US012575317B2

(12) United States Patent
Kim et al.

(10) Patent No.: US 12,575,317 B2
(45) Date of Patent: Mar. 10, 2026

(54) HETEROCYCLIC COMPOUND, ORGANIC LIGHT-EMITTING DEVICE INCLUDING HETEROCYCLIC COMPOUND, AND ELECTRONIC APPARATUS INCLUDING ORGANIC LIGHT-EMITTING DEVICE

(71) Applicant: Samsung Electronics Co., Ltd., Suwon-si (KR)

(72) Inventors: Hwang Suk Kim, Suwon-si (KR); Hosuk Kang, Suwon-si (KR); Eunsuk Kwon, Suwon-si (KR); Joonghyuk Kim, Seoul (KR); Yeon Sook Chung, Seoul (KR); Yongsik Jung, Seoul (KR); Kyeongsik Ju, Suwon-si (KR); Sangyeon Hwang, Seoul (KR); Satoko Ishibe, Suwon-si (KR); Jun Chwae, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 797 days.

(21) Appl. No.: 17/692,345

(22) Filed: Mar. 11, 2022

(65) Prior Publication Data

US 2023/0019868 A1 Jan. 19, 2023

(30) Foreign Application Priority Data

Mar. 12, 2021 (KR) ........................ 10-2021-0033005

(51) Int. Cl.

| | |
|---|---|
| ***H10K 85/40*** | (2023.01) |
| ***C07F 7/08*** | (2006.01) |
| *H10K 50/11* | (2023.01) |
| *H10K 101/10* | (2023.01) |

(52) U.S. Cl.

CPC ........... *H10K 85/40* (2023.02); *C07F 7/0812* (2013.01); *H10K 50/11* (2023.02); *H10K 2101/10* (2023.02)

(58) Field of Classification Search

None

See application file for complete search history.

(56) References Cited

U.S. PATENT DOCUMENTS 9,312,499 B1 * 4/2016 Zeng .................... C09K 11/025
2007/0173657 A1 7/2007 Chen et al.
2012/0298966 A1 * 11/2012 Zeng .......................... C07F 7/08 548/406
2013/0026909 A1 1/2013 Zeng et al.
2016/0141525 A1 * 5/2016 Xia .................... H10K 85/6576 546/14
2016/0204359 A1 * 7/2016 Lee ...................... C09K 11/025 544/333
2022/0310945 A1 9/2022 Chung et al.

FOREIGN PATENT DOCUMENTS

CN 102775432 A * 11/2012 .............. C07F 9/572
KR 20100118700 A 11/2010
KR 20110079402 A 7/2011
KR 20150105201 A * 9/2015 ........... C07D 403/04
WO 2010126234 A1 4/2010
WO 2011019156 A1 2/2011

* cited by examiner

*Primary Examiner* — Robert S Loewe

(74) *Attorney, Agent, or Firm* — CANTOR COLBURN LLP

(57) ABSTRACT

Provided are a heterocyclic compound represented by Formula 1, an organic light-emitting device including the same, and an electronic apparatus including the organic light-emitting device.

Formula 1

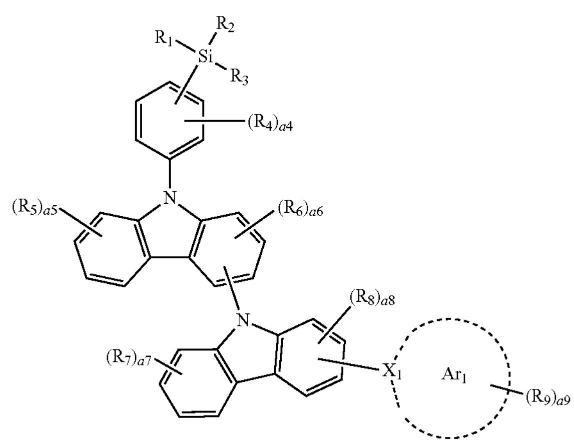

The detailed description of Formula 1 is the same as described in the present specification.

20 Claims, 4 Drawing Sheets

HETEROCYCLIC COMPOUND, ORGANIC LIGHT-EMITTING DEVICE INCLUDING HETEROCYCLIC COMPOUND, AND ELECTRONIC APPARATUS INCLUDING ORGANIC LIGHT-EMITTING DEVICE

CROSS-REFERENCE TO RELATED APPLICATION

This application claims priority under 35 U.S.C. § 119 to Korean Patent Application No. 10-2021-0033005, filed on Mar. 12, 2021, in the Korean Intellectual Property Office, the content of which is incorporated by reference herein in its entirety.

BACKGROUND

1. Field

The present disclosure relates to heterocyclic compounds, organic light-emitting devices including the same, and electronic apparatuses including the organic light-emitting devices.

2. Description of the Related Art

Organic light-emitting devices are self-emissive devices, which have improved characteristics in terms of viewing angles, response time, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

Provided are a novel heterocyclic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments of the disclosure.

According to one or more embodiments, a heterocyclic compound represented by Formula 1 is provided:

Formula 1

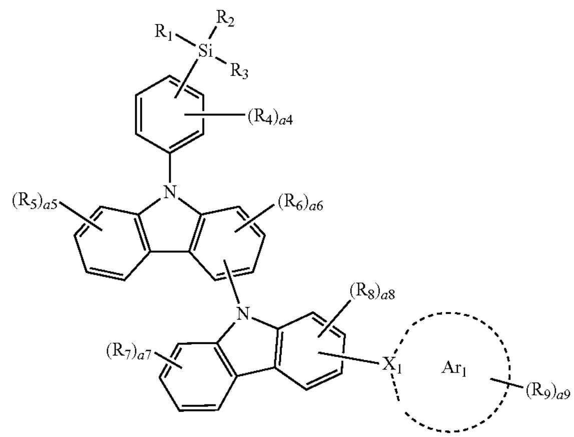

wherein, in Formula 1, $X_1$ is N or C, $Ar_1$ is i) a π electron-rich $C_6$-$C_{60}$ polycyclic group, or ii) a $C_6$-$C_{60}$ polycyclic group to which a furan group, a thiophene group, a pyrrole group, a cyclopentadiene group, a silole group, or any combination thereof is condensed, $R_1$ to $R_9$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$, a4, a5, and a7 are each independently an integer from 0 to 4, a6 and a8 are each independently an integer from 0 to 3, a9 is an integer from 0 to 20, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-Coo alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, and any combination thereof;

$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$;

or any combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to another aspect, an organic light-emitting device includes a first electrode, a second electrode, and an organic layer located between the first electrode and the second electrode and including an emission layer, wherein the organic layer includes at least one heterocyclic compound represented by Formula 1.

Another aspect of the present disclosure provides an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
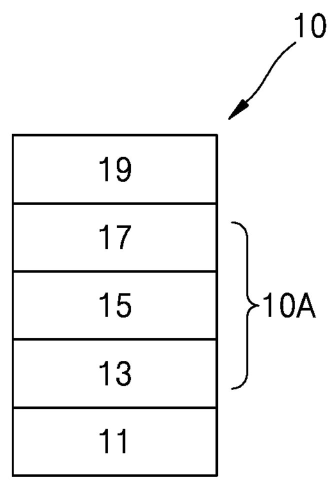
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A heterocyclic compound according to an embodiment may be represented by Formula 1:

Formula 1

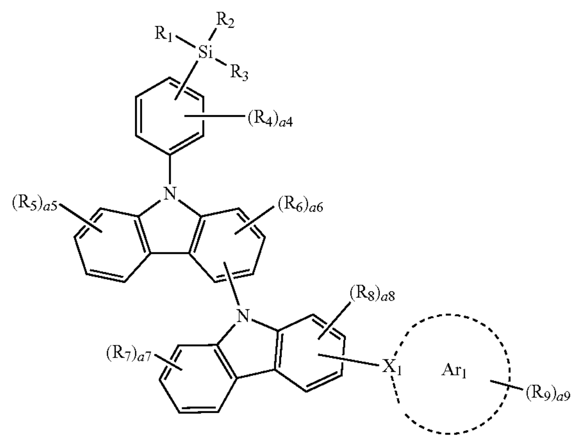

$X_1$ in Formula 1 may be N or C.

$Ar_1$ in Formula 1 may be i) a π electron-rich $C_6$-$C_{60}$ polycyclic group, or ii) a $C_6$-$C_{60}$ polycyclic group to which a furan group, a thiophene group, a pyrrole group, a cyclopentadiene group, a silole group, or any combination thereof is condensed.

In an embodiment, $Ar_1$ in Formula 1 may be a) a $C_{10}$-$C_{60}$ polycyclic group in which two or more first groups are condensed with each other, b) a $C_9$-$C_{60}$ polycyclic group in which one or more first groups and one or more second groups are condensed with each other, c) a $C_7$-$C_{60}$ polycyclic group in which one or more second groups and one or more third groups are condensed with each other, or d) a $C_{11}$-$C_{60}$ polycyclic group in which one or more first groups, one or more second groups, and one or more third groups are condensed with each other, wherein the first group may be a benzene group, the second group may be a furan group, a thiophene group, a pyrrole group, a cyclopentadiene group, or a silole group, and the third group may be a pyridine group, a pyrimidine group, a pyridazine group, or a pyrazine group.

In one or more embodiments, $Ar_1$ in Formula 1 may be a polycyclic group in which two to five rings are condensed with each other.

In one or more embodiments, $Ar_1$ in Formula 1 may be a naphthalene group, an anthracene group, a phenanthrene group, a pyrene group, a furan group, a thiophene group, a pyrrole group, a cyclopentadiene group, a silole group, a benzofuran group, a benzothiophene group, an indole group, an indene group, a benzosilole group, a dibenzofuran group, a dibenzothiophene group, a carbazole group, a fluorene group, a dibenzosilole group, a naphthobenzofuran group, a naphthobenzothiophene group, a benzocarbazole group, a benzofluorene group, a naphthobenzosilole group, a dinaphthofuran group, a dinaphthothiophene group, a dibenzocarbazole group, a dibenzofluorene group, a dinaphthosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, an azadibenzosilole group, an azanaphthobenzofuran group, an azanaphthobenzothiophene group, an azabenzocarbazole group, an azabenzofluorene group, an azanaphthobenbenzosilole group, an azadinaphthofuran group, an azadinaphthothiophene group, an azadibenzocarbazole group, an azadibenzofluorene group, or an azadinaphthosilole group.

In one or more embodiments, a group represented by

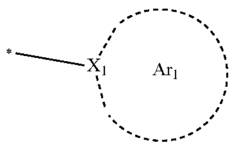

in Formula 1 may be a group represented by Formula 2-1 or 2-2:

2-1

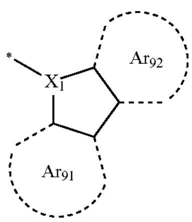

2-2

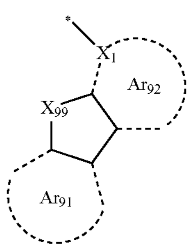

wherein, in Formulae 2-1 and 2-2, $X_1$ in Formula 2-1 may be N, and $X_1$ in Formula 2-2 is the same as described herein, $X_{99}$ may be O, S, $N(R_{99a})$, $C(R_{99a})(R_{99b})$, or $Si(R_{99a})(R_{99b})$, $R_{99a}$ and $R_{99b}$ are each the same as described in connection with $R_9$, $Ar_{91}$ and $Ar_{92}$ may each independently be a benzene group, a naphthalene group, a benzofuran group, a benzothiophene group, an indole group, an indene group, a benzosilole group, a dibenzofuran group, a dibenzothiophene group, a carbazole group, a fluorene group, a dibenzosilole group, a pyridine group, a pyrimidine group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group, and may indicate a binding site to a neighboring atom.

In one or more embodiments, a group represented by

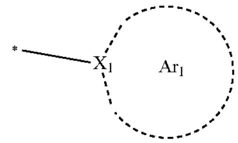

in Formula 1 may be a group represented by one of Formulae 3-1 to 3-5:

3-1

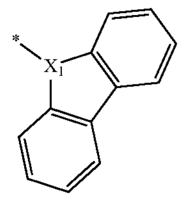

3-2

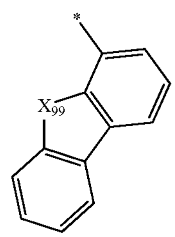

3-3

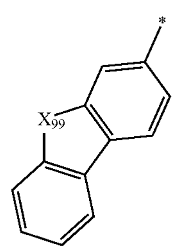

3-4

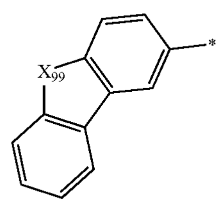

3-5

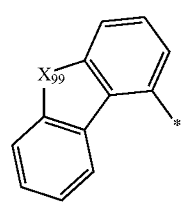

wherein, in Formulae 3-1 to 3-5, $X_1$ may be N, $X_{99}$ may be O, S, $N(R_{99a})$, $C(R_{99a})(R_{99b})$, or $Si(R_{99a})(R_{99b})$, $R_{99a}$ and $R_{99b}$ are each the same as described in connection with $R_9$, and indicates a binding site to an adjacent atom.

$R_1$ to $R_9$ in Formula 1 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Ge($Q_3$)($Q_4$)($Q_5$), —B($Q_6$)($Q_7$), —P(=O)($Q_8$)($Q_9$), or —P($Q_8$)($Q_9$). $Q_1$ to $Q_9$ may each be the same as described herein.

In an embodiment, the number of Si (silicon) included in Formula 1 may be 1.

In an embodiment, $R_1$ to $R_9$ in Formula 1 may each independently be:

hydrogen, deuterium, —F, or a cyano group; or a $C_1$-$C_{60}$ alkyl group, a $C_1$-$C_{60}$ alkoxy group, a π electron-rich $C_3$-$C_{60}$ cyclic group, or a pyridinyl group, each unsubstituted or substituted with deuterium, —F, a cyano group, a $C_1$-$C_{60}$ alkyl group, a $C_1$-$C_{60}$ alkoxy group, a π electron-rich $C_3$-$C_{60}$ cyclic group, a pyridinyl group, a biphenyl group, a terphenyl group, or any combination thereof.

In one or more embodiments, $R_1$ to $R_9$ in Formula 1 may each independently be:

hydrogen, deuterium, —F, or a cyano group; or a phenyl group, a naphthyl group, a phenanthrenyl group, a furanyl group, a thiophenyl group, a pyrrolyl group, a cyclopentenyl group, a silolyl group, a benzofuranyl group, a benzothiophenyl group, an indolyl group, an indenyl group, a benzosilolyl group, a dibenzofuranyl group, a dibenzothiophenyl group, a carbazolyl group, a fluorenyl group, a dibenzosilolyl group, a benzonaphthofuranyl group, a benzonaphthothiophenyl group, a benzocarbazolyl group, a benzofluorenyl group, a benzonaphthosilolyl group, a dinaphthofuranyl group, a dinaphthothiophenyl group, a dibenzocarbazolyl group, a dibenzofluorenyl group, a dinaphthosilolyl group, or a pyridinyl group, each unsubstituted or substituted with deuterium, —F, a cyano group, a $C_1$-$C_{20}$ alkyl group, a phenyl group, a naphthyl group, a phenanthrenyl group, a furanyl group, a thiophenyl group, a pyrrolyl group, a cyclopentenyl group, a silolyl group, a benzofuranyl group, a benzothiophenyl group, an indolyl group, an indenyl group, a benzosilolyl group, a dibenzofuranyl group, a dibenzothiophenyl group, a carbazolyl group, a fluorenyl group, a dibenzosilolyl group, a benzonaphthofuranyl group, a benzonaphthothiophenyl group, a benzocarbazolyl group, a benzofluorenyl group, a benzonaphthosilolyl group, a dinaphthofuranyl group, a dinaphthothiophenyl group, a dibenzocarbazolyl group, a dibenzofluorenyl group, a dinaphthosilolyl group, a pyridinyl group, a biphenyl group, a terphenyl group, or any combination thereof.

In one or more embodiments, $R_1$ to $R_3$ in Formula 1 may each independently be a phenyl group unsubstituted or substituted with deuterium, —F, a cyano group, a $C_1$-$C_{60}$ alkyl group, a $C_1$-$C_{60}$ alkoxy group, a phenyl group, a biphenyl group, a terphenyl group, or any combination thereof.

In one or more embodiments, $R_4$ to $R_9$ in Formula 1 may each independently be:

hydrogen, deuterium, —F, or a cyano group; or a phenyl group unsubstituted or substituted with deuterium, —F, a cyano group, a $C_1$-$C_{60}$ alkyl group, a $C_1$-$C_{60}$ alkoxy group, a phenyl group, a biphenyl group, a terphenyl group, or any combination thereof.

a4, a5, and a7 in Formula 1 respectively indicate the number of $R_4$(s), the number of $R_5$(s), and the number of $R_7$(s), and may each independently be an integer from 0 to 4 (for example, 0, 1 or 2). When a4 is two or more, two or more of $R_4$(s) may be identical to or different from each other, and when a5 is two or more, two or more of $R_5$(s) may be identical to or different from each other, and when a7 is two or more, two or more of $R_7$(s) may be identical to or different from each other.

a6 and a8 in Formula 1 respectively indicate the number of $R_6$(s) and the number of $R_8$(s), and may each independently be an integer from 0 to 3 (for example, 0, 1 or 2). When a6 is 2 or more, two or more of $R_6$(s) may be identical to or different from each other, and when a8 is 2 or more, two or more $R_8$(s) may be identical to or different from each other.

a9 in Formula 1 indicates the numbers of $R_9$(s), respectively, and may each independently be an integer from 0 to 20 (for example, 0, 1, 2, or 3). When a9 is 2 or more, two or more of $R_9$(s) may be identical to or different from each other.

In an embodiment, a group represented by

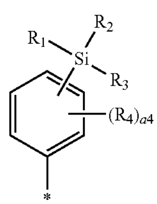

in Formula 1 may be a group represented by one of Formulae 4-1 to 4-3 (for example, a group represented by one of Formulae 4-1 and 4-2):

4-1

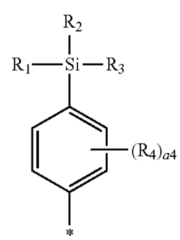

4-2

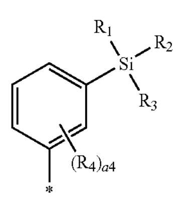

-continued 4-3

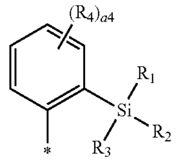

wherein, in Formulae 4-1 to 4-3, $R_1$ to $R_4$, and a4 are each the same as described above, and indicates a binding site to a neighboring N.

In an embodiment, a group represented by

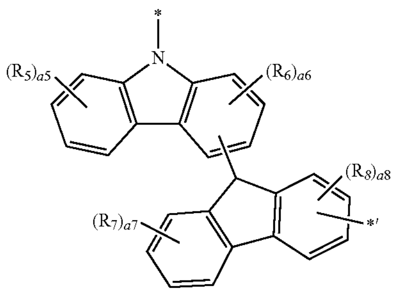

in Formula 1 may be a group represented by one of Formulae 5-1 to 5-4 (for example, a group represented by one of Formulae 5-2 and 5-3):

5-1

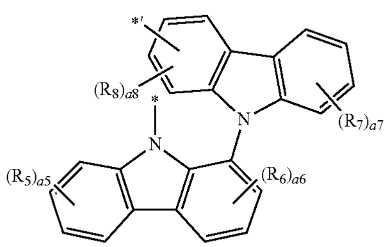

5-2

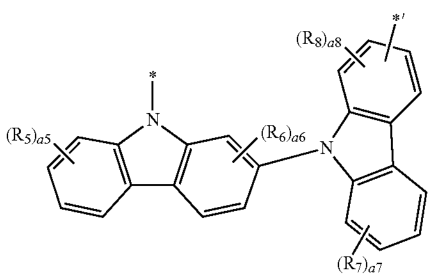

5-3

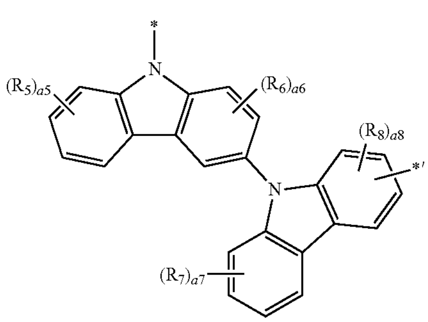

-continued 5-4

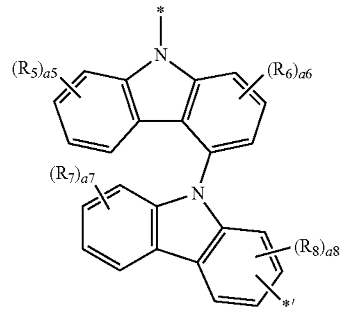

wherein, in Formulae 5-1 to 5-4, $R_5$ to $R_8$ and a5 to a8 are each the same as described above, indicates a binding site to a neighboring C, and is a binding site to $X_1$.

In an embodiment, a group represented by

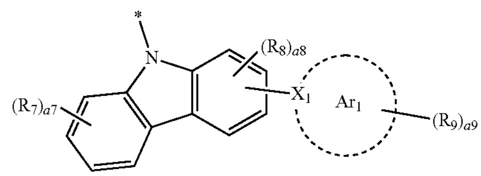

in Formula 1 may be a group represented by one of Formulae 6-1 to 6-4 (for example, a group represented by one of Formulae 6-2 and 6-3):

6-1

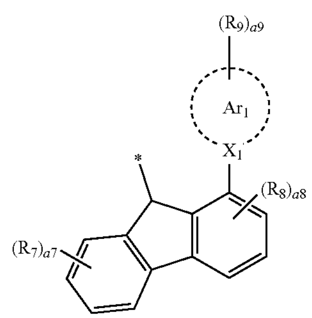

6-2

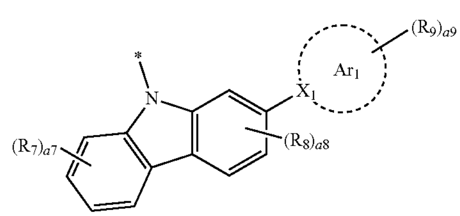

6-3

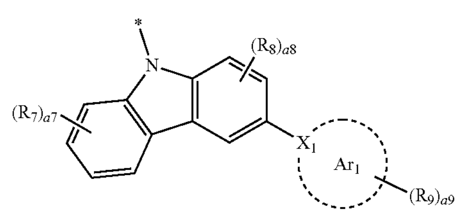

-continued
6-4
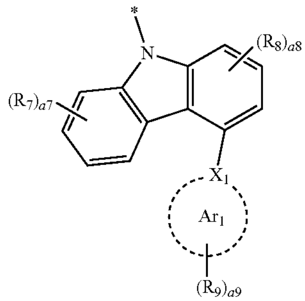
wherein, in Formulae 6-1 to 6-4,
$X_1$, $Ar_1$, $R_7$ to $R_9$, and a7 to a9 are the same as described above, and
indicates a binding site to a neighboring C.
In one or more embodiments, the heterocyclic compound represented by Formula 1 may be one of Compounds 1 to 1006:
1
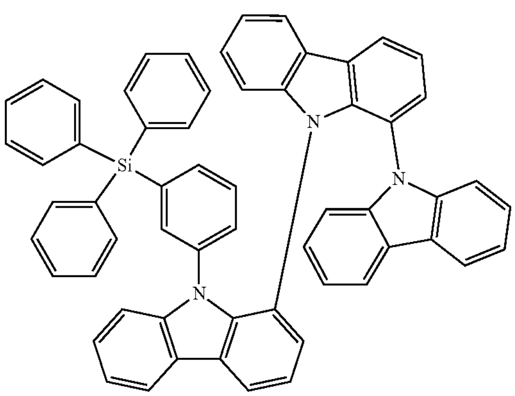
2
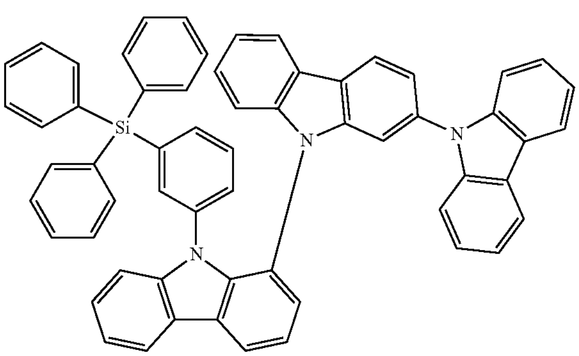
-continued
3
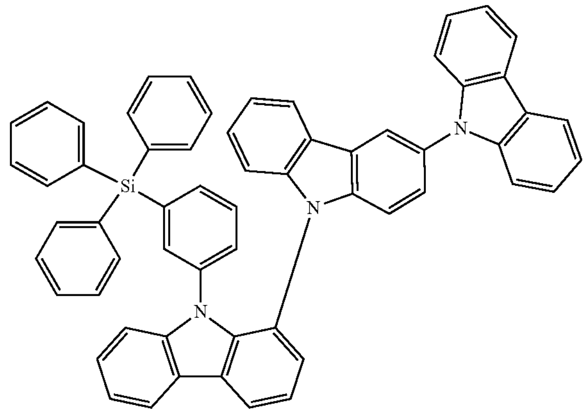
4
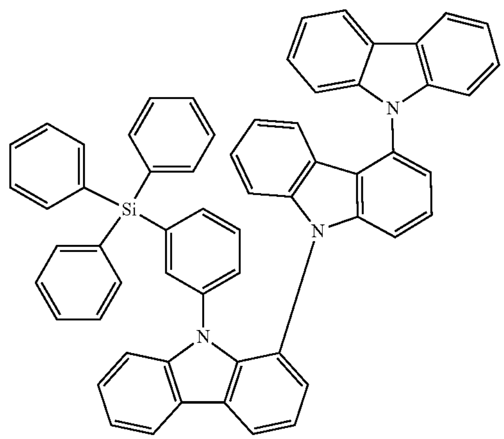
5
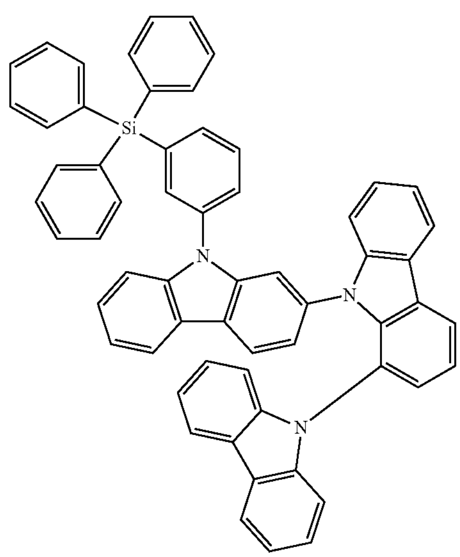

-continued
6
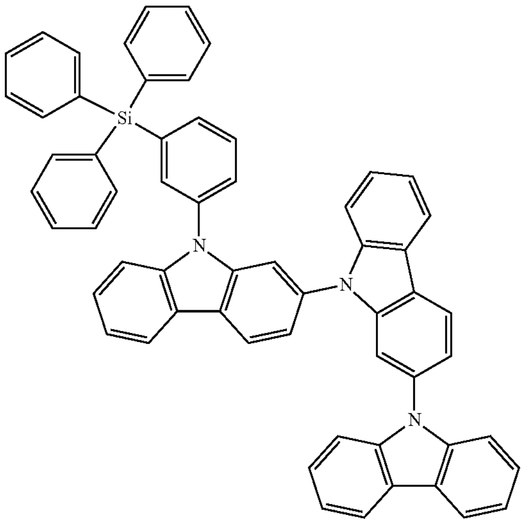
7
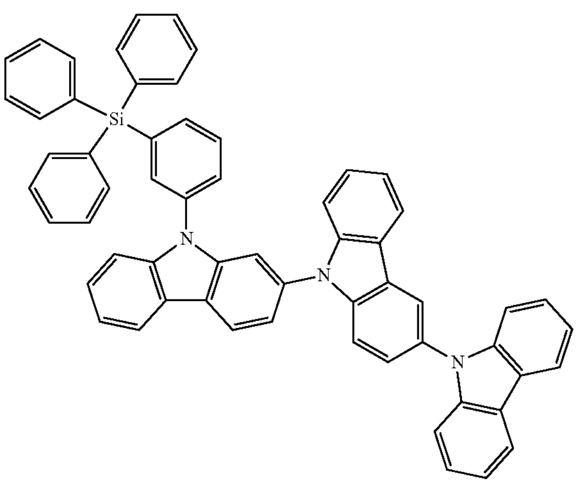
8
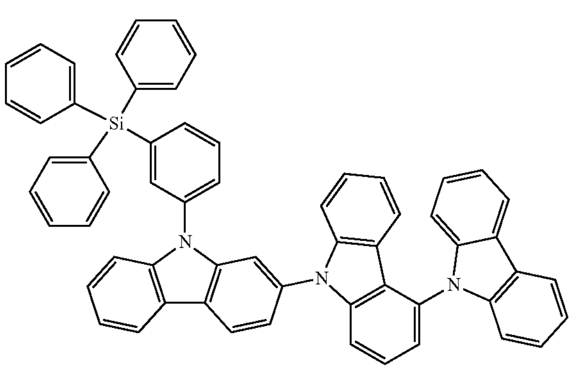
-continued
9
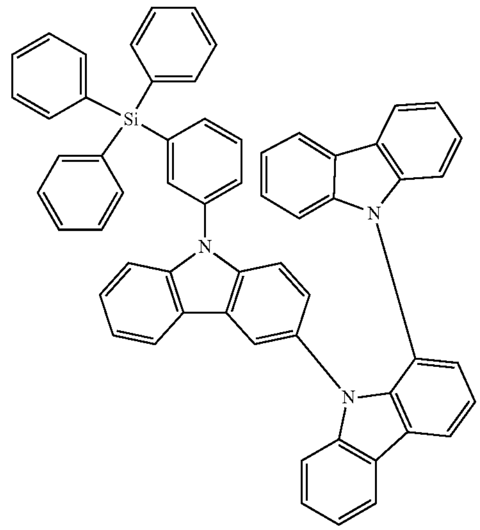
10
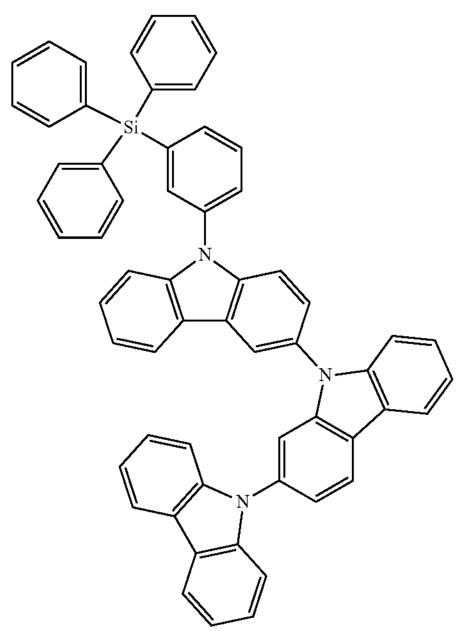

-continued
11
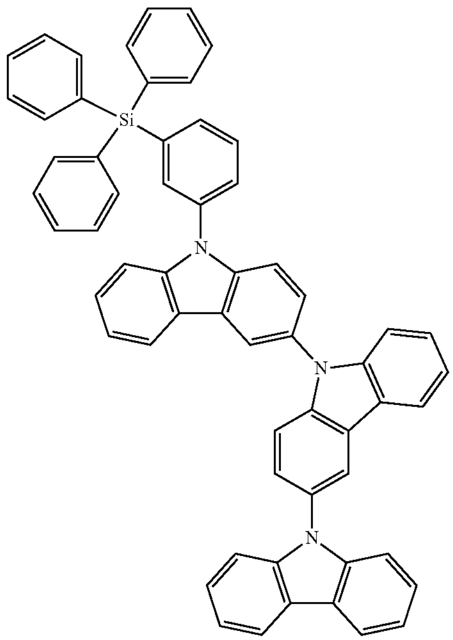
12
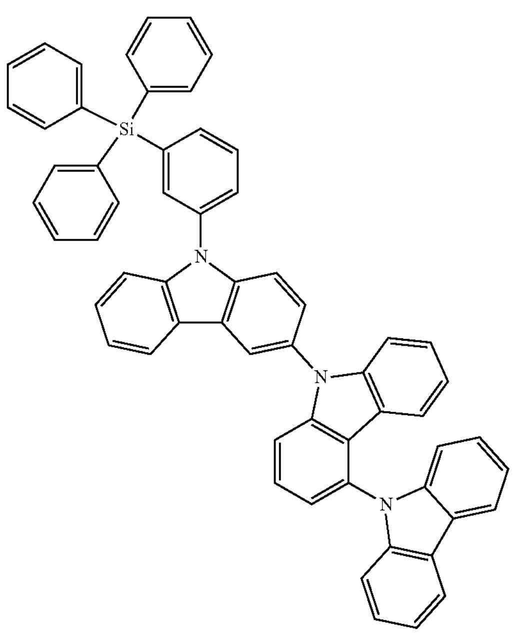
-continued
13
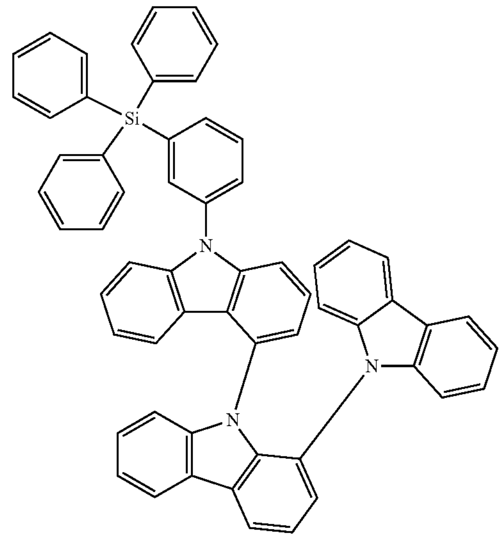
14
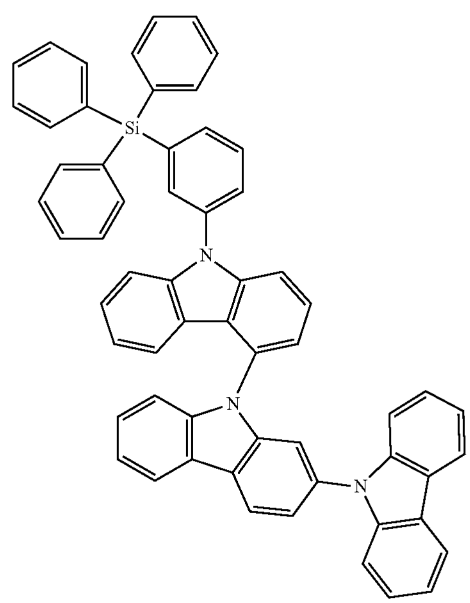

-continued
15
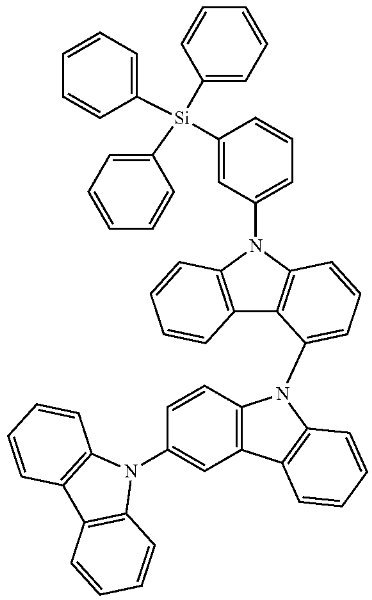
16
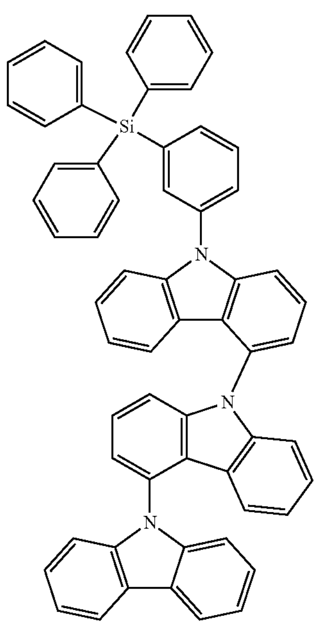
-continued
17
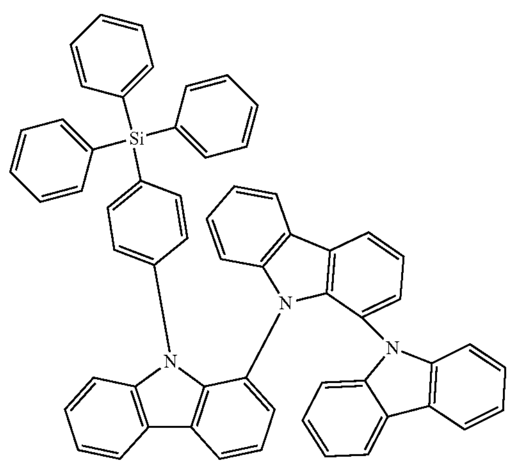
18
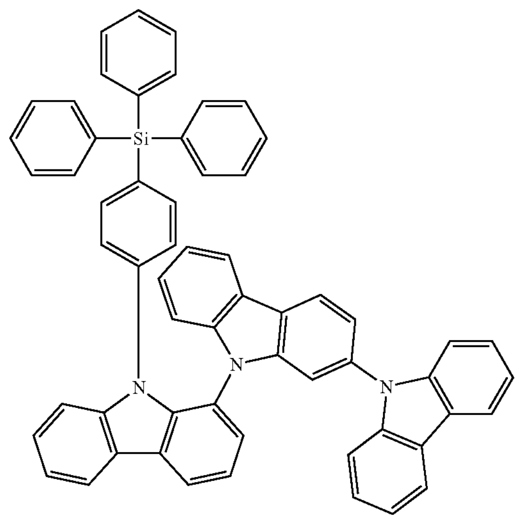
19
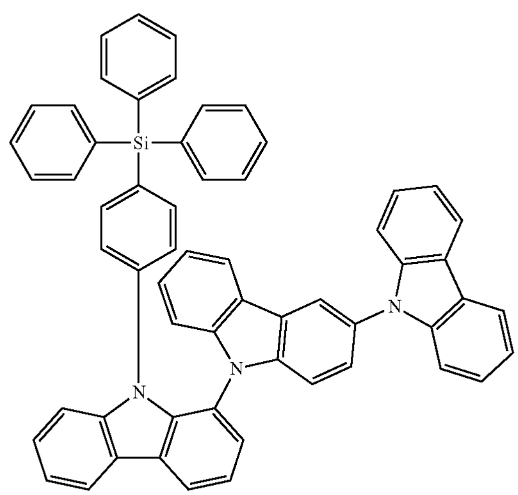

-continued
20
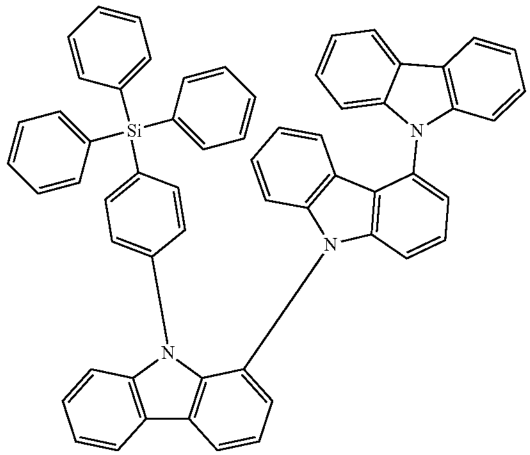
21
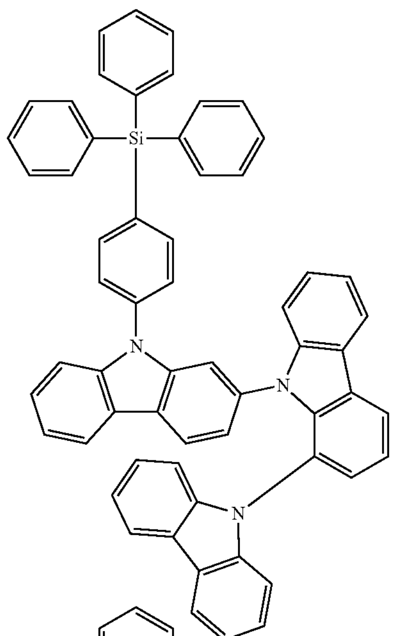
22
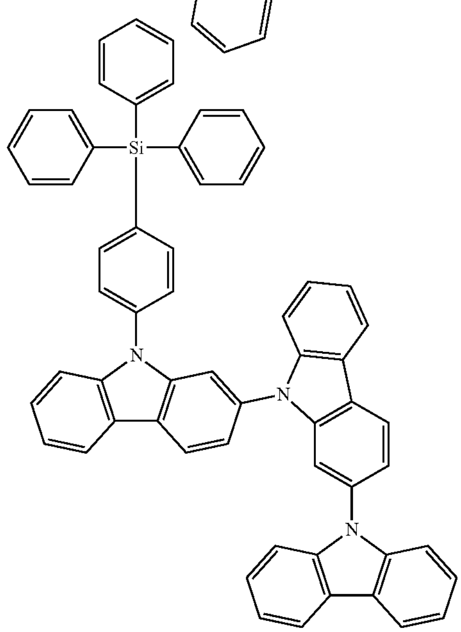
-continued
23
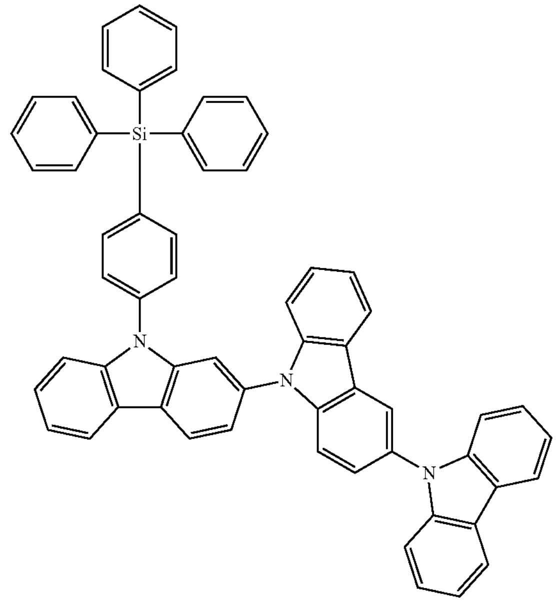
24
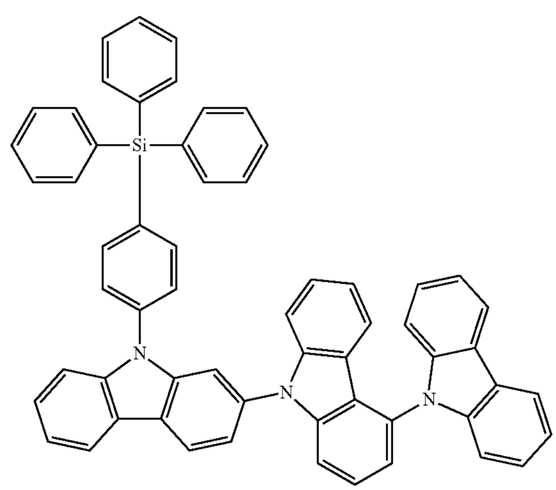

-continued
25
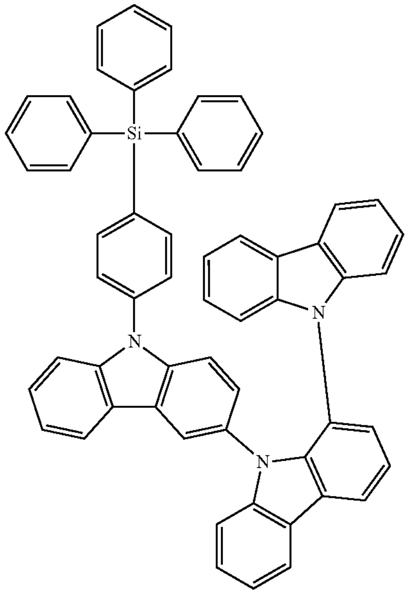
26
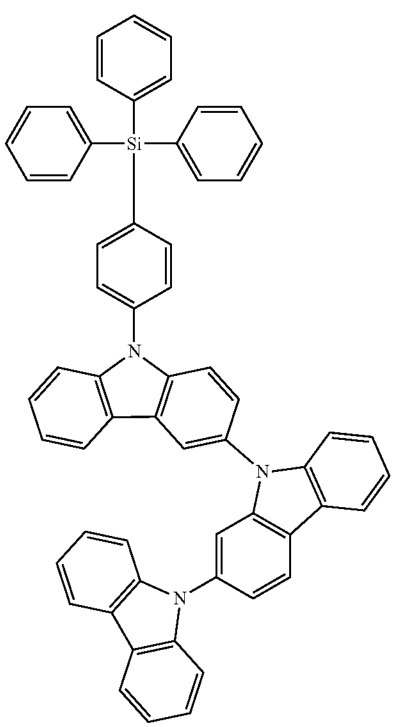
-continued
27
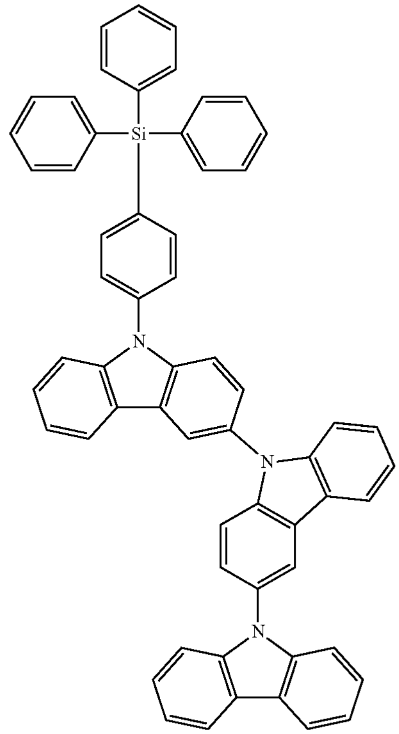
28
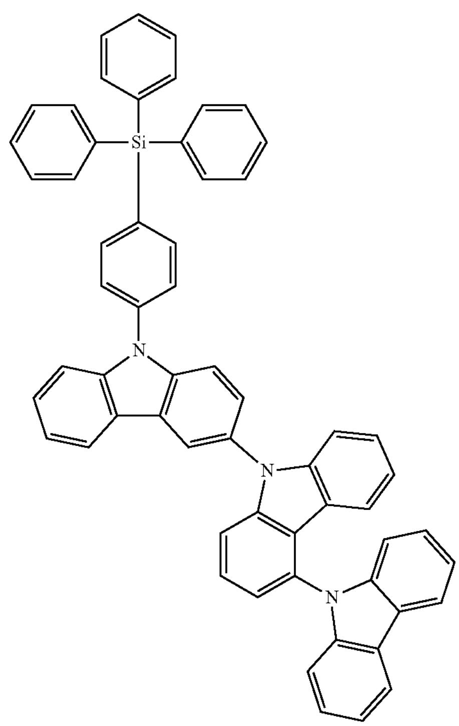

-continued
29
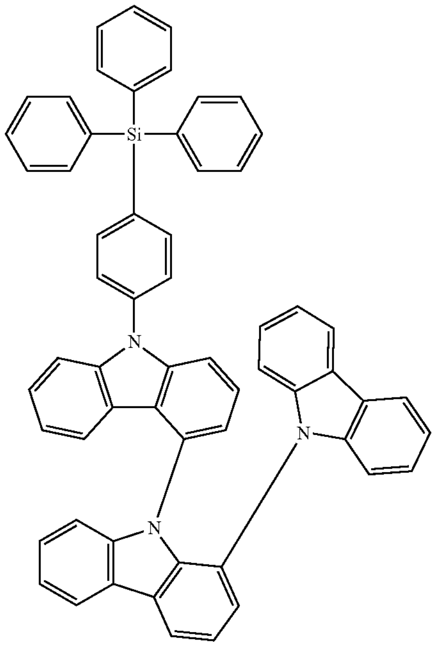
30
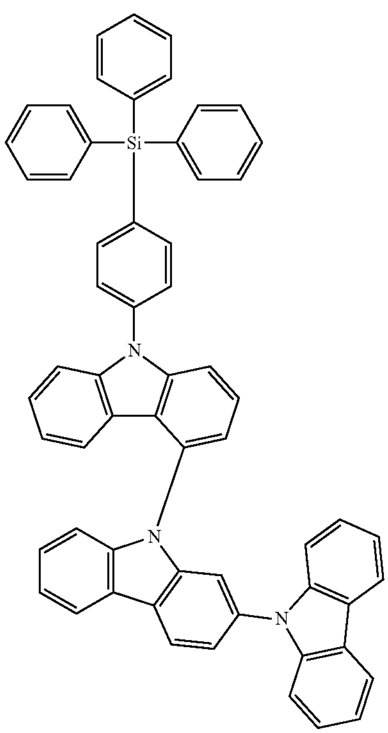
-continued
31
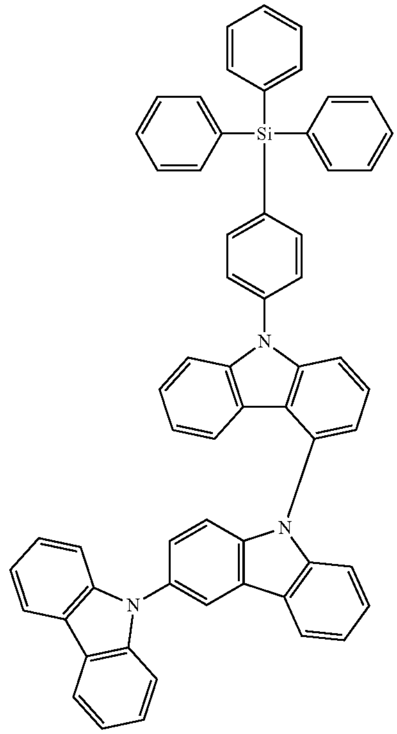
32
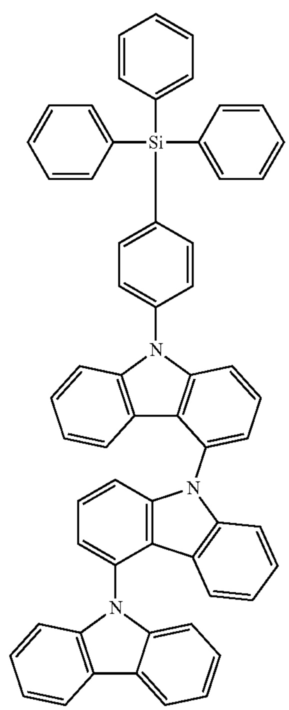

33
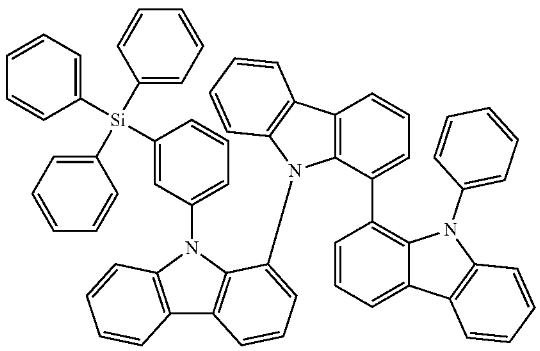
34
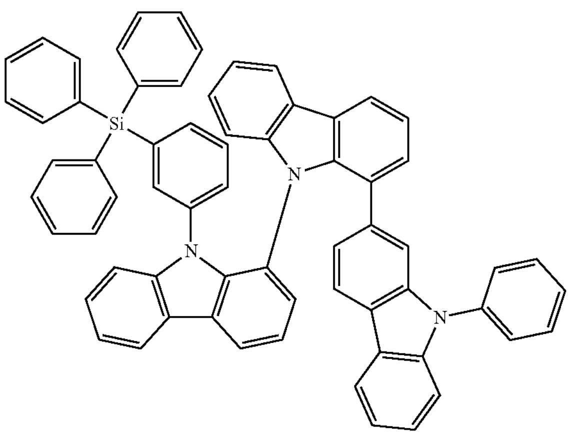
35
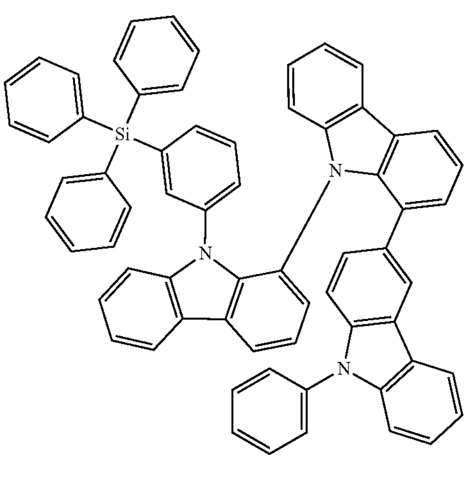
36
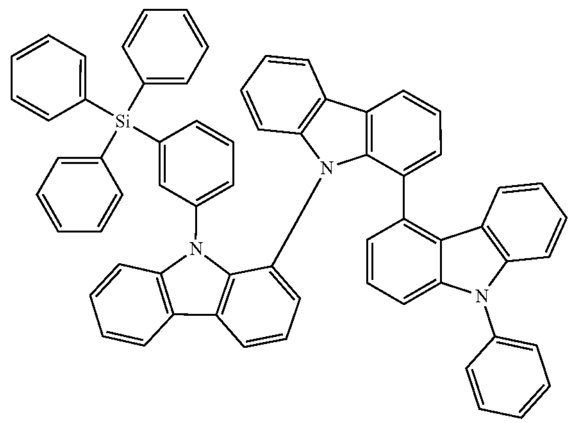
37
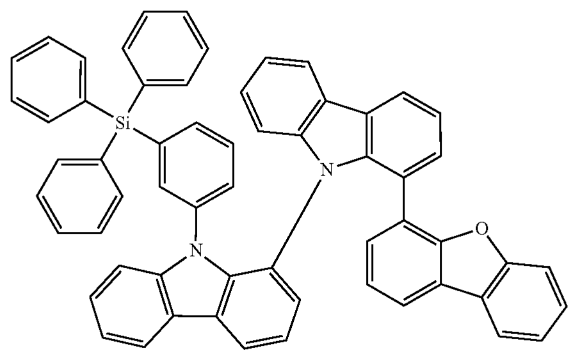
38
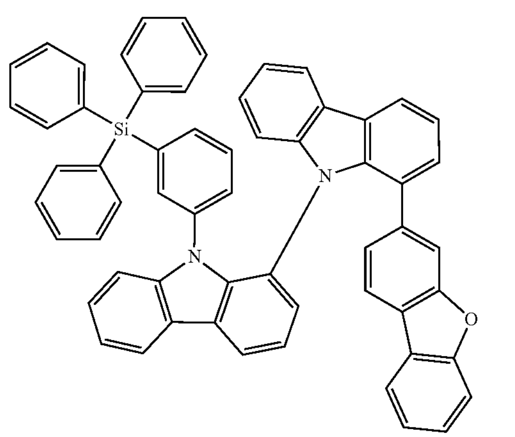

-continued
39
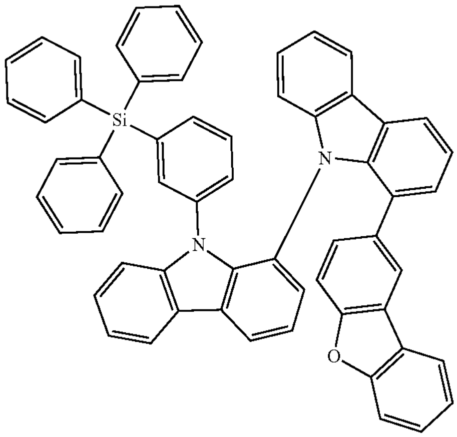
40
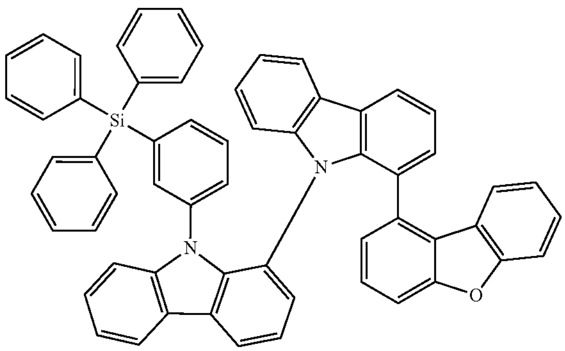
41
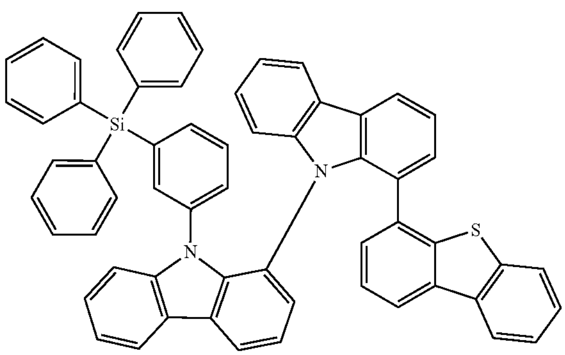
42
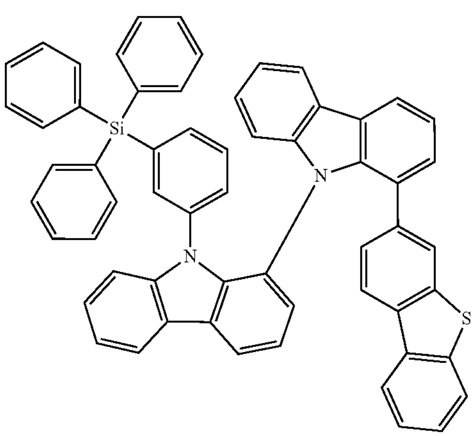
-continued
43
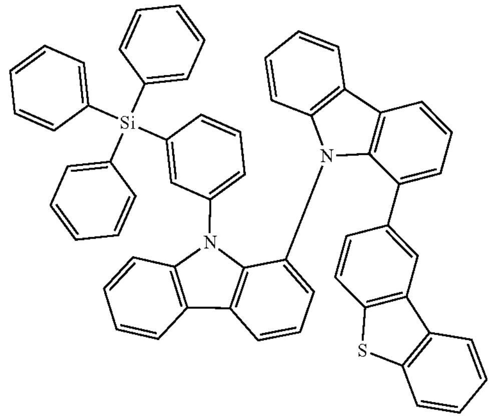
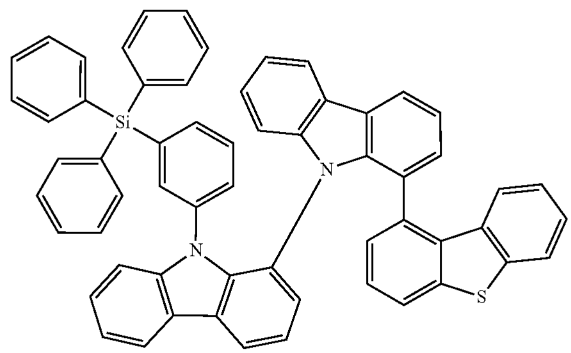
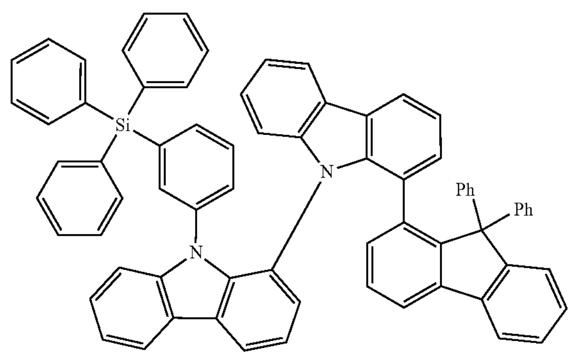
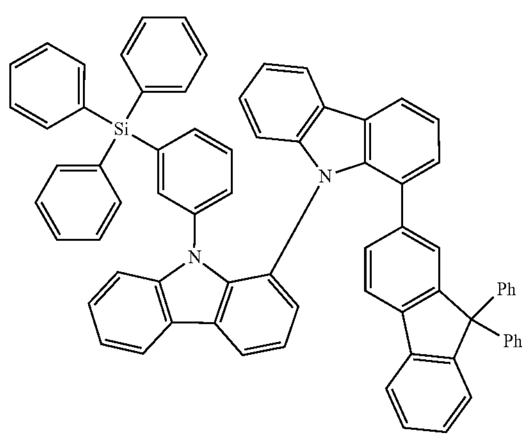

-continued
47
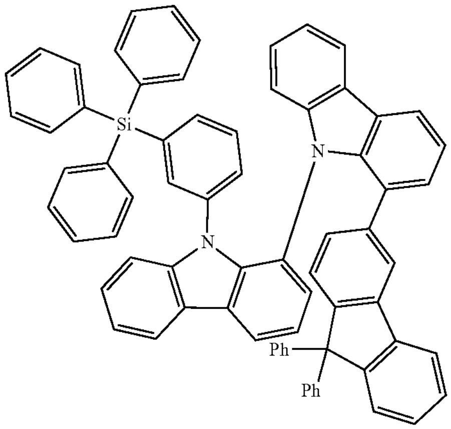
48
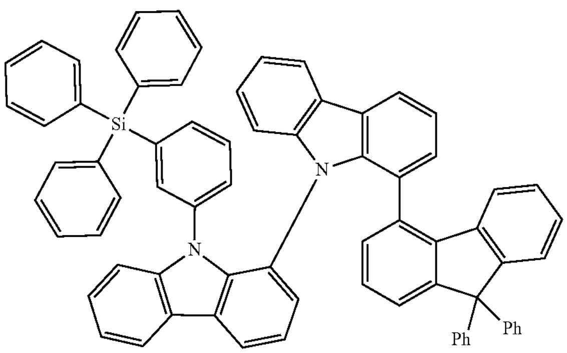
49
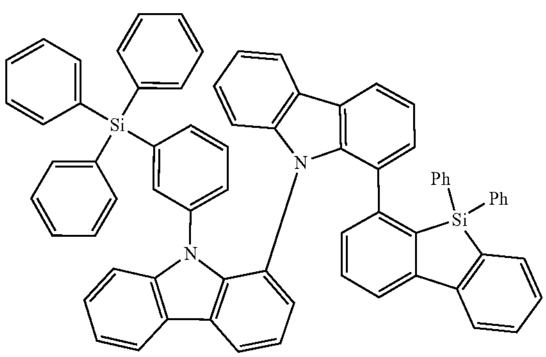
50
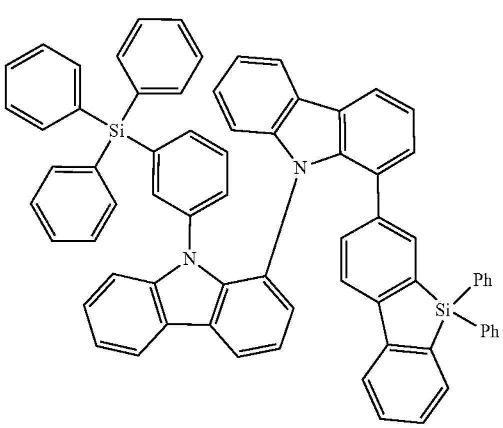
-continued
51
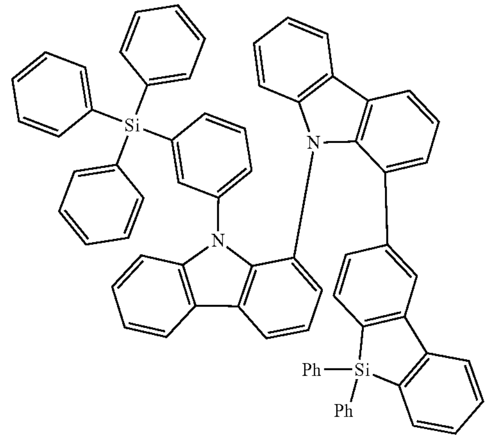
52
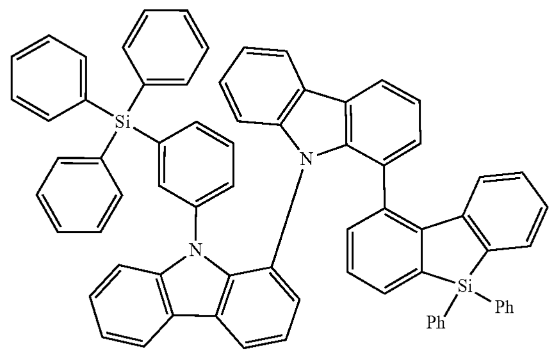
53
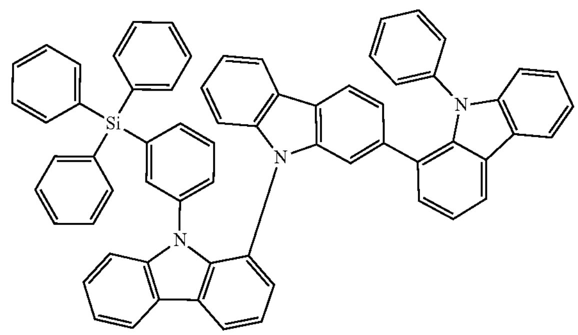
54
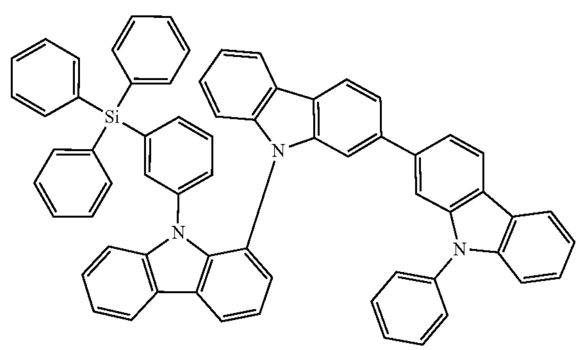

-continued
55
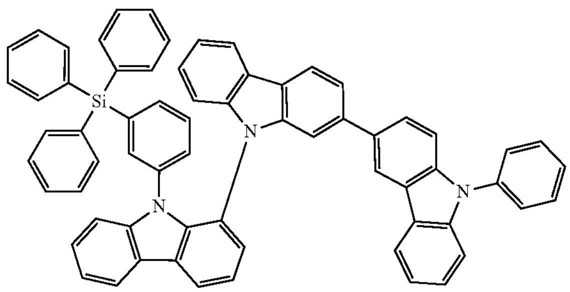
56
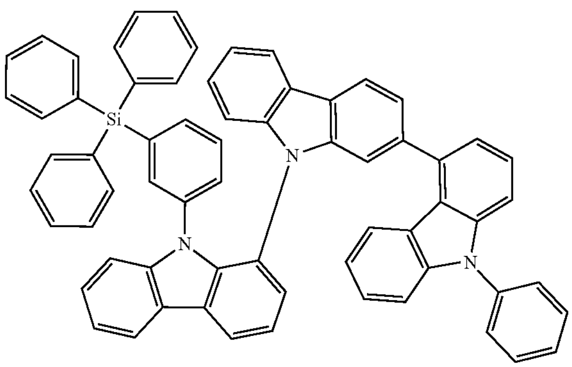
57
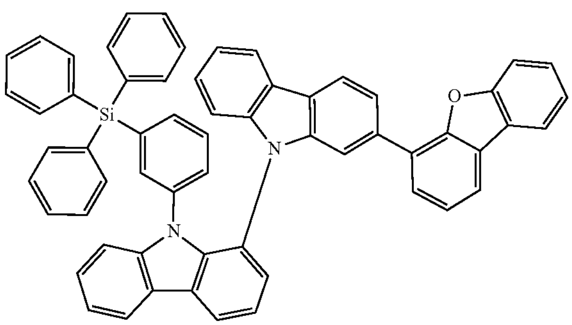
58
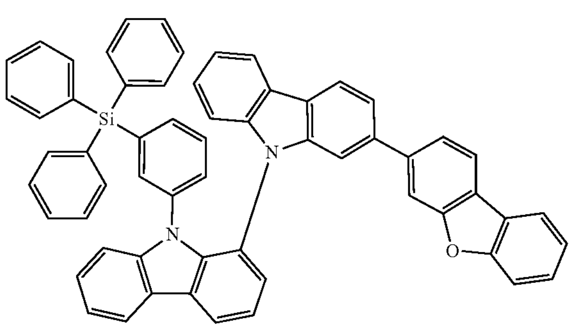
-continued
59
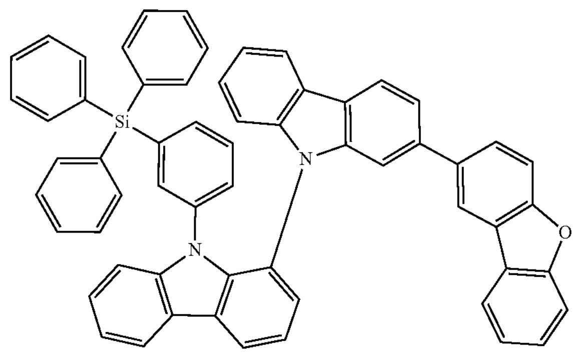
60
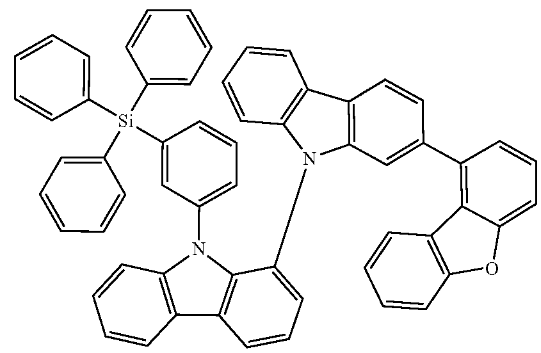
61
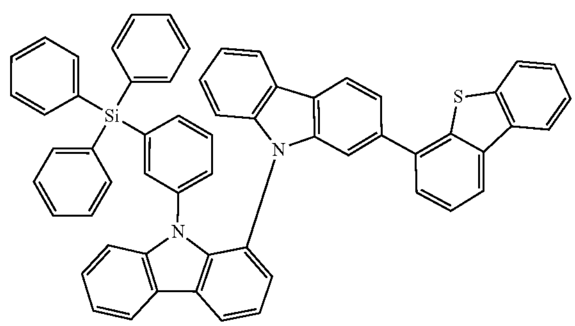
62
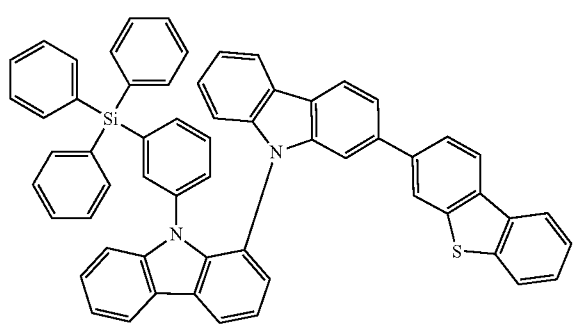

63
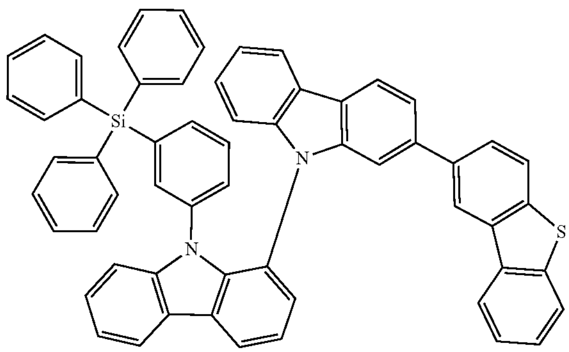
64
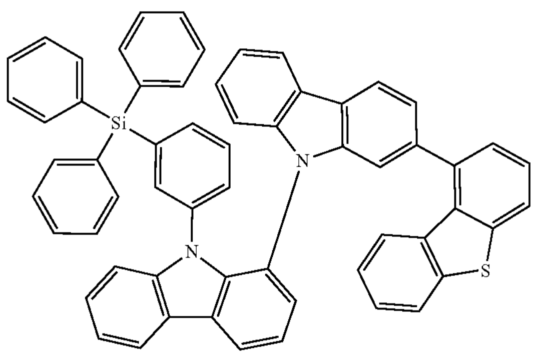
65
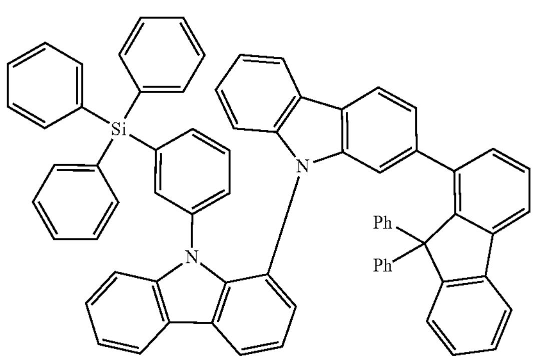
66
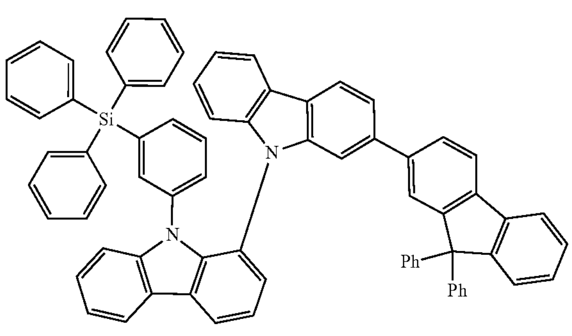
67
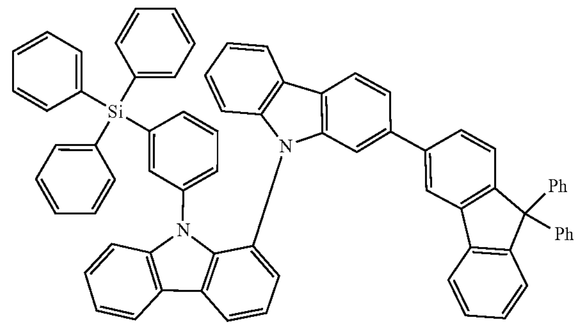
68
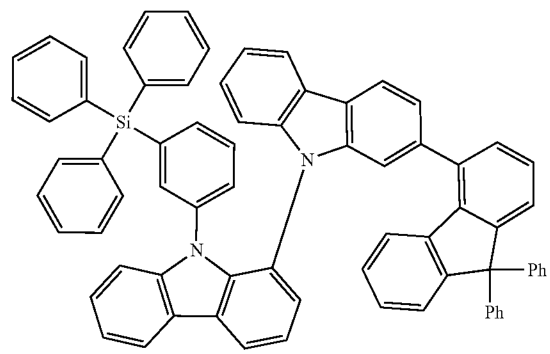
69
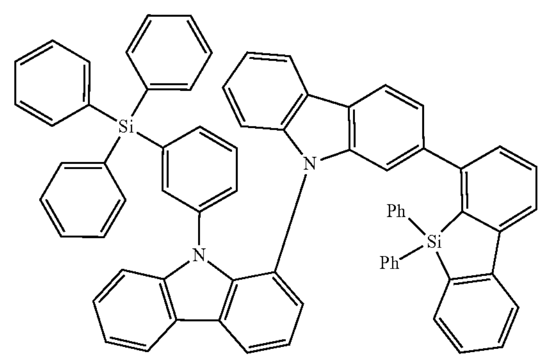
70
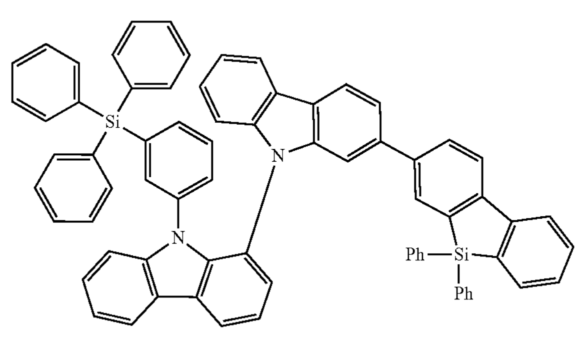

-continued
71
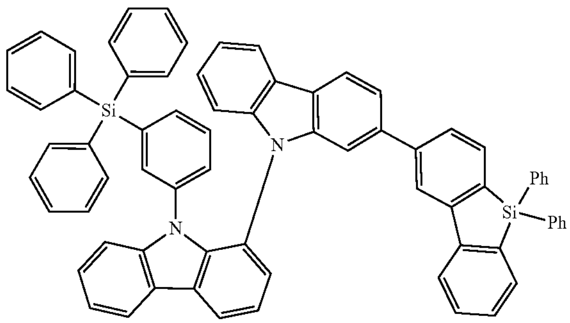
72
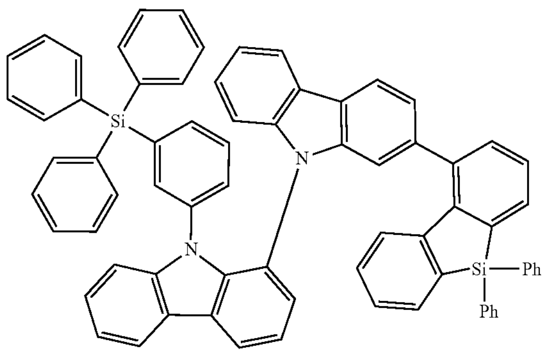
73
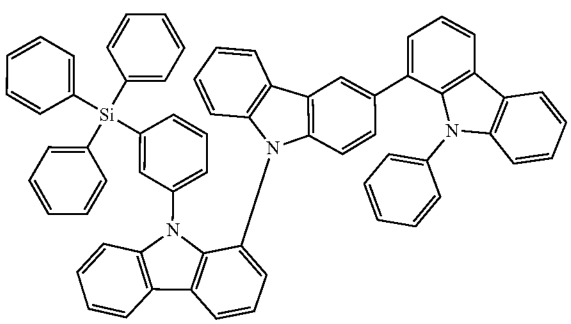
74
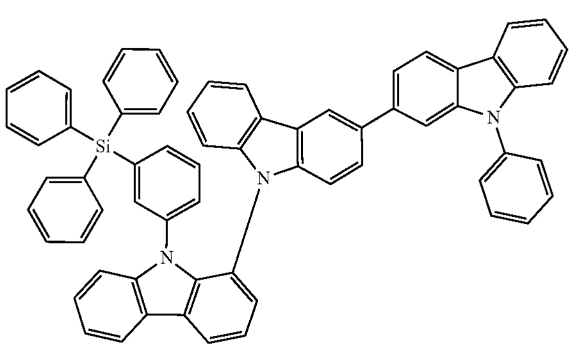
-continued
75
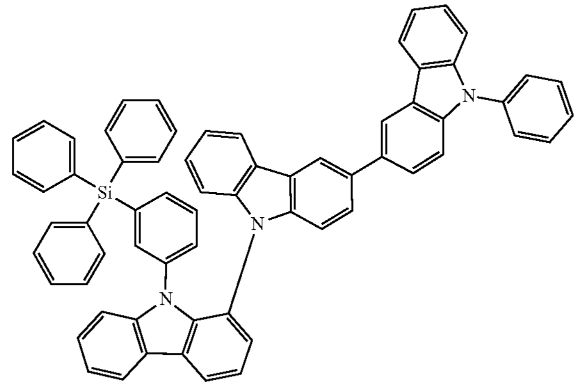
76
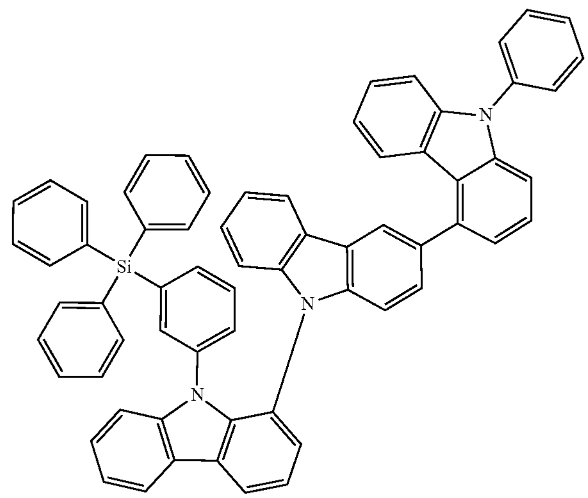
77
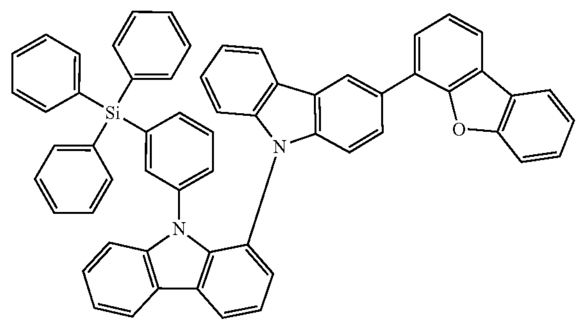
78
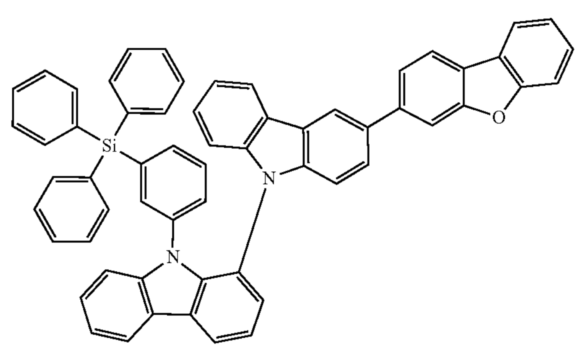

-continued
79
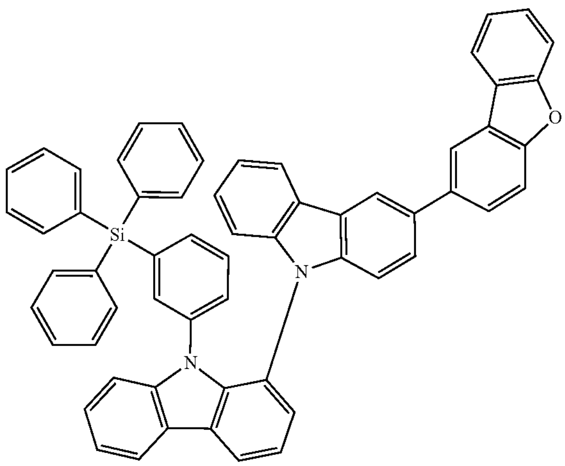
80
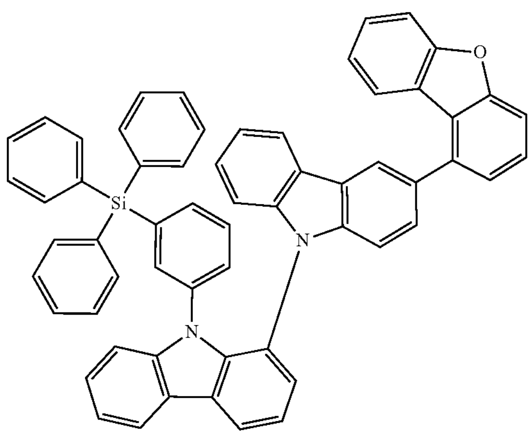
81
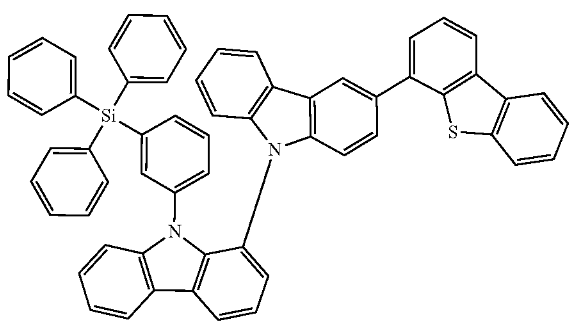
82
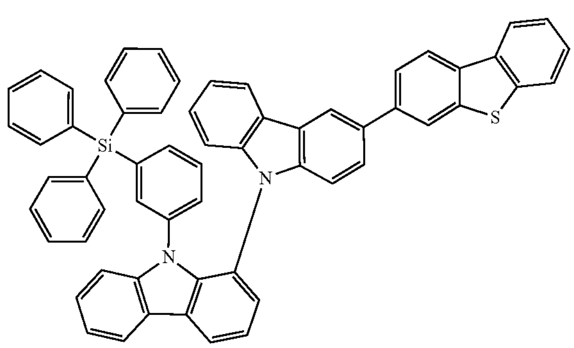
-continued
83
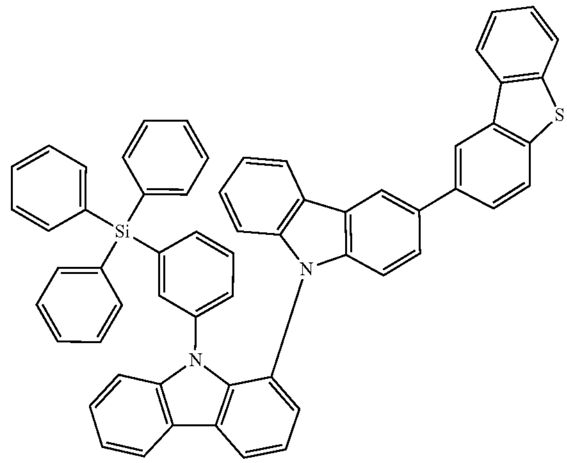
84
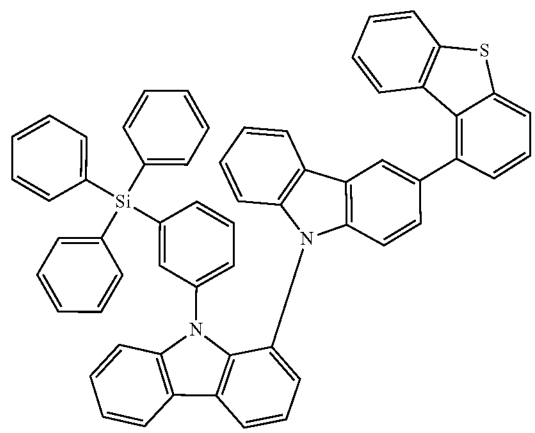
85
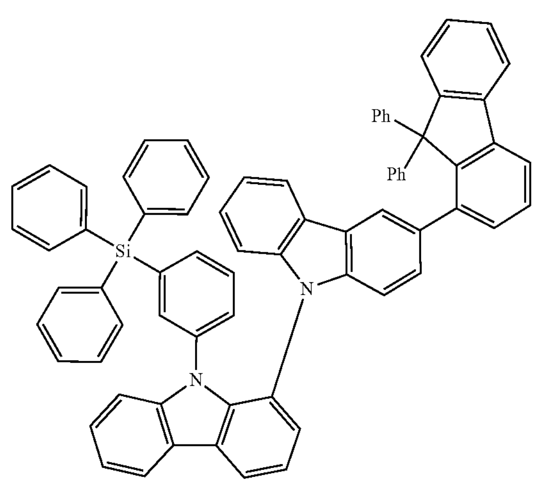

86
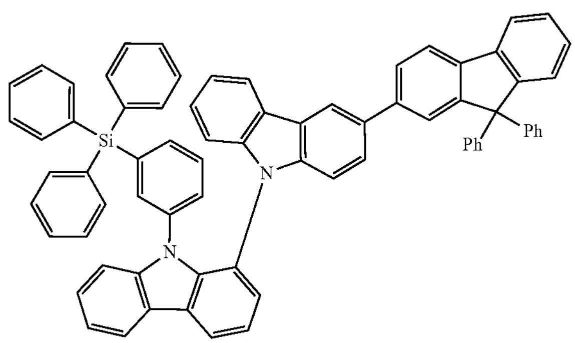
87
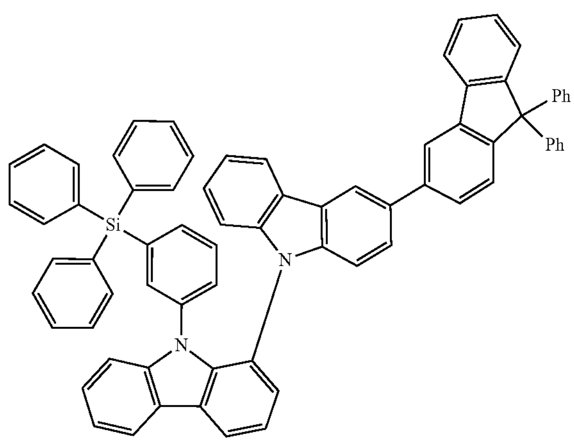
88
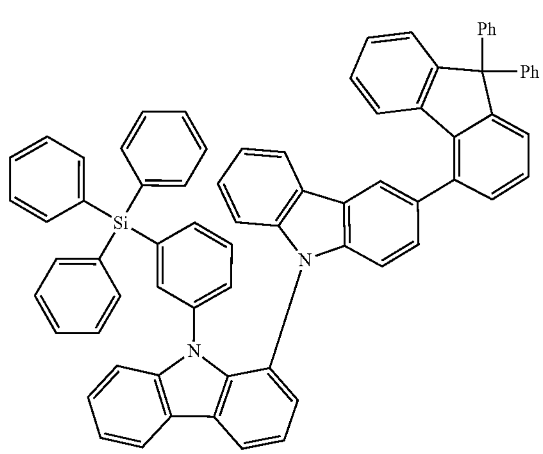
89
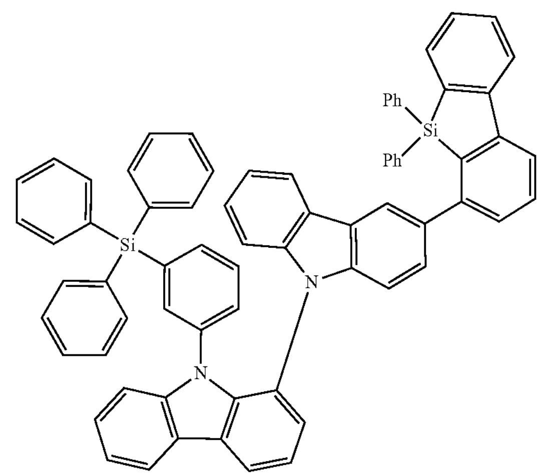
90
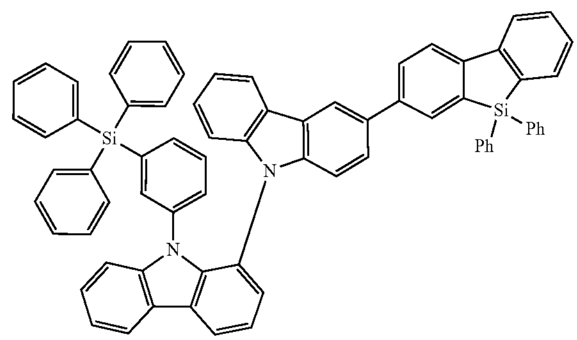
91
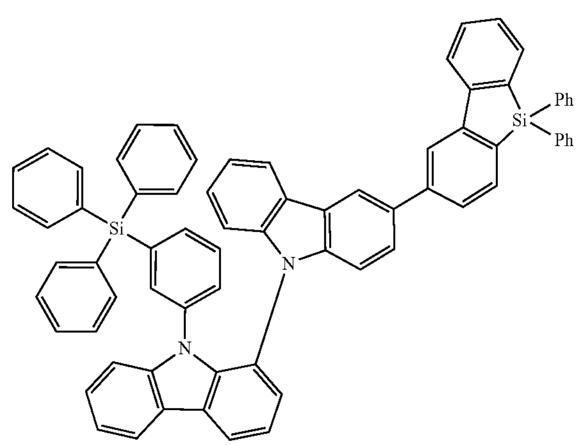

-continued
92
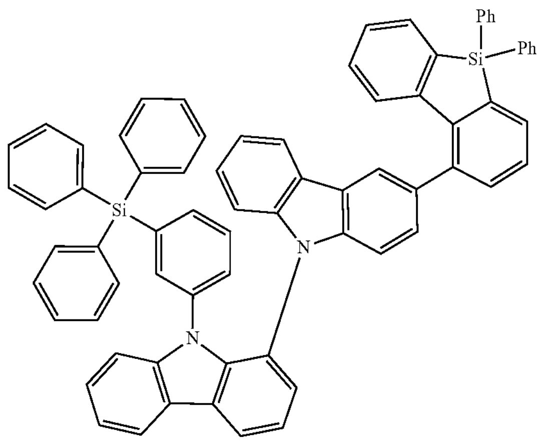
93
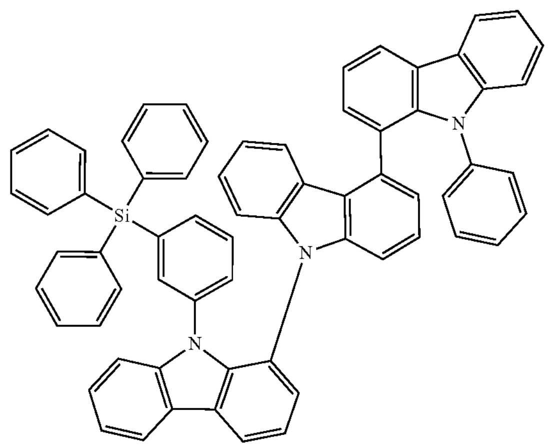
94
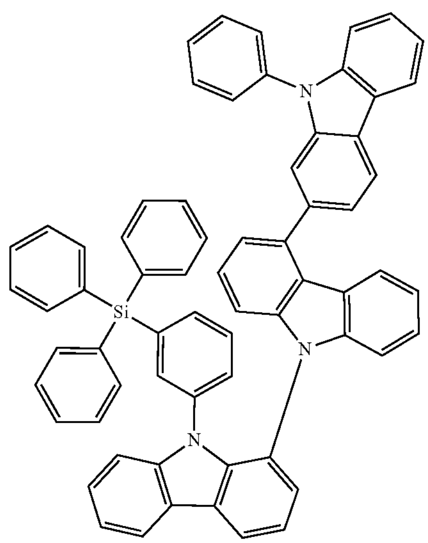
-continued
95
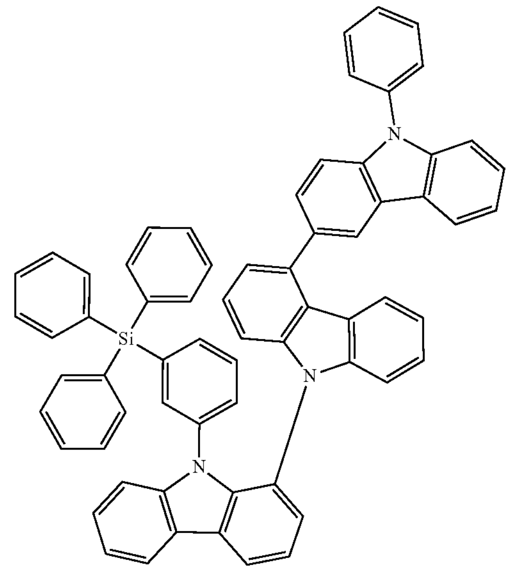
96
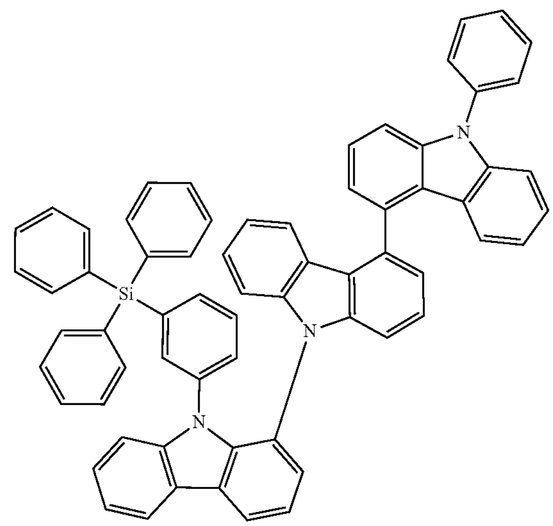
97
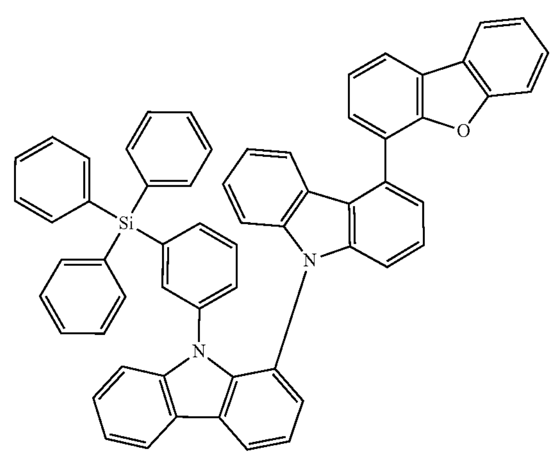

98
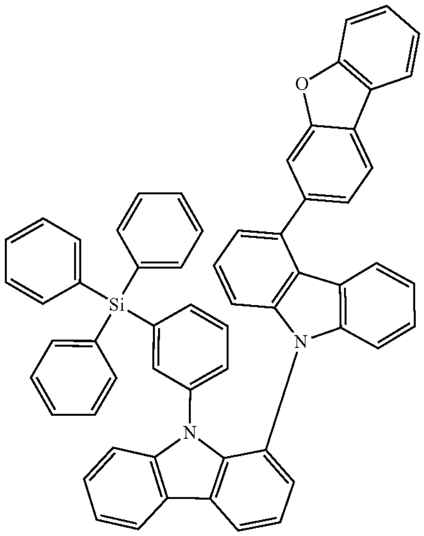
99
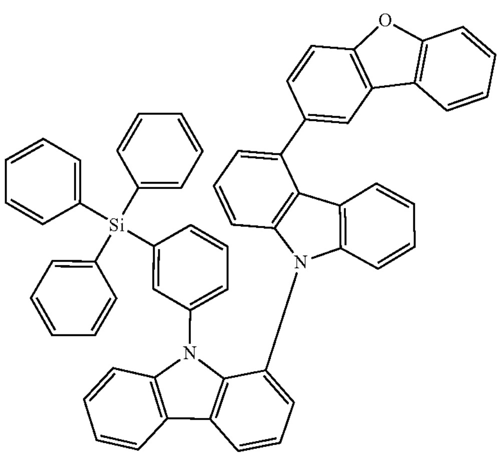
100
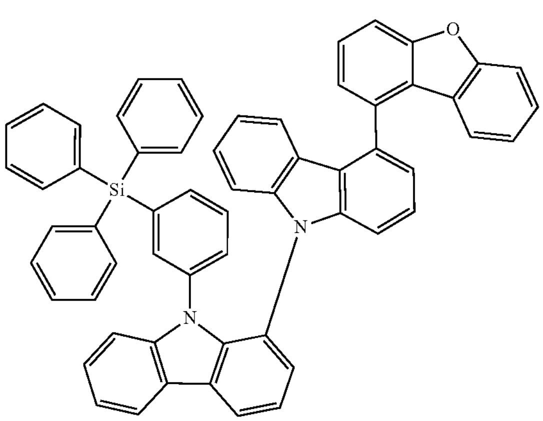
101
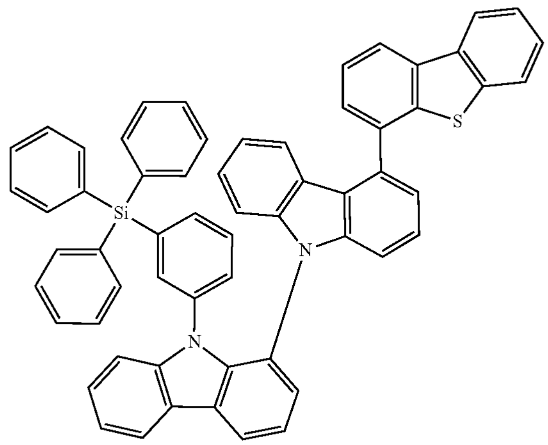
102
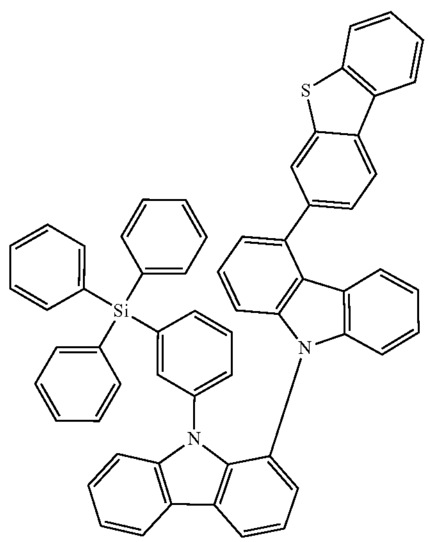
103
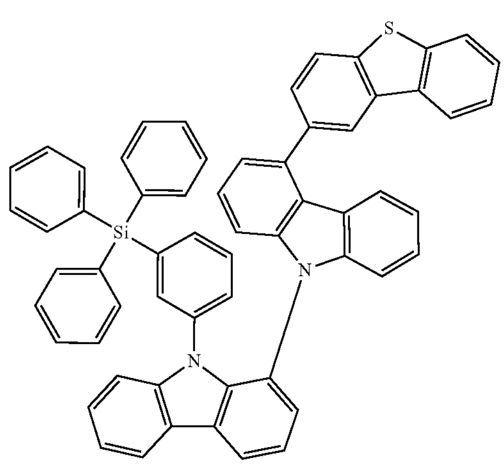

-continued
104
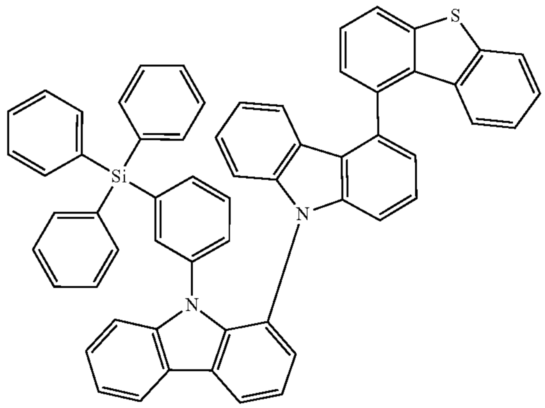
105
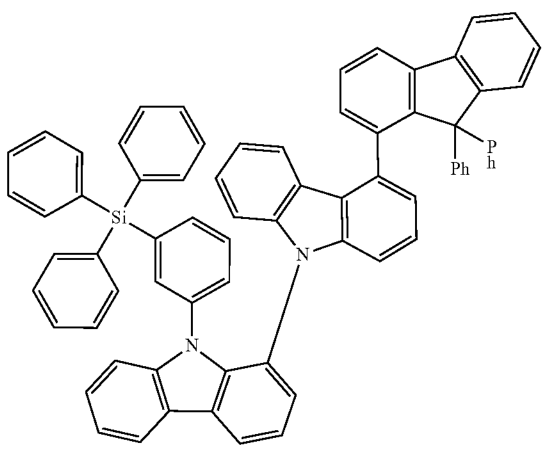
106
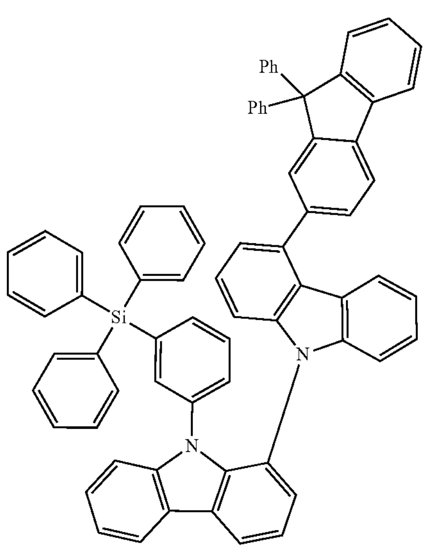
-continued
107
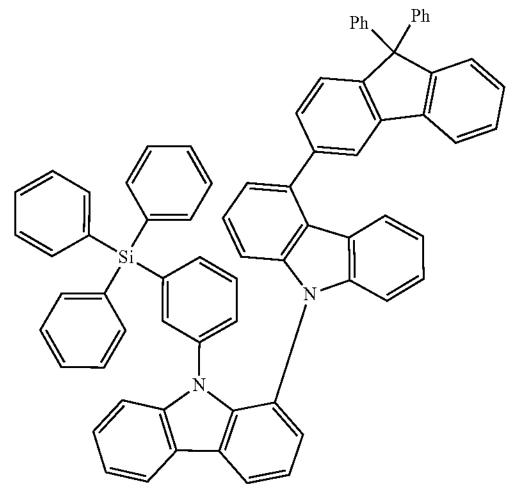
108
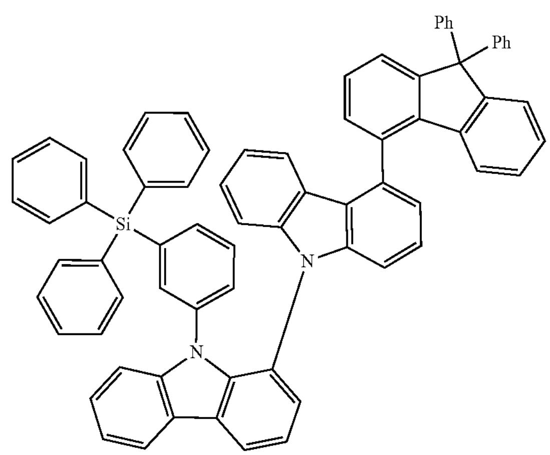
109
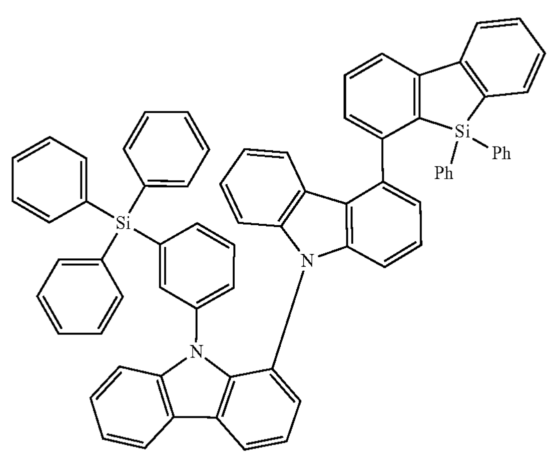

-continued
110
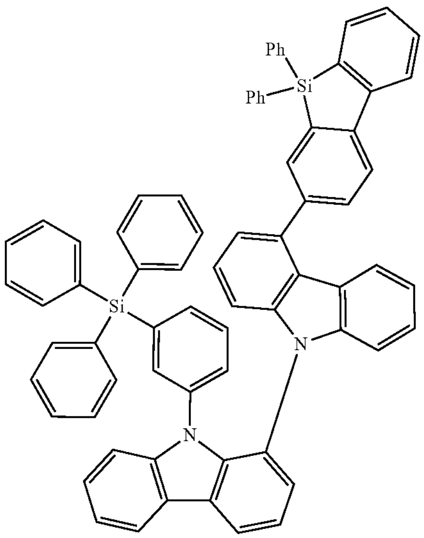
111
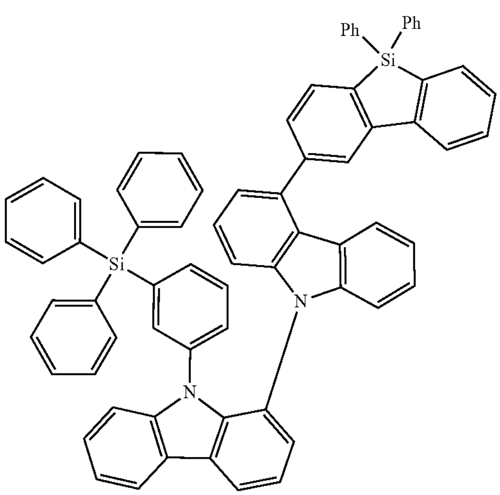
112
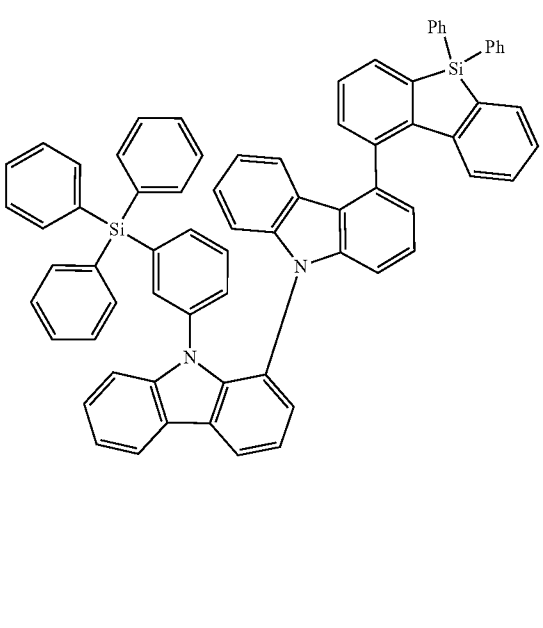
-continued
113
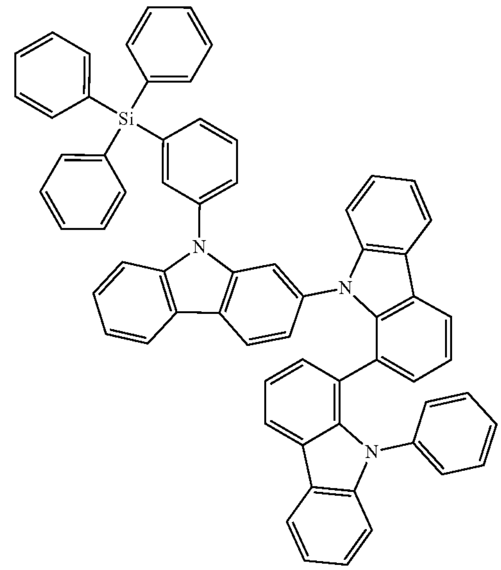
114
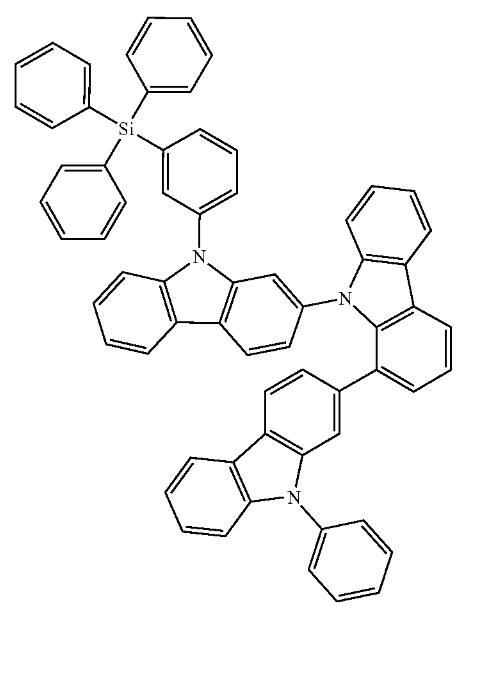

-continued
115
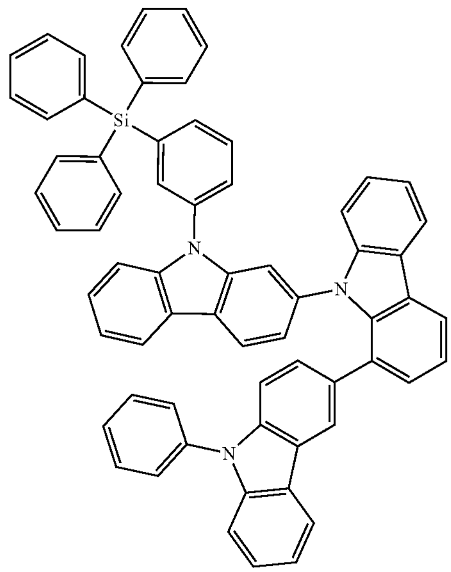
116
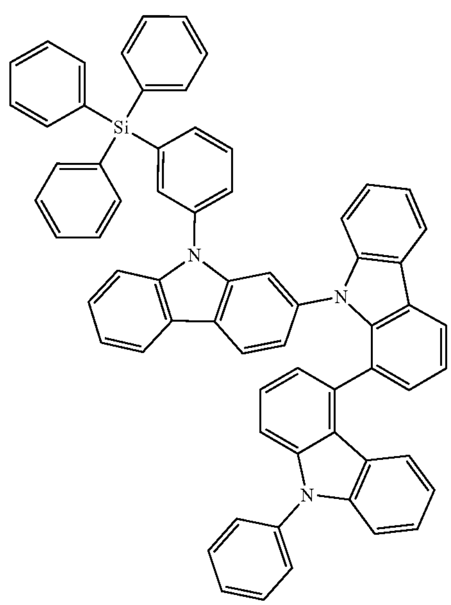
-continued
117
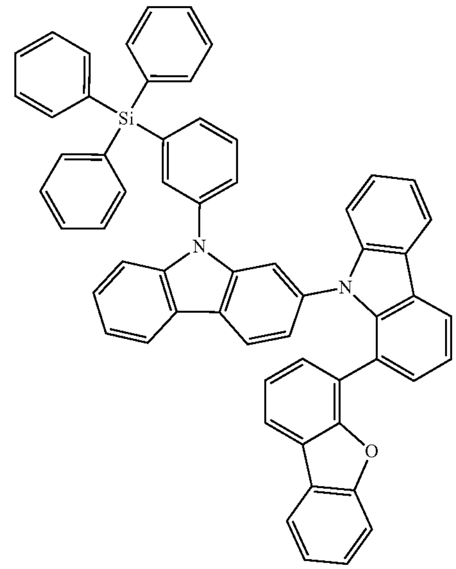
118
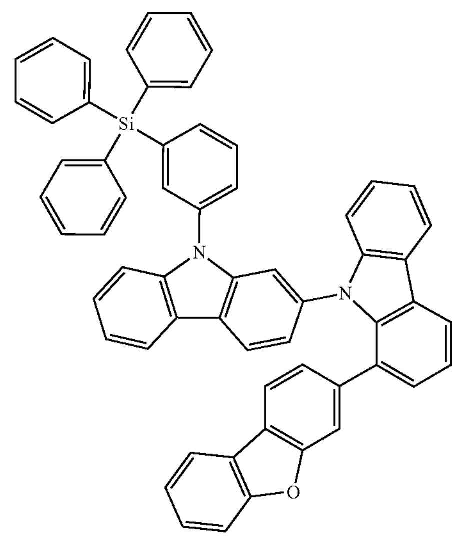
119
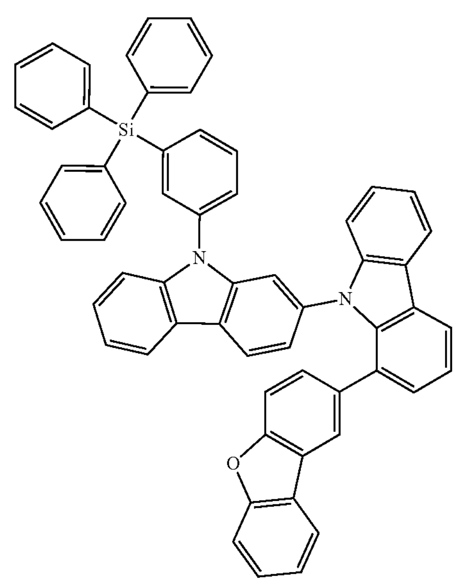

-continued
120
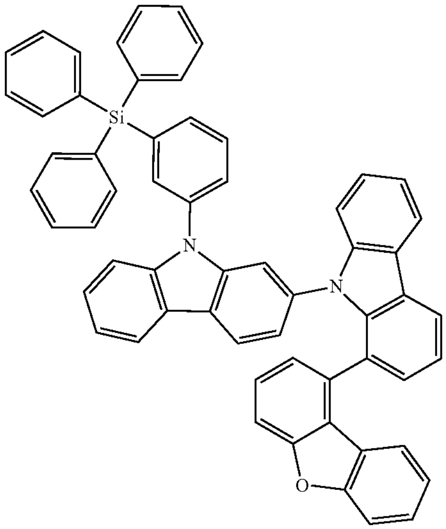
121
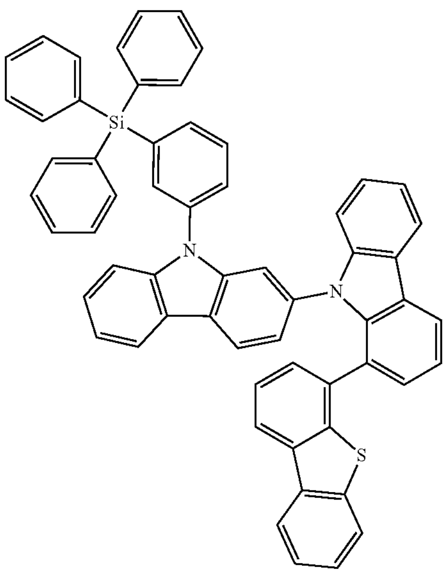
122
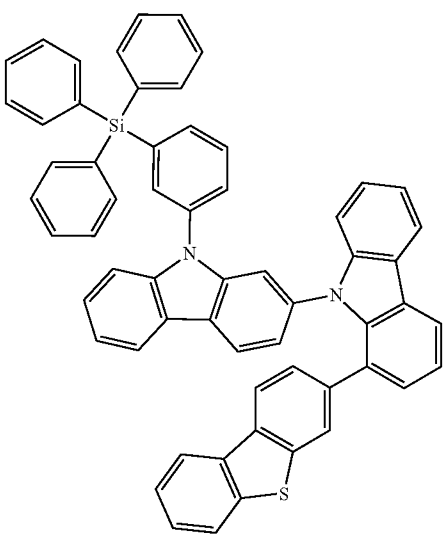
-continued
123
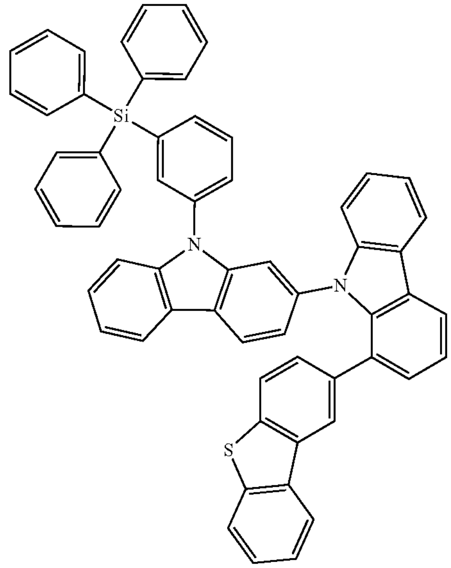
124
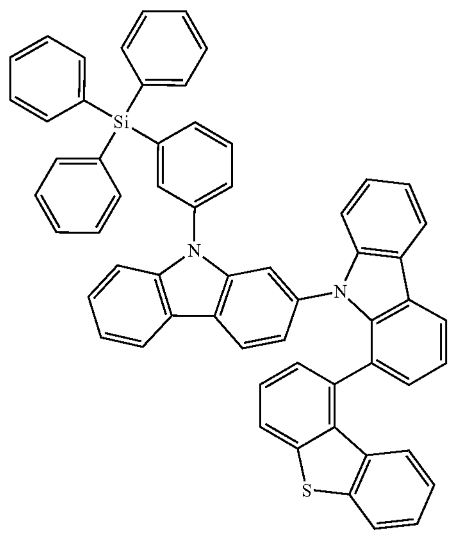
125
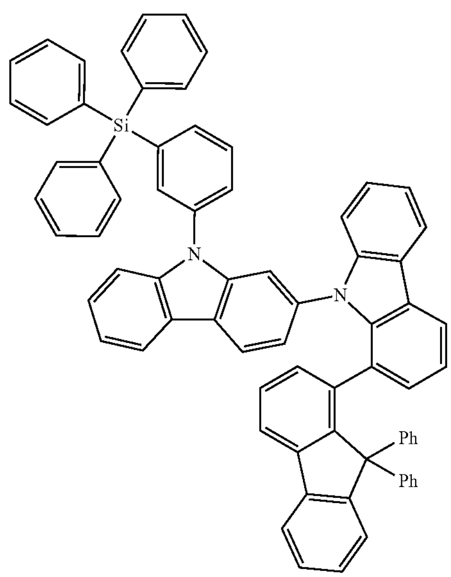

-continued
126
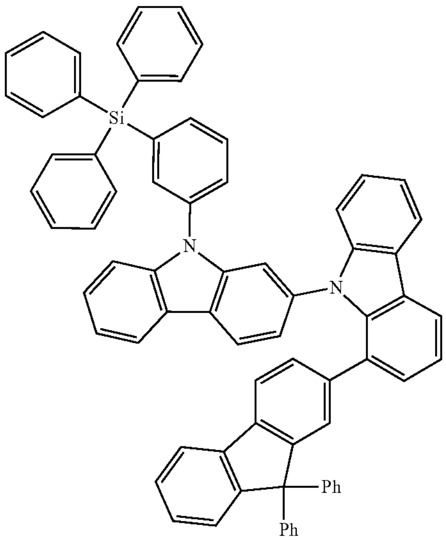
127
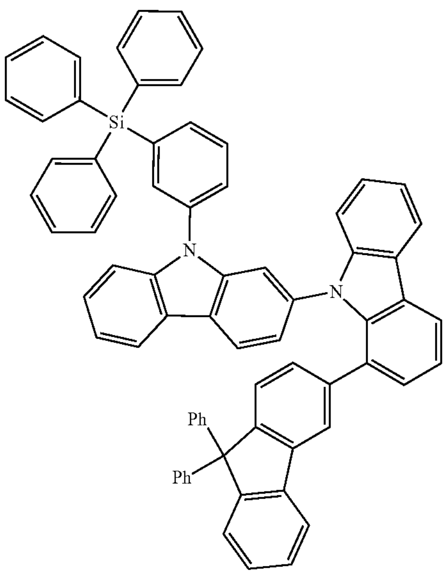
128
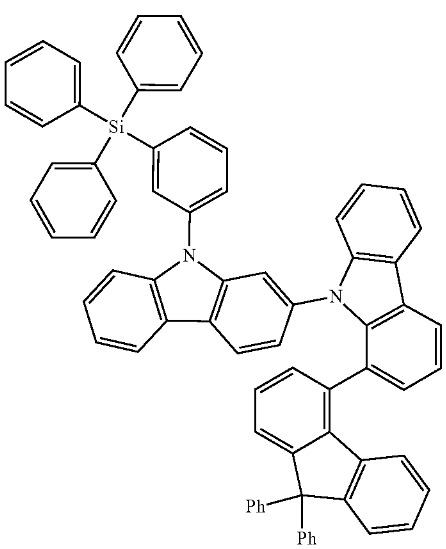
-continued
129
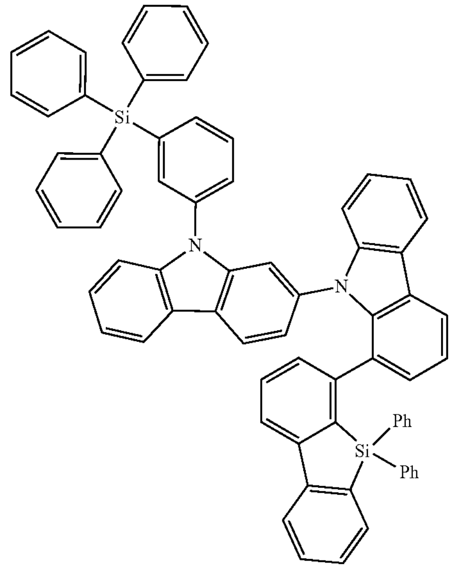
130
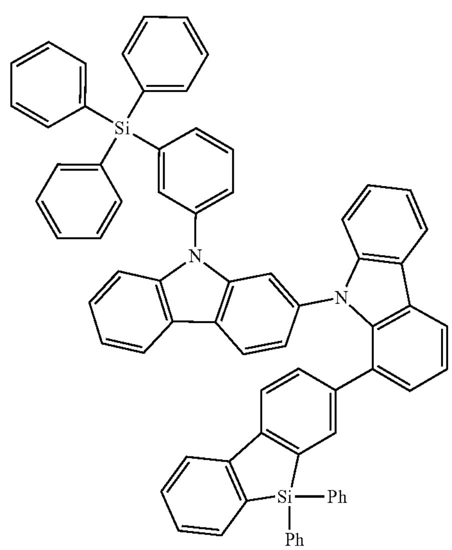

-continued
131
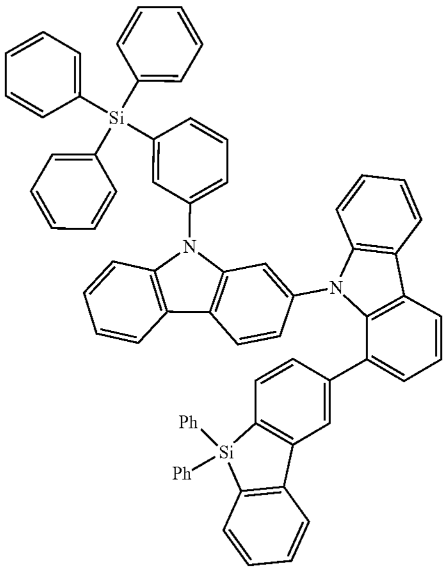
132
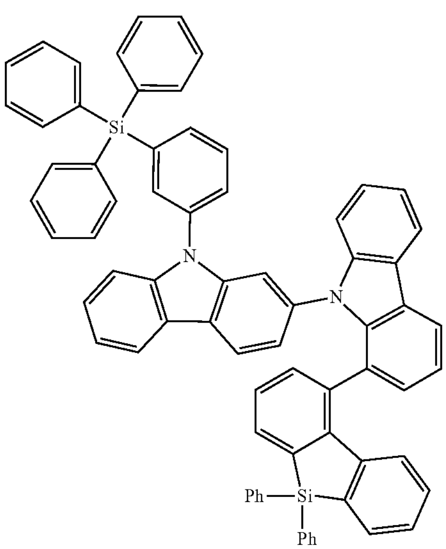
-continued
133
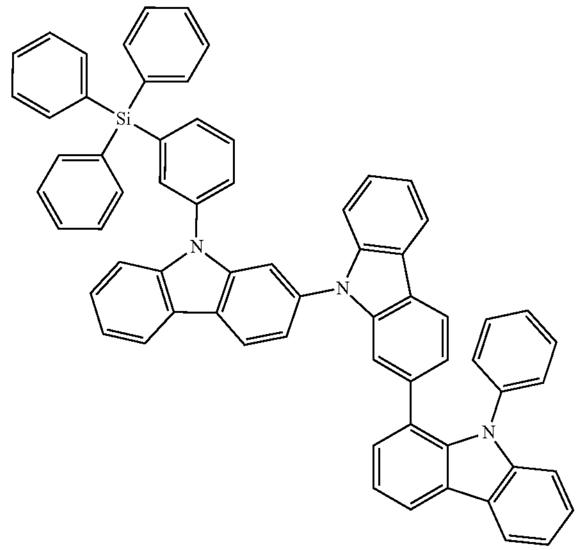
134
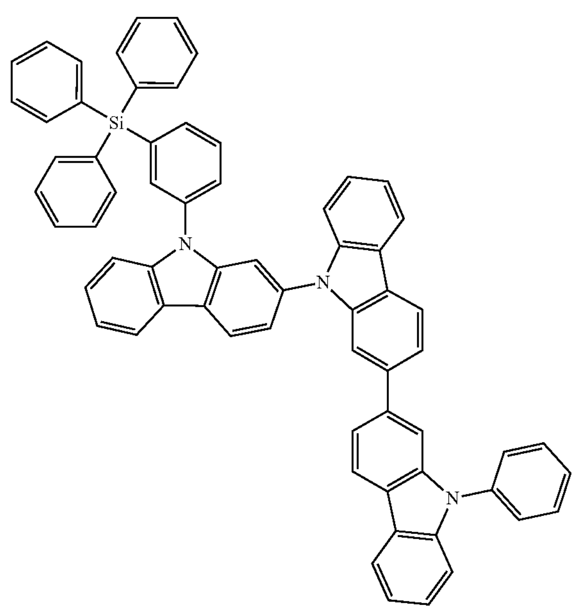

-continued
135
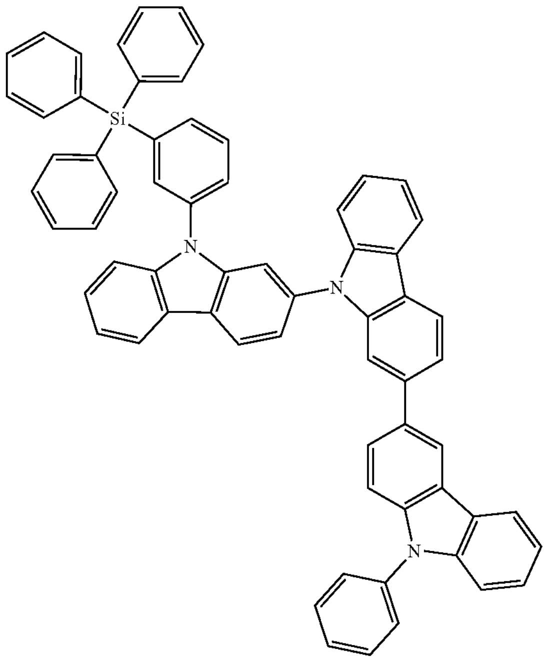
136
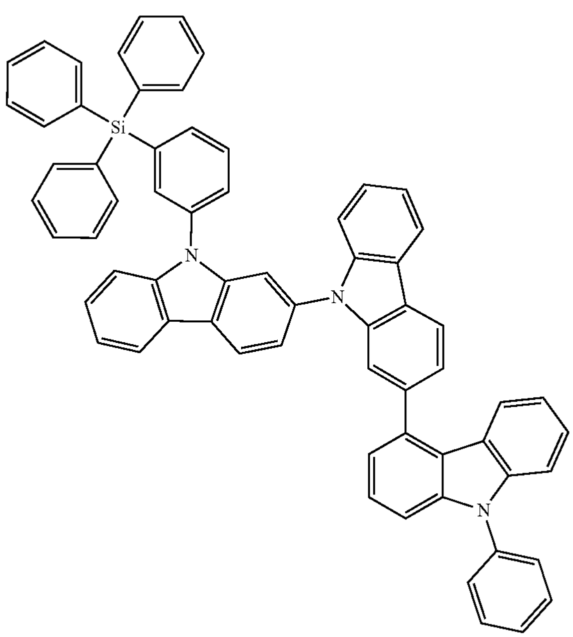
-continued
137
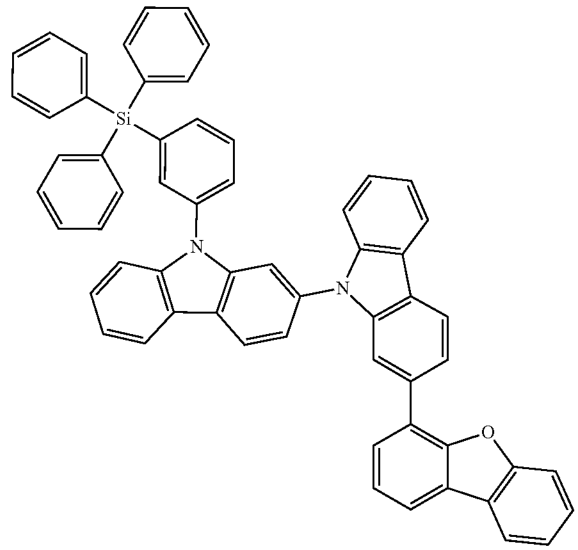
138
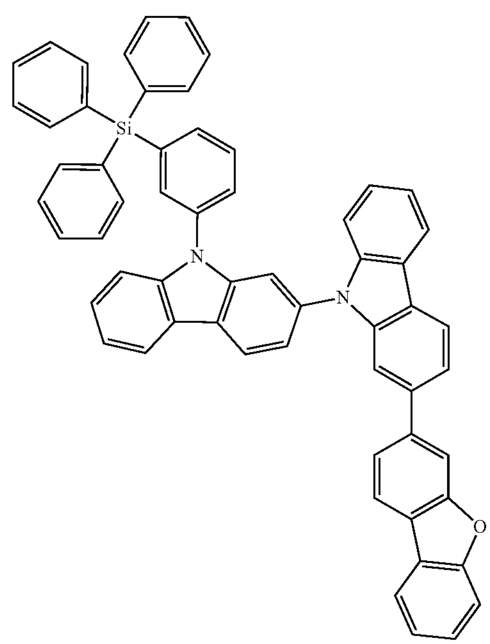

-continued
139
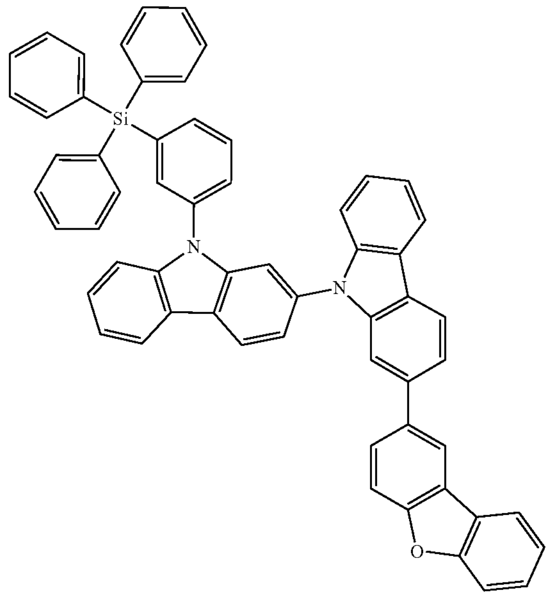
140
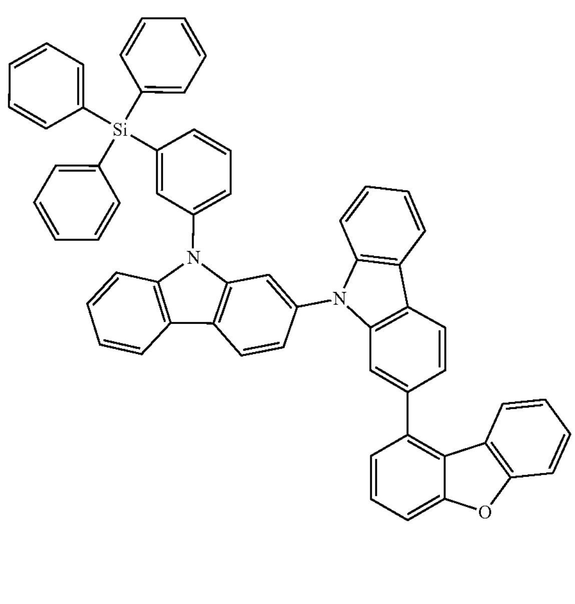
-continued
141
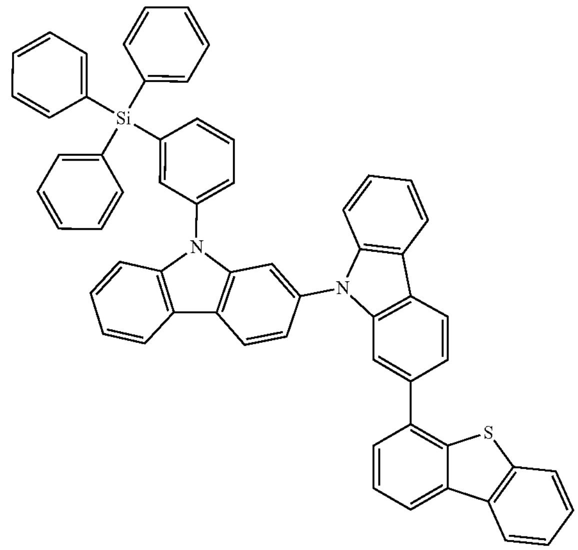
142
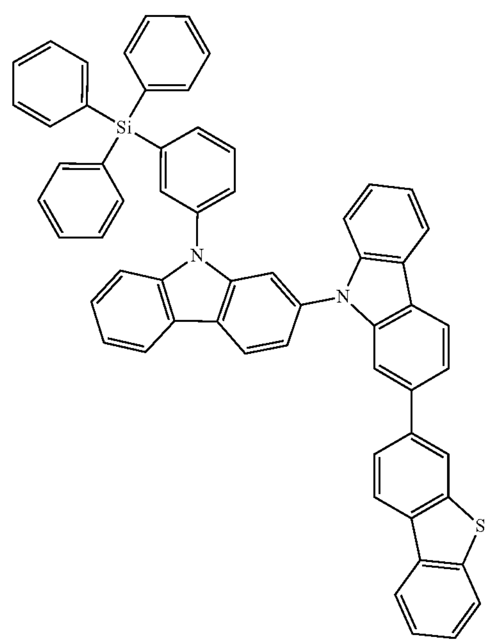

143
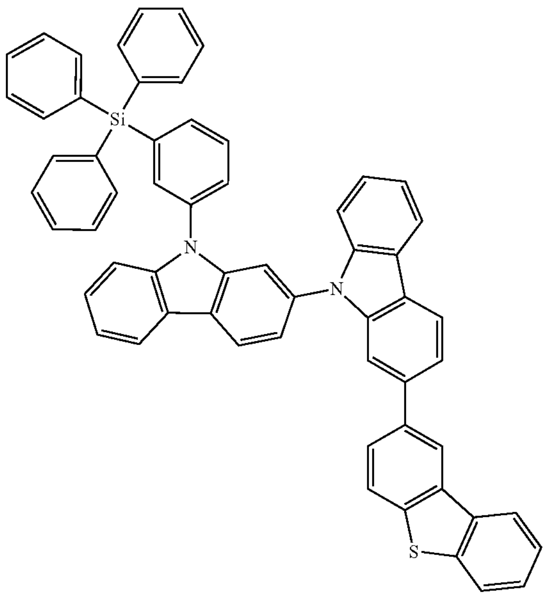
144
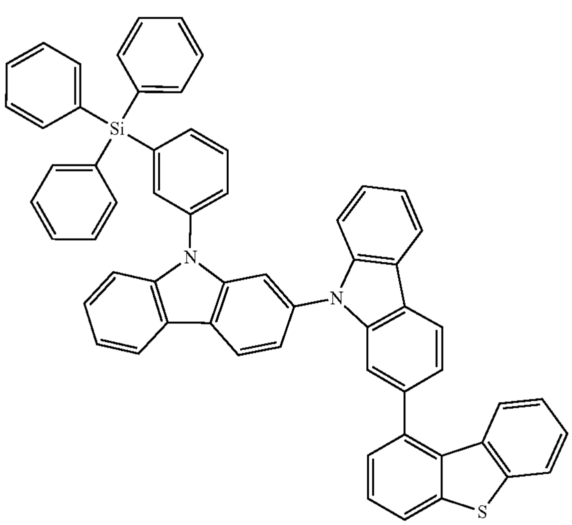
145
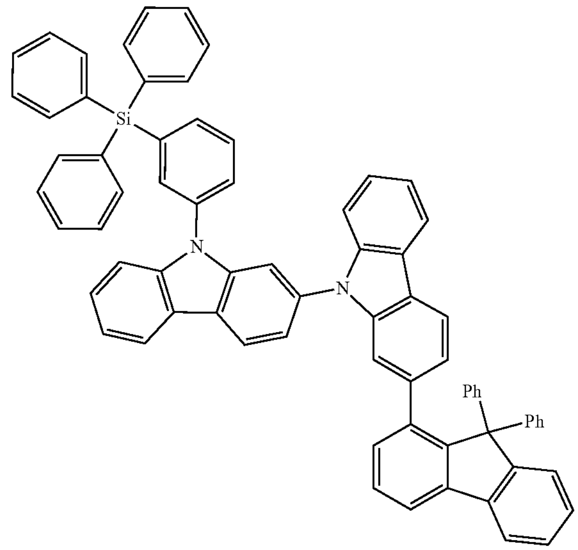
146
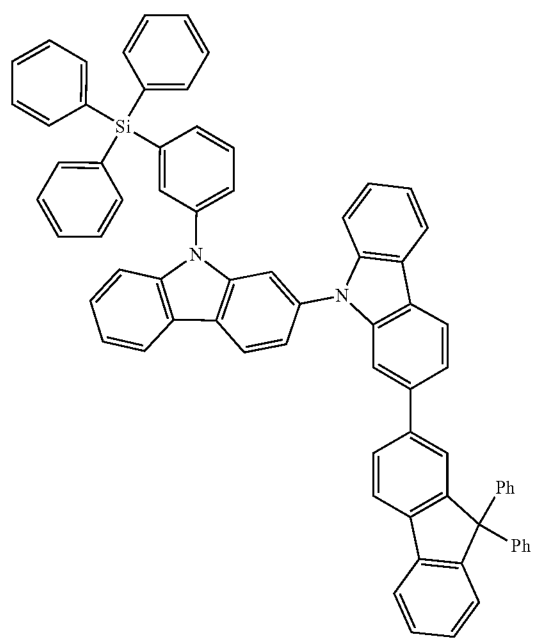

147
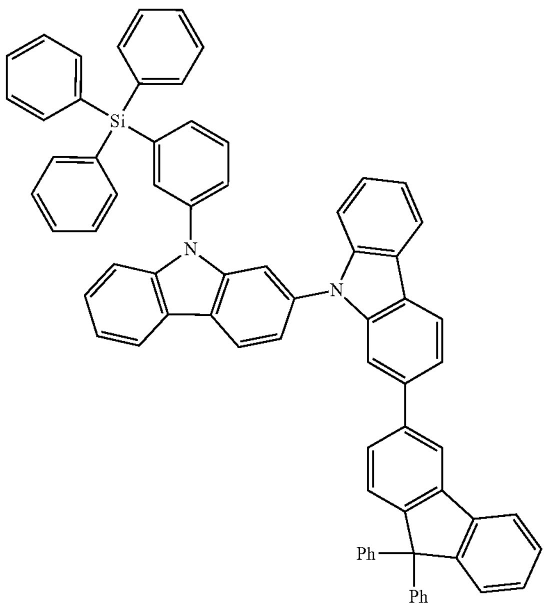
148
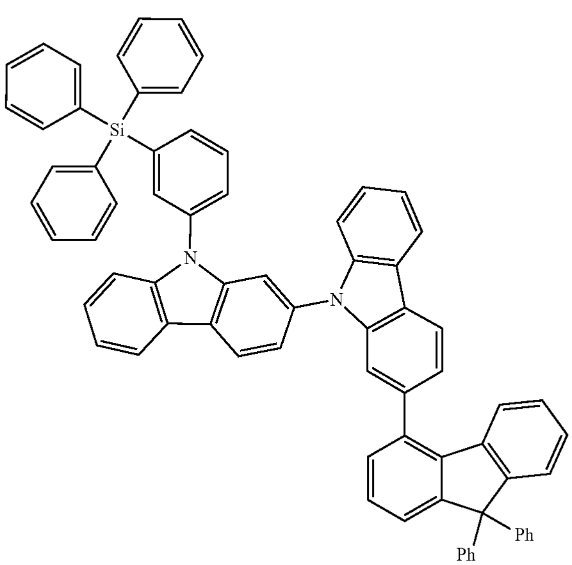
149
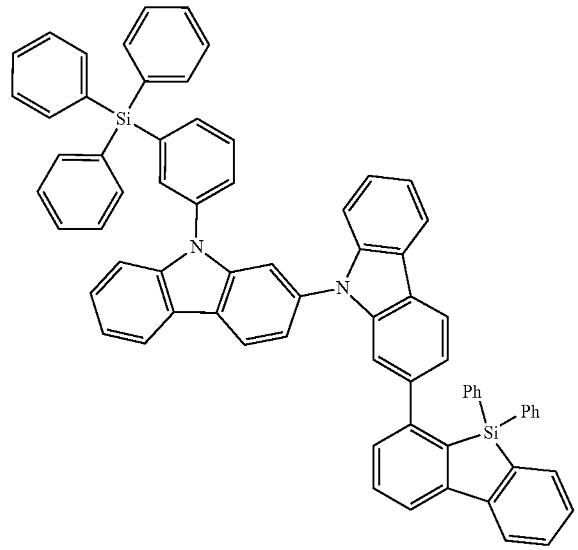
150
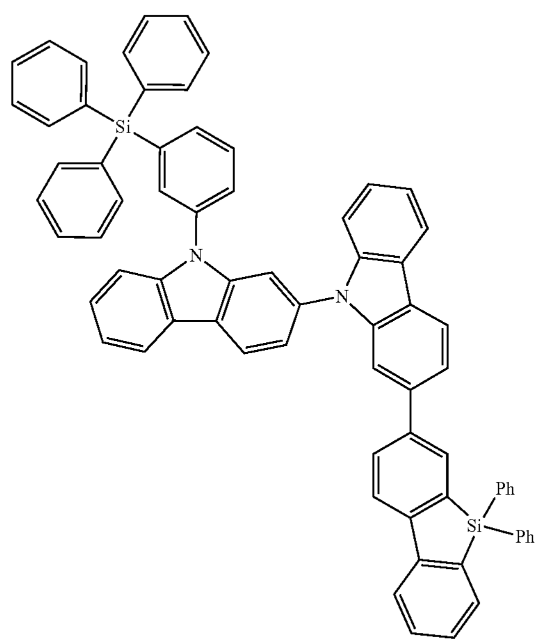

-continued
151
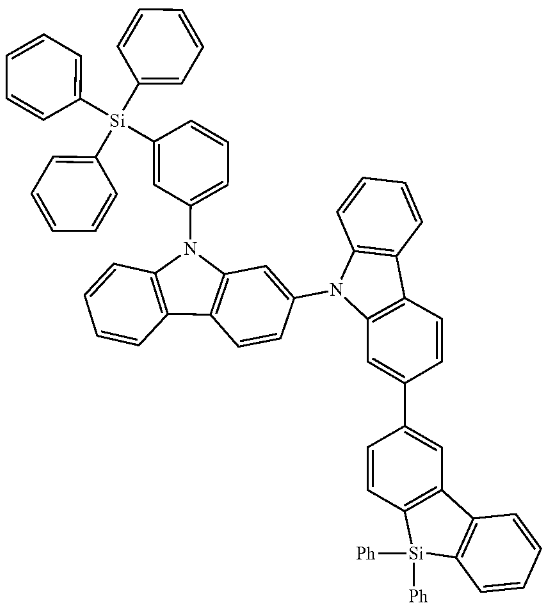
152
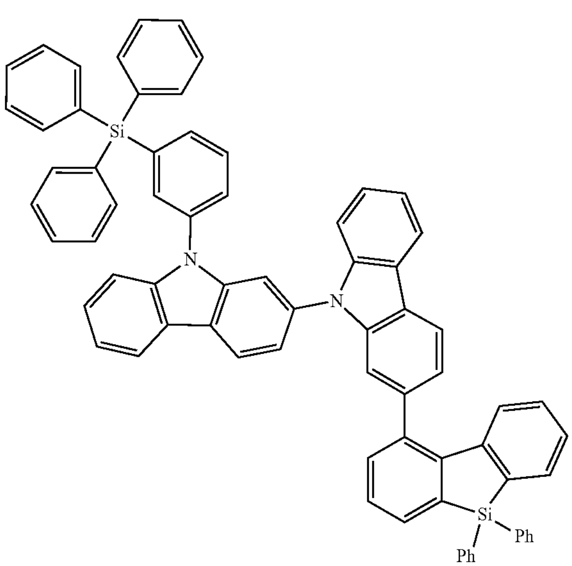
-continued
153
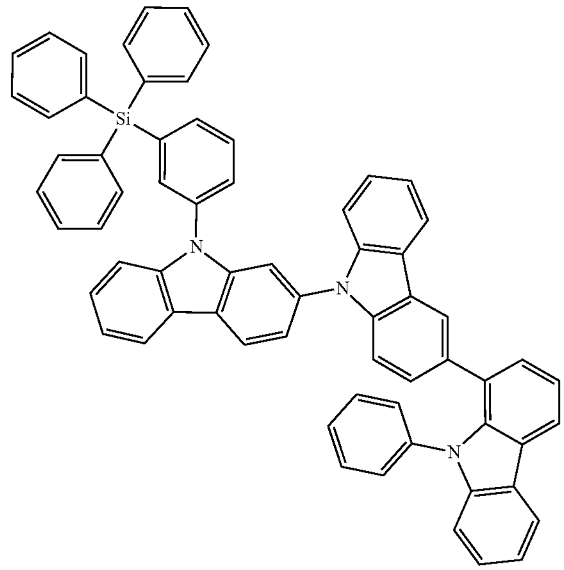
154
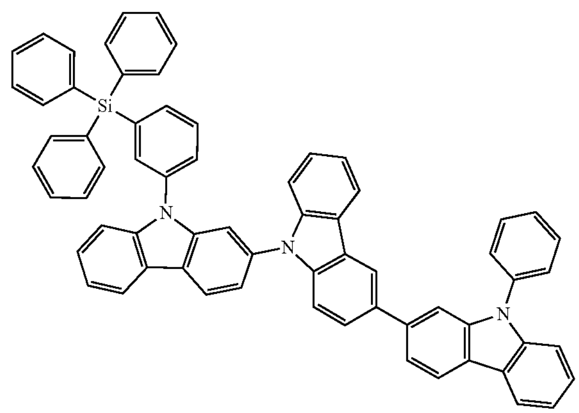
155
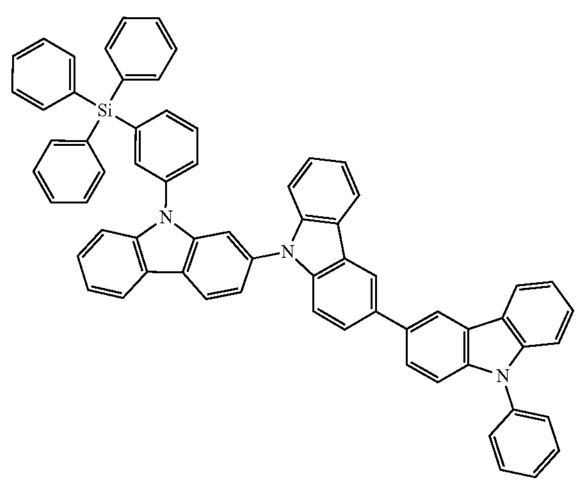

-continued
156
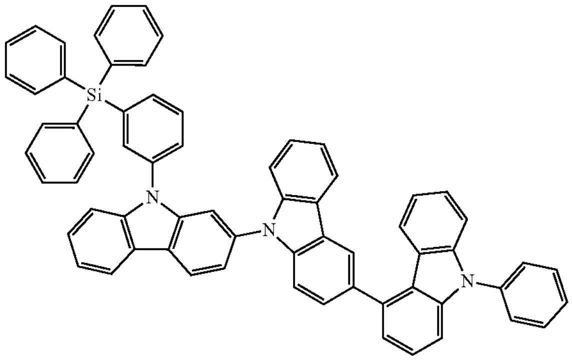
157
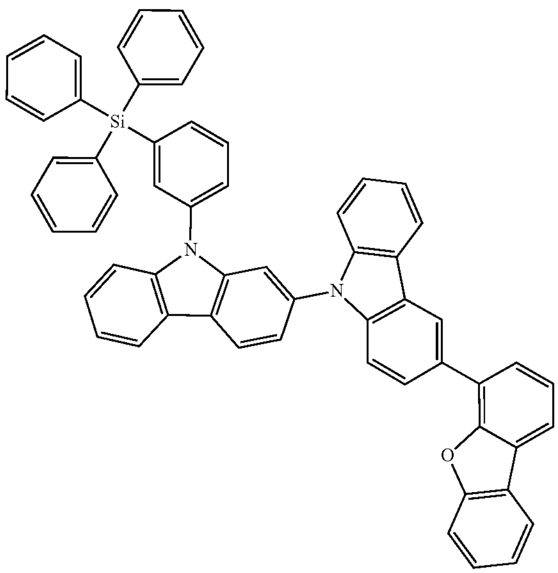
158
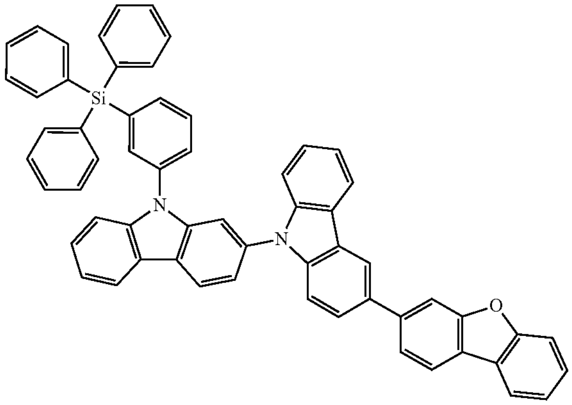
-continued
159
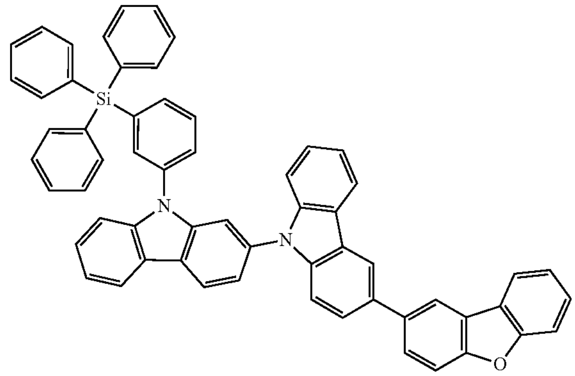
160
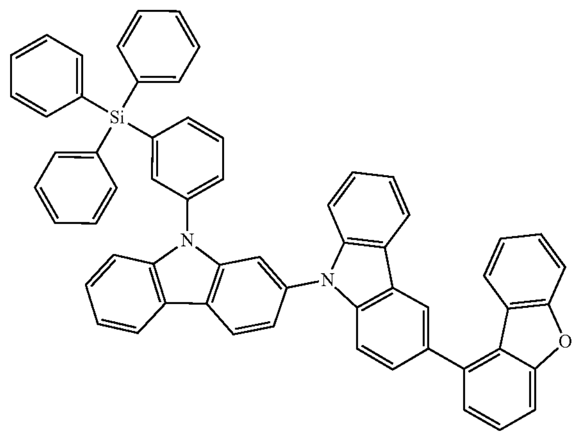
161
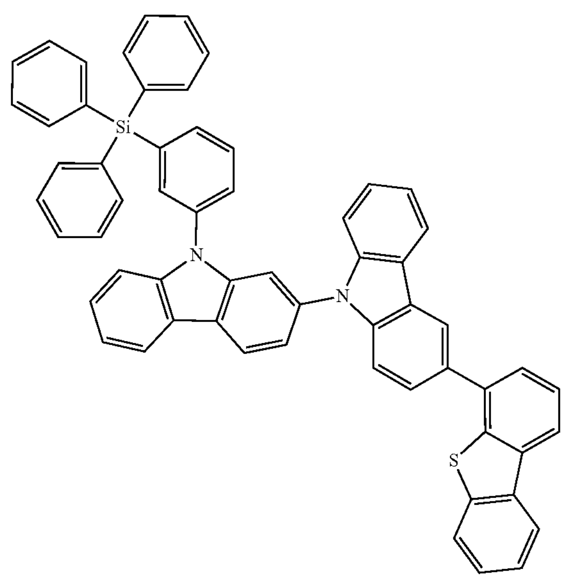

-continued
162
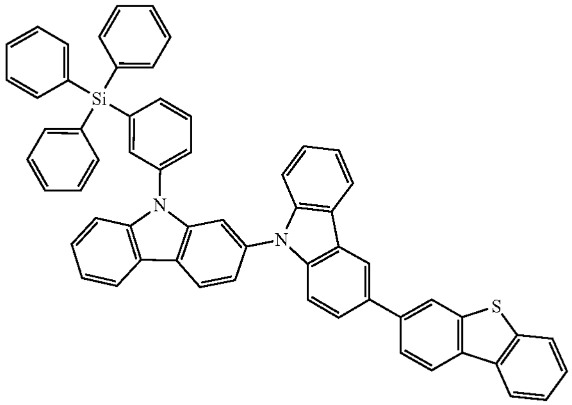
163
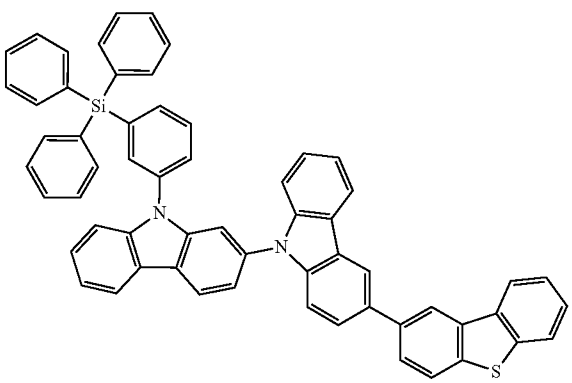
164
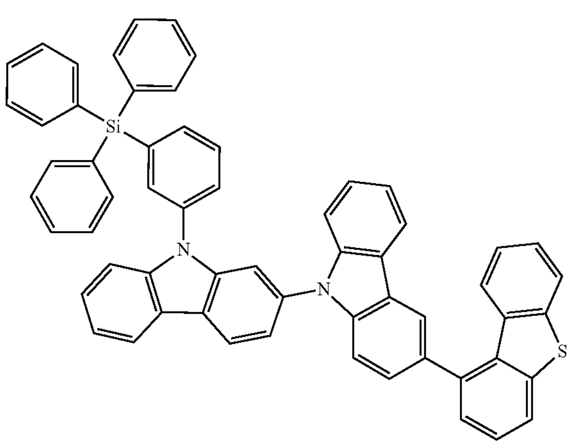
-continued
165
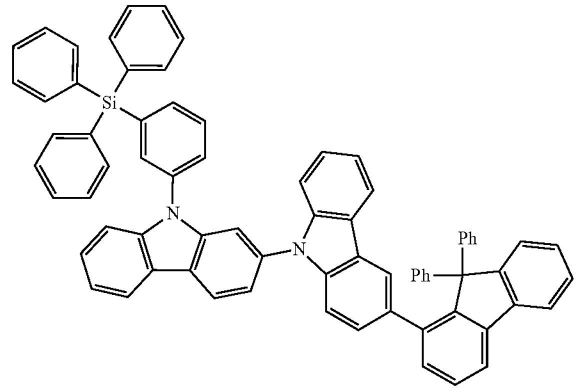
166
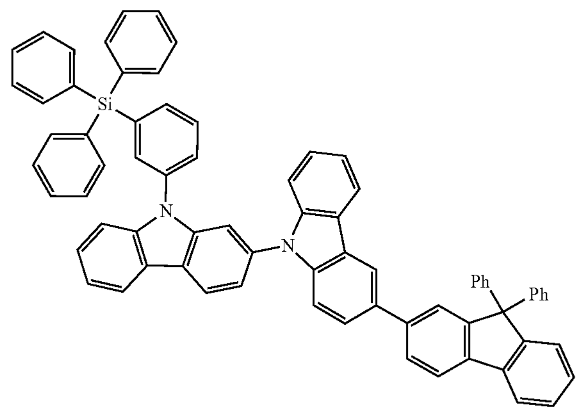
167
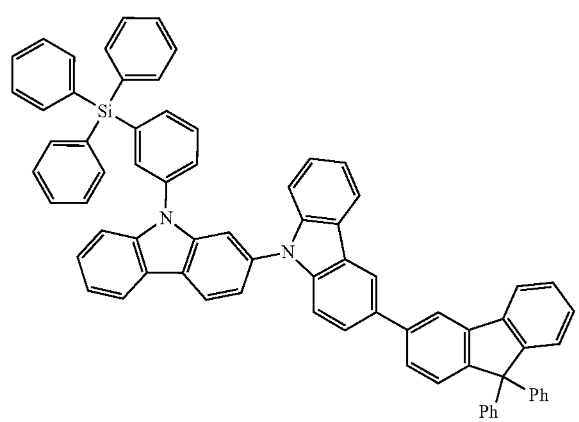

-continued
168
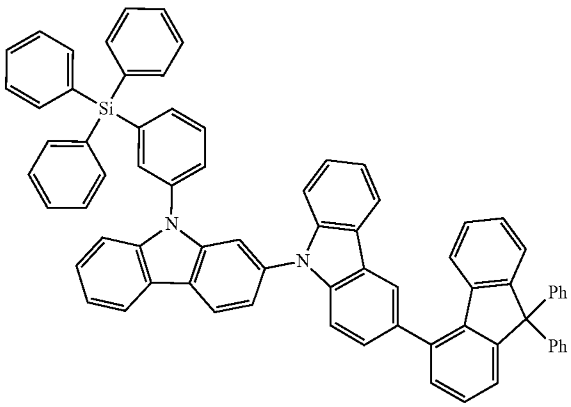
169
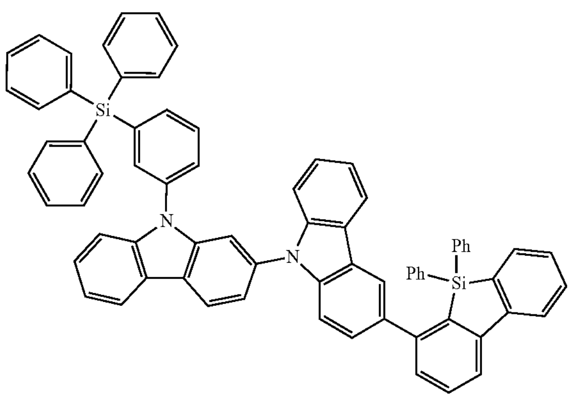
170
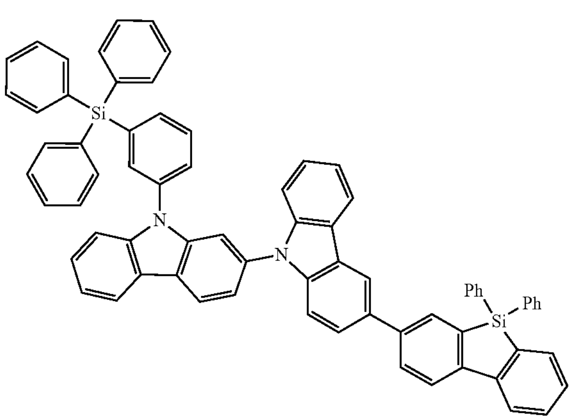
-continued
171
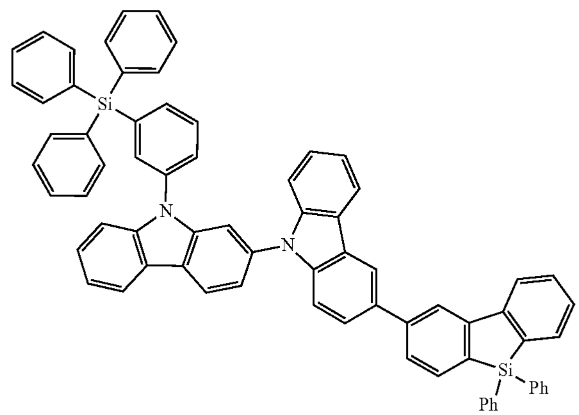
172
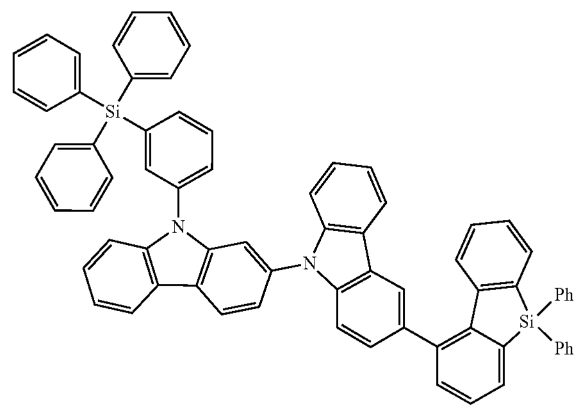
173
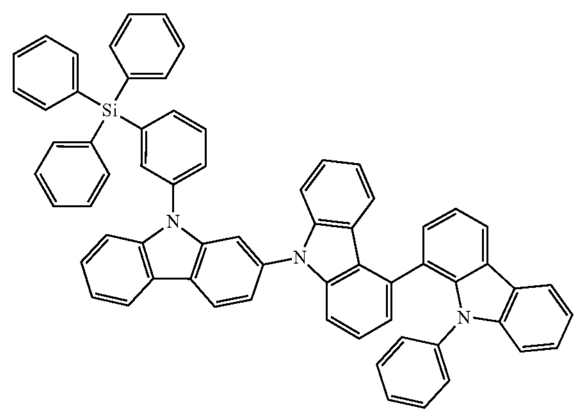
174
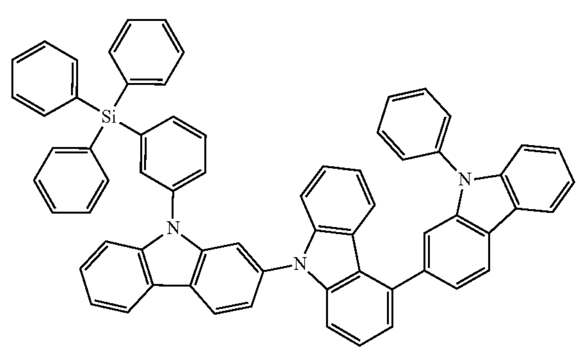

-continued
175
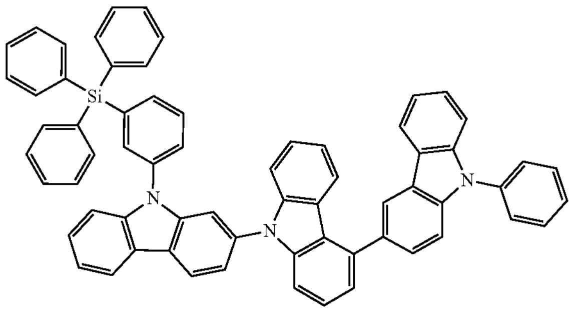
176
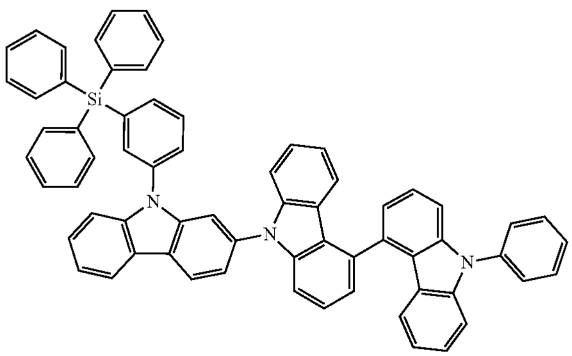
177
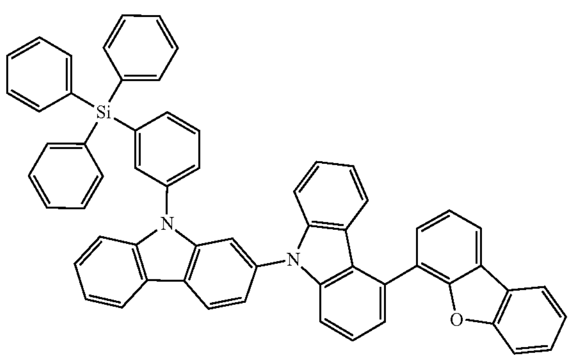
178
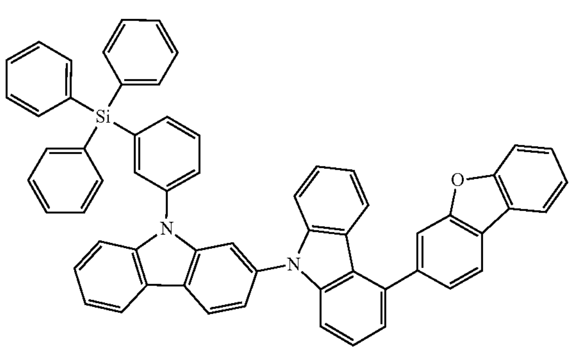
-continued
179
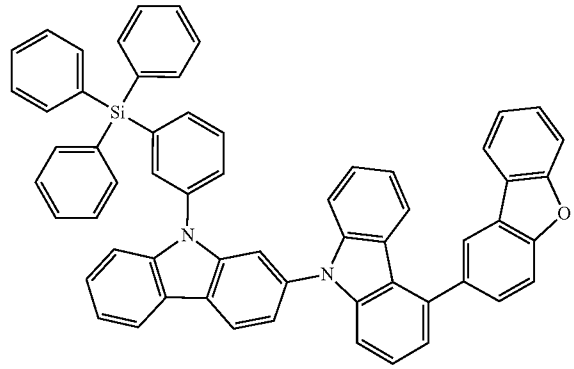
180
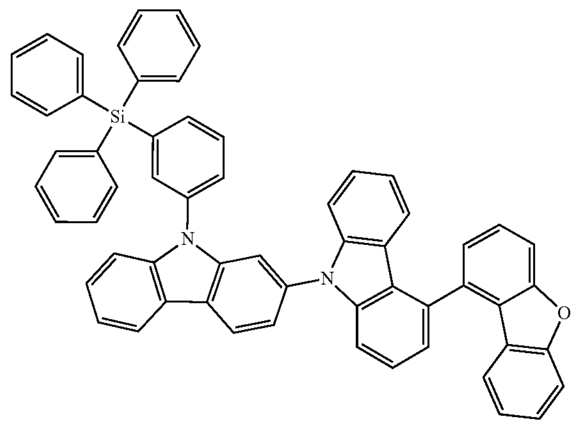
181
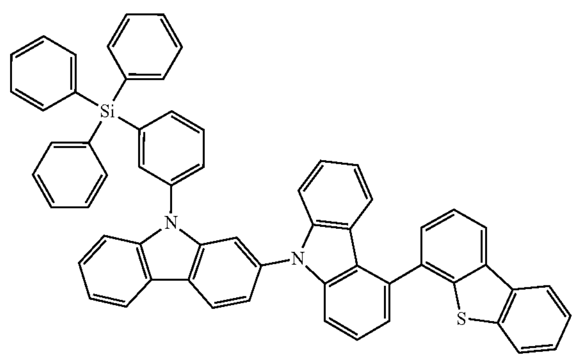
182
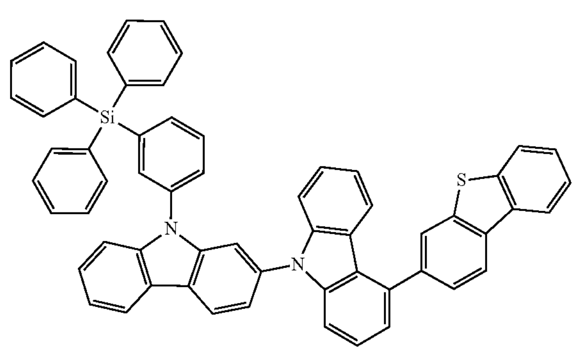

-continued
183
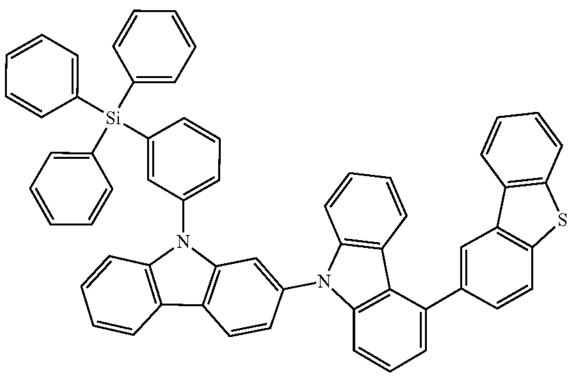
184
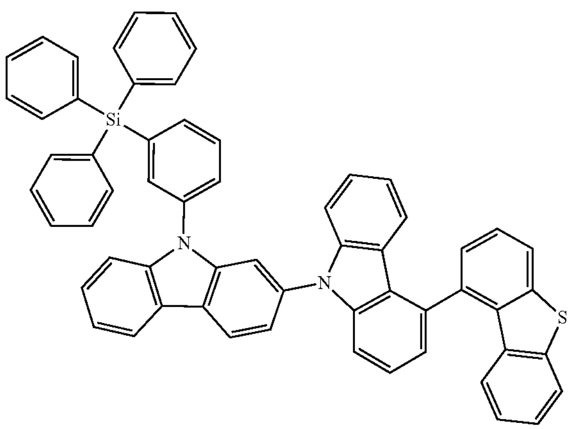
185
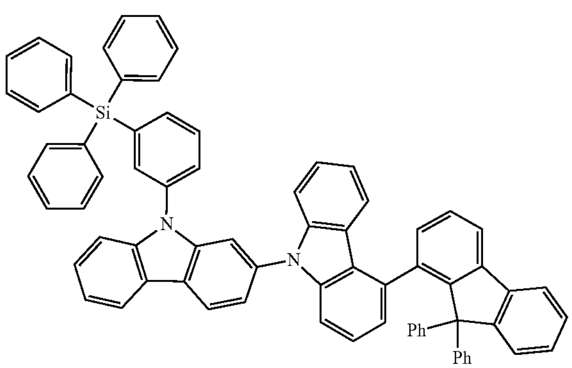
186
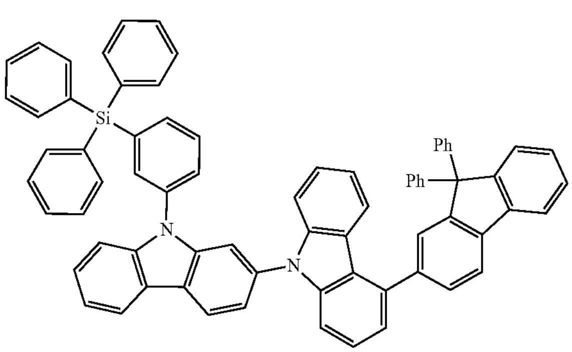
-continued
187
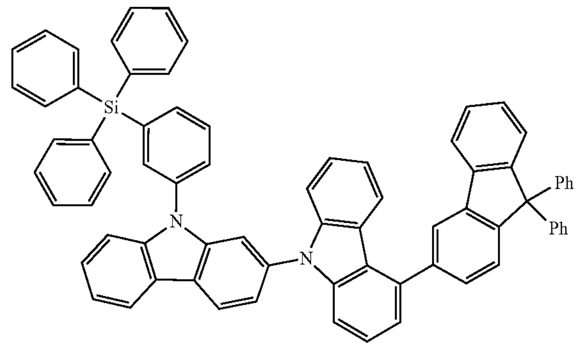
188
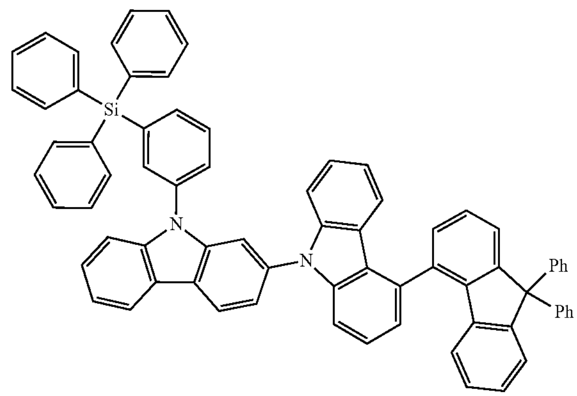
189
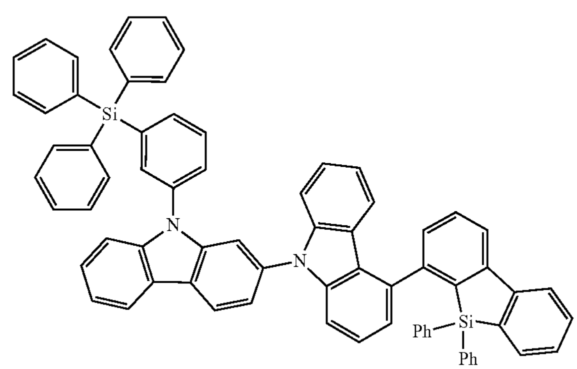
190
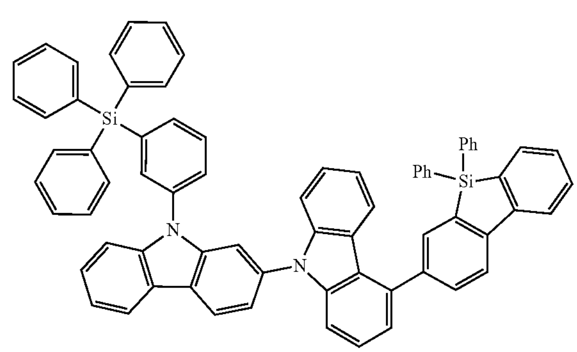

191
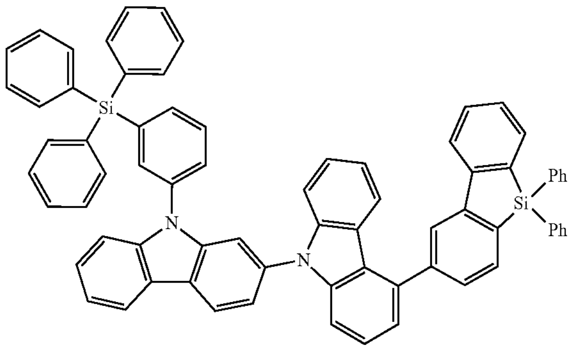
192
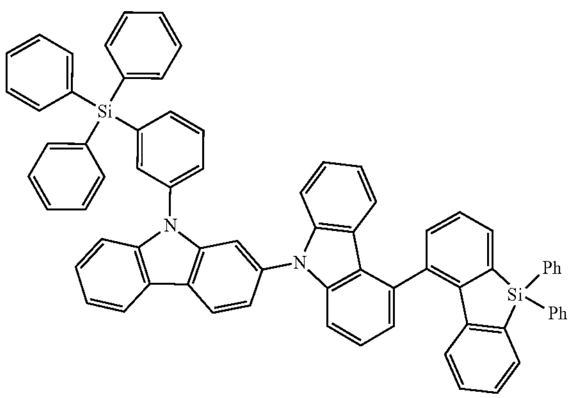
193
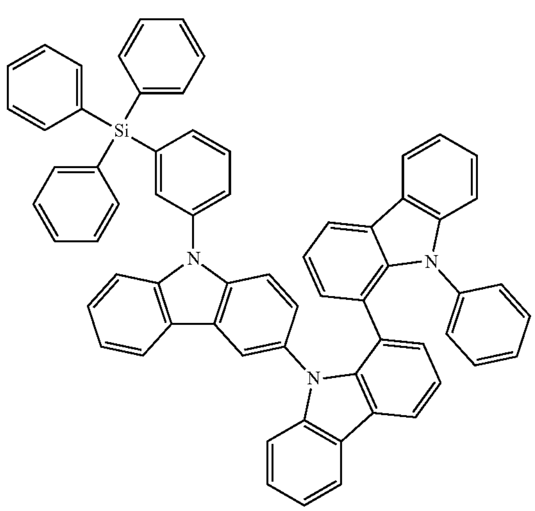
194
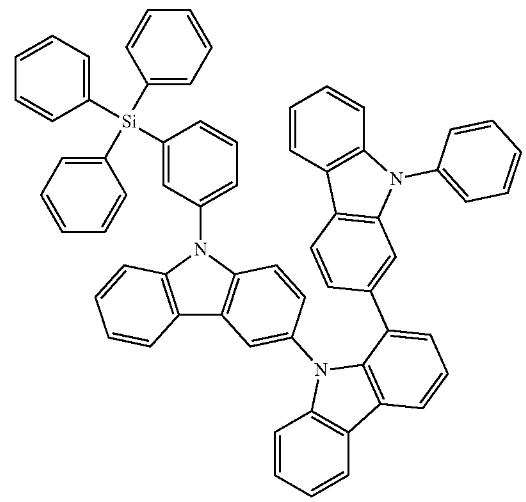
195
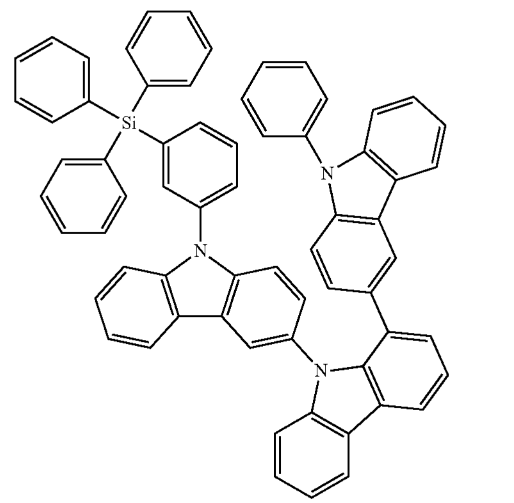
196
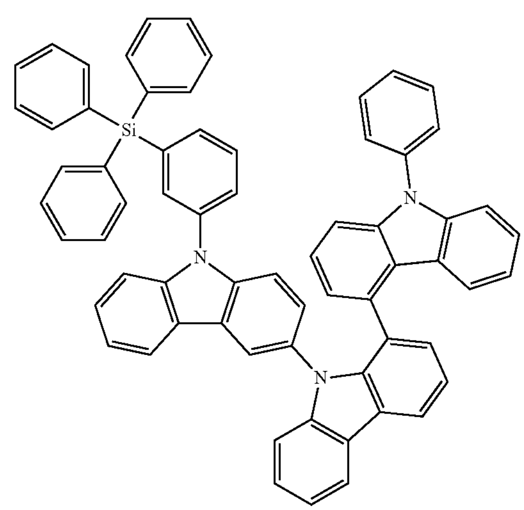

-continued
197
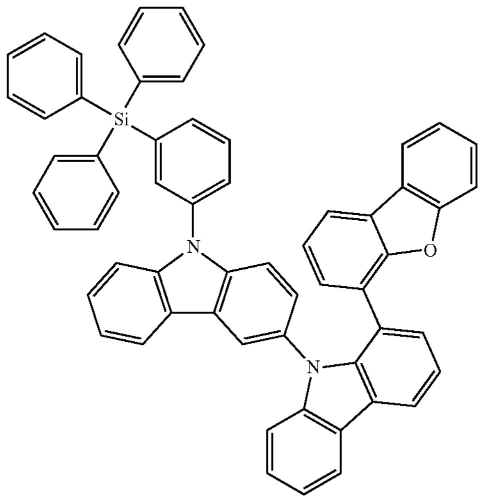
198
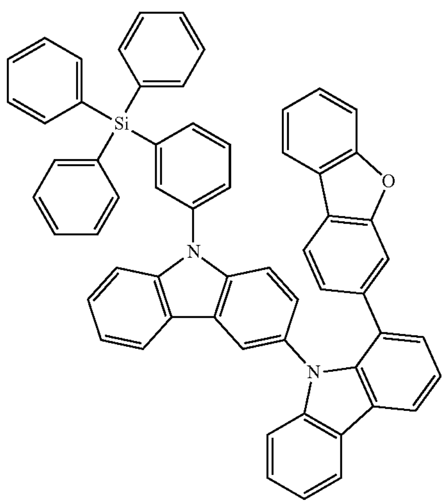
199
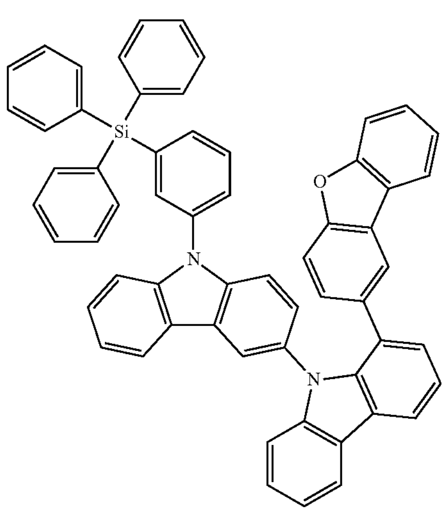
-continued
200
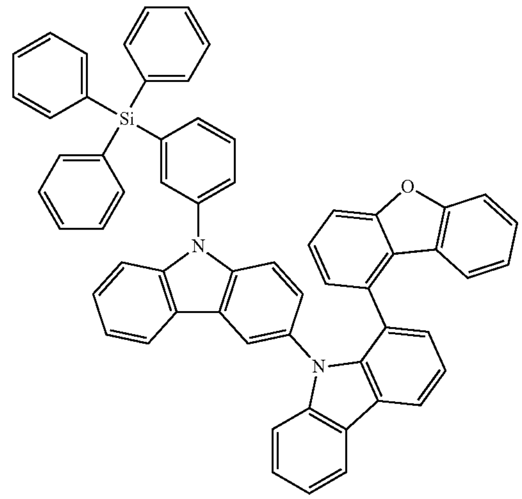
201
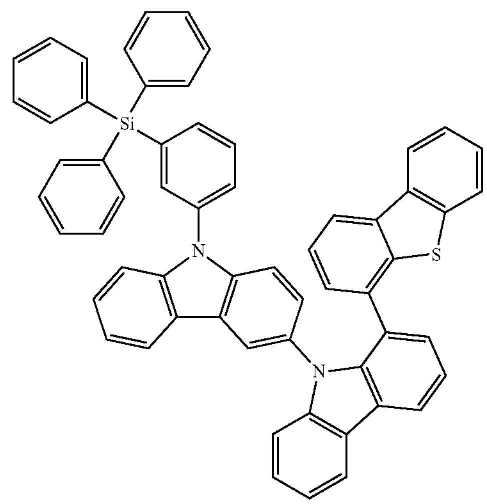
202
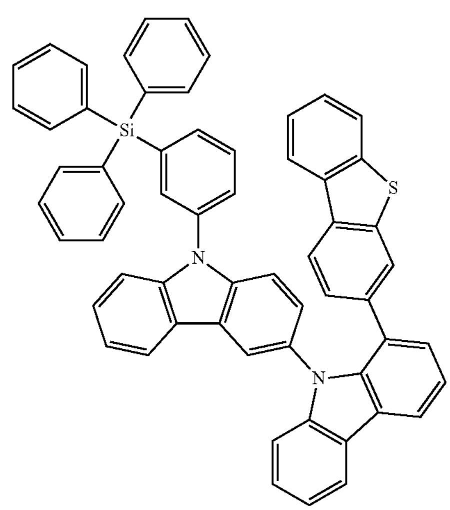

-continued
203
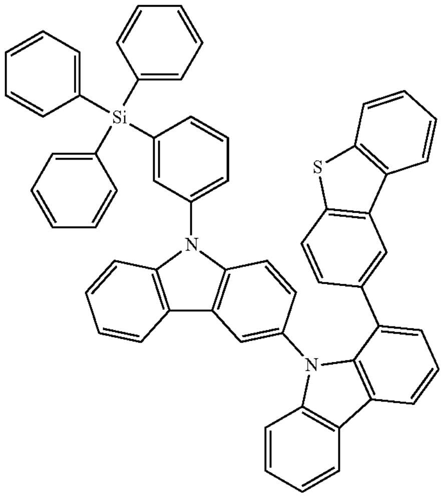
204
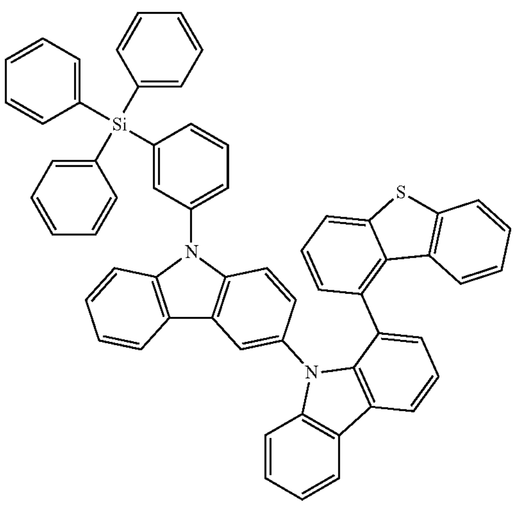
205
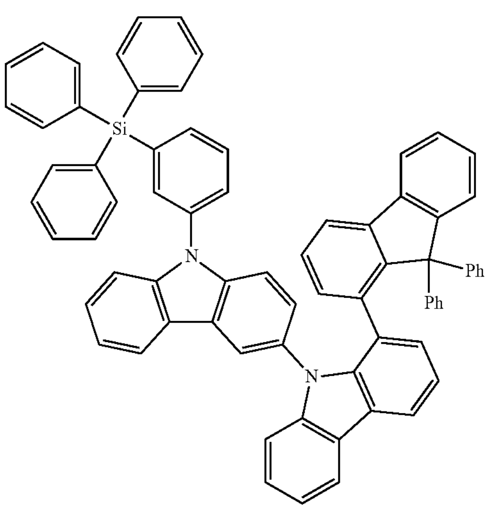
-continued
206
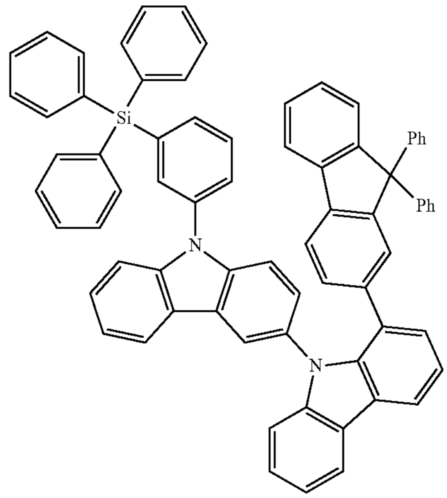
207
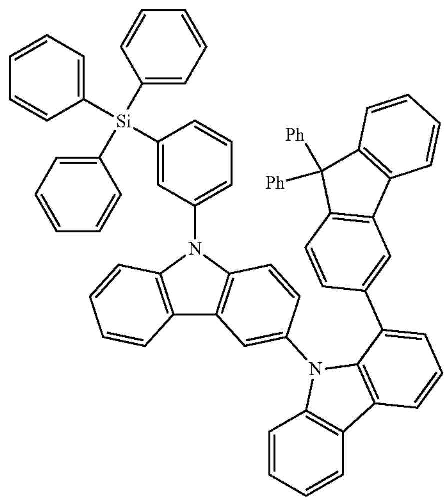
208
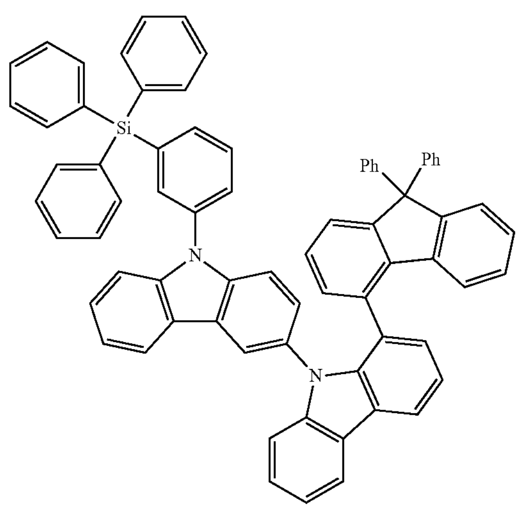

-continued
209
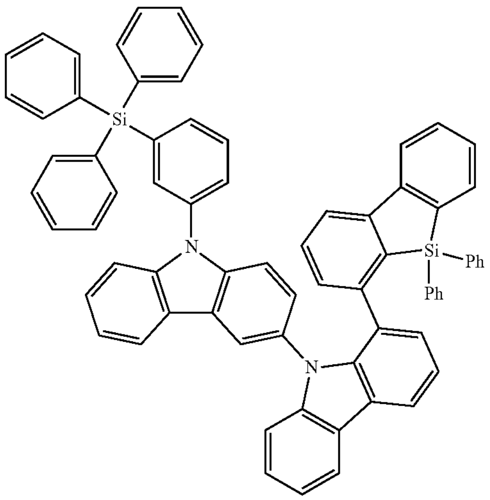
210
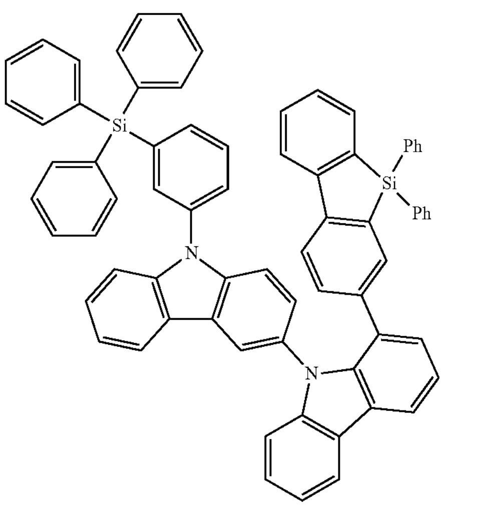
211
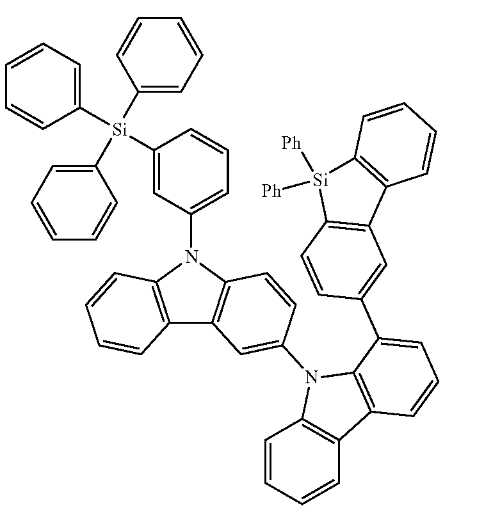
-continued
212
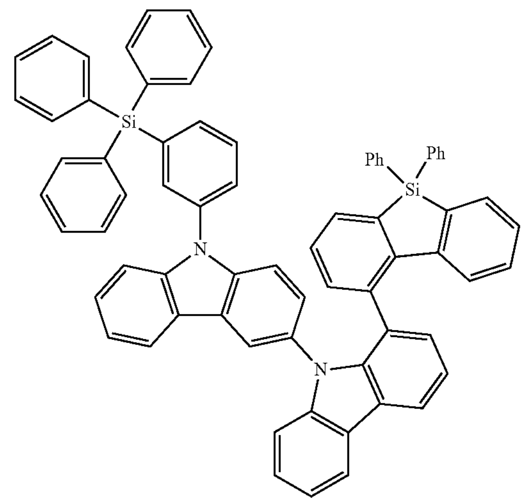
213
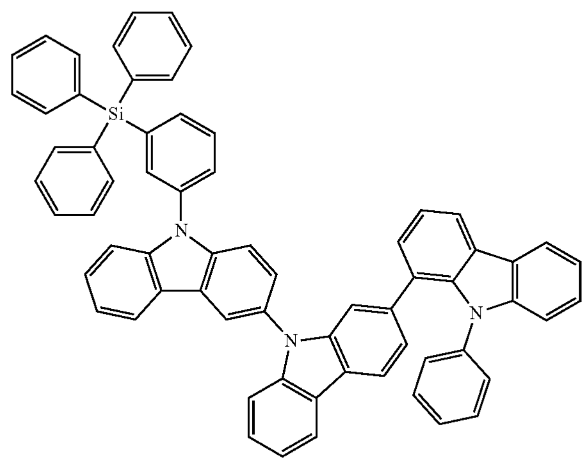
214
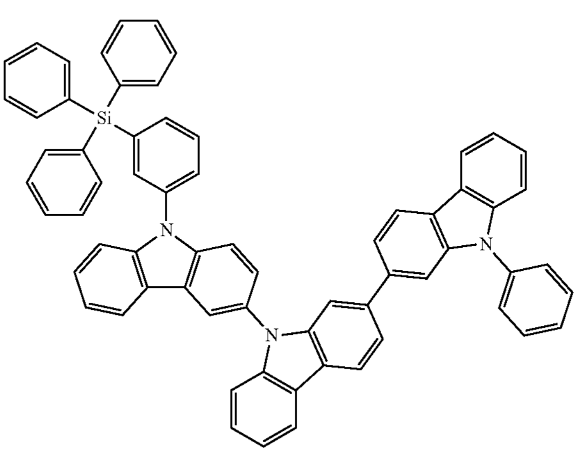

-continued
215
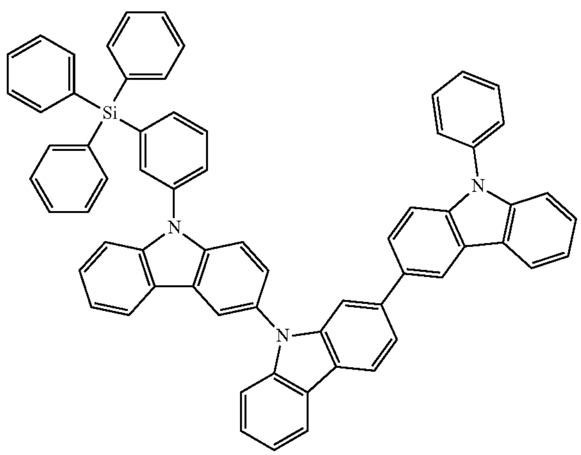
216
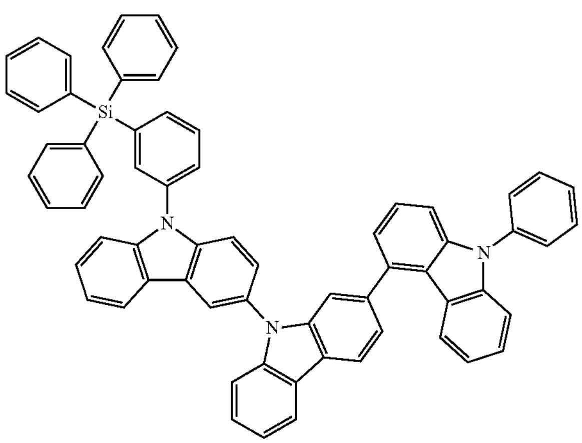
217
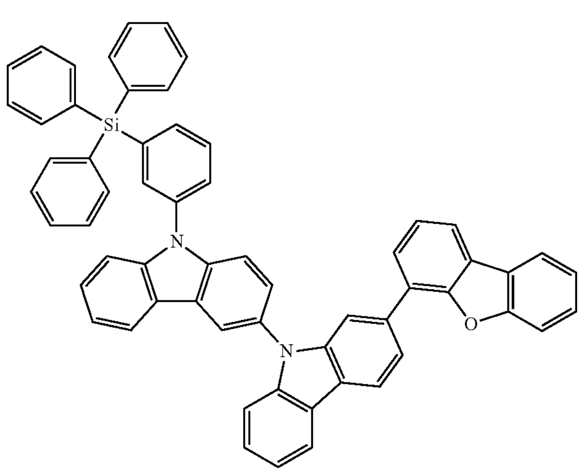
-continued
218
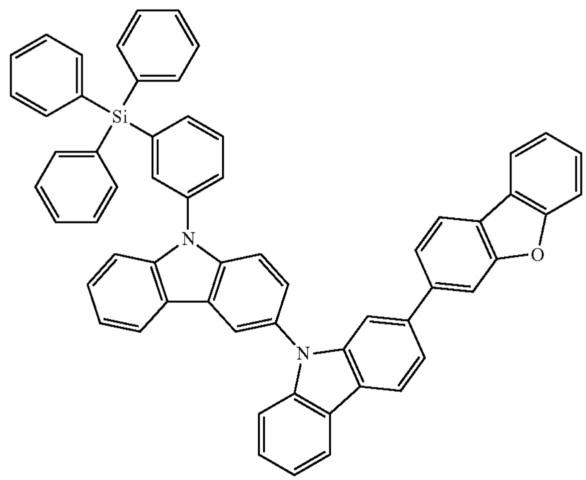
219
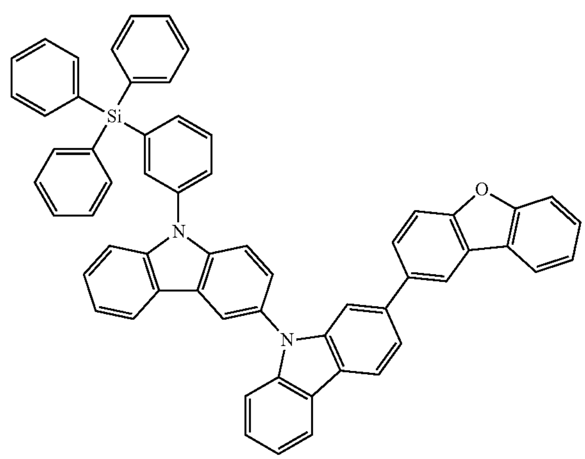
220
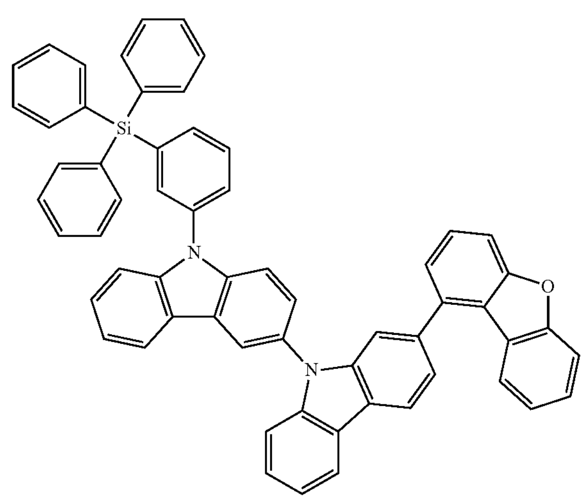

-continued
221
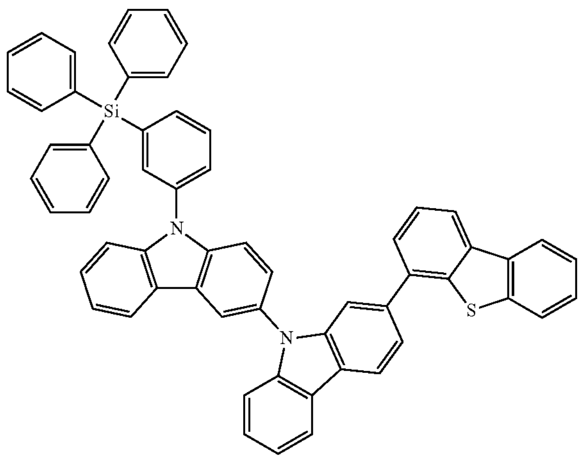
222
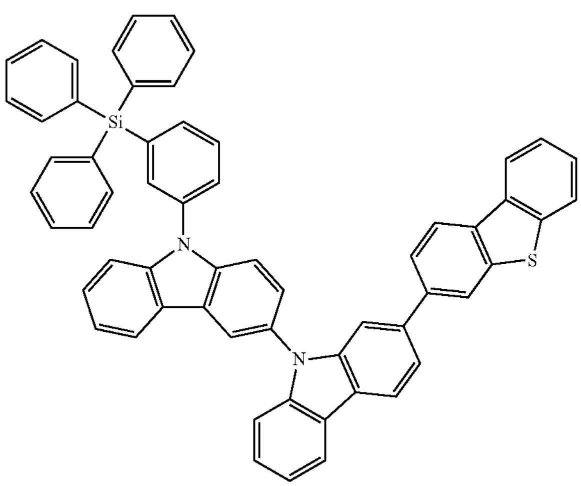
223
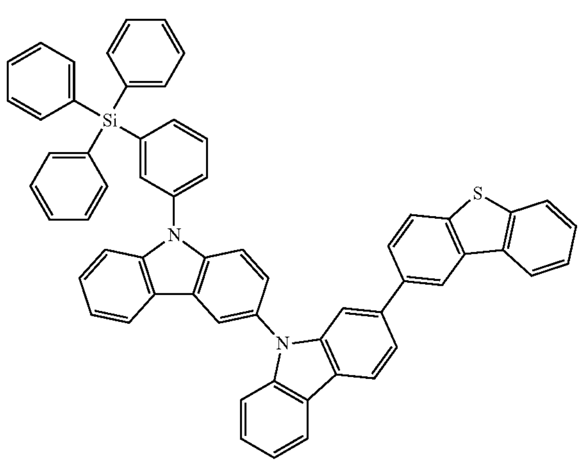
-continued
224
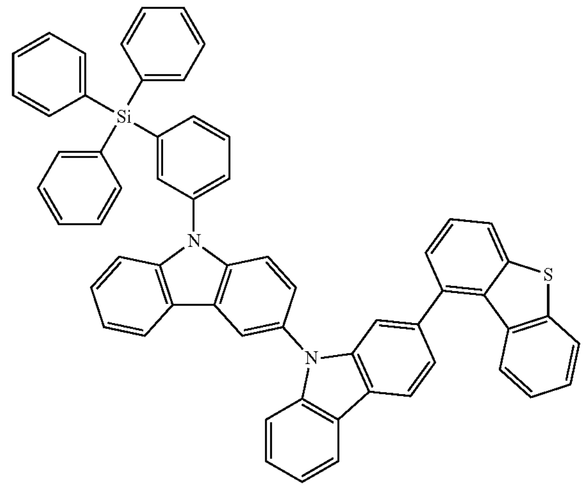
225
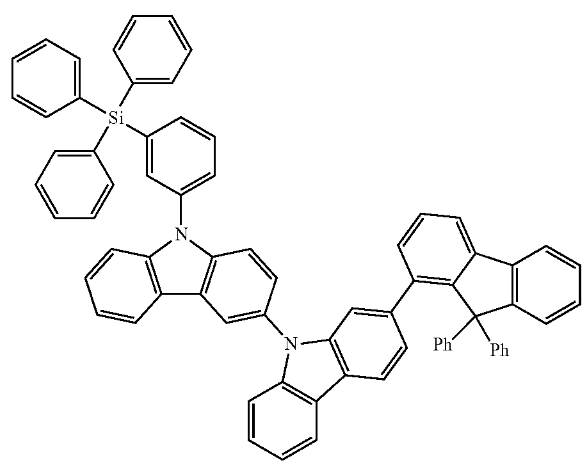
226
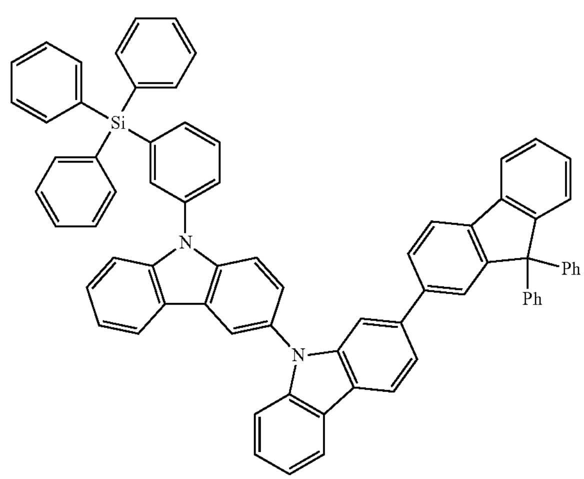

-continued
227
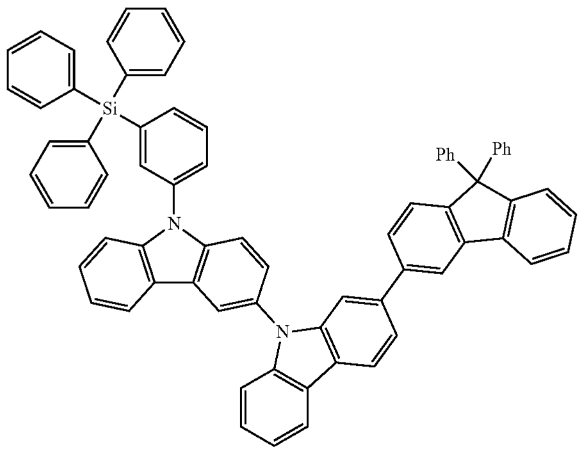
228
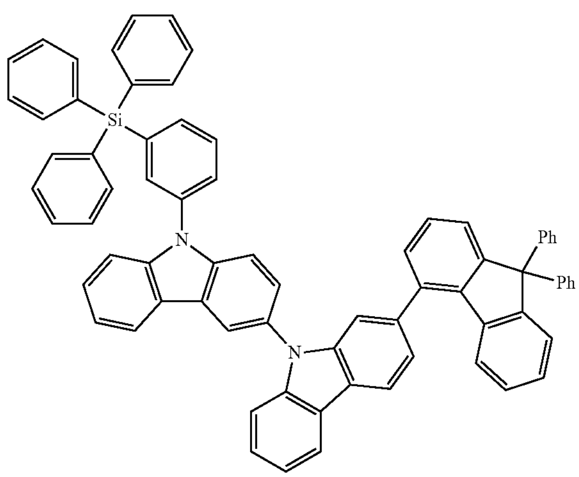
229
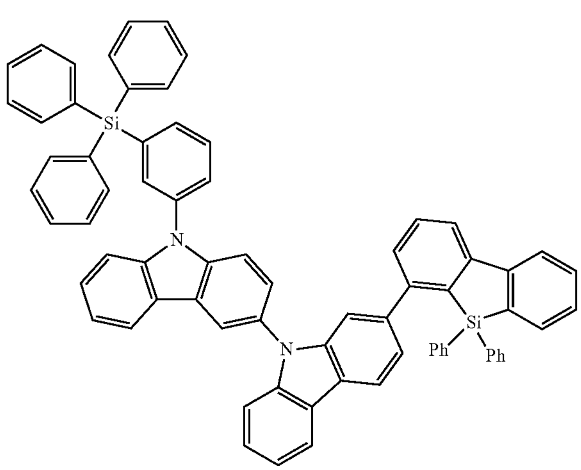
-continued
230
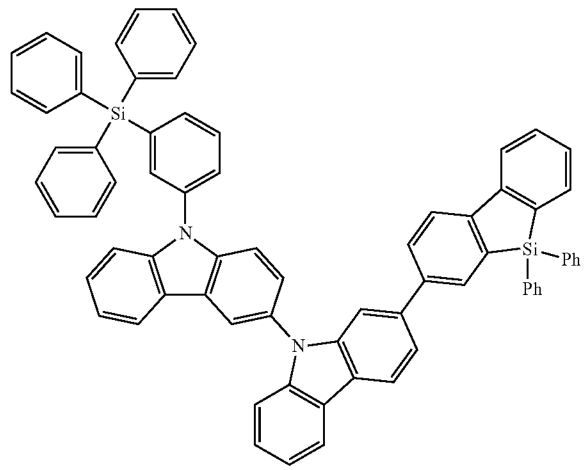
231
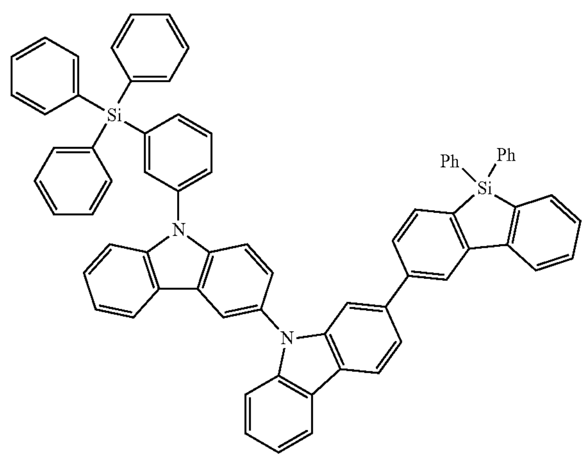
232
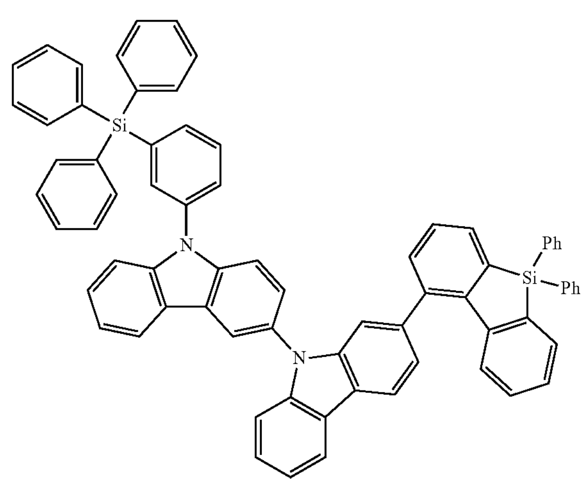

233
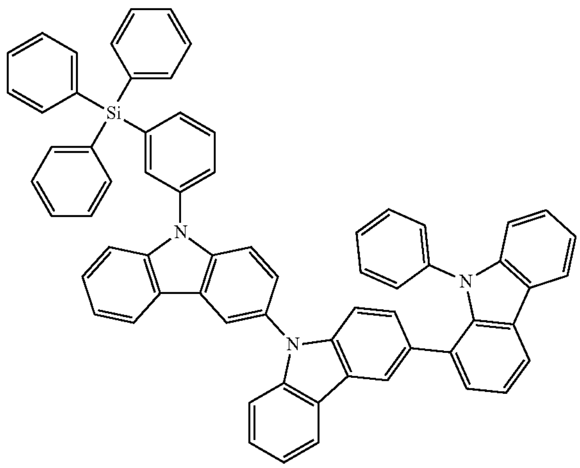
234
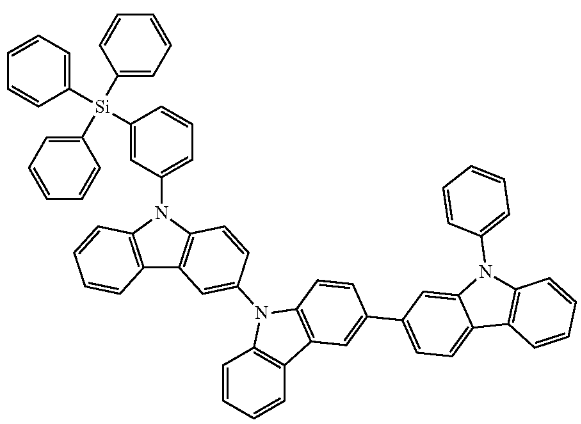
235
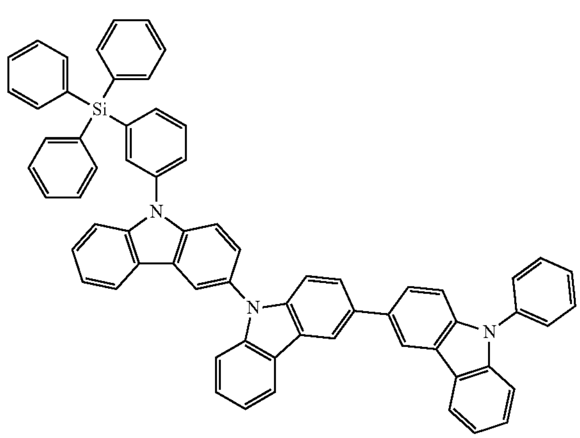
236
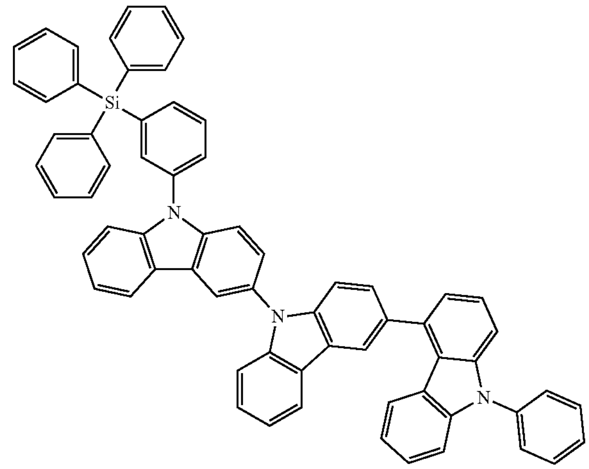
237
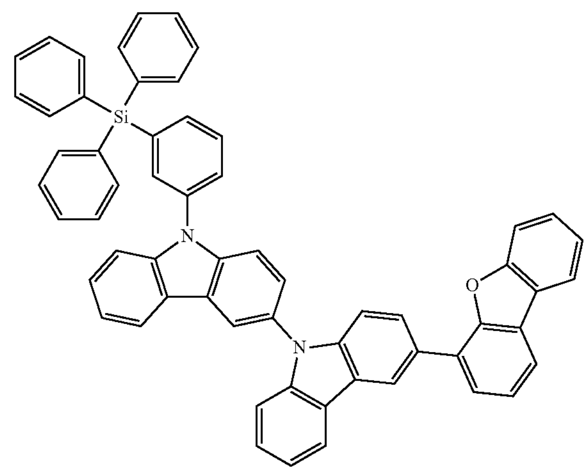
238
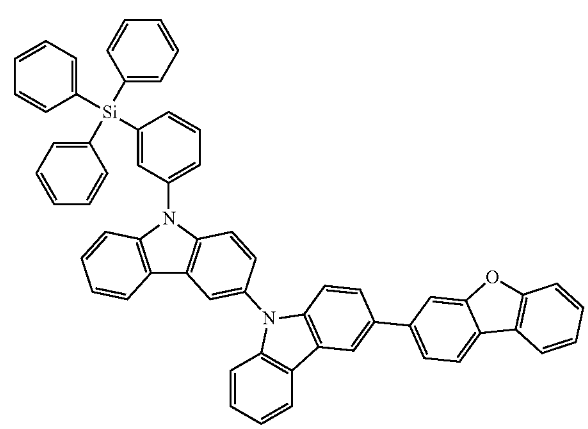

-continued
239
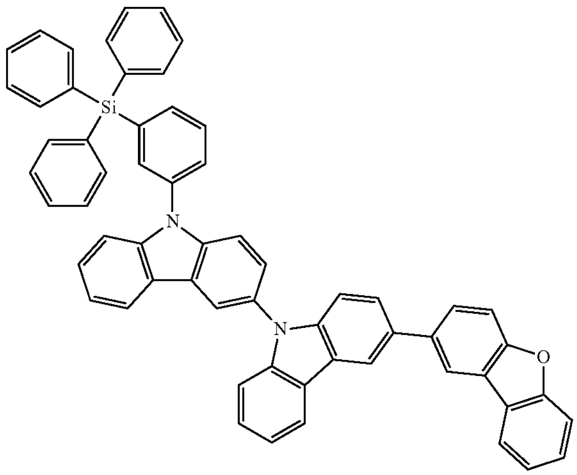
240
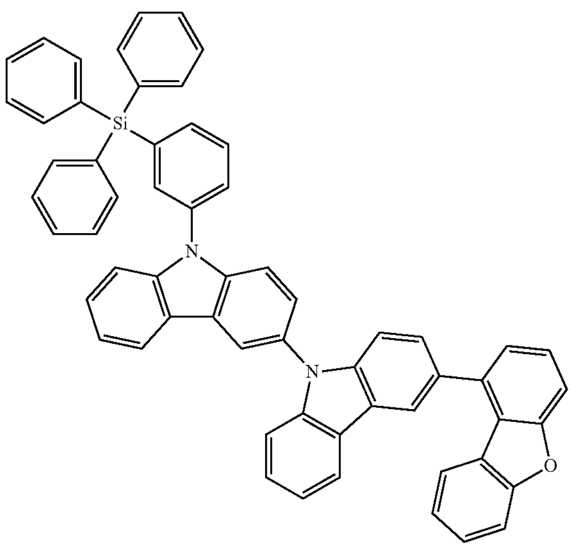
241
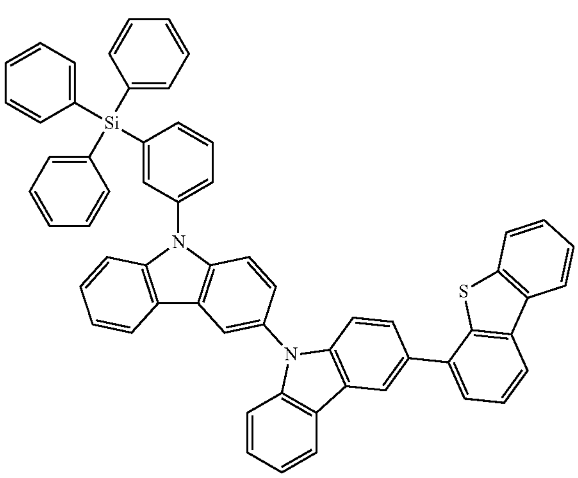
-continued
242
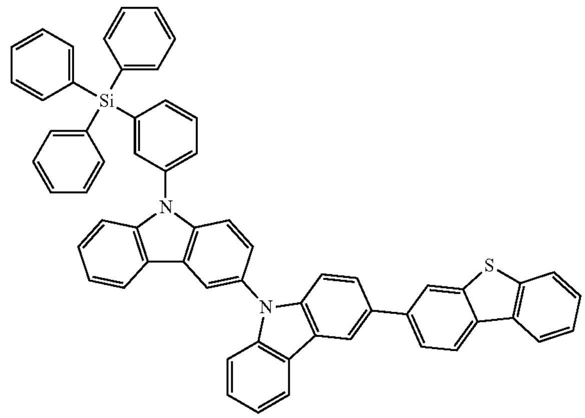
243
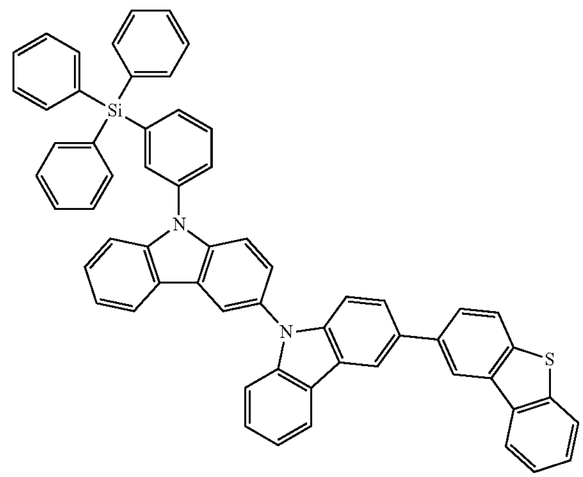
244
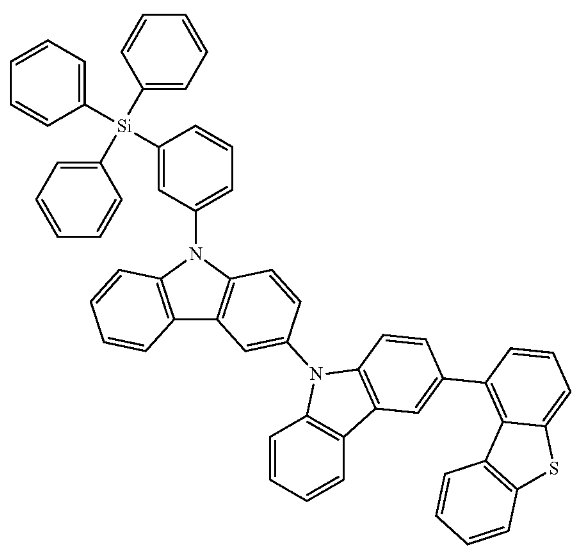

-continued
245
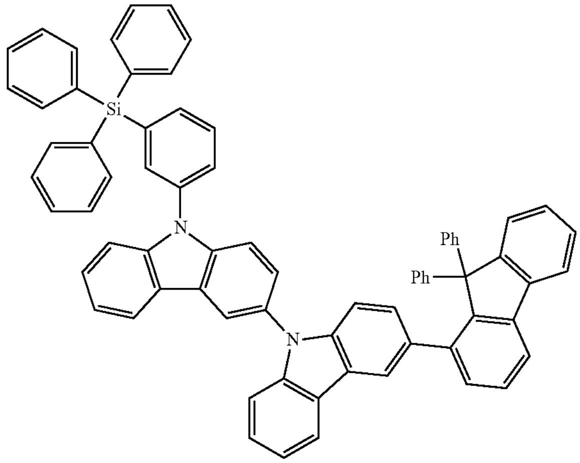
246
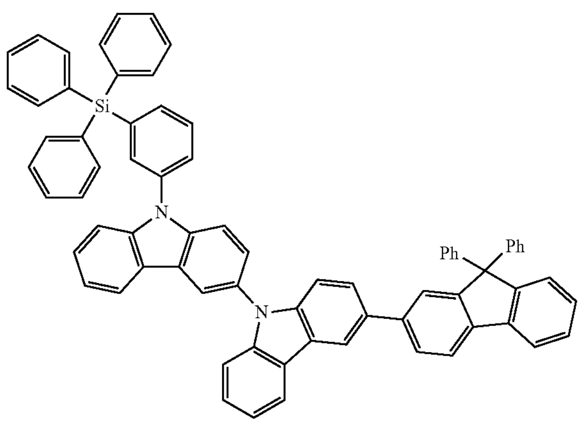
247
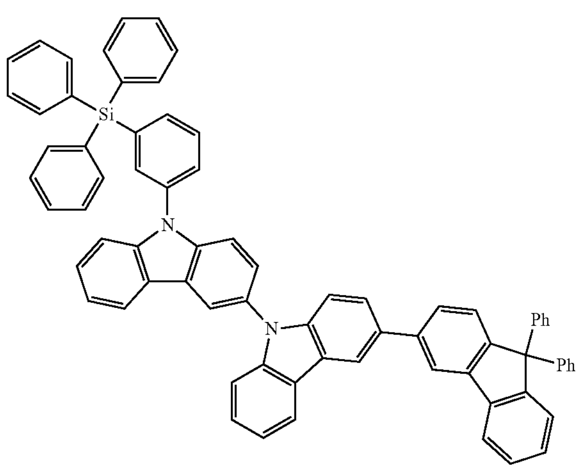
-continued
248
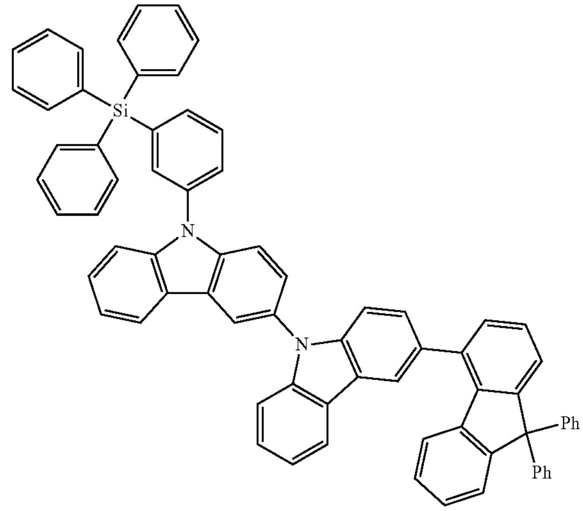
249
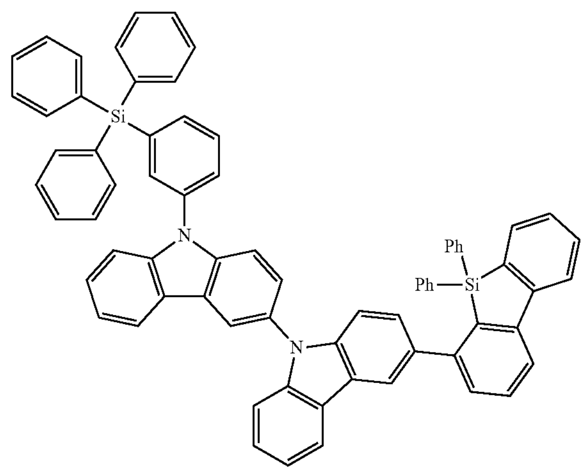
250
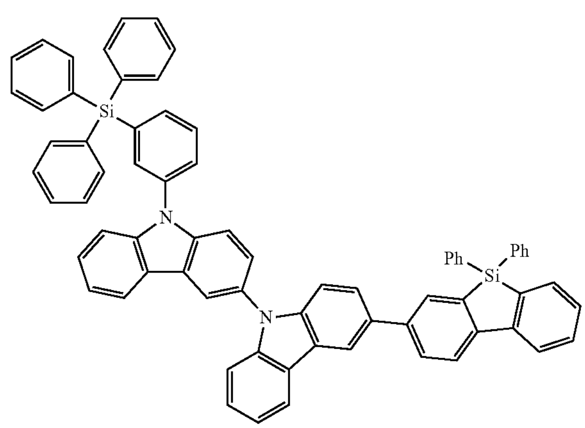

-continued
251
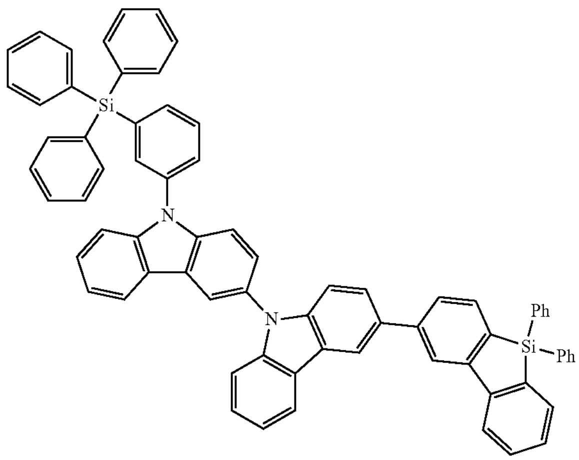
252
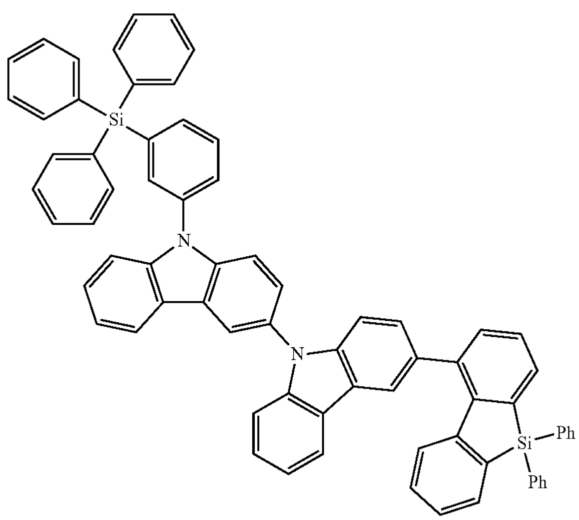
253
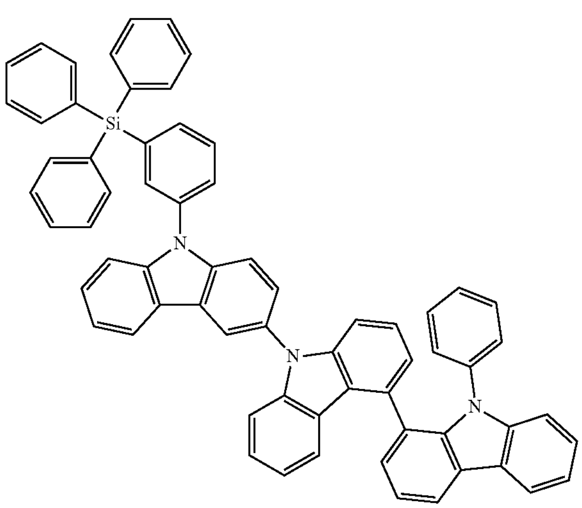
-continued
254
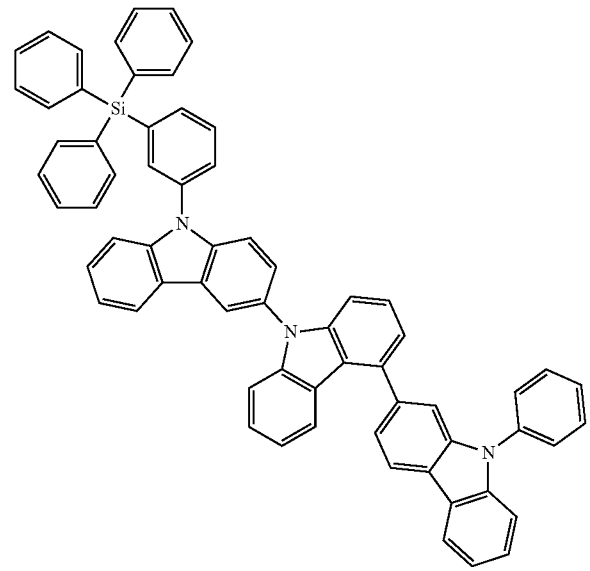
255
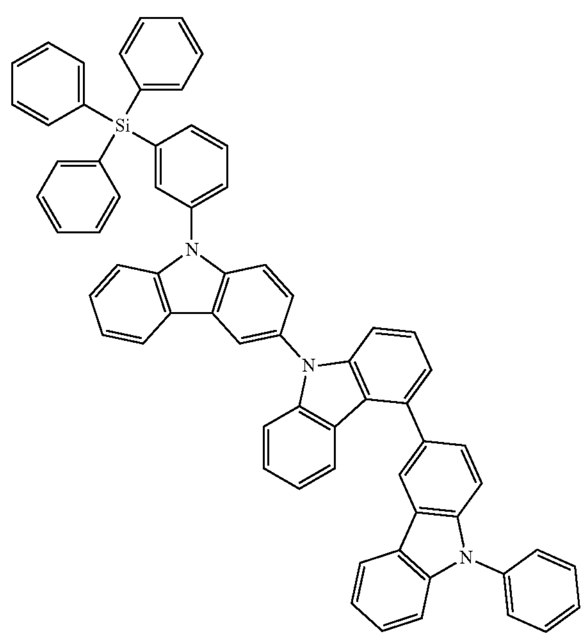

256
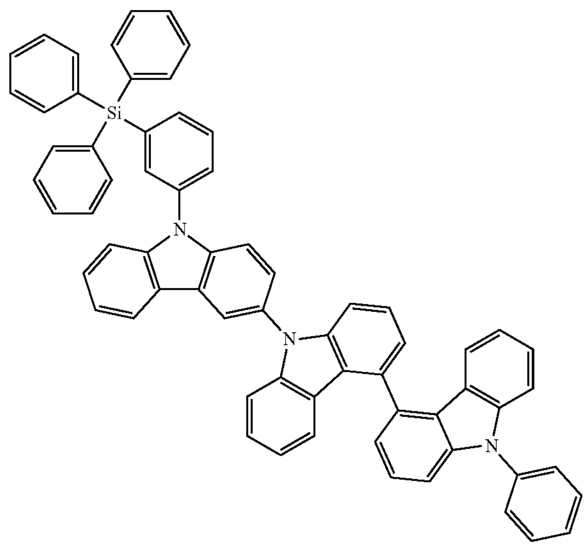
257
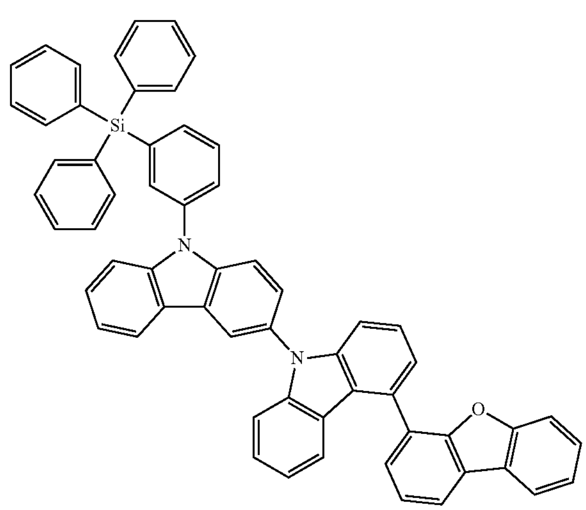
258
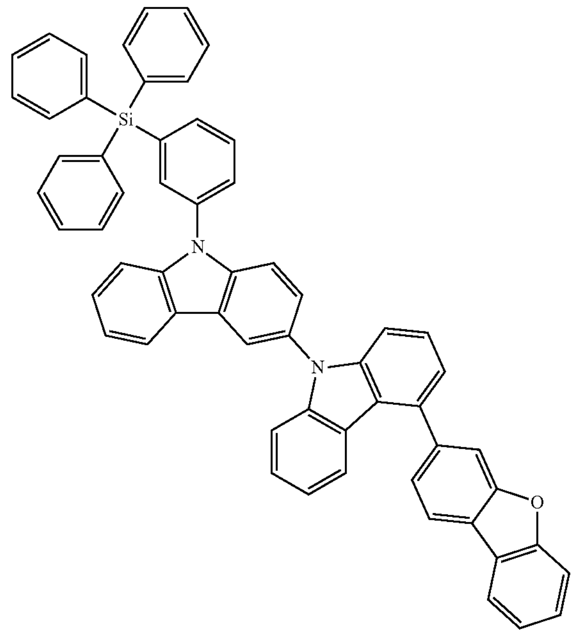
259
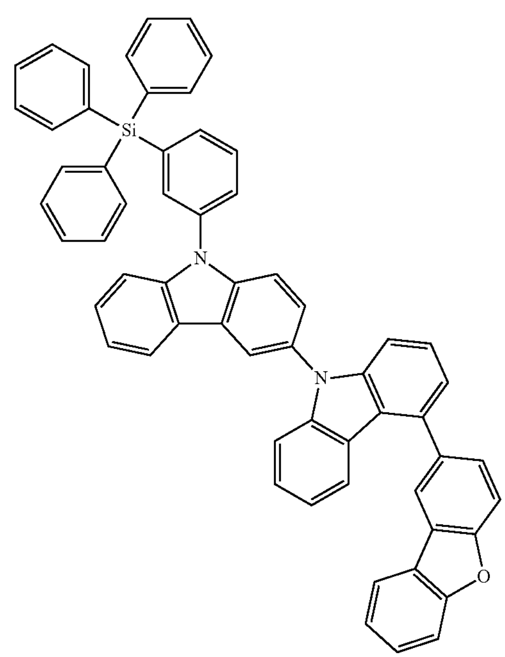

-continued
260
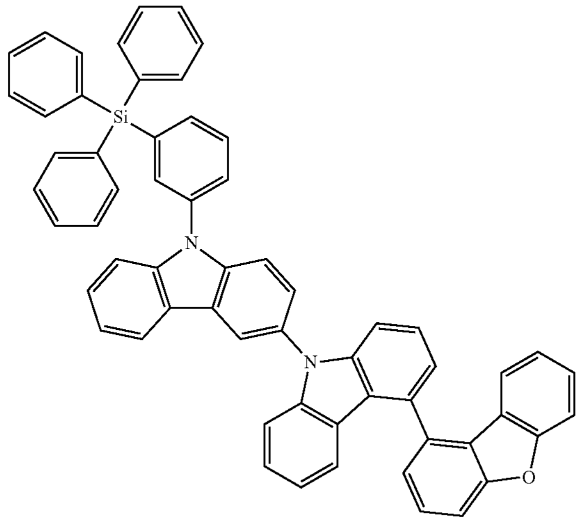
261
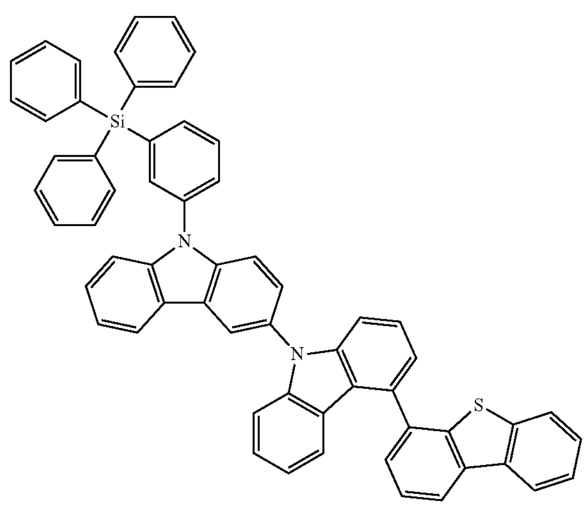
-continued
262
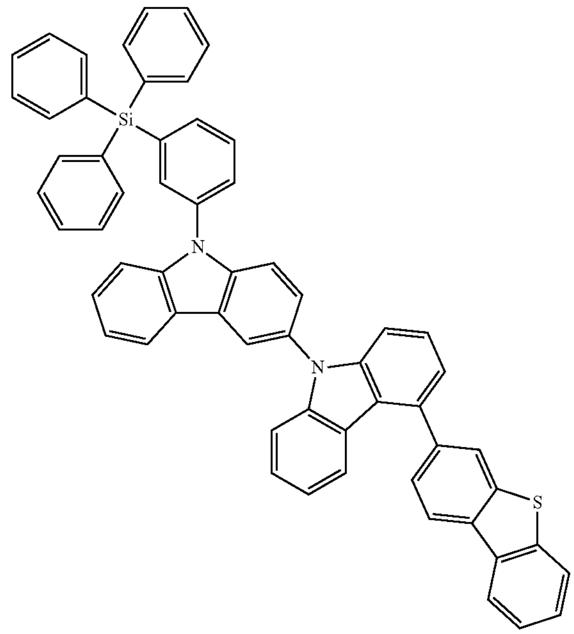
263
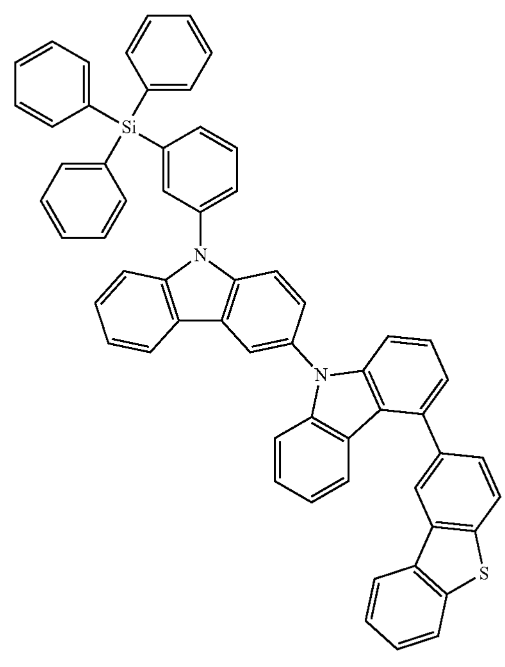

-continued
264
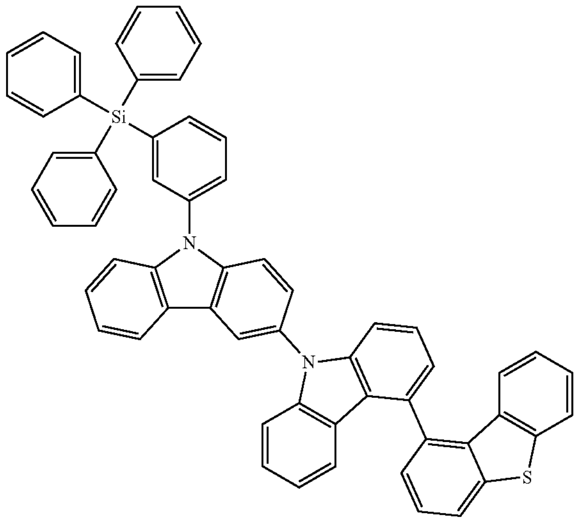
265
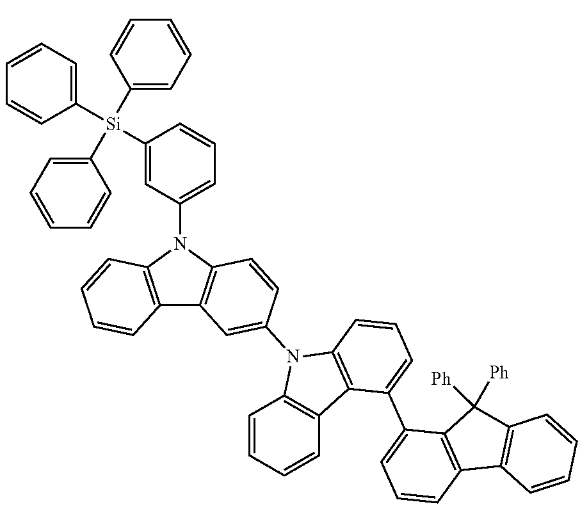
-continued
266
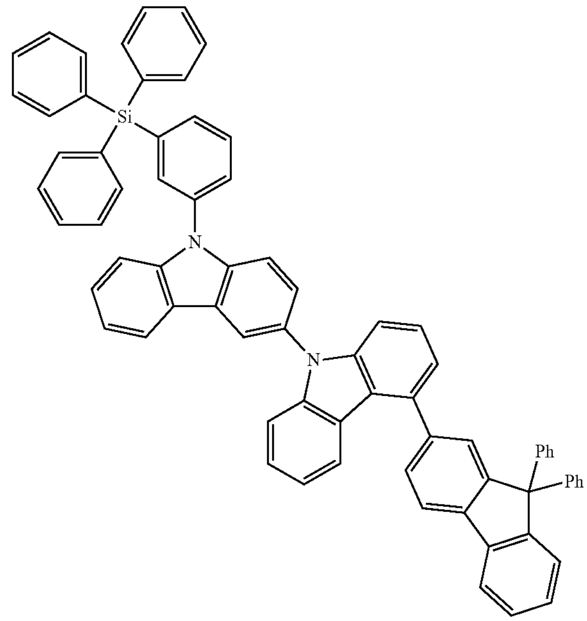
267
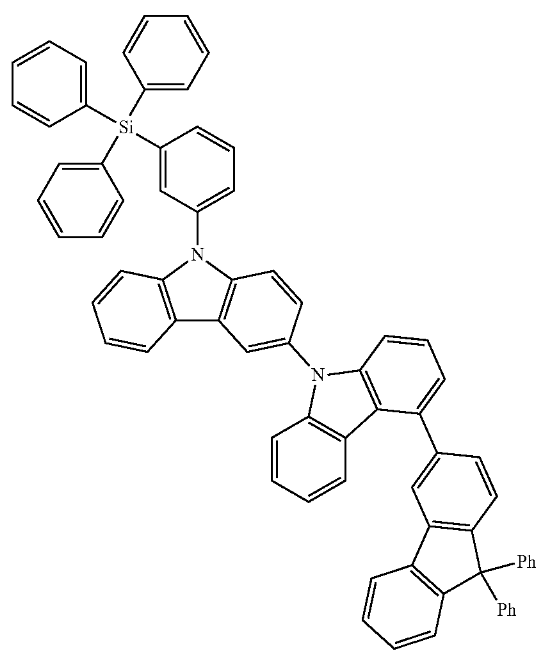

-continued
268
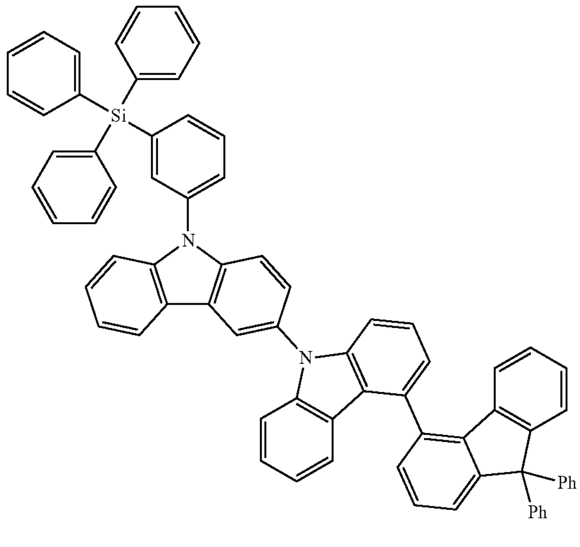
269
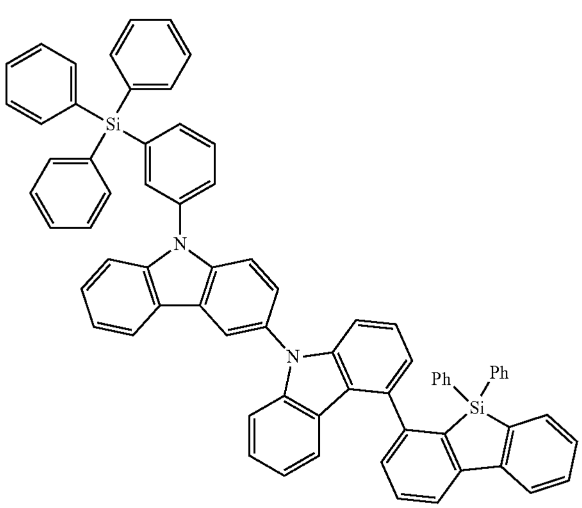
-continued
270
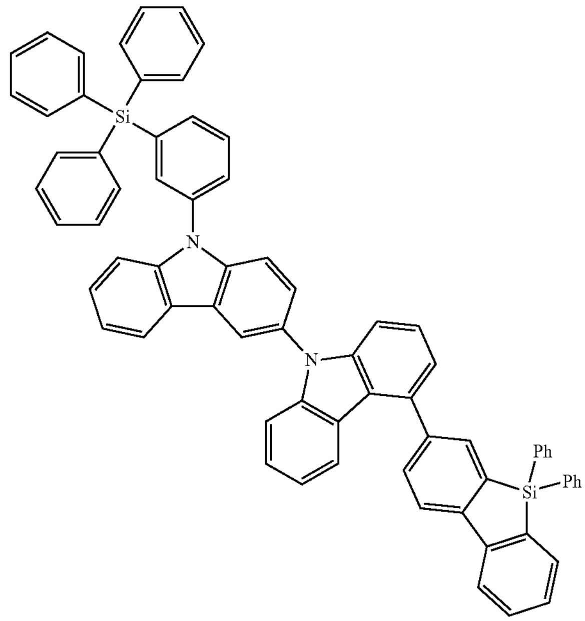
271
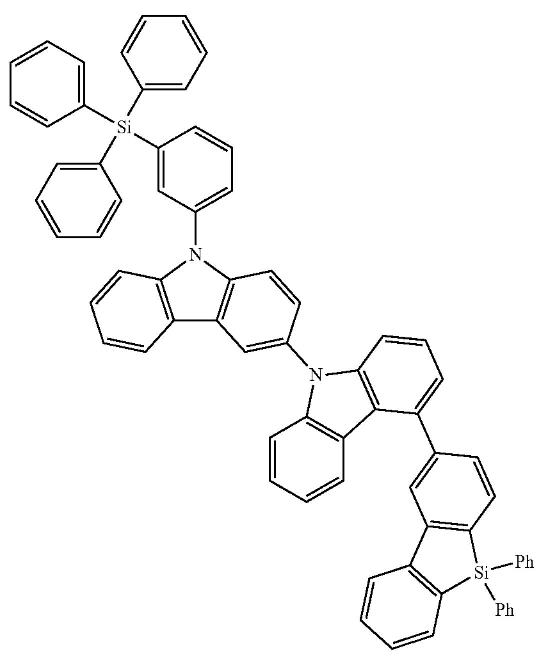

-continued
272
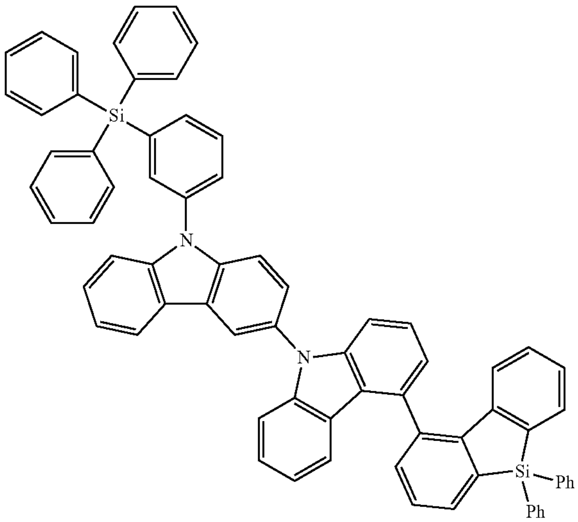
273
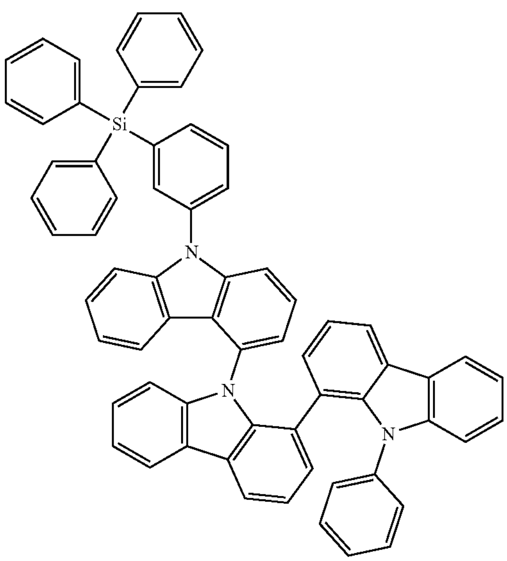
274
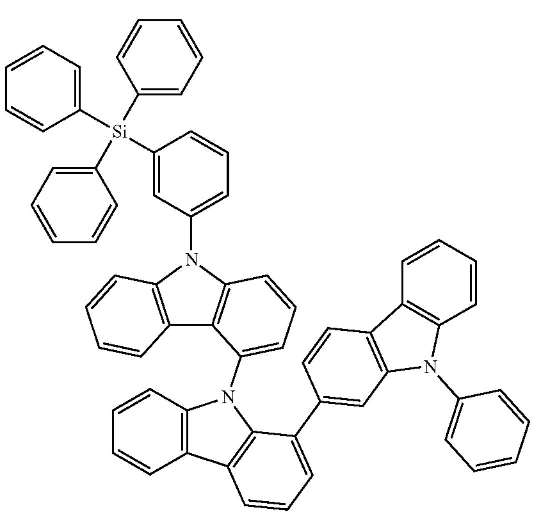
-continued
275
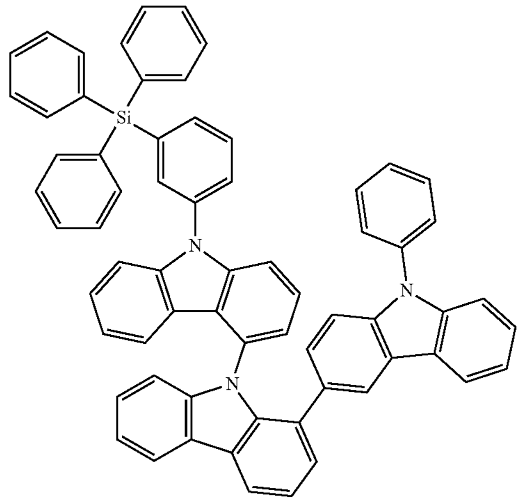
276
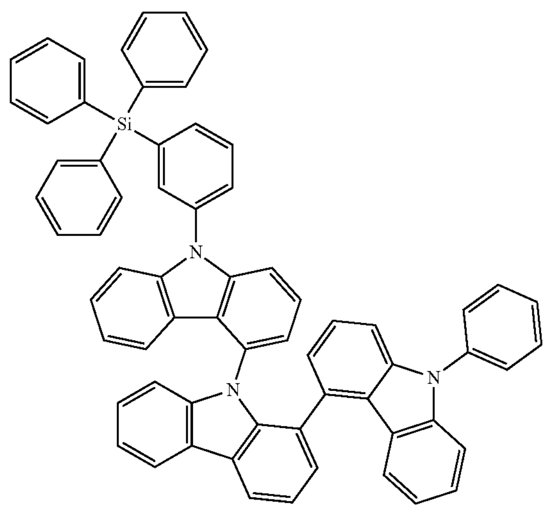
277
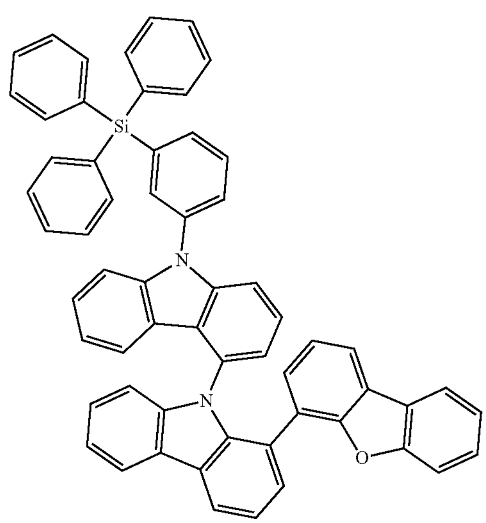

278
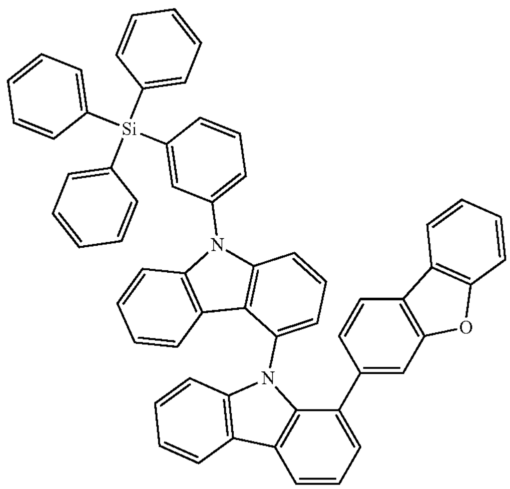
279
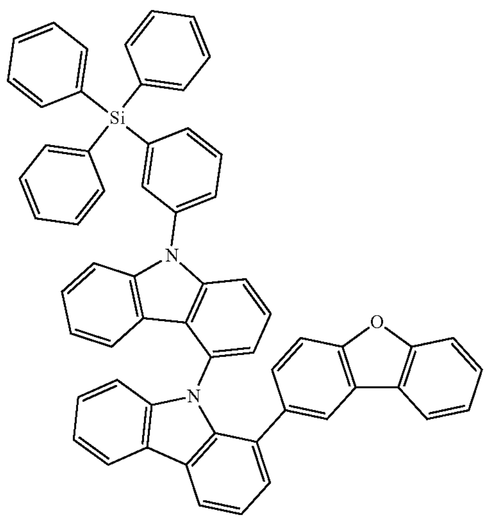
280
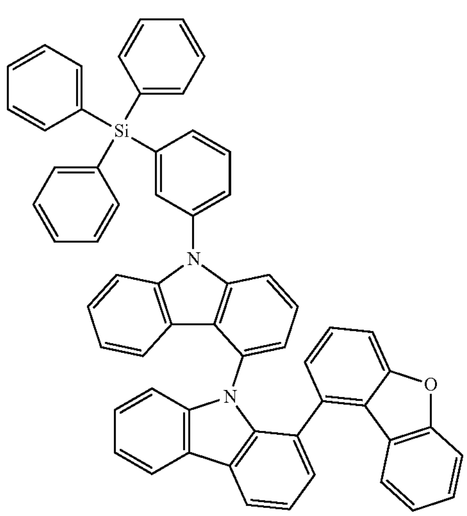
281
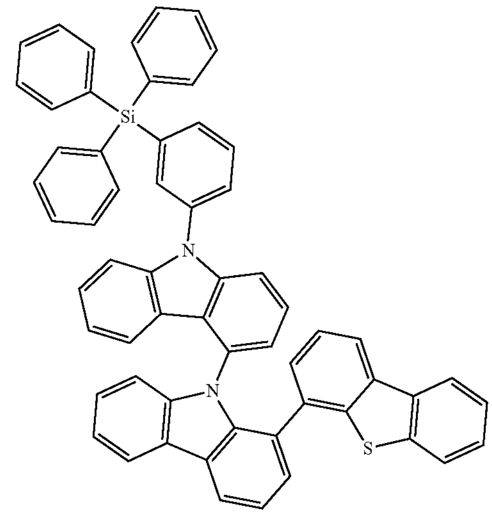
282
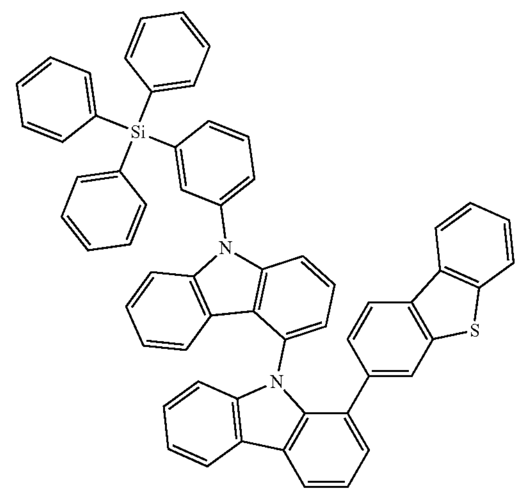
283
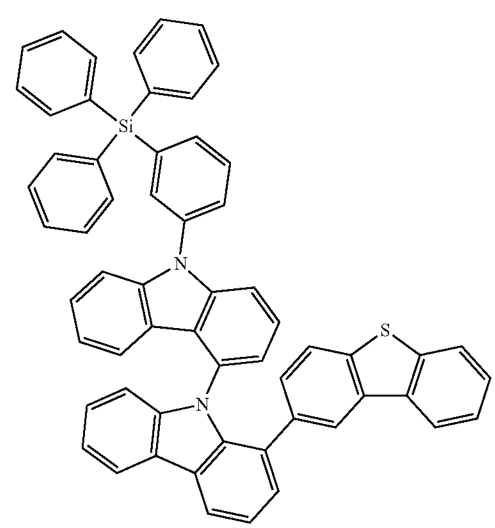

-continued
284
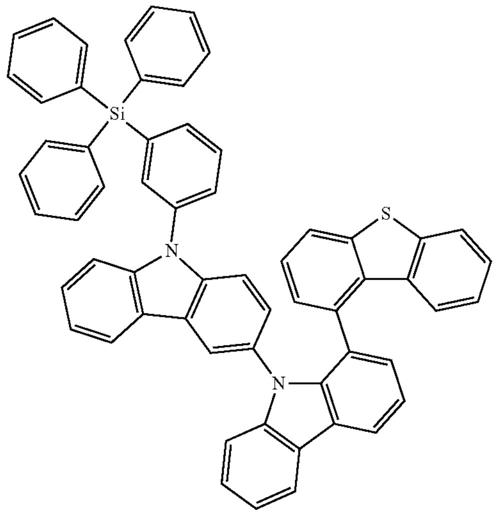
285
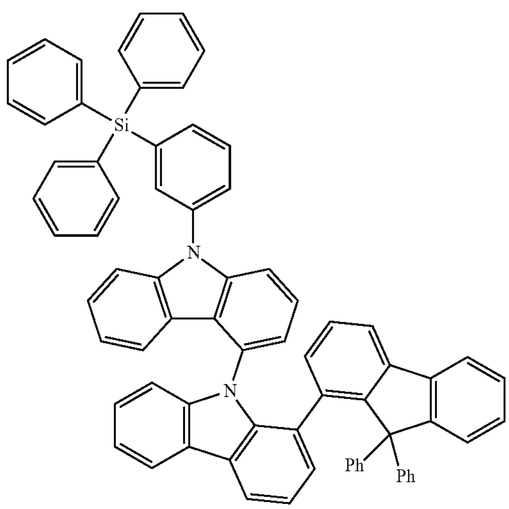
286
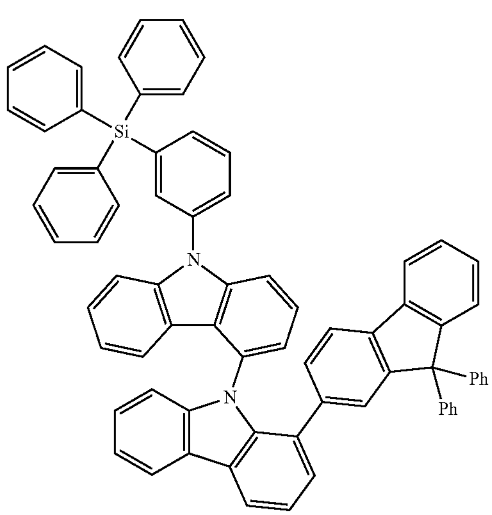
-continued
287
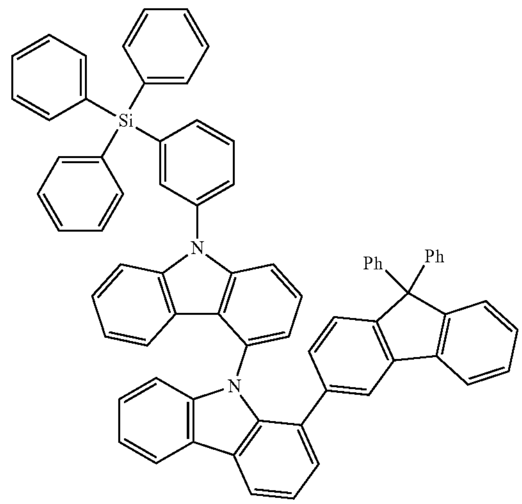
288
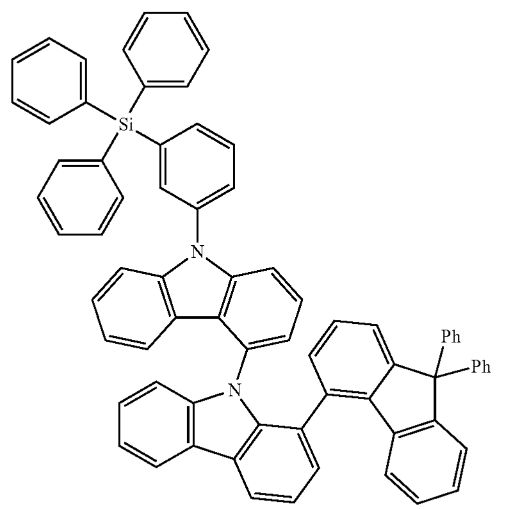
289
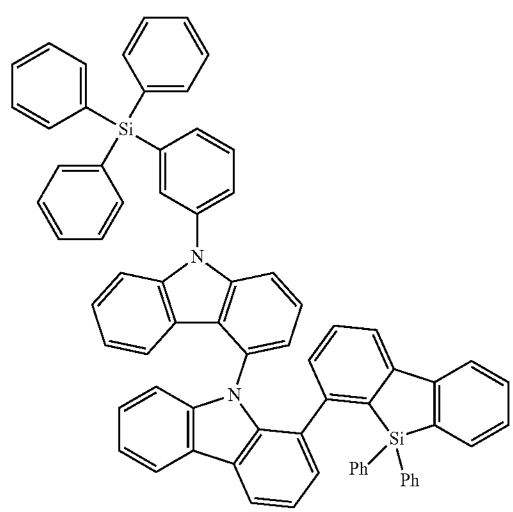

-continued
290
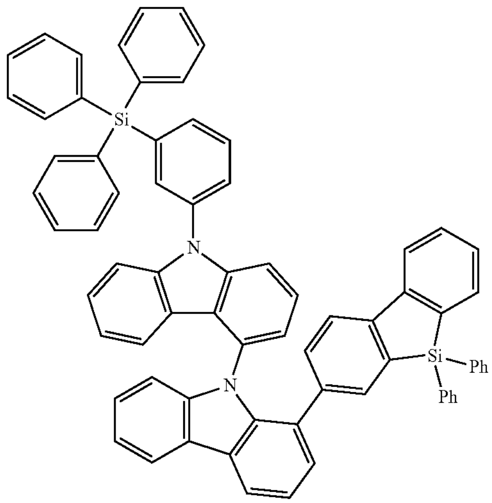
291
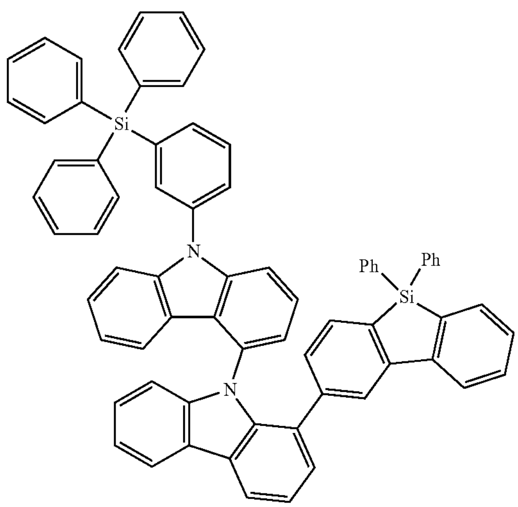
292
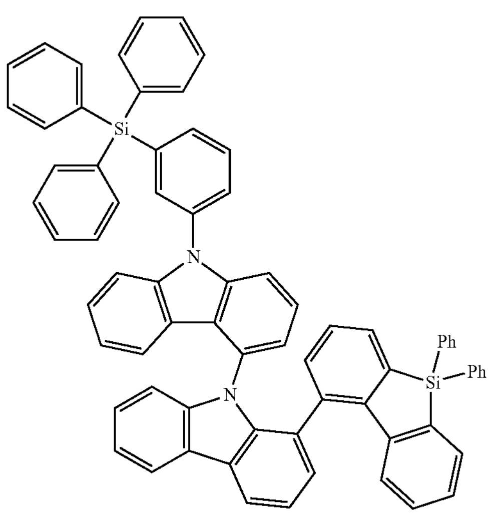
-continued
293
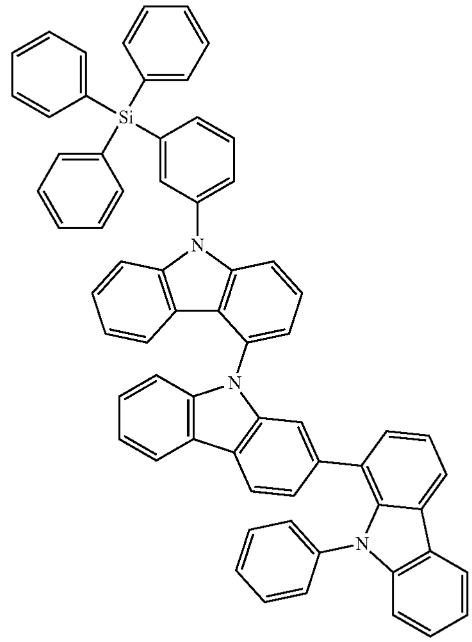
294
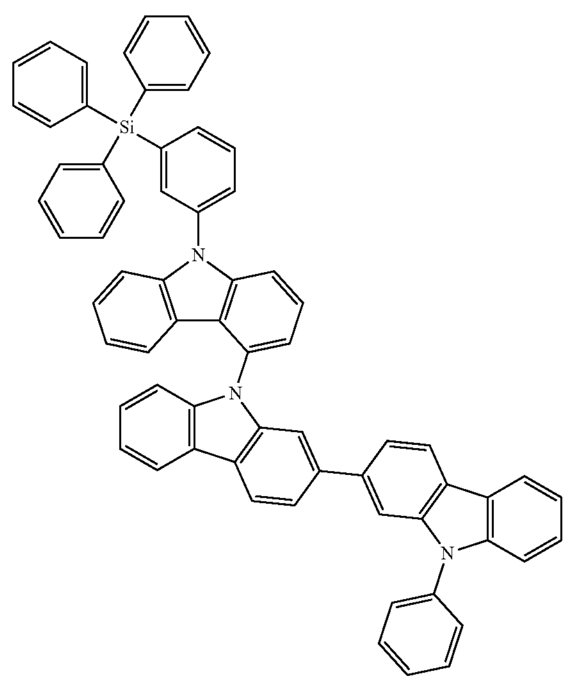

-continued
295
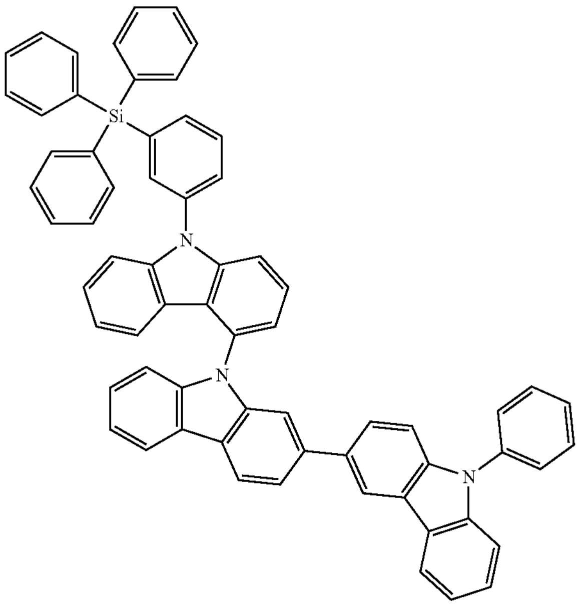
296
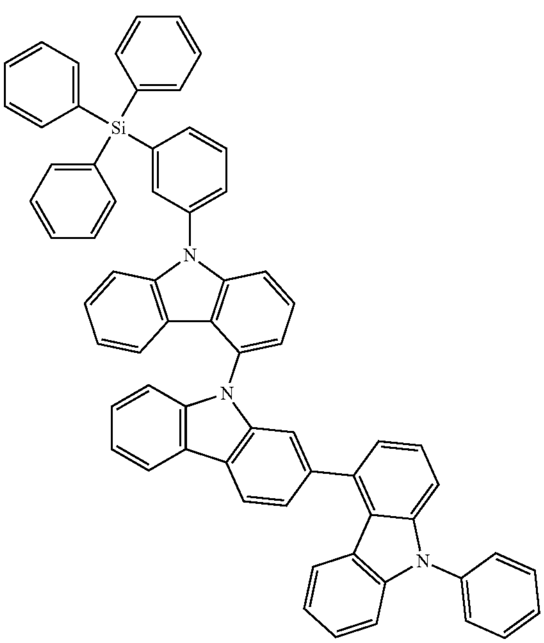
-continued
297
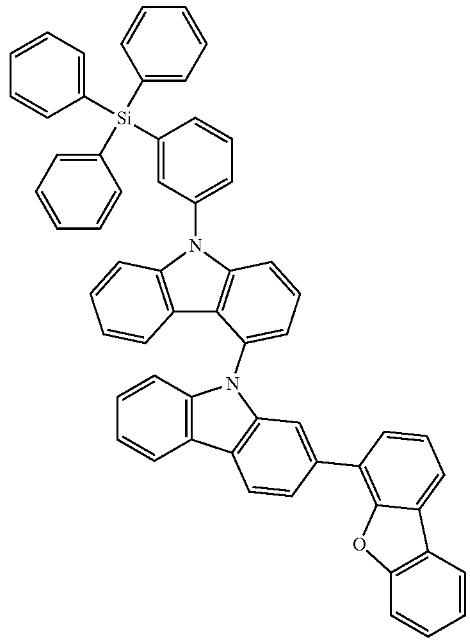
298
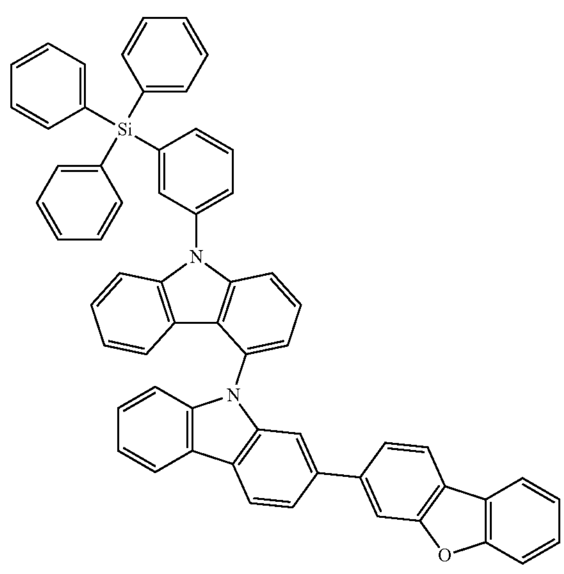

299
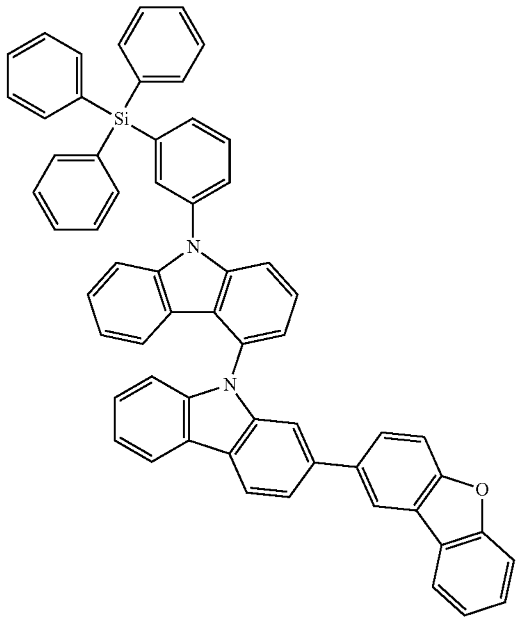
300
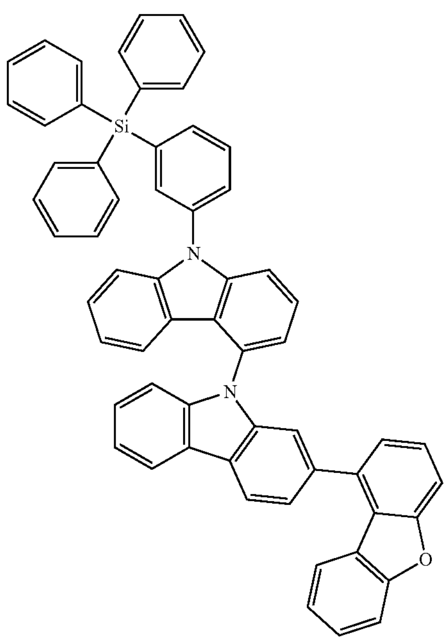
301
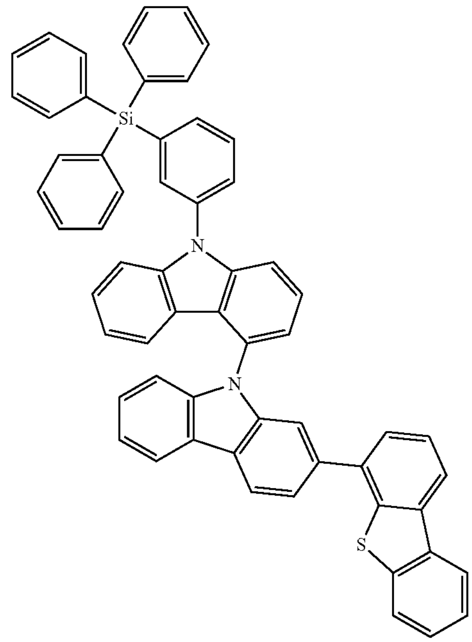
302
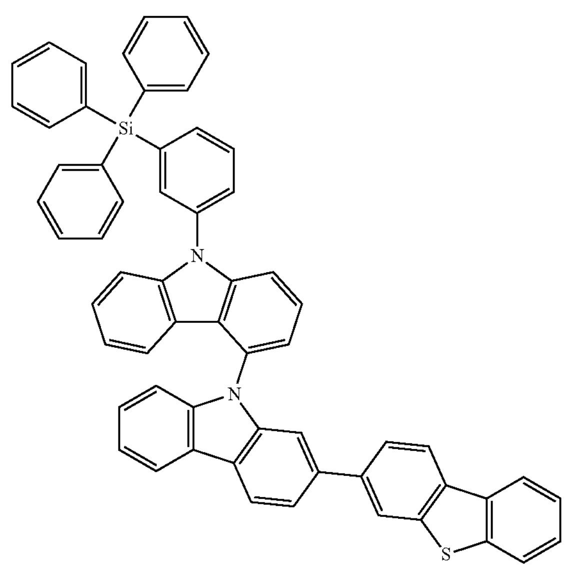

-continued
303
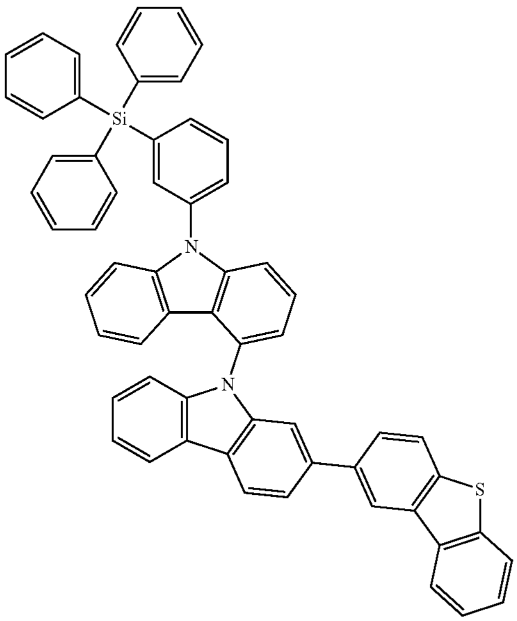
304
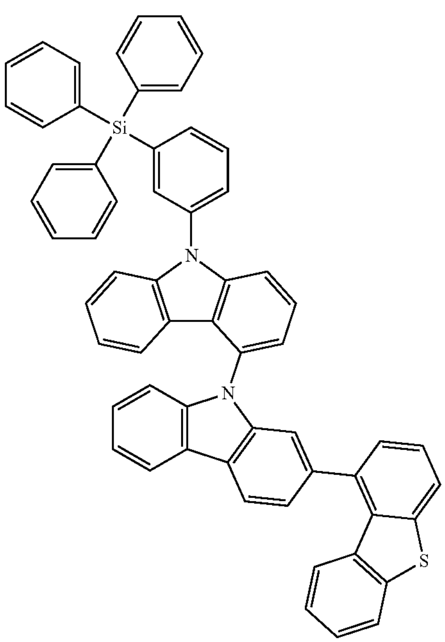
-continued
305
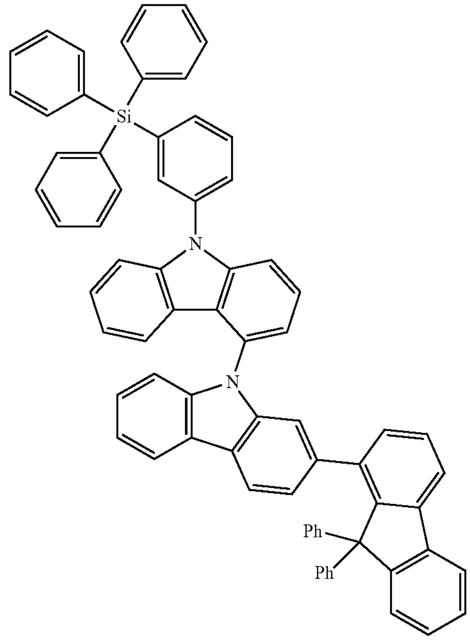
306
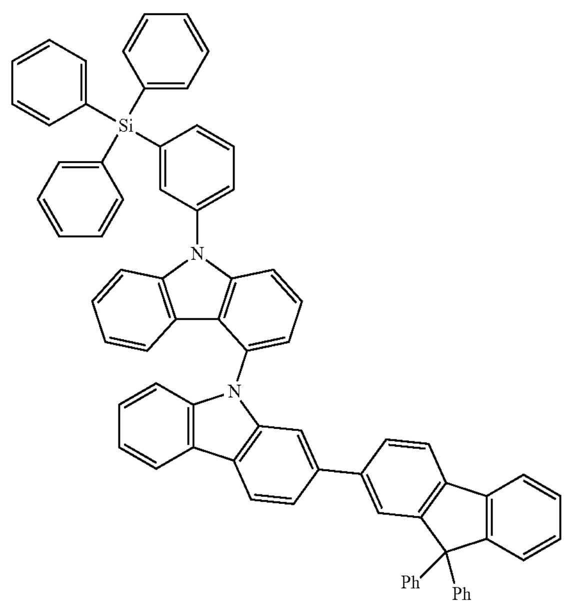

307
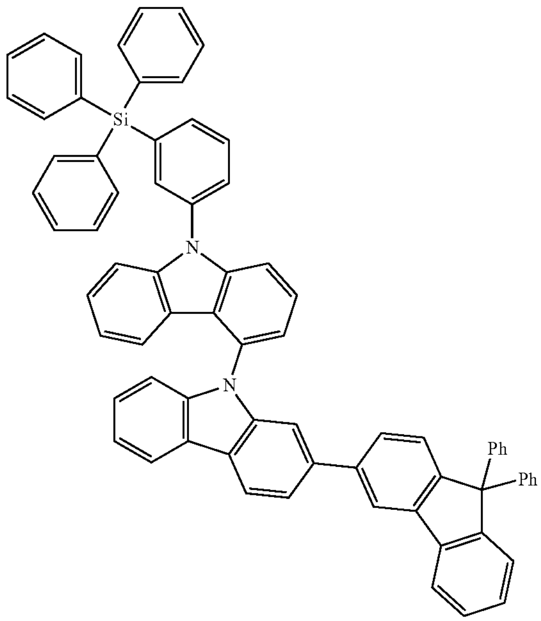
308
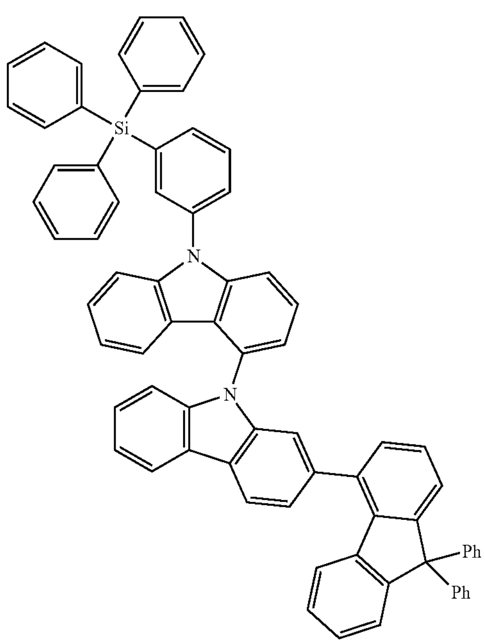
309
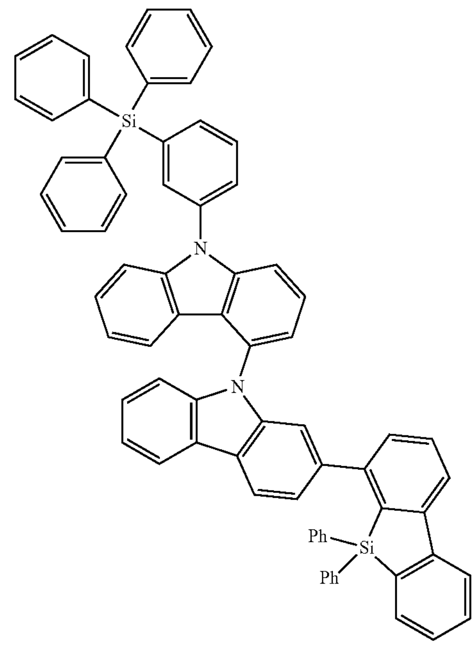
310
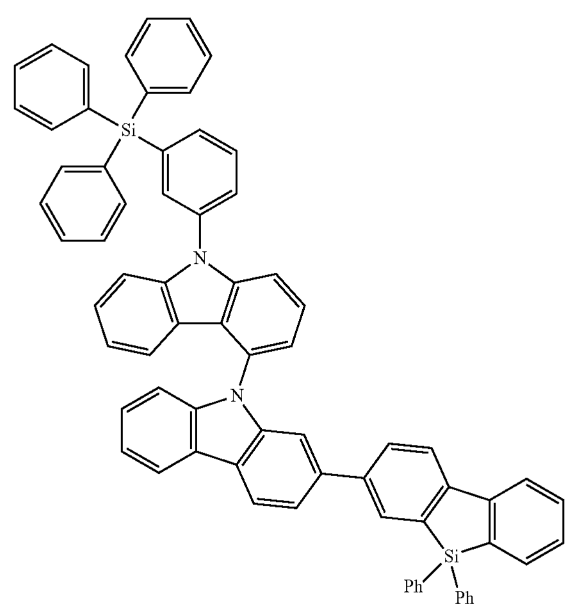

311
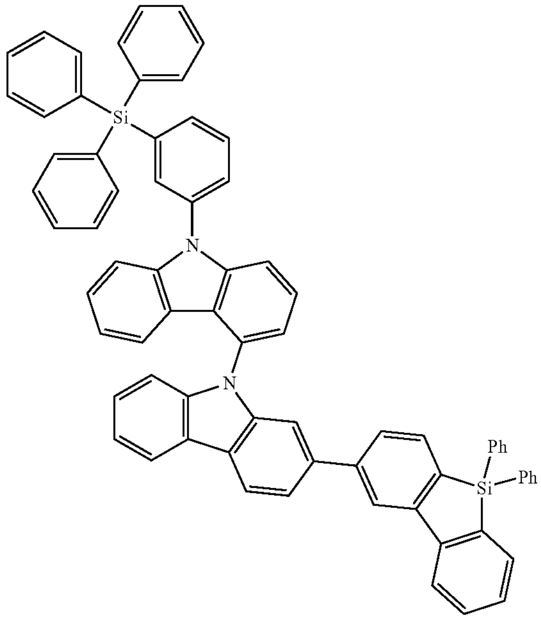
312
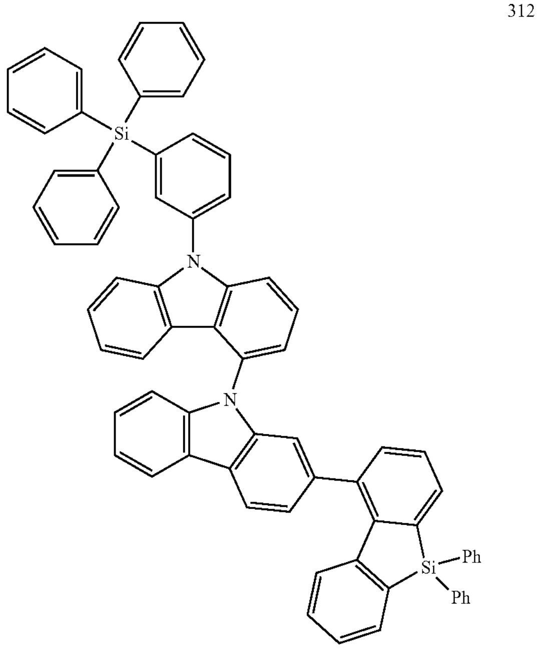
313
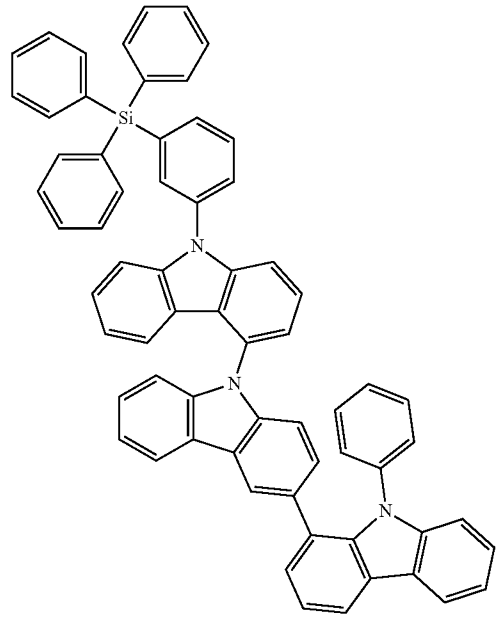
314
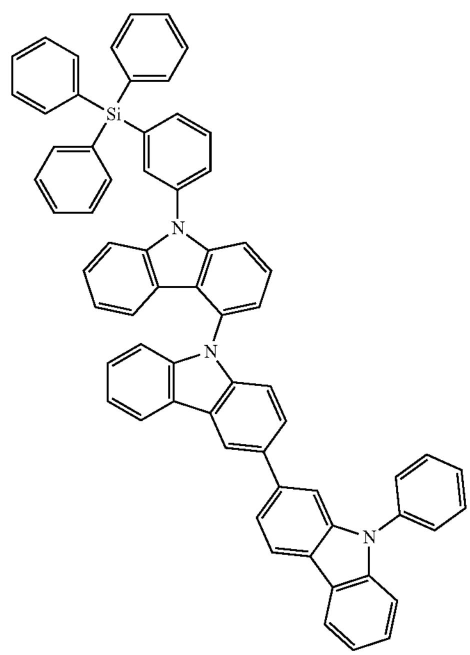

-continued
315
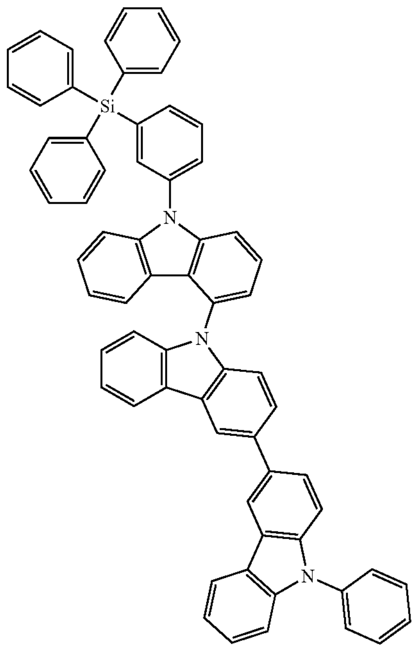
316
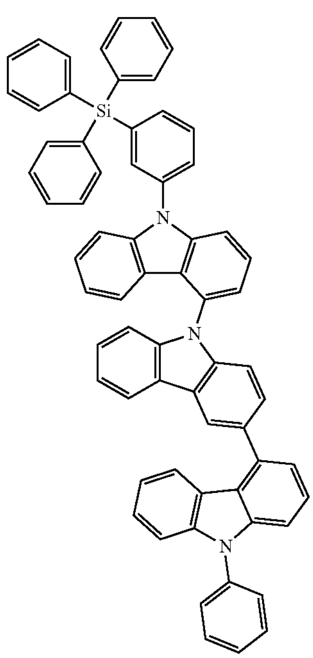
-continued
317
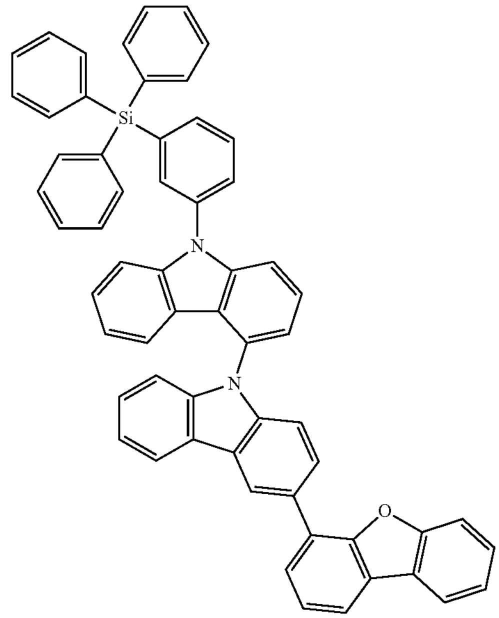
318
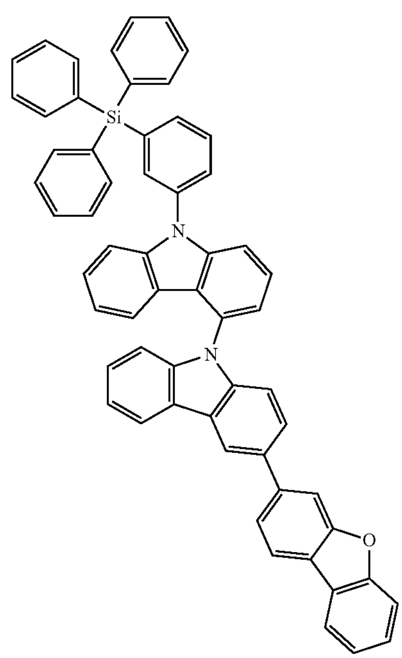

319
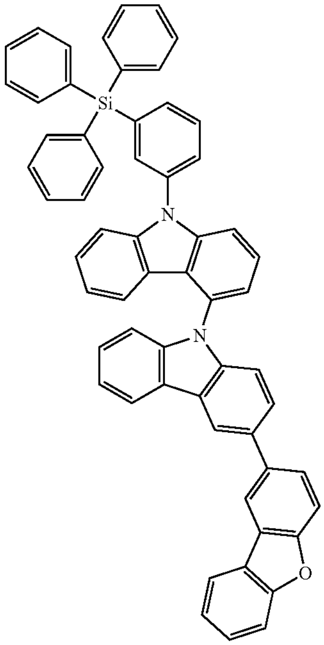
320
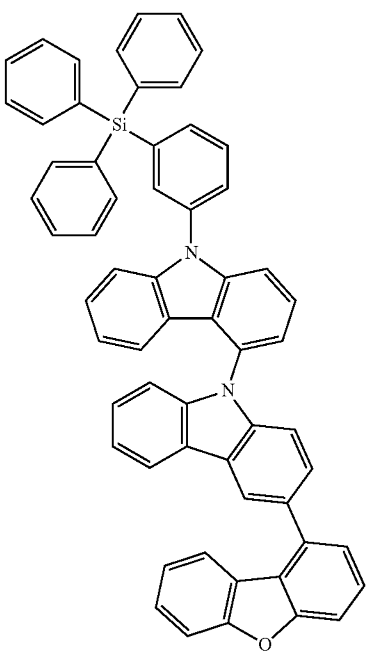
321
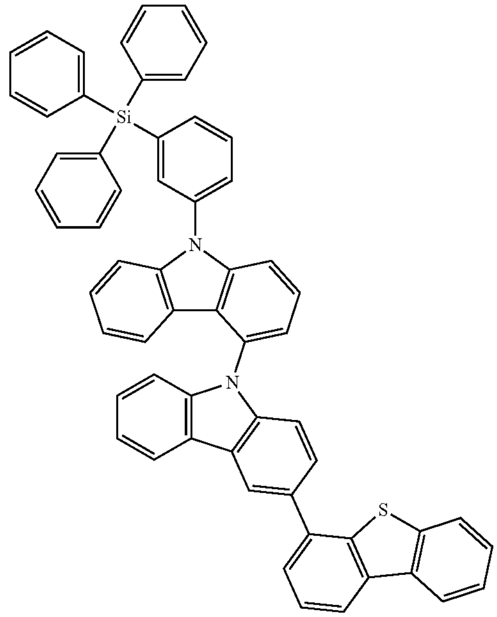
322
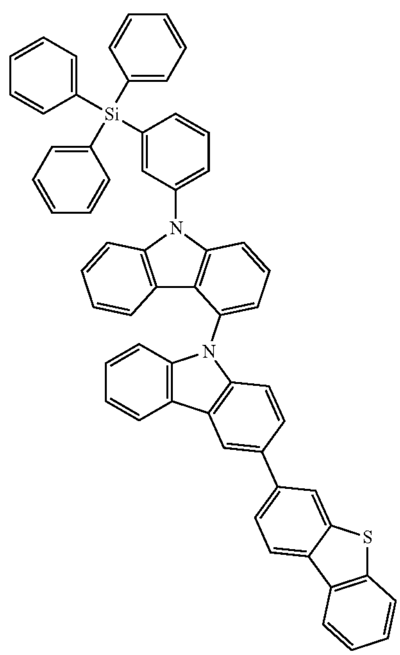

-continued
323
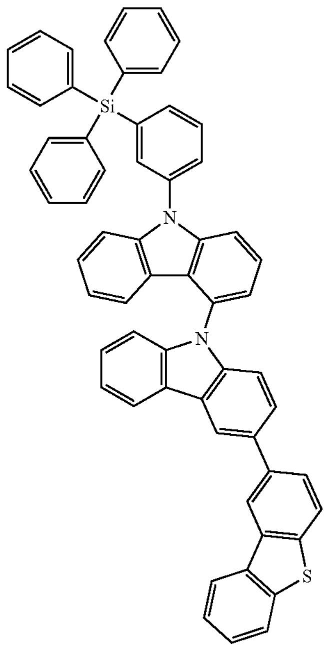
325
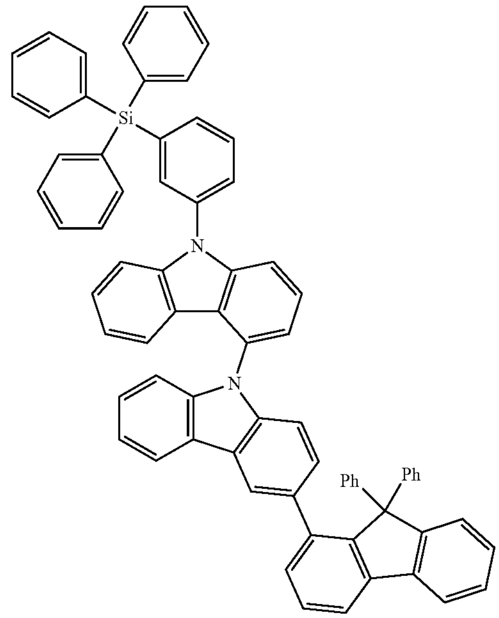
324
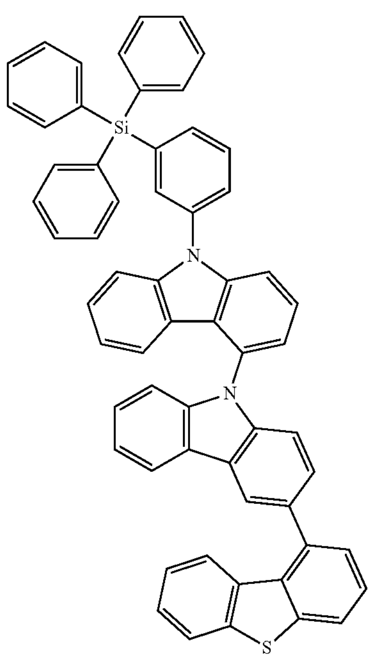
326
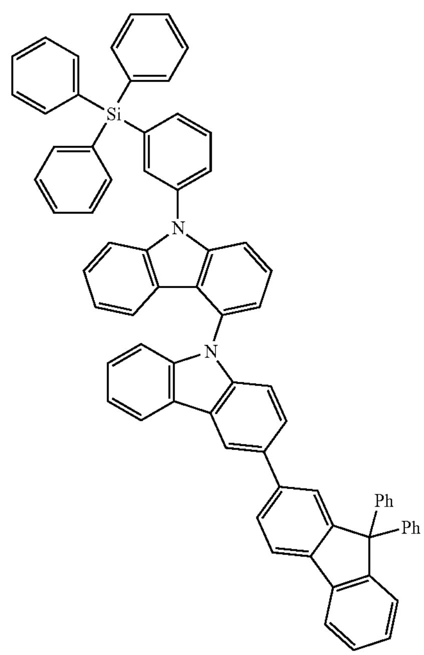

327
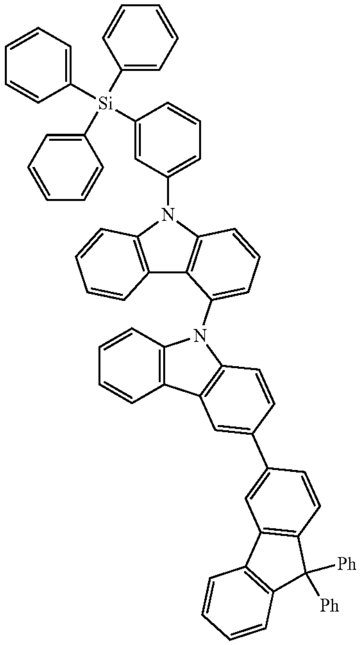
328
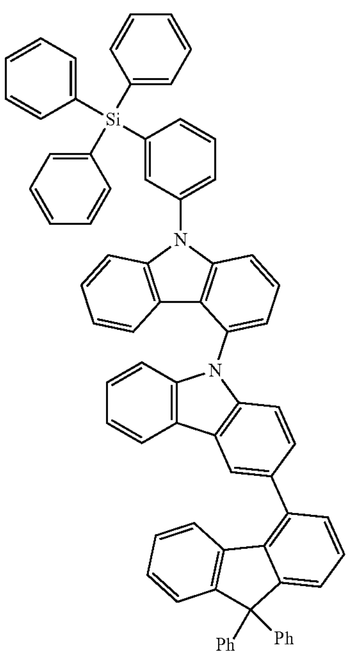
329
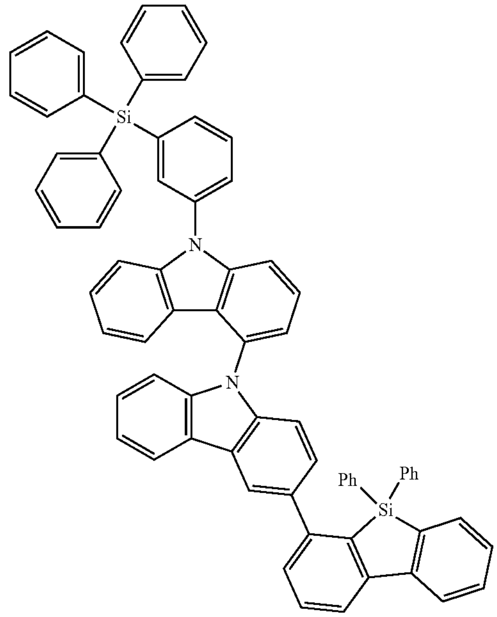
330
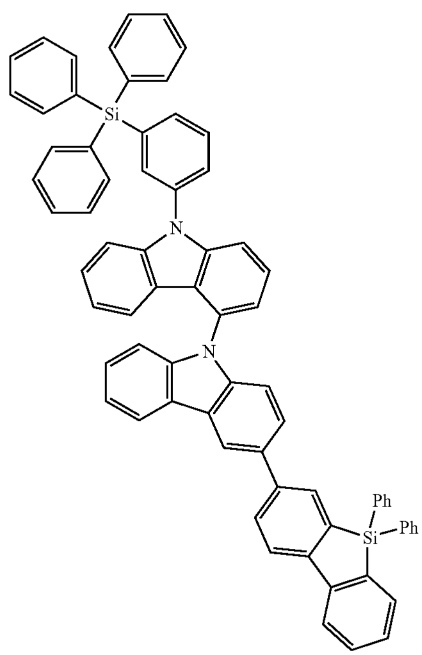

331
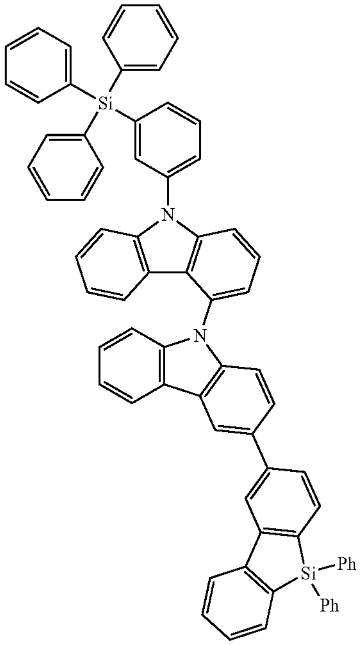
333
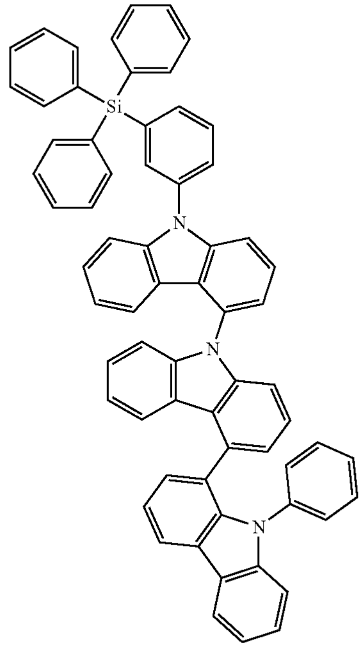
332
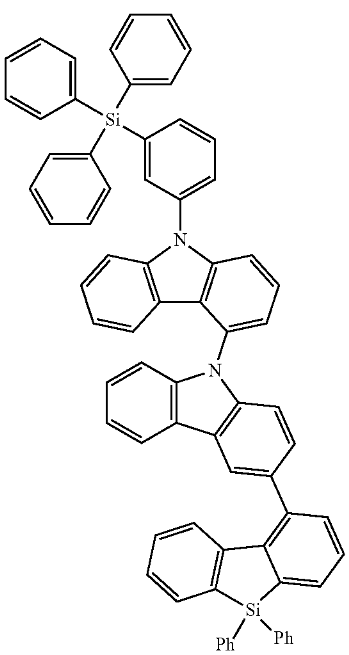
334
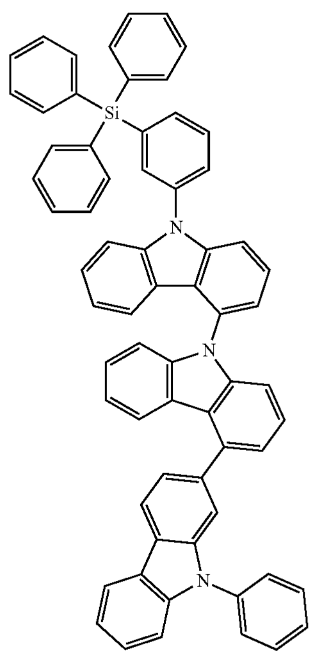

-continued
335
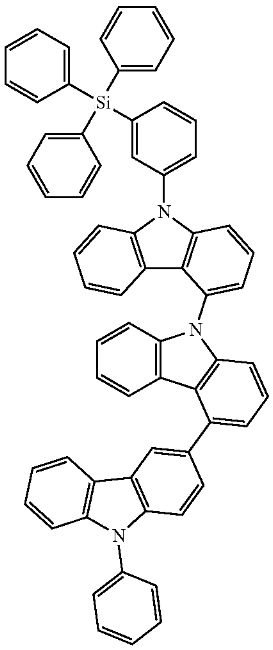
336
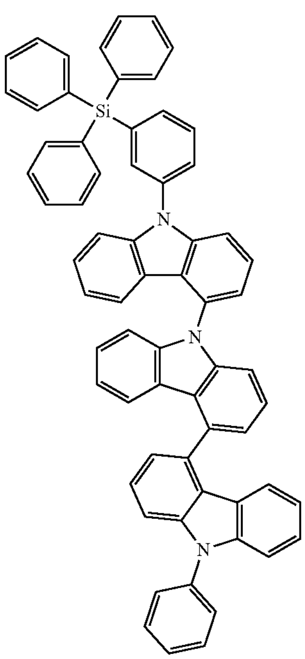
-continued
337
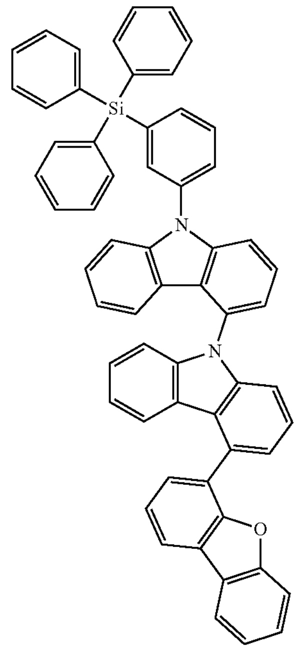
338
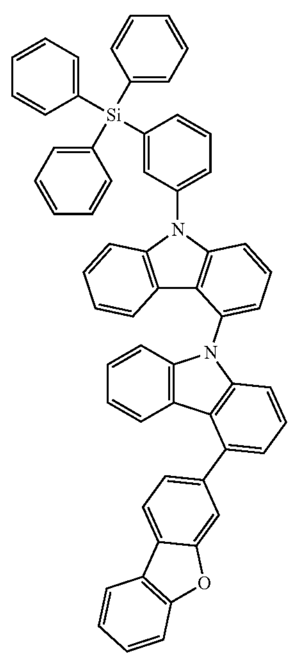

-continued
339
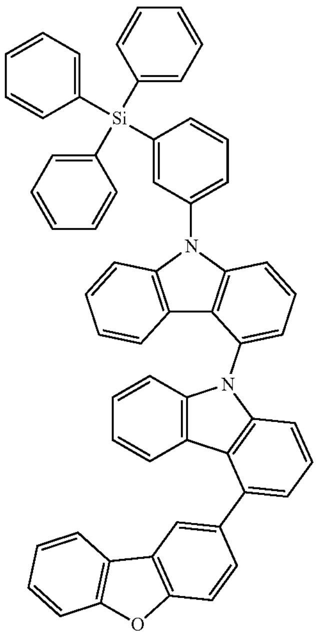
341
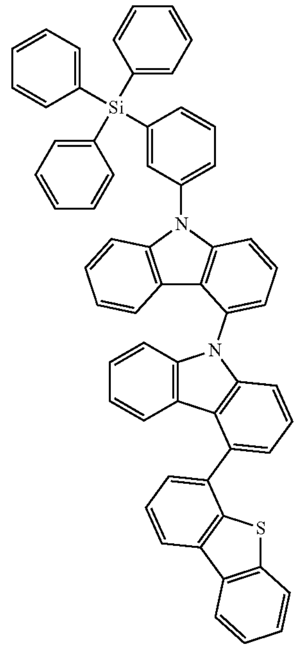
340
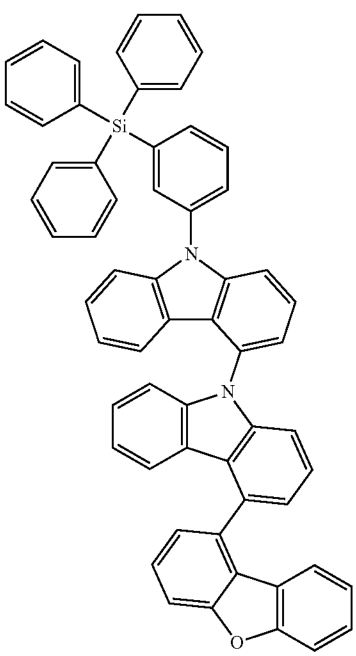
342
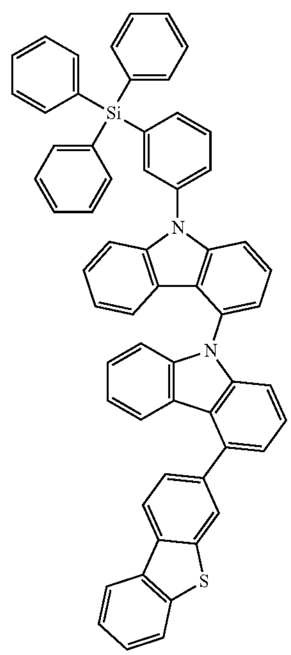

-continued
343
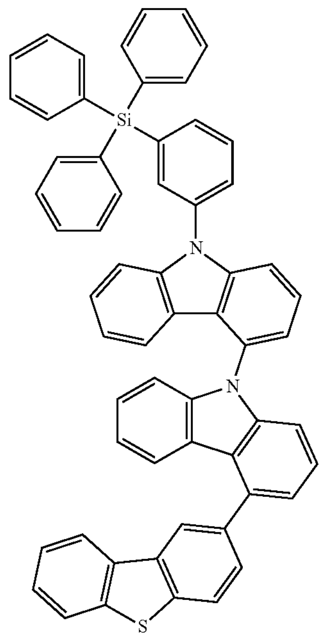
-continued
345
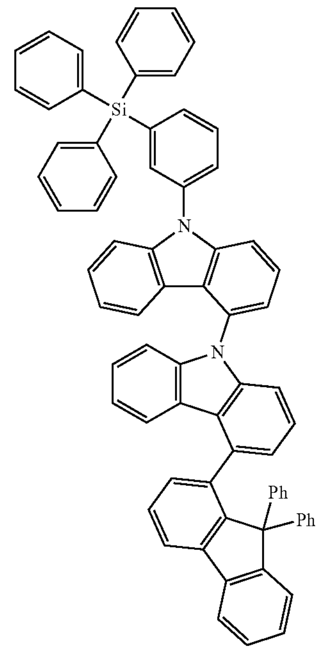
344
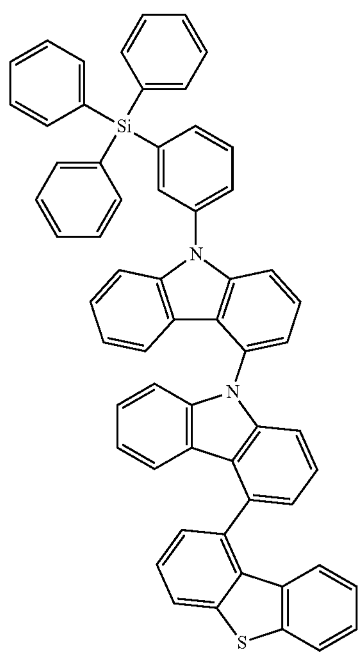
346
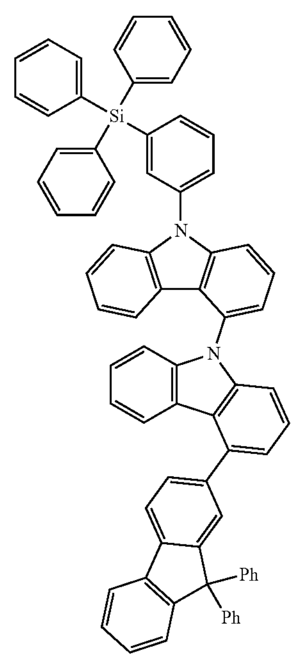

-continued
347
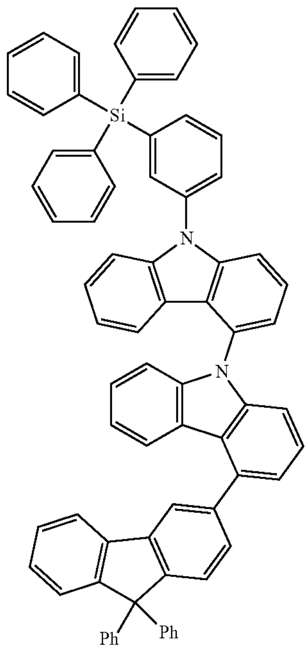
349
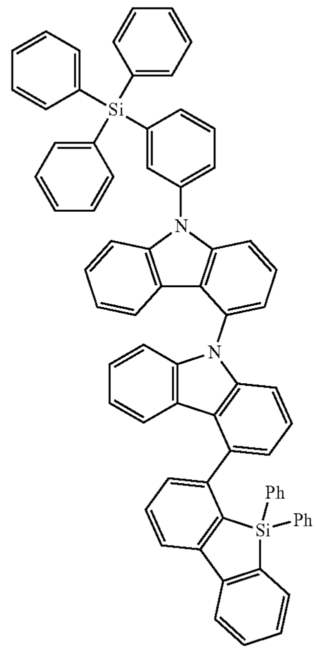
348
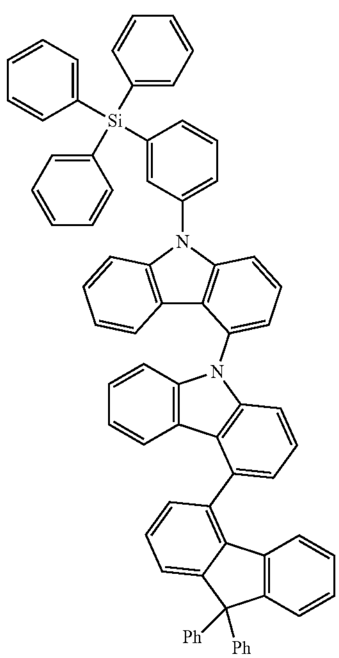
350
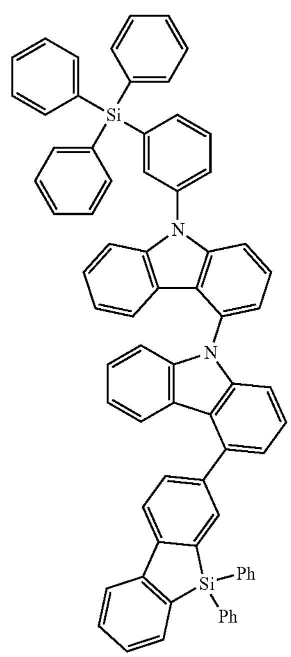

-continued
351
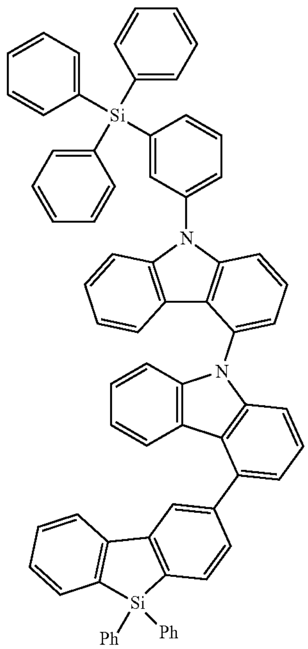
353
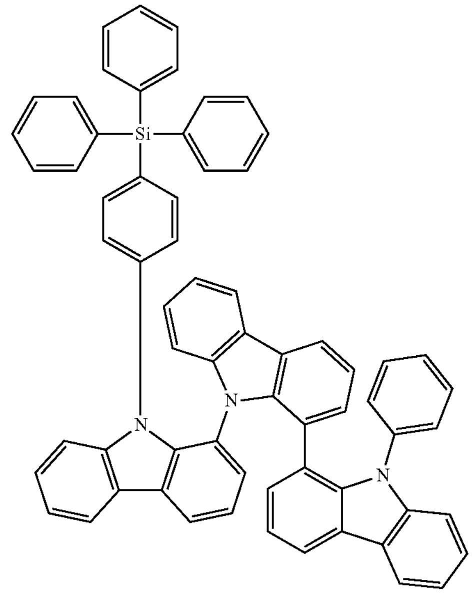
352
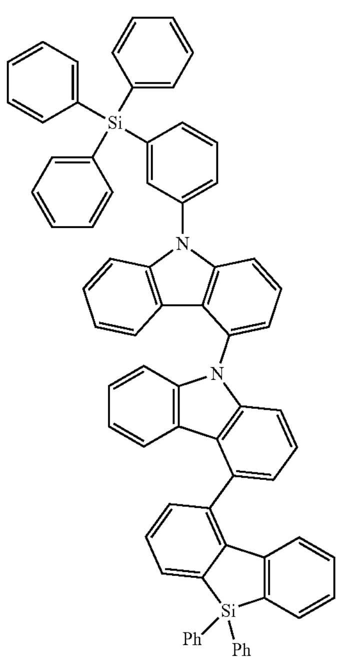
354
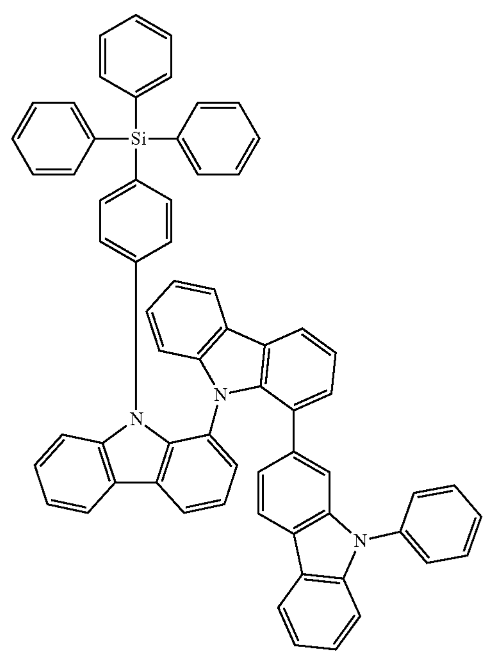

-continued
355
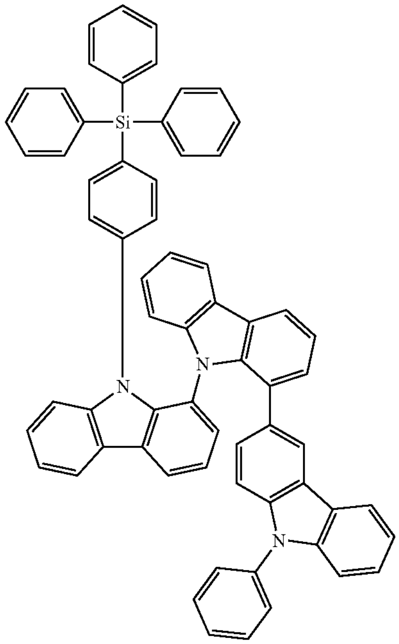
356
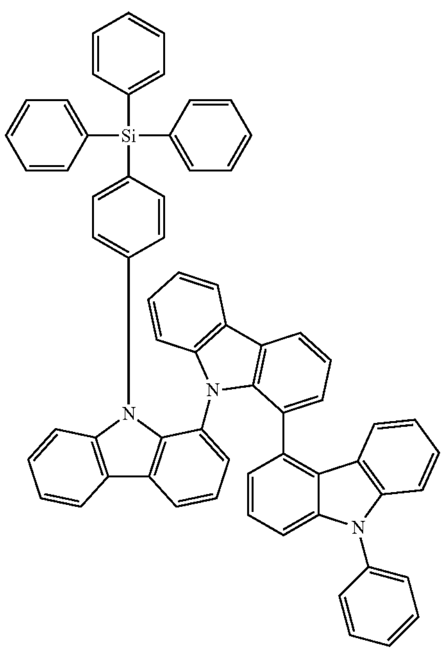
-continued
357
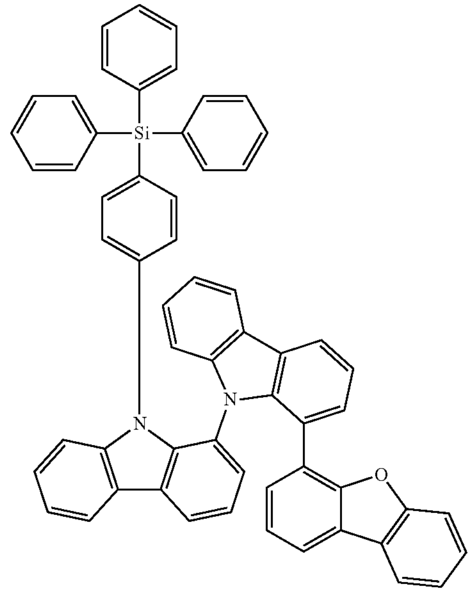
358
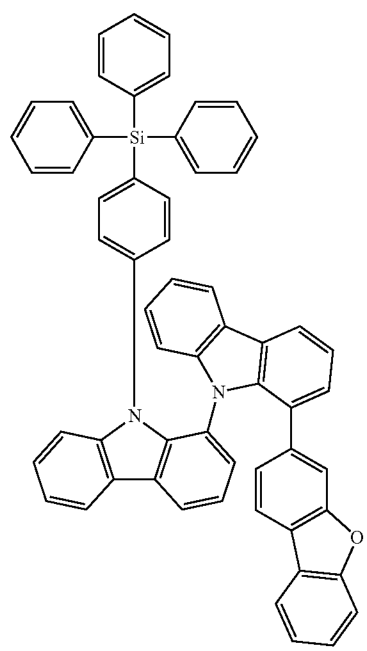

-continued
359
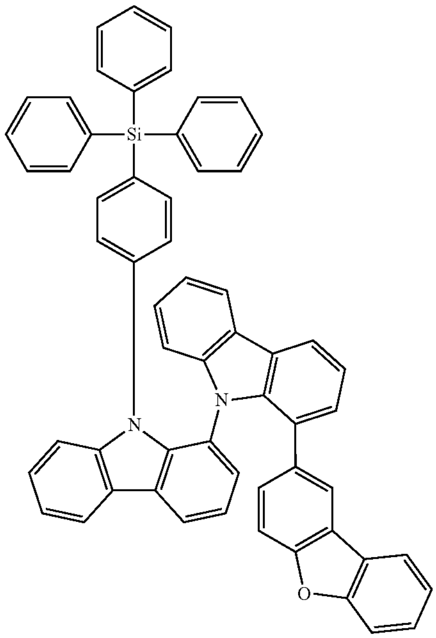
360
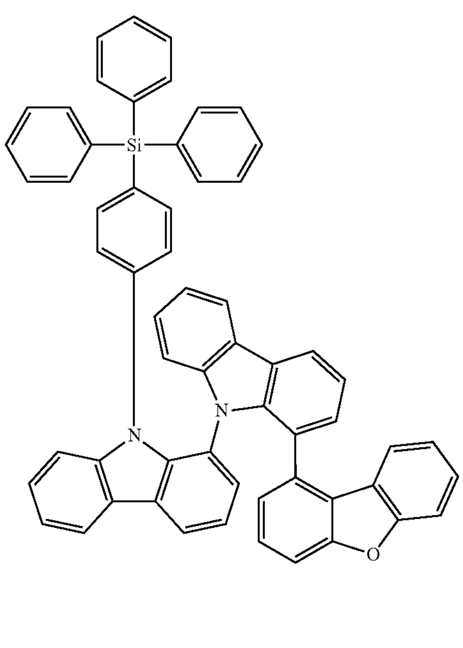
-continued
361
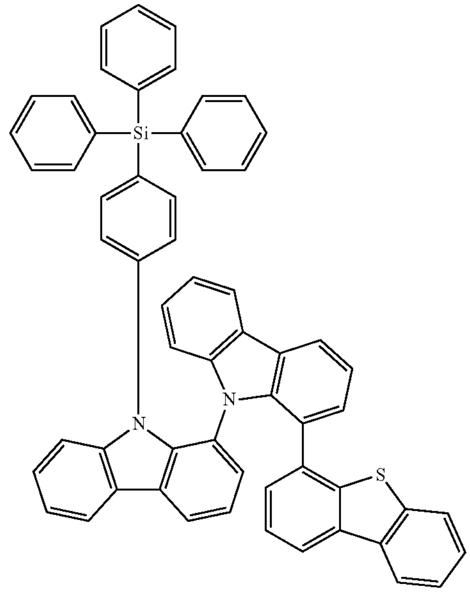
362
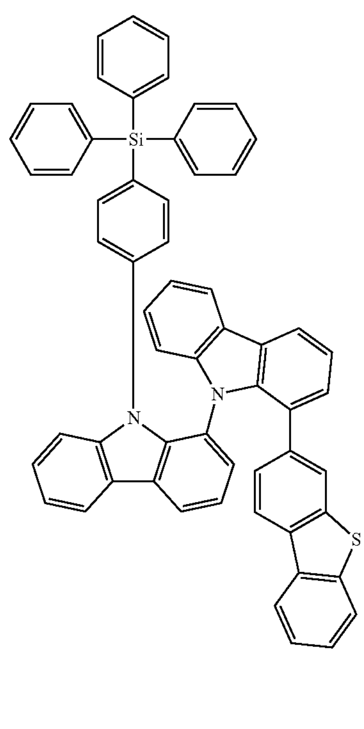

-continued
363
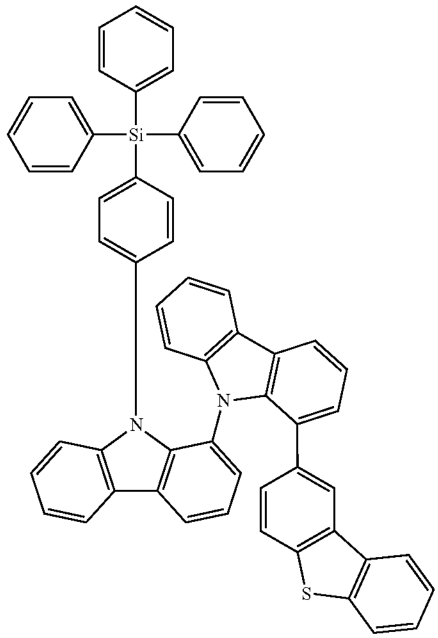
364
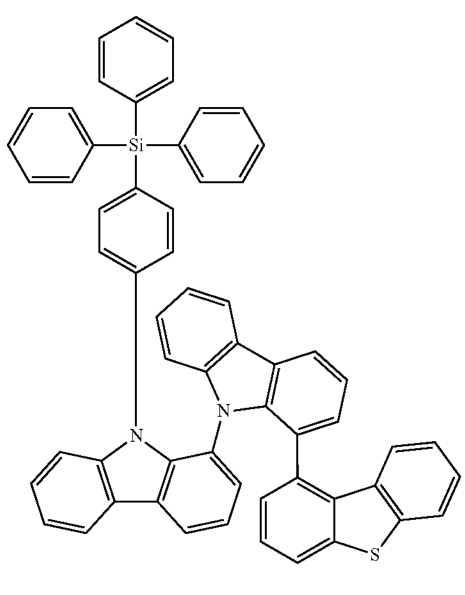
-continued
365
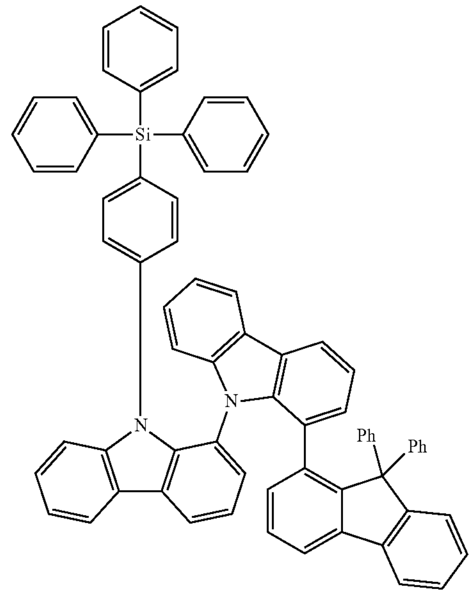
366
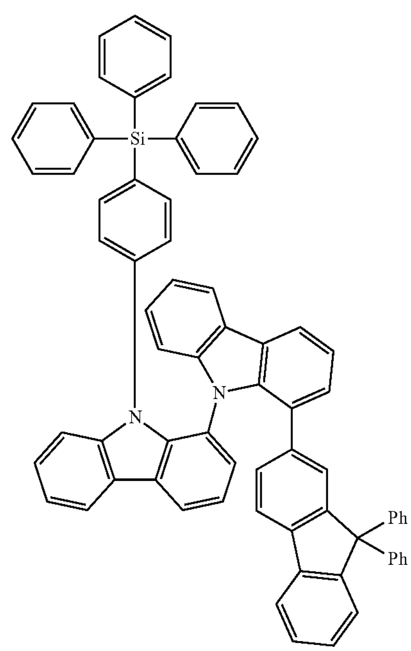

-continued
367
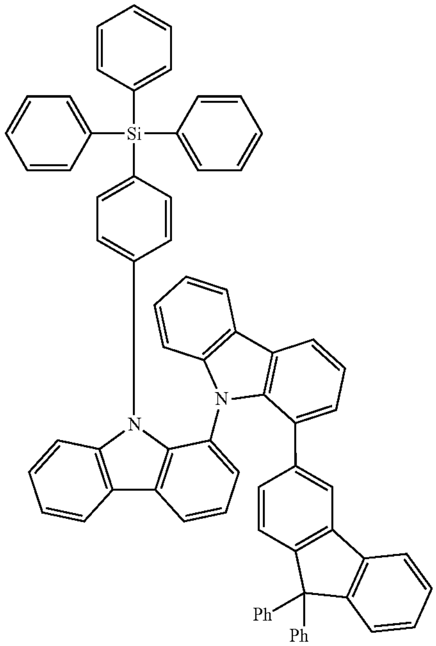
368
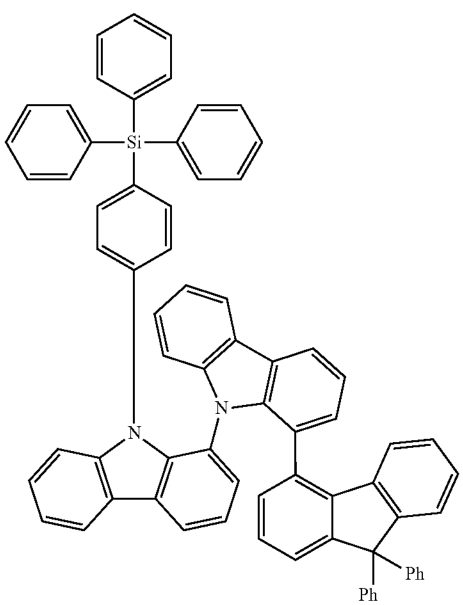
-continued
369
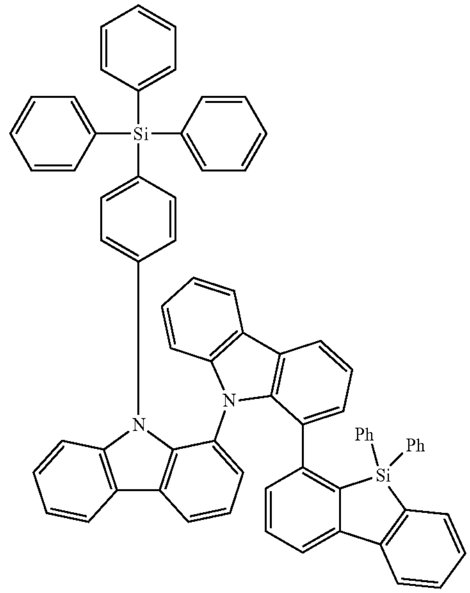
370
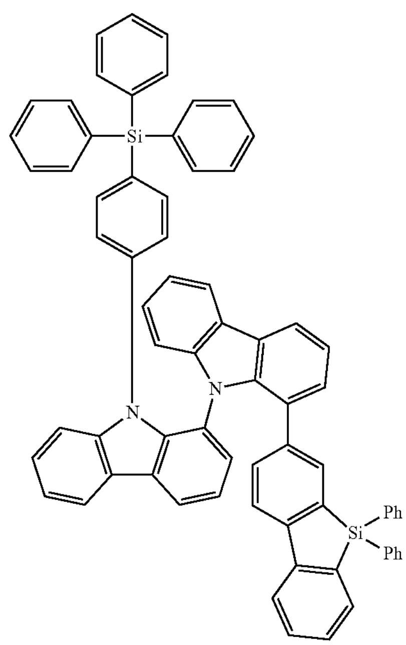

-continued
371
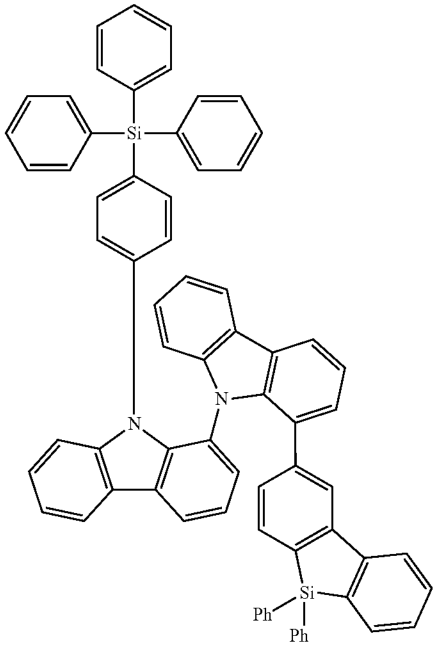
372
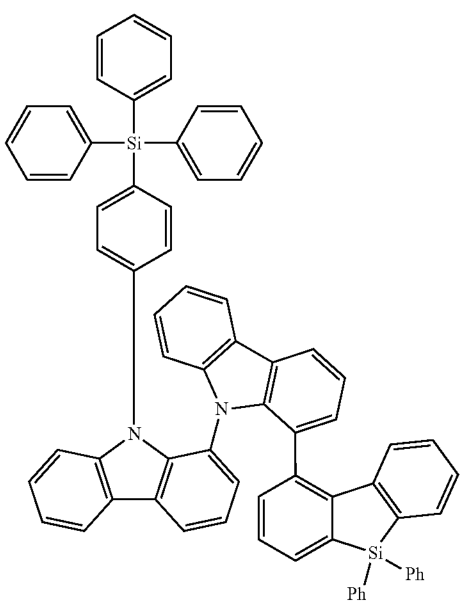
-continued
373
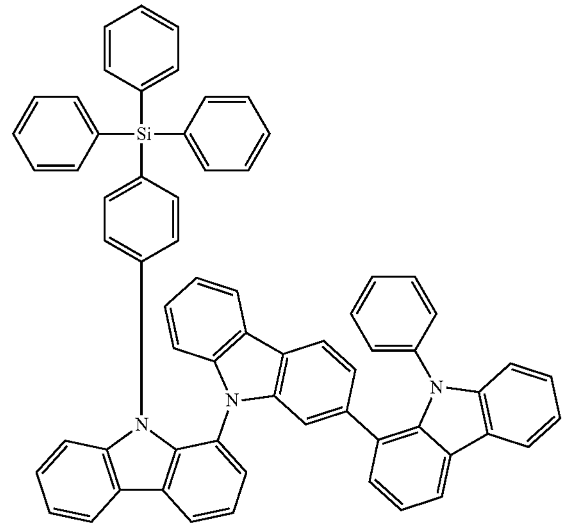
374
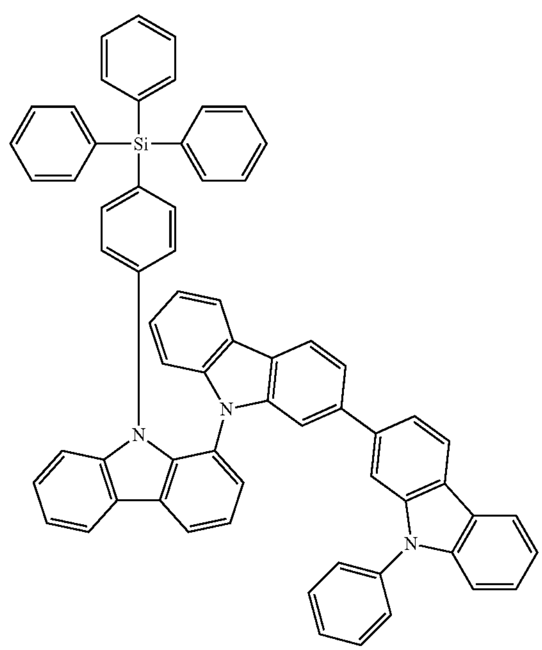

-continued
375
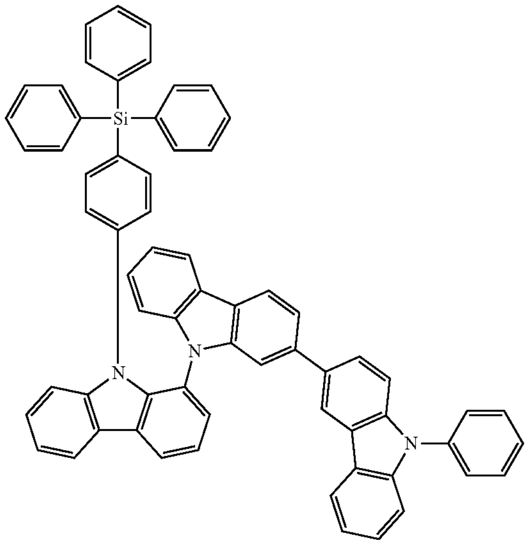
376
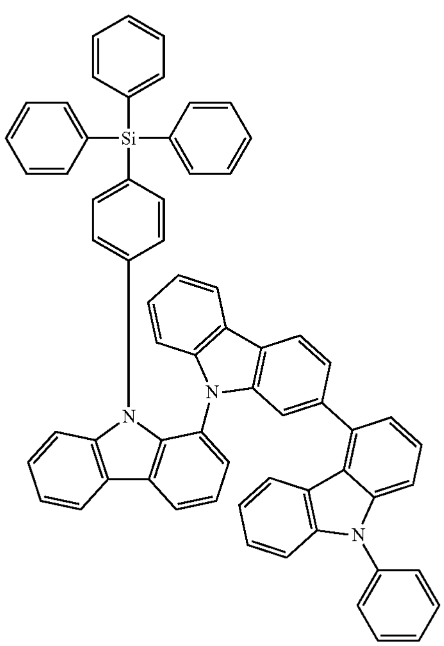
-continued
377
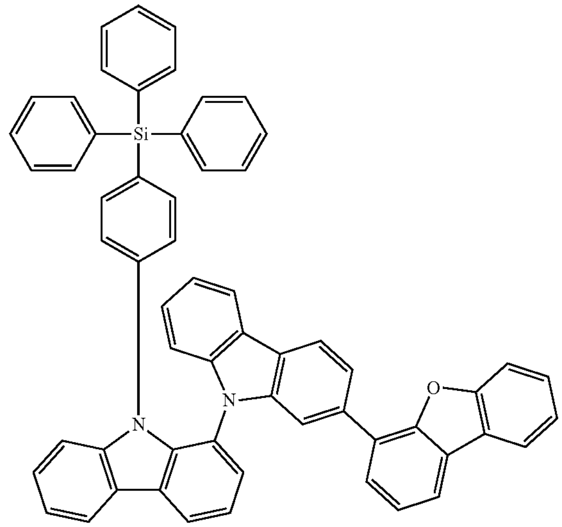
378
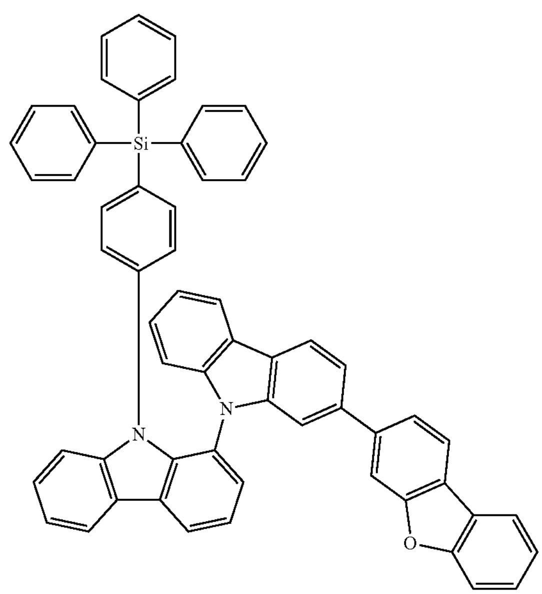

-continued
379
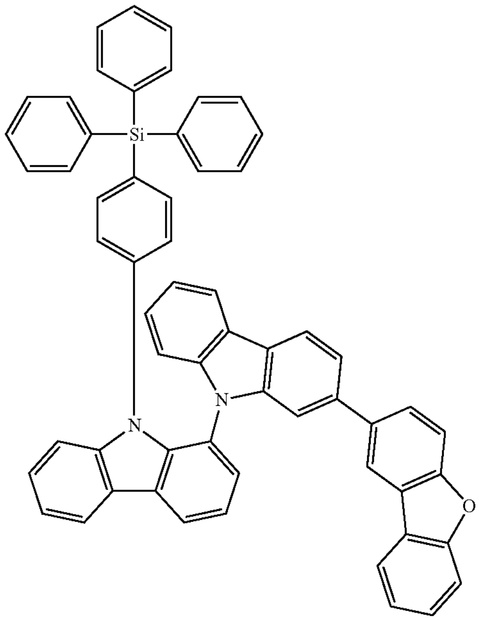
380
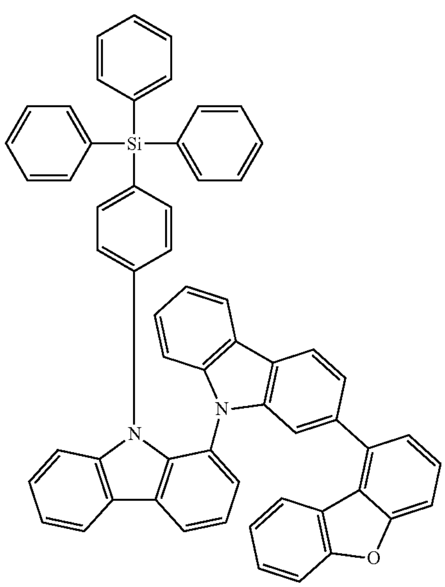
-continued
381
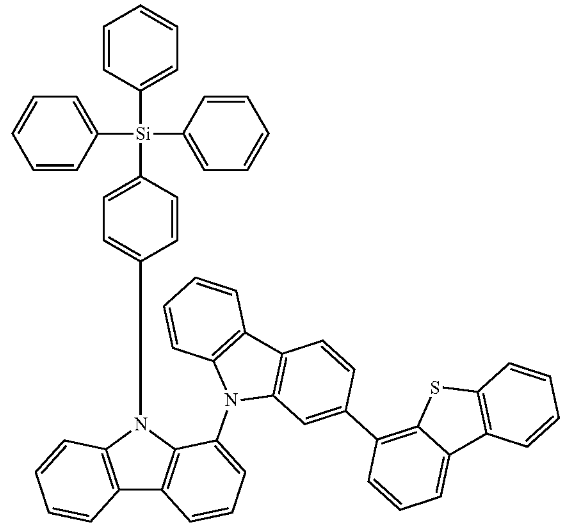
382
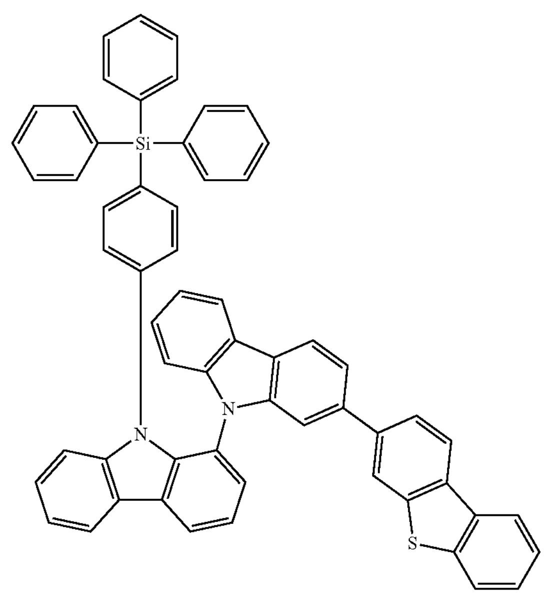

383
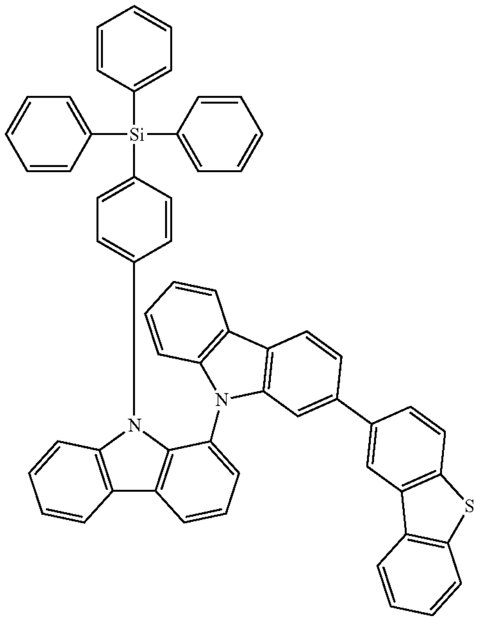
384
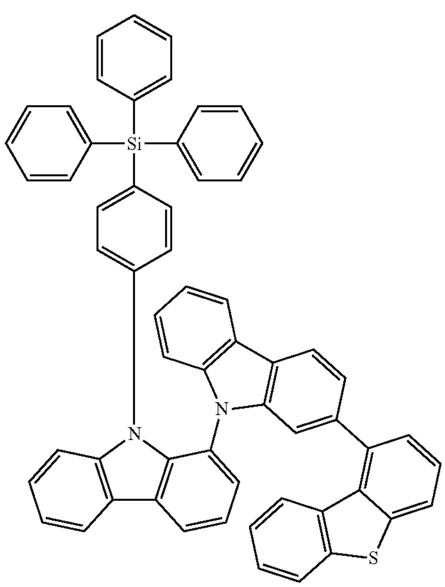
385
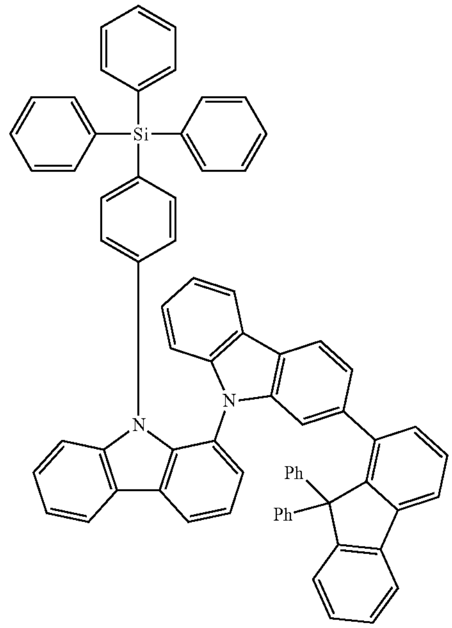
386
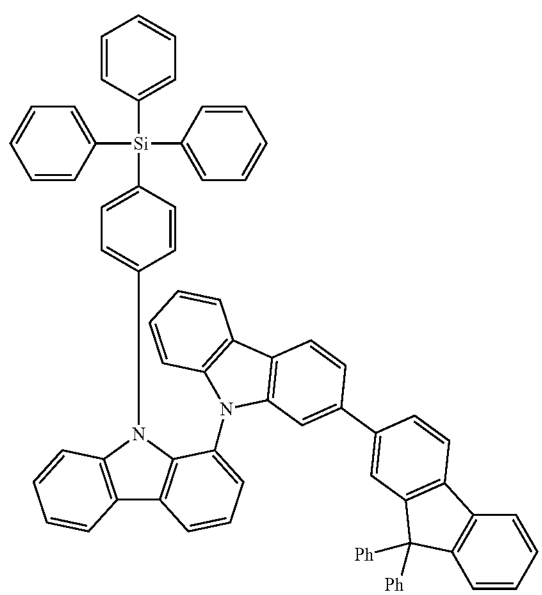

-continued
387
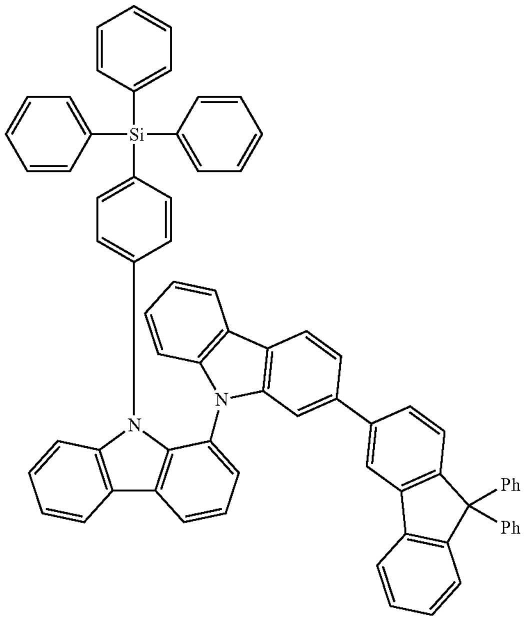
388
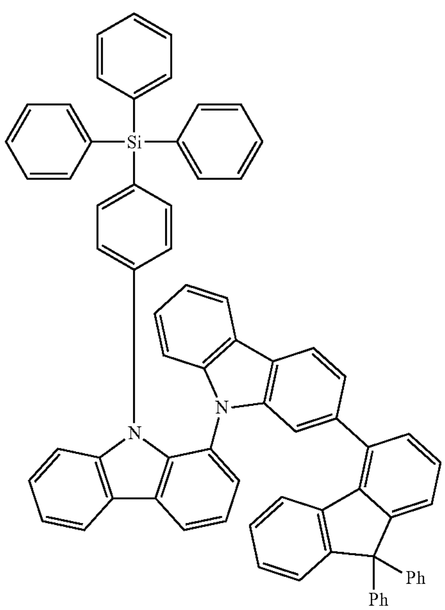
-continued
389
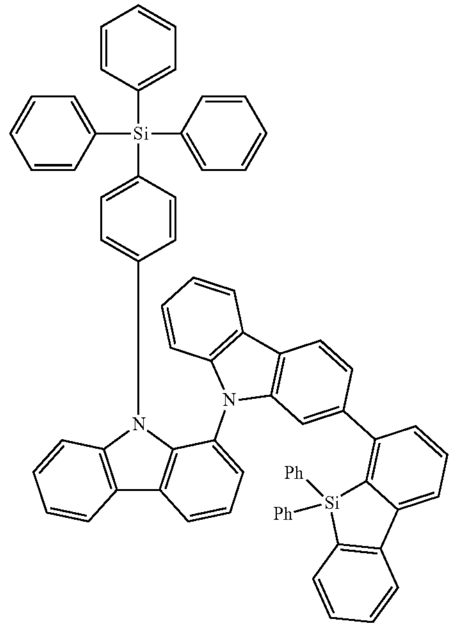
390
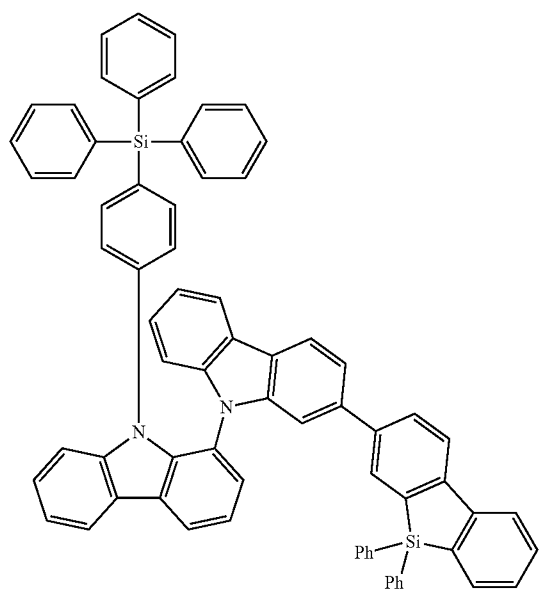

-continued
391
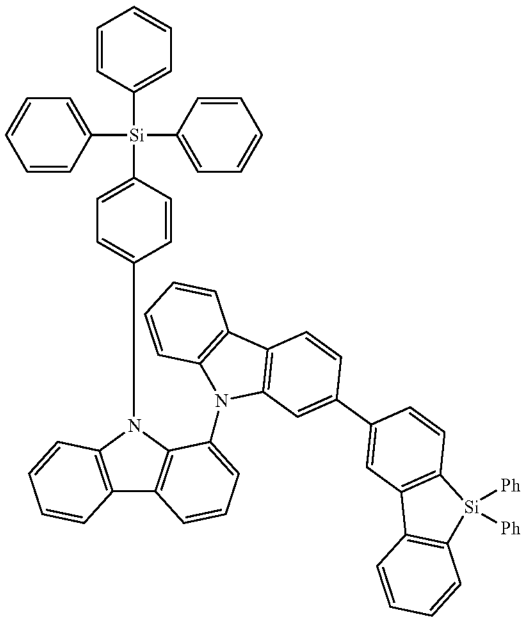
392
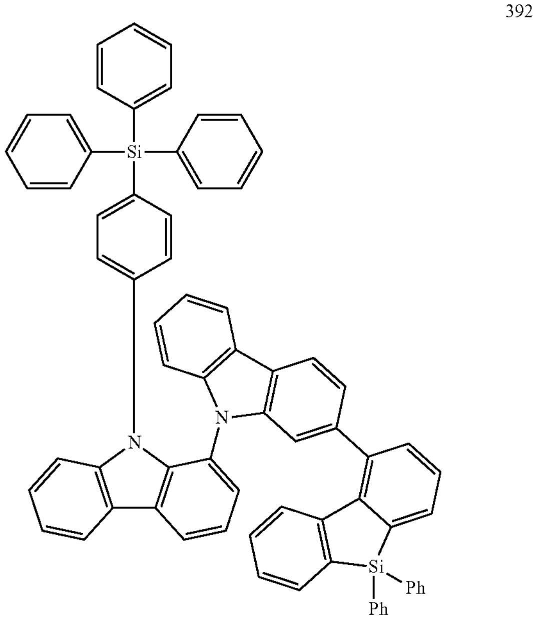
-continued
393
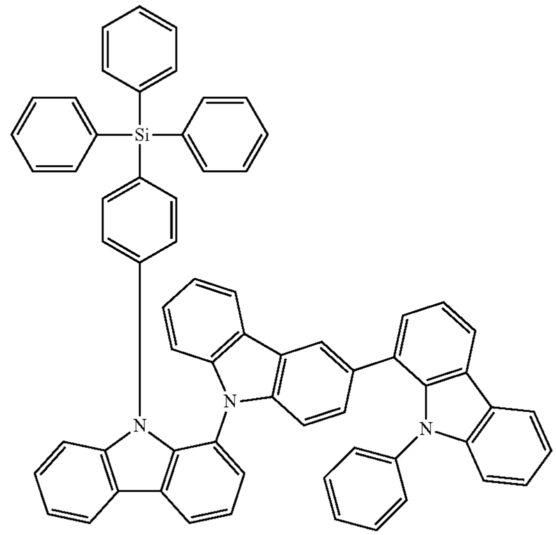
394
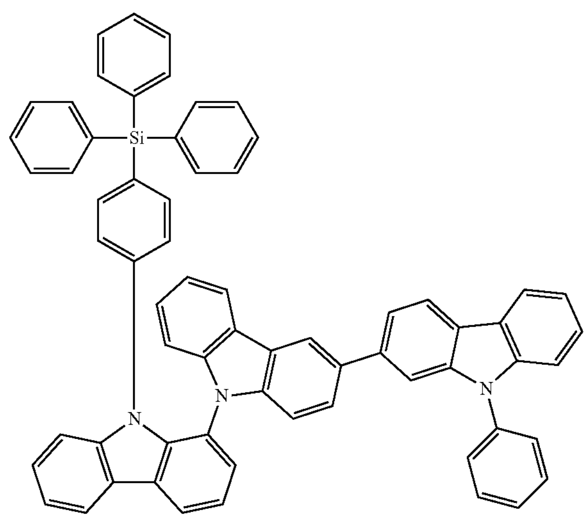
395
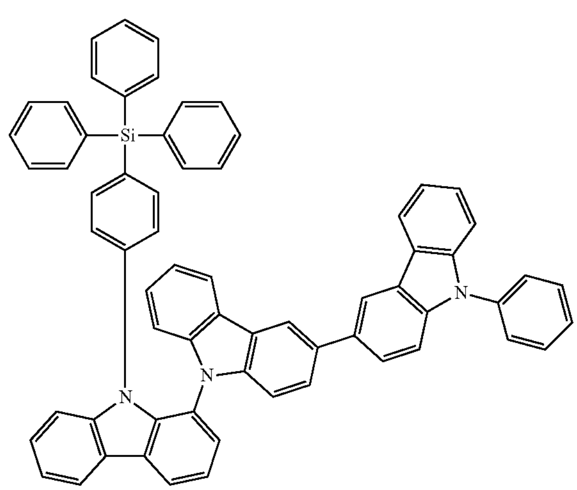

-continued
396
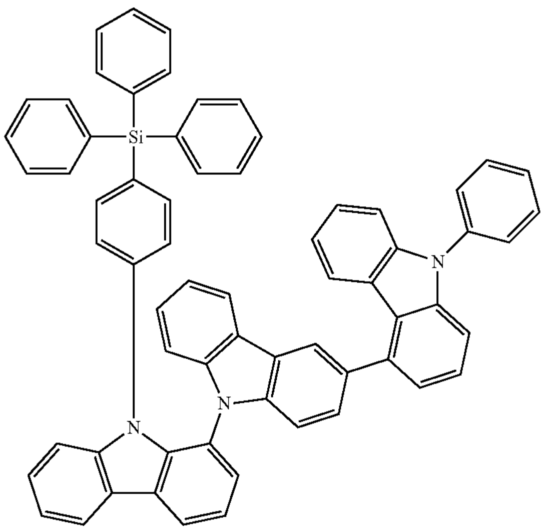
397
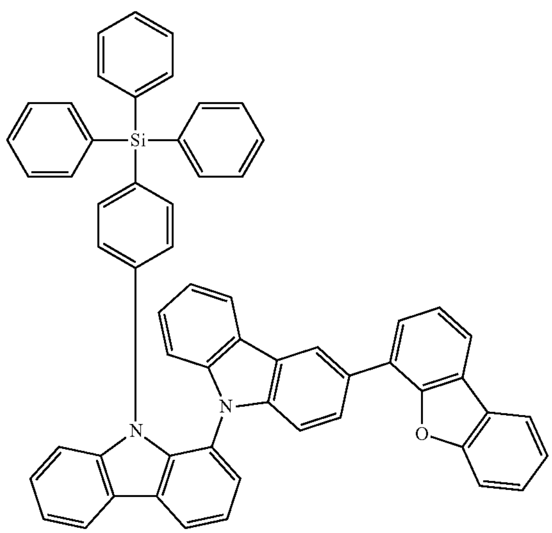
398
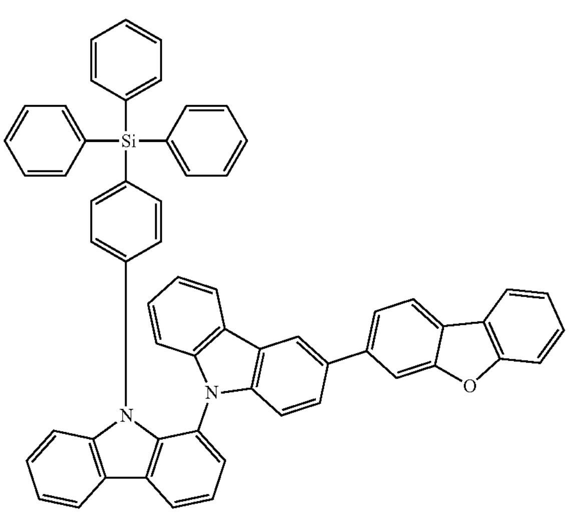
-continued
399
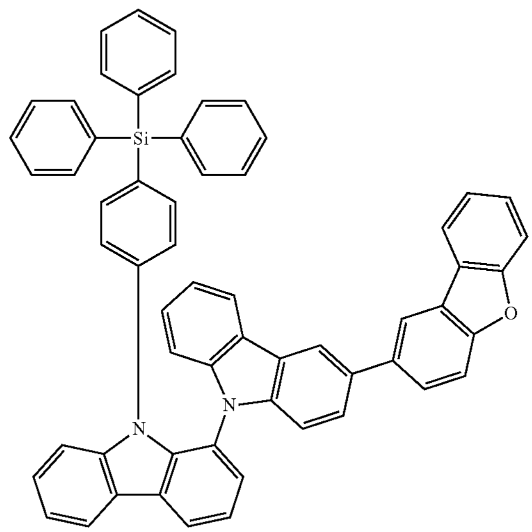
400
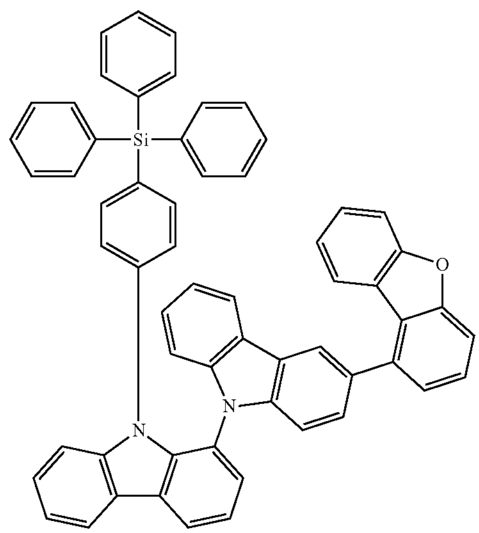
401
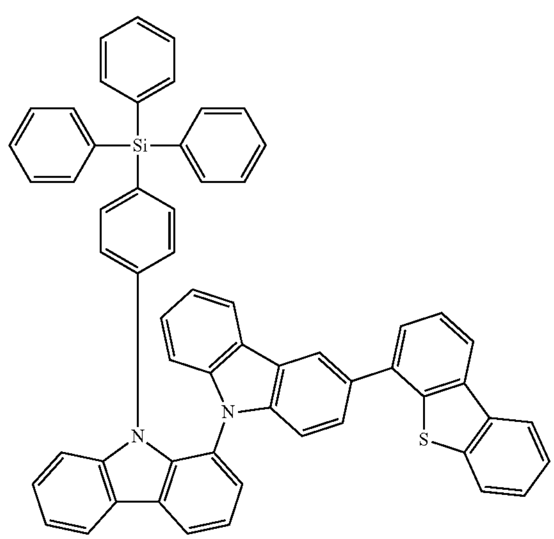

402
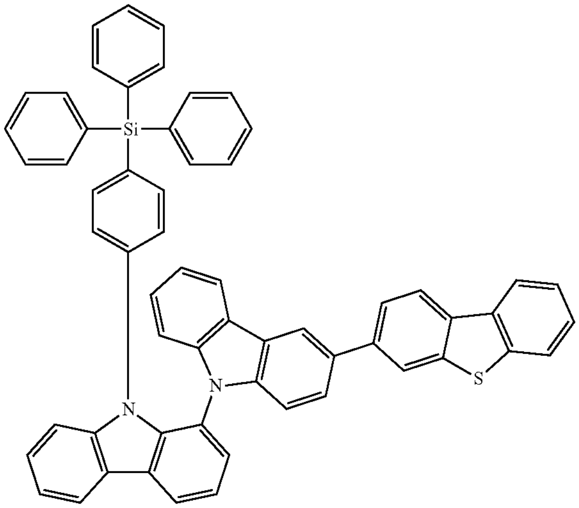
403
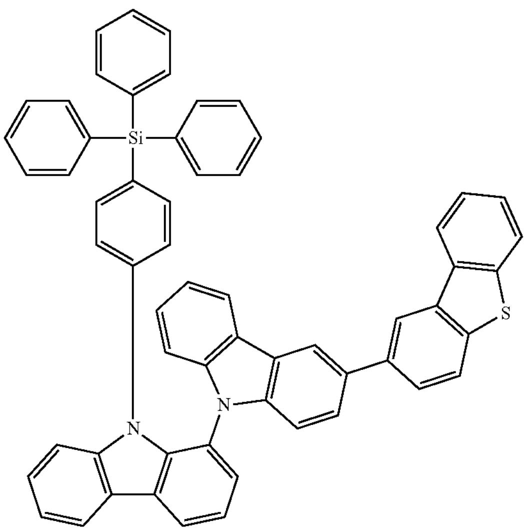
404
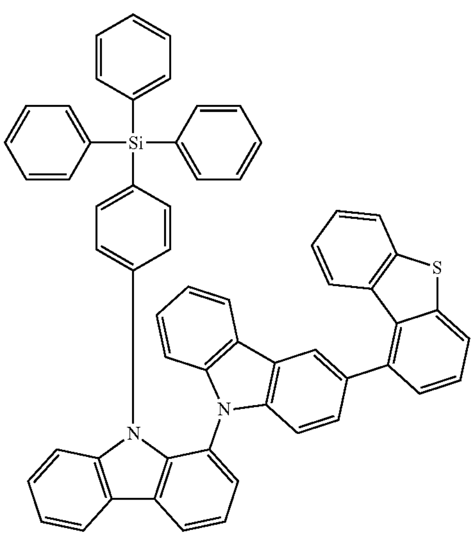
405
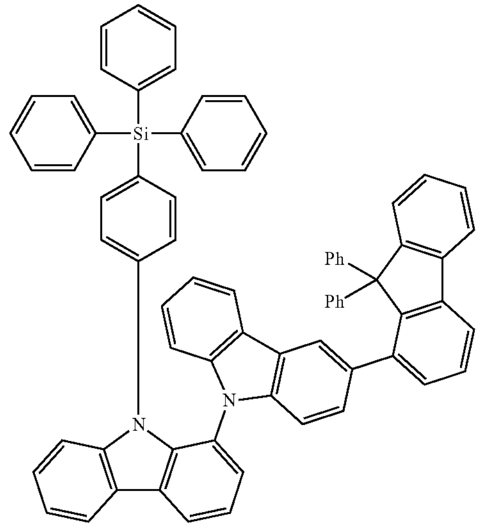
406
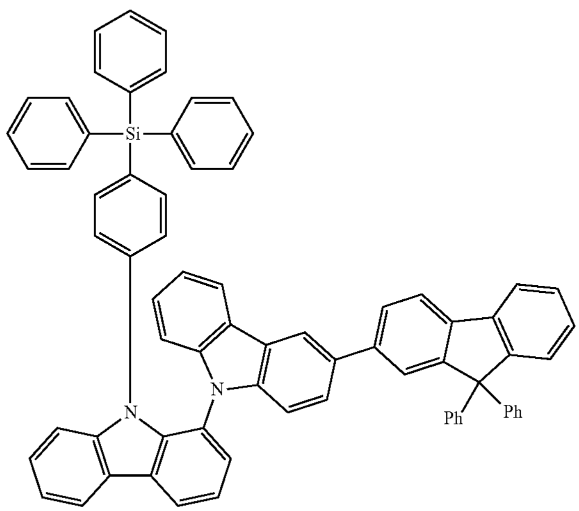
407
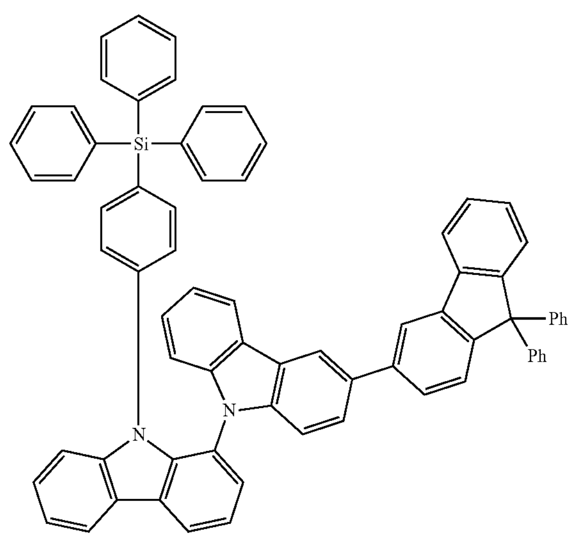

-continued
408
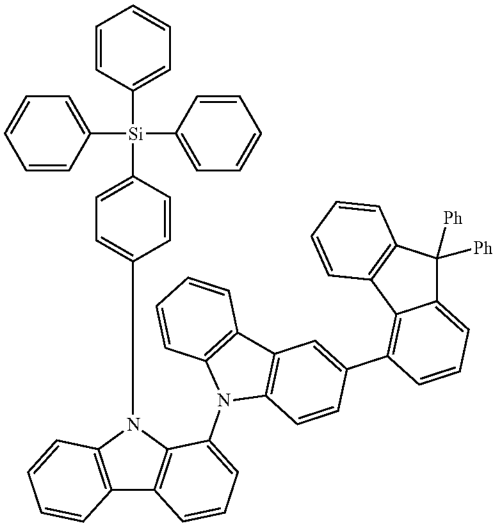
409
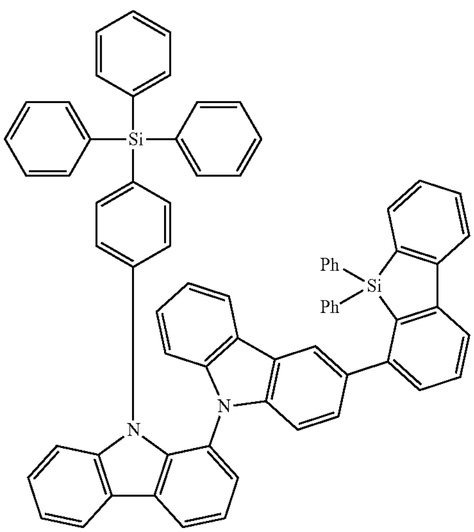
410
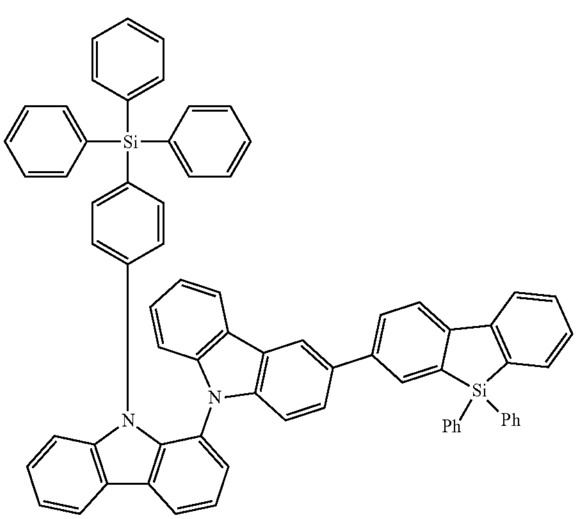
-continued
411
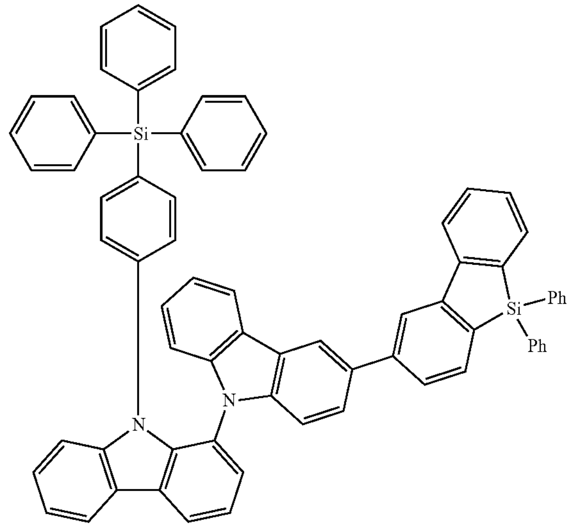
412
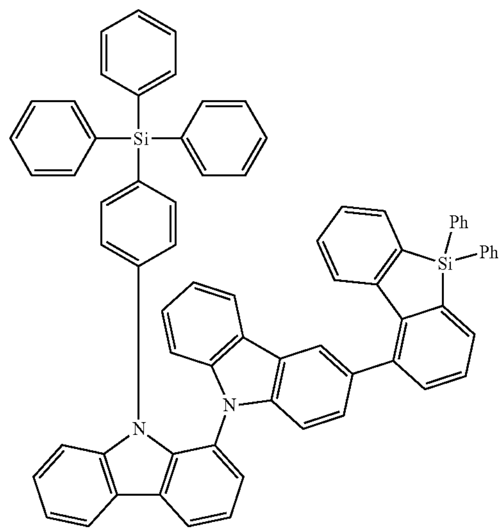
413
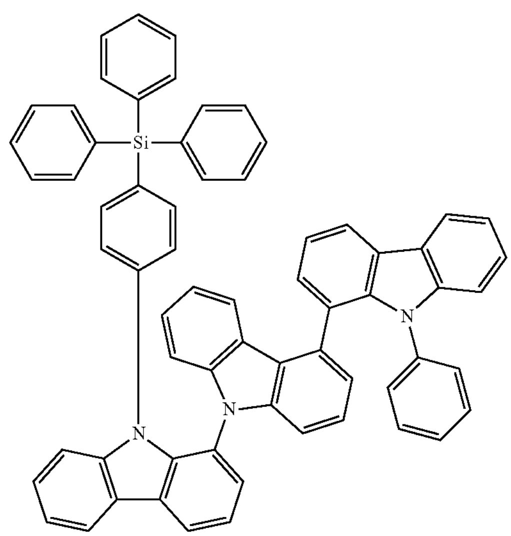

-continued
414
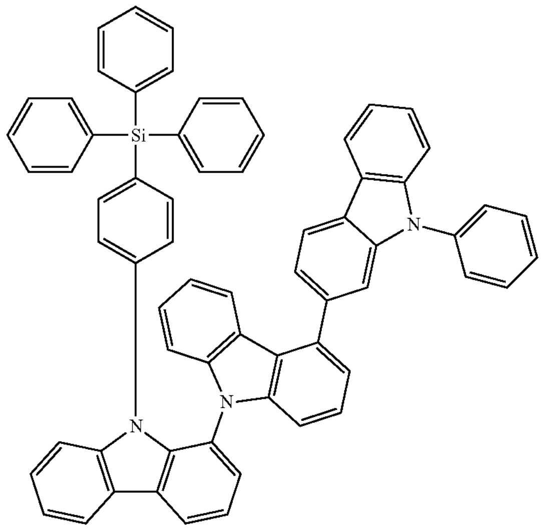
415
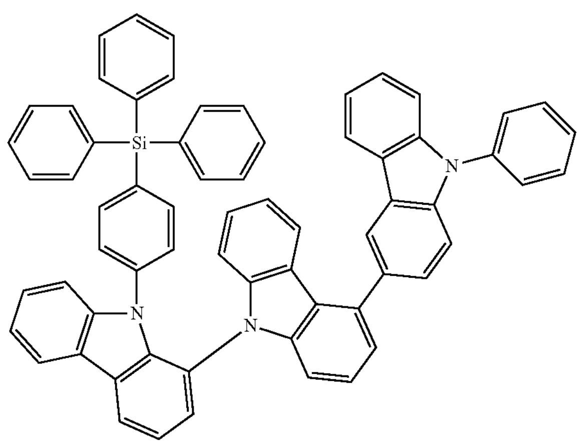
416
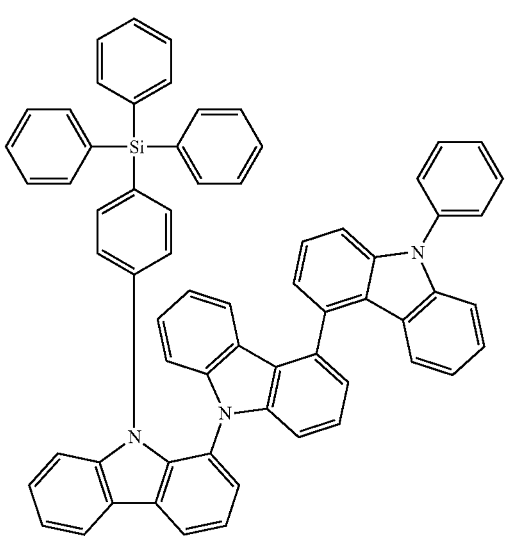
-continued
417
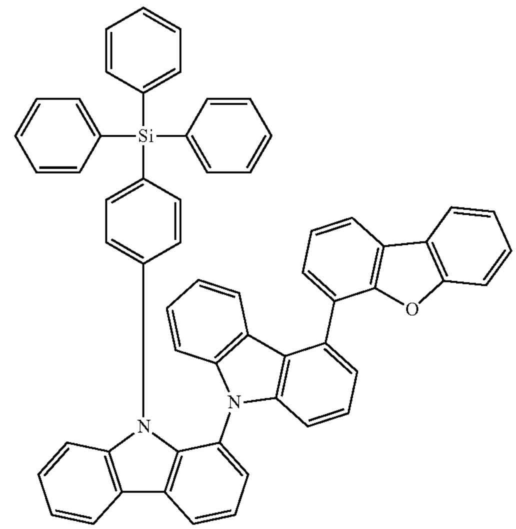
418
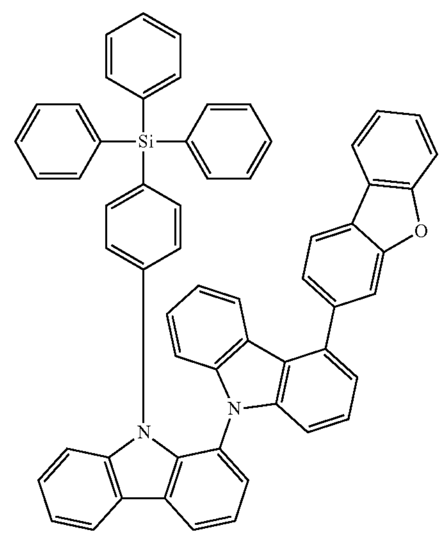
419
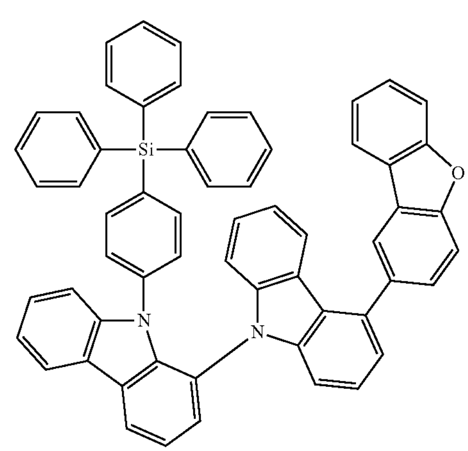

-continued
420
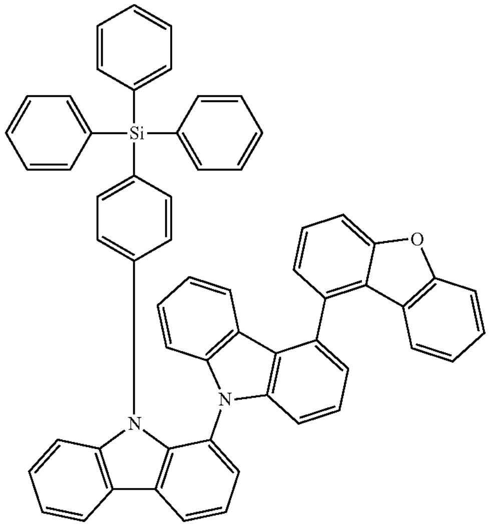
421
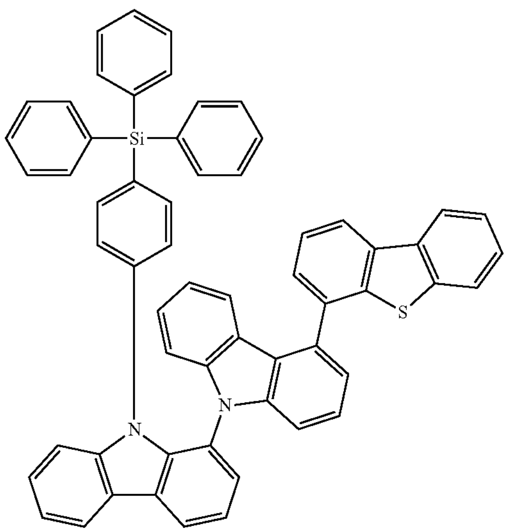
422
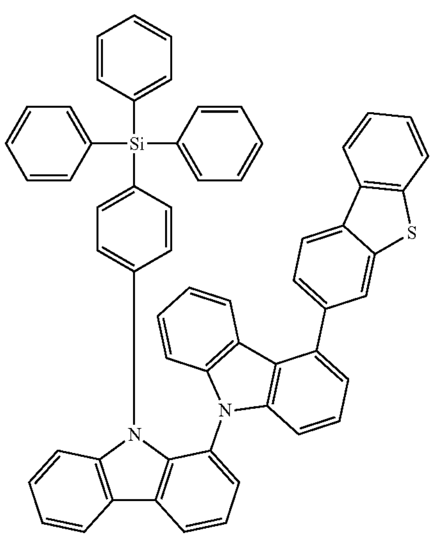
-continued
423
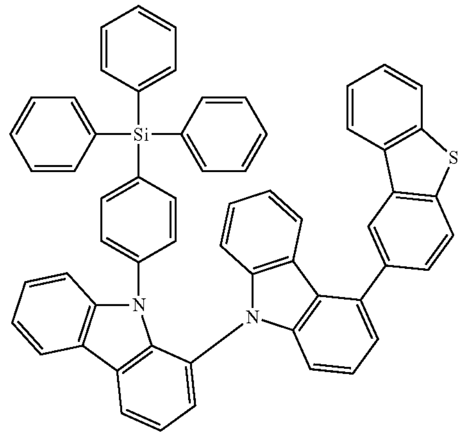
424
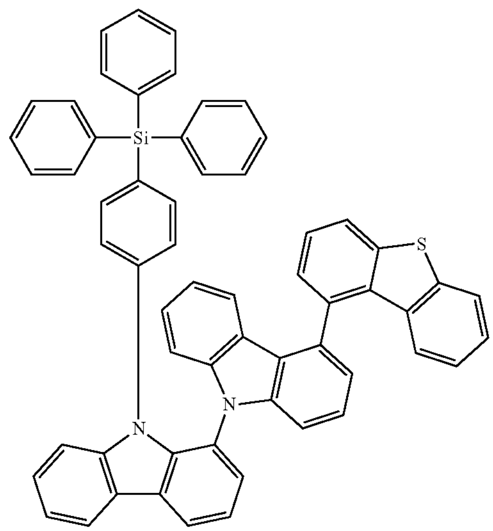
425
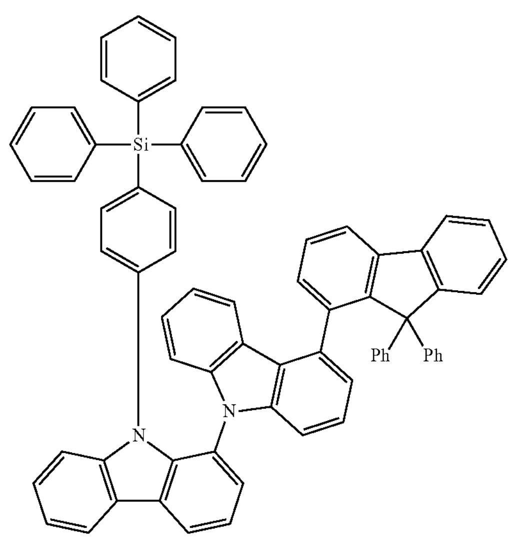

-continued
426
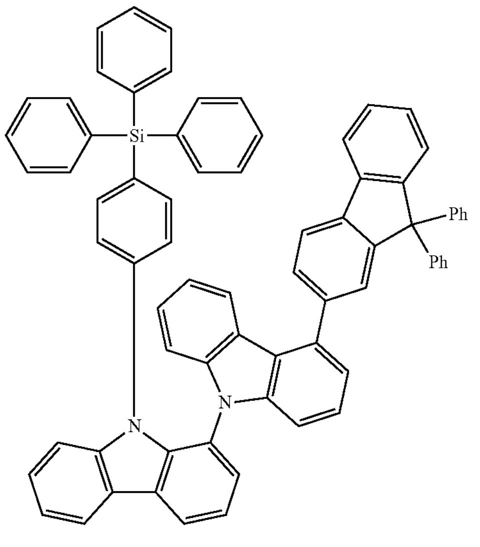
427
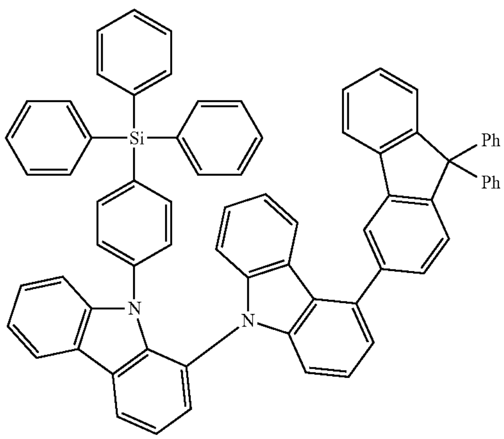
428
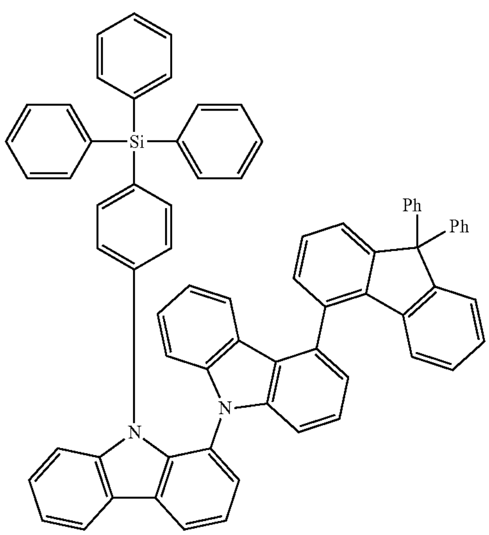
-continued
429
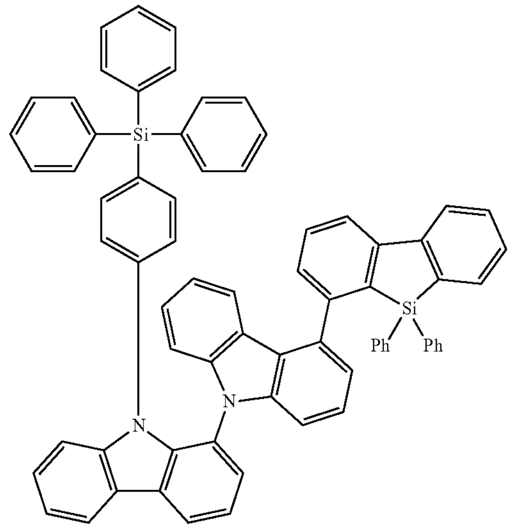
430
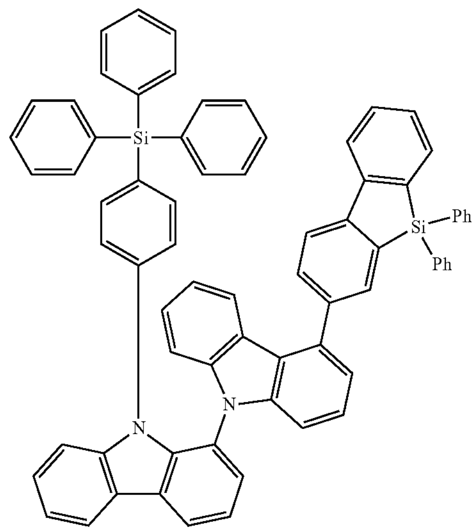
431
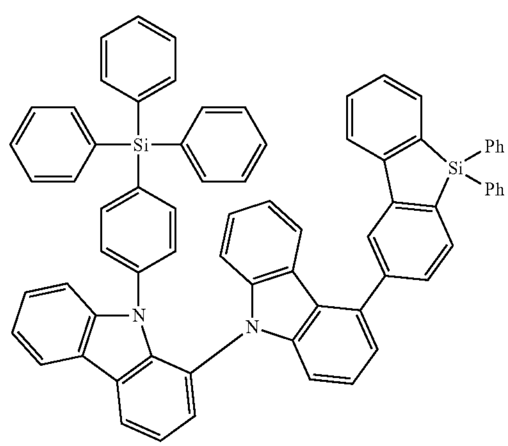

-continued
432
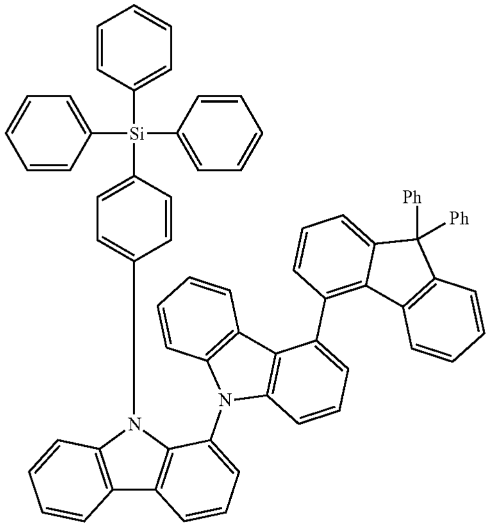
433
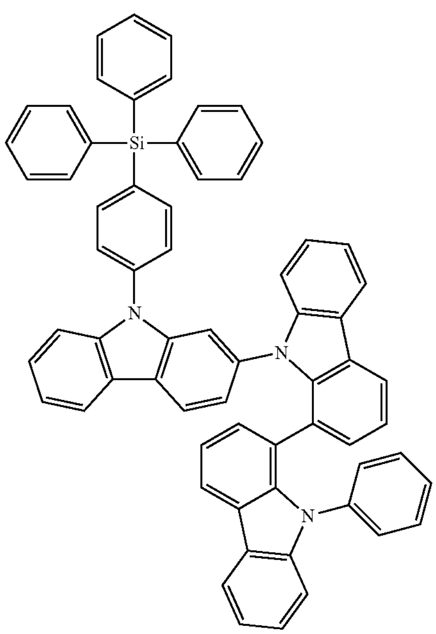
-continued
434
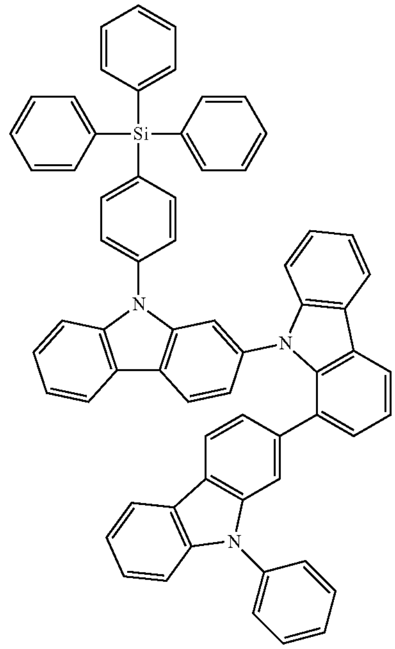
435
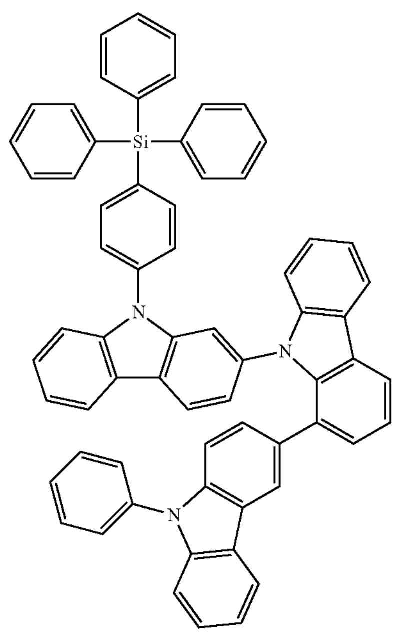

-continued
436
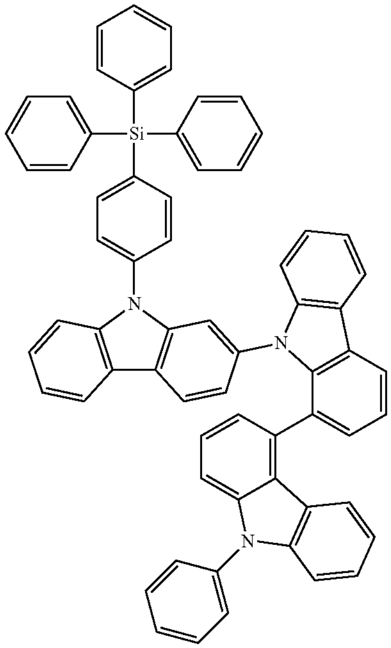
437
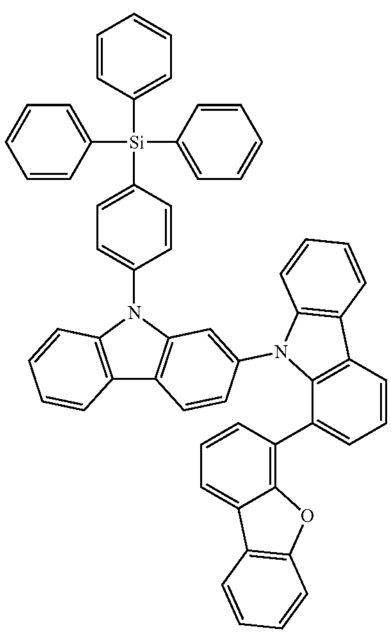
-continued
438
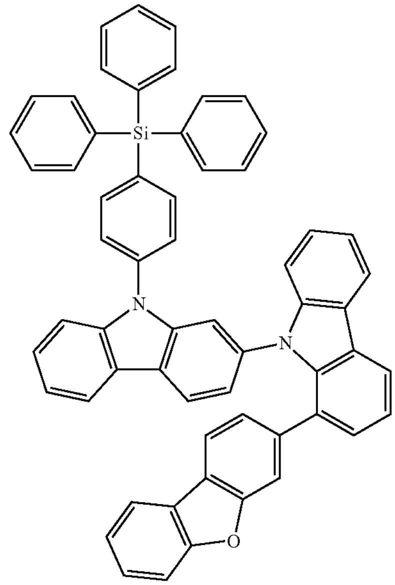
439
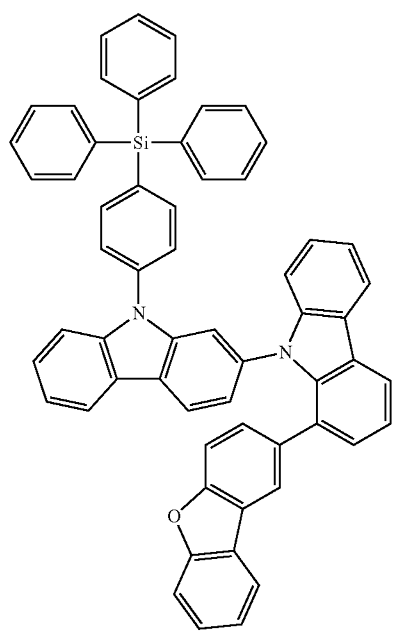

-continued
440
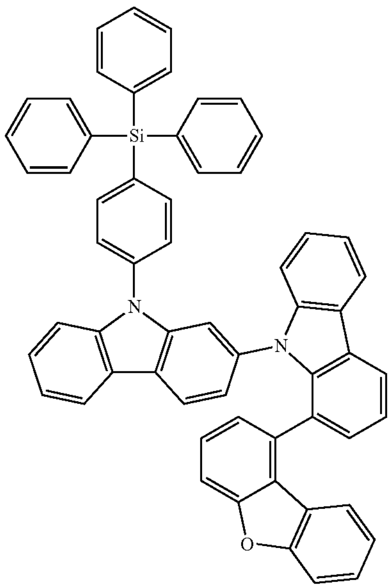
441
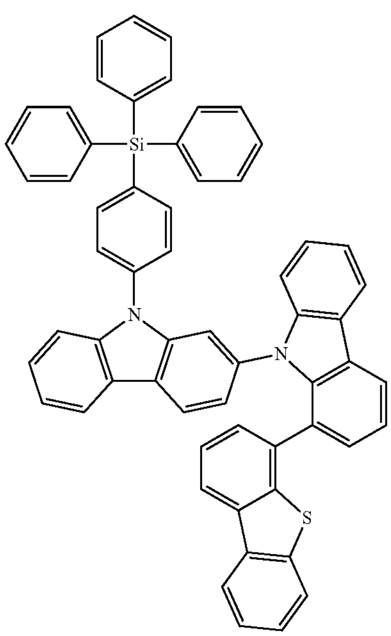
-continued
442
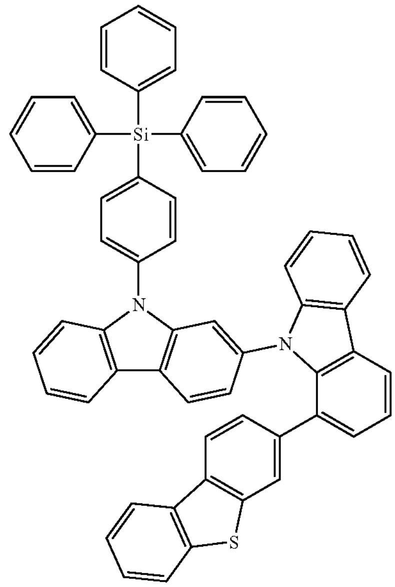
443
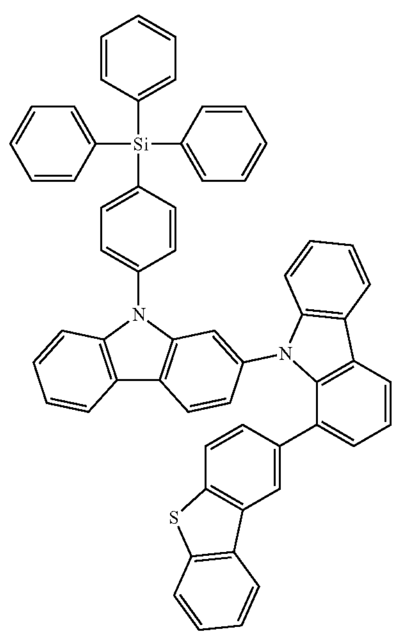

-continued
444
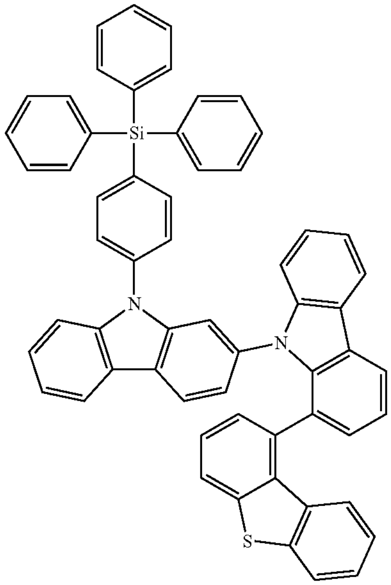
445
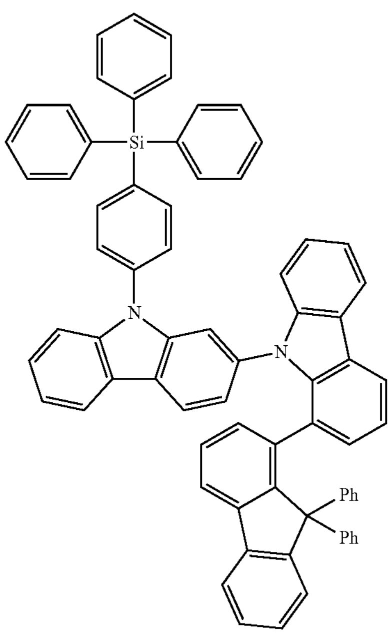
-continued
446
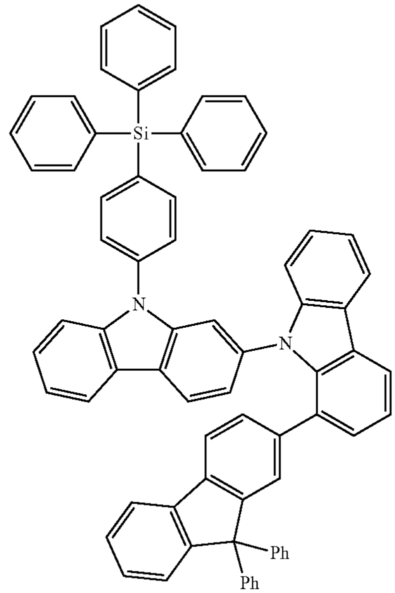
447
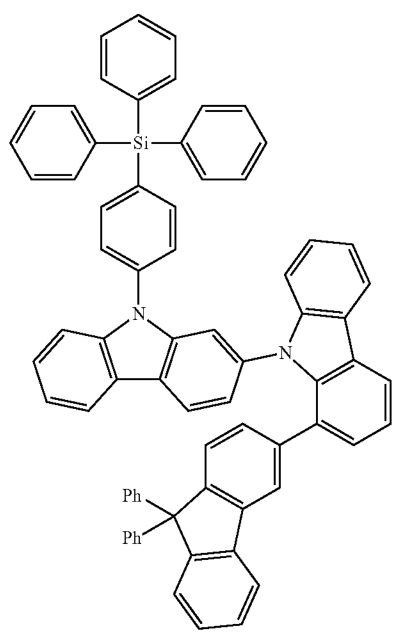

-continued
448
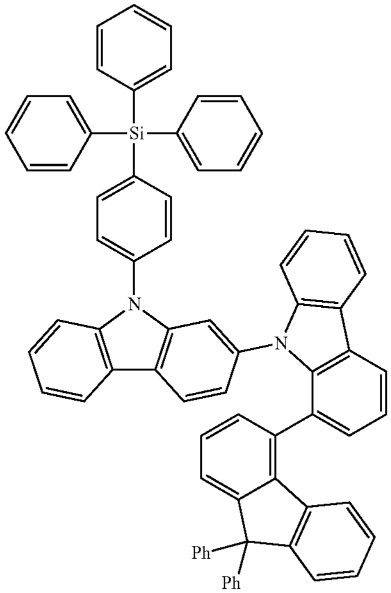
449
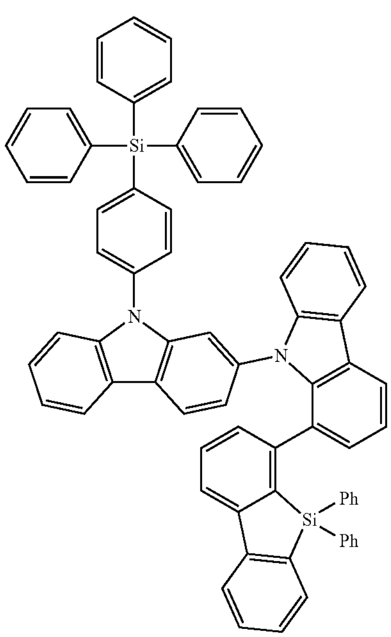
-continued
450
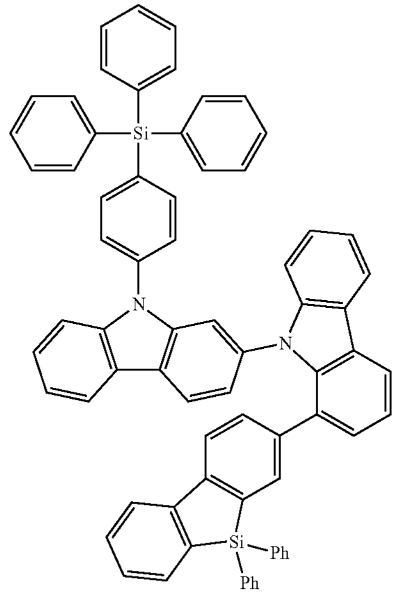
451
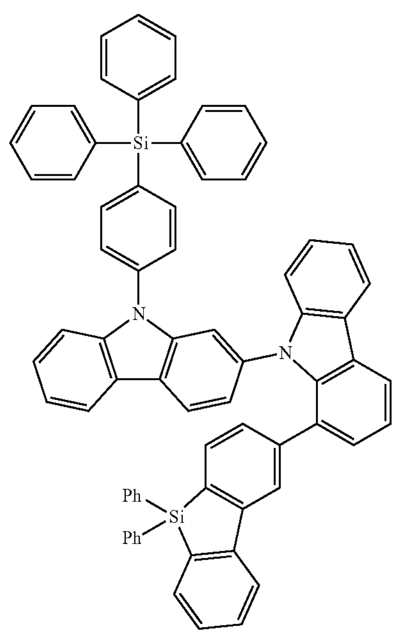

452
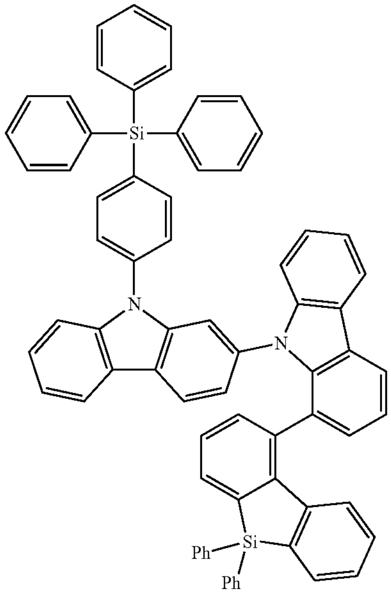
453
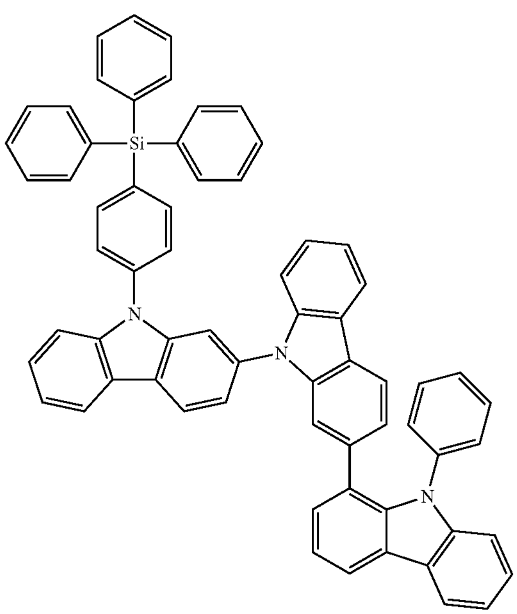
454
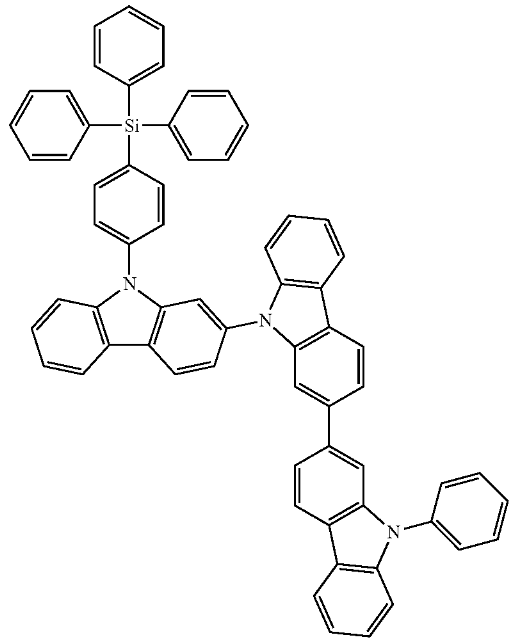
455
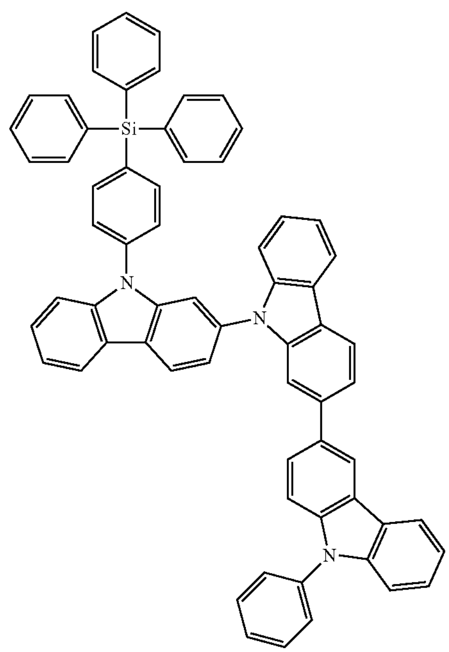

-continued
456
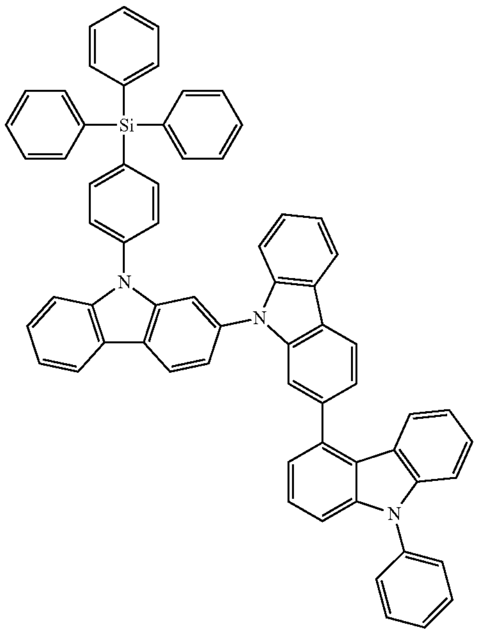
458
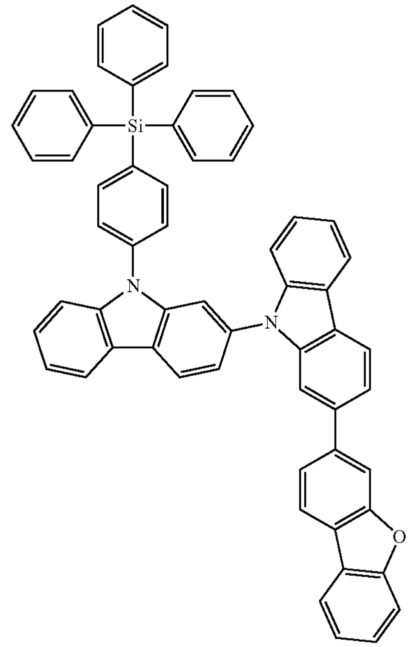
457
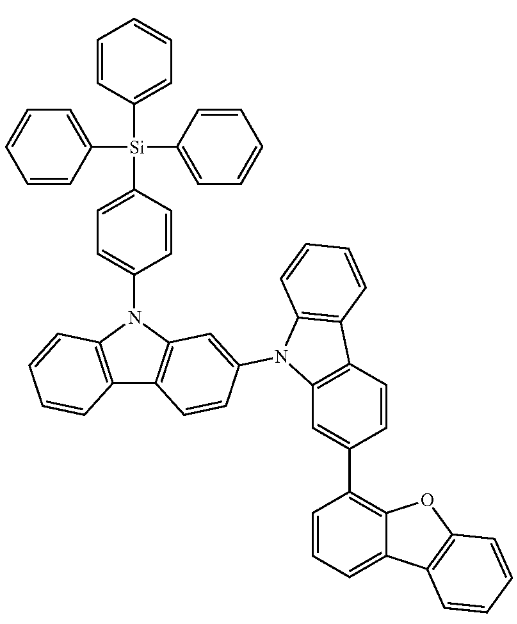
459
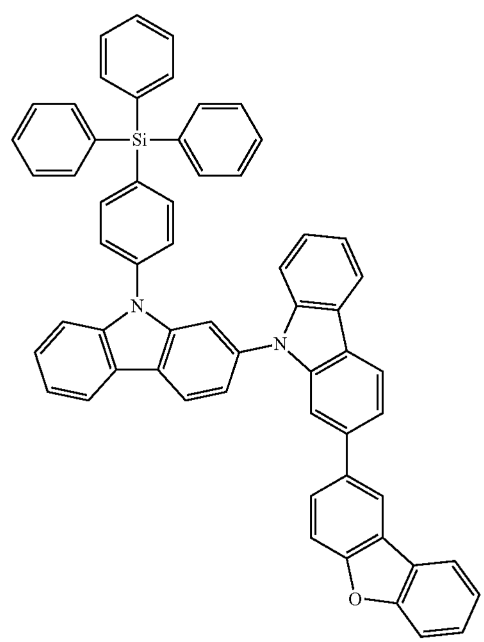

460
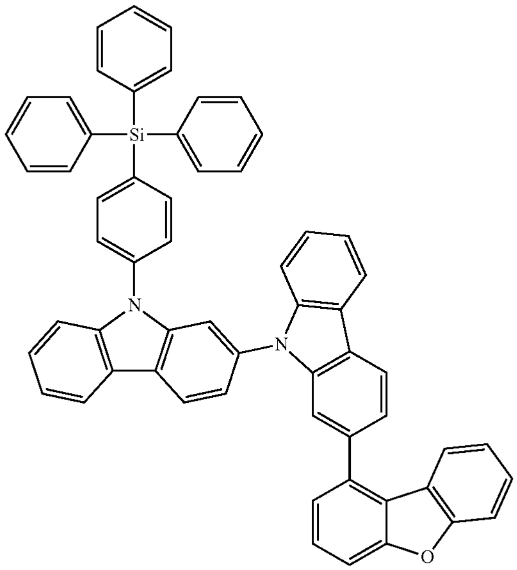
461
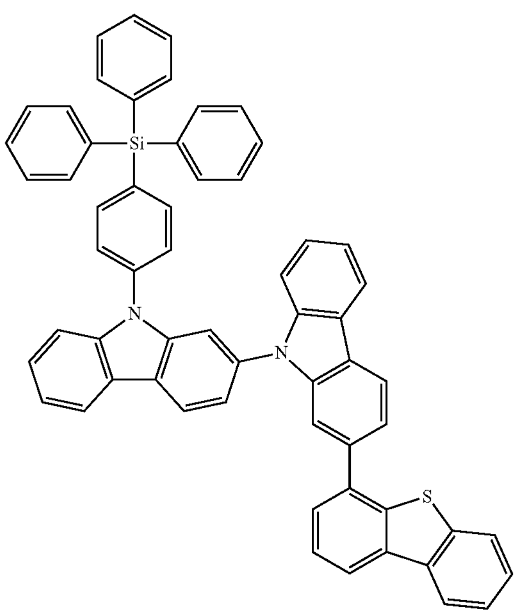
462
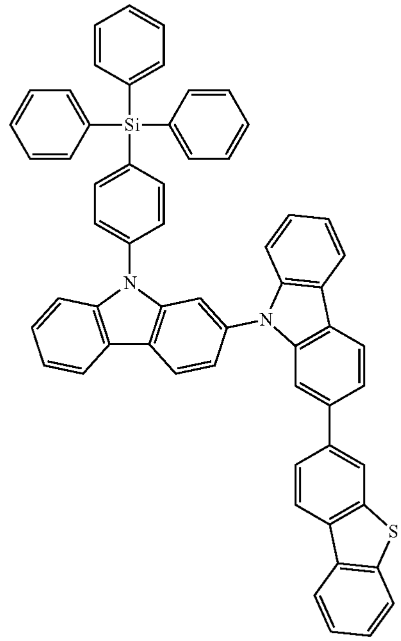
463
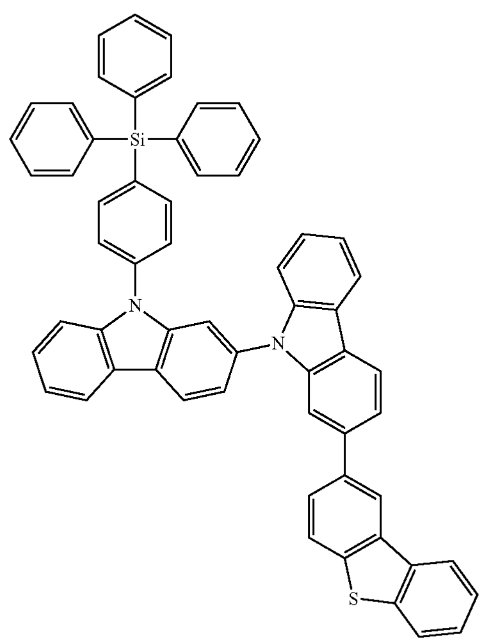

-continued
464
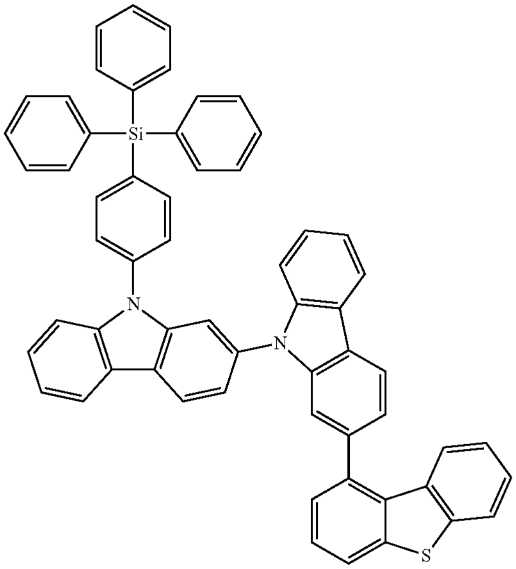
465
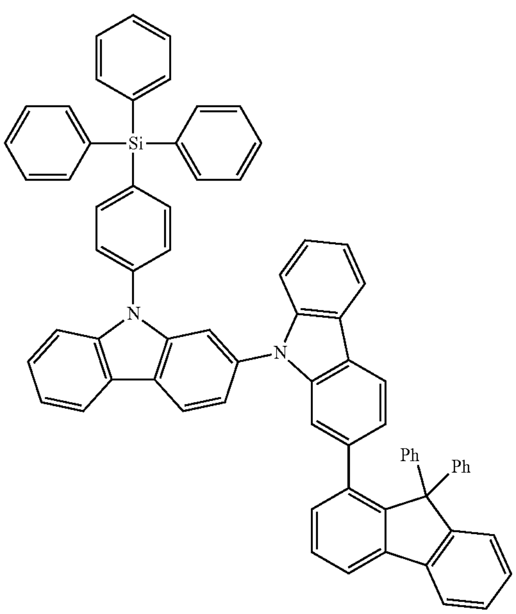
-continued
466
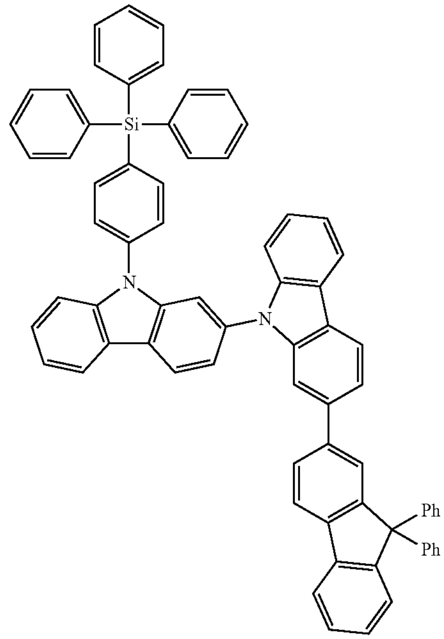
467
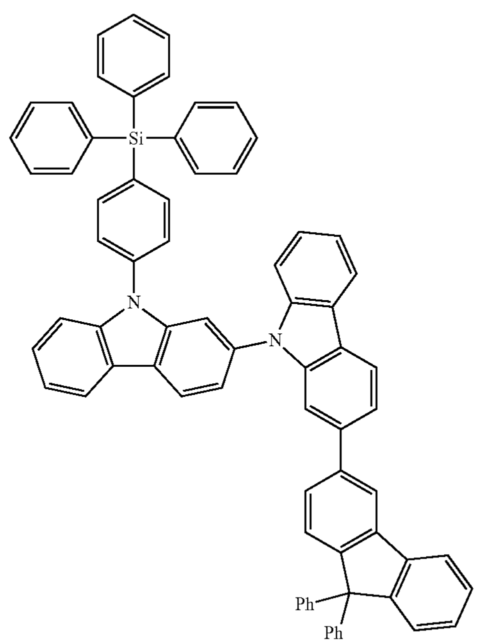

-continued
468
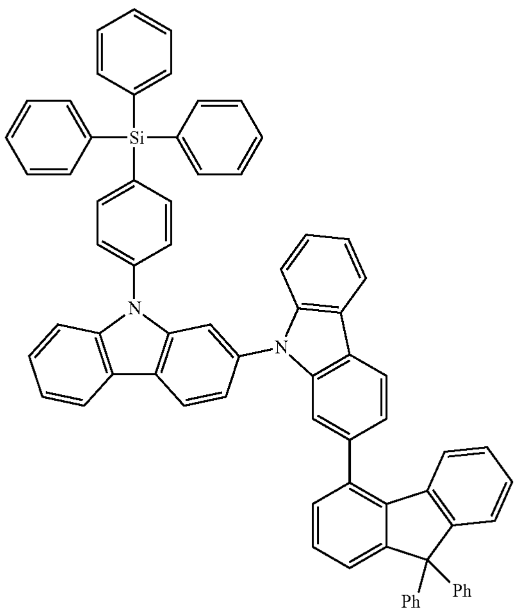
469
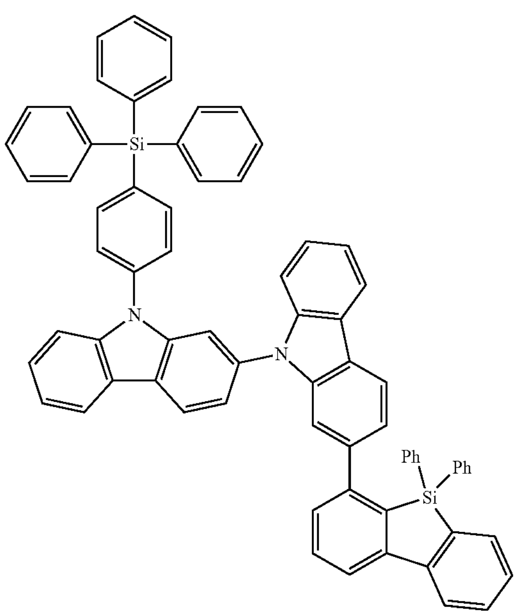
-continued
470
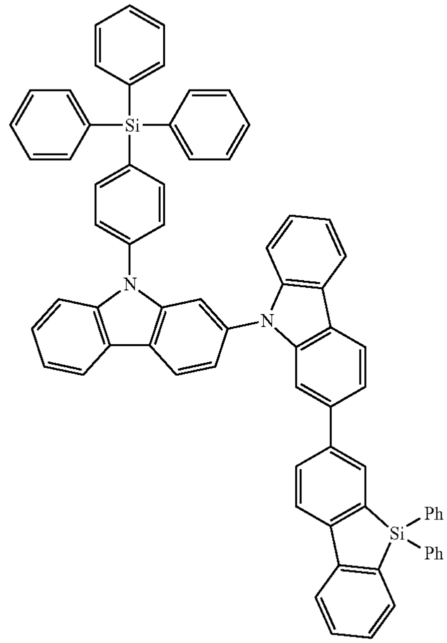
471
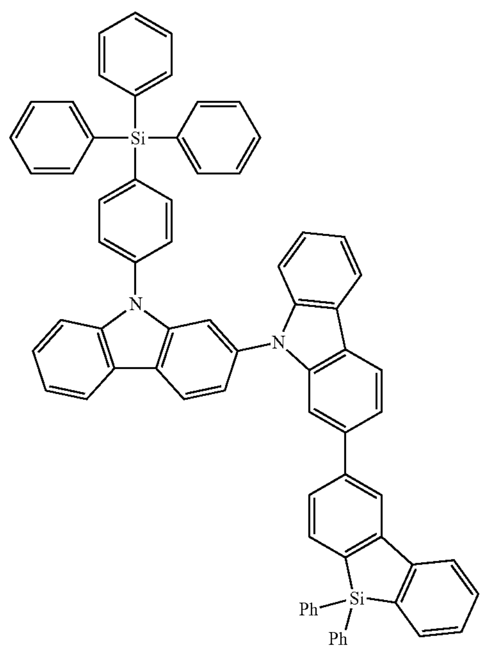

-continued
472
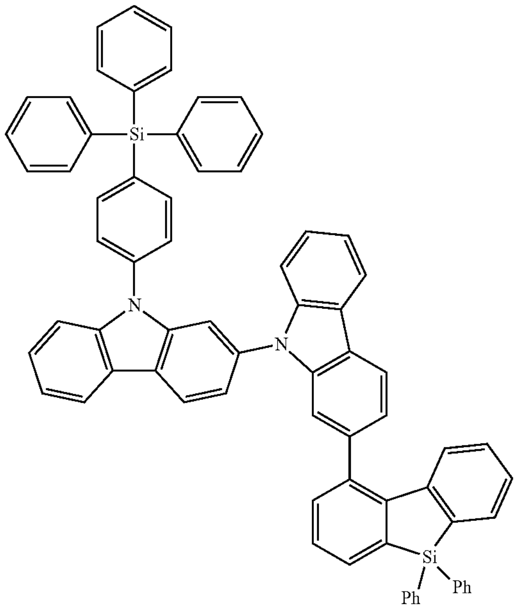
473
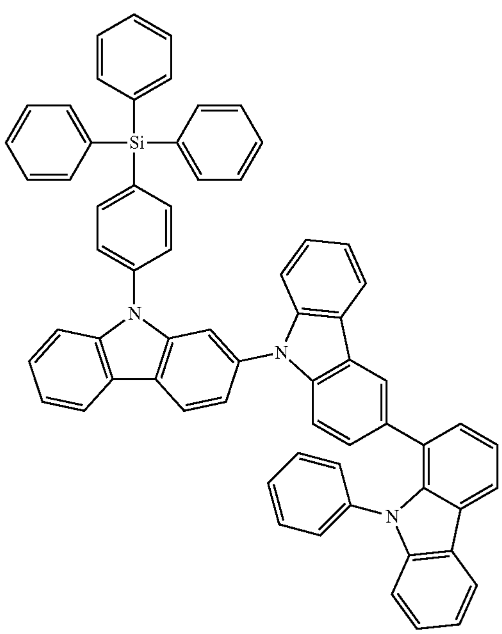
-continued
474
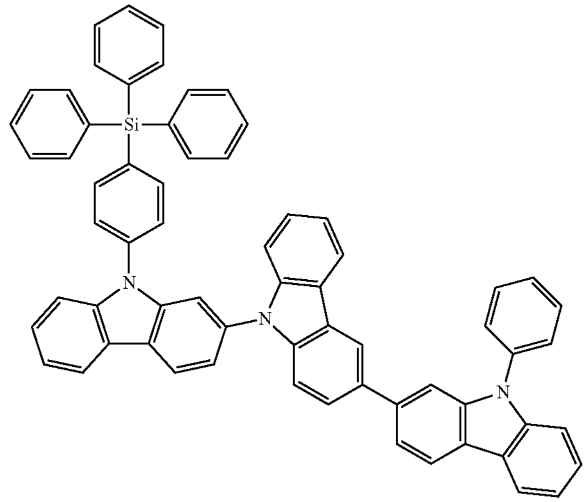
475
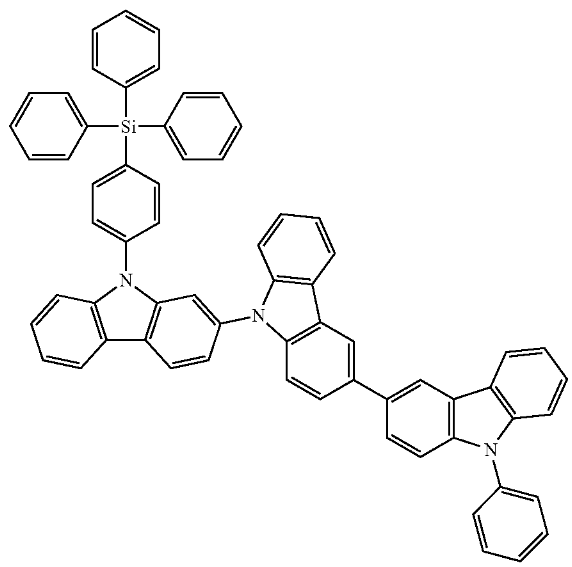
476
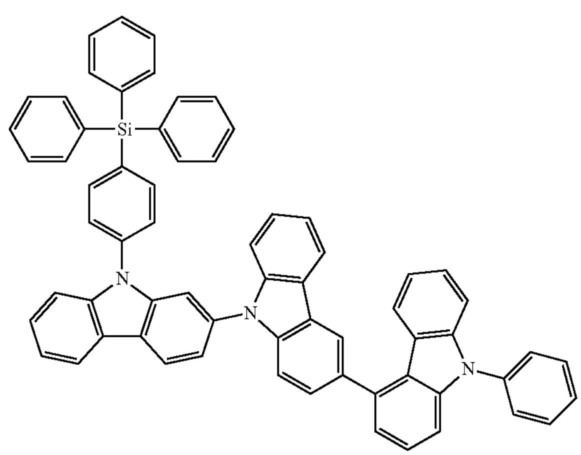

-continued
477
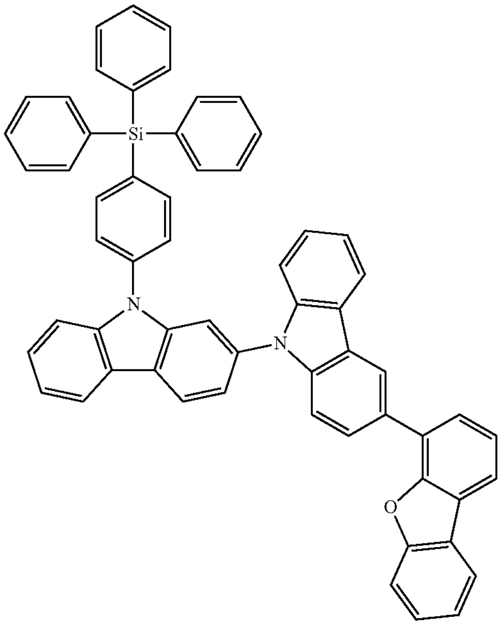
478
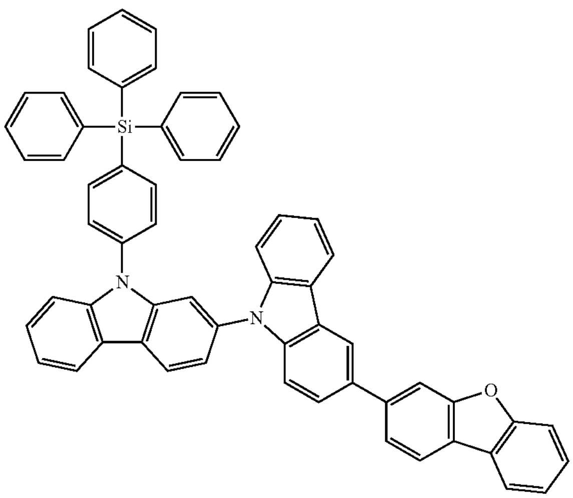
479
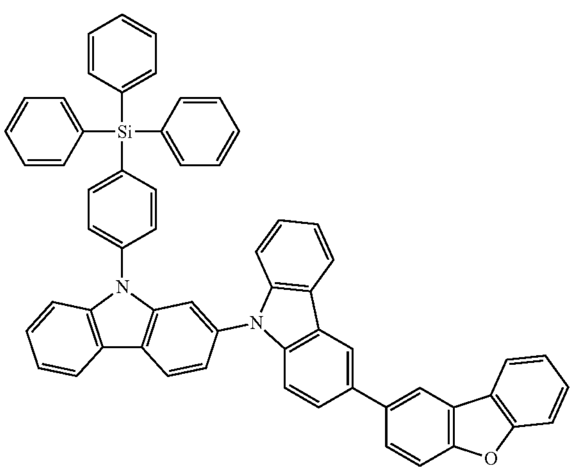
-continued
480
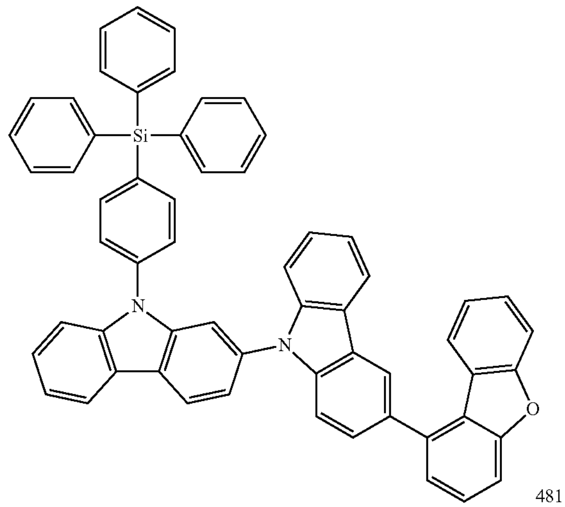
481
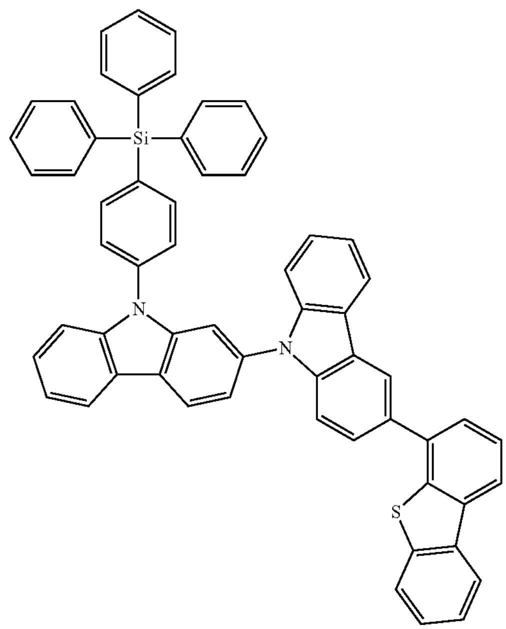
482
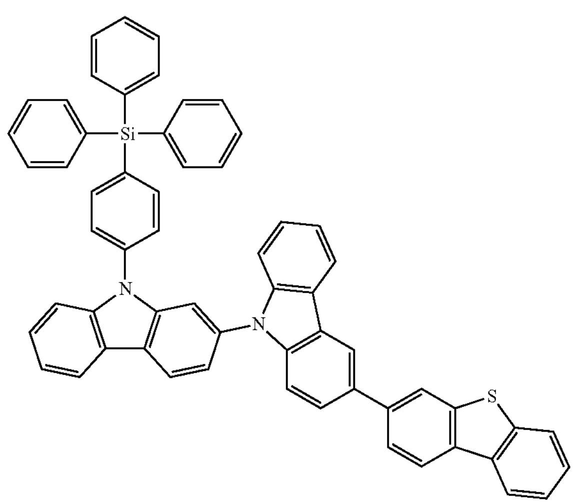

-continued
483
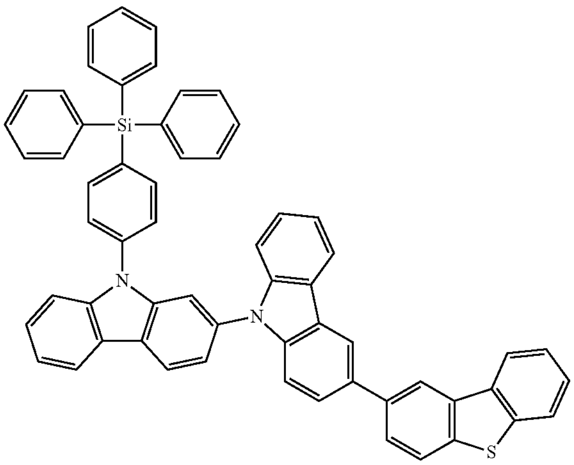
484
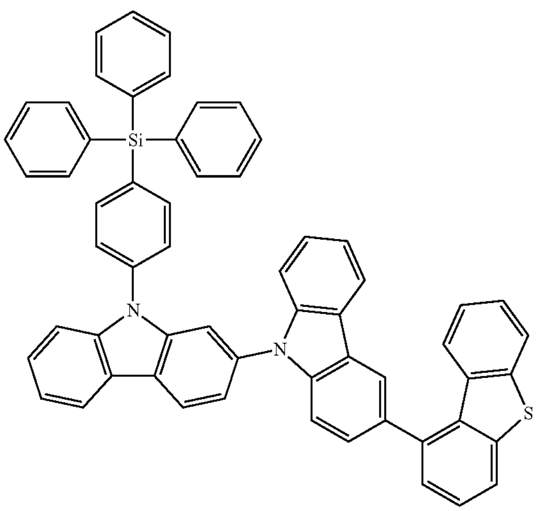
485
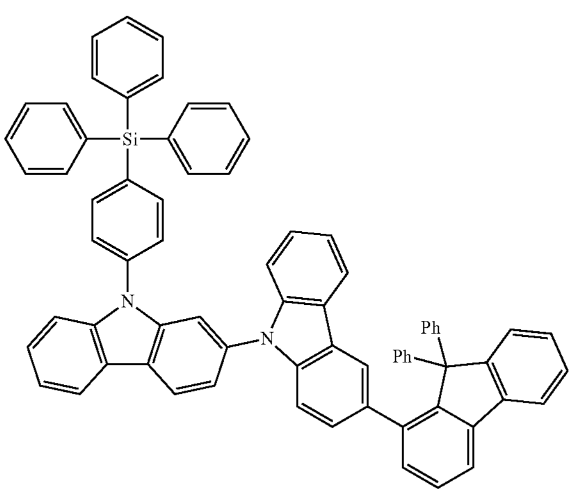
-continued
486
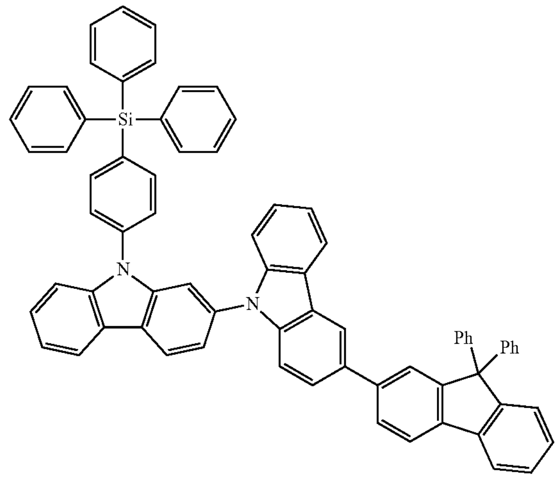
487
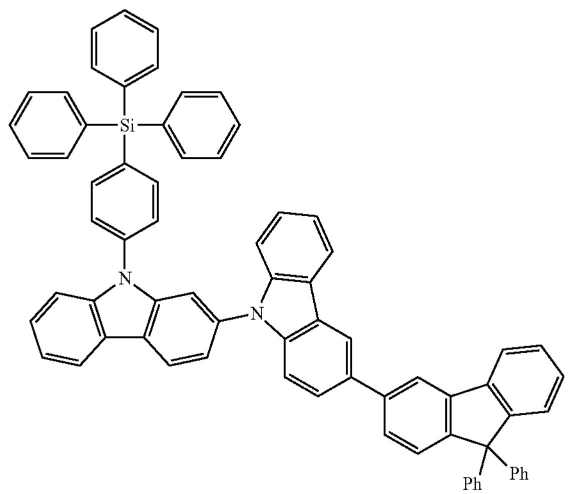
488
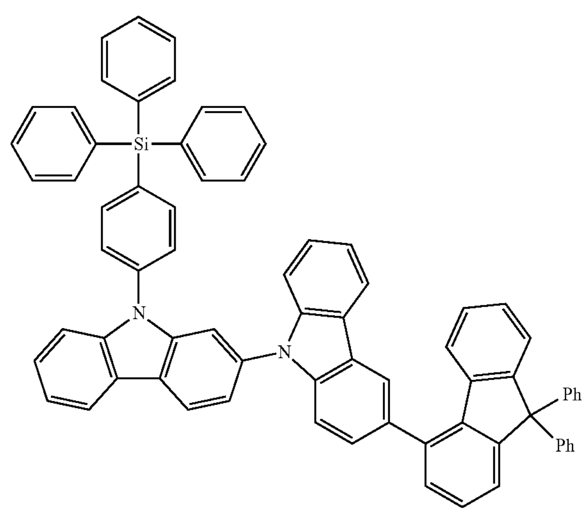

-continued
489
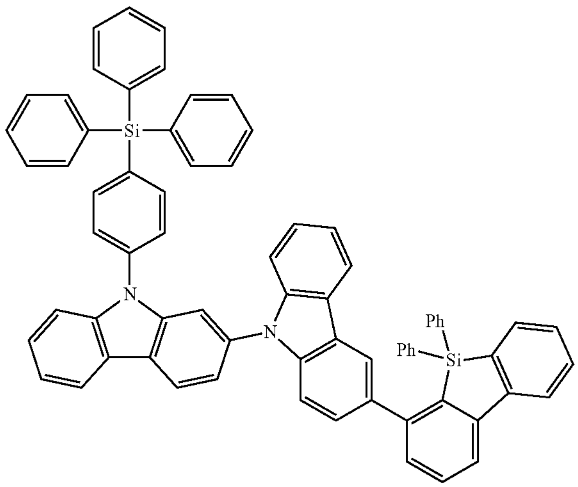
490
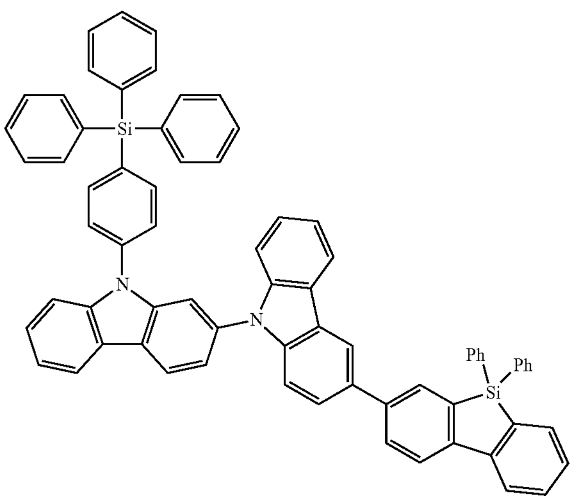
491
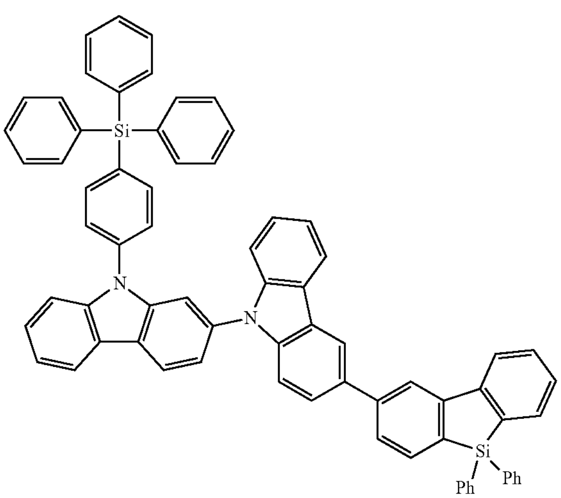
-continued
492
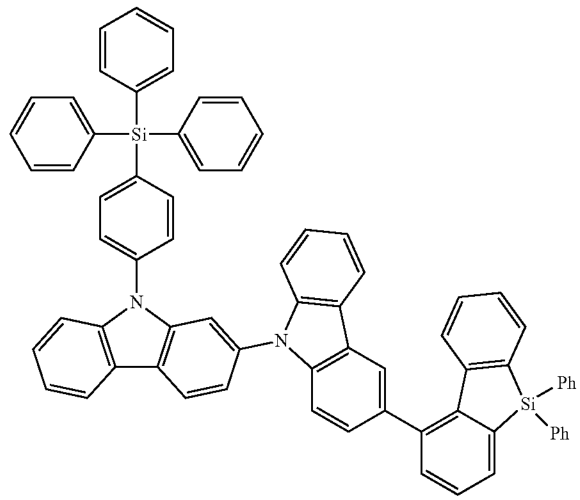
493
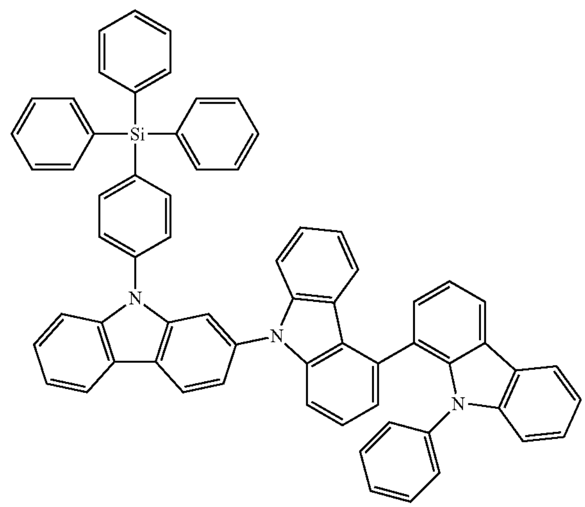
494
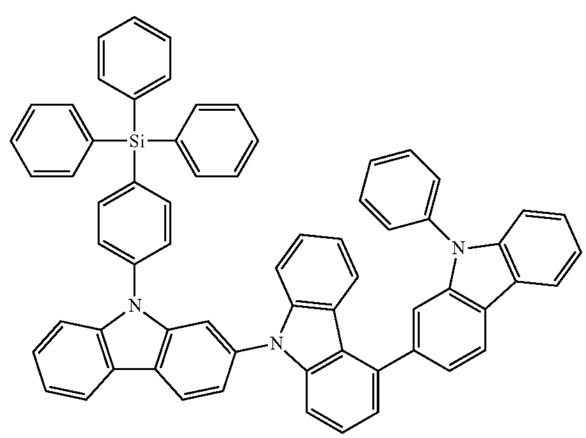

-continued
495
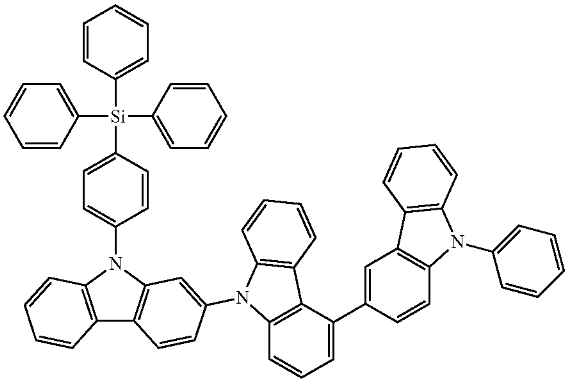
496
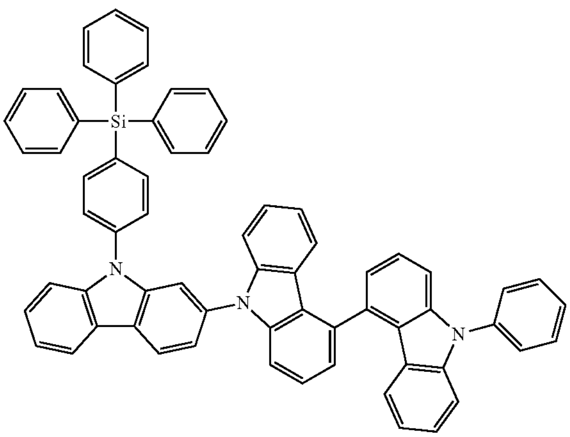
497
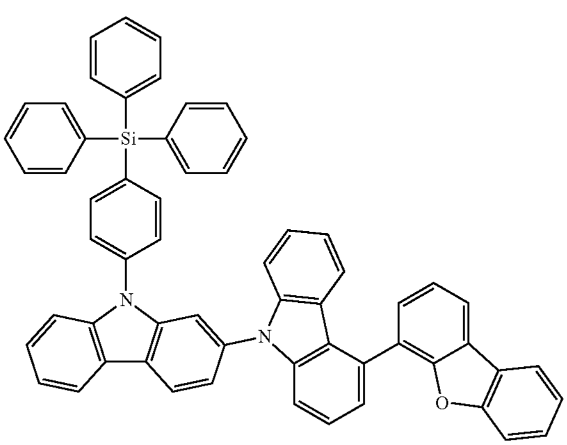
-continued
498
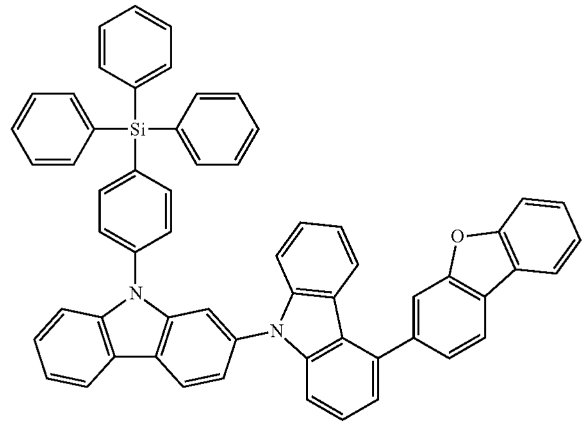
499
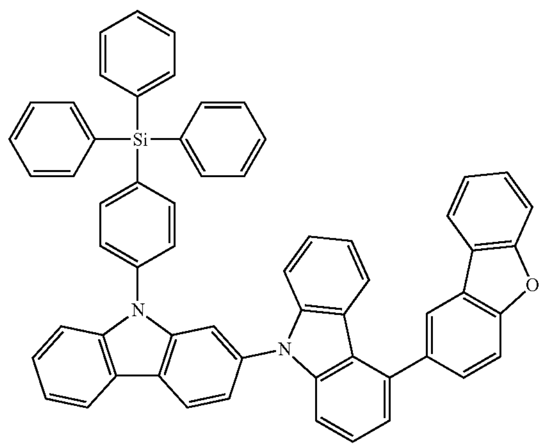
500
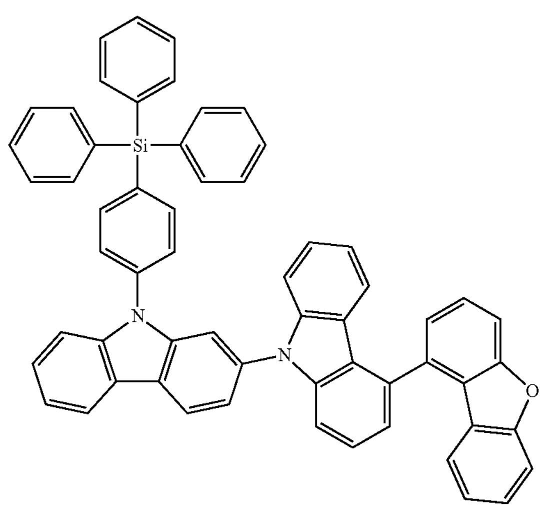

-continued
501
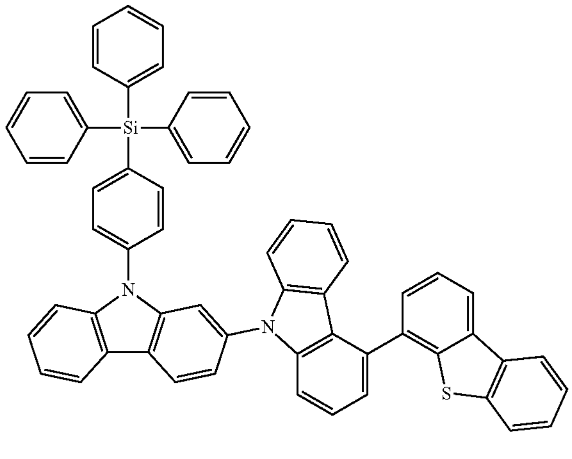
502
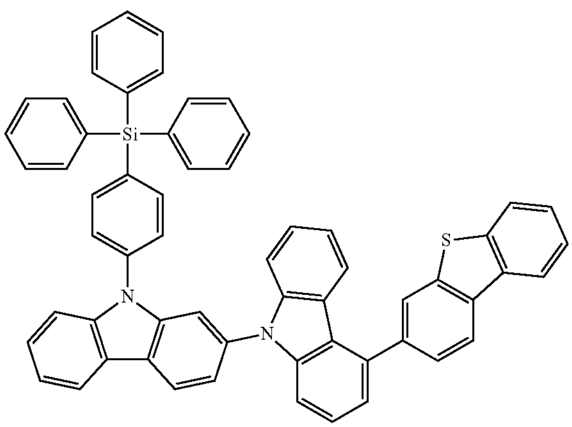
503
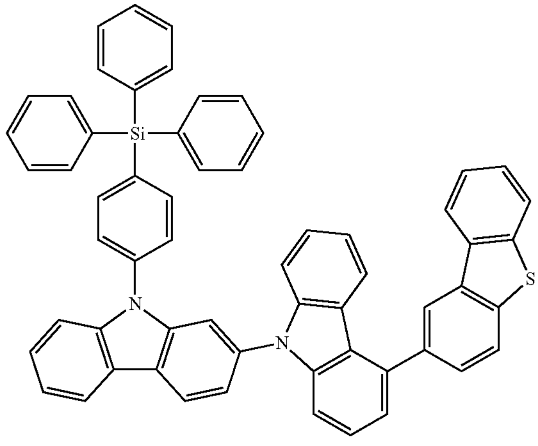
-continued
504
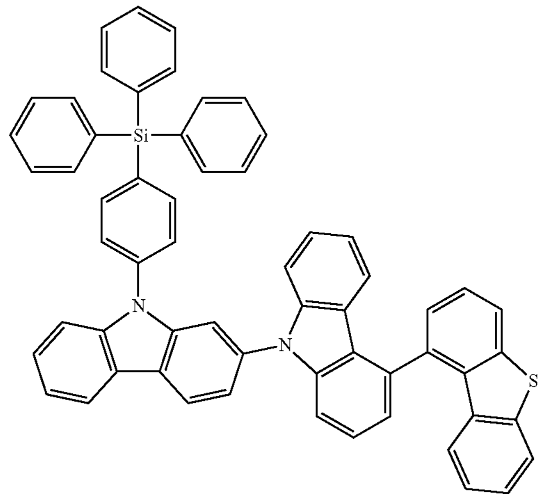
505
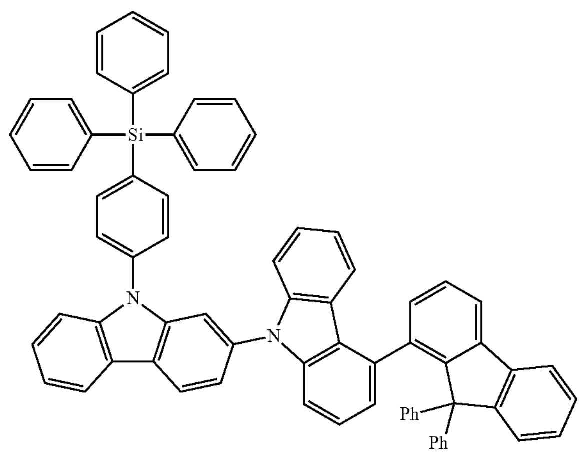
506
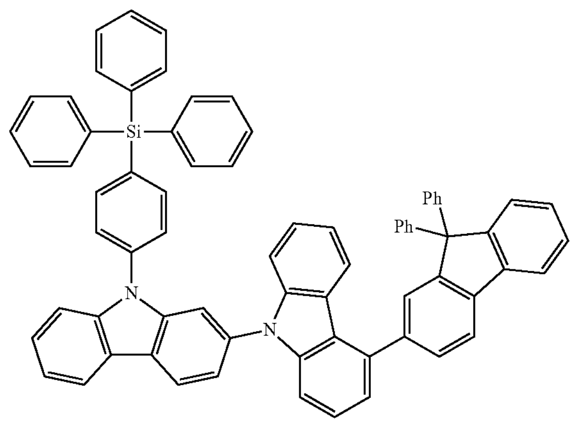

-continued
507
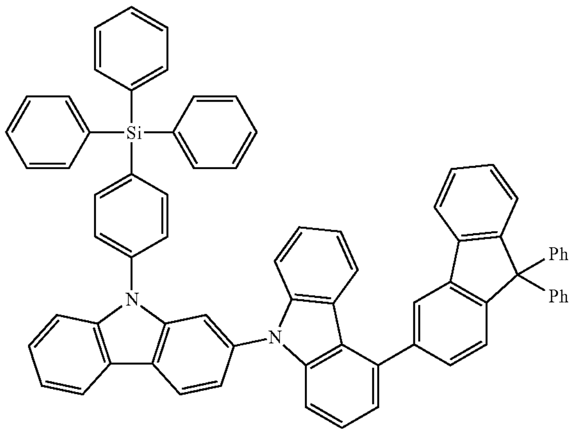
508
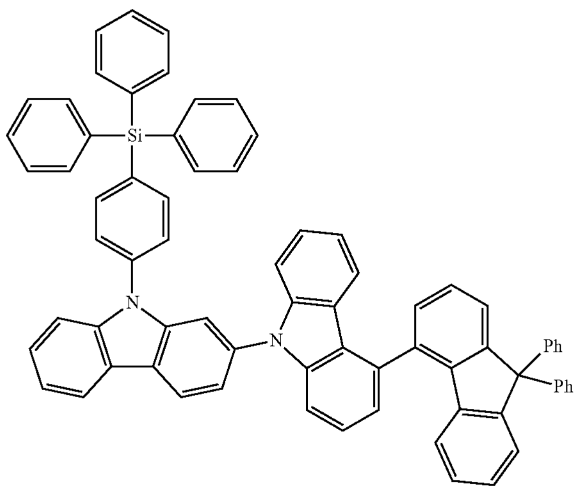
509
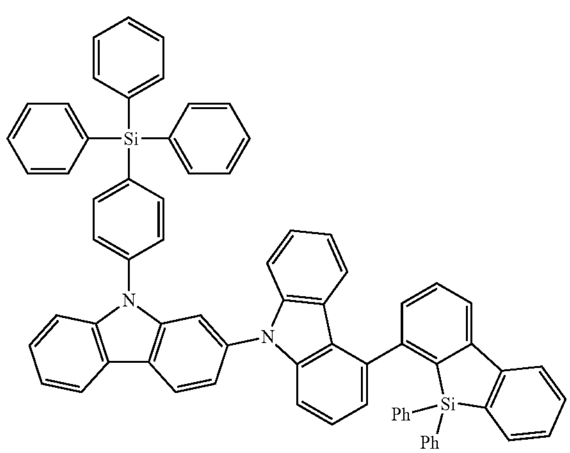
-continued
510
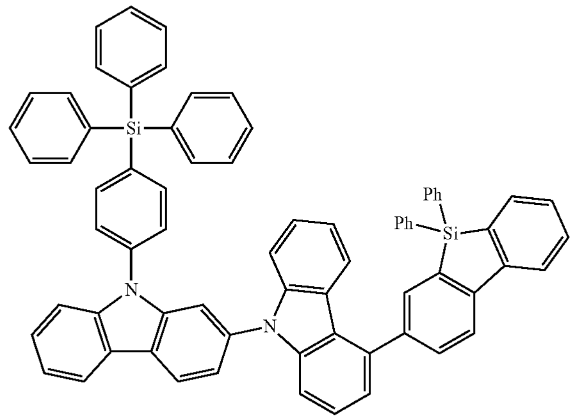
511
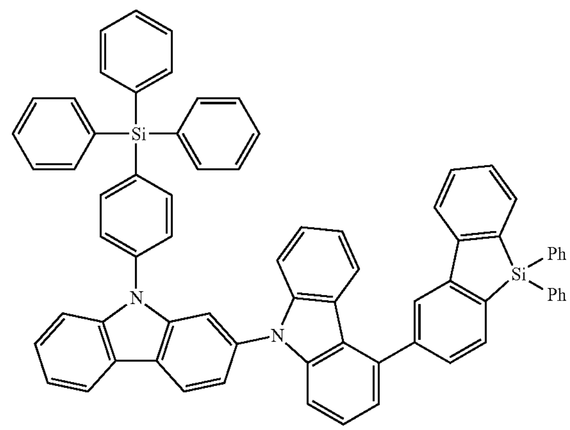
512
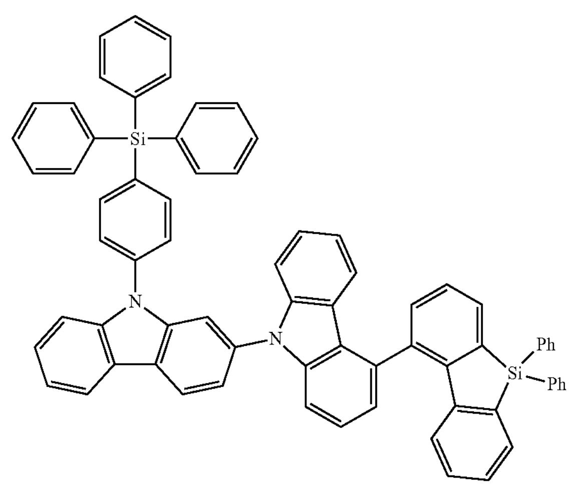

-continued
513
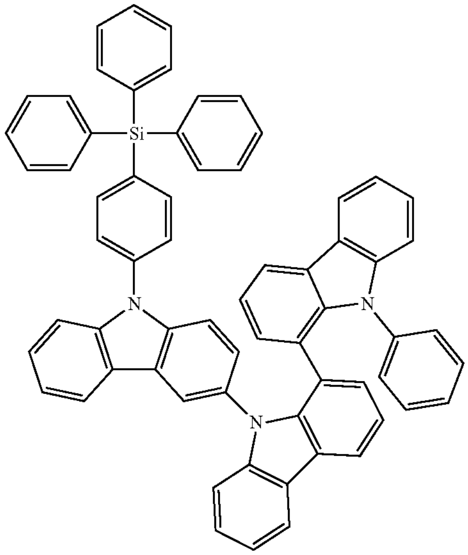
515
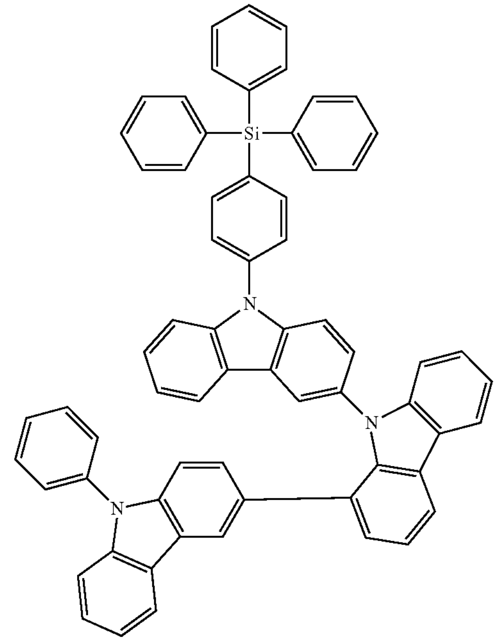
514
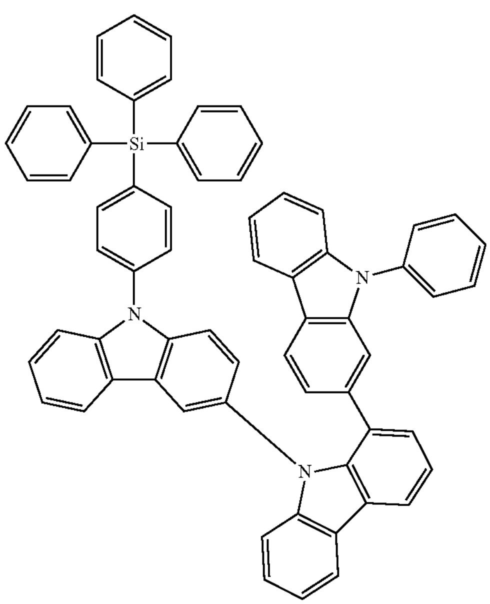
516
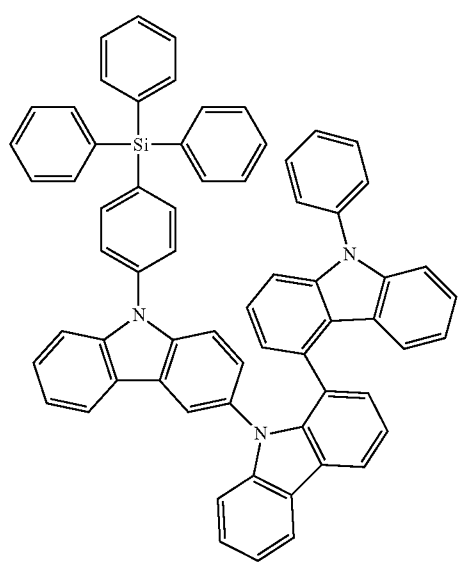

-continued
517
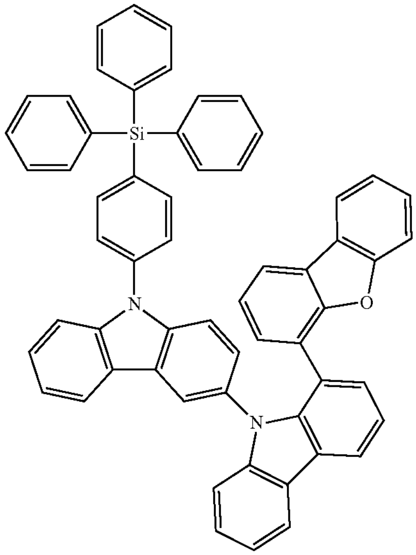
518
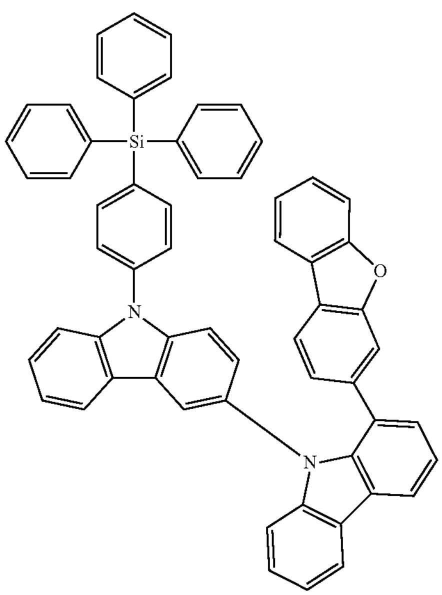
-continued
519
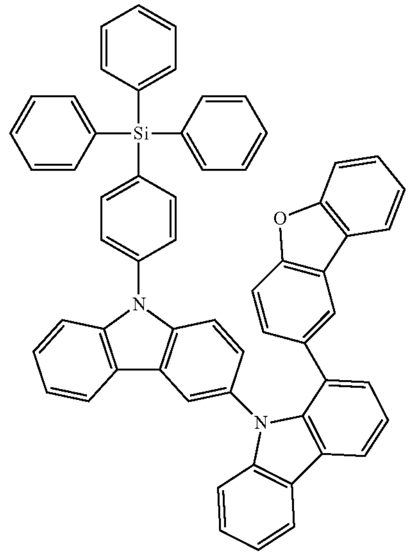
520
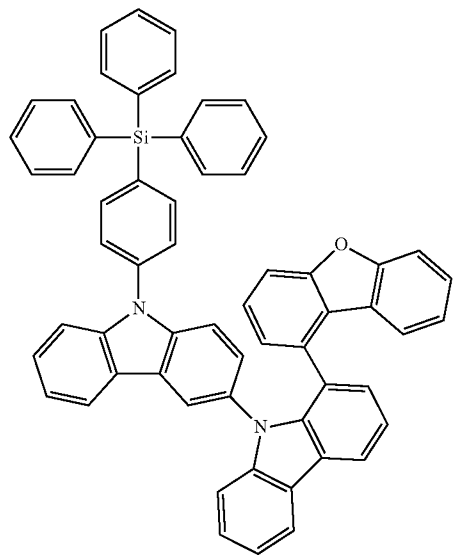
521
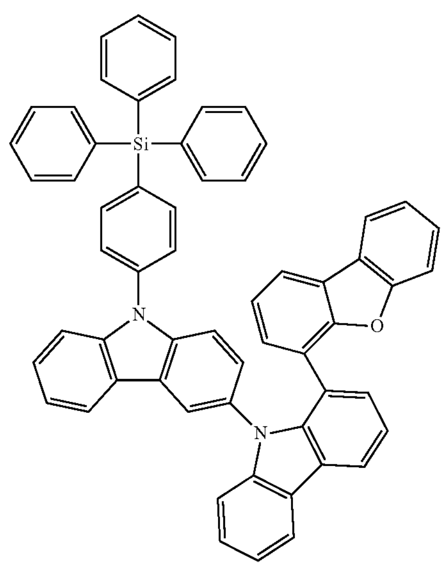

-continued
522
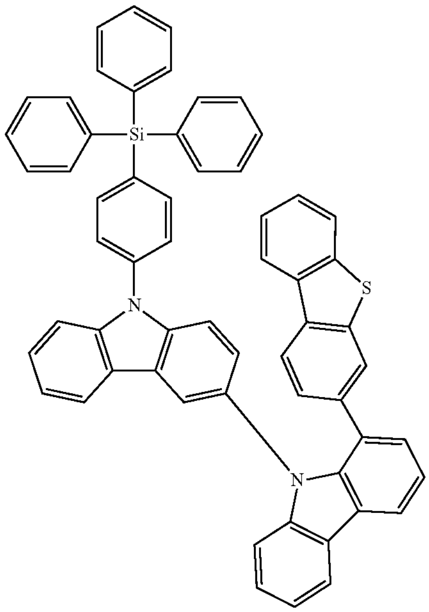
523
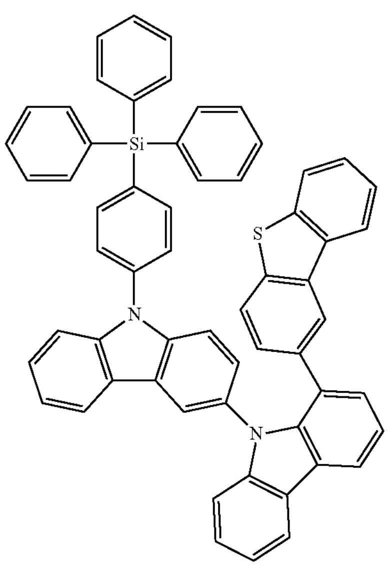
-continued
524
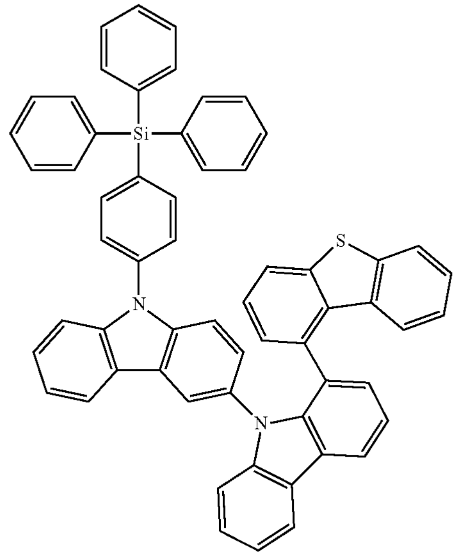
525
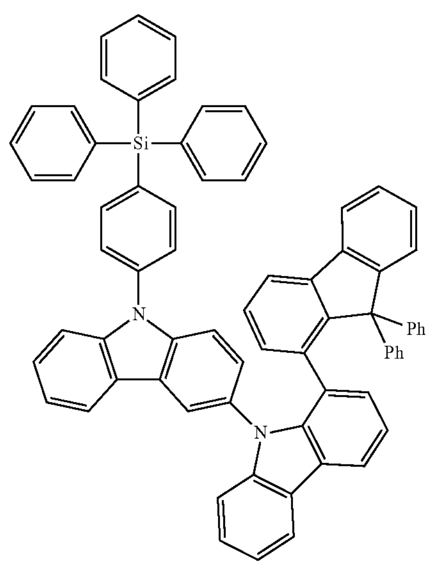

526
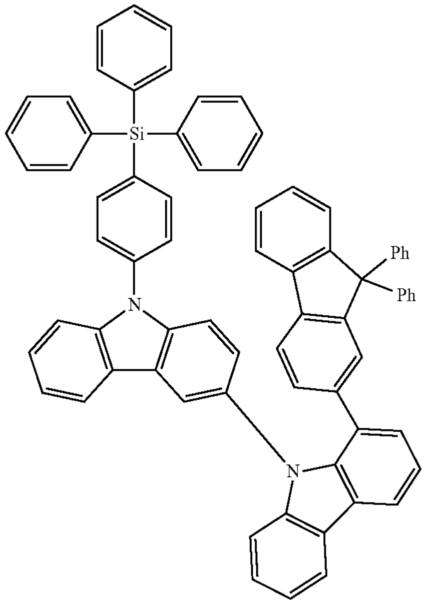
527
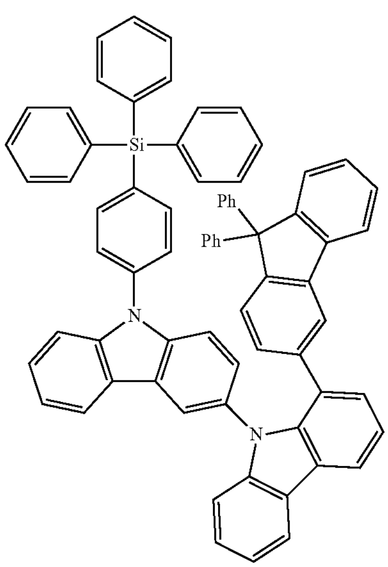
528
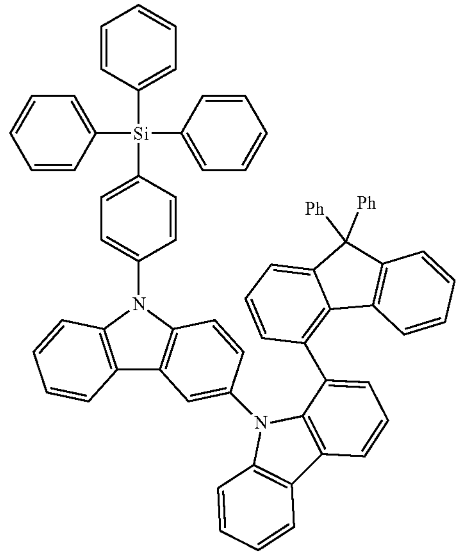
529
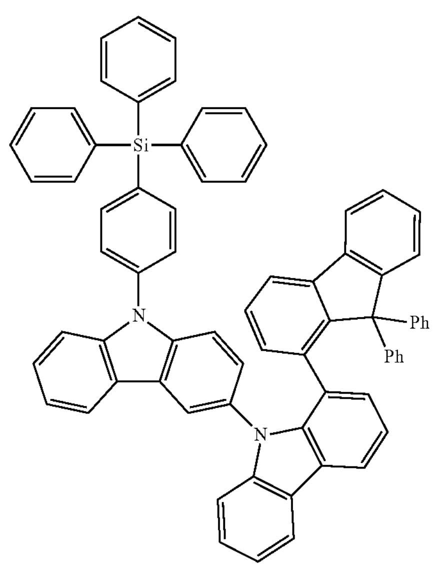

-continued
530
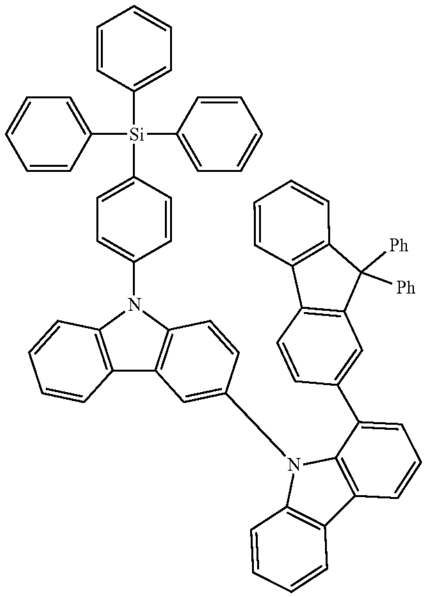
531
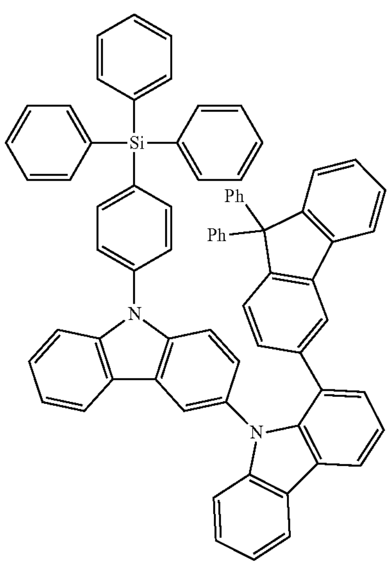
-continued
532
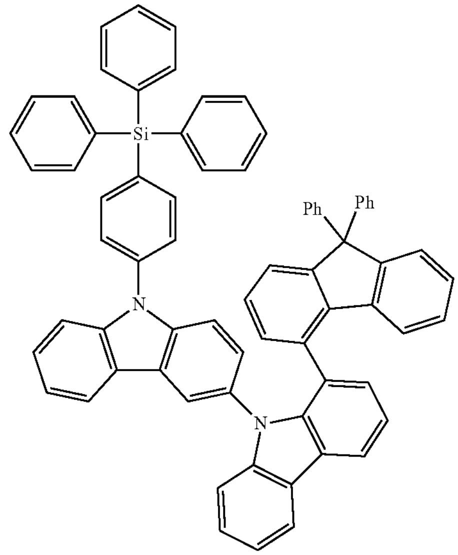
533
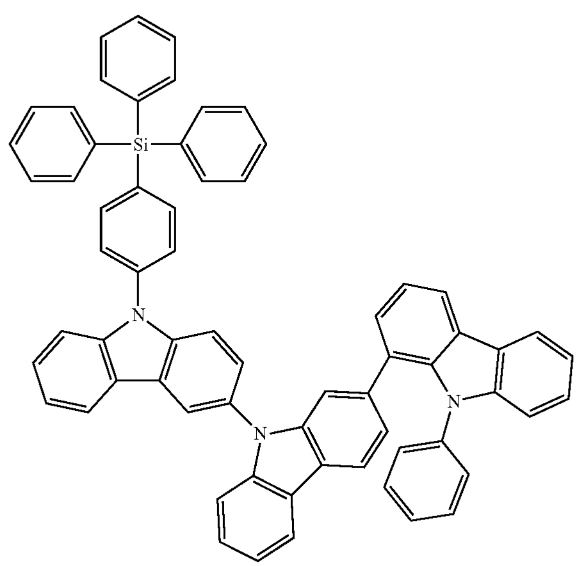

-continued
534
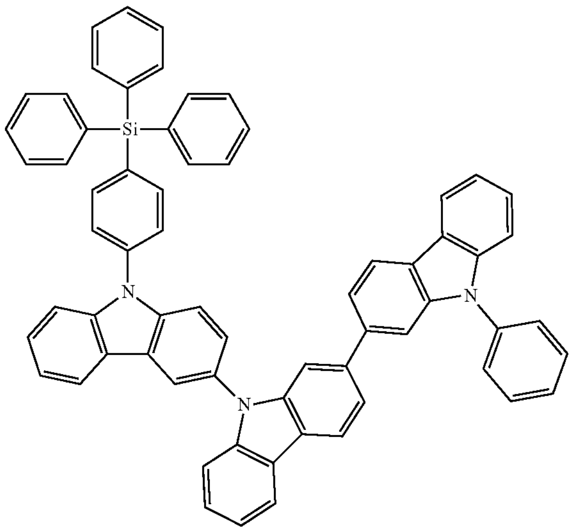
535
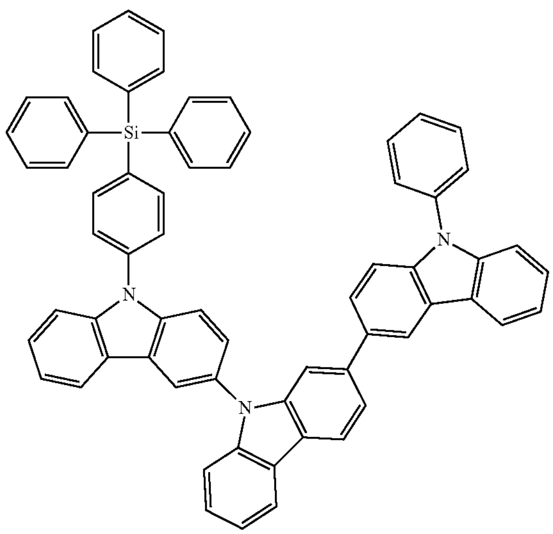
536
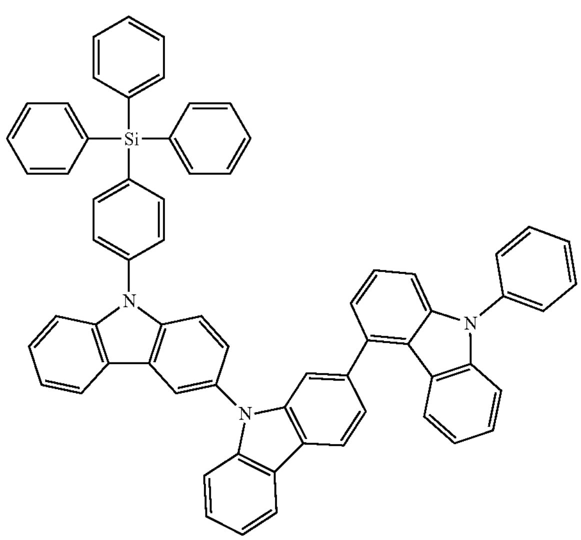
-continued
537
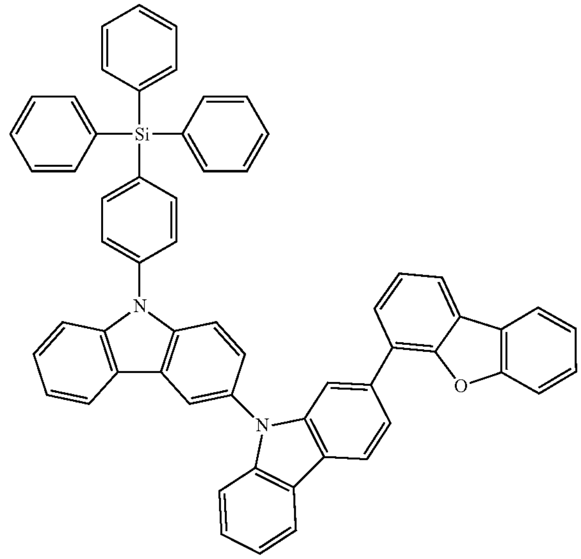
538
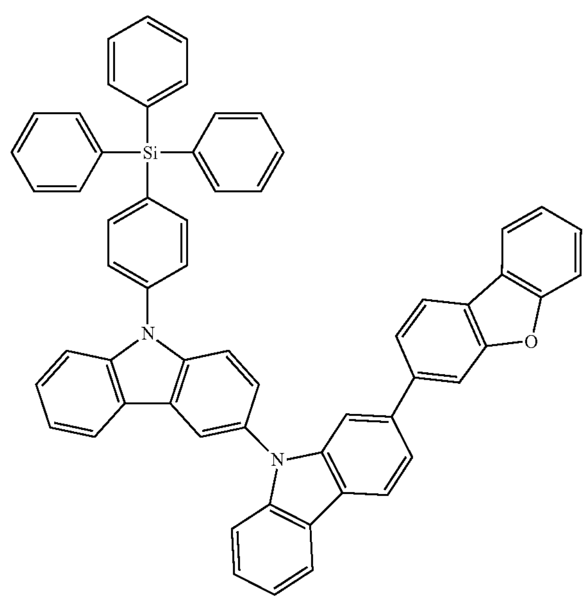

-continued
539
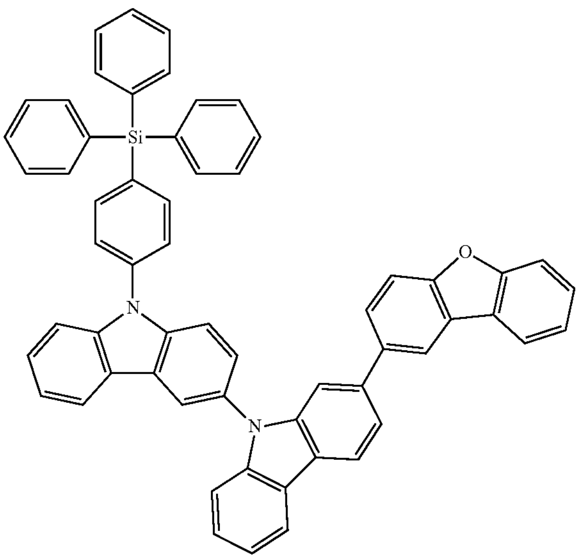
540
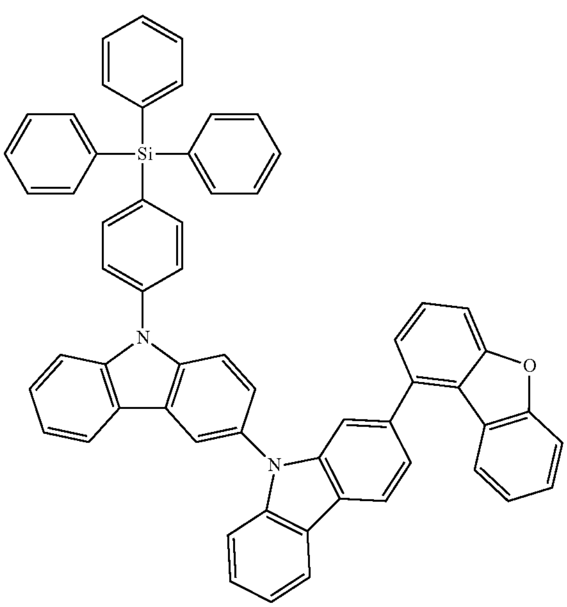
-continued
541
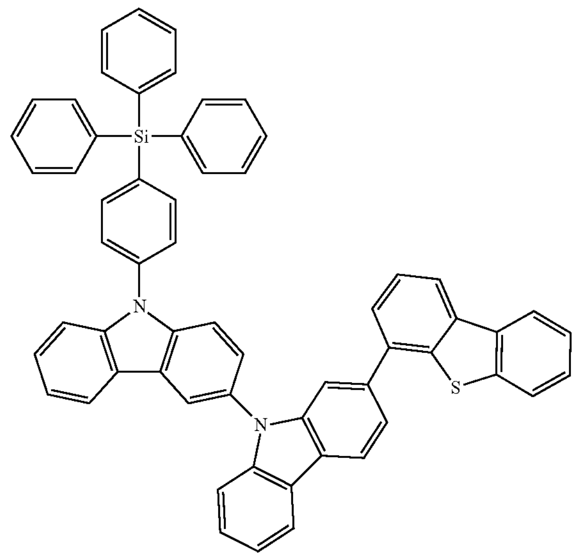
542
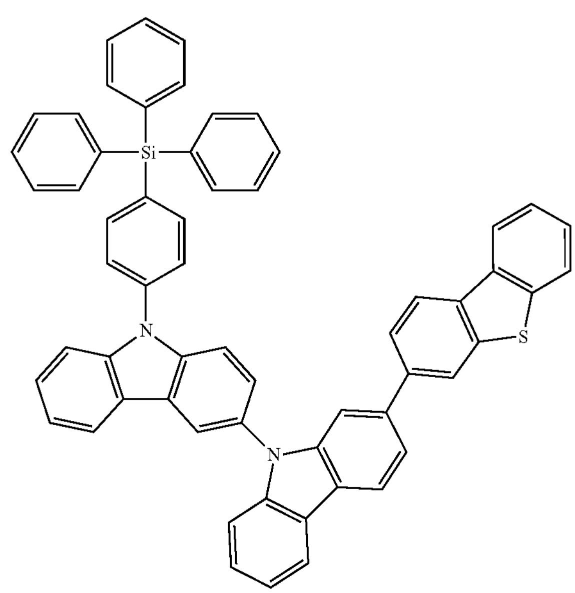

-continued
543
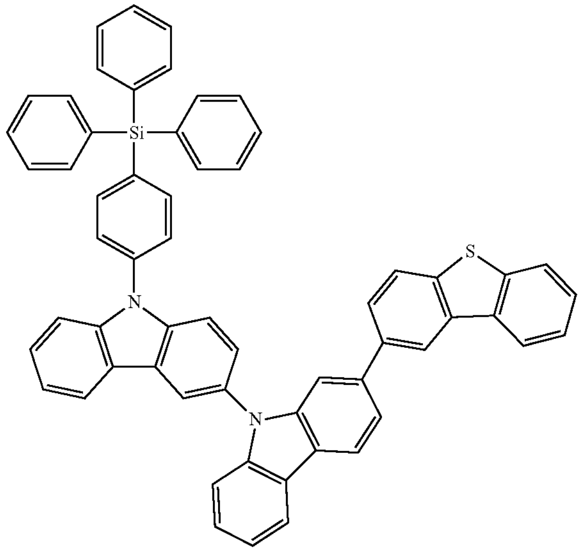
544
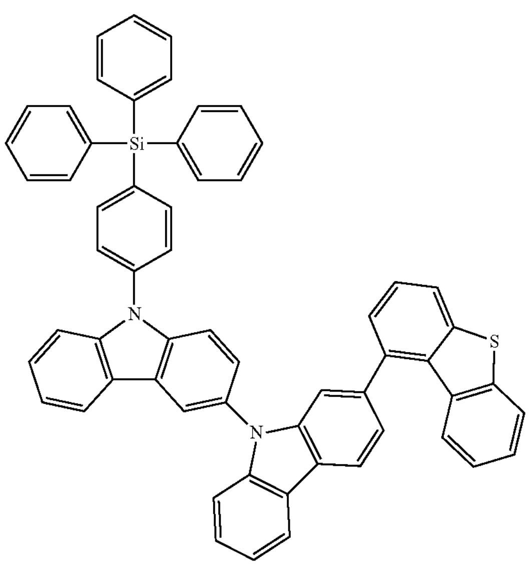
-continued
545
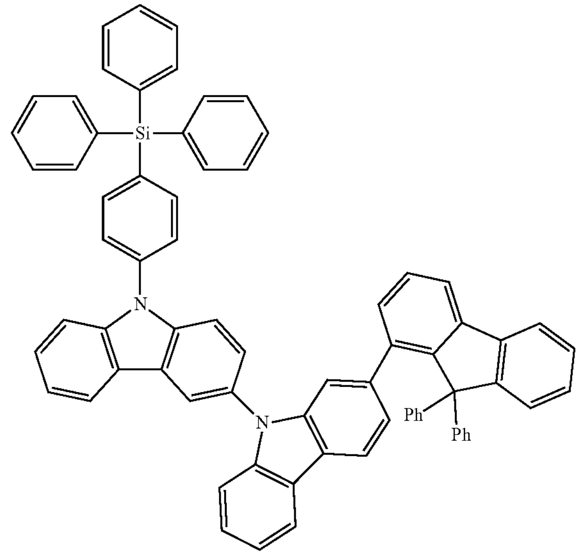
546
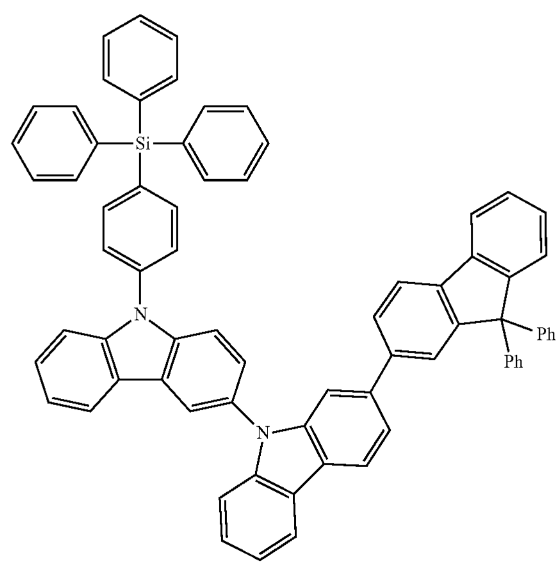

-continued
547
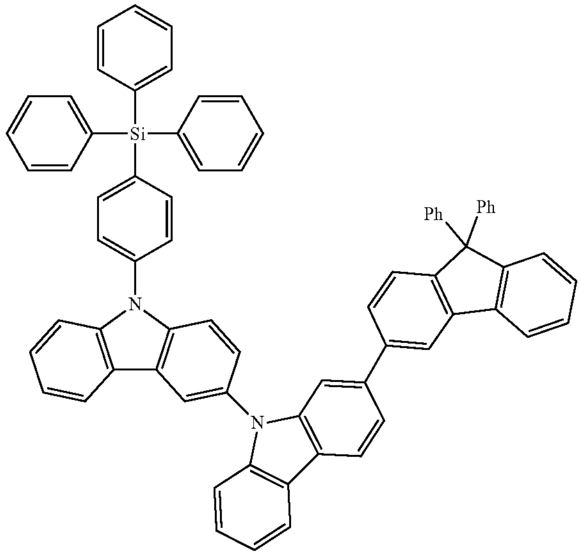
548
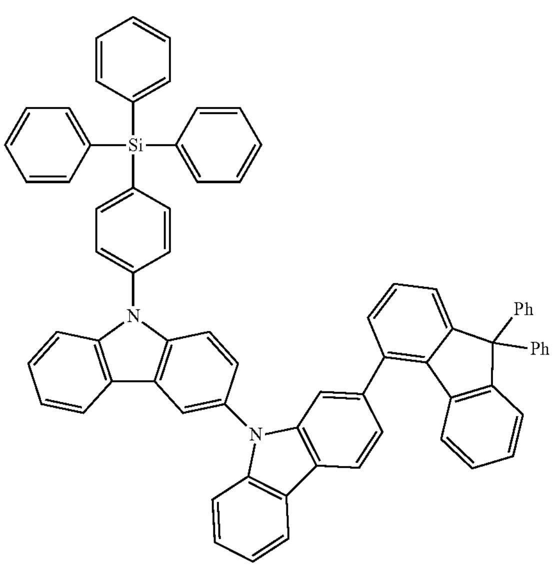
-continued
549
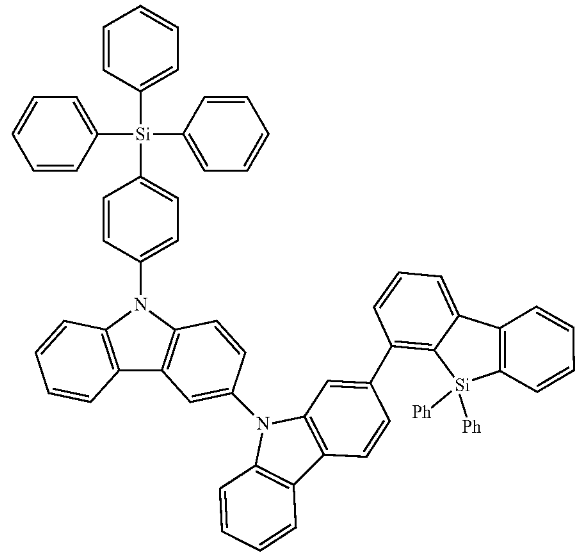
550
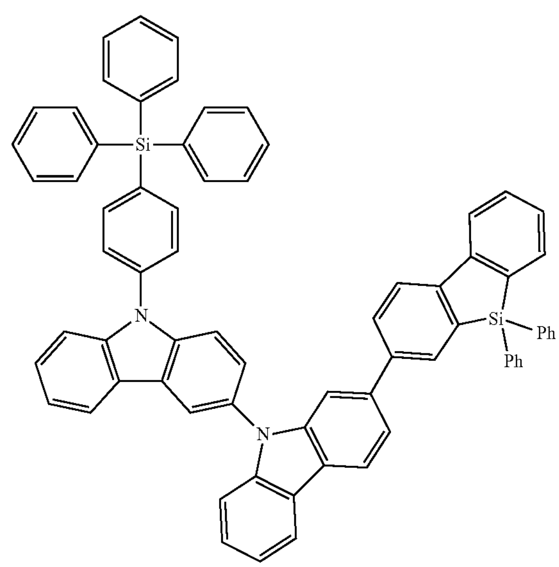

-continued
551
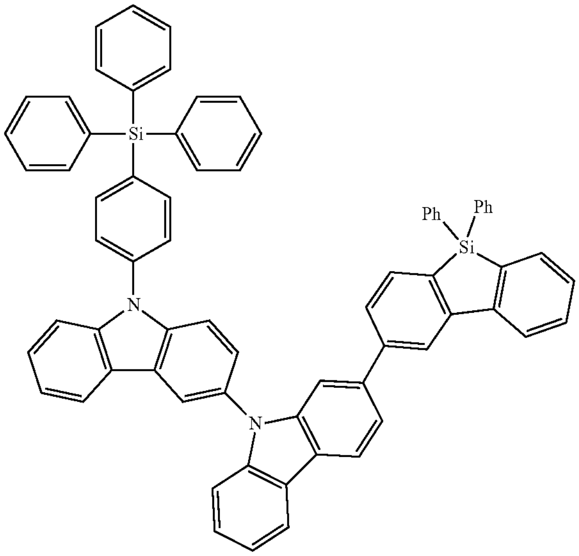
552
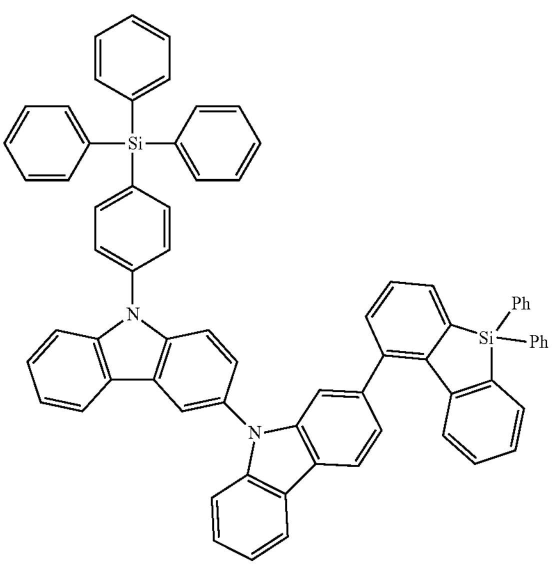
-continued
553
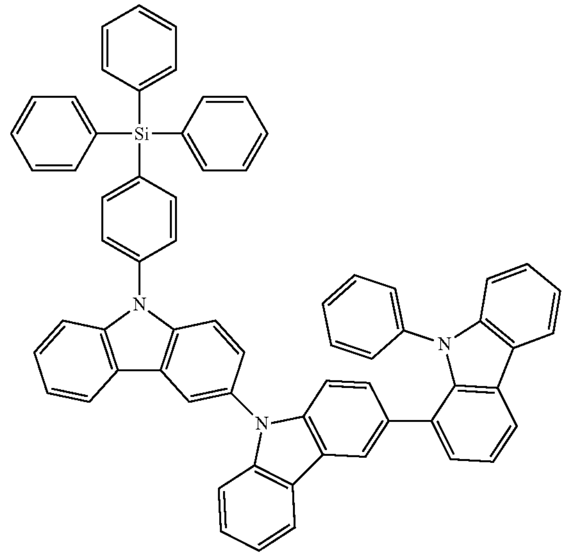
554
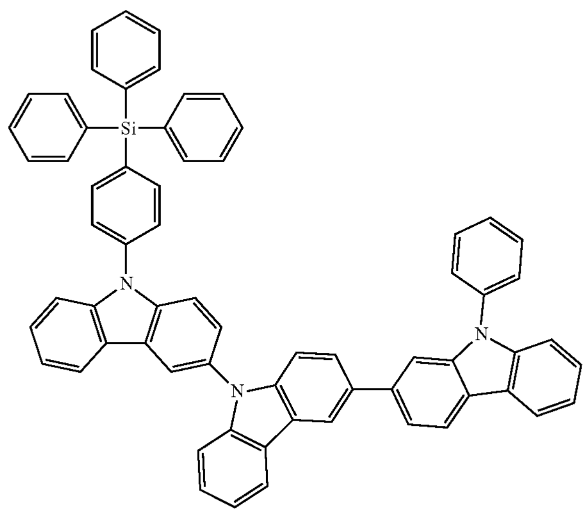
555
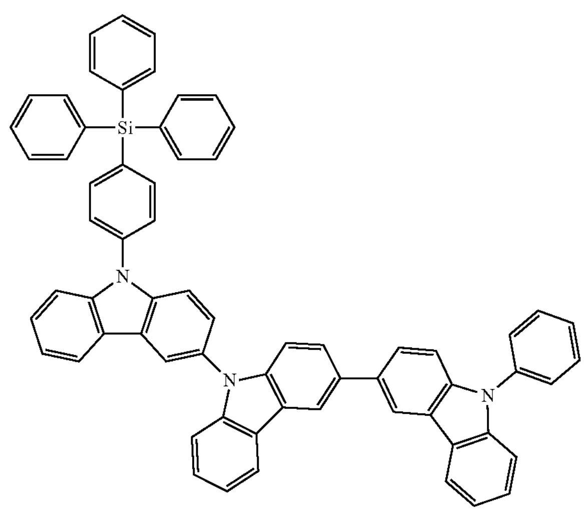

-continued
556
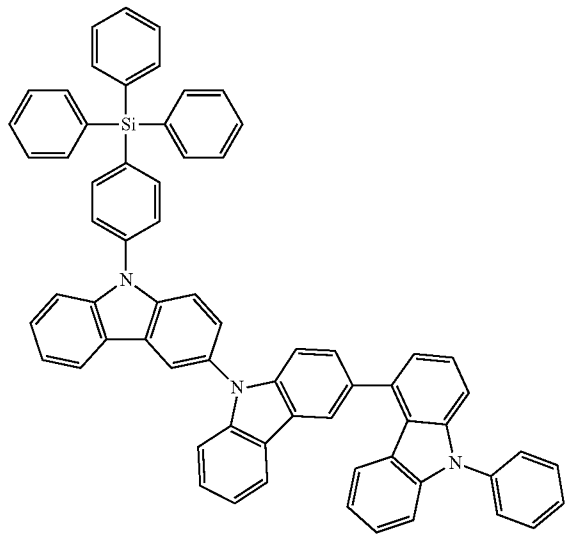
557
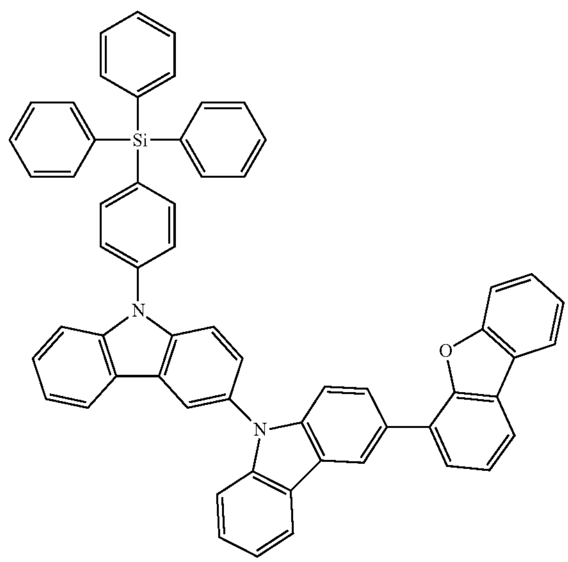
558
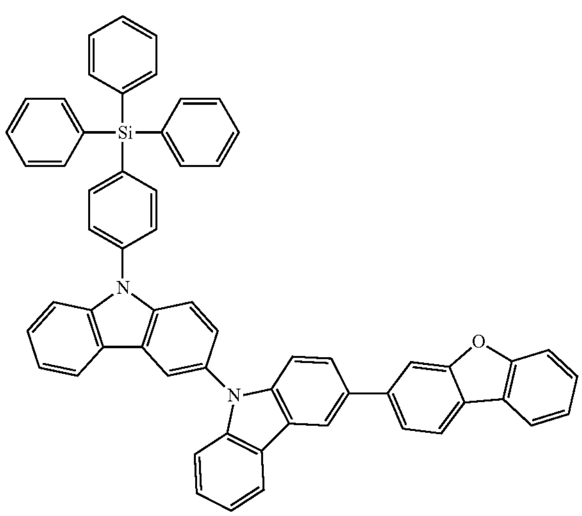
-continued
559
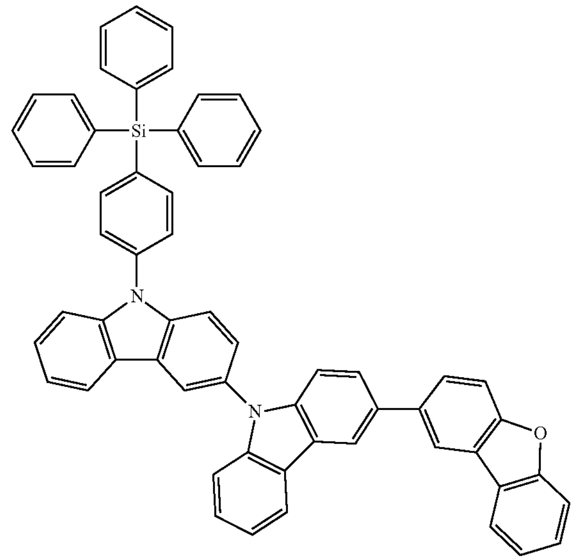
560
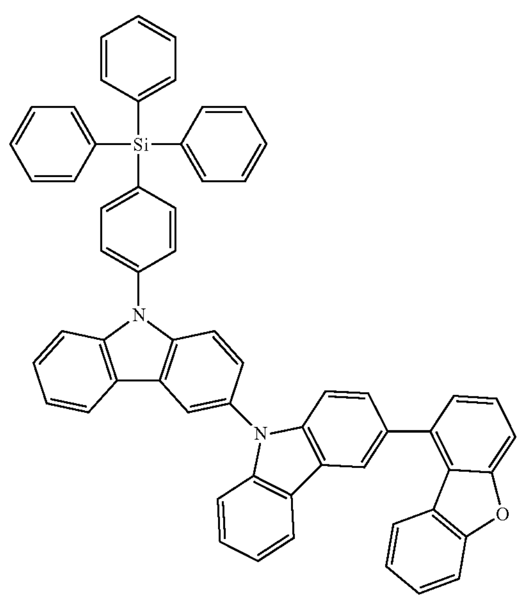

-continued
561
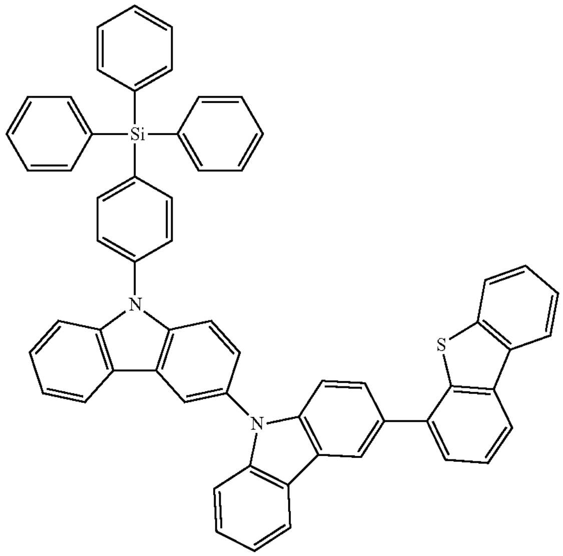
-continued
563
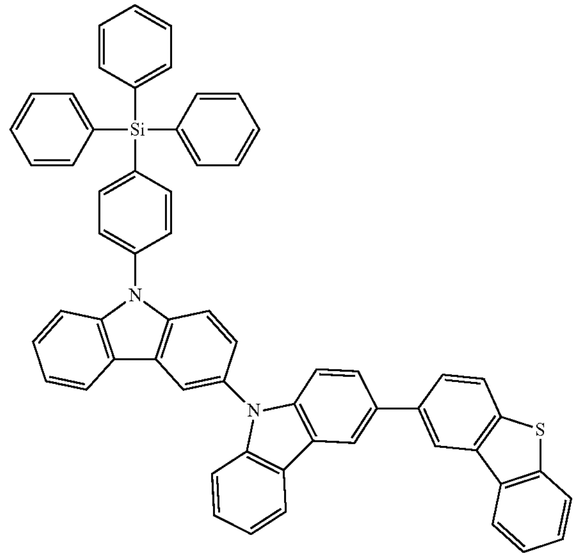
562
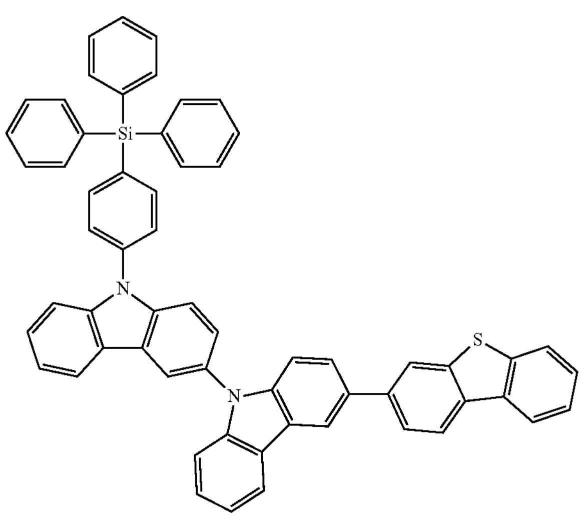
564
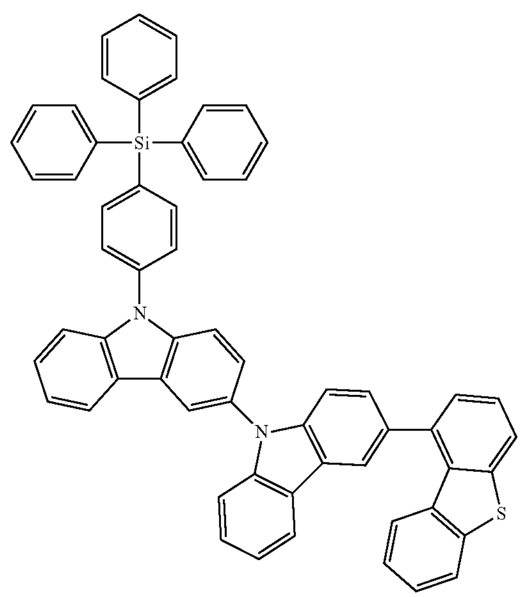

-continued
565
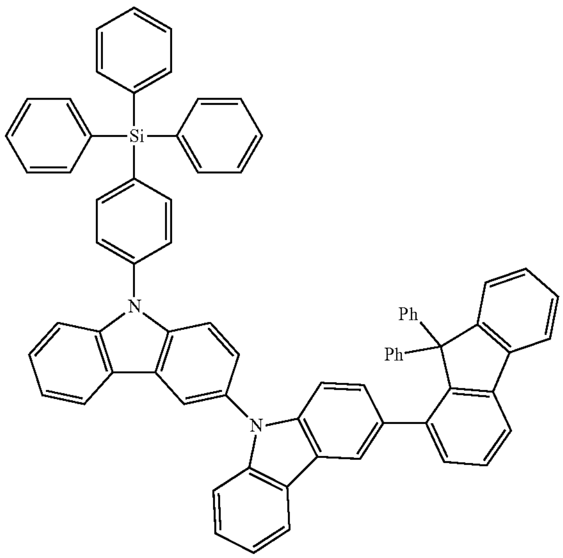
566
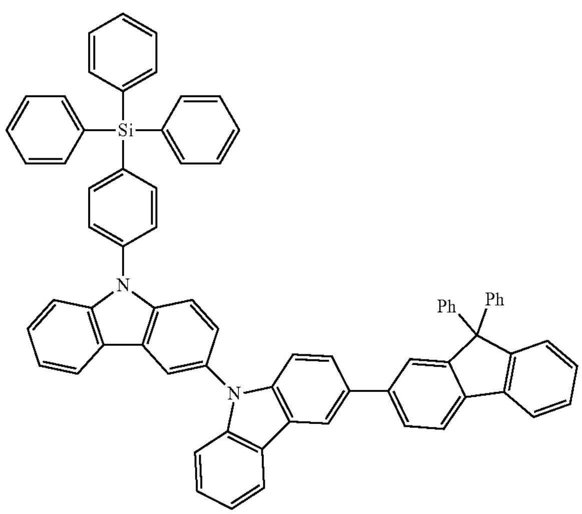
567
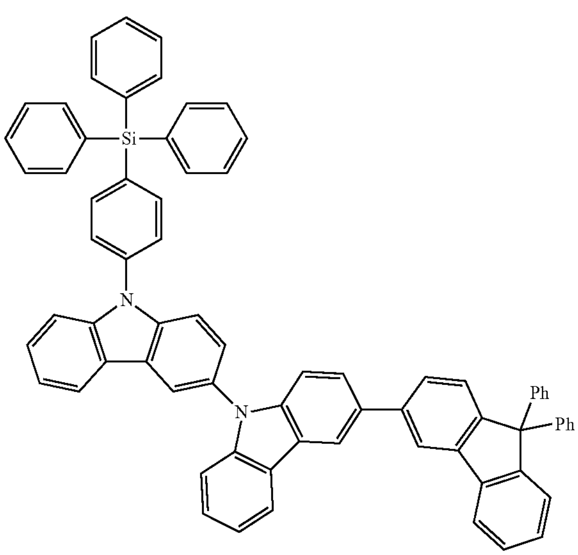
-continued
568
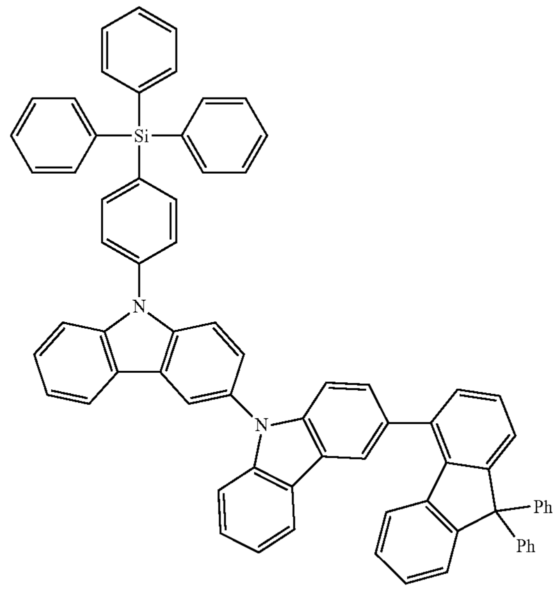
569
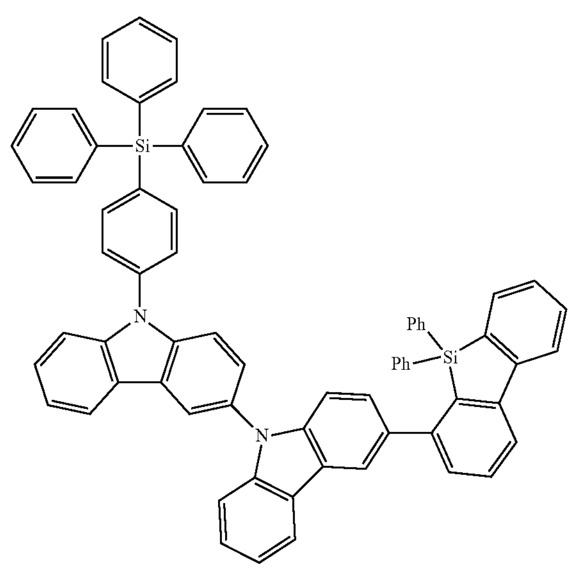

-continued
570
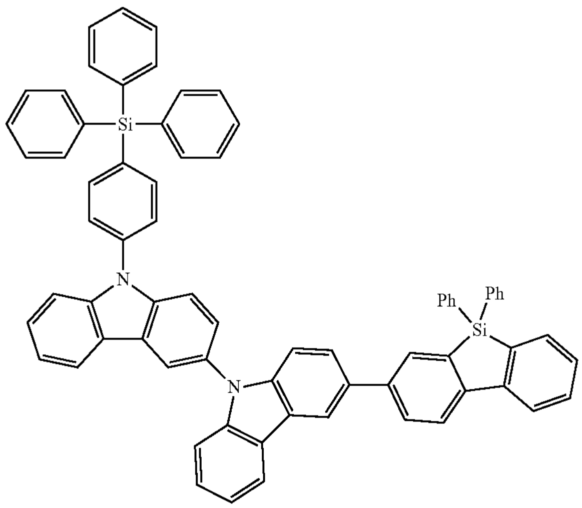
571
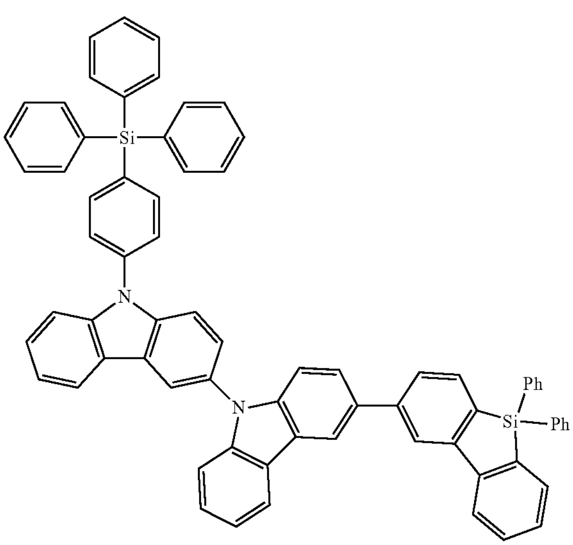
-continued
572
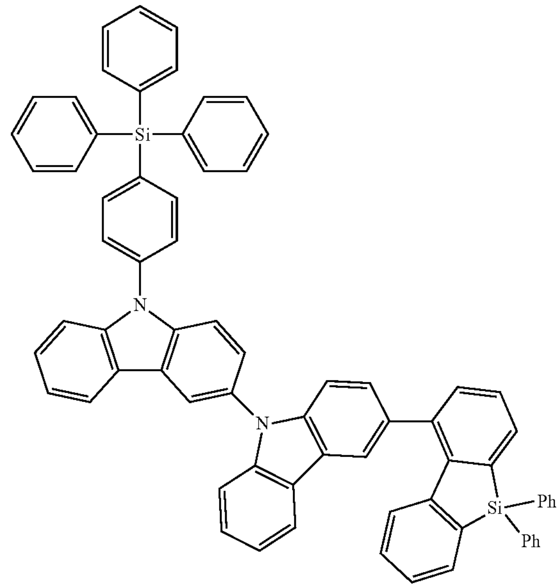
573
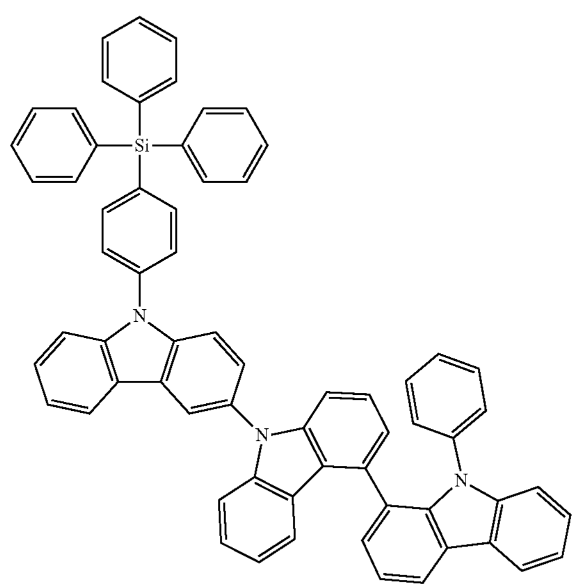

-continued
574
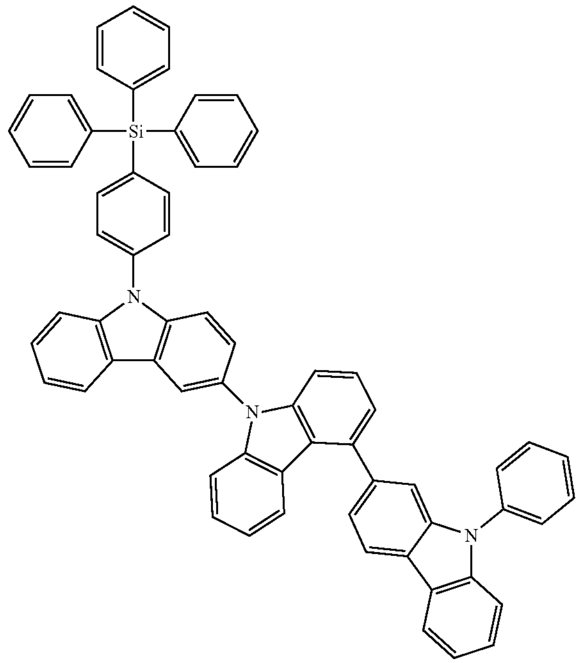
575
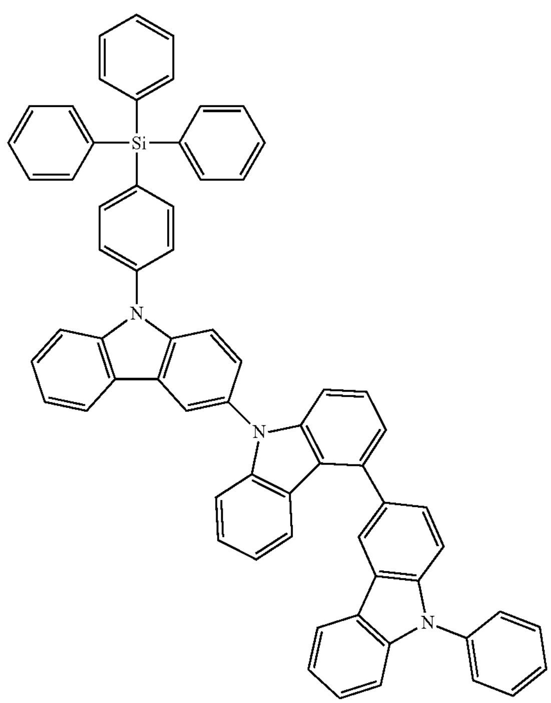
-continued
576
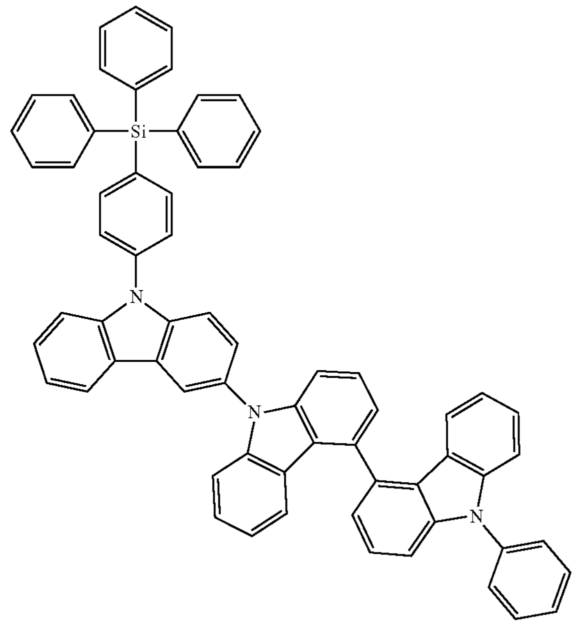
577
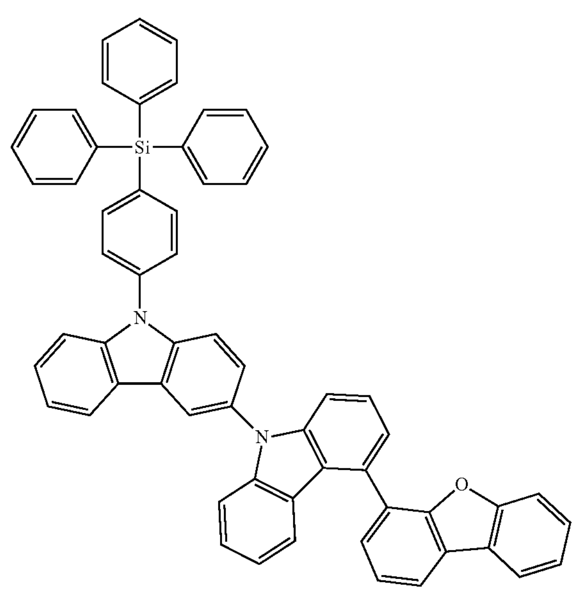

578
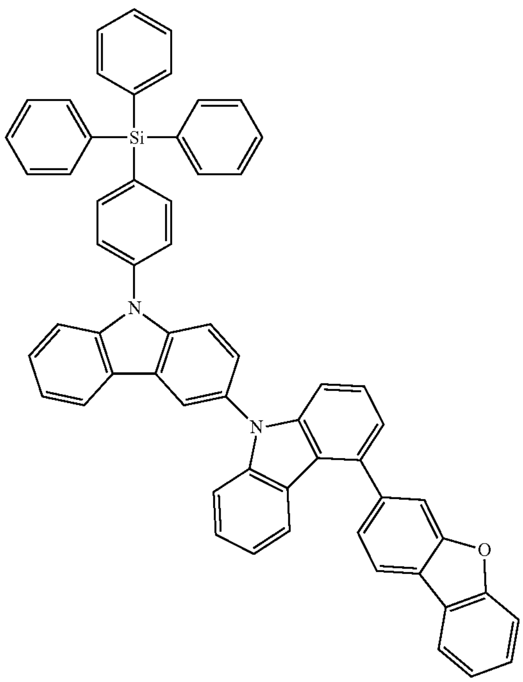
579
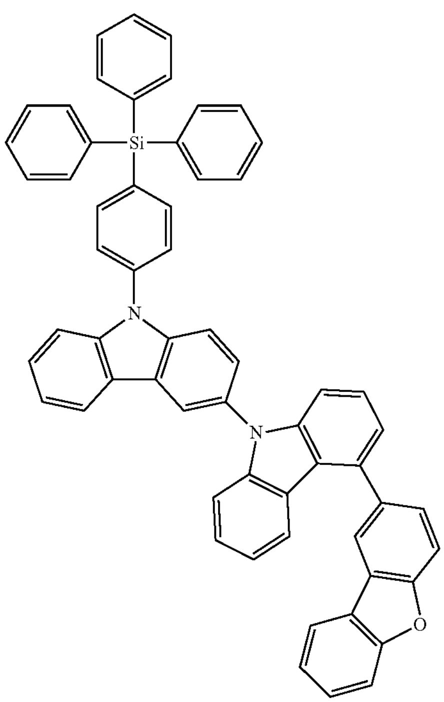
580
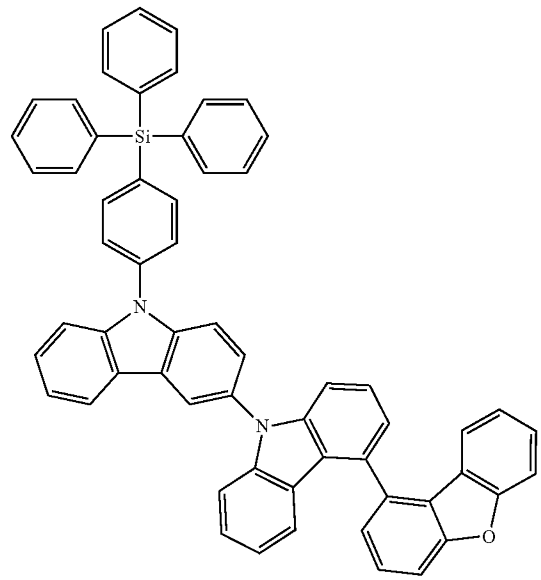
581
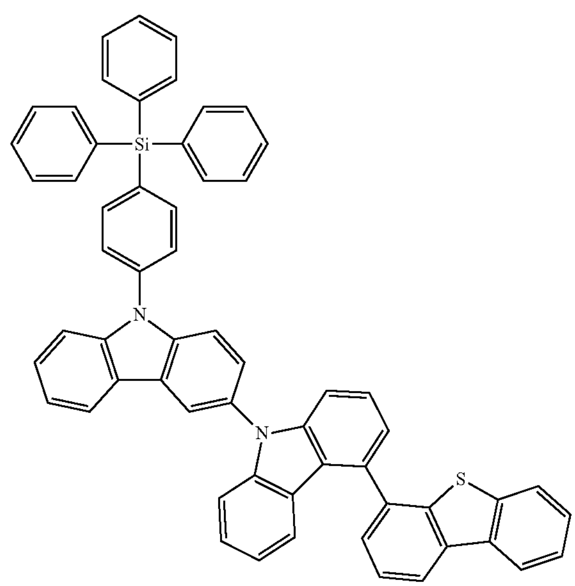

-continued
582
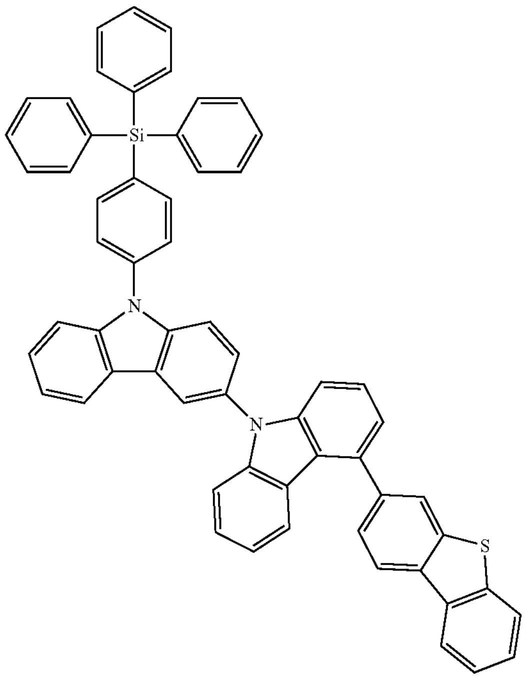
583
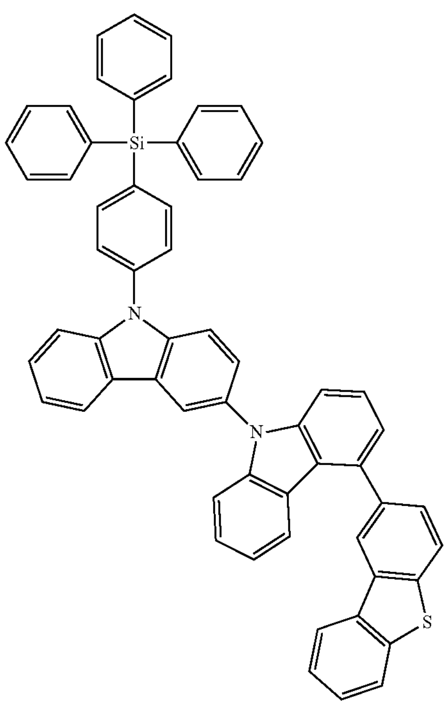
-continued
584
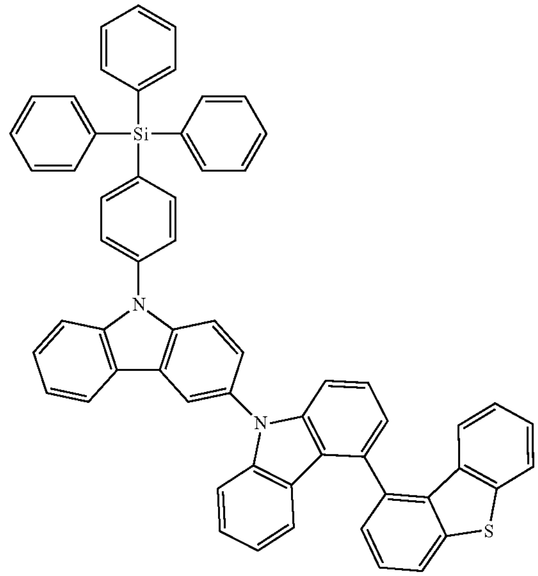
585
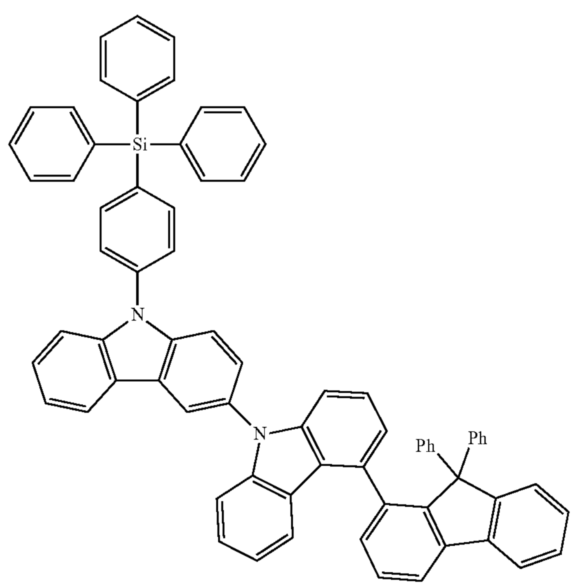

-continued
586
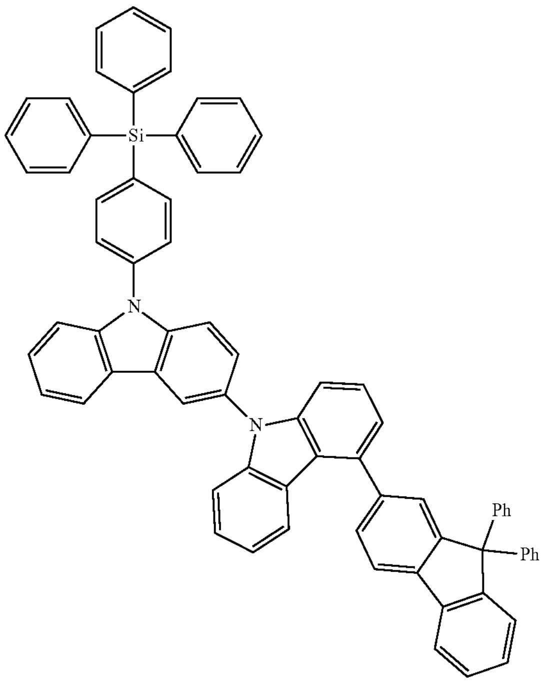
587
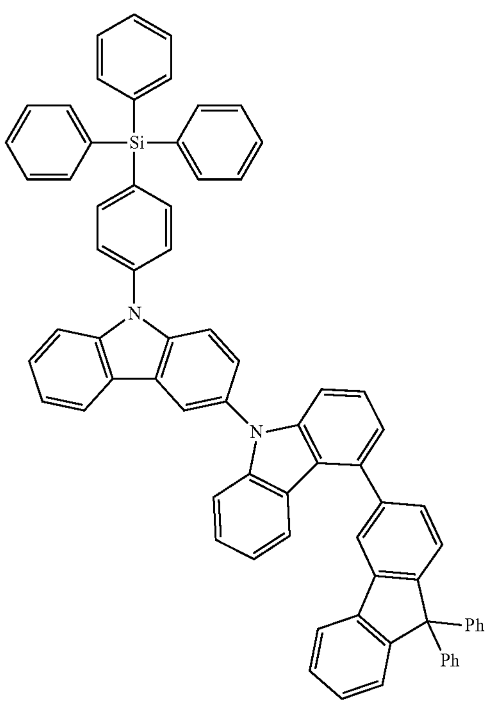
-continued
588
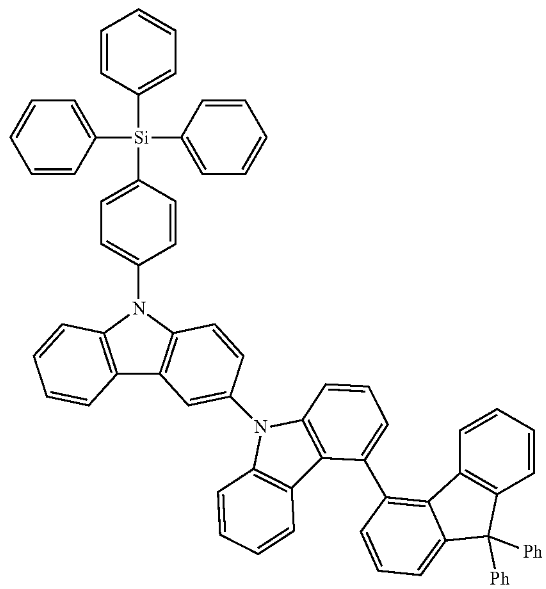
589
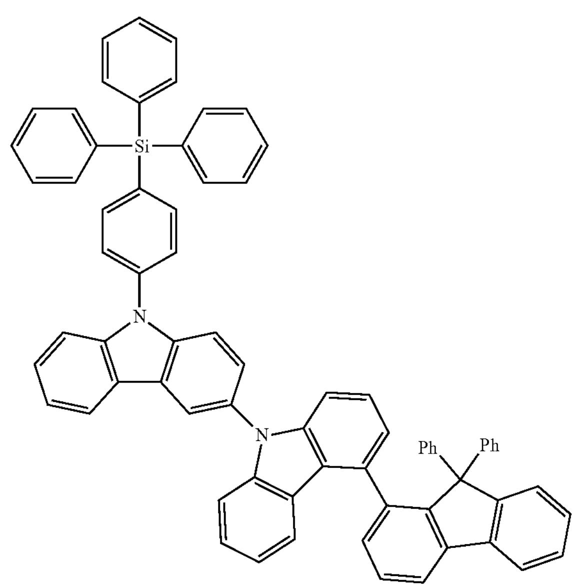

590
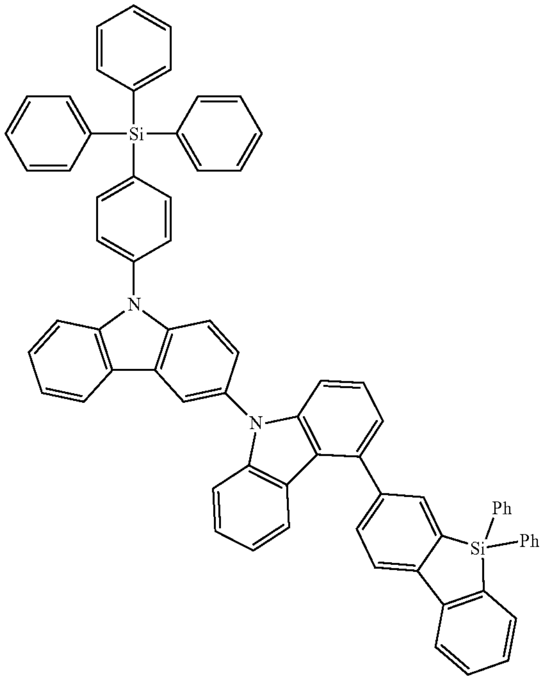
591
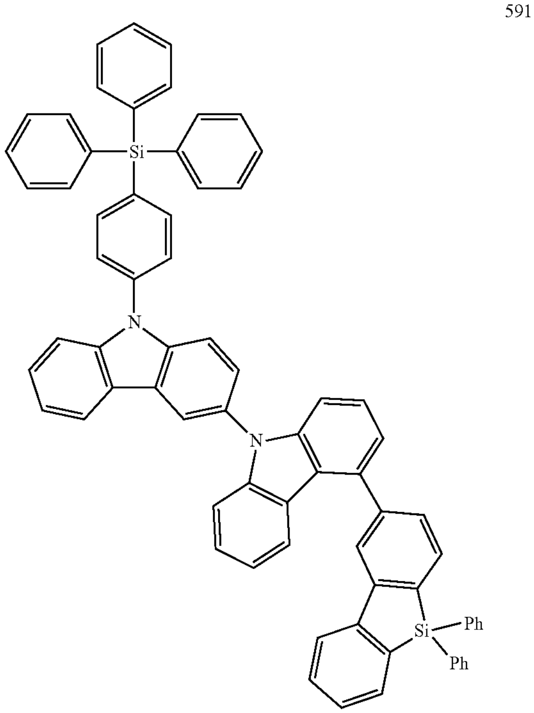
592
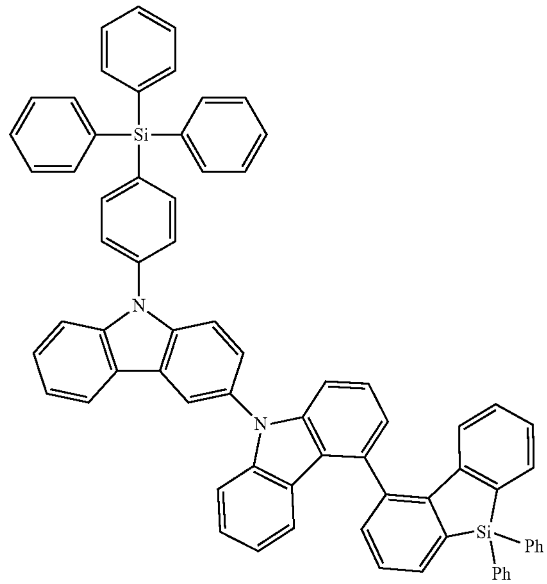
593
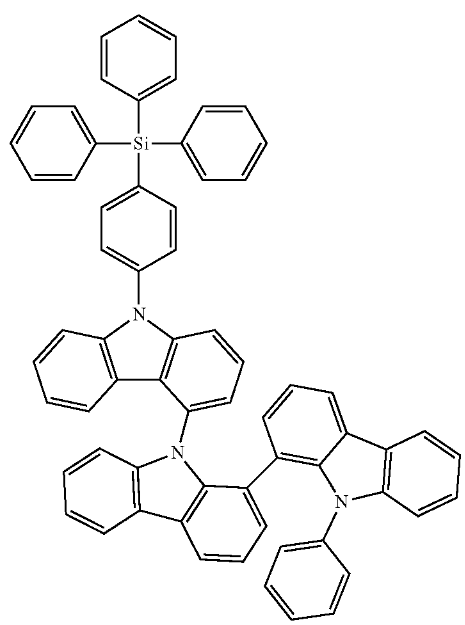

-continued
594
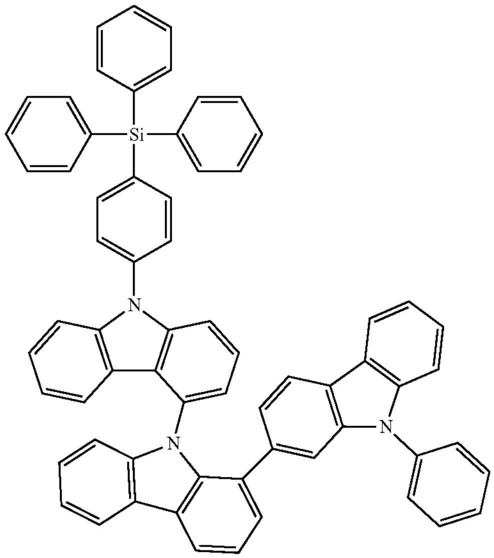
595
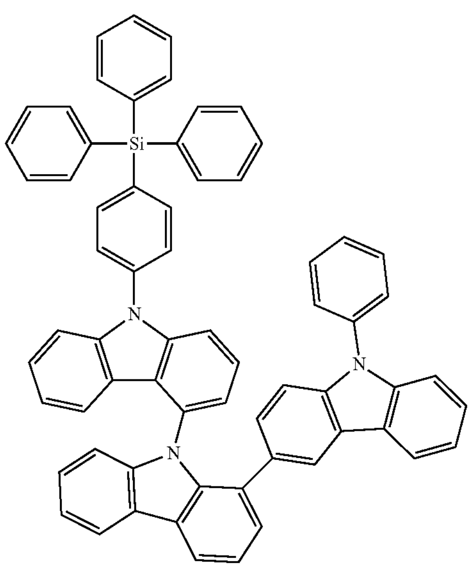
-continued
596
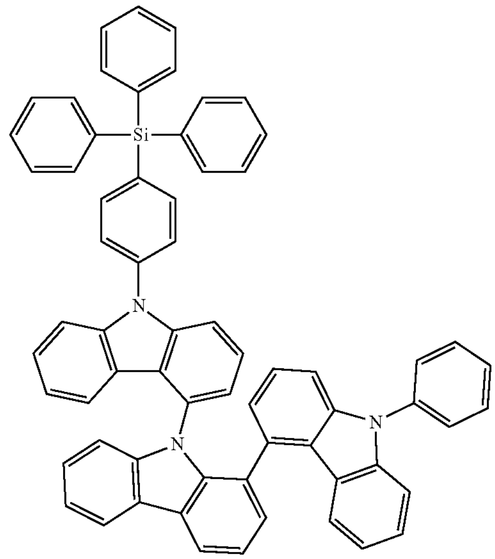
597
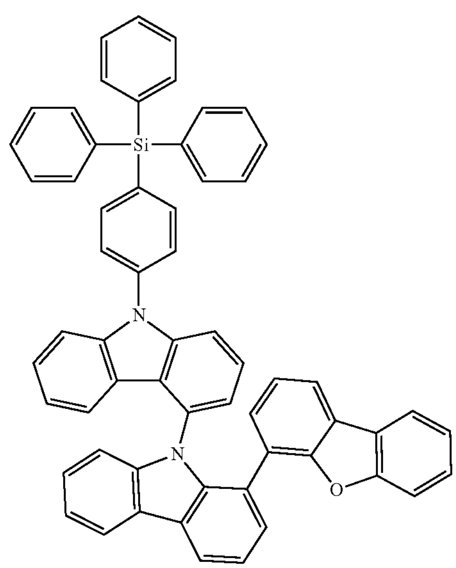

-continued
598
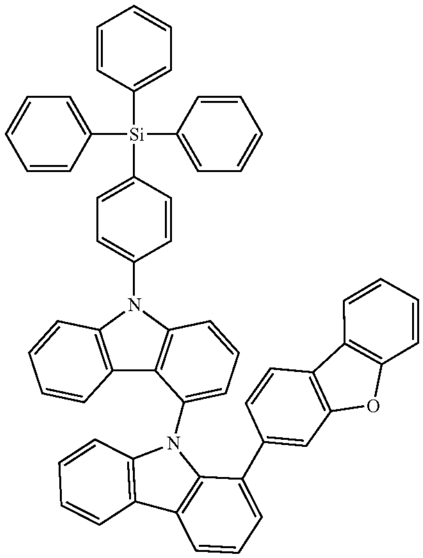
599
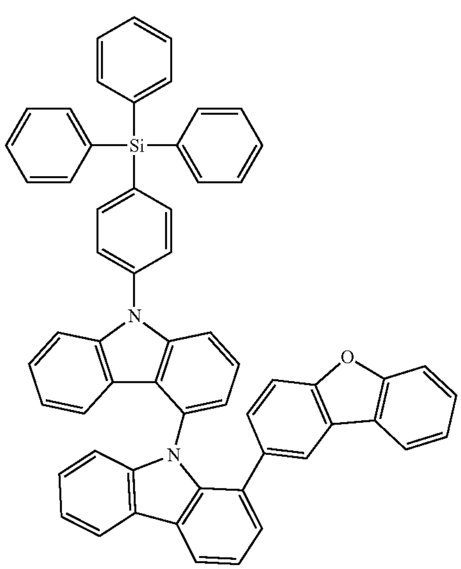
-continued
600
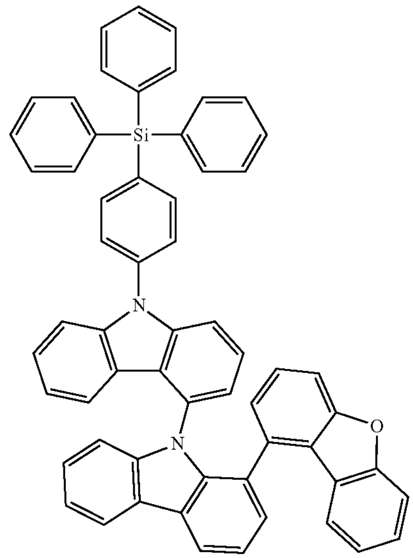
601
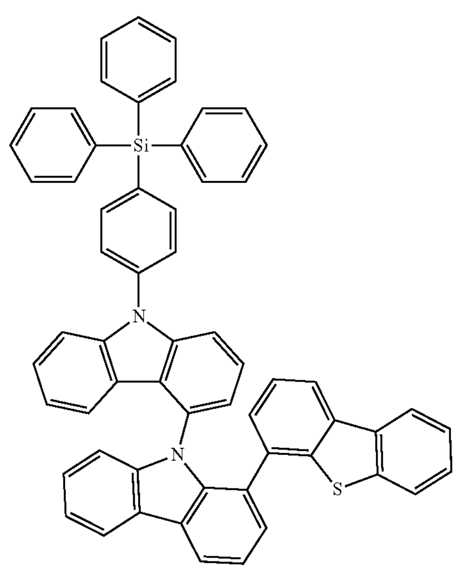

-continued
602
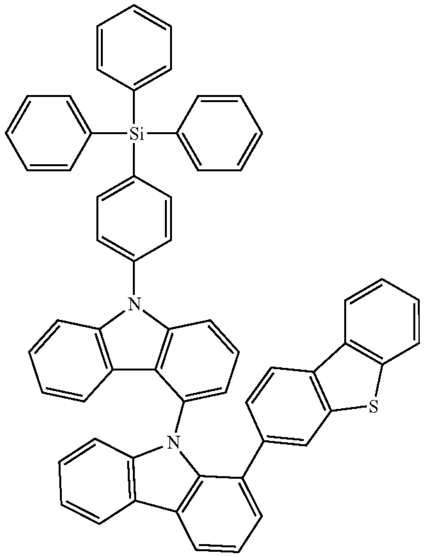
603
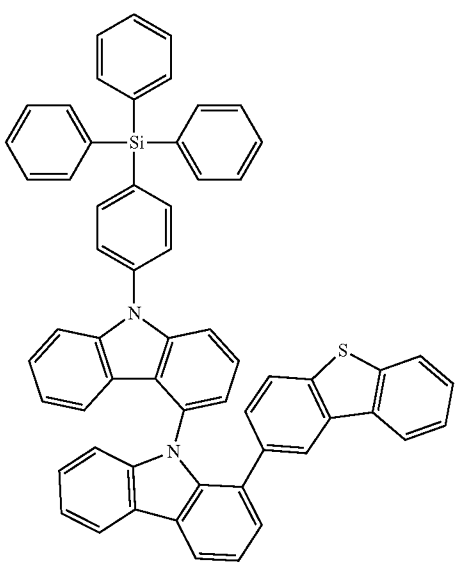
-continued
604
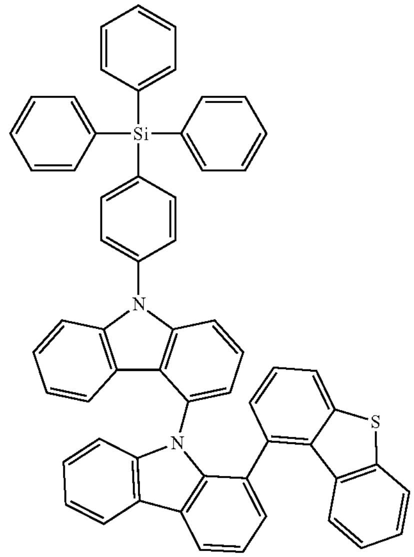
605
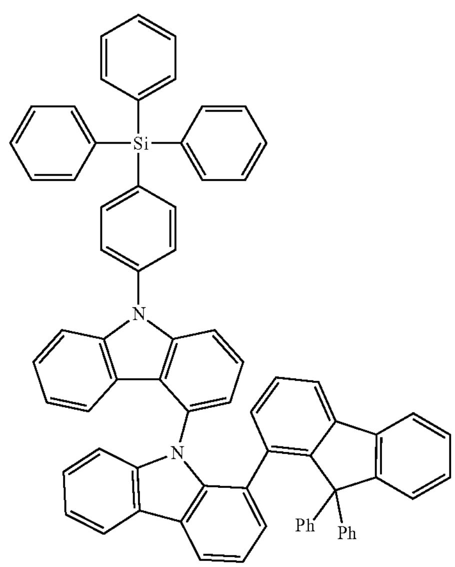

-continued
606
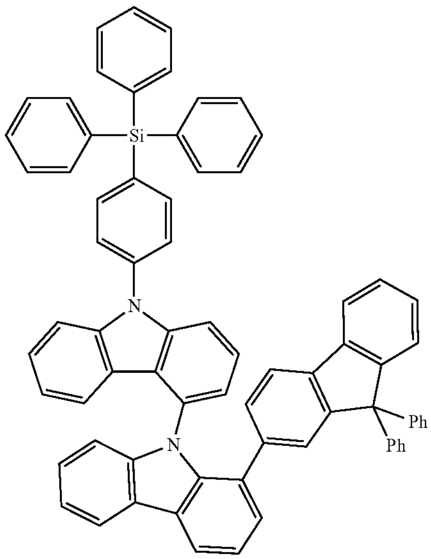
607
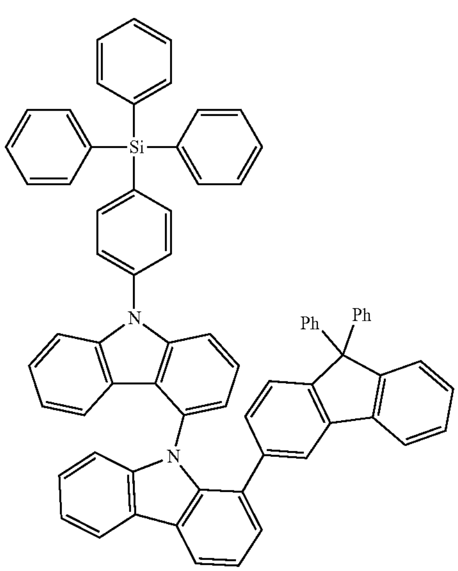
-continued
608
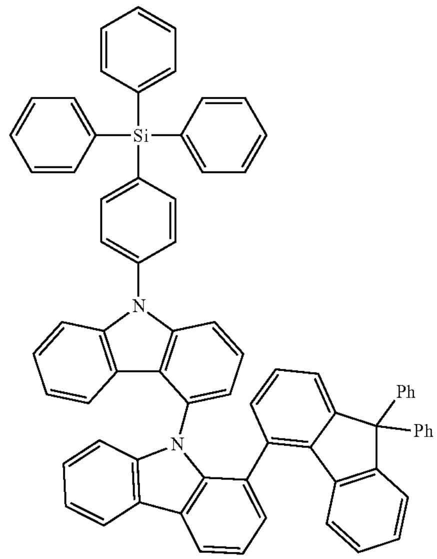
609
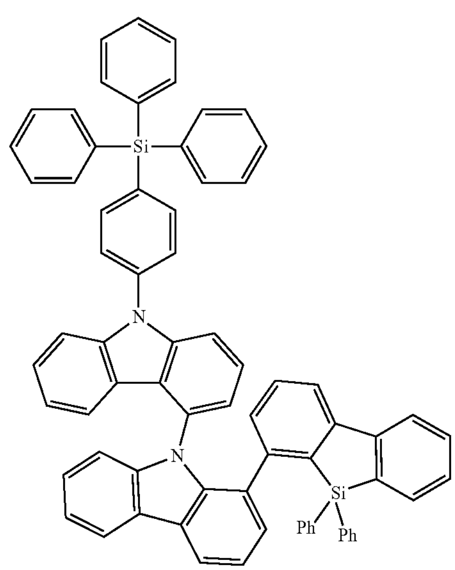

-continued
610
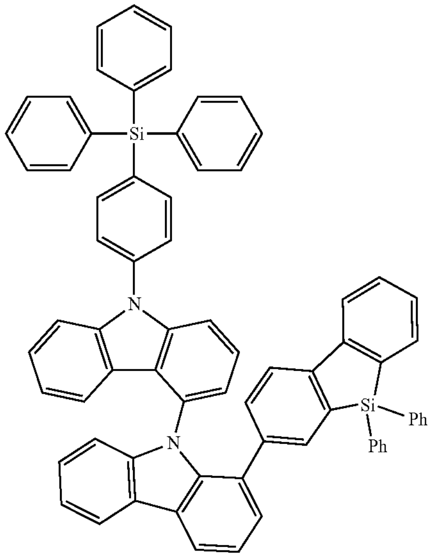
611
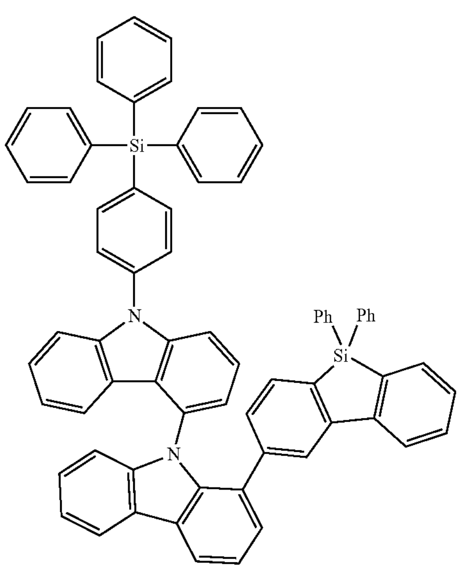
-continued
612
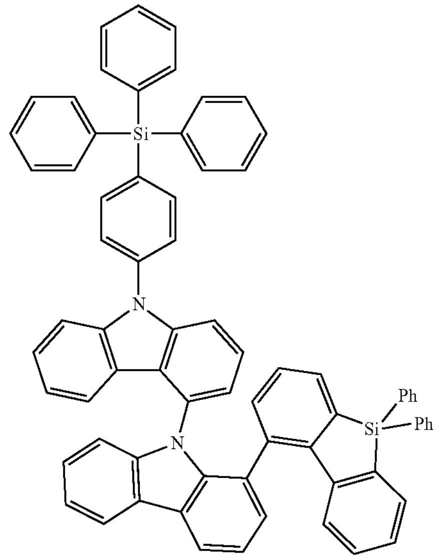
613
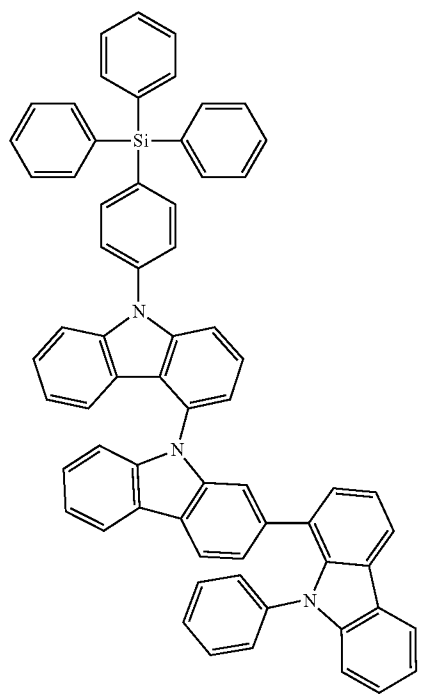

-continued
614
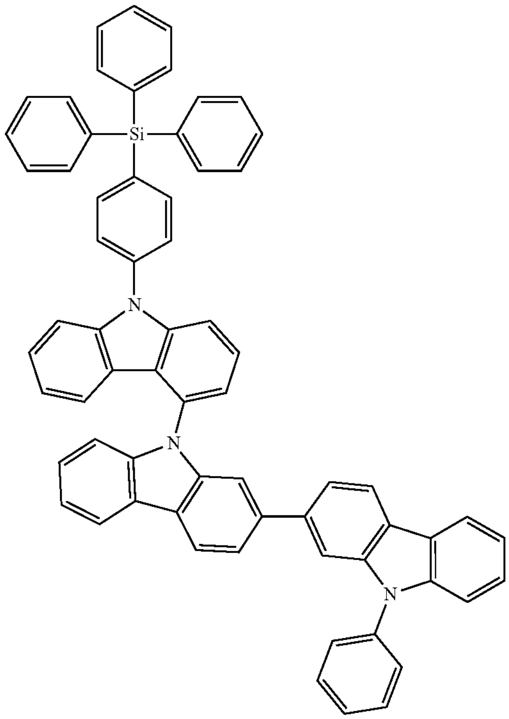
615
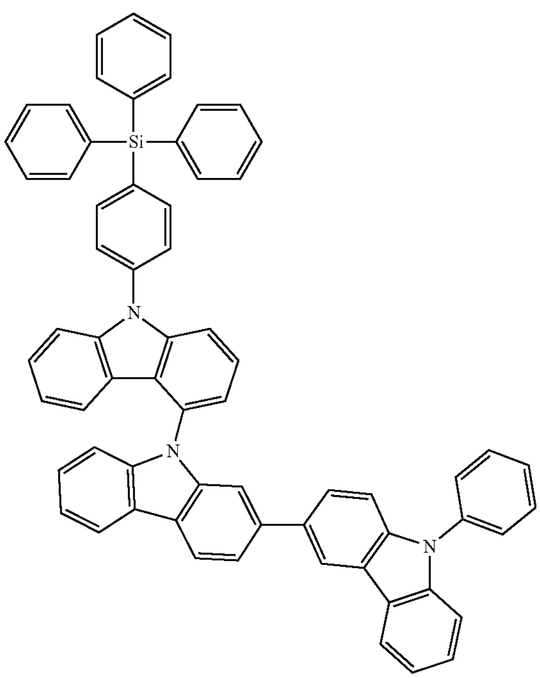
-continued
616
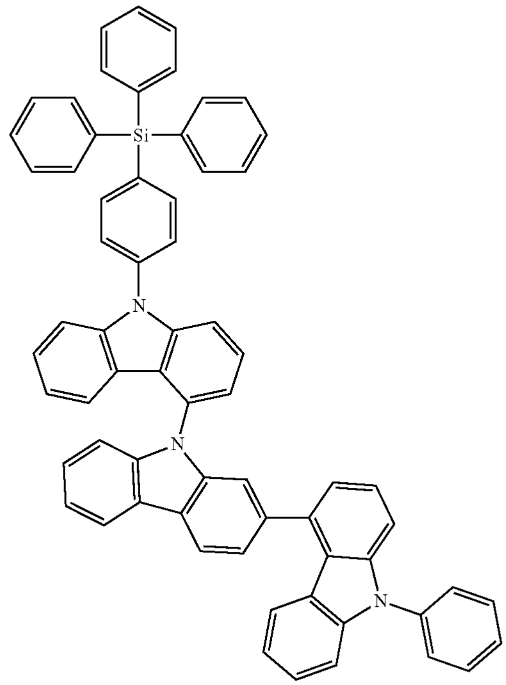
617
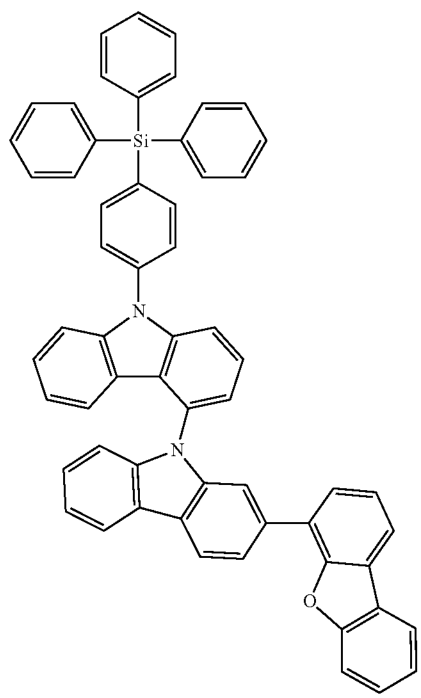

-continued
618
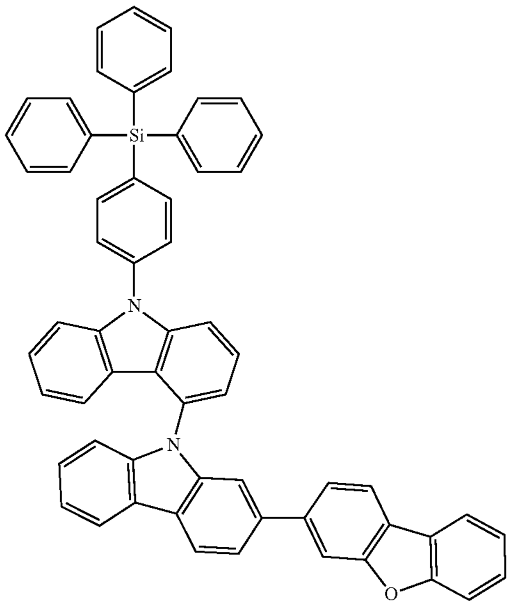
619
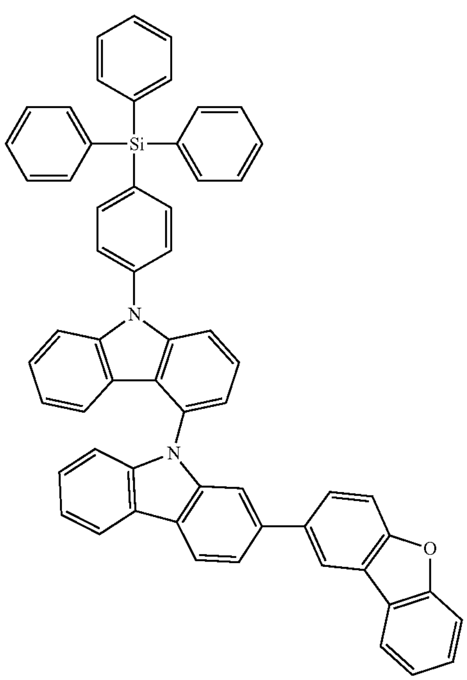
-continued
620
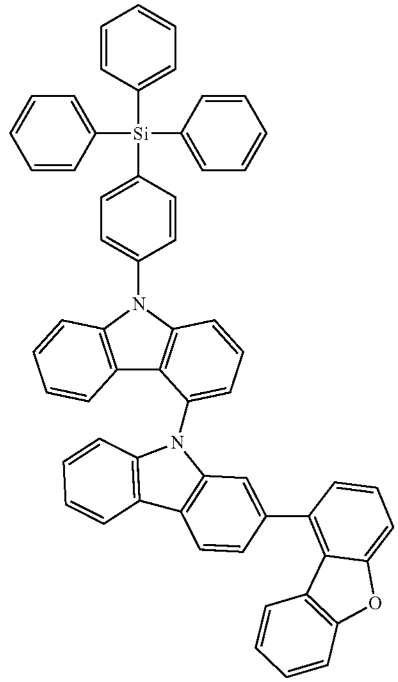
621
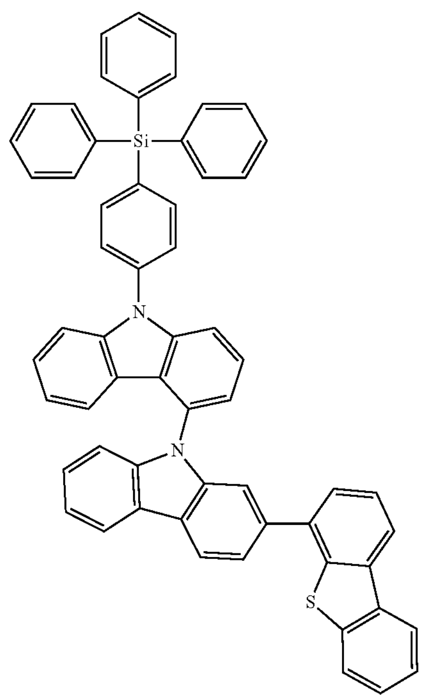

-continued
622
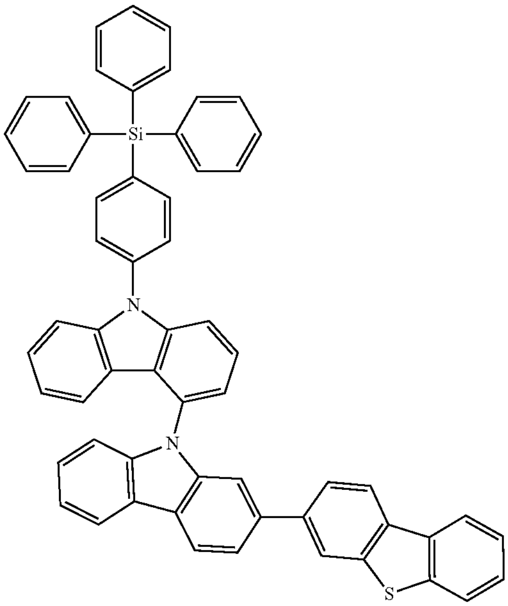
623
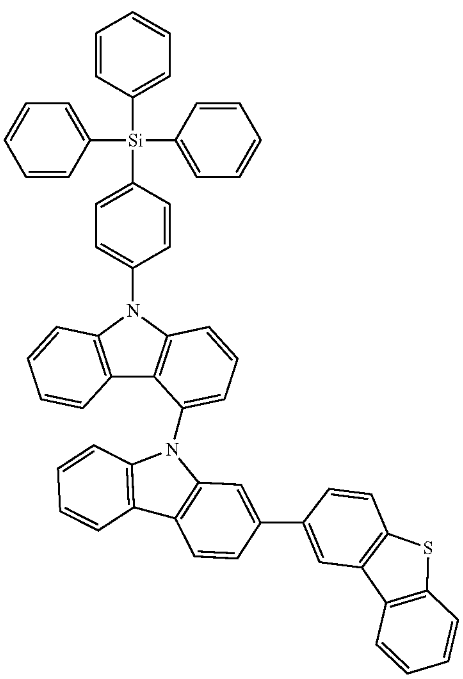
-continued
624
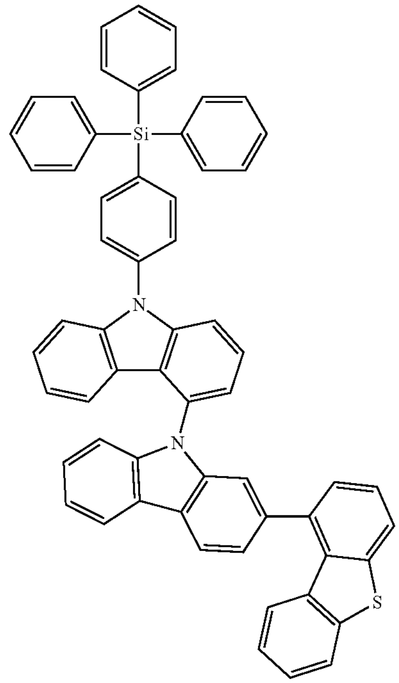
625
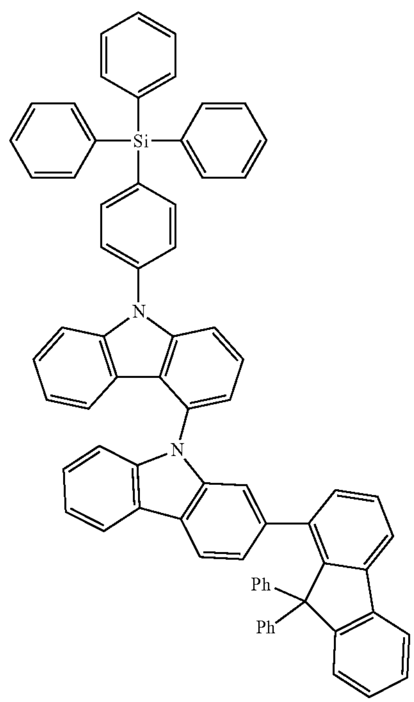

-continued
626
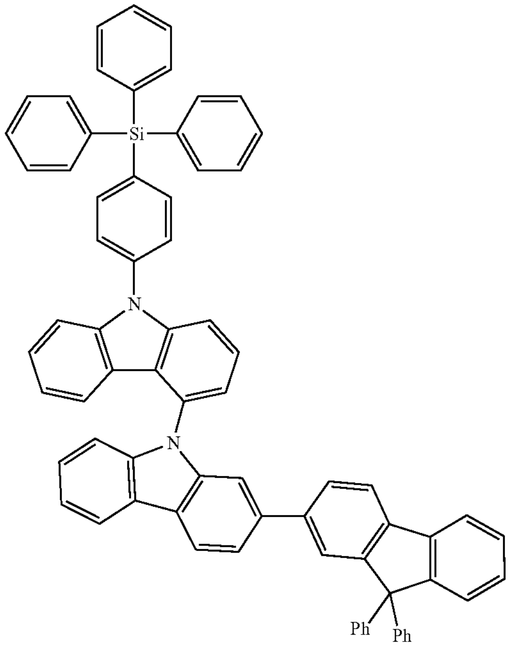
627
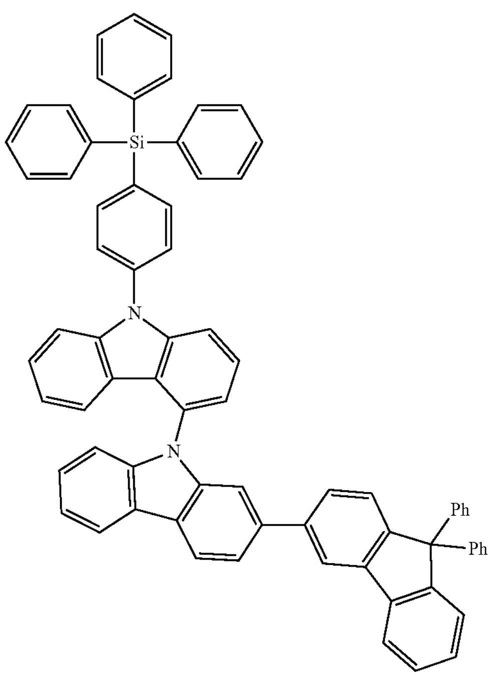
-continued
628
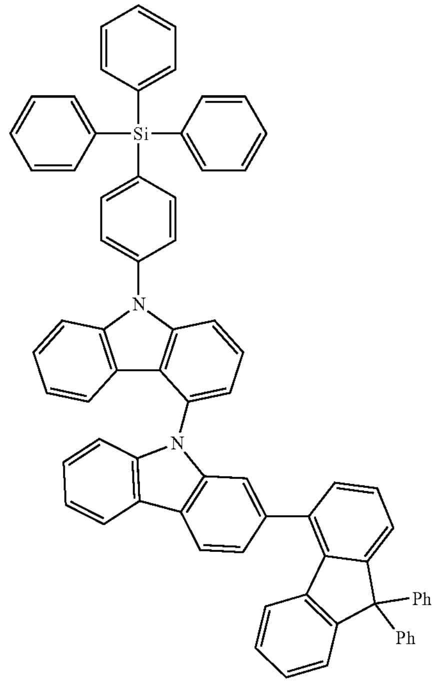
629
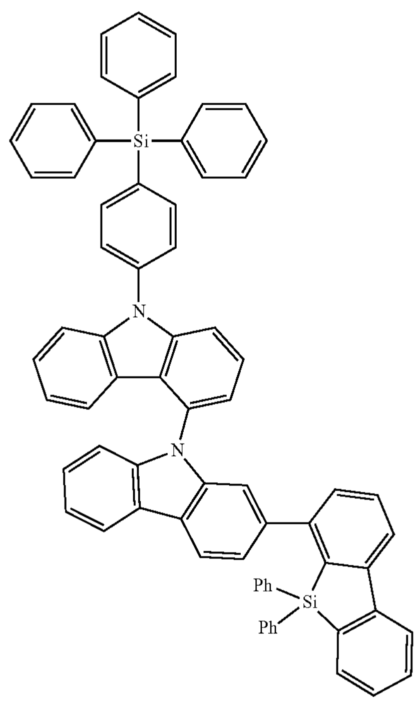

-continued
630
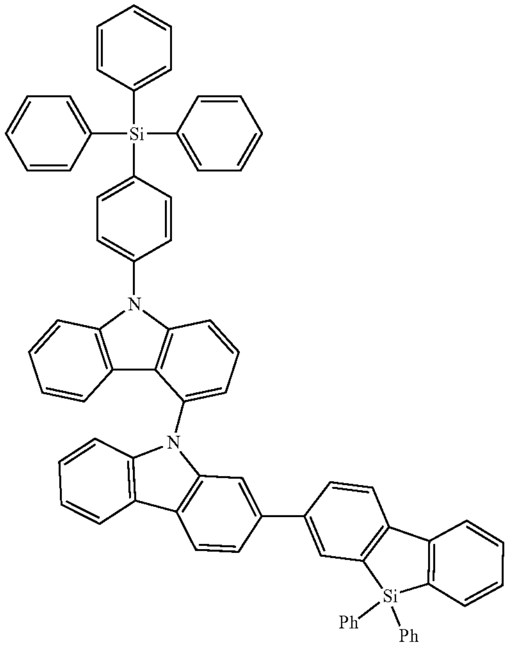
631
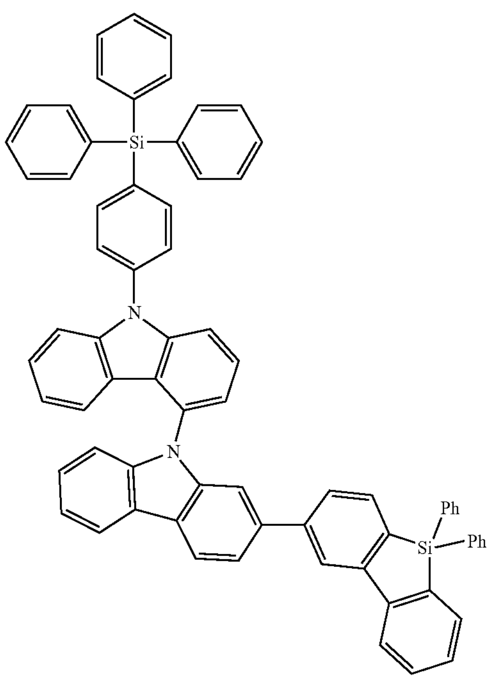
-continued
632
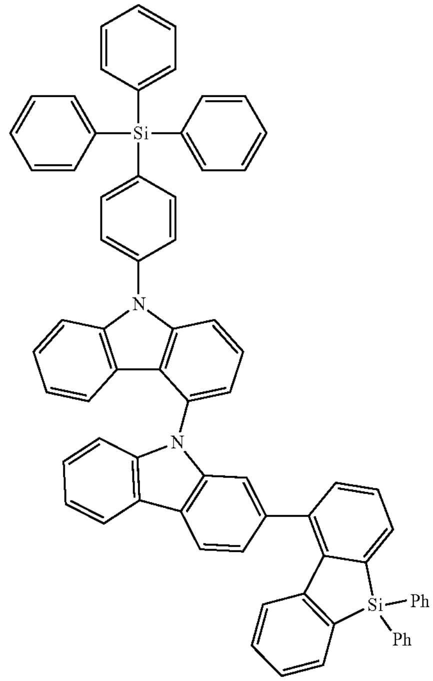
633
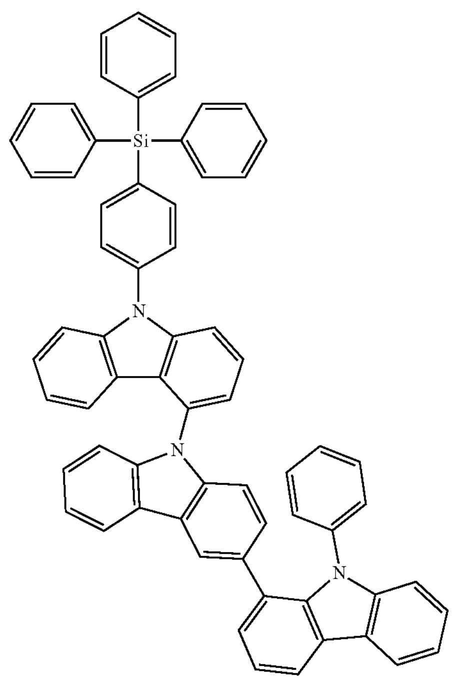

-continued
634
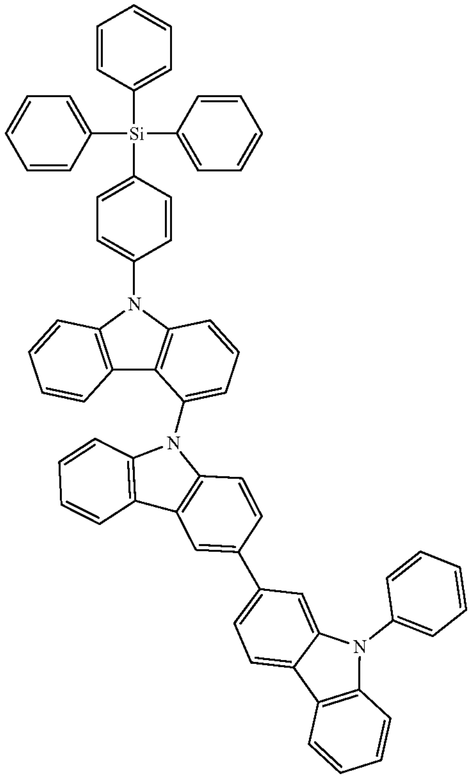
635
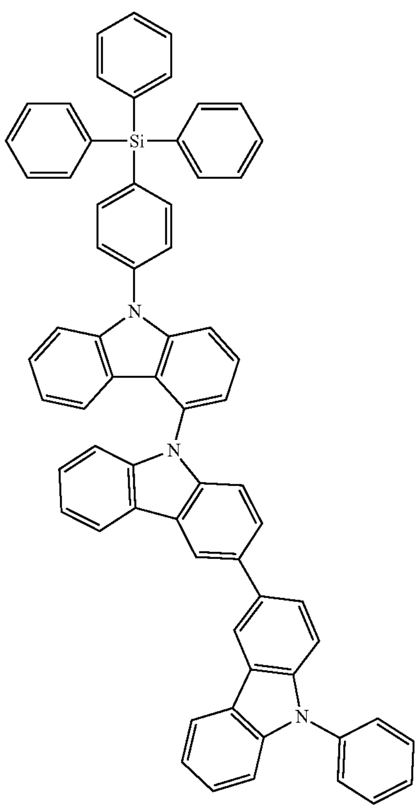
-continued
636
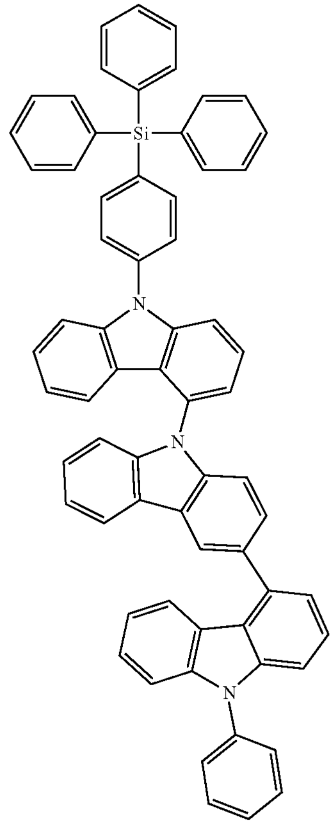
637
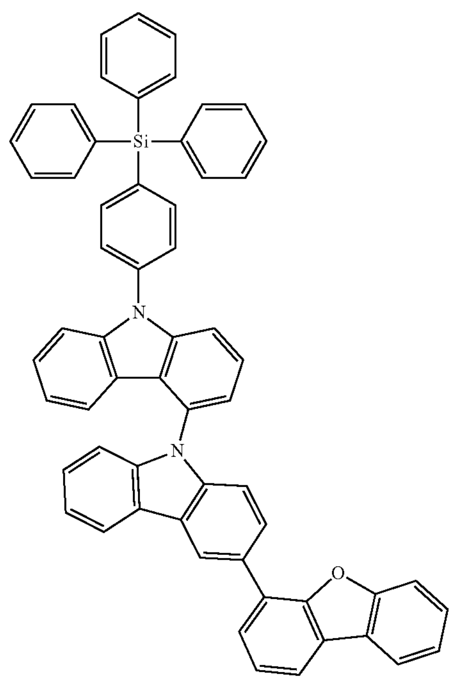

638
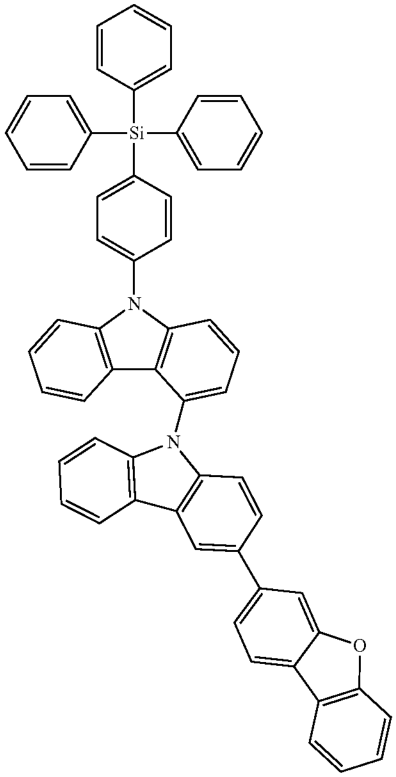
639
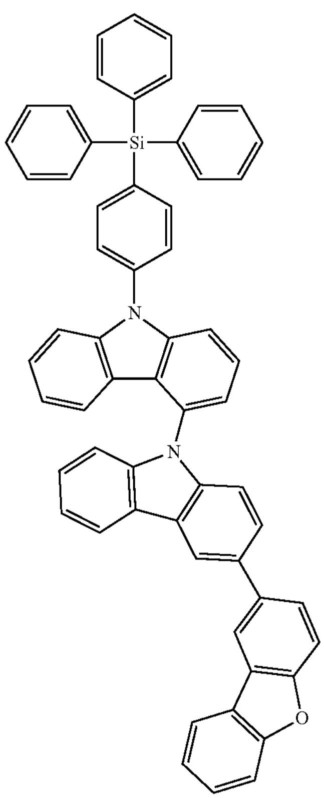
640
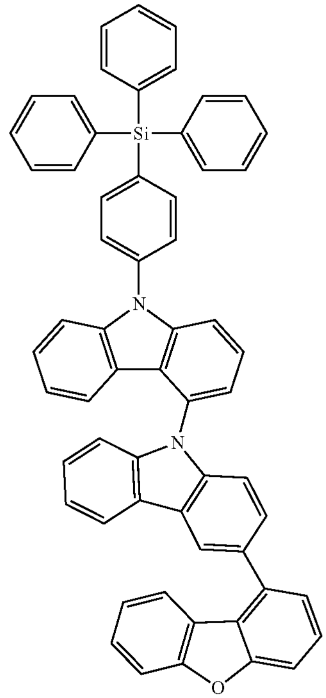
641
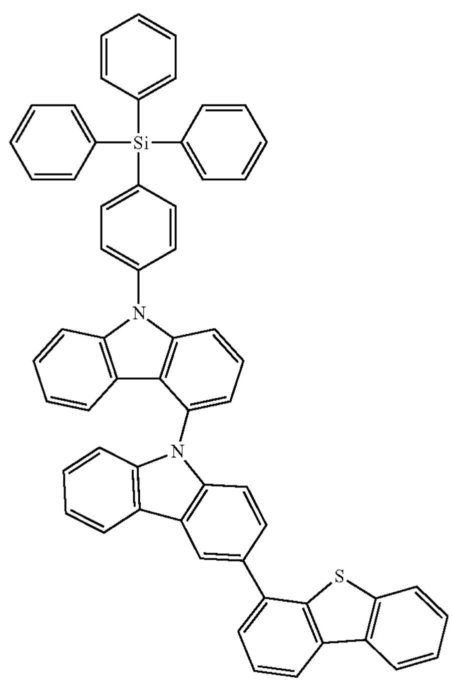

642
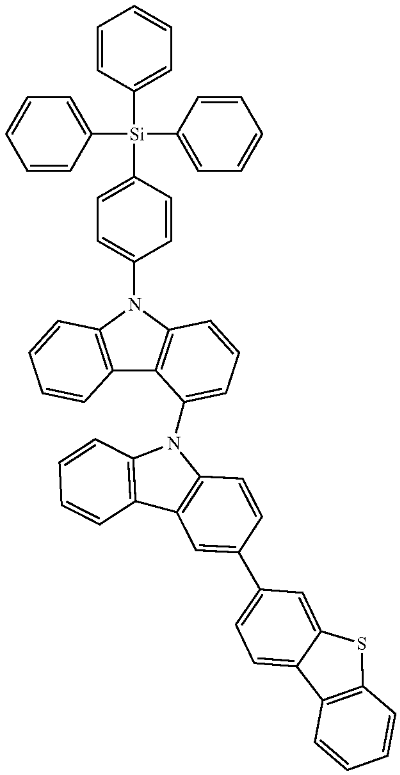
643
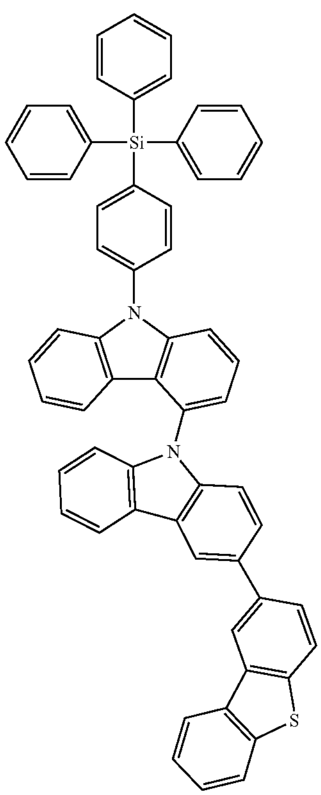
644
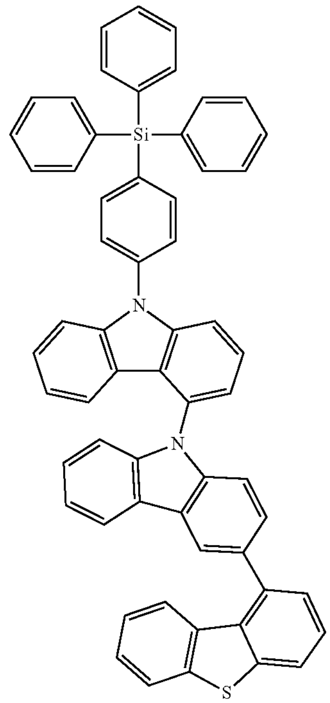
645
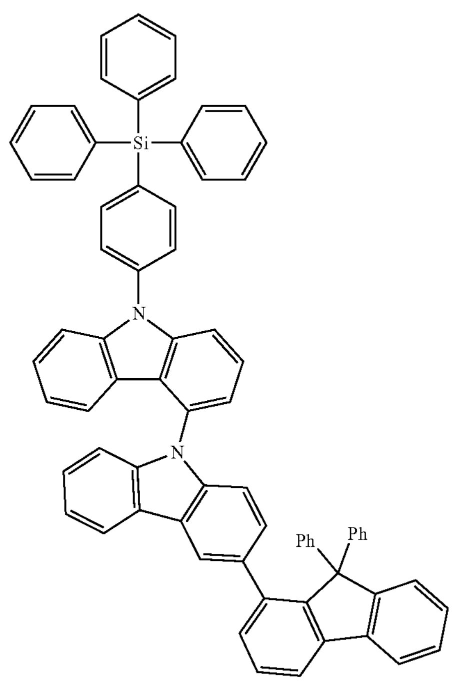

-continued
646
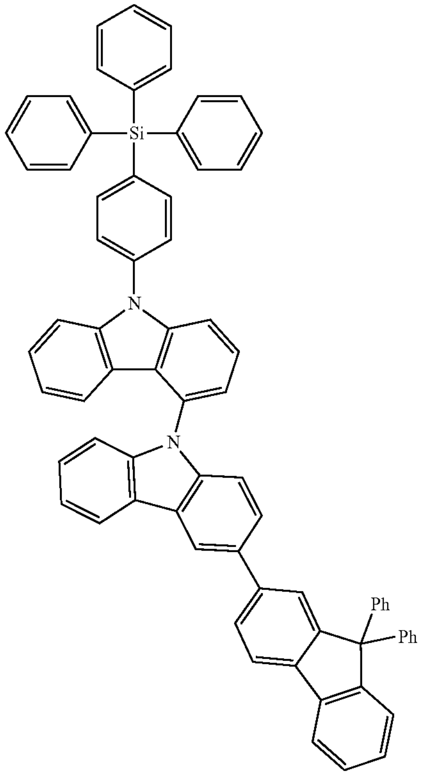
647
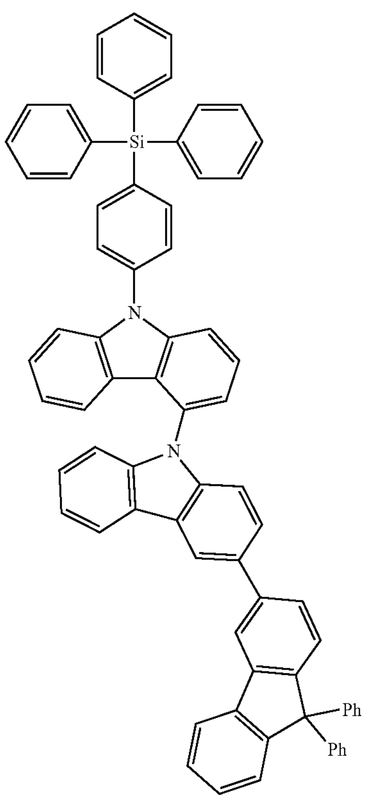
-continued
648
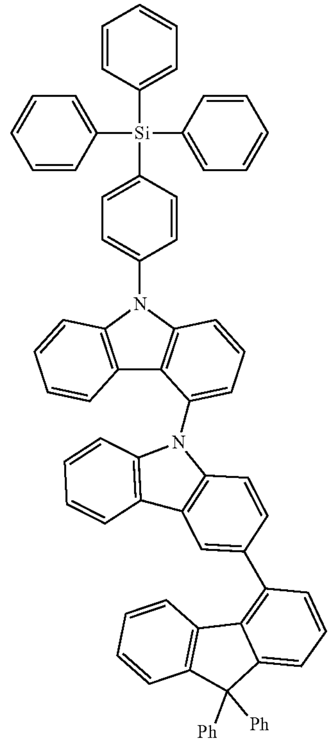
649
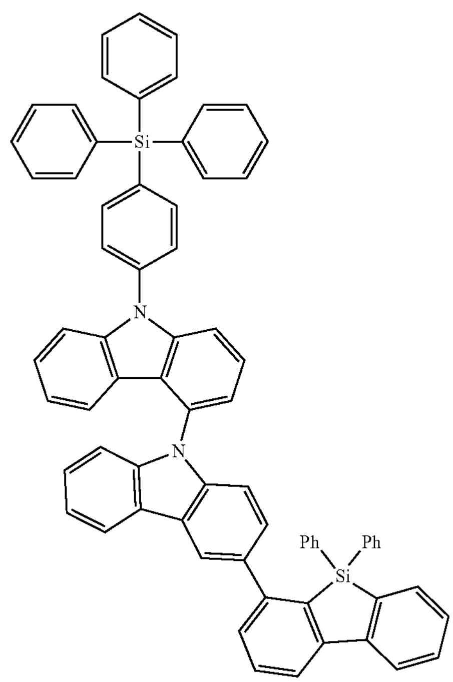

-continued
650
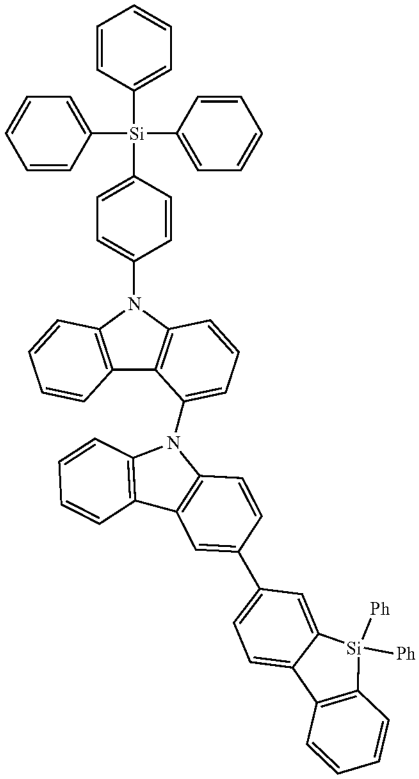
651
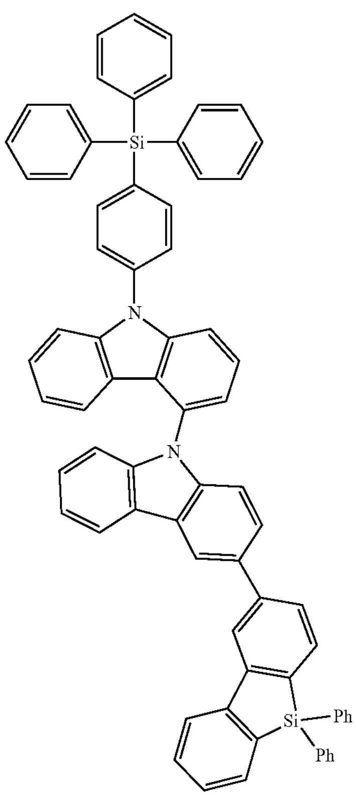
-continued
652
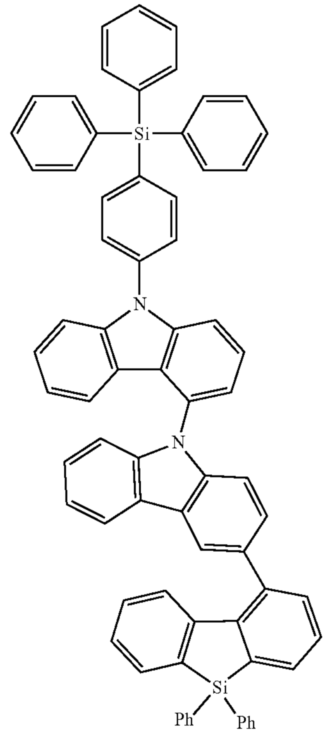
653
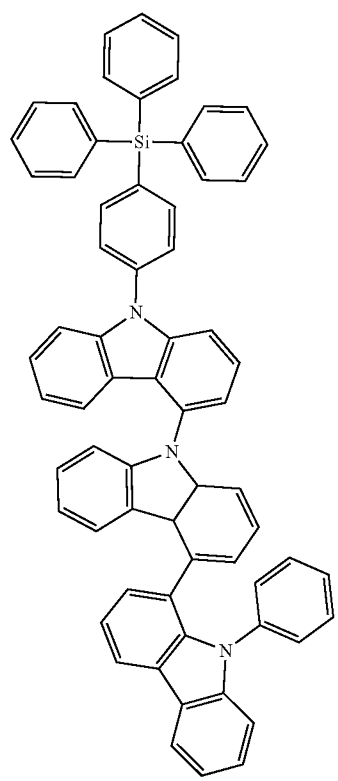

654
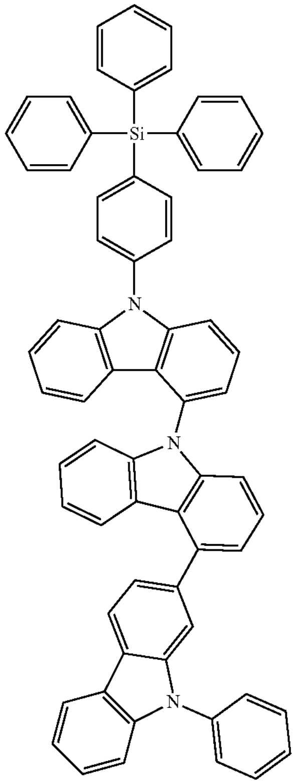
655
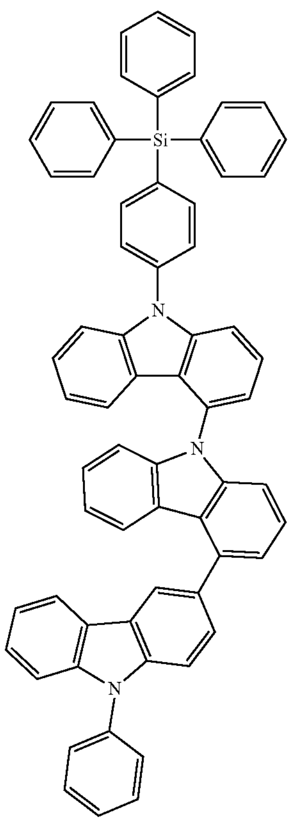
656
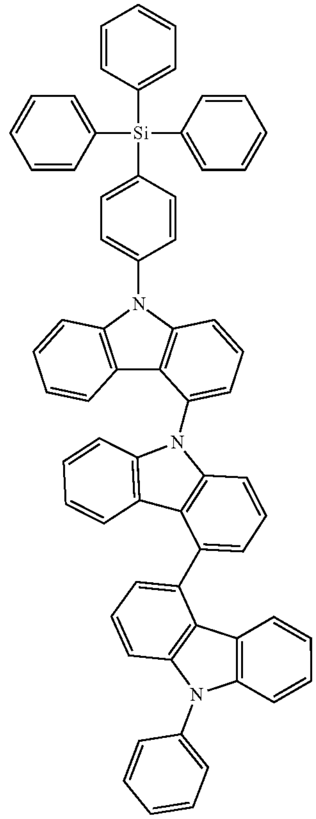
657
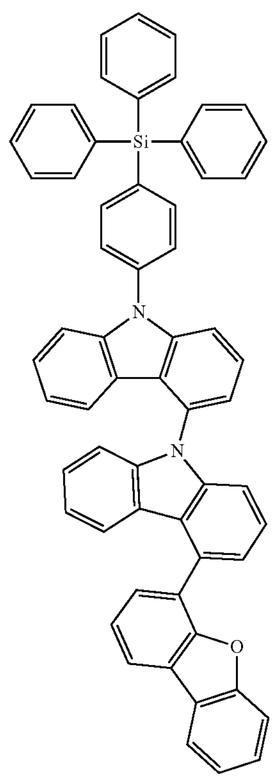

-continued
658
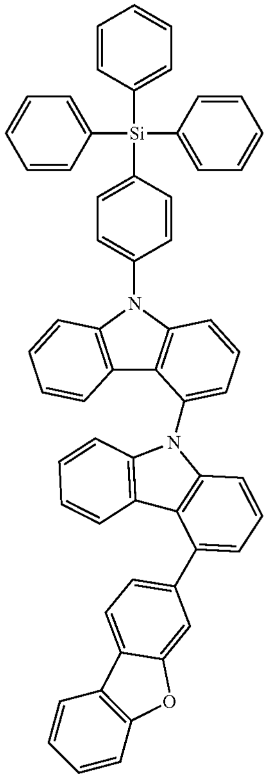
659
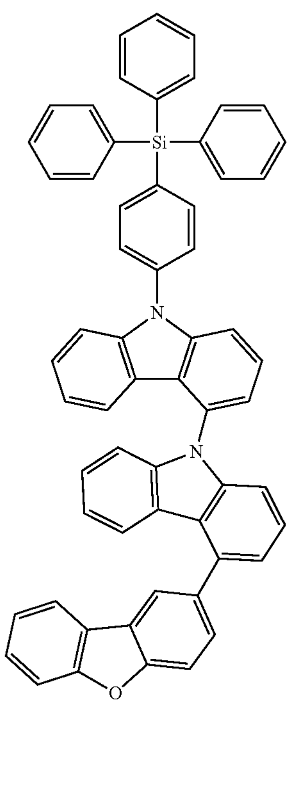
-continued
660
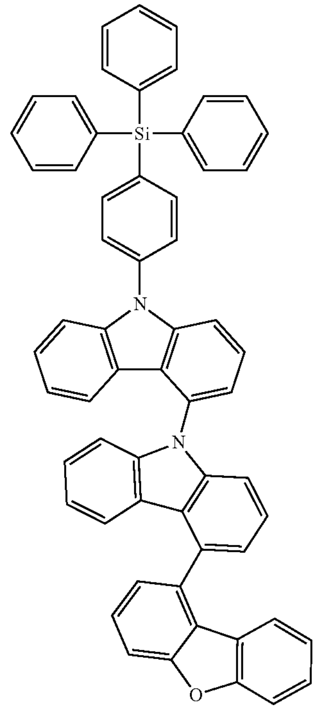
661
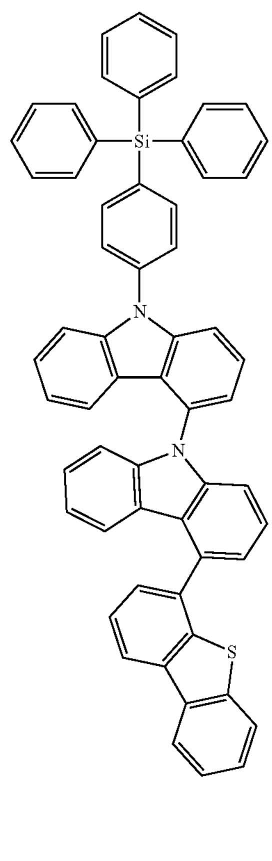

-continued
662
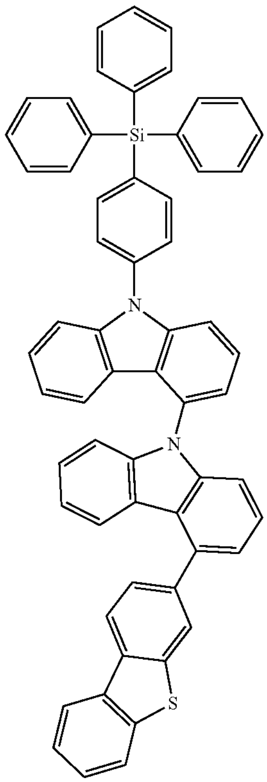
663
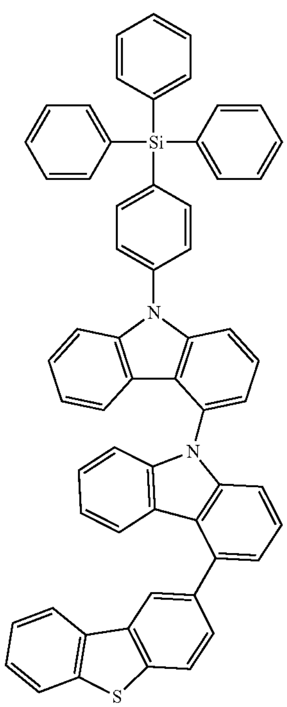
-continued
664
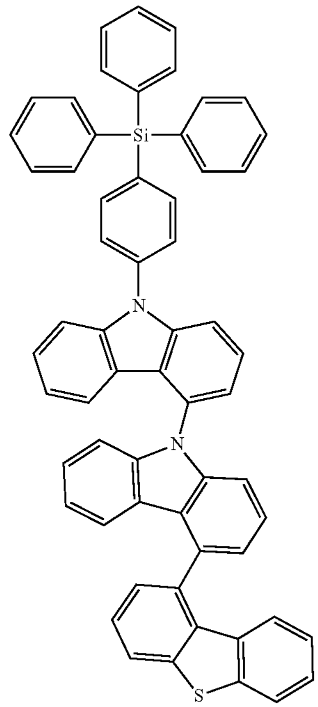
665
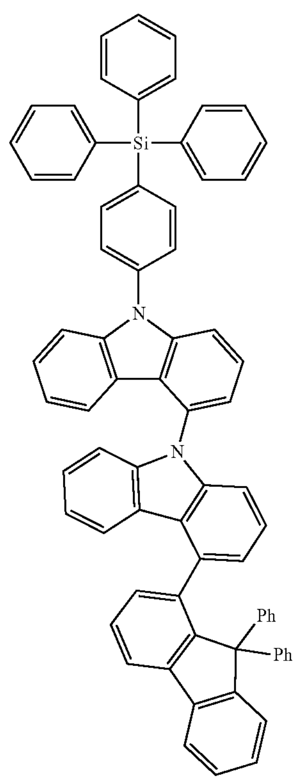

-continued
666
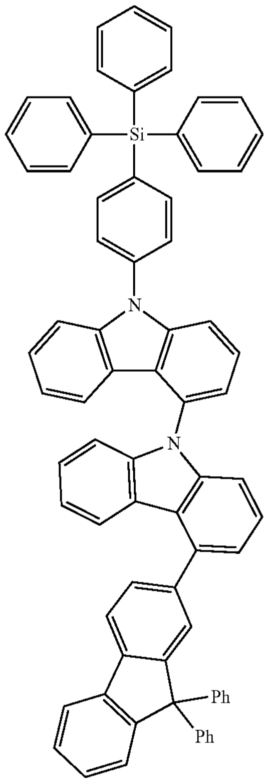
667
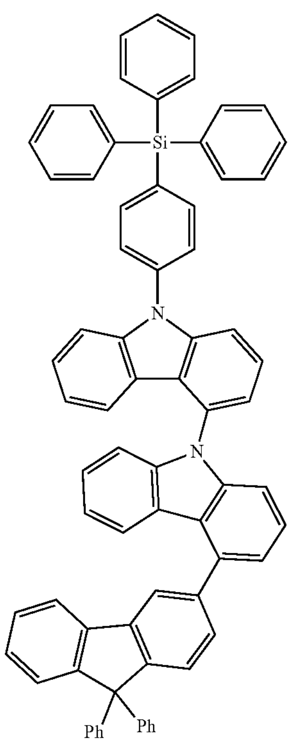
-continued
668
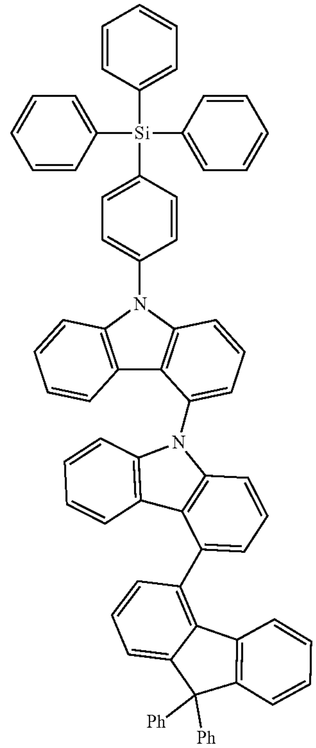
669
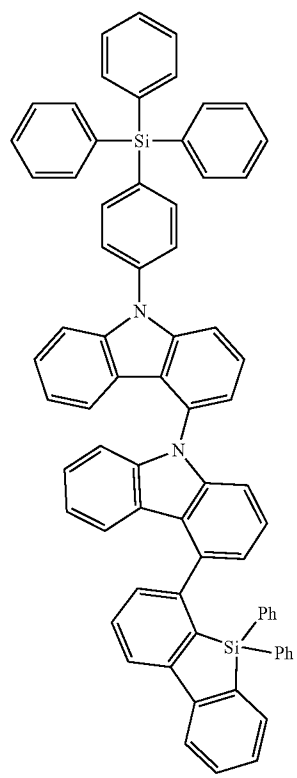

-continued
670
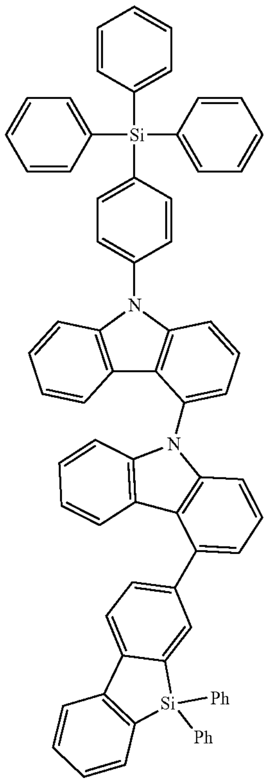
671
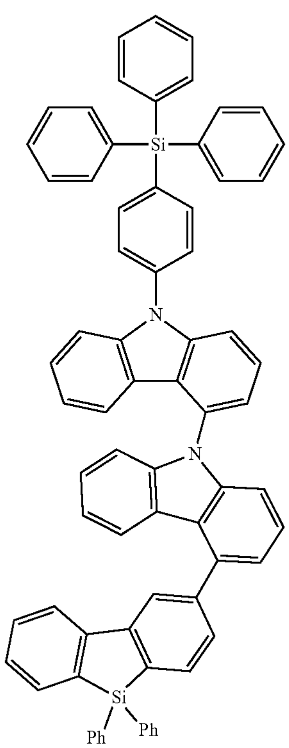
-continued
672
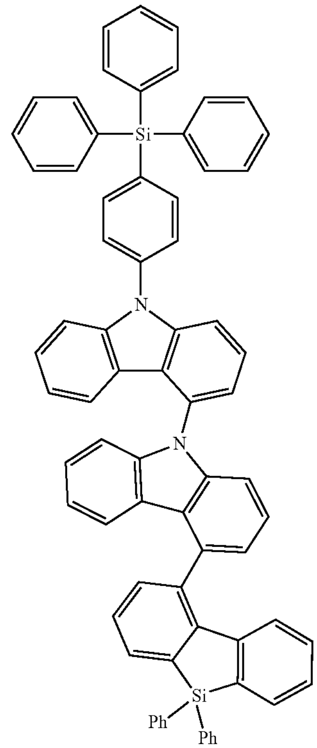
673
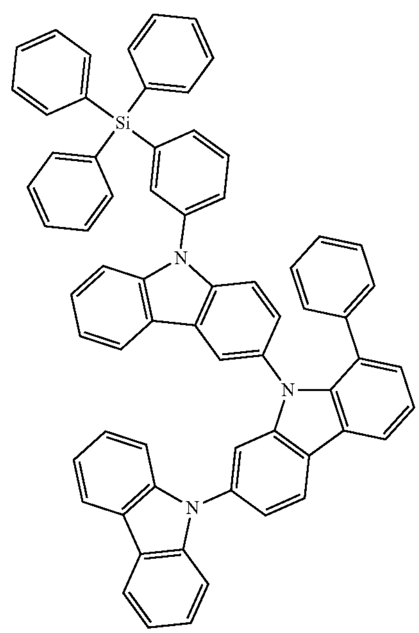

-continued
674
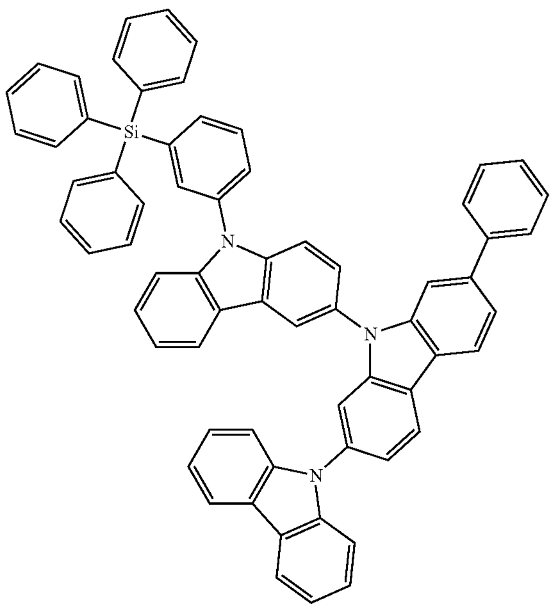
675
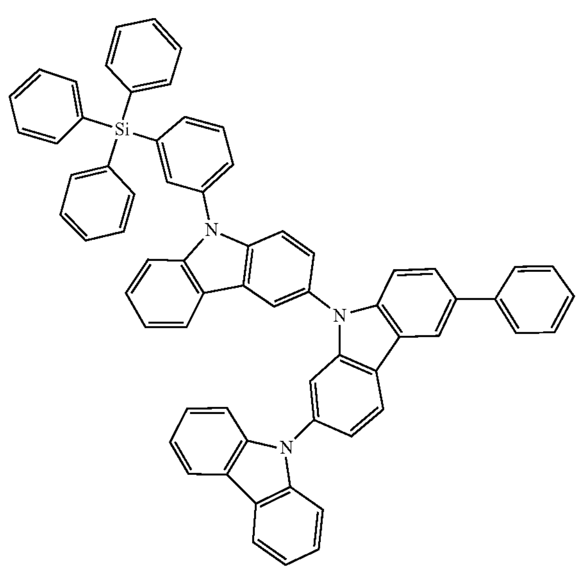
-continued
676
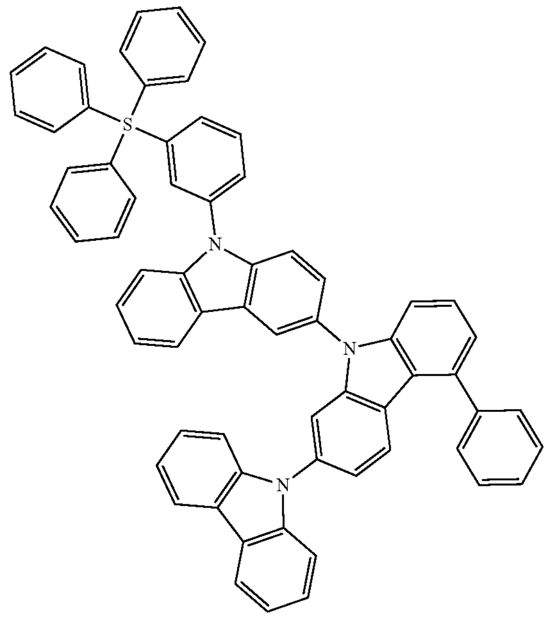
677
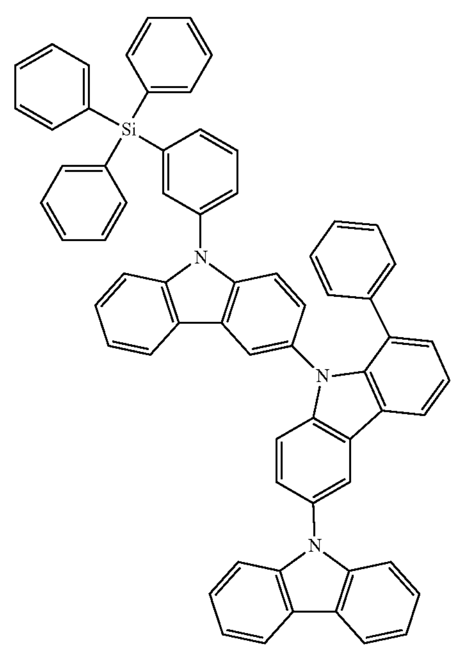

-continued
678
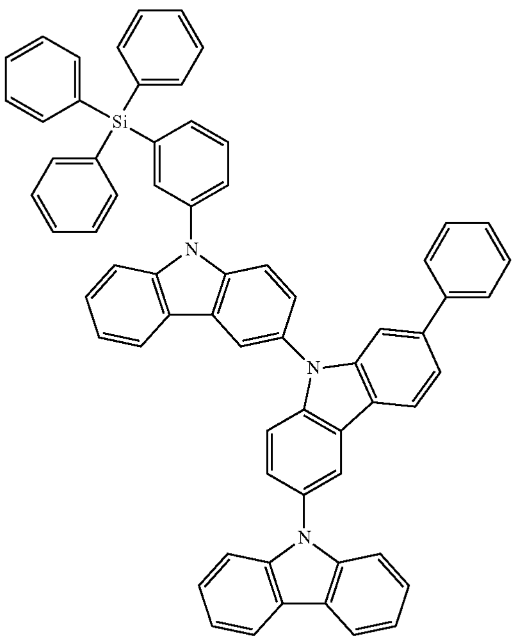
679
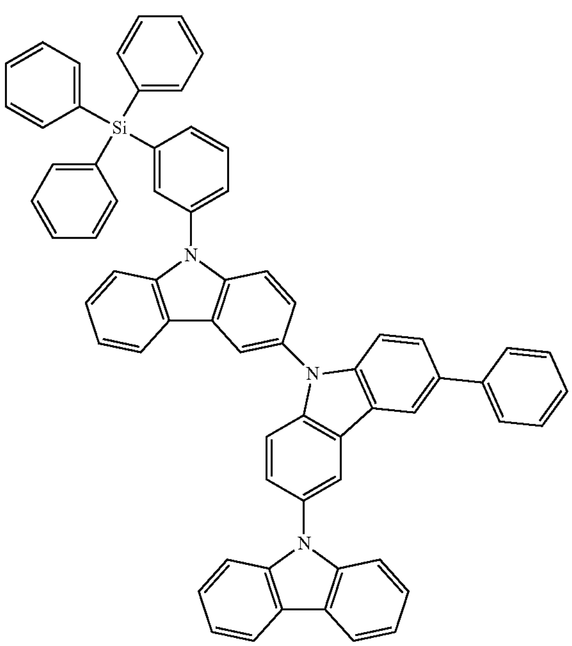
-continued
680
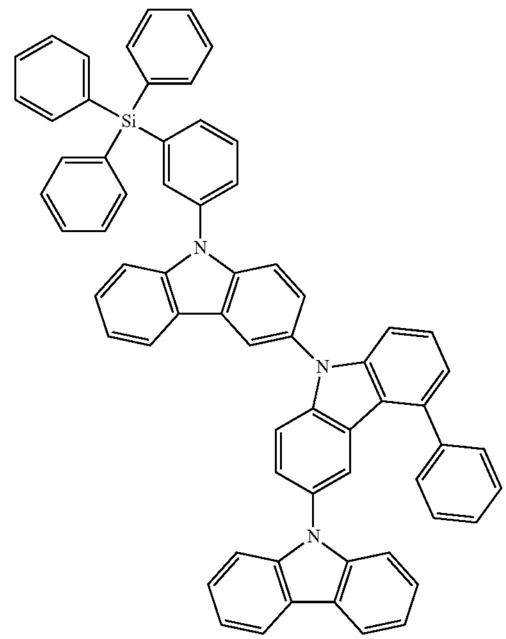
681
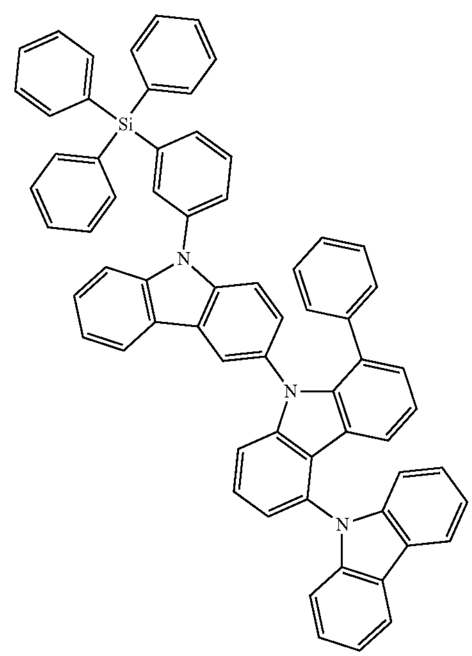

-continued
682
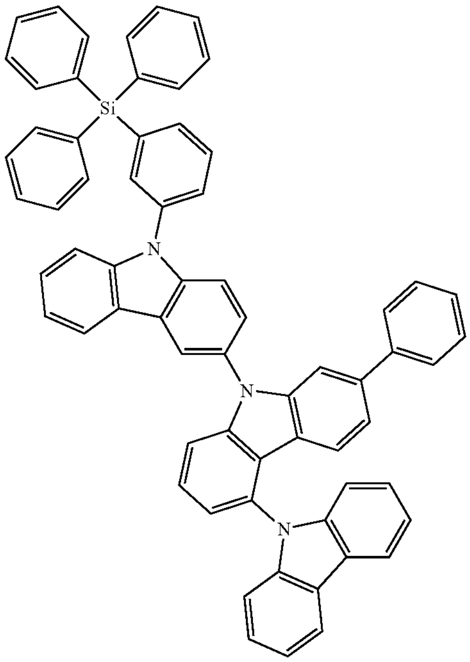
683
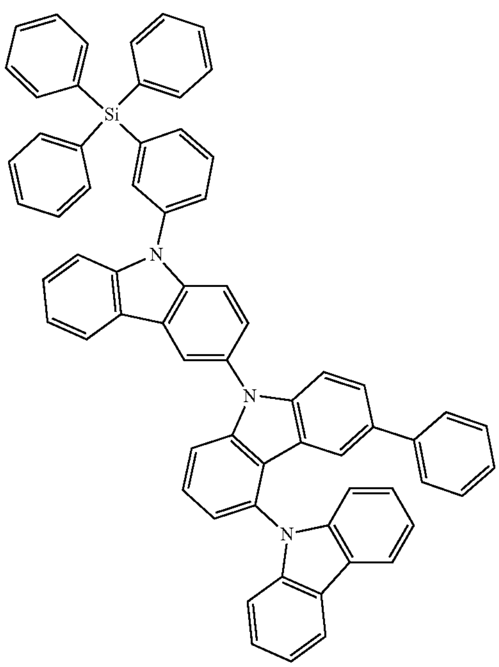
-continued
684
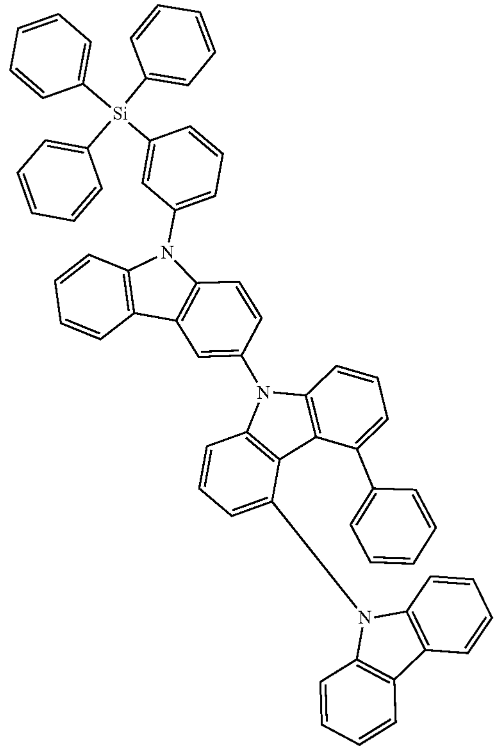
685
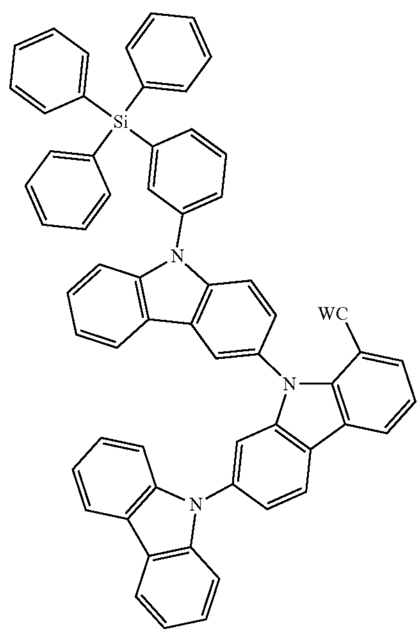

-continued
686
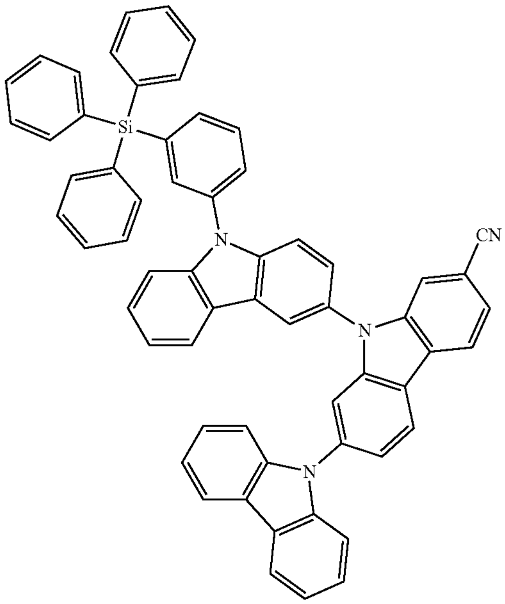
687
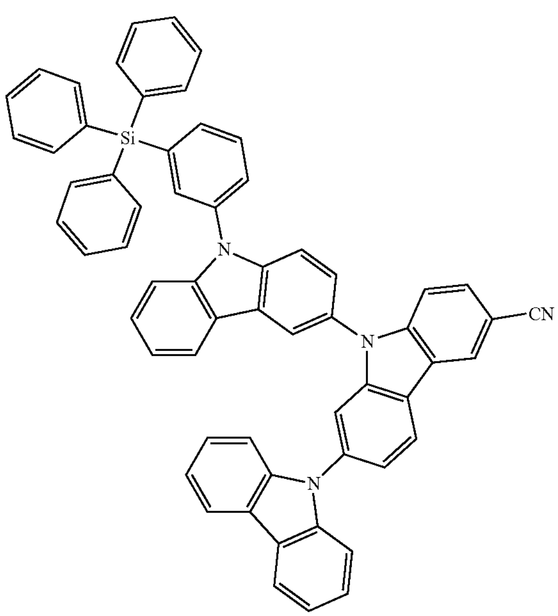
-continued
688
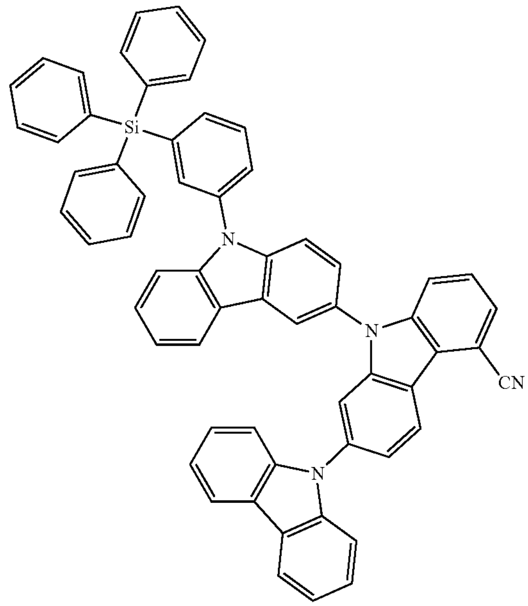
689
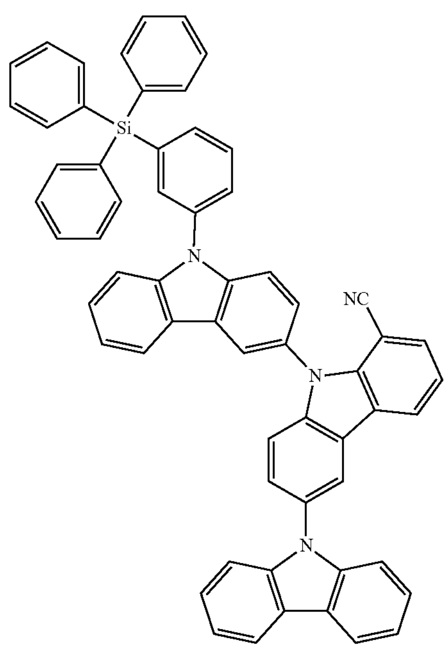

-continued
690
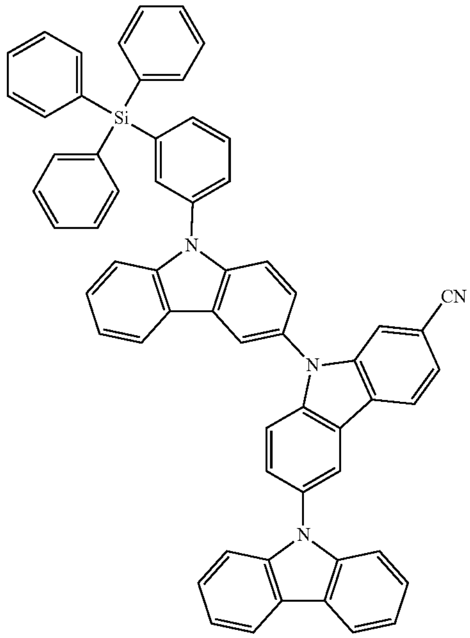
692
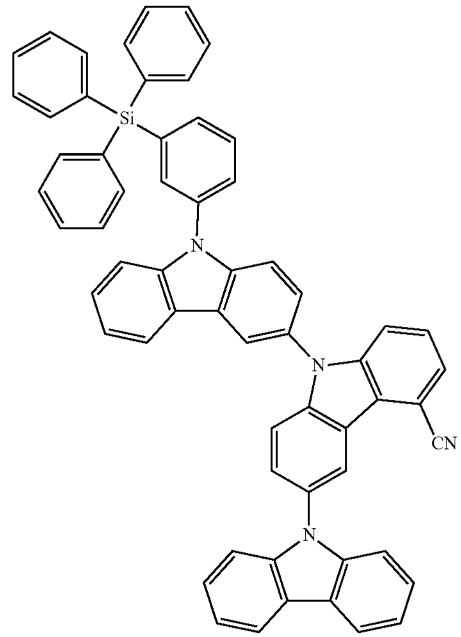
691
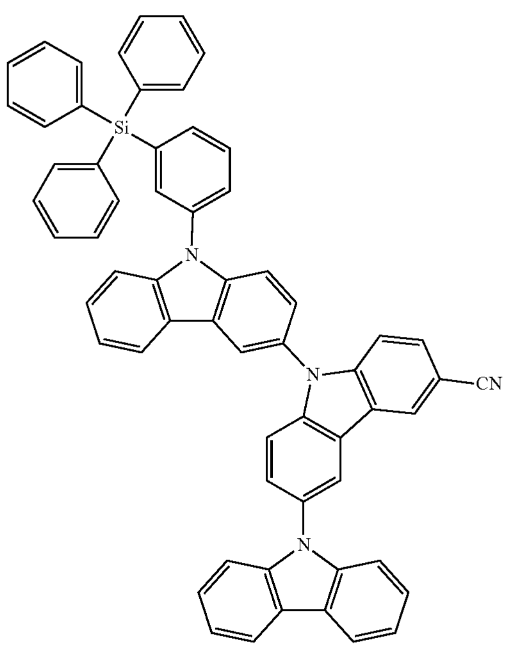
693
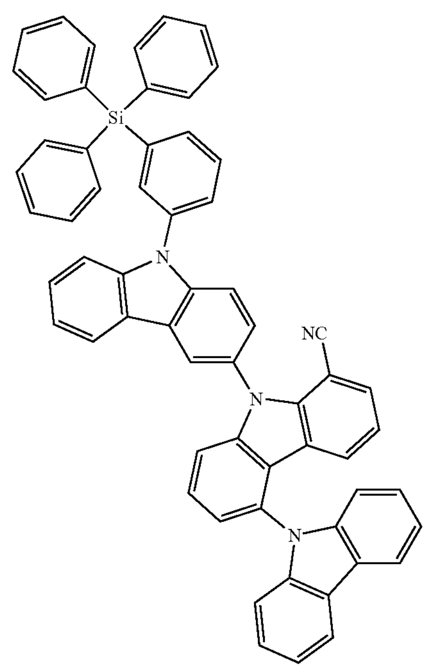

-continued
694
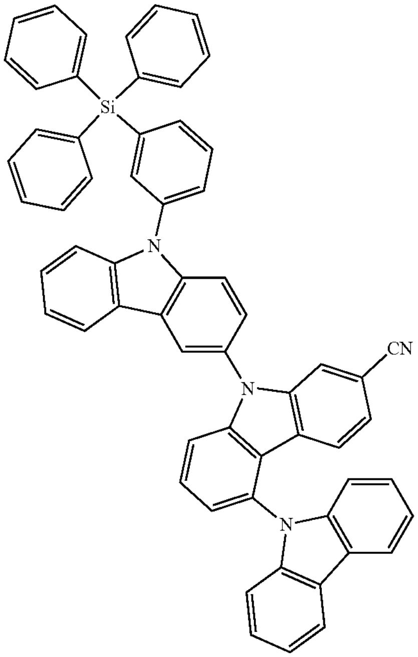
695
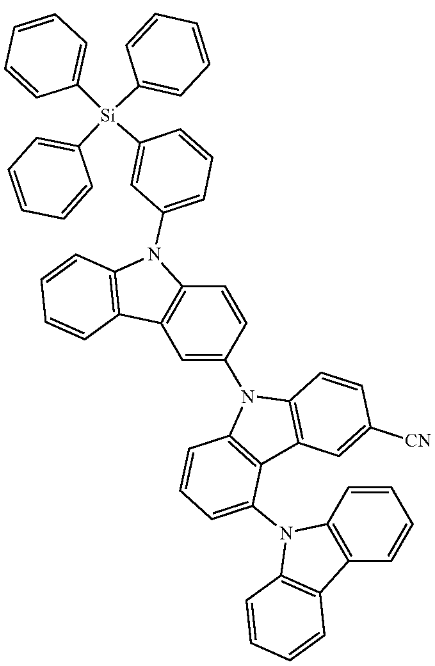
-continued
696
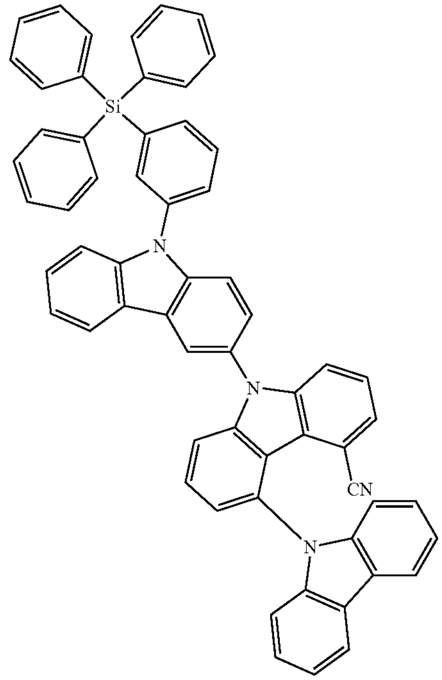
697
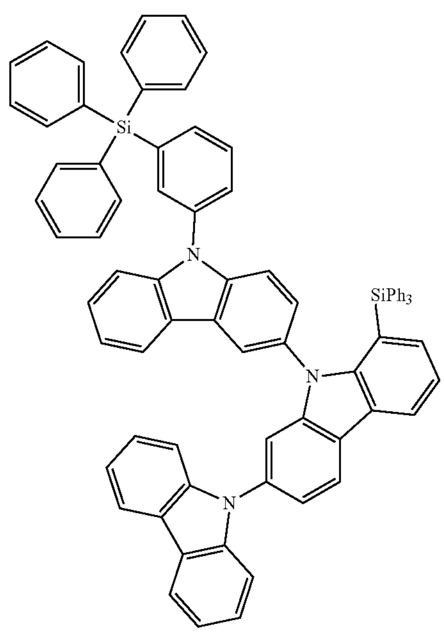

-continued
698
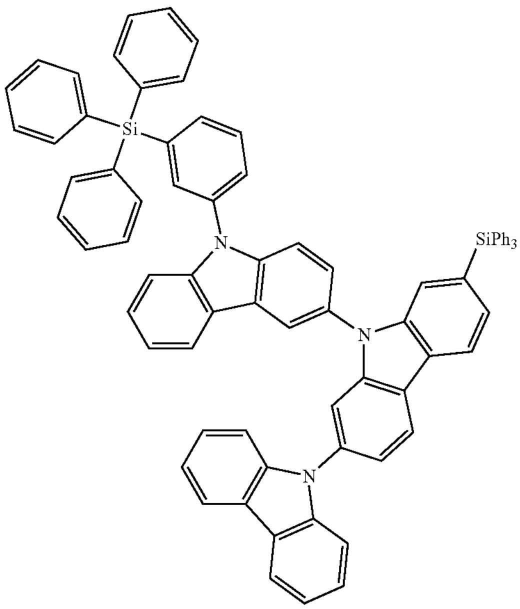
699
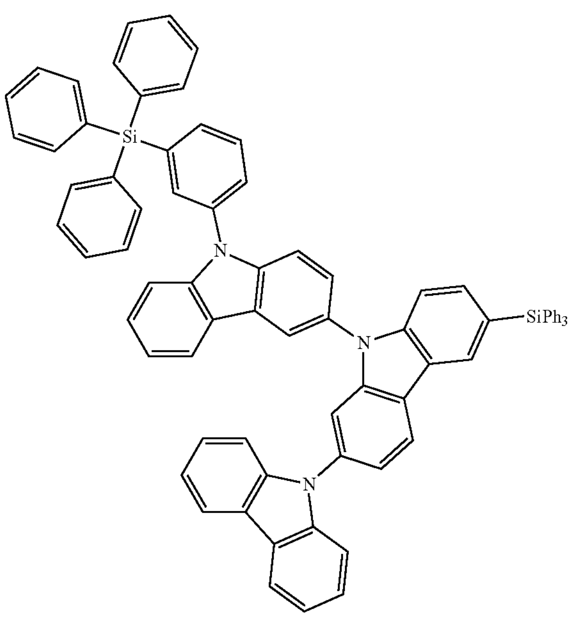
-continued
700
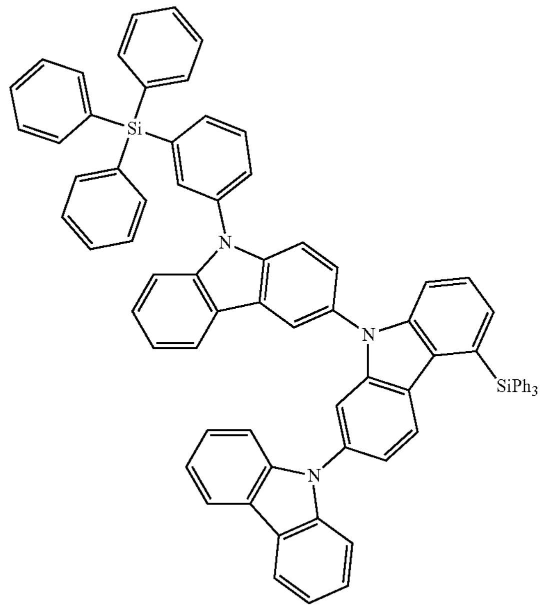
701
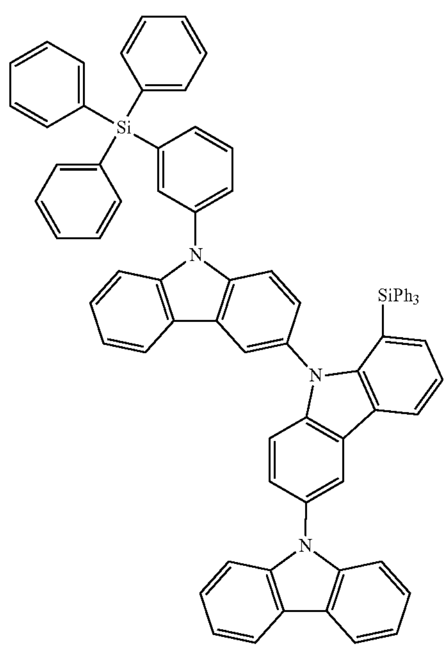

-continued
702
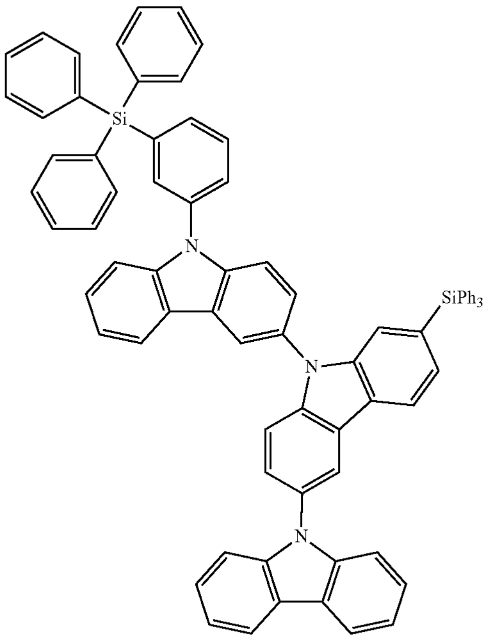
704
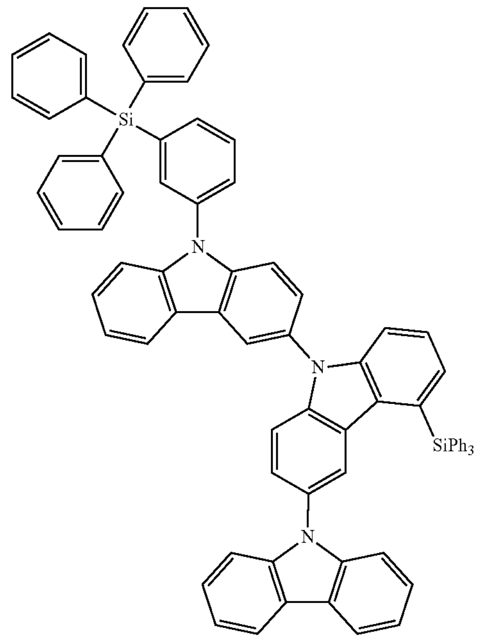
703
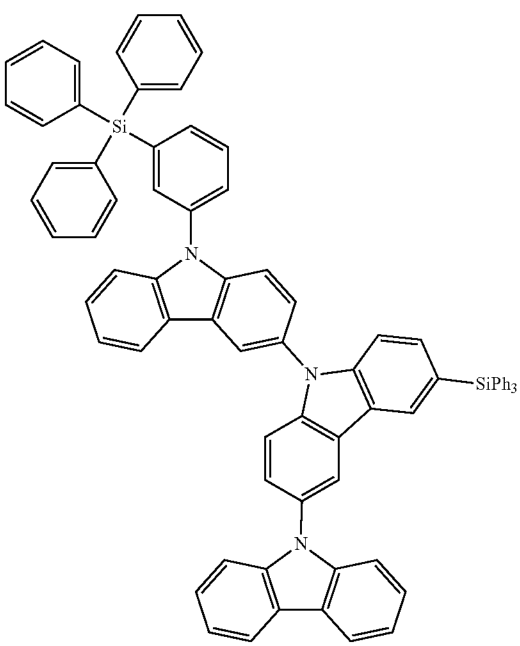
705
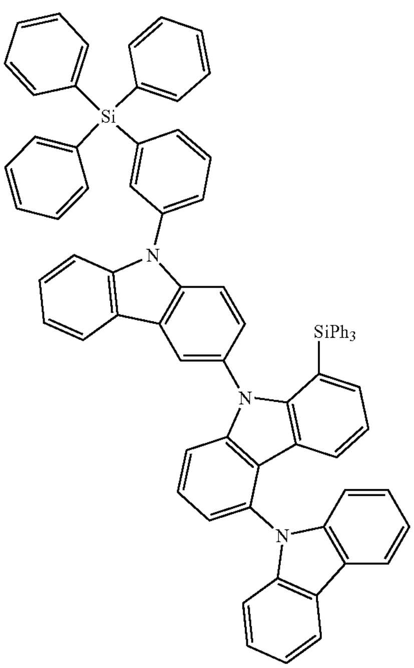

-continued
706
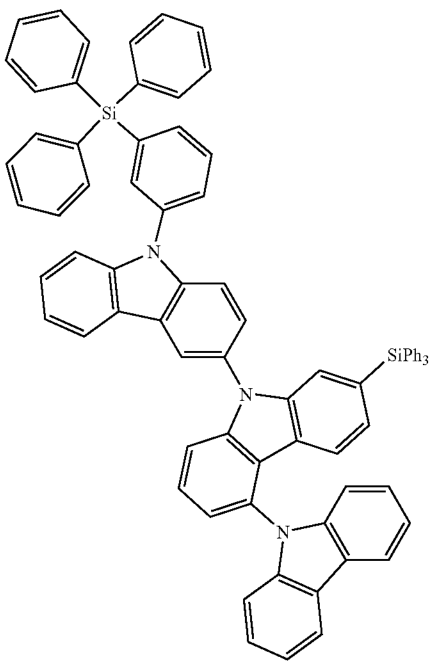
707
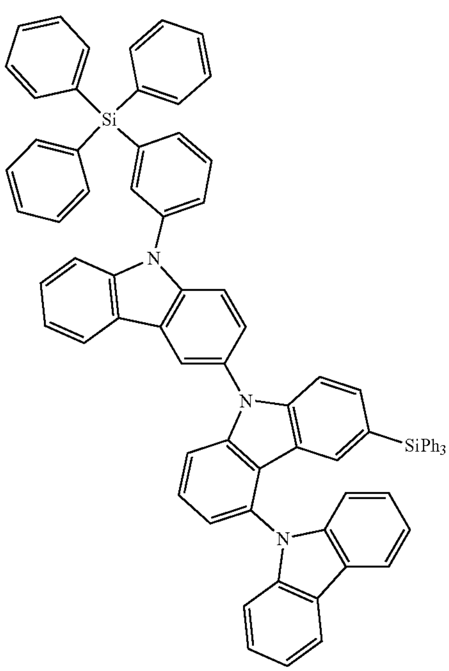
-continued
708
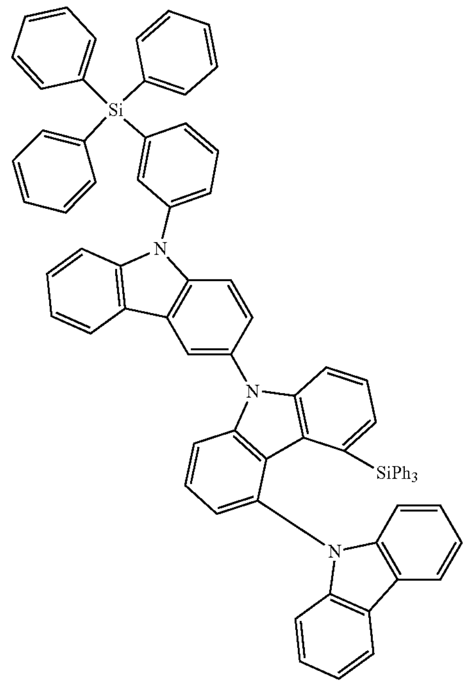
709
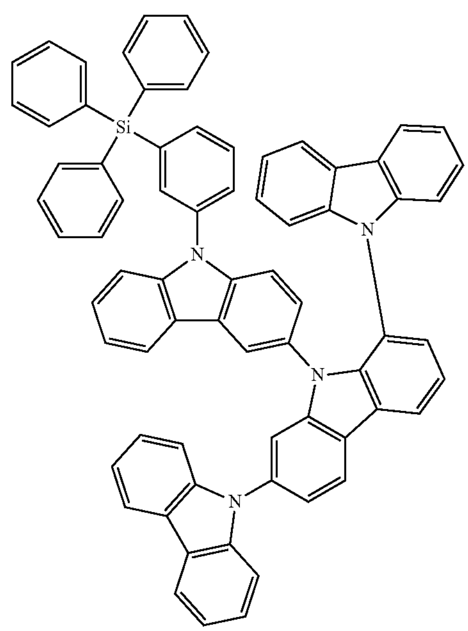

-continued
710
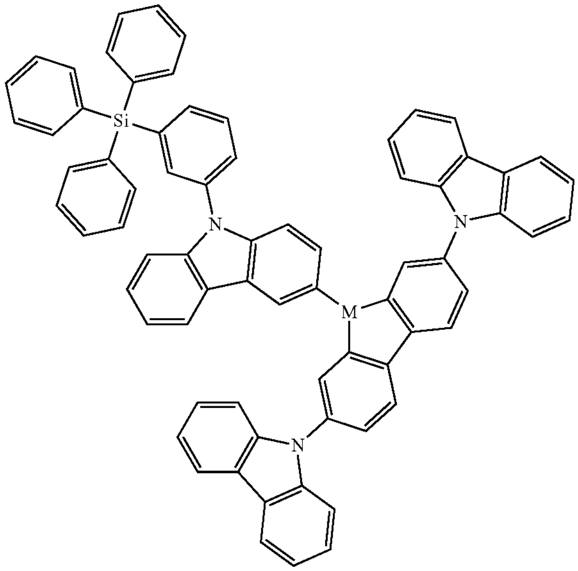
711
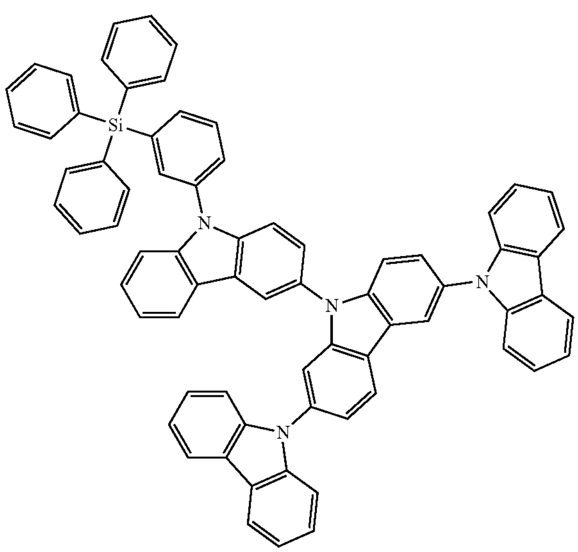
-continued
712
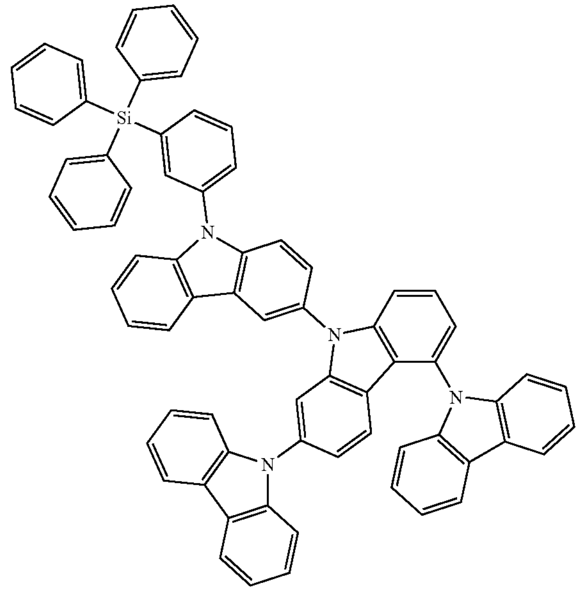
713
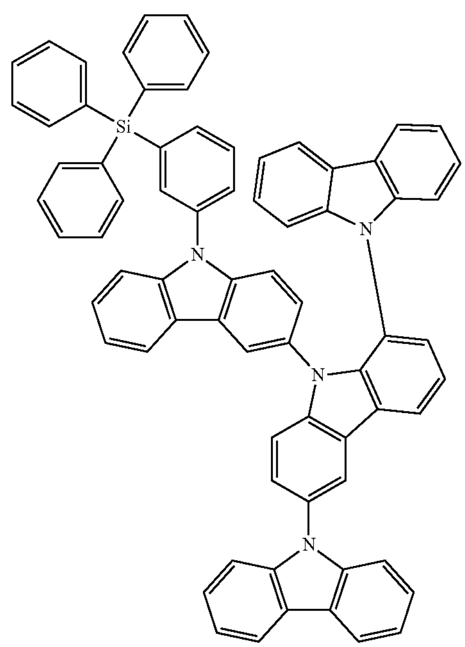

-continued
714
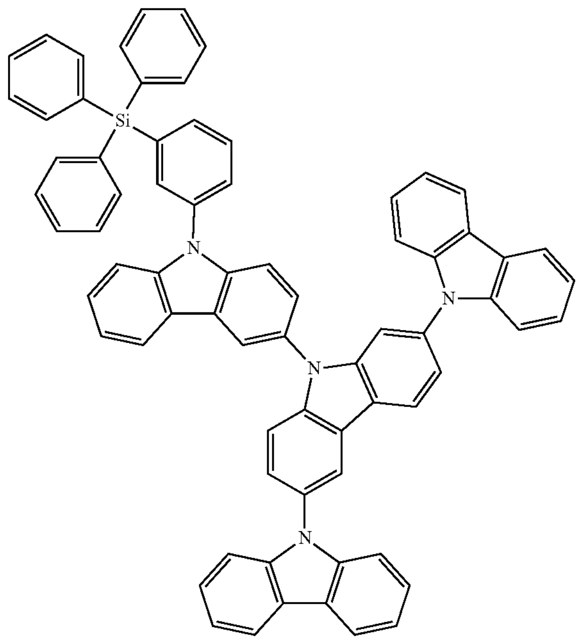
716
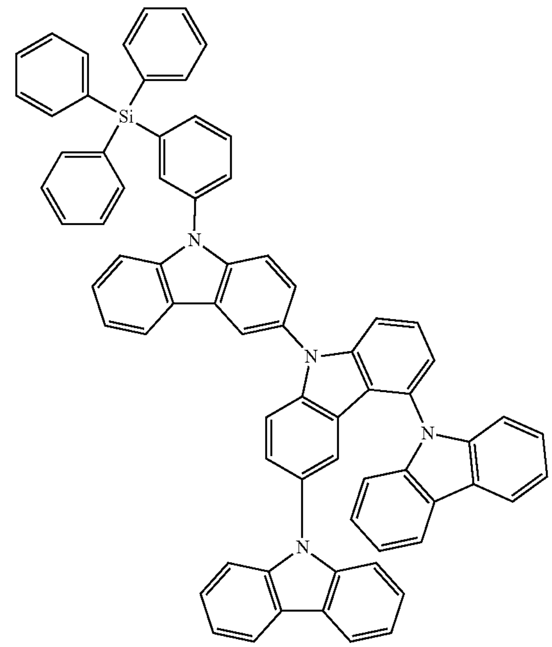
715
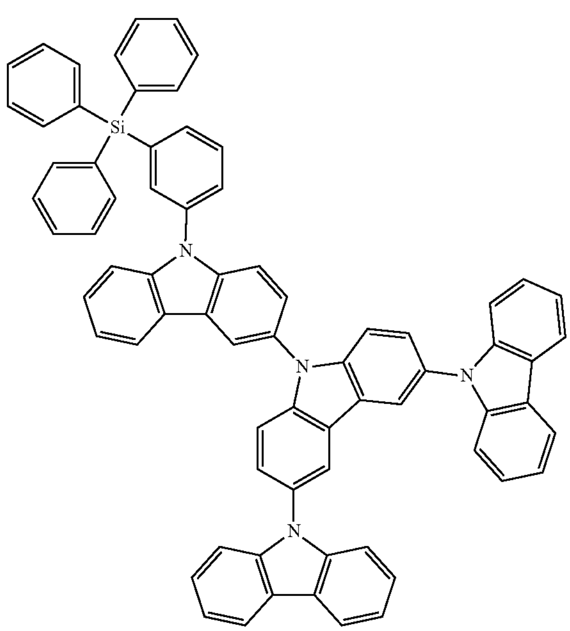
717
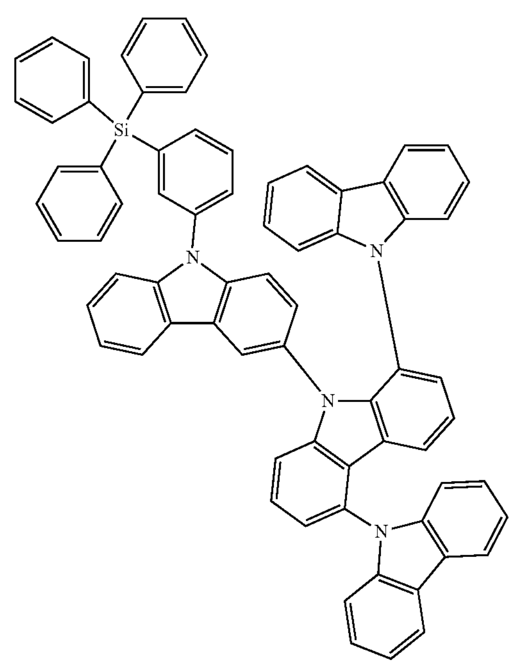

-continued
718
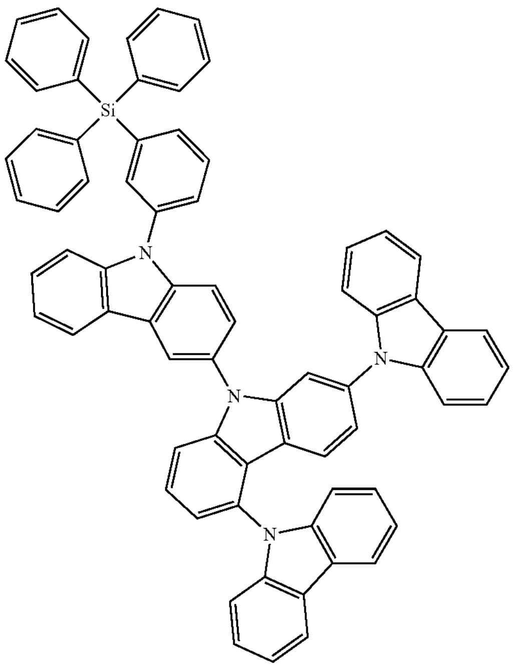
719
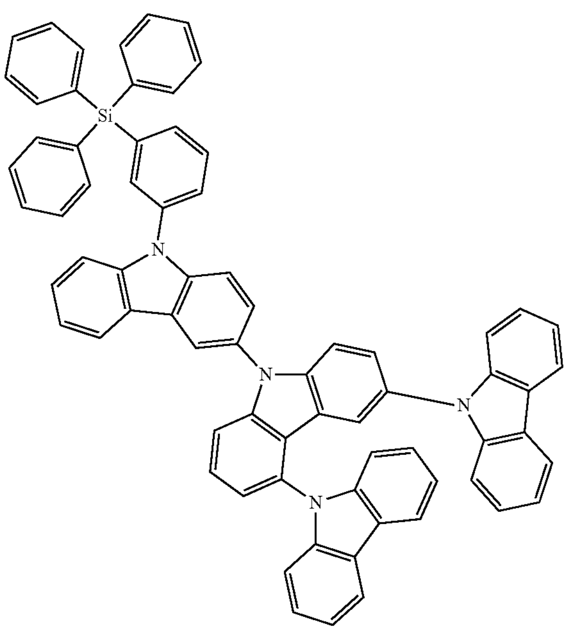
-continued
720
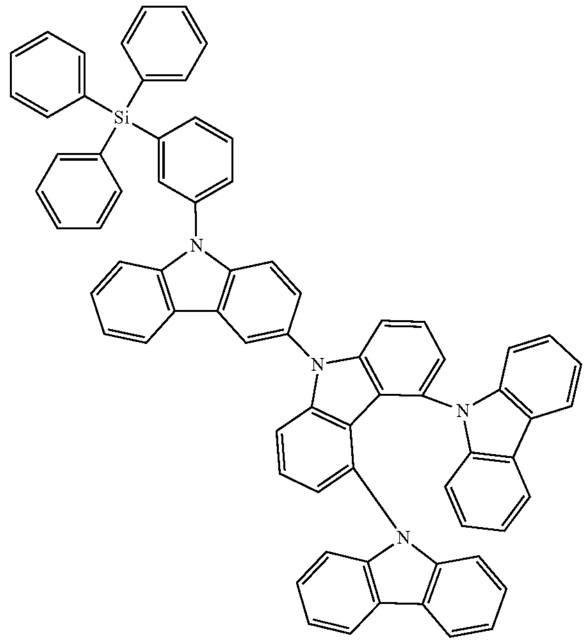
721
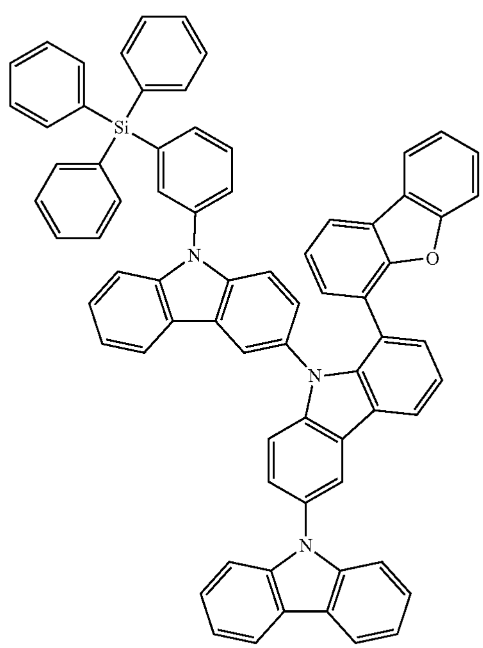

-continued
722
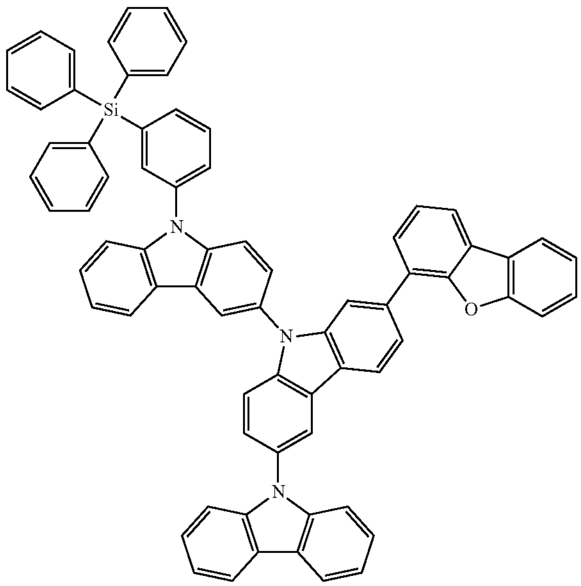
723
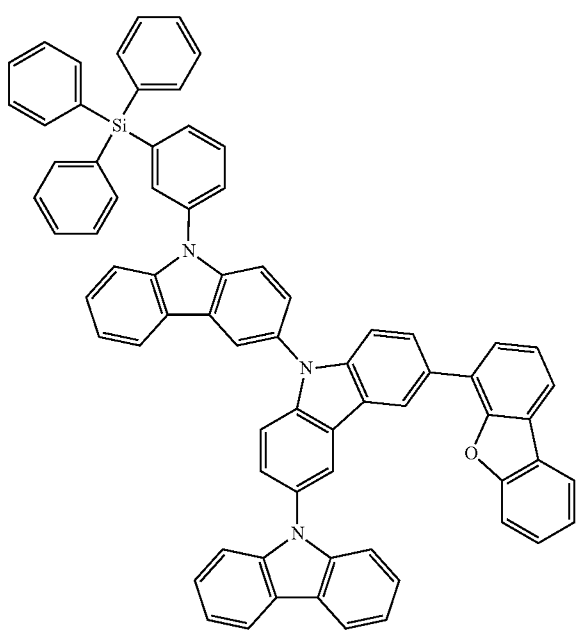
-continued
724
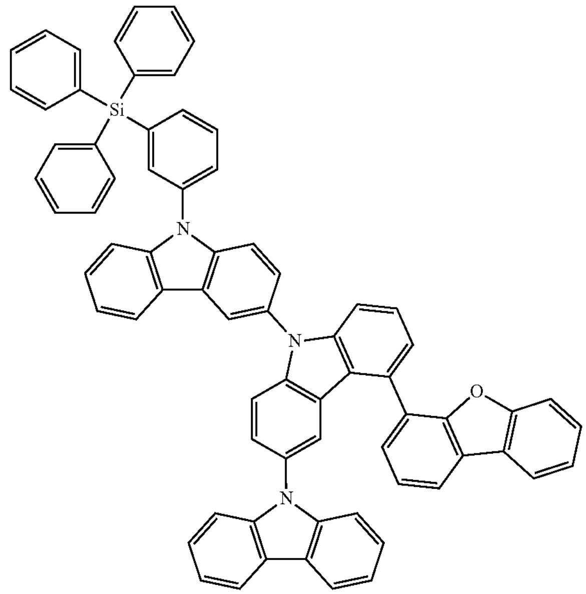
725
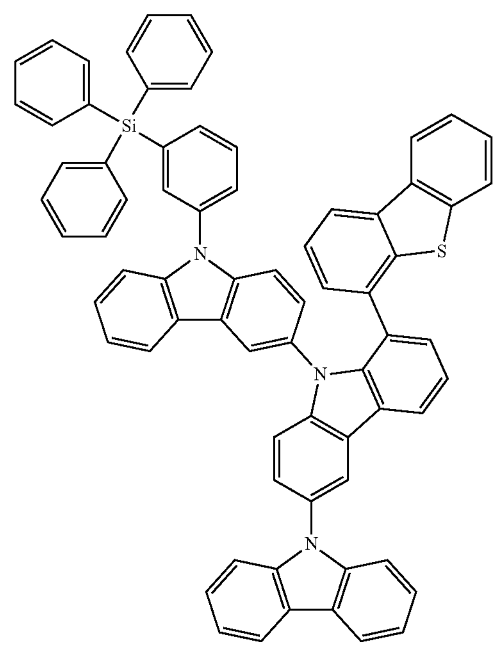

-continued
726
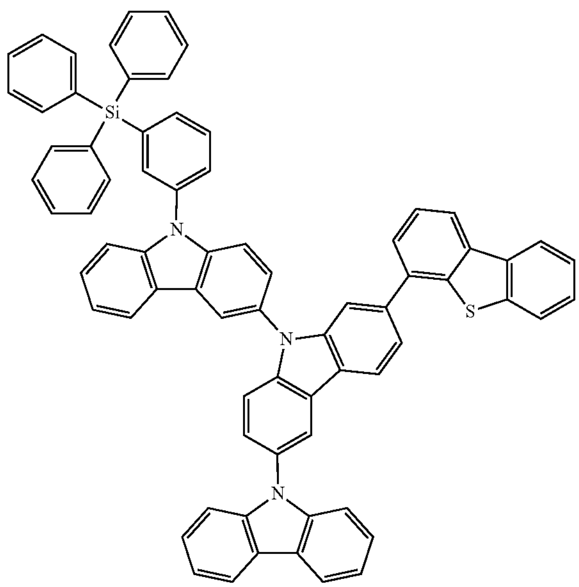
727
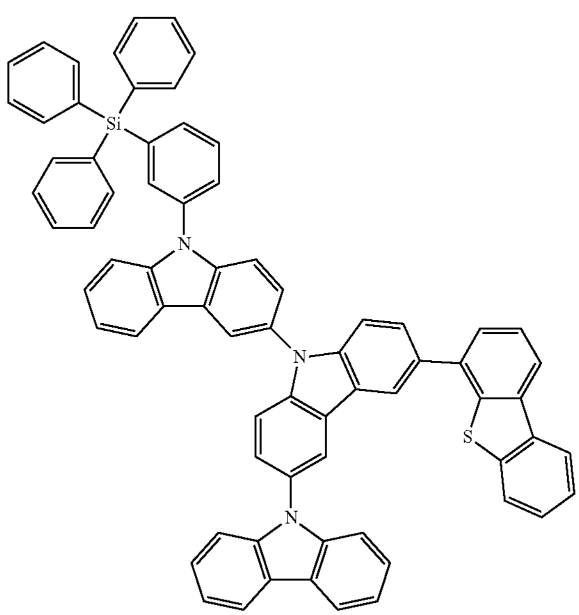
-continued
728
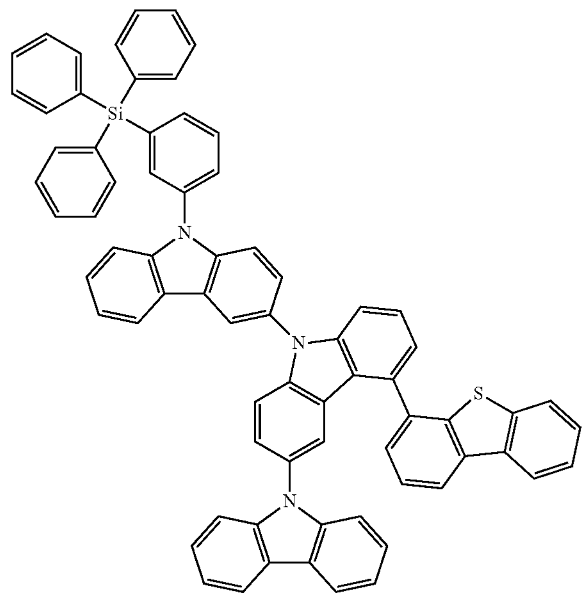
729
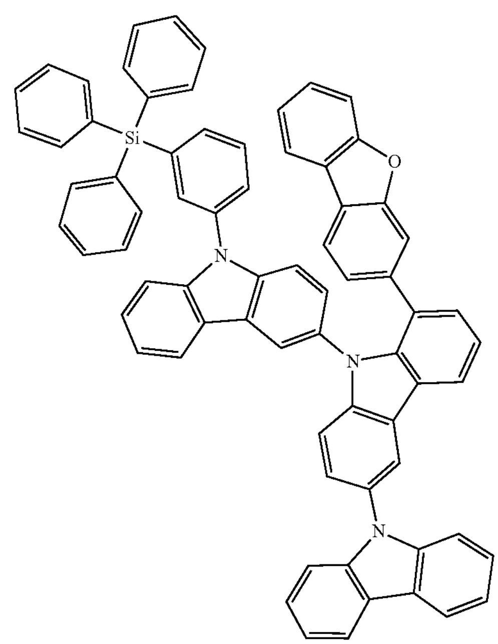

-continued
730
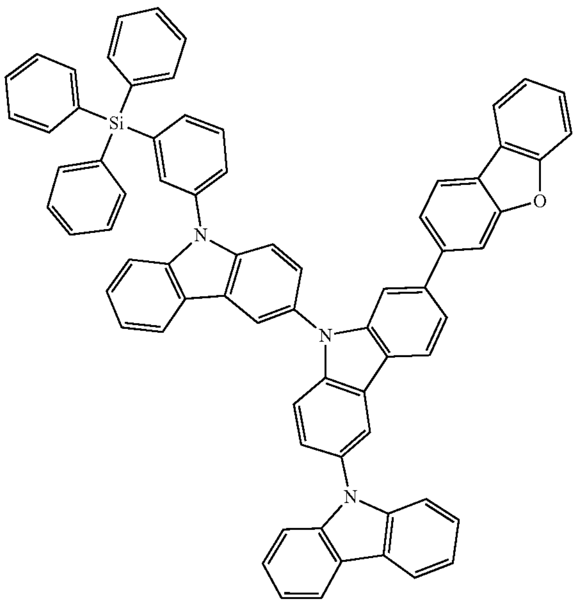
731
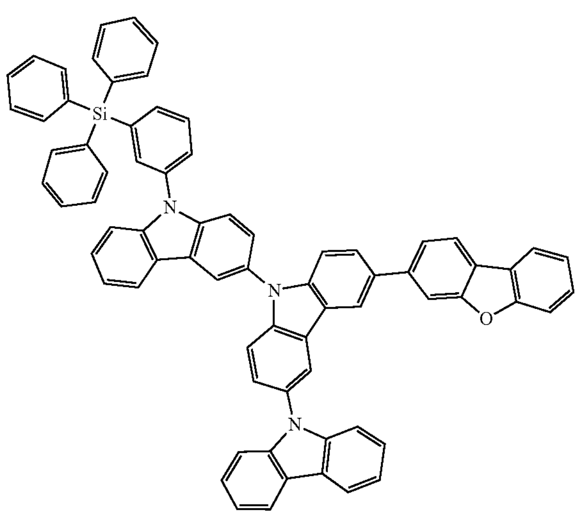
-continued
732
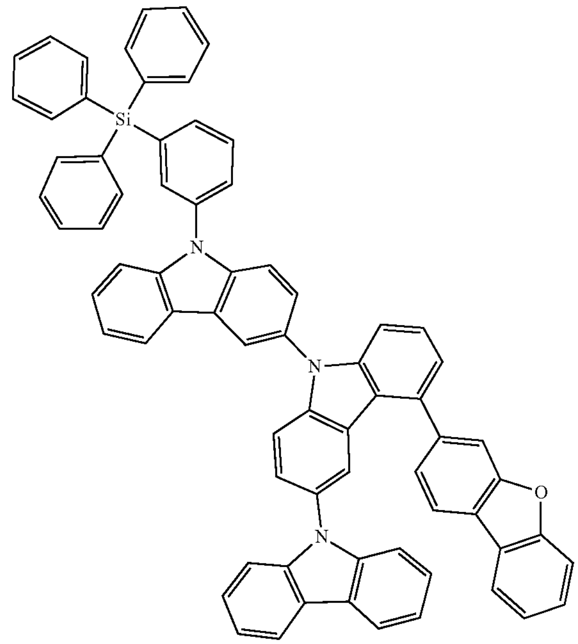
733
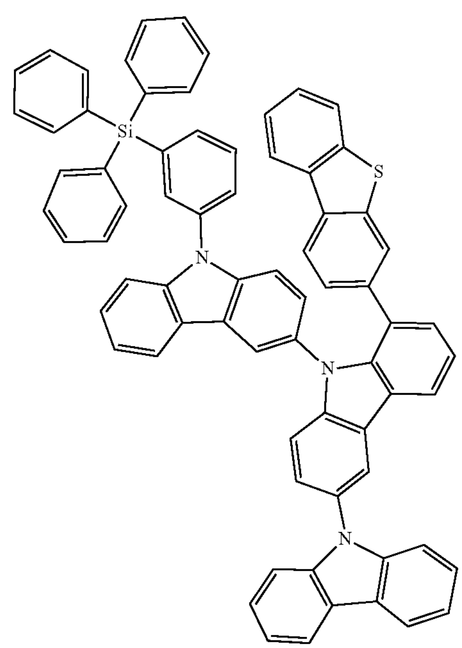

-continued
734
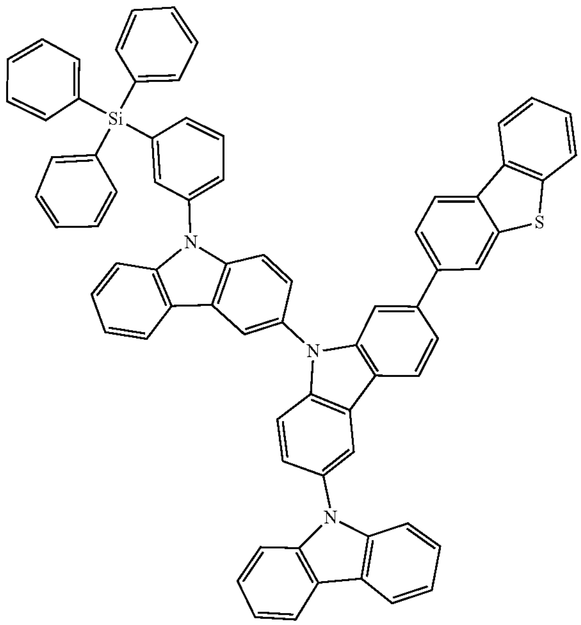
735
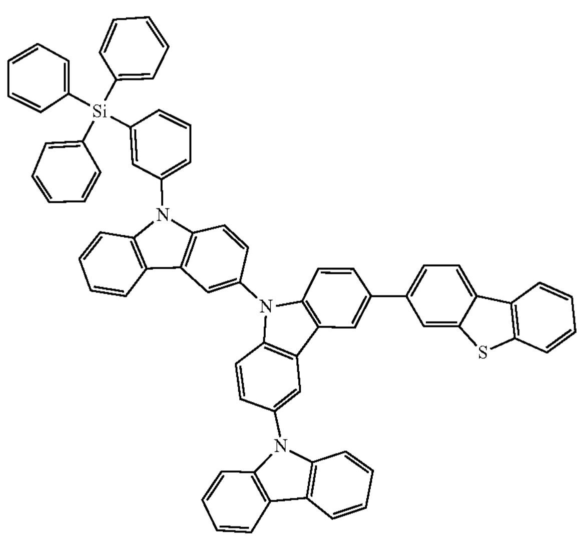
-continued
736
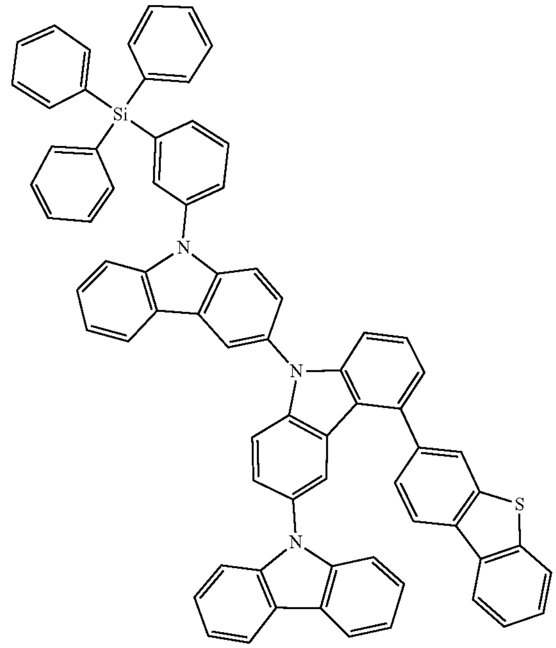
737
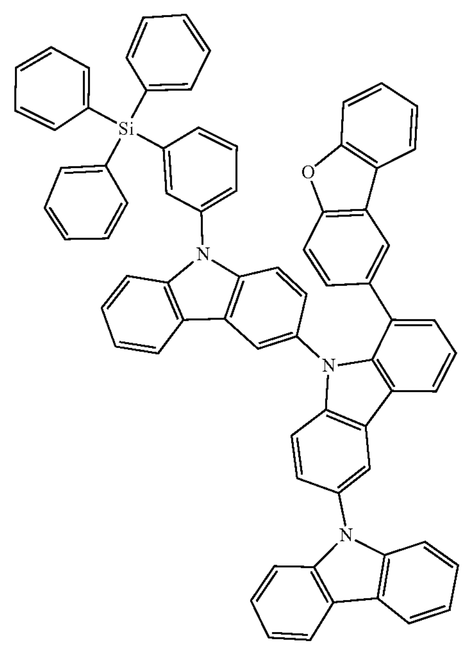

-continued
738
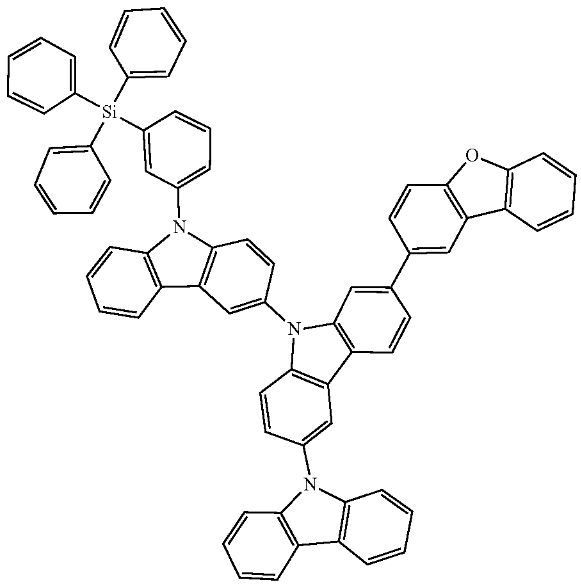
739
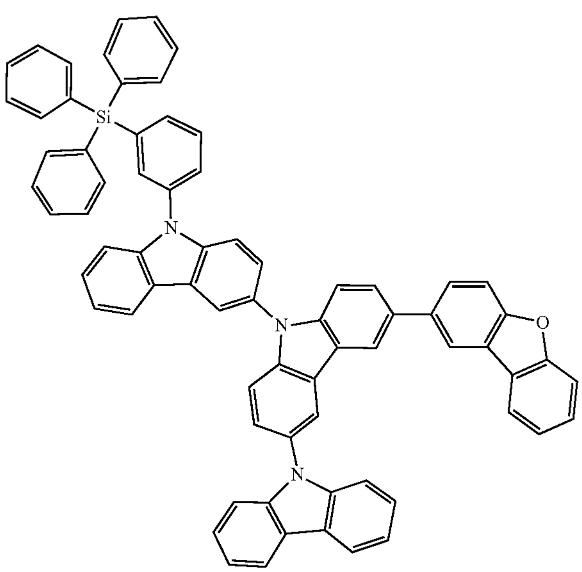
-continued
740
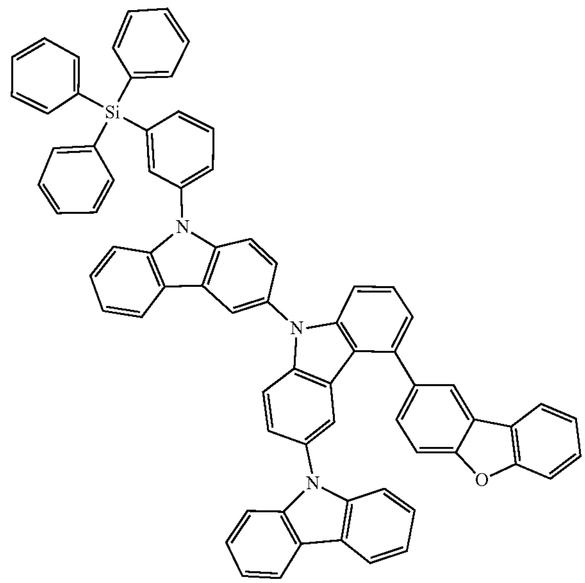
741
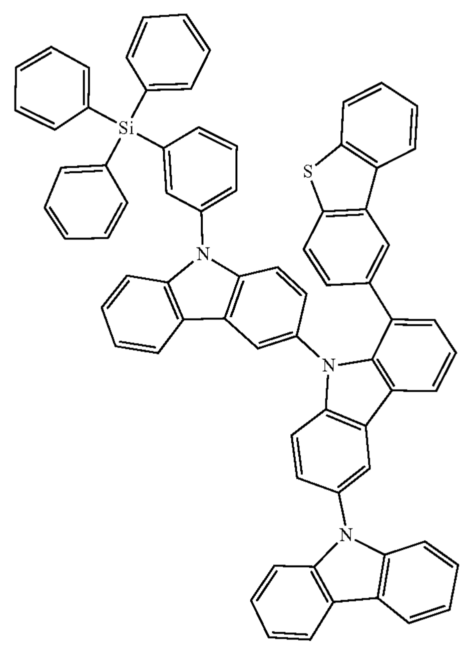

-continued
742
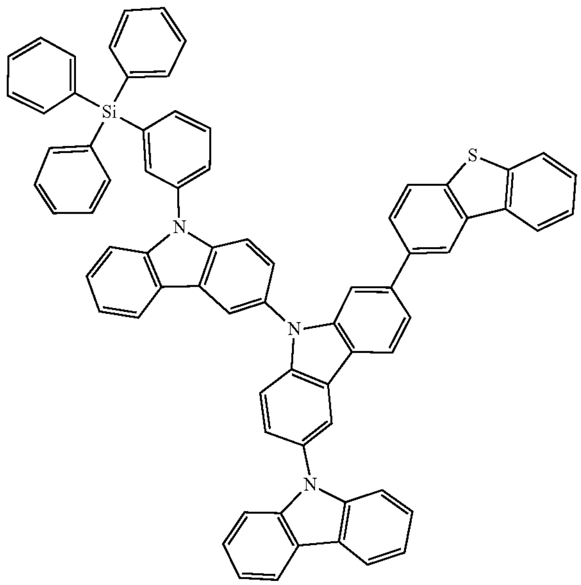
743
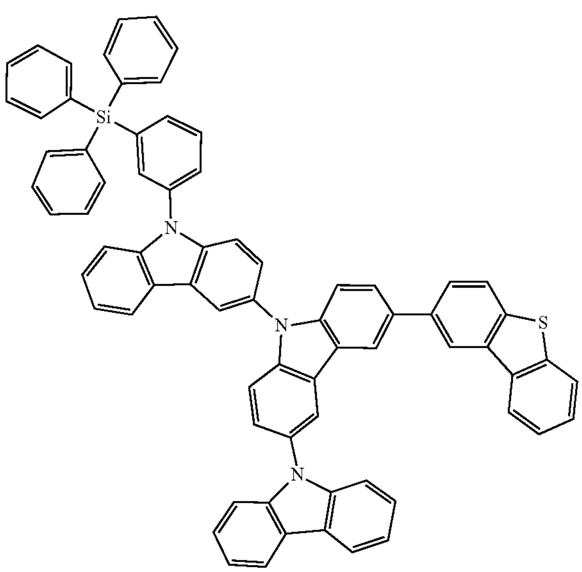
-continued
744
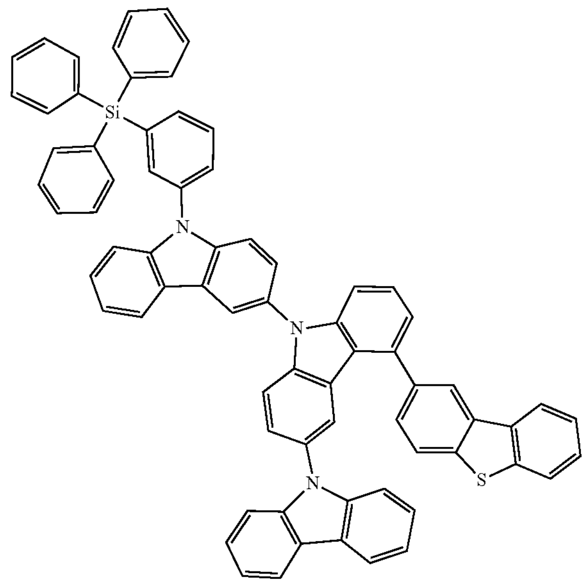
745
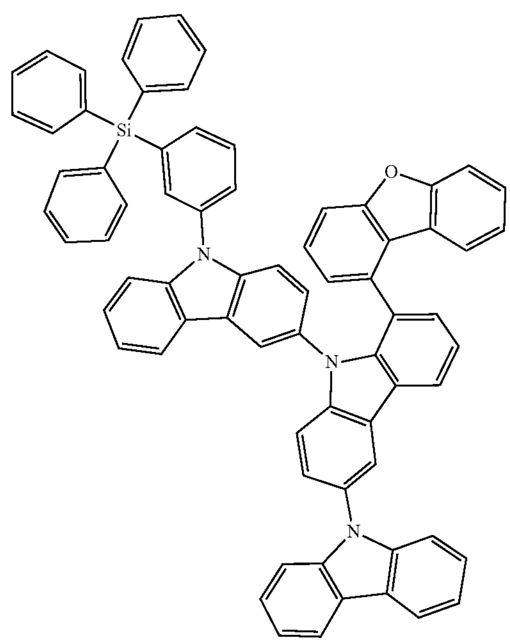

-continued
746
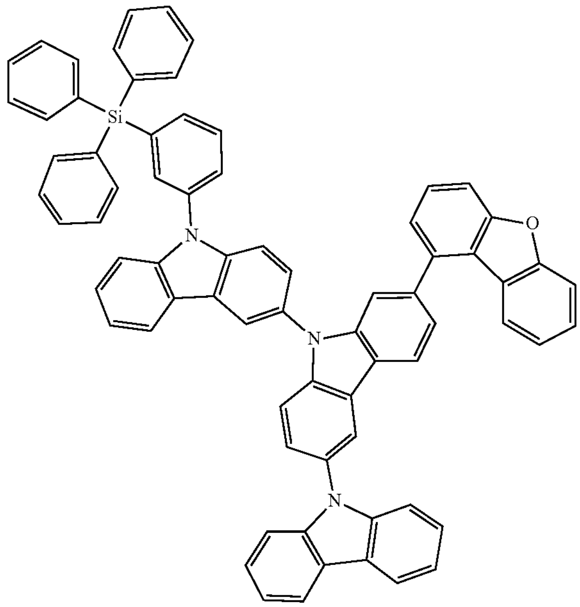
747
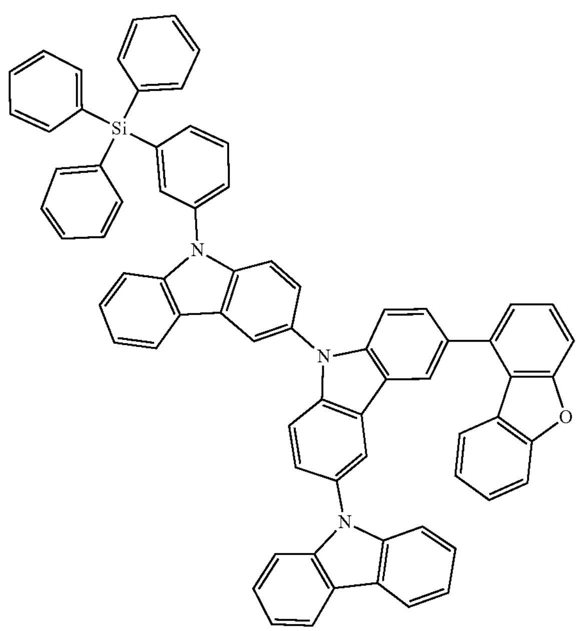
-continued
748
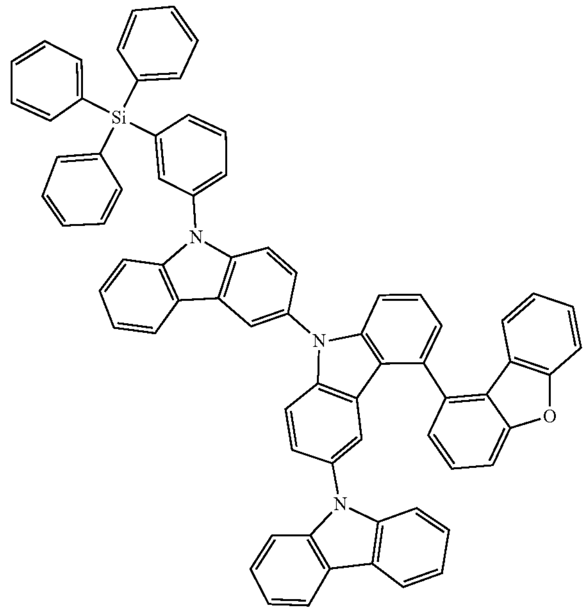
749
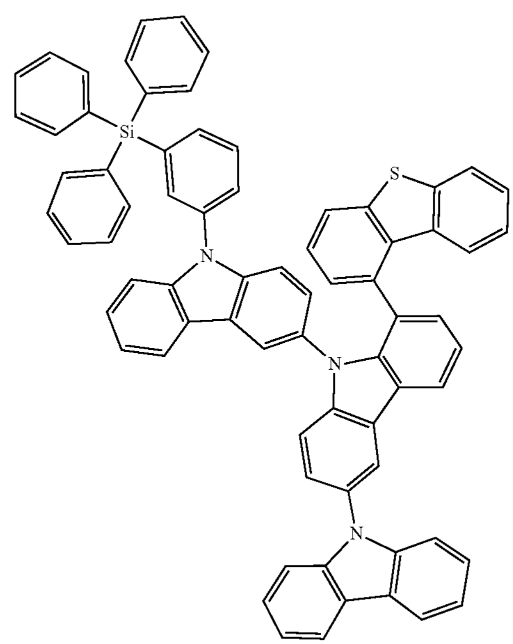

-continued
750
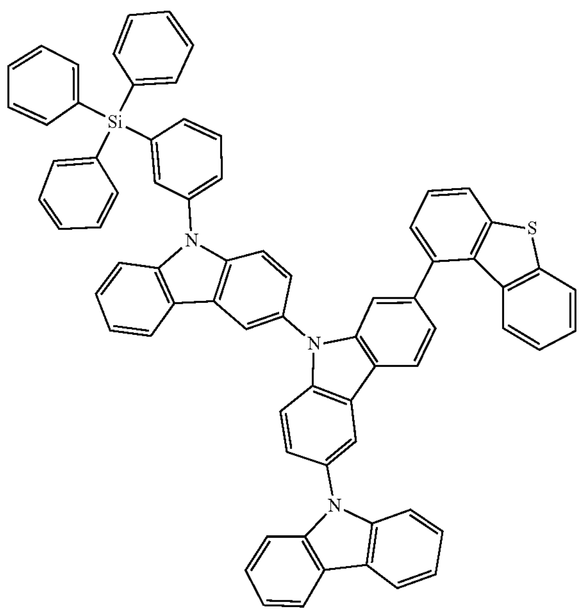
751
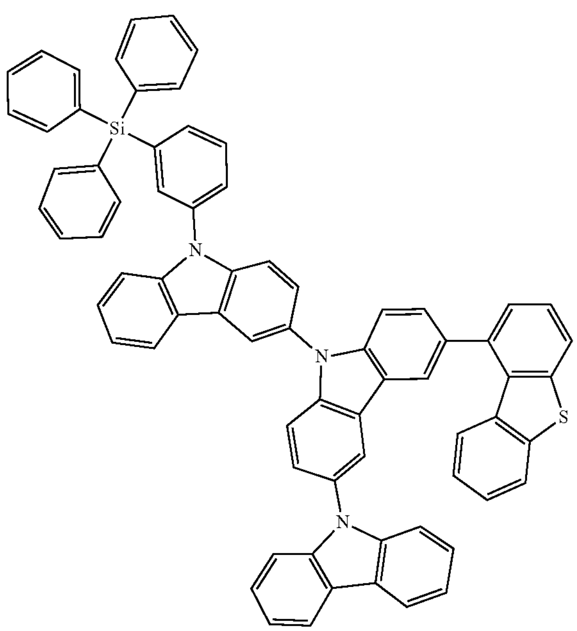
-continued
752
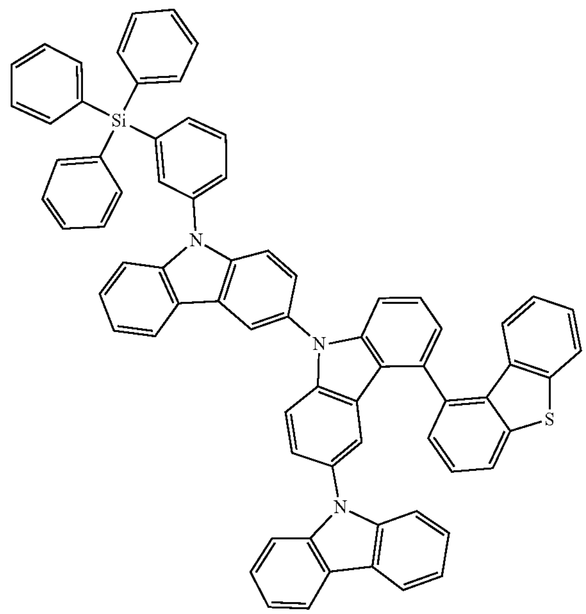
753
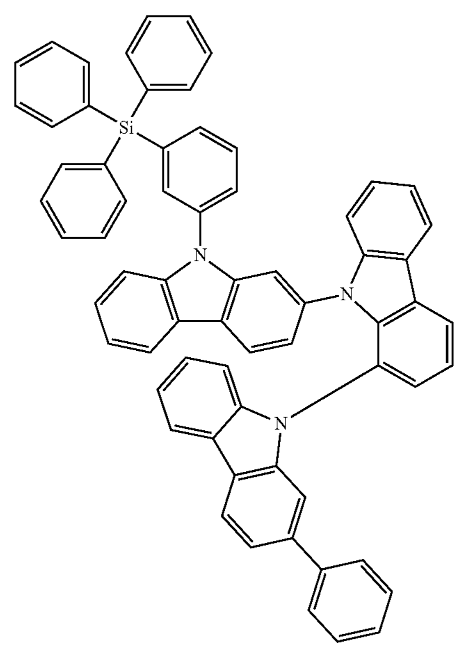

-continued
754
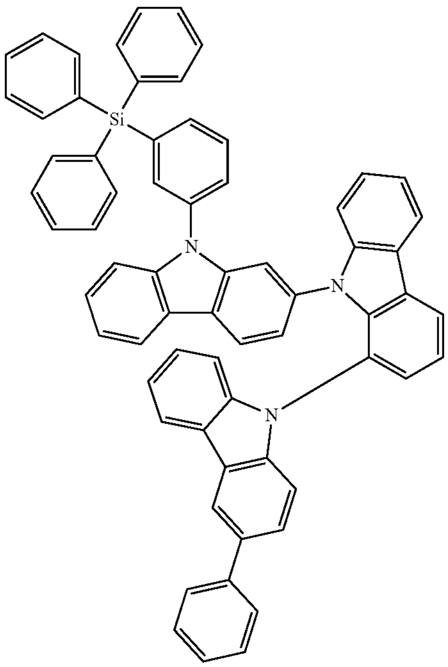
755
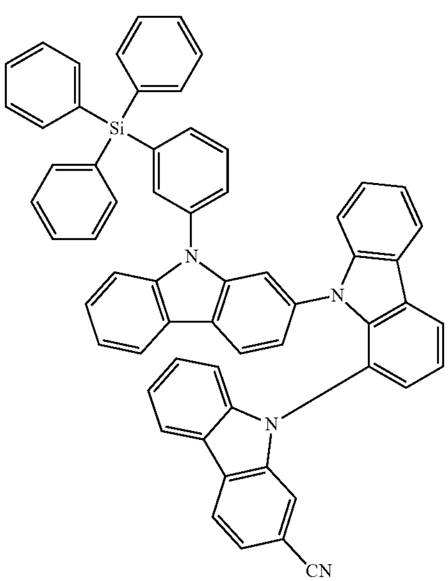
-continued
756
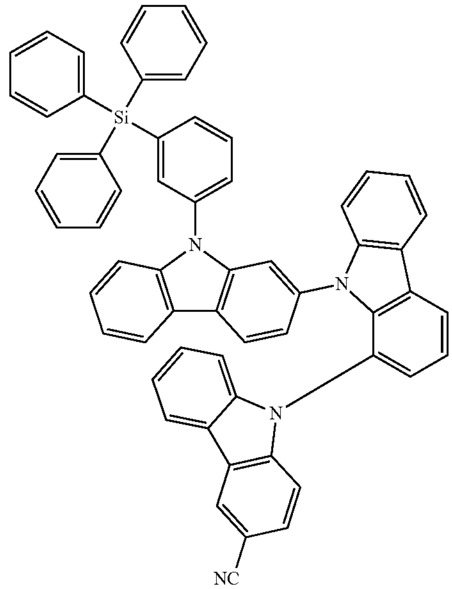
757
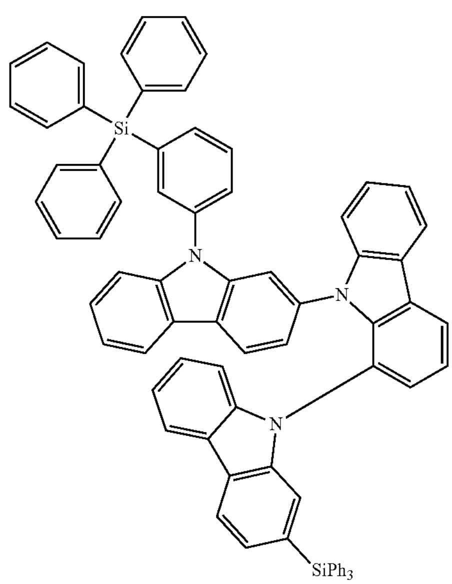

-continued
758
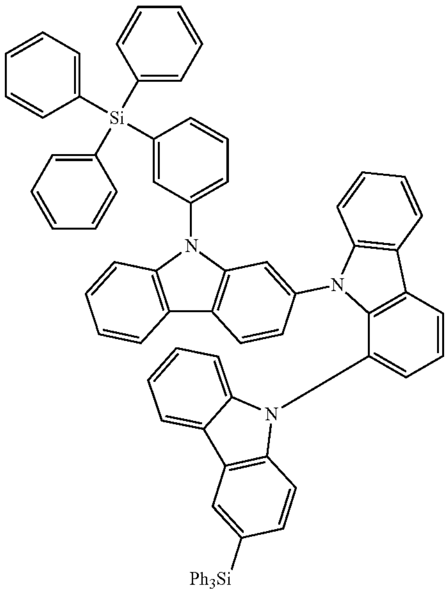
759
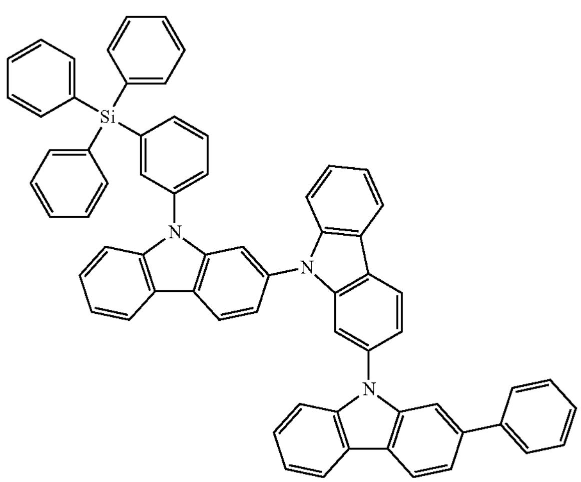
-continued
760
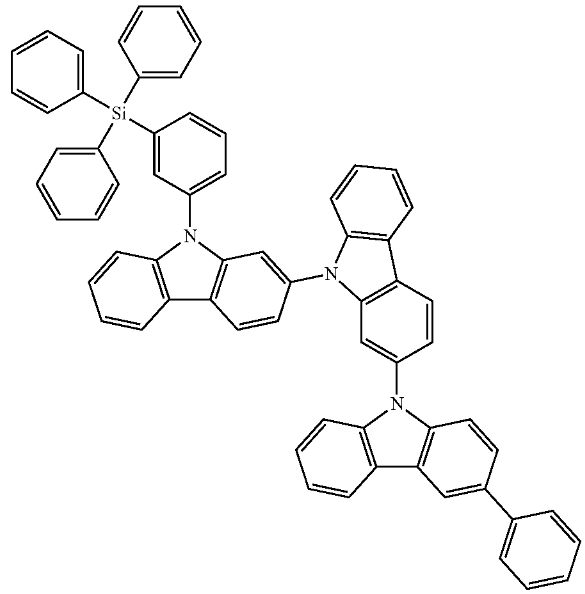
761
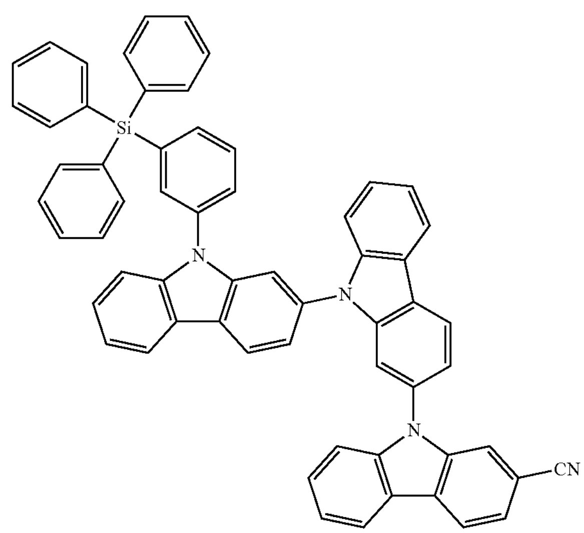

-continued
762
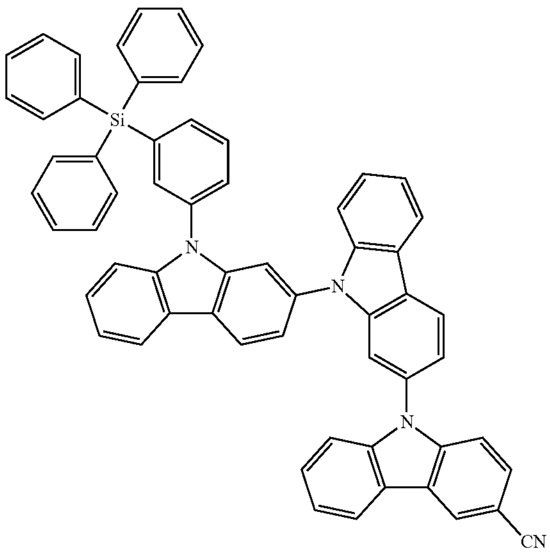
763
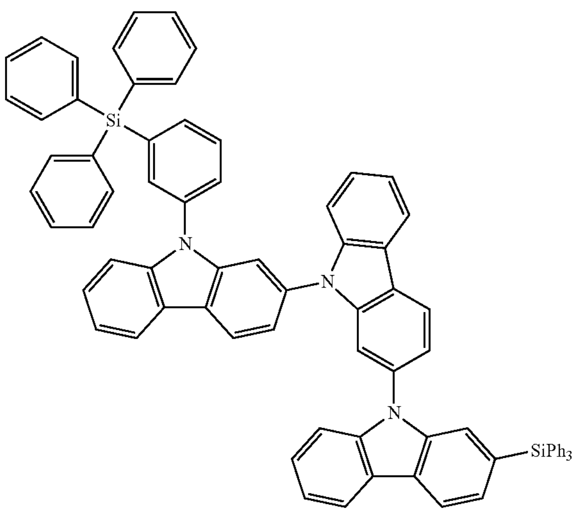
764
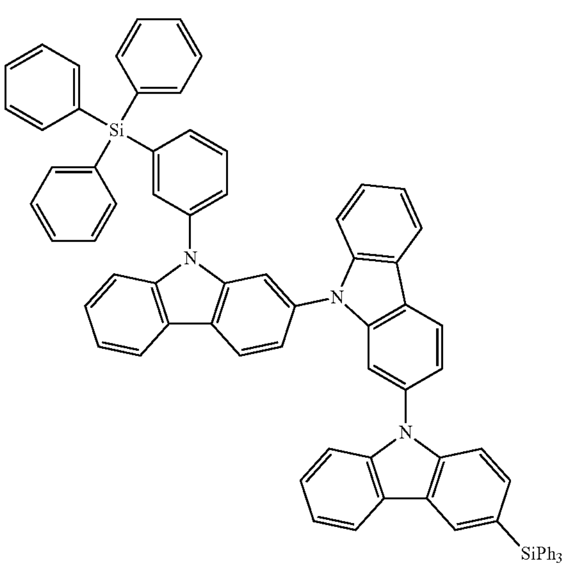
-continued
765
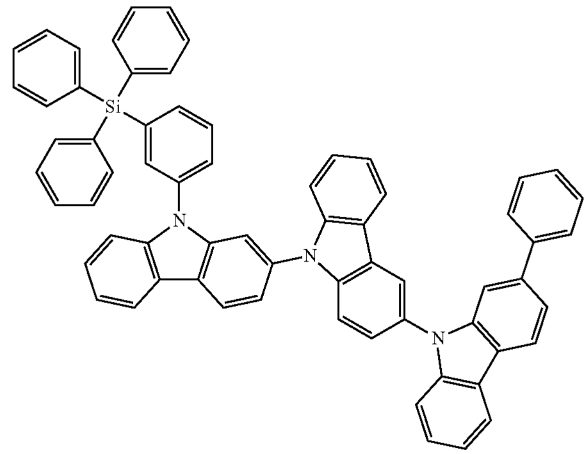
766
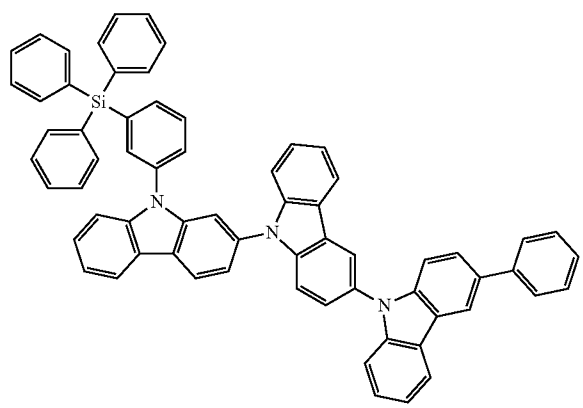
767
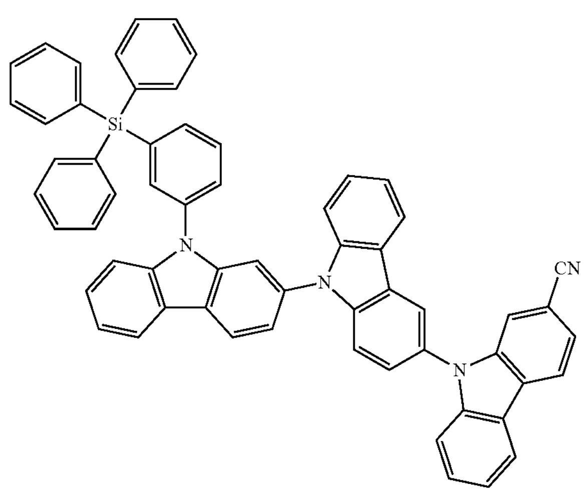

768
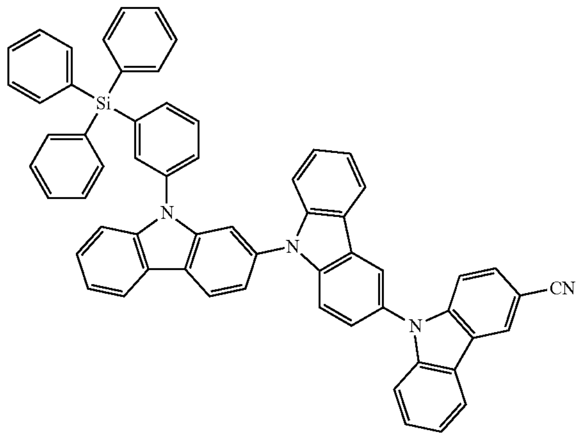
769
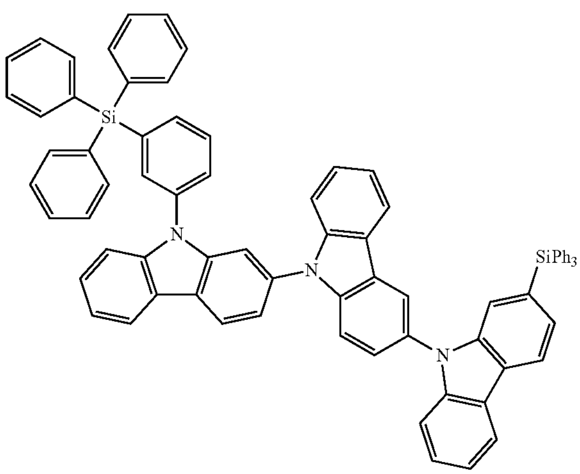
770
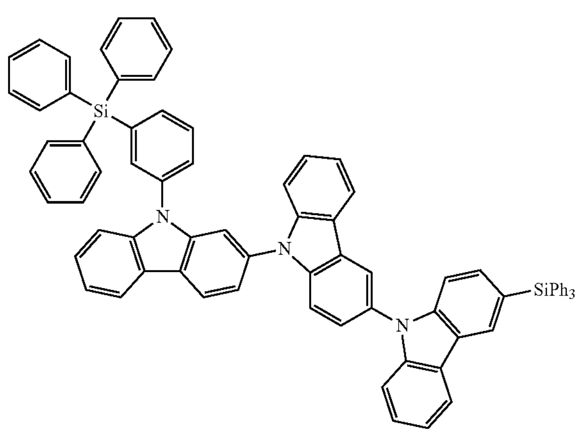
771
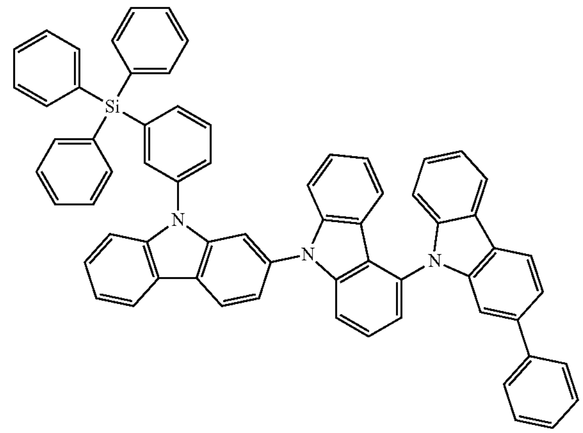
772
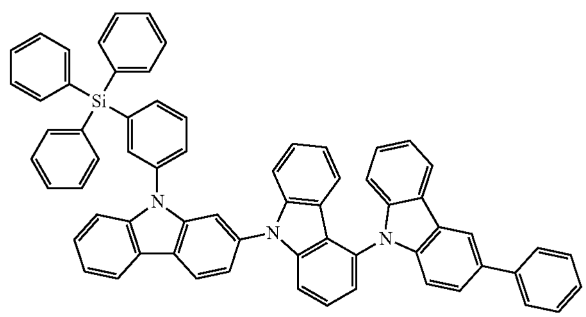
773
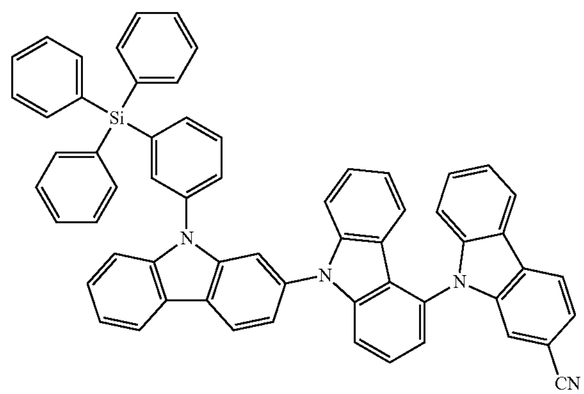
774
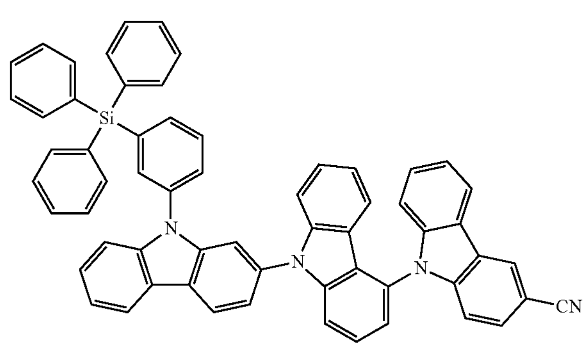

-continued
775
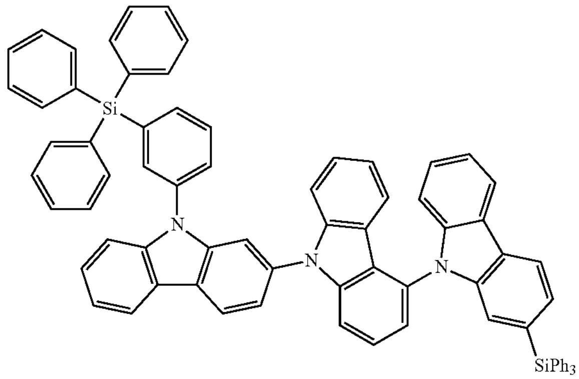
776
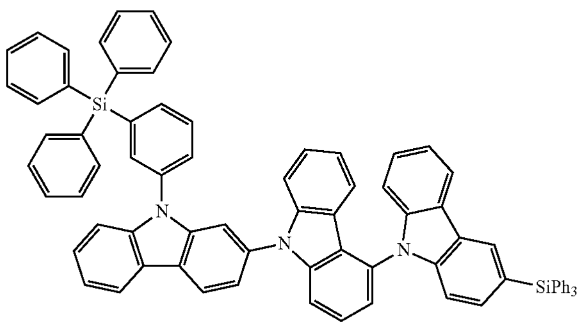
777
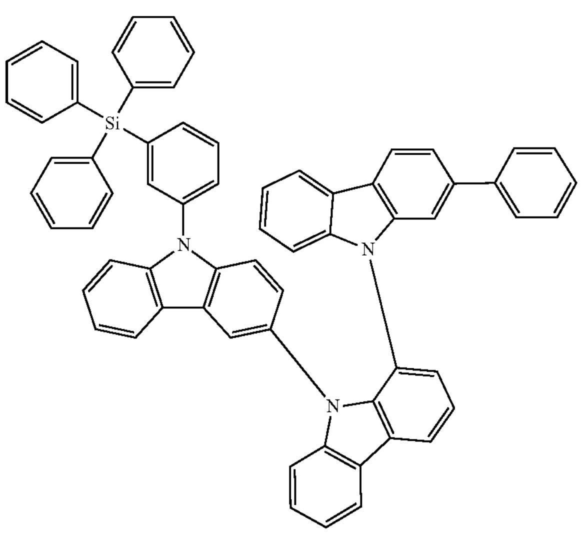
-continued
778
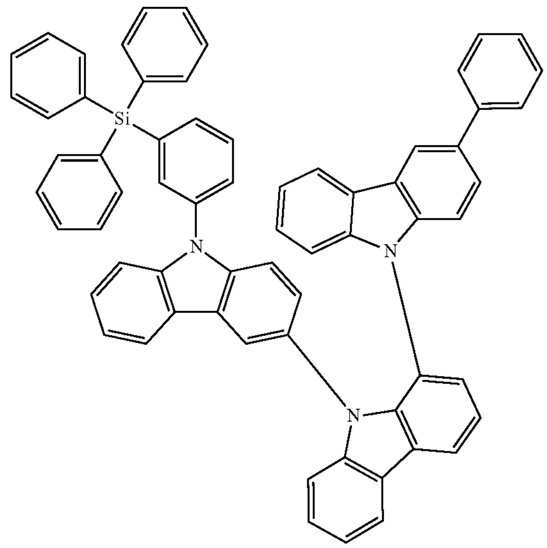
779
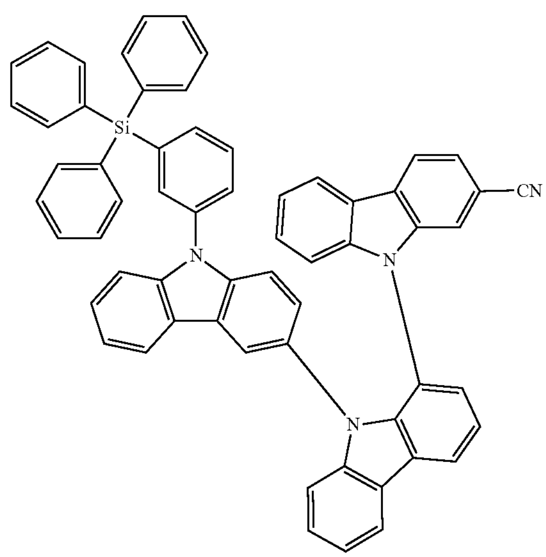

780
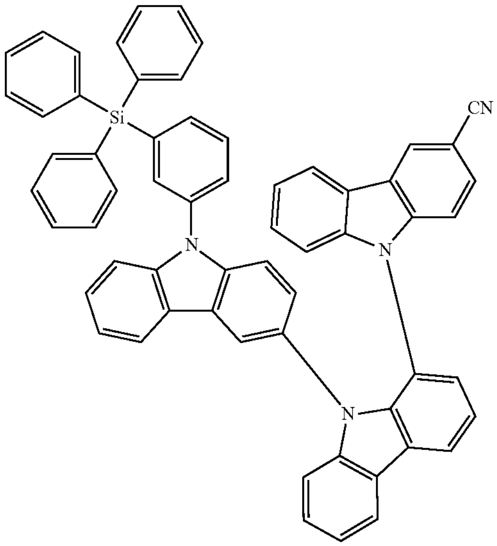
781
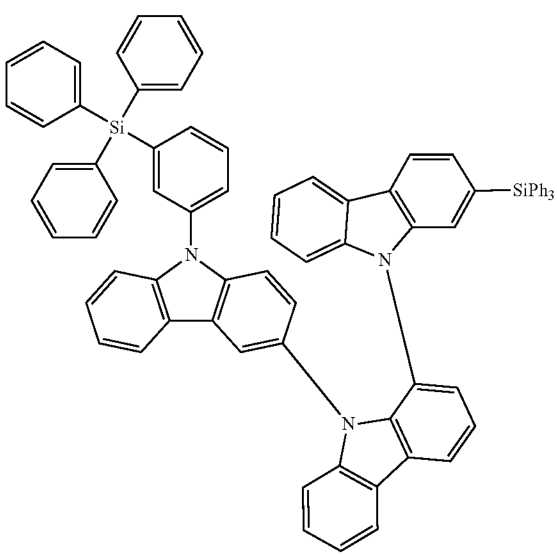
782
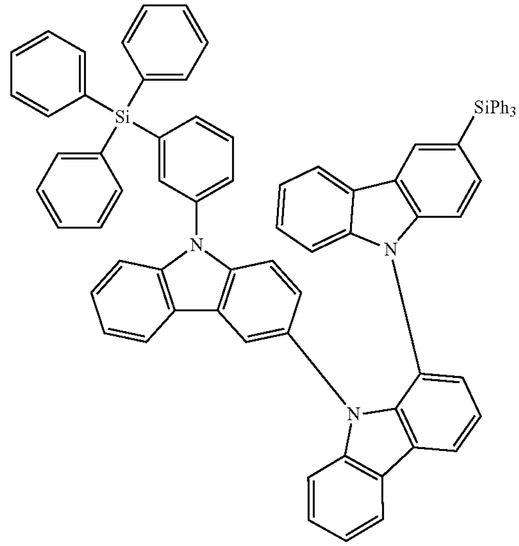
783
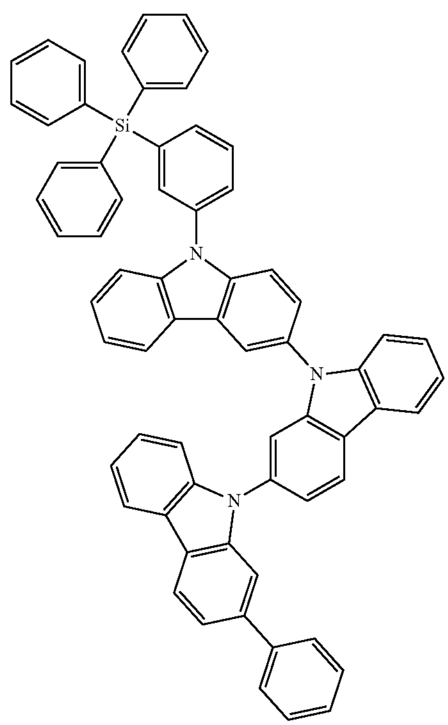

-continued
784
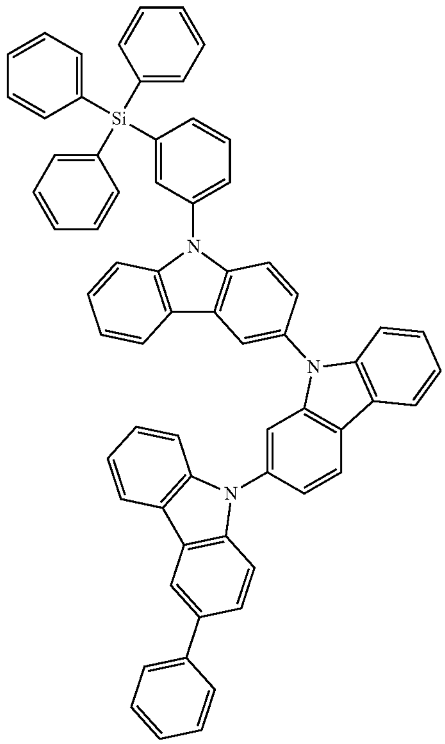
785
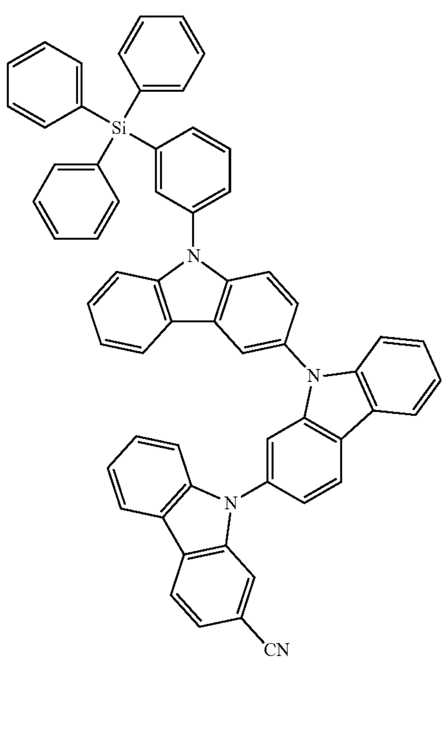
-continued
786
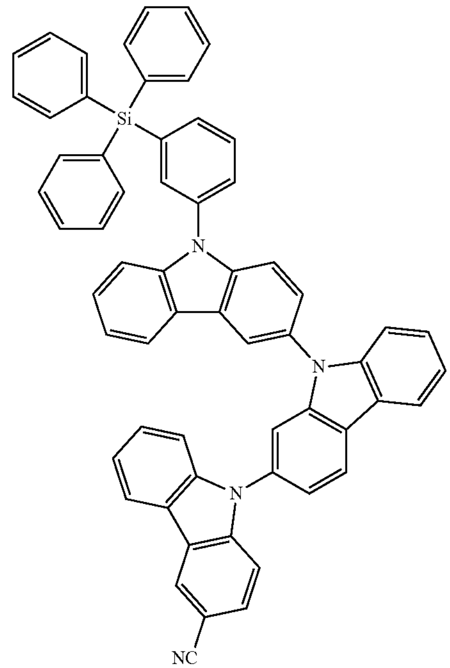
787
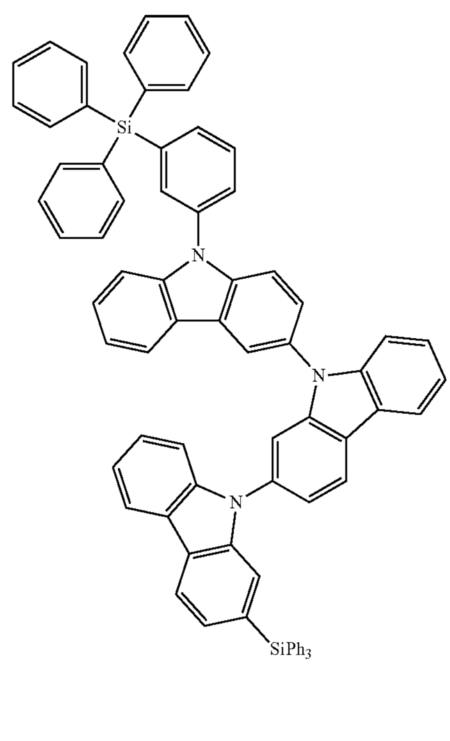

788
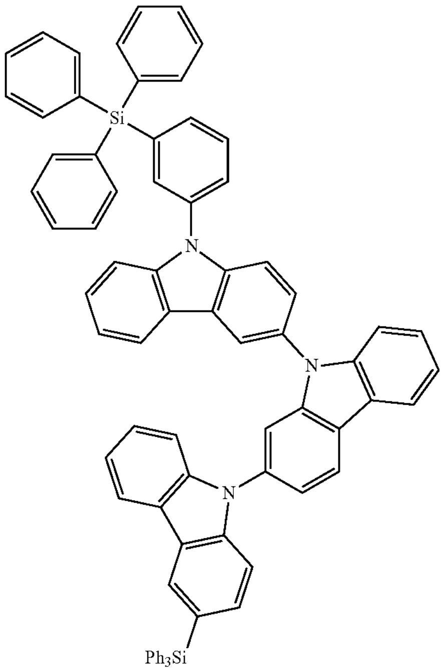
789
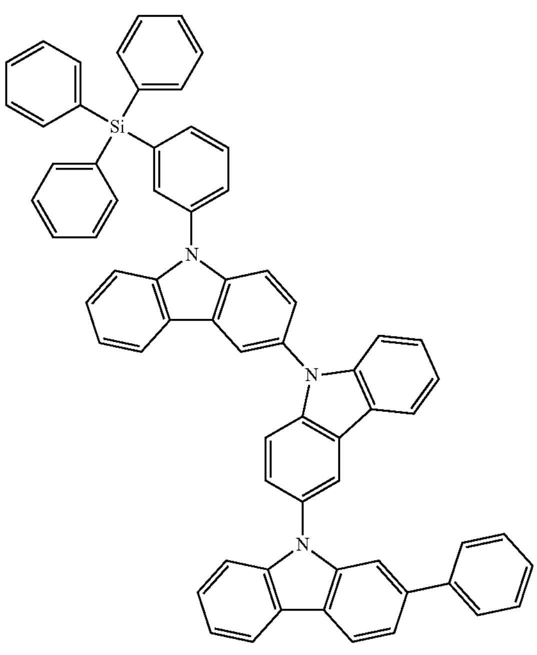
790
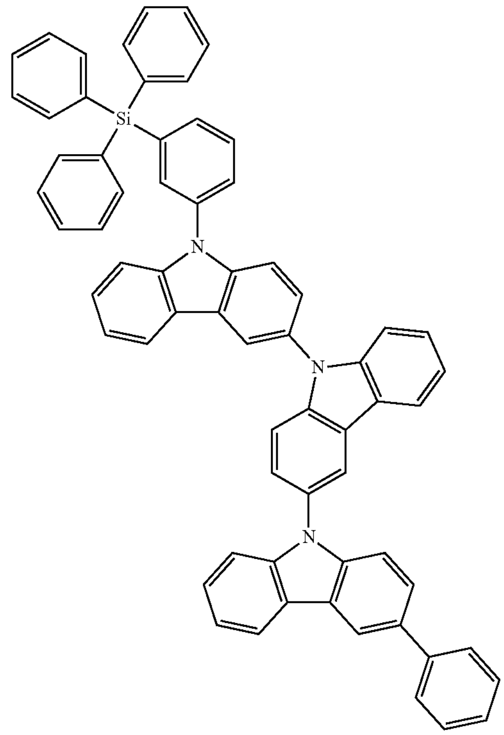
791
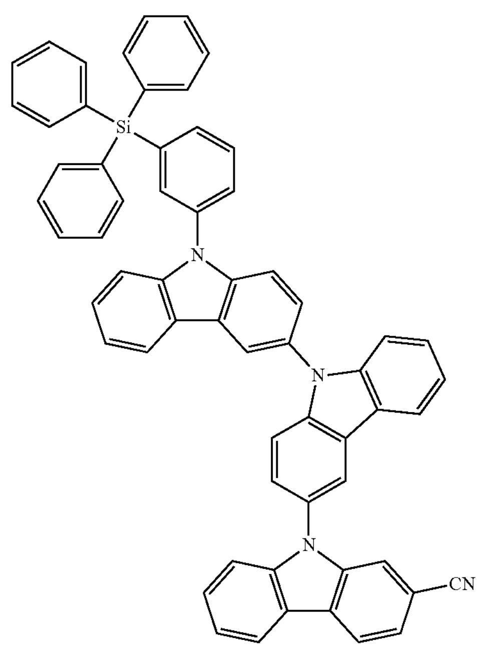

-continued
792
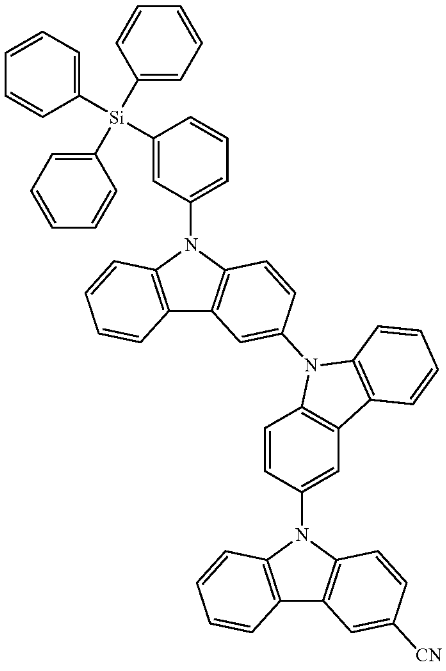
793
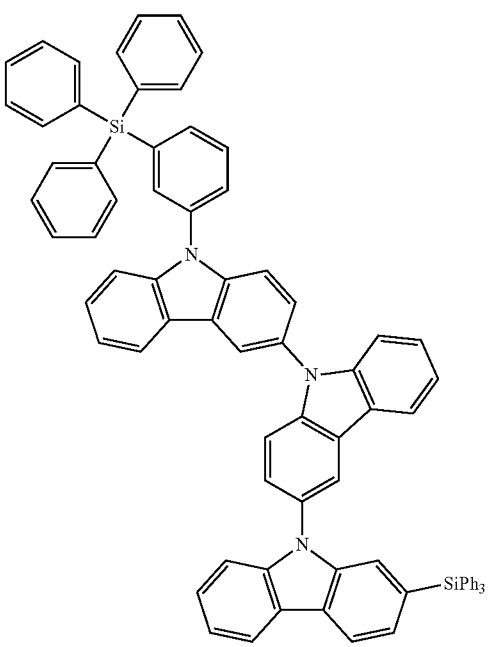
-continued
794
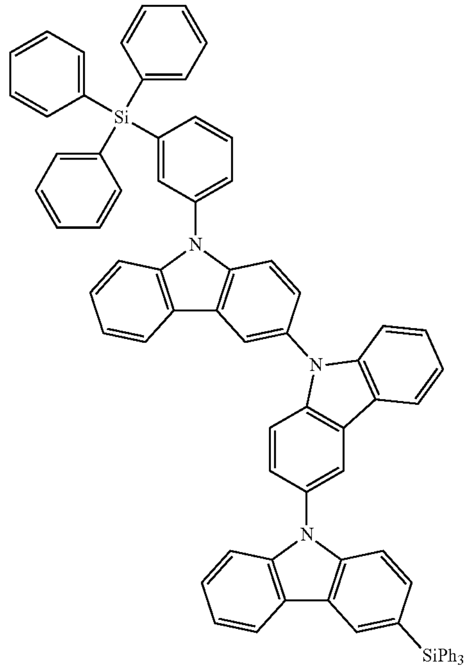
795
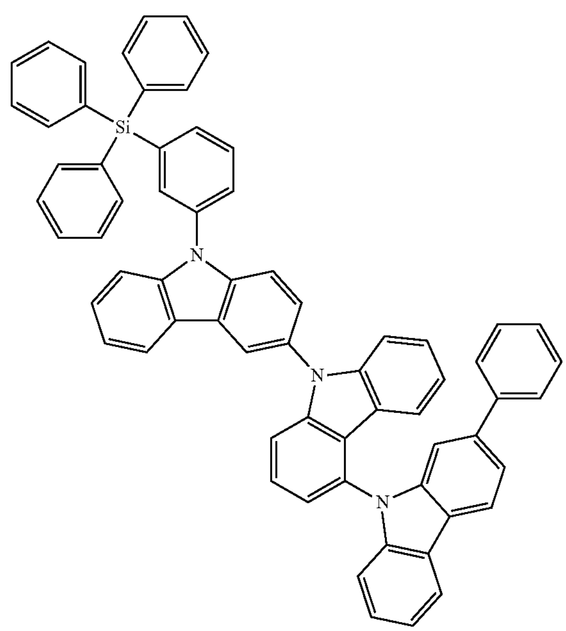

-continued
796
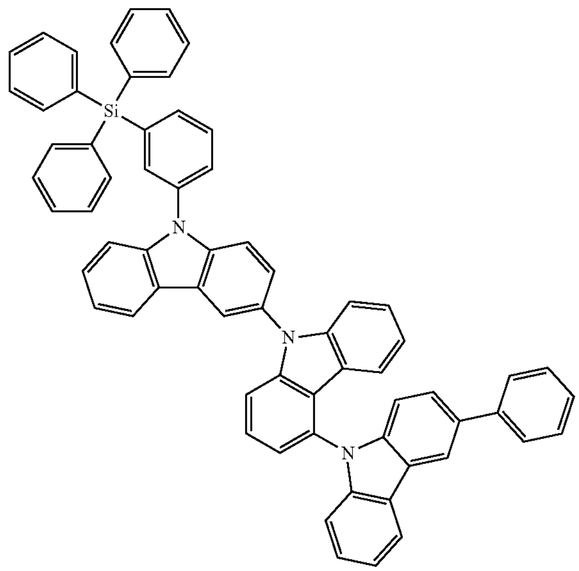
798
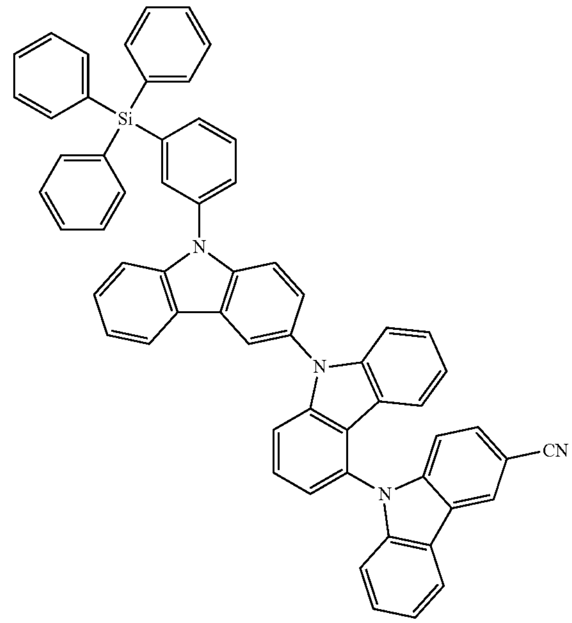
797
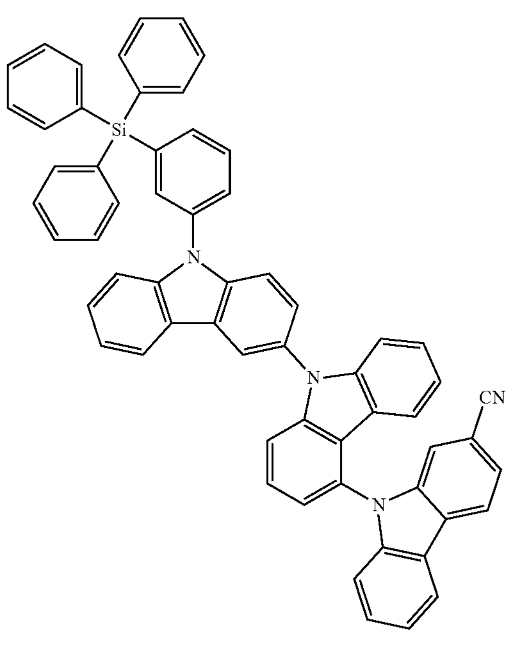
799
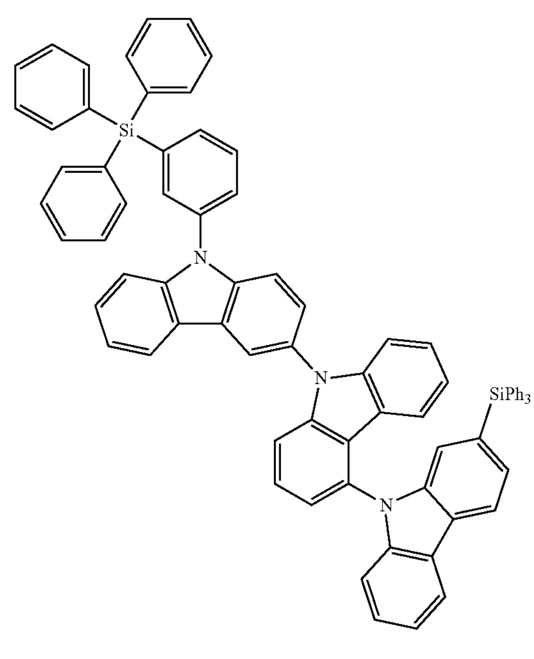

-continued
800
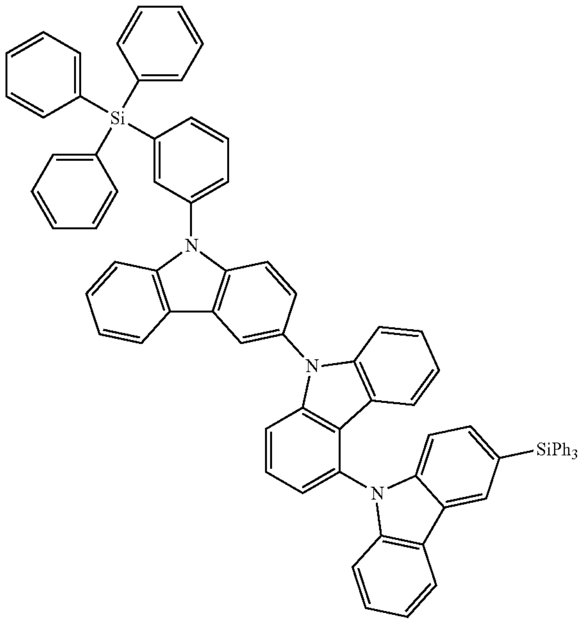
801
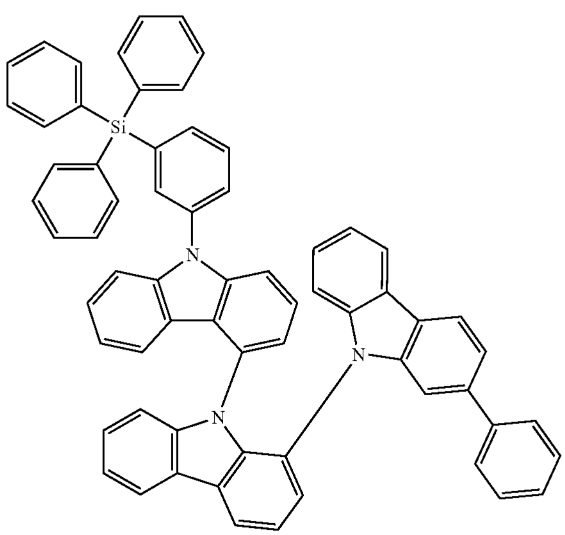
-continued
802
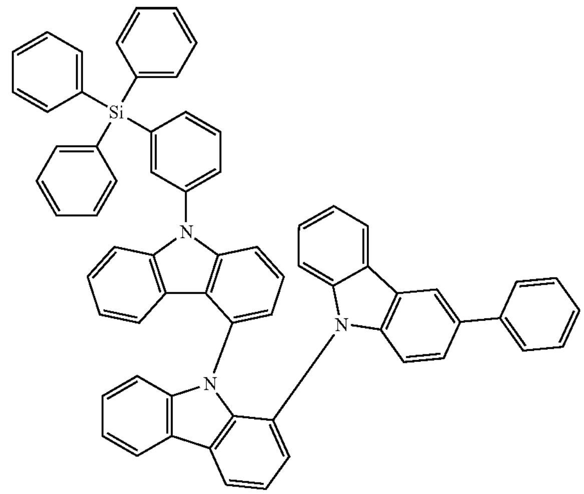
803
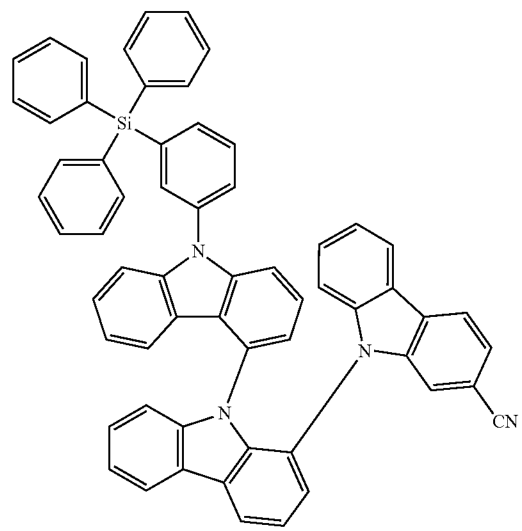
804
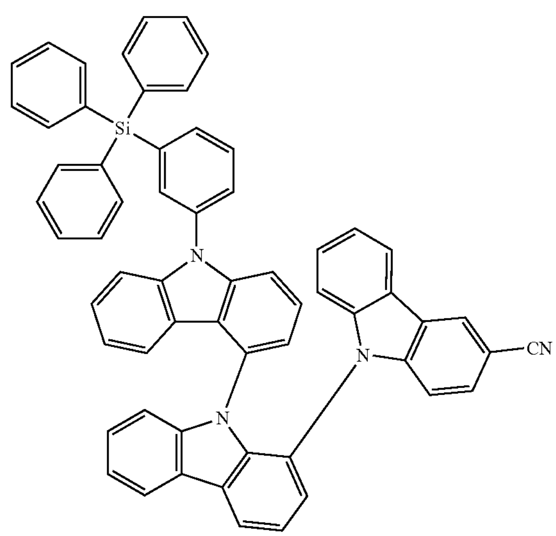

-continued
805
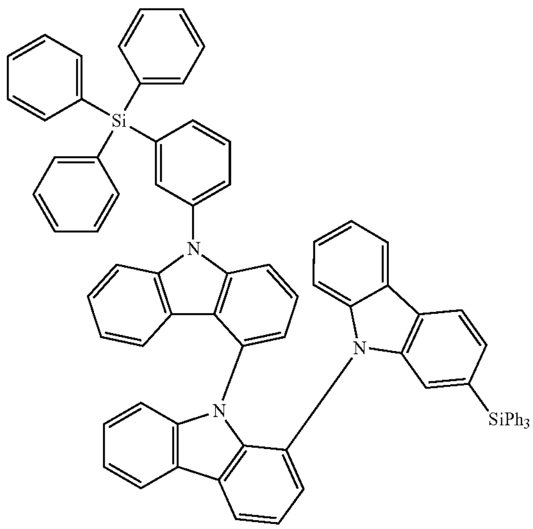
806
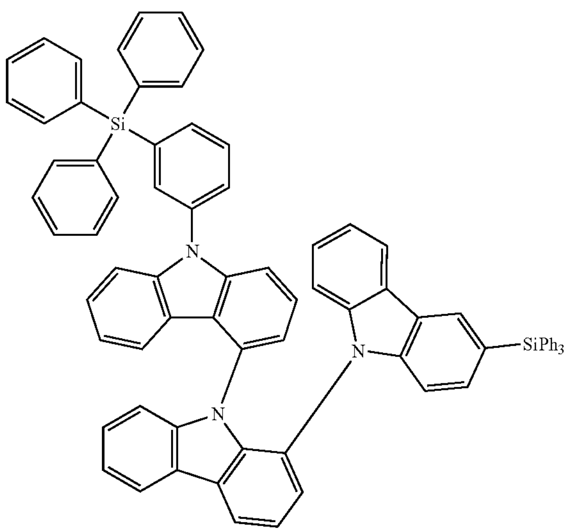
807
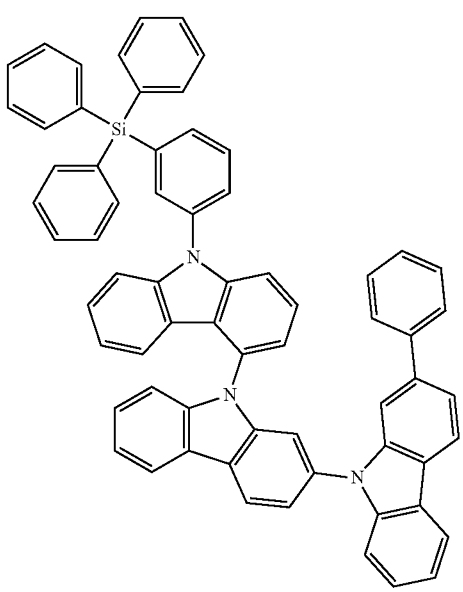
-continued
808
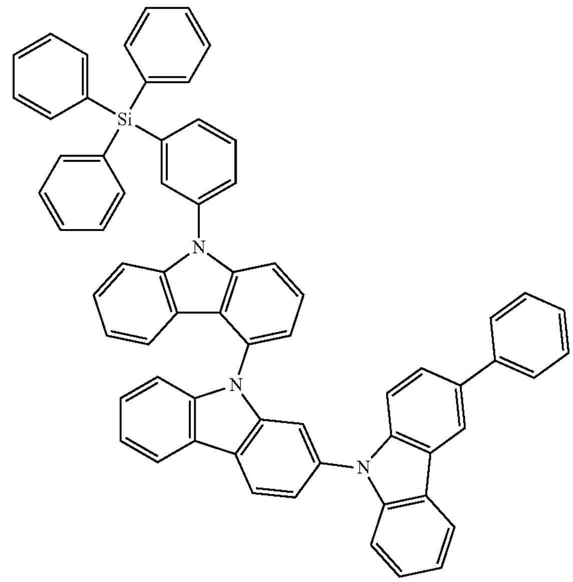
809
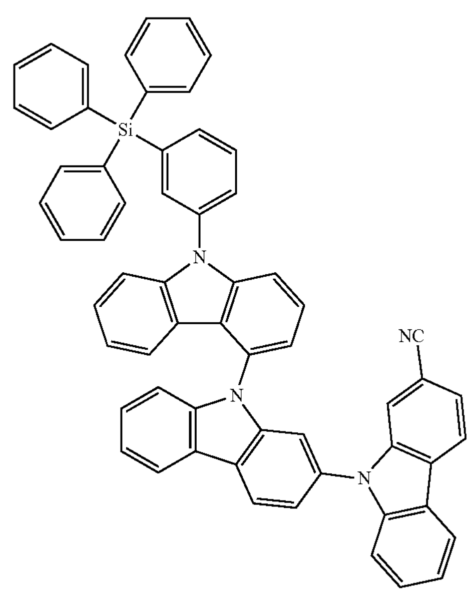

-continued
810
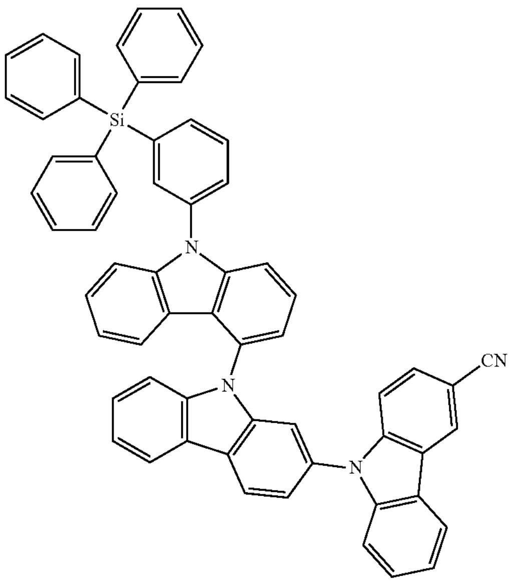
811
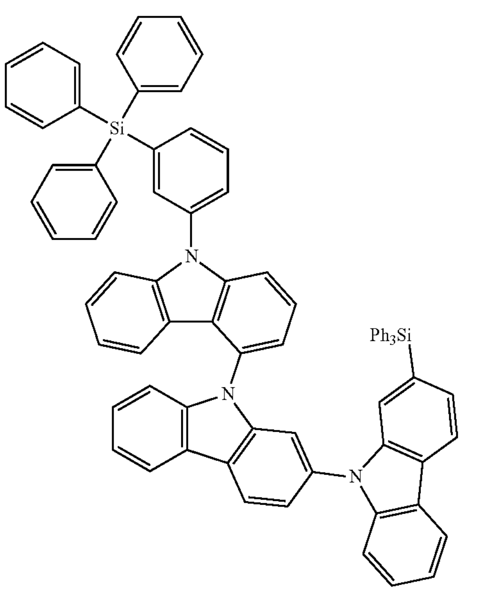
-continued
812
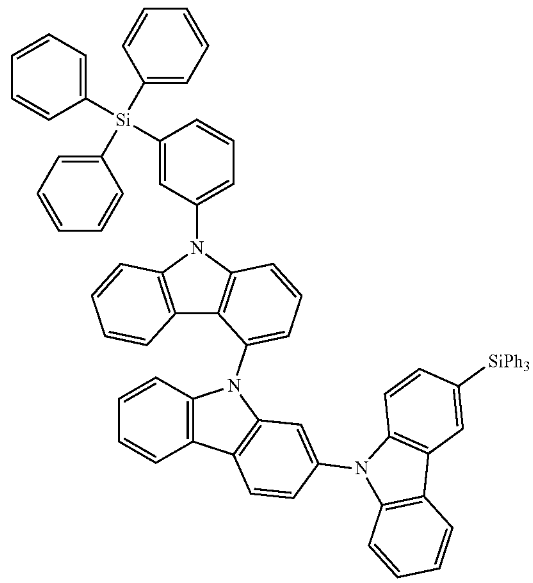
813
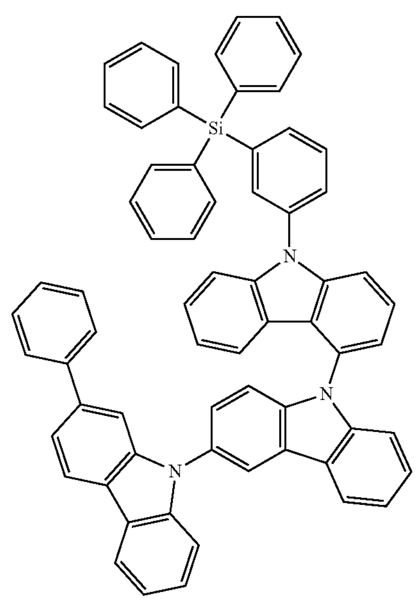

-continued
814
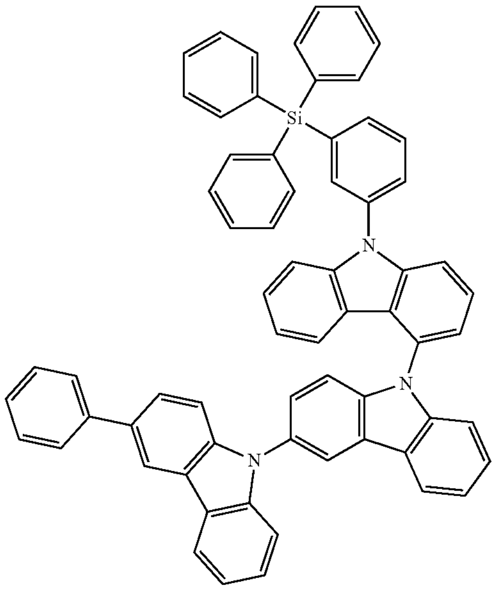
815
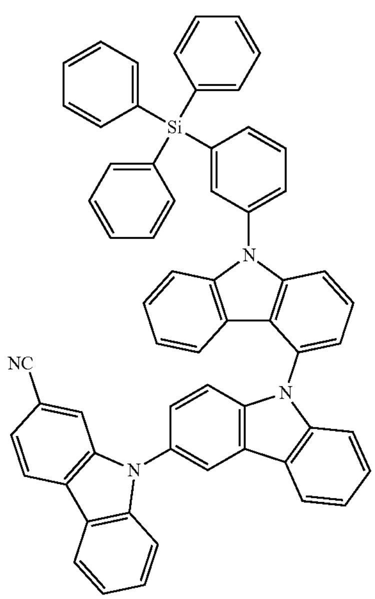
-continued
816
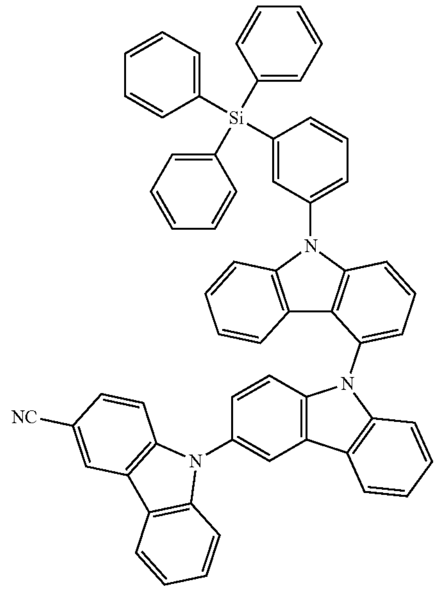
817
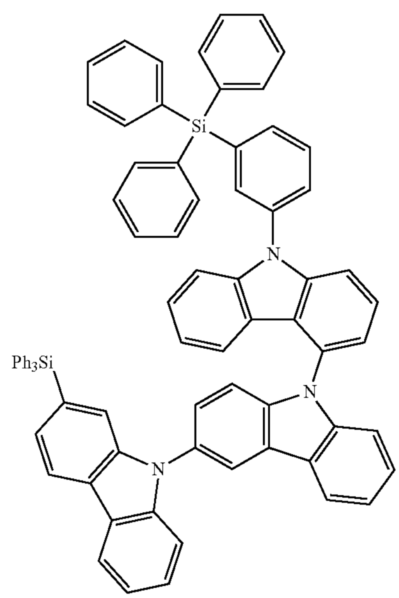

-continued
818
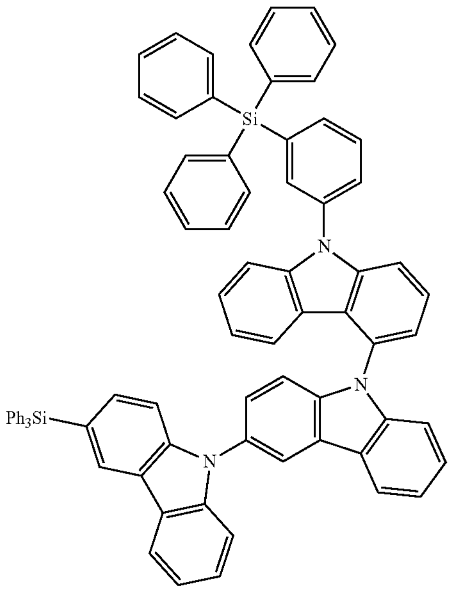
820
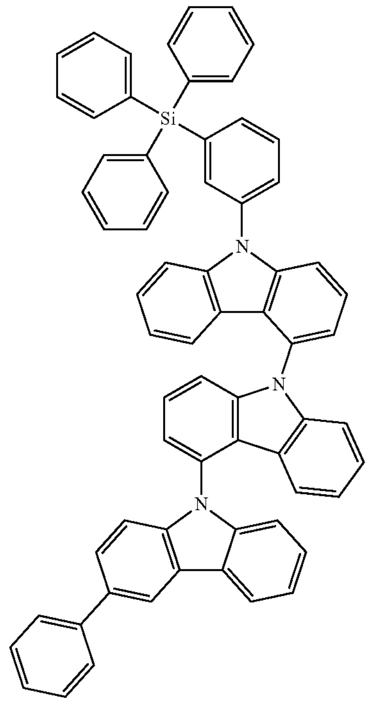
819
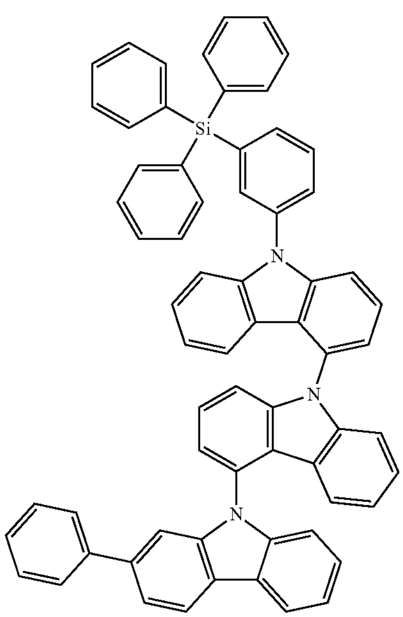
821
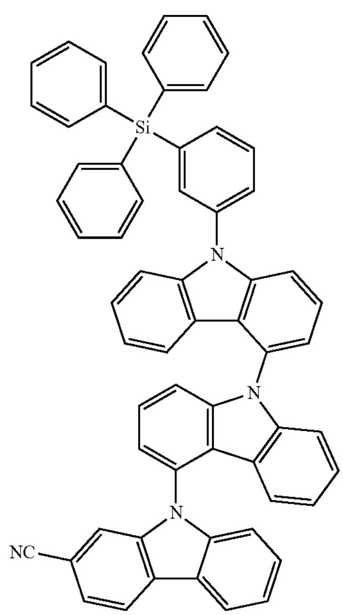

-continued
822
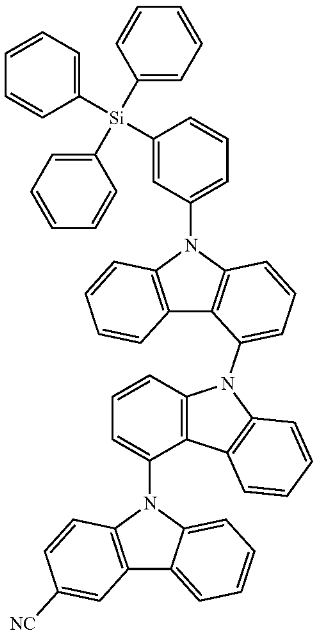
823
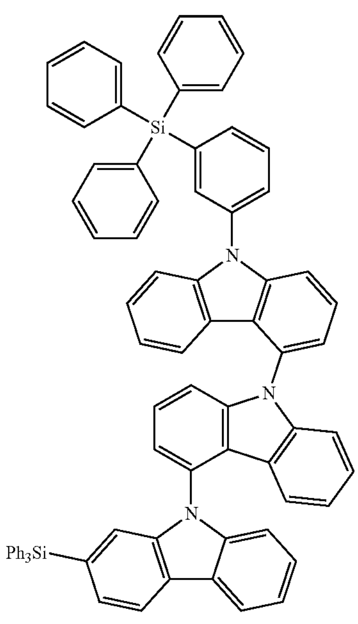
824
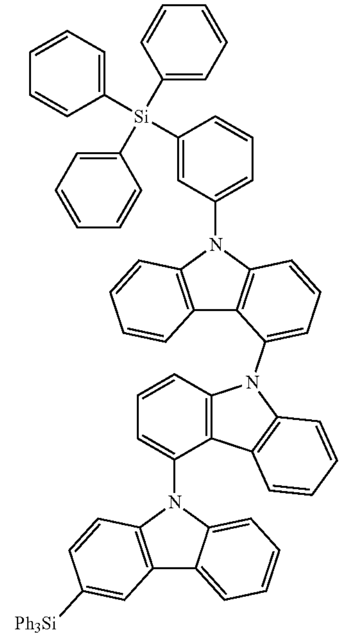
825
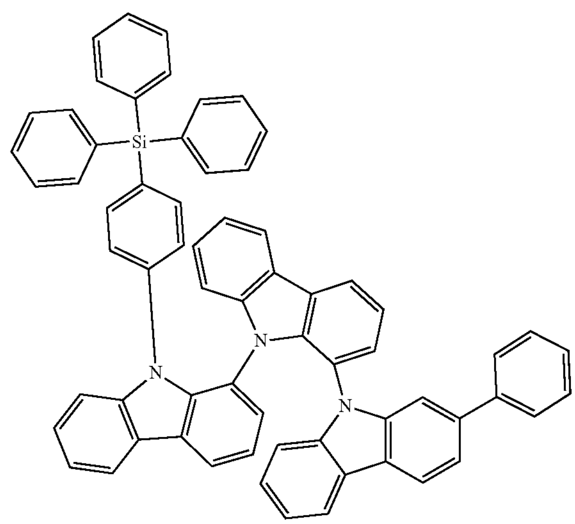

-continued
826
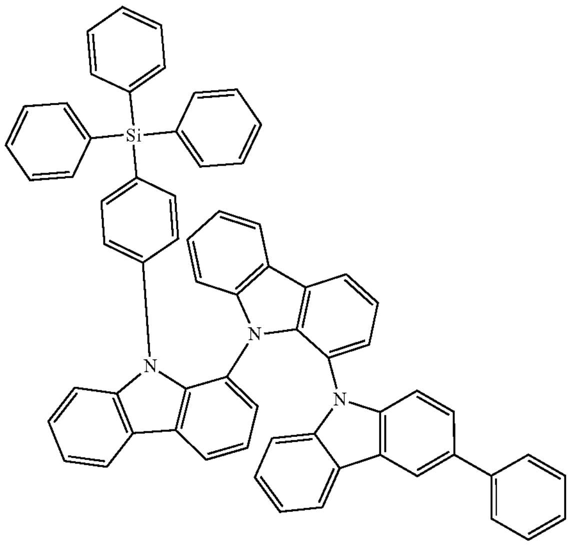
827
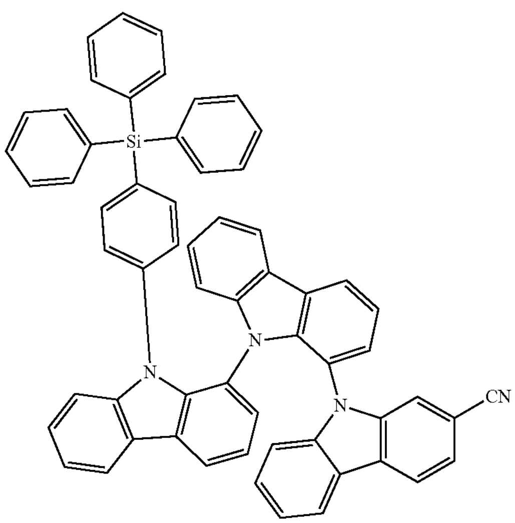
828
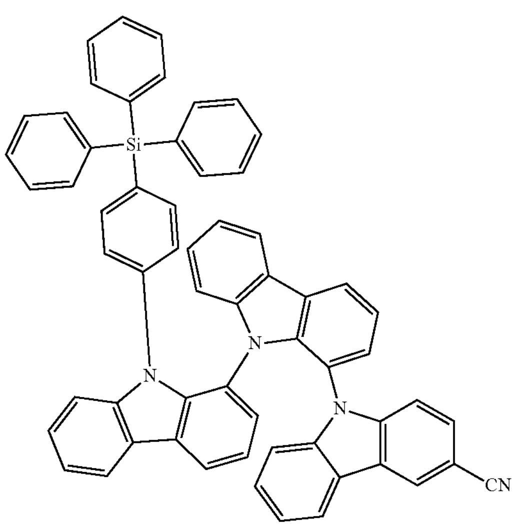
-continued
829
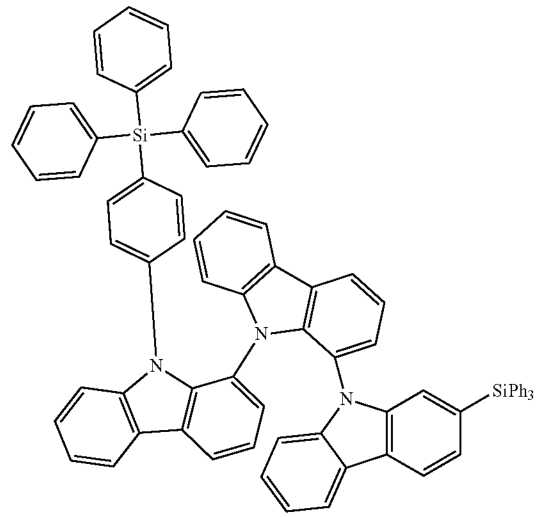
830
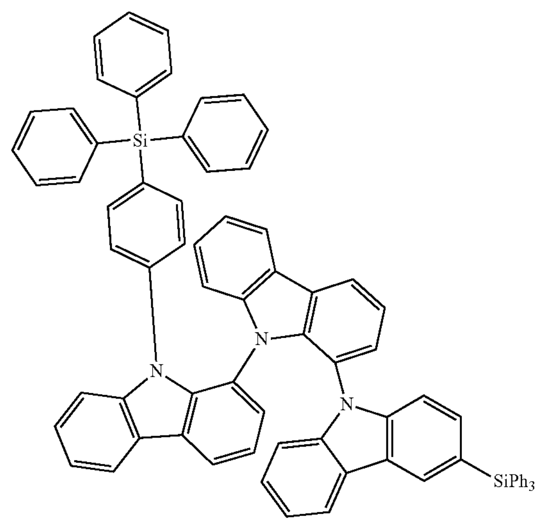
831
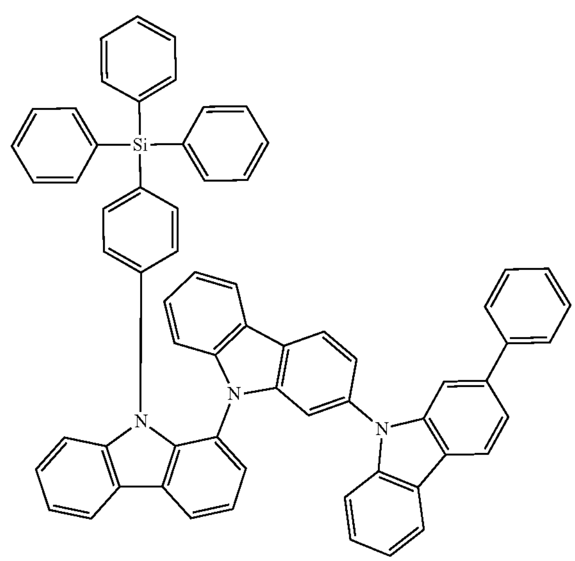

-continued
832
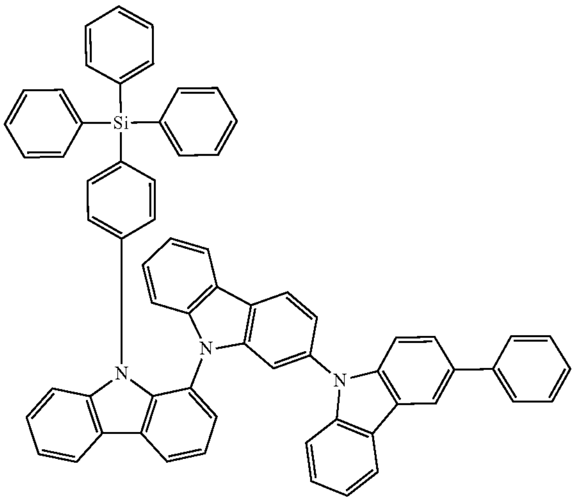
833
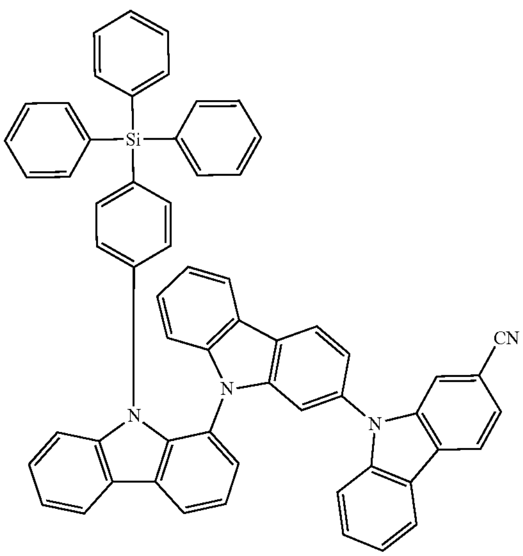
834
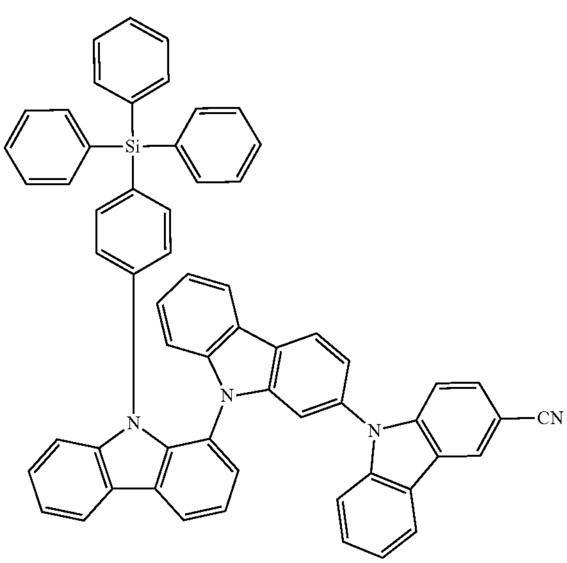
-continued
835
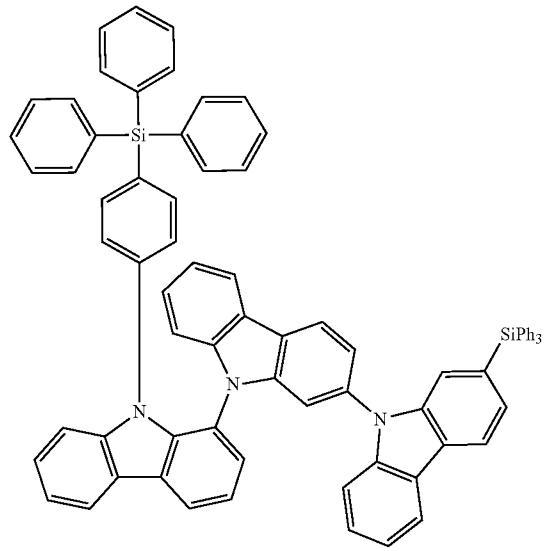
836
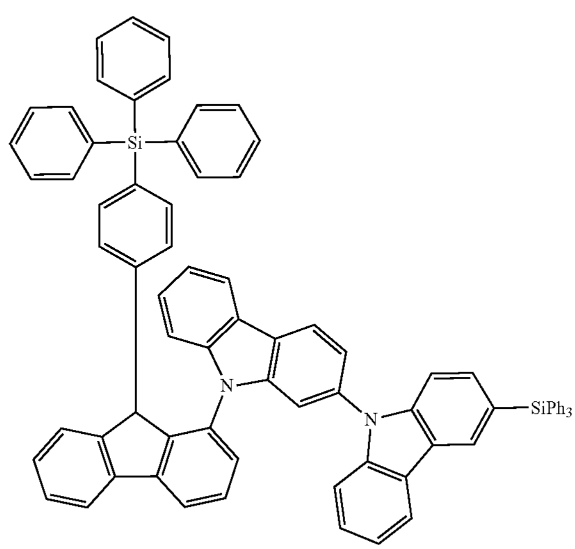

-continued
837
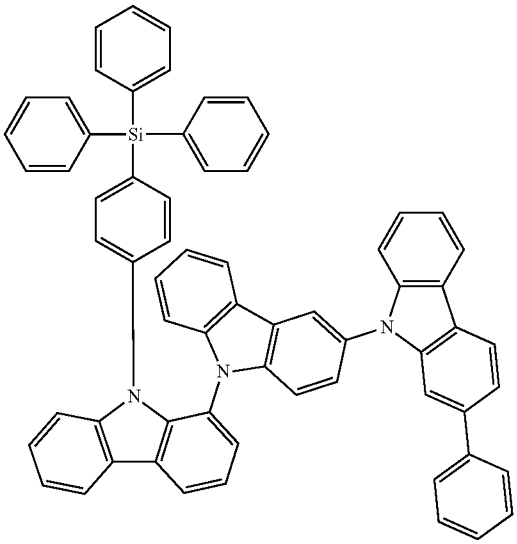
838
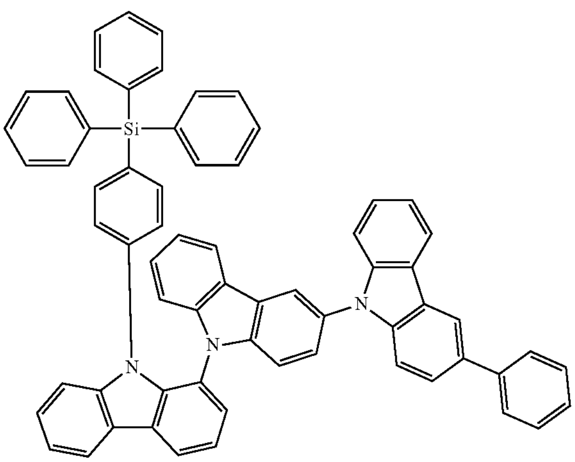
839
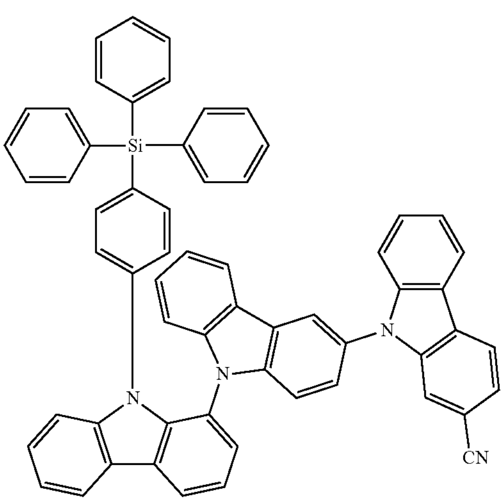
840
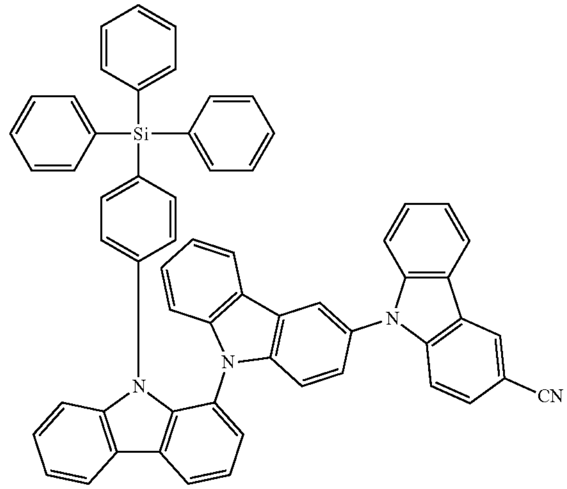
841
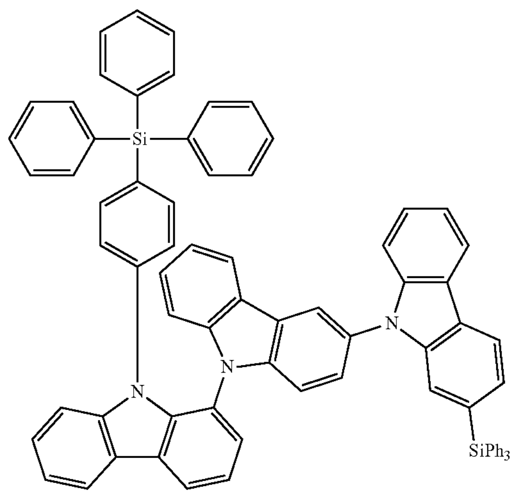
842
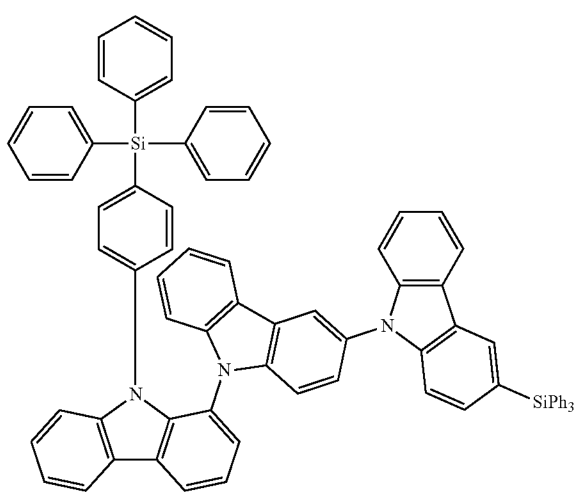

843
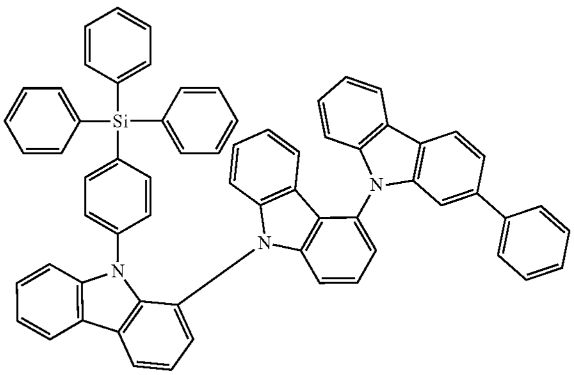
844
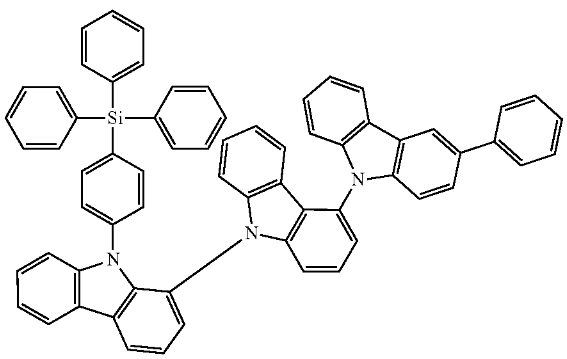
845
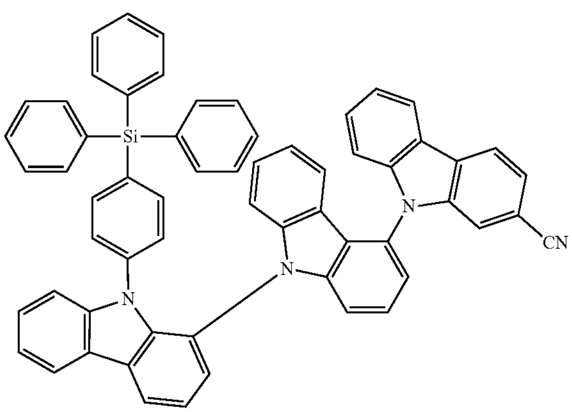
846
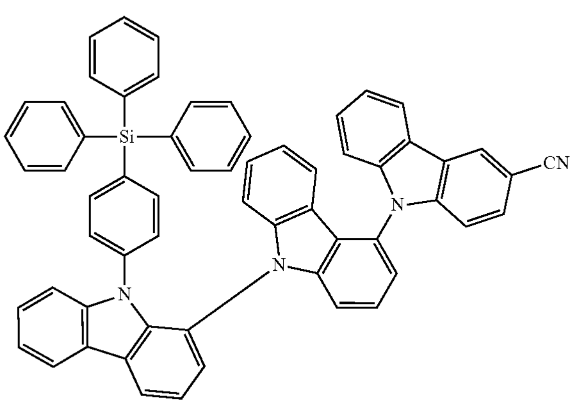
847
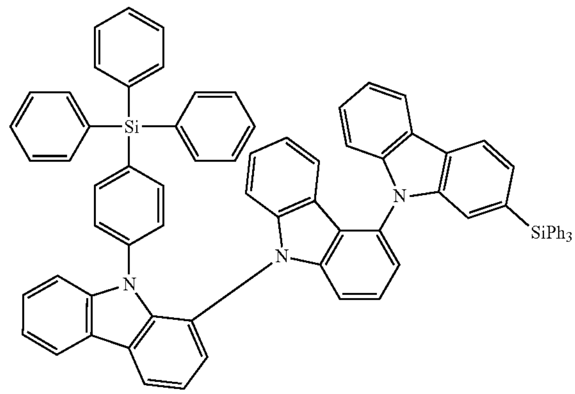
848
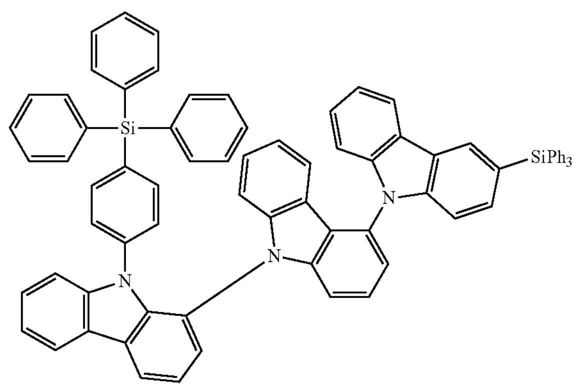
849
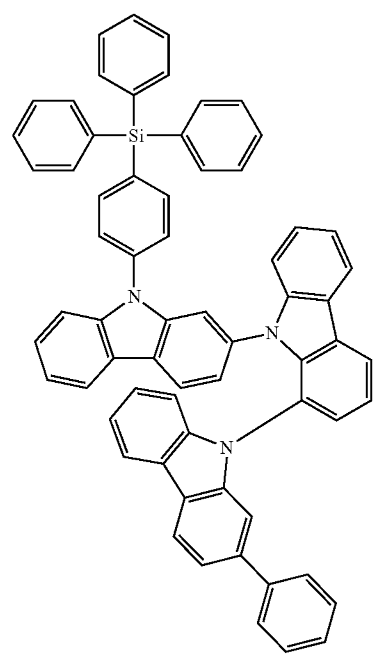

-continued
850
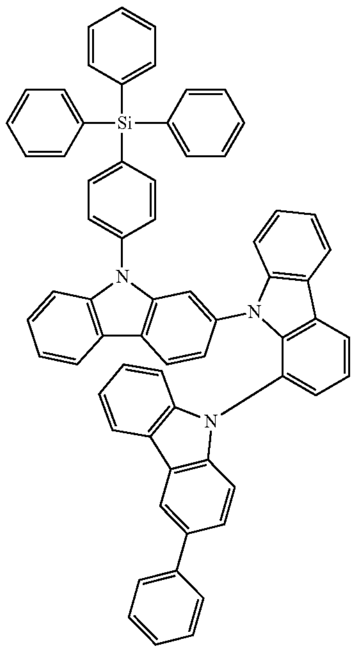
852
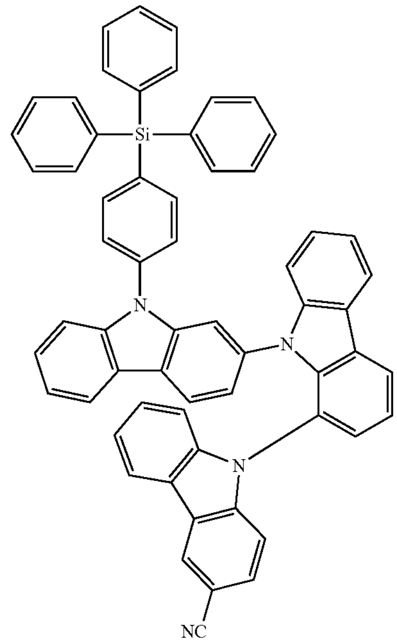
851
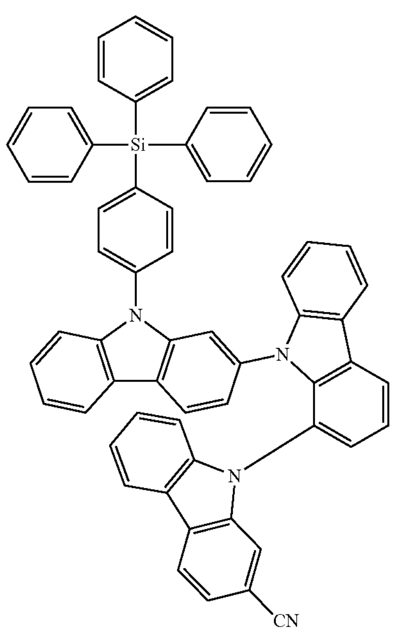
853
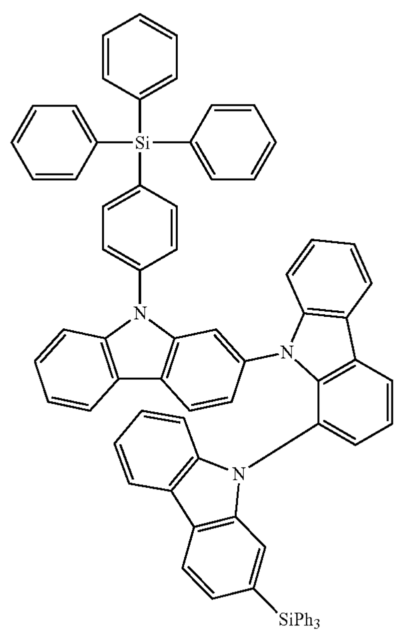

-continued
854
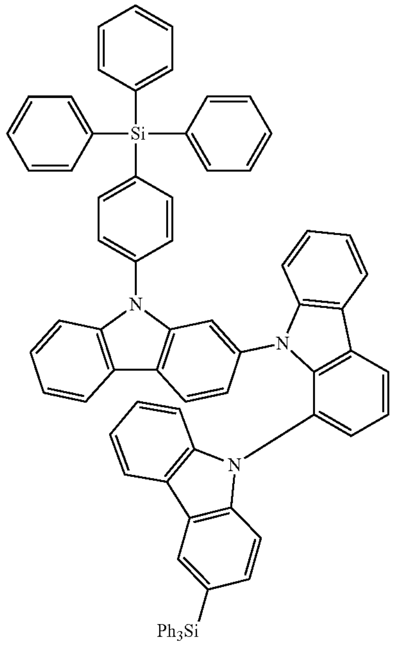
855
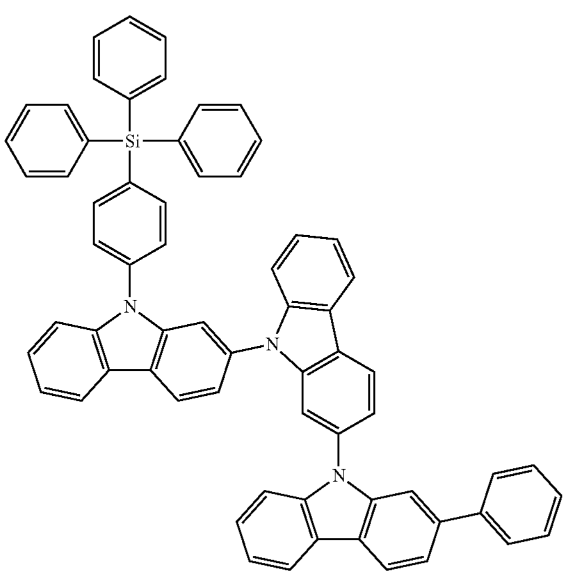
-continued
856
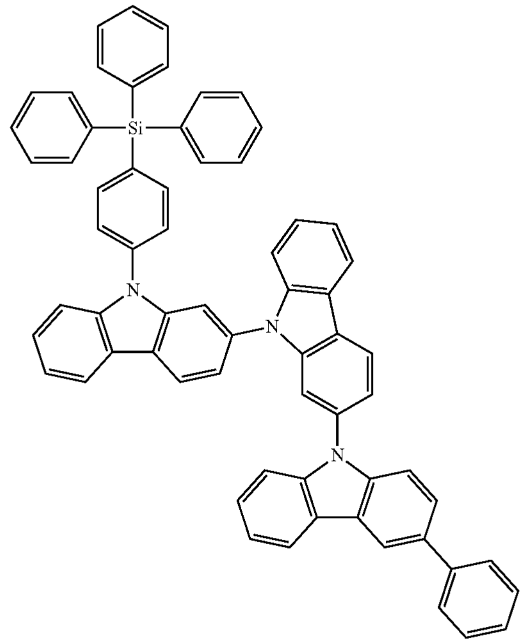
857
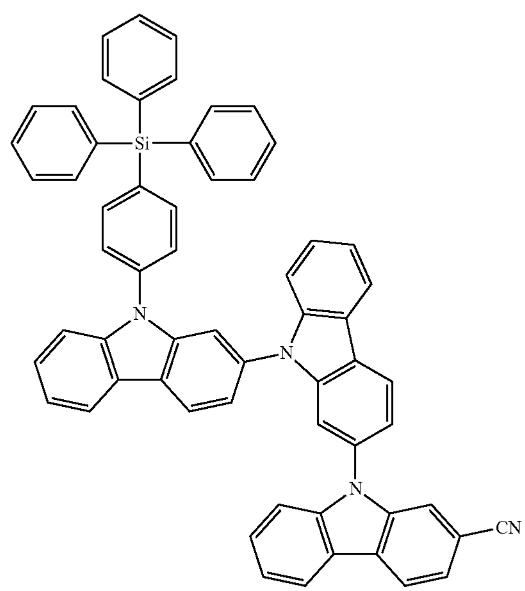

-continued
858
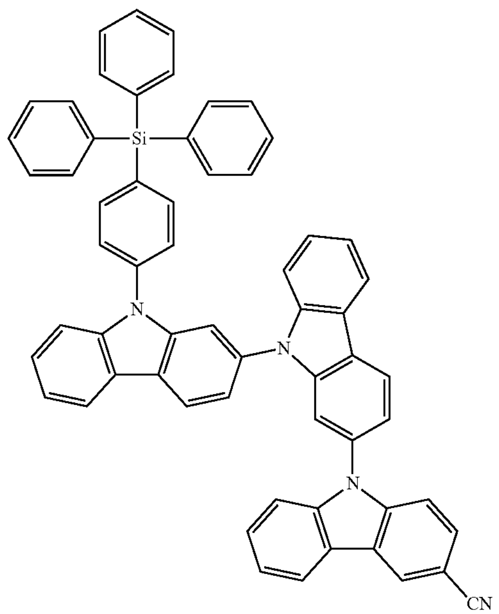
859
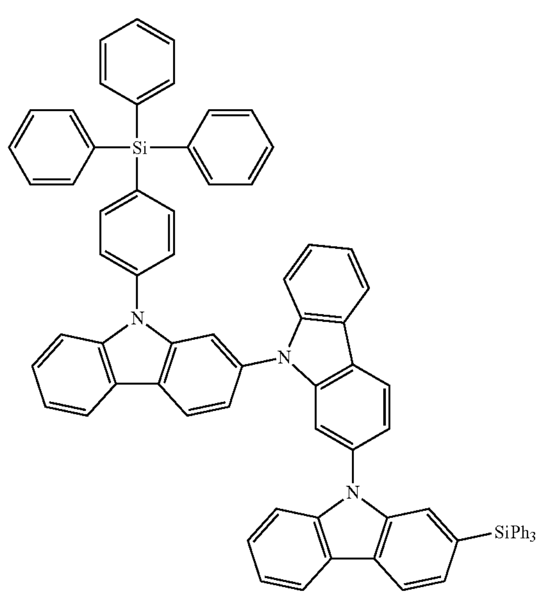
-continued
860
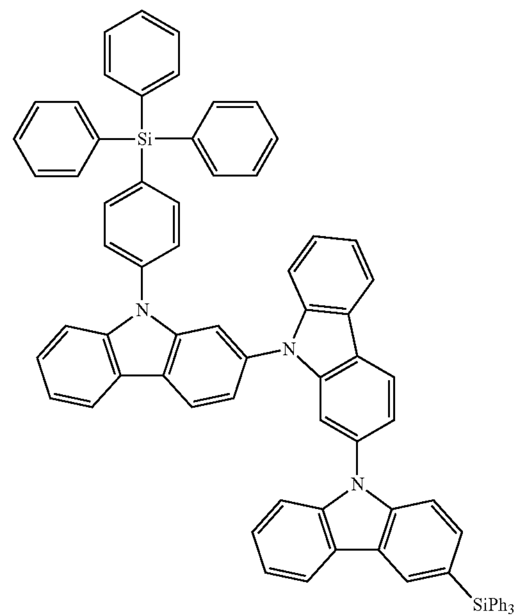
861
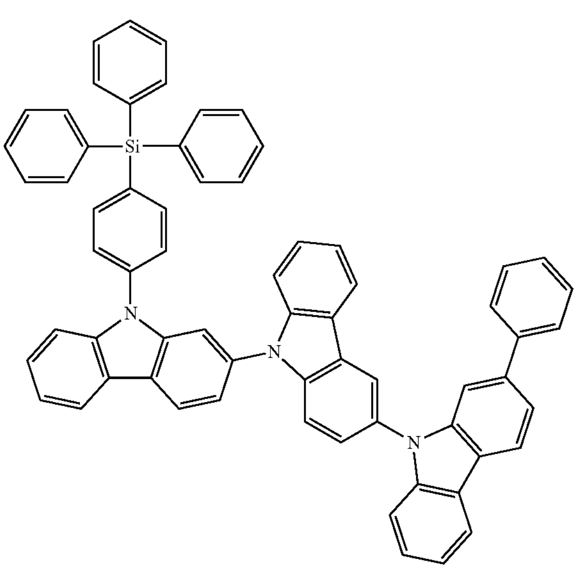

-continued
862
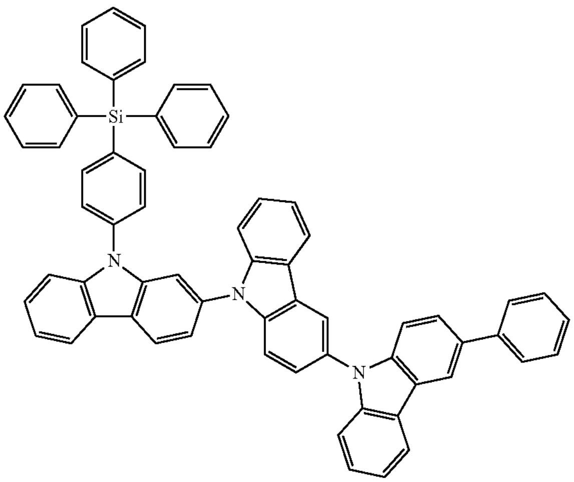
863
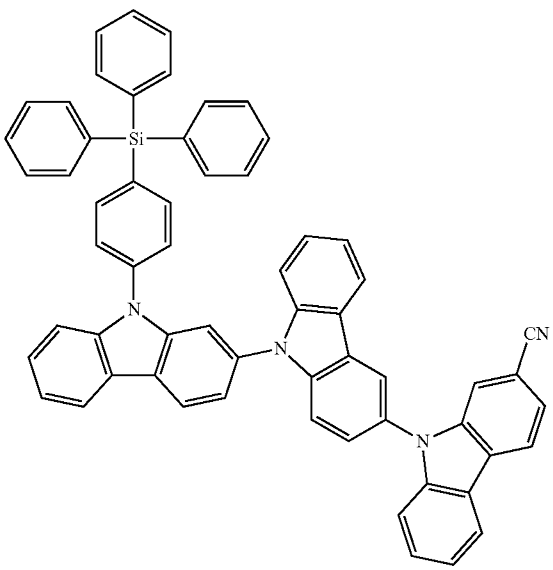
864
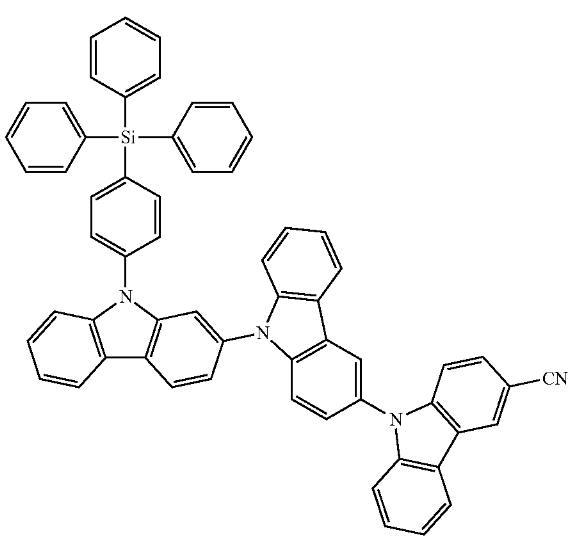
-continued
865
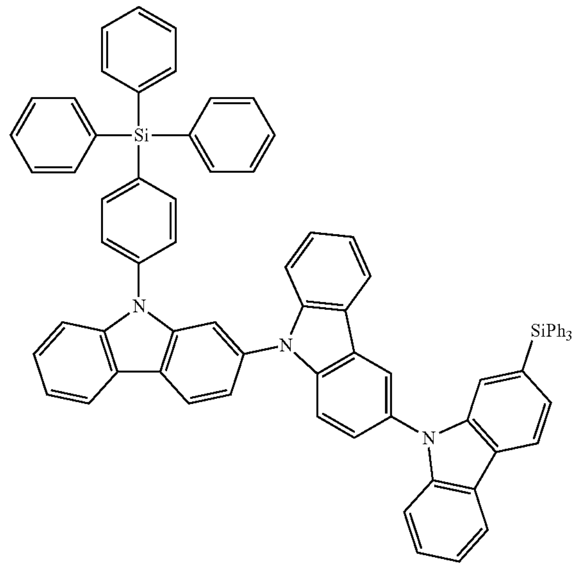
866
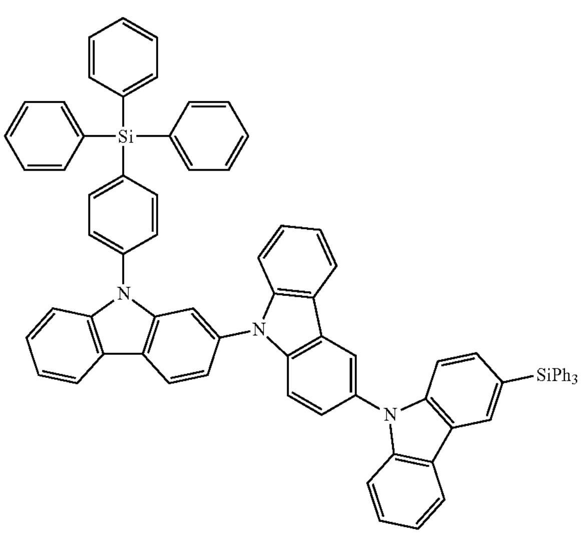

-continued
867
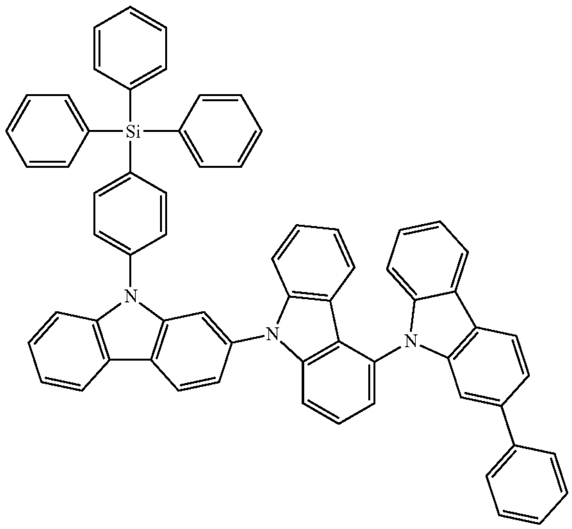
868
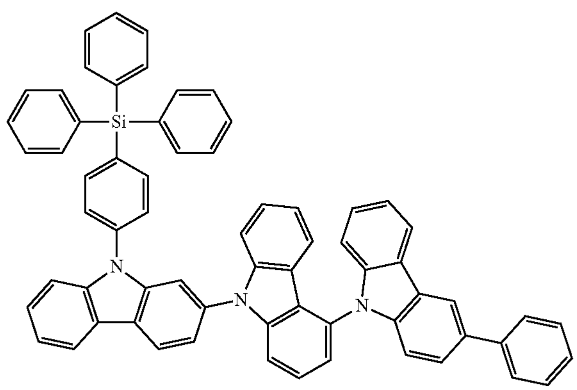
869
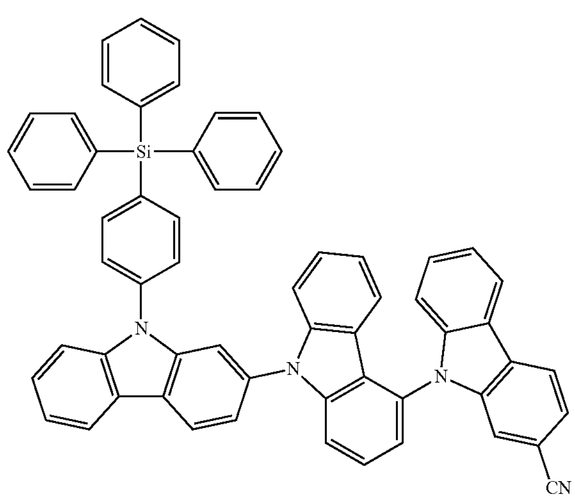
-continued
870
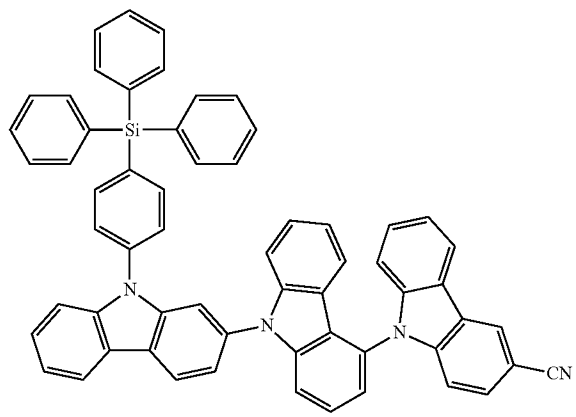
871
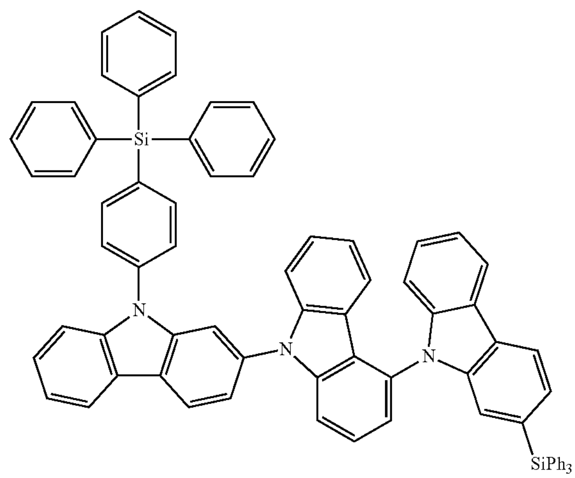
872
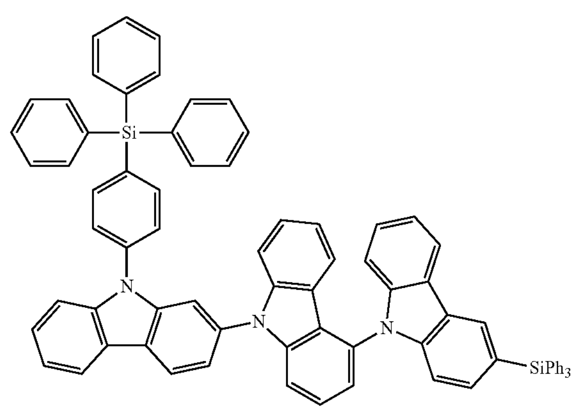

-continued
873
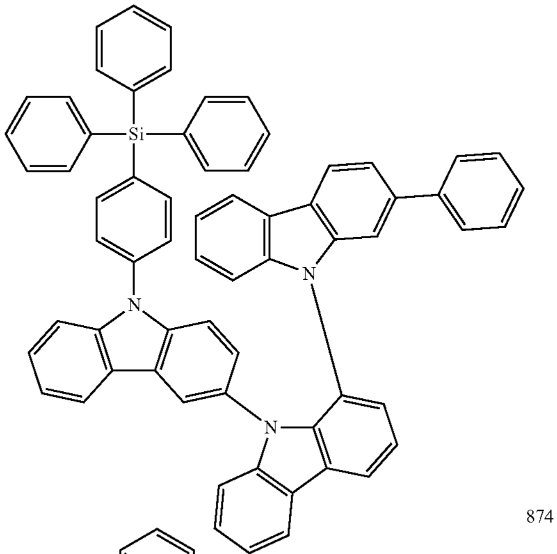
874
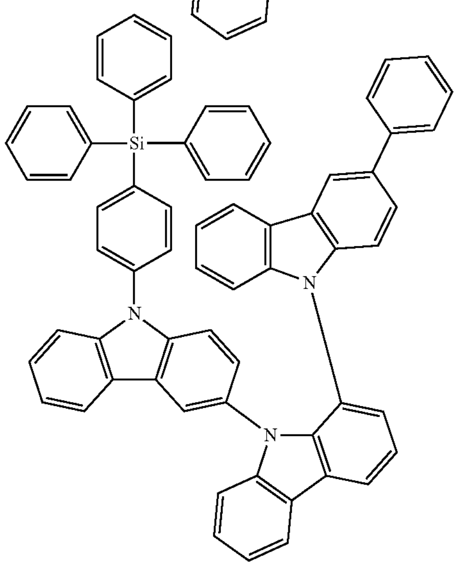
875
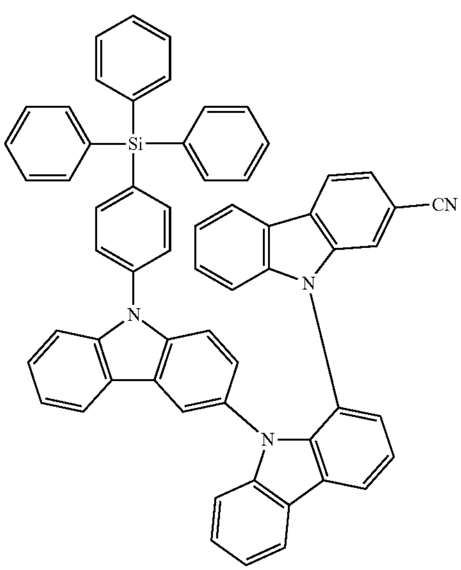
-continued
876
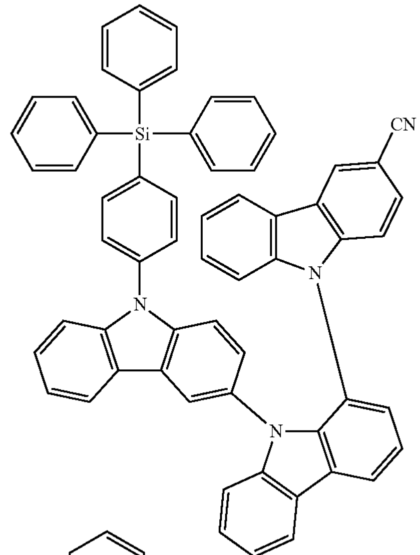
877
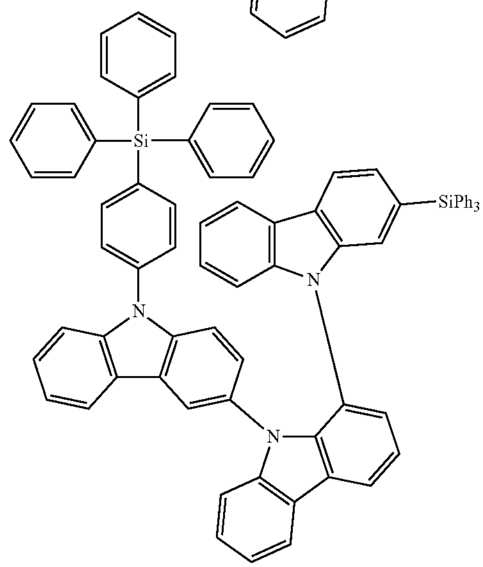
878
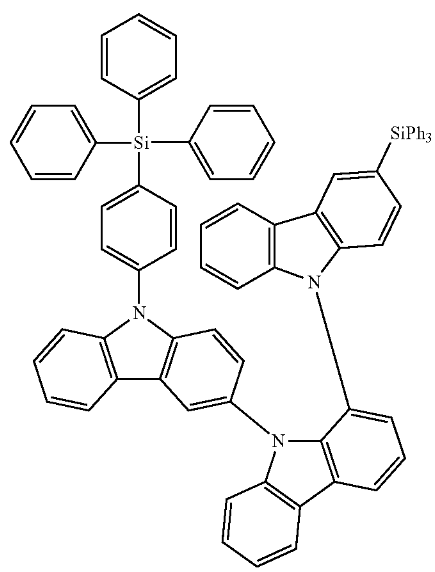

-continued
879
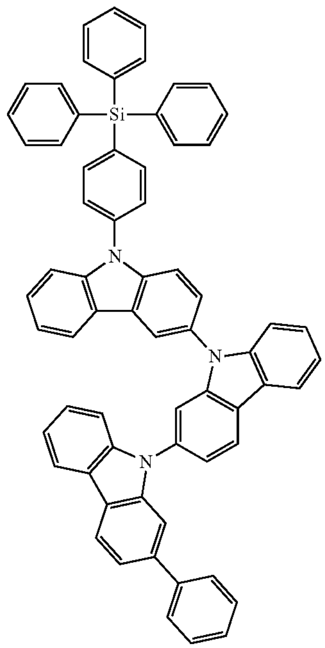
881
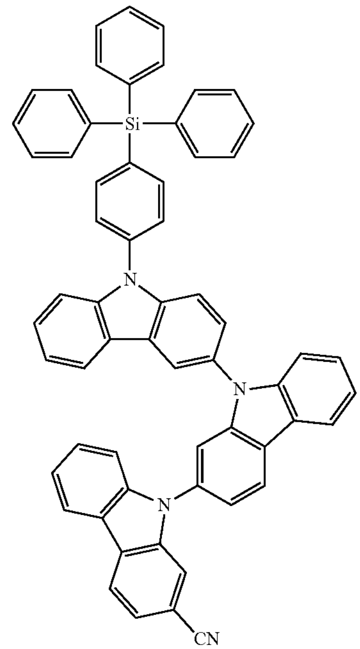
880
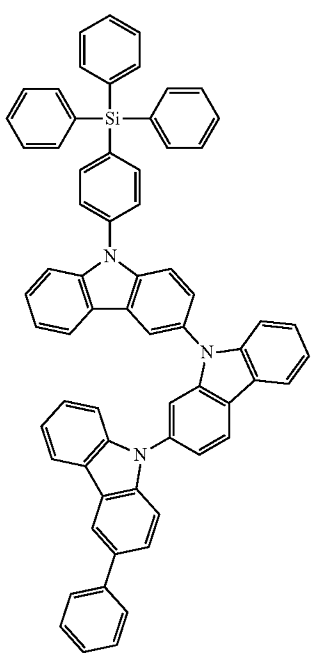
882
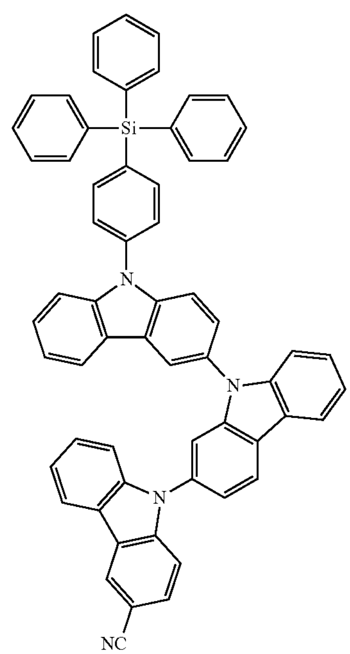

-continued
883
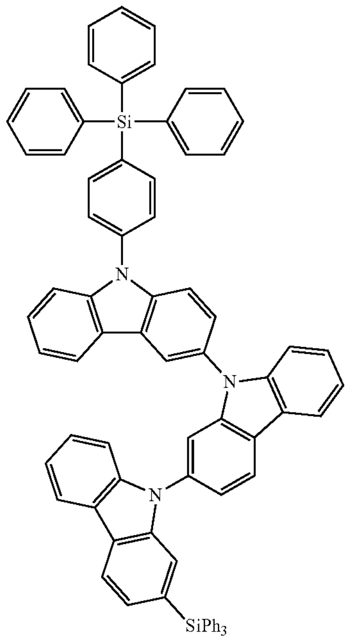
884
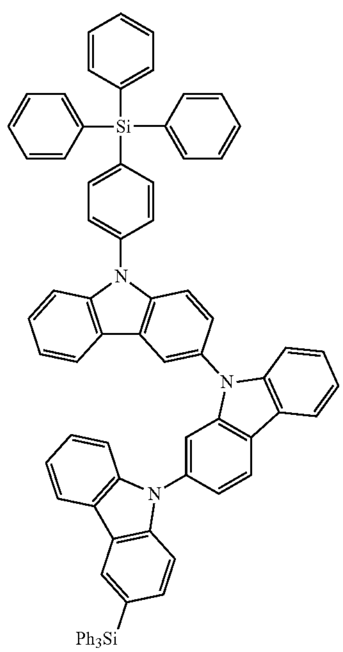
-continued
885
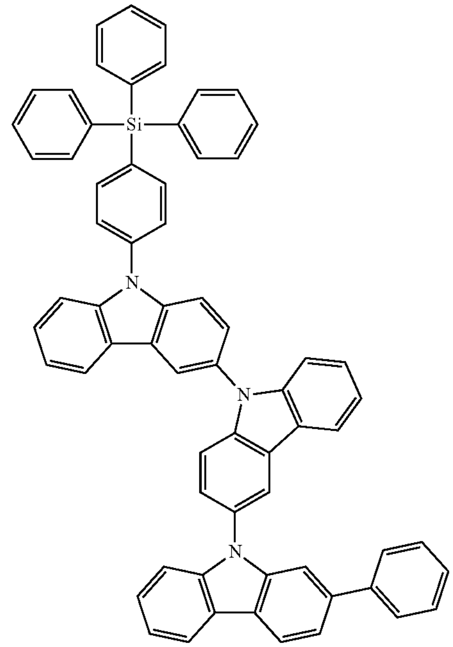
886
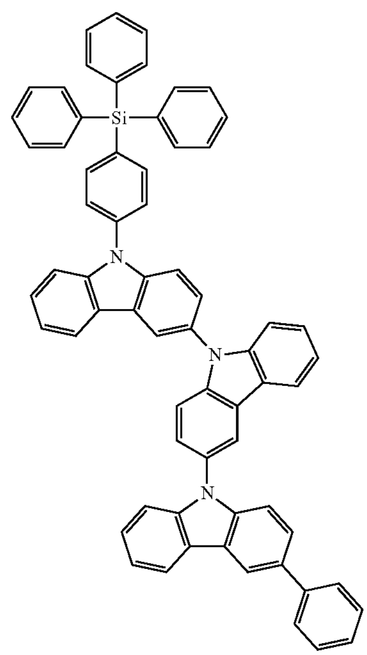

887
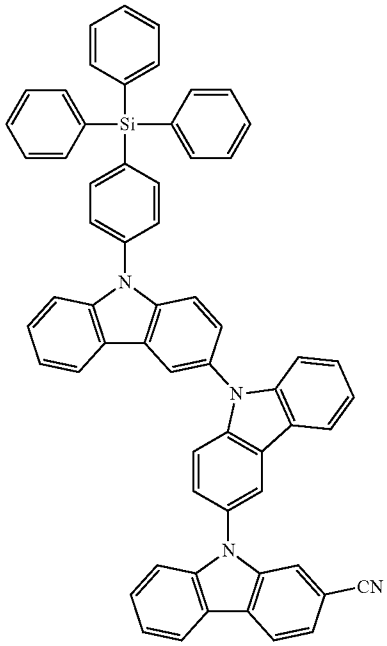
889
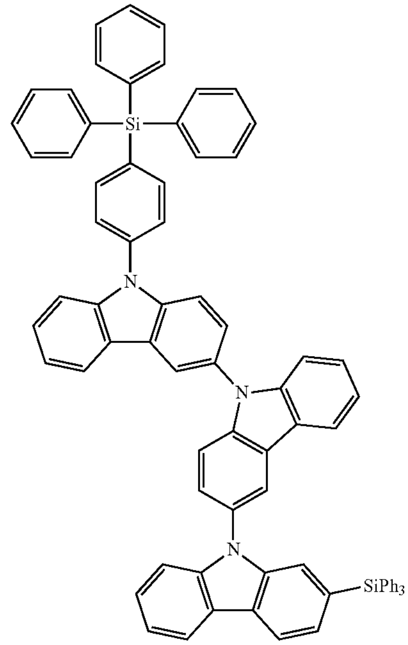
888
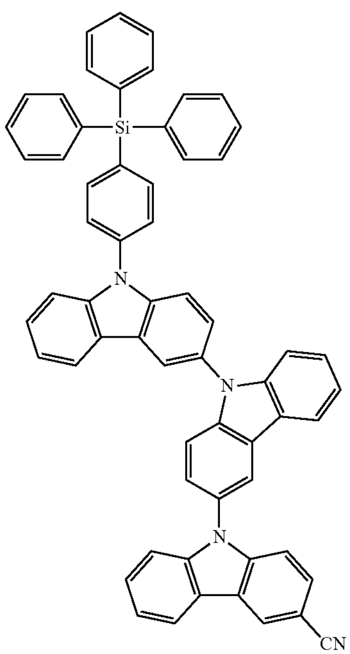
890
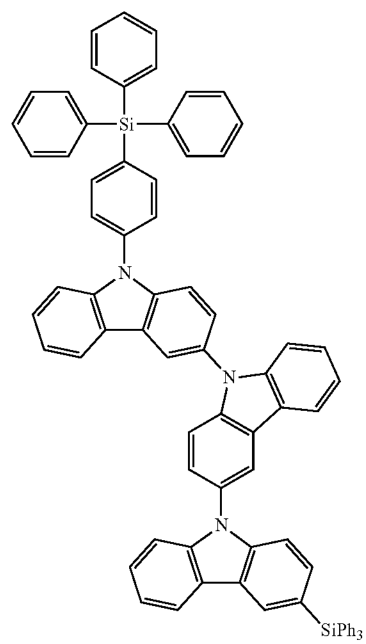

891
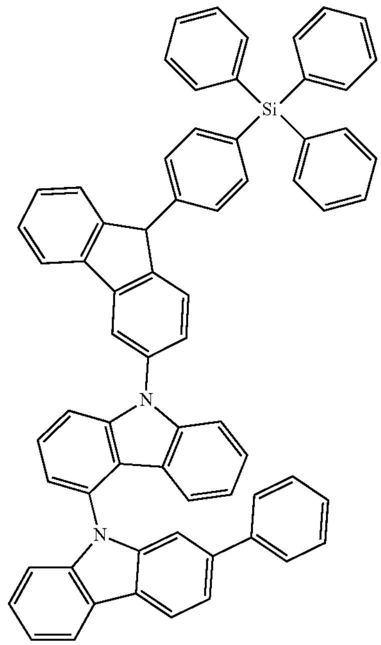
893
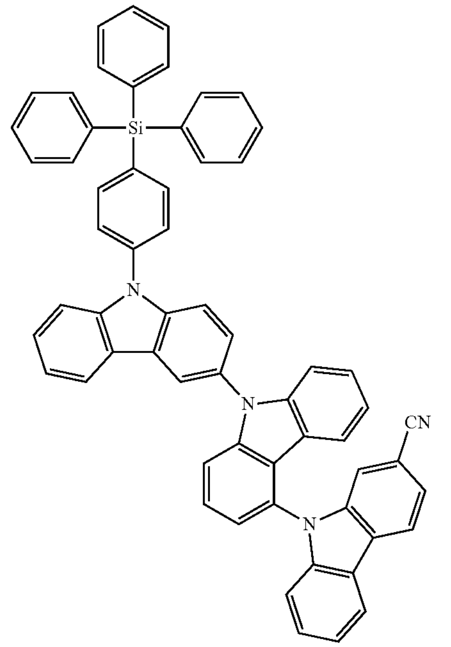
892
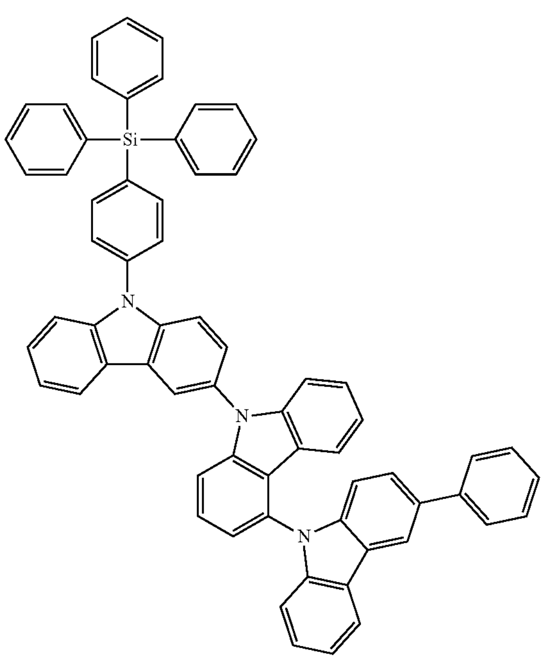
894
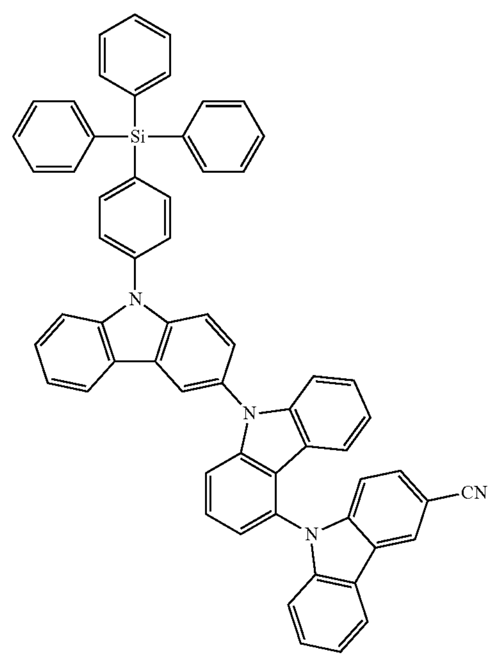

-continued
895
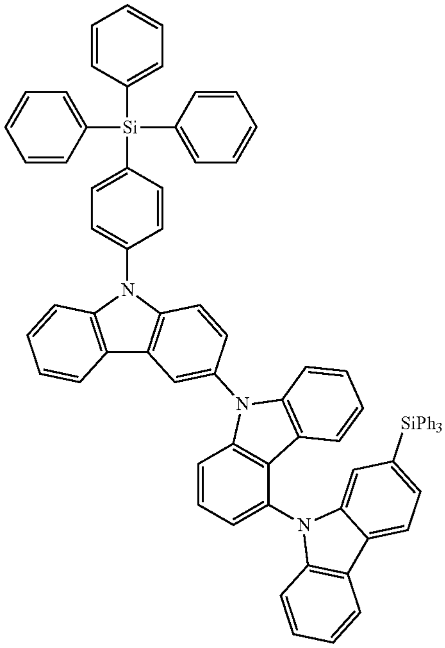
896
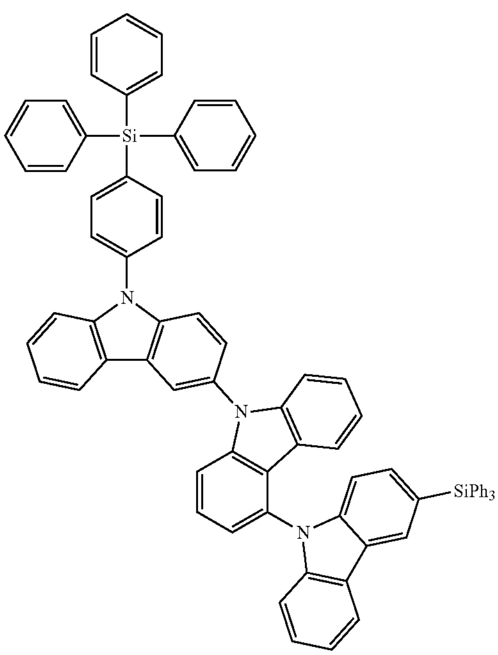
-continued
897
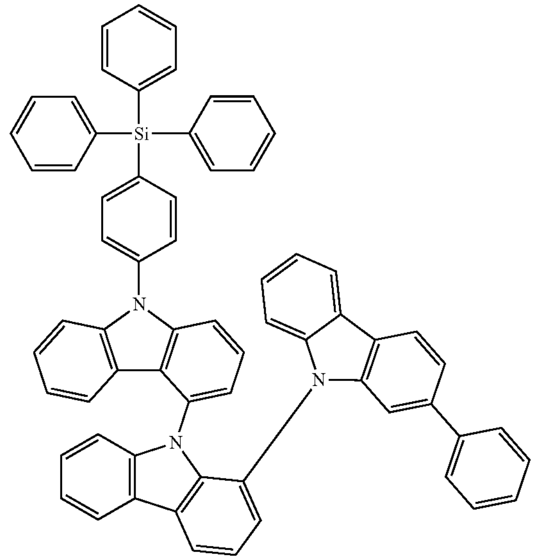
898
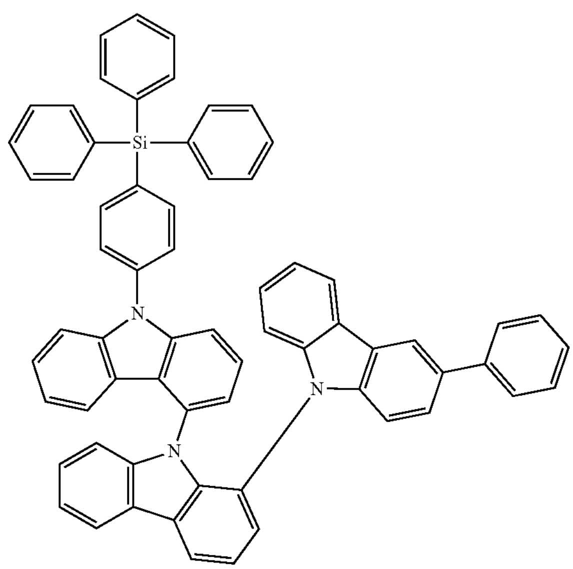

-continued
899
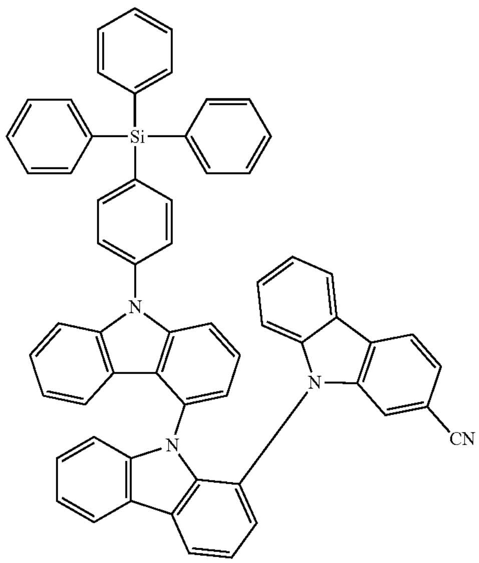
900
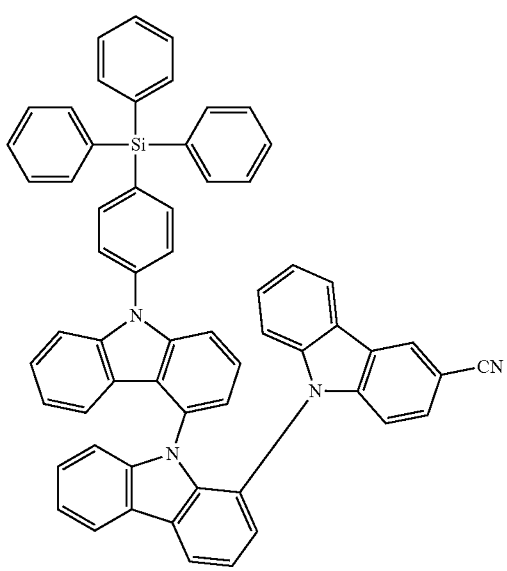
-continued
901
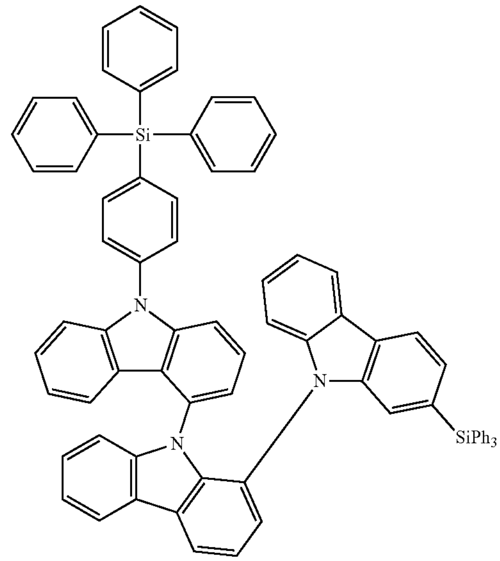
902
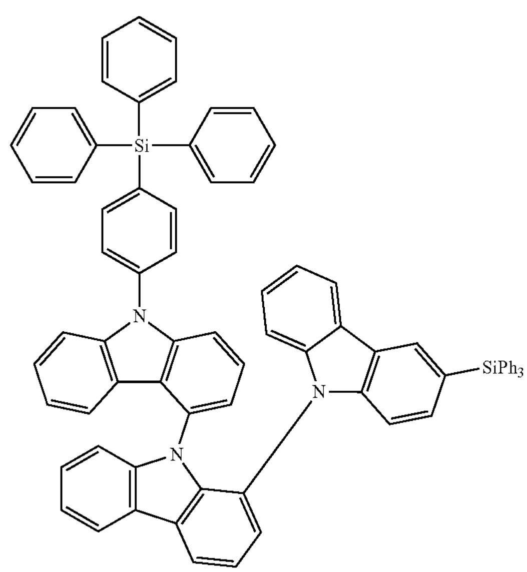

903
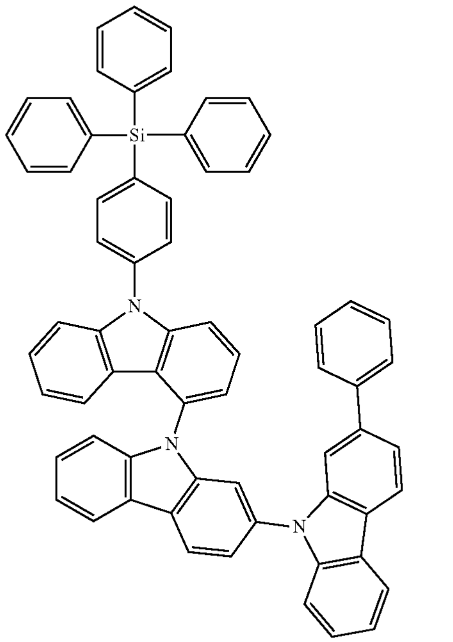
904
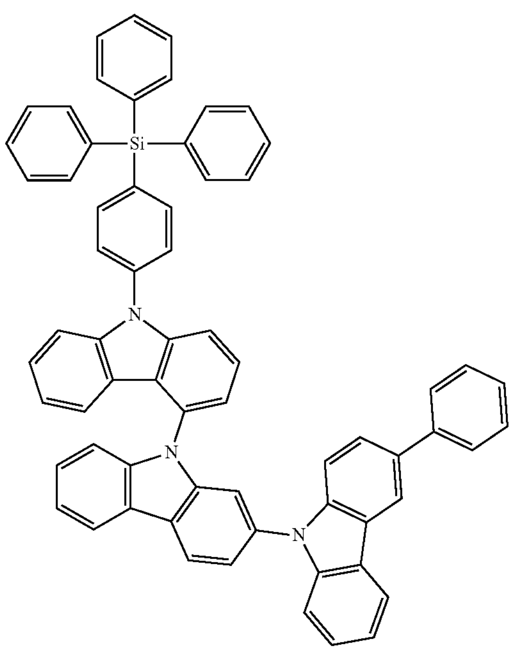
905
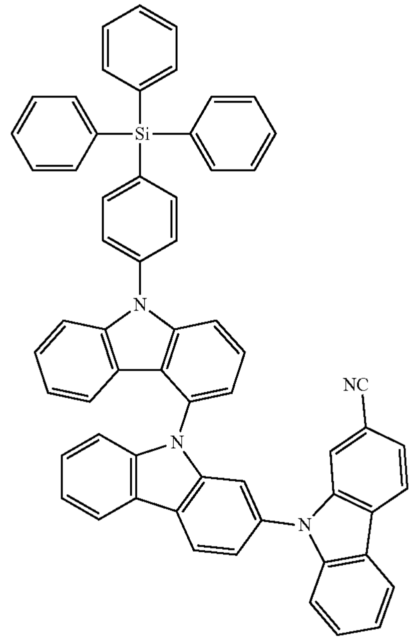
906
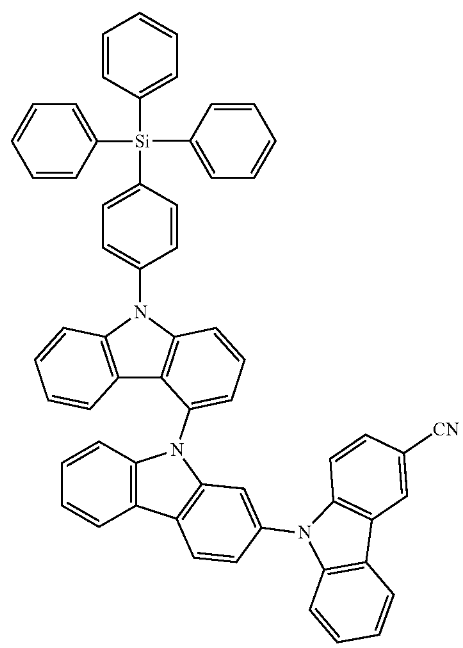

-continued
907
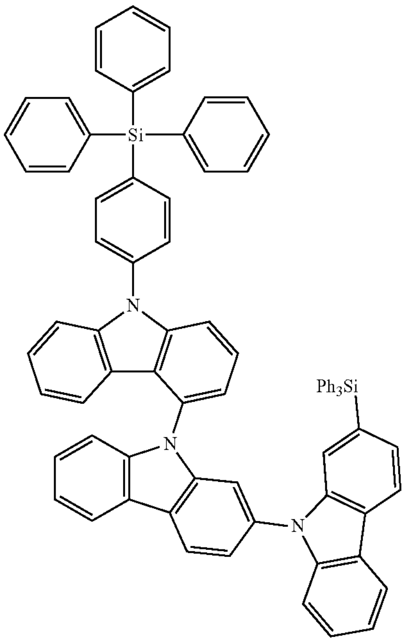
908
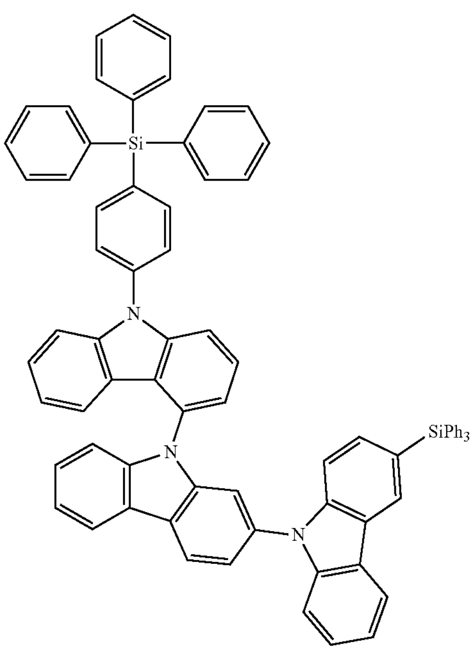
-continued
909
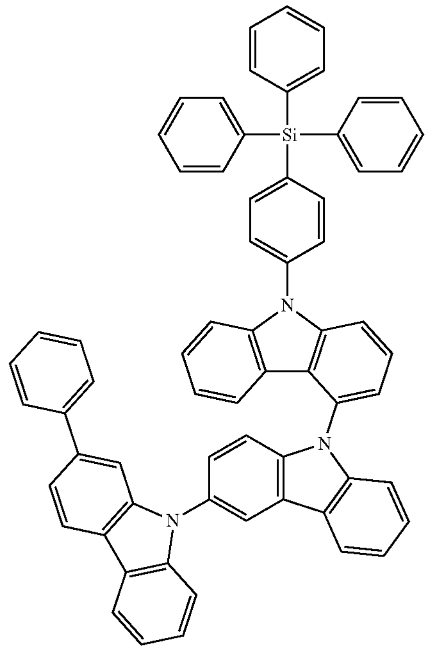
910
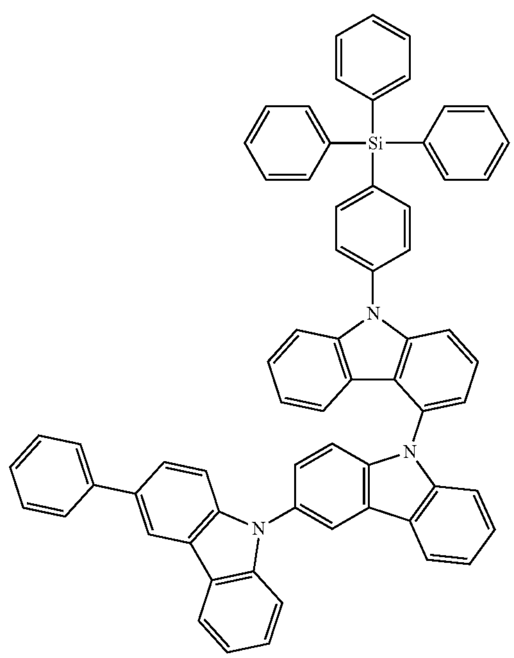

-continued
911
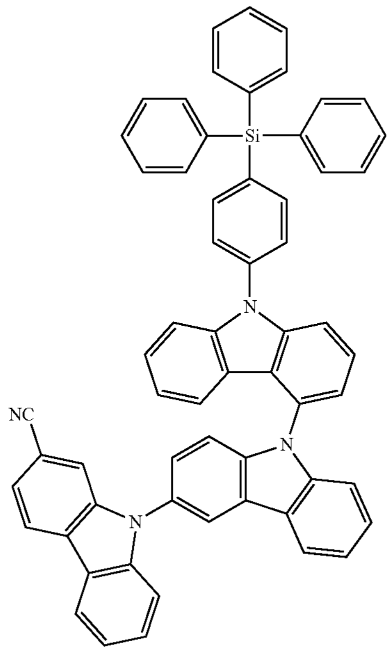
912
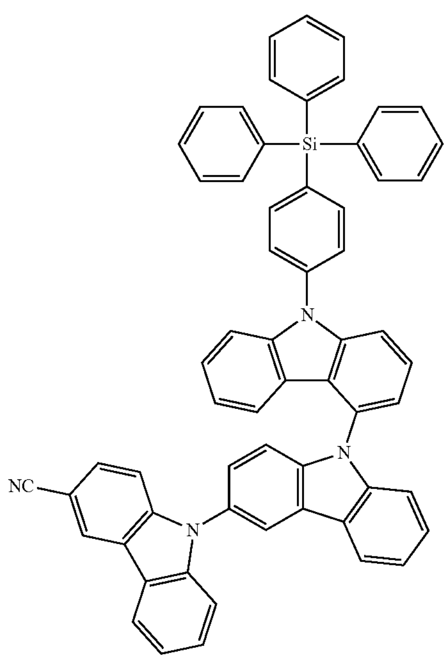
-continued
913
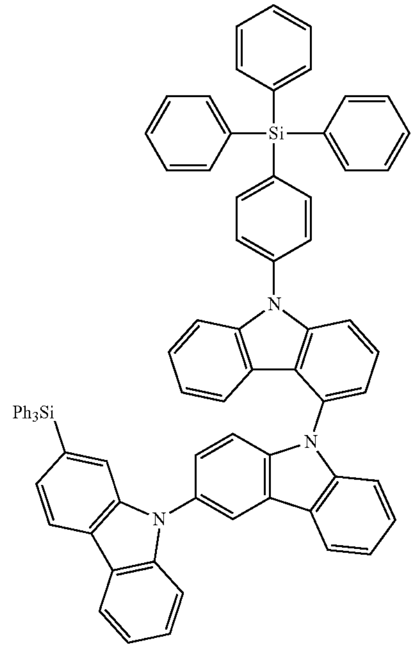
914
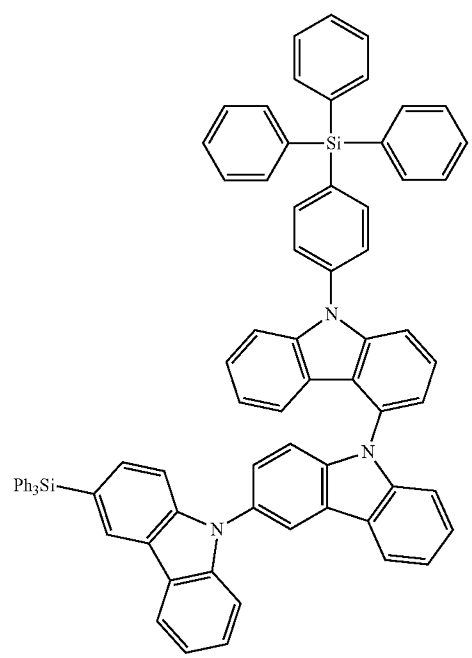

-continued
915
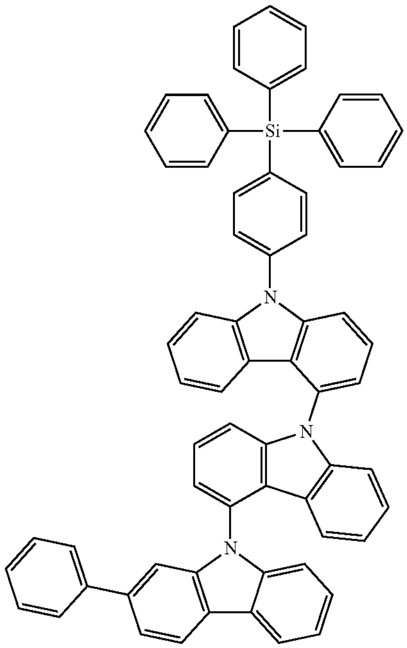
916
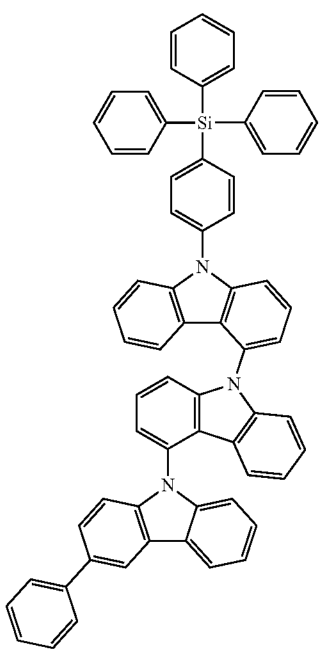
-continued
917
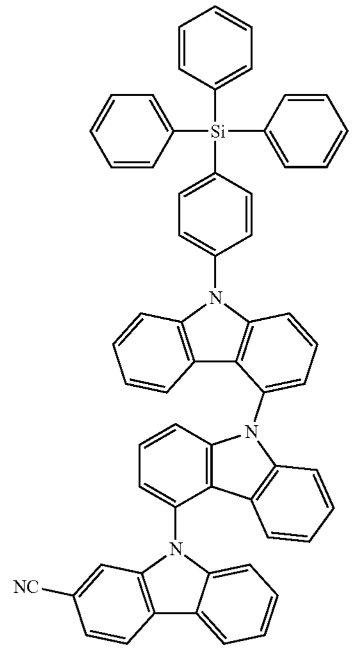
918
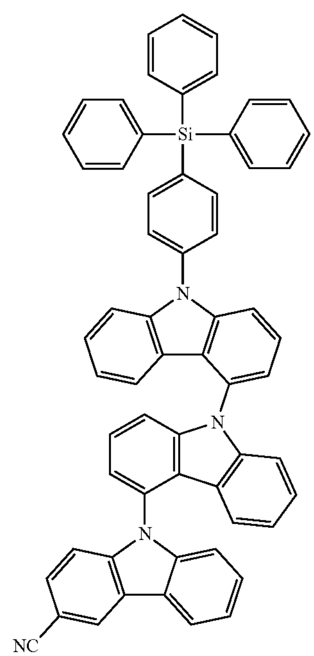

-continued
919
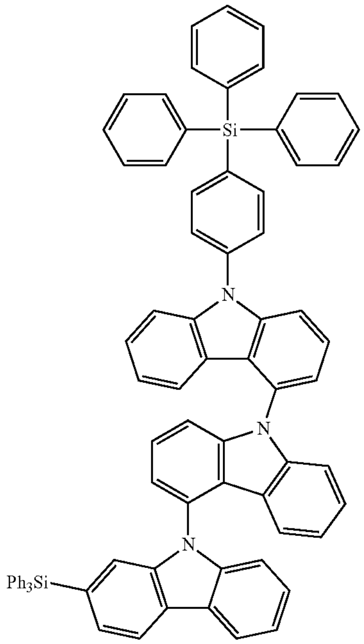
920
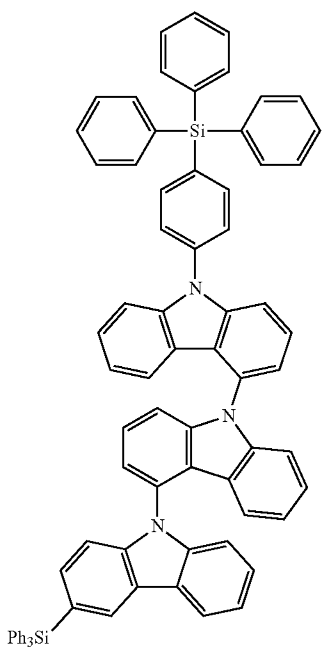
-continued
921
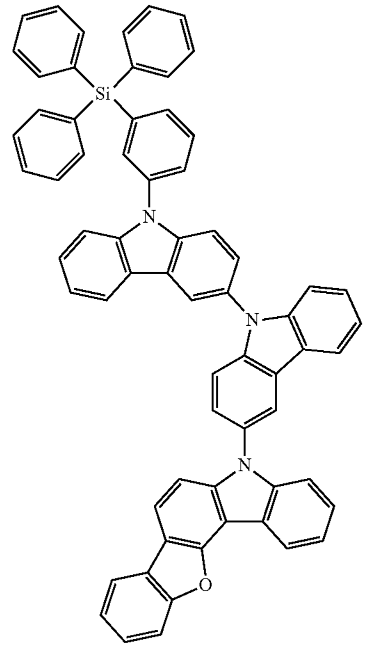
922
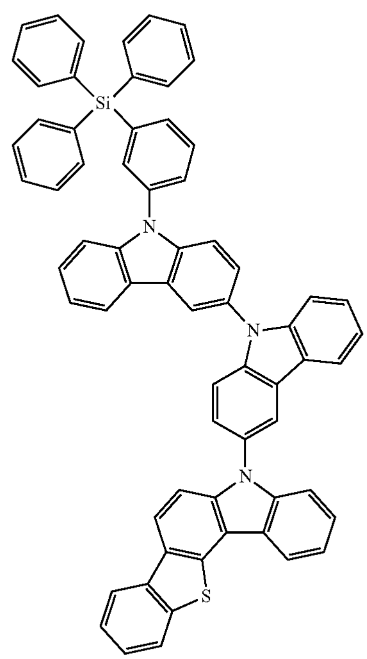

-continued
923
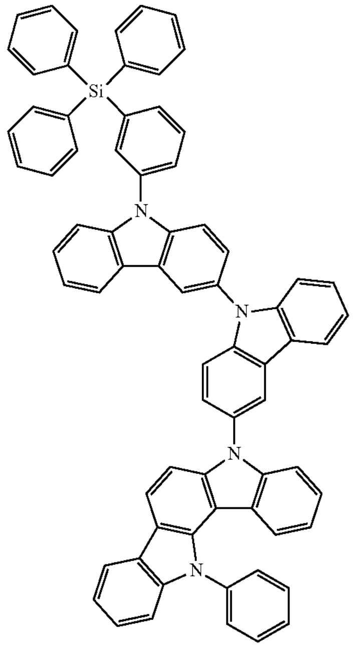
924
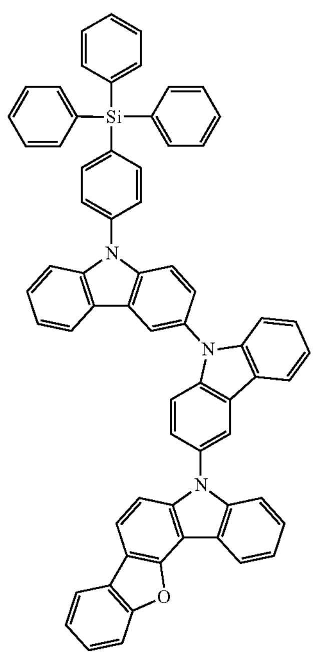
-continued
925
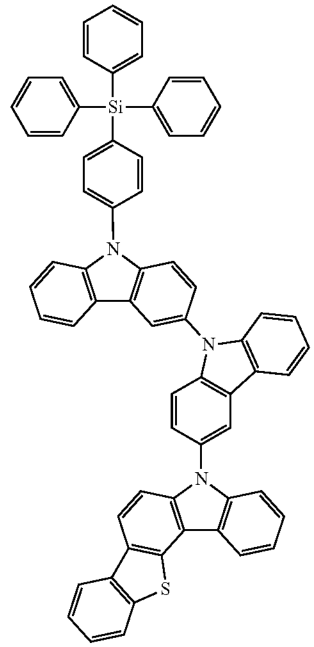
926
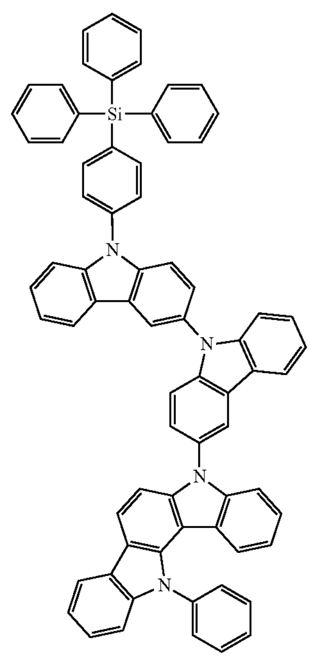

-continued
927
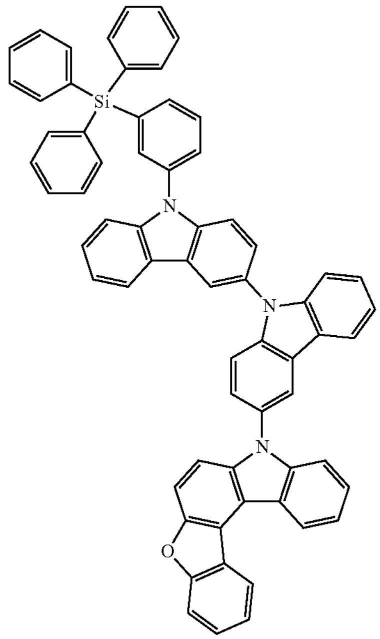
929
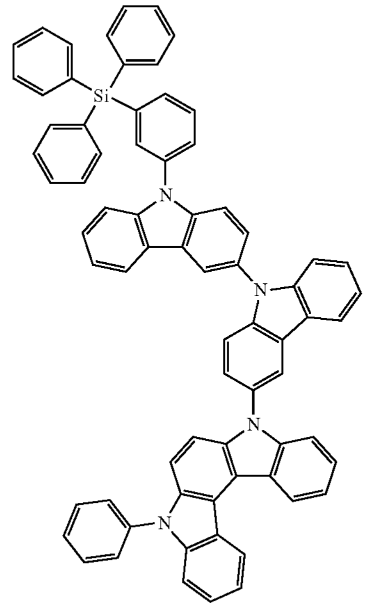
928
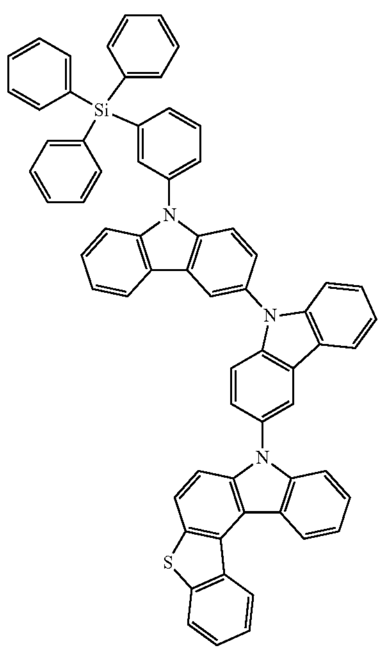
930
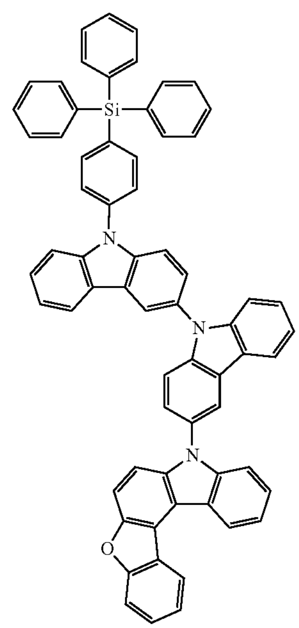
-continued 931
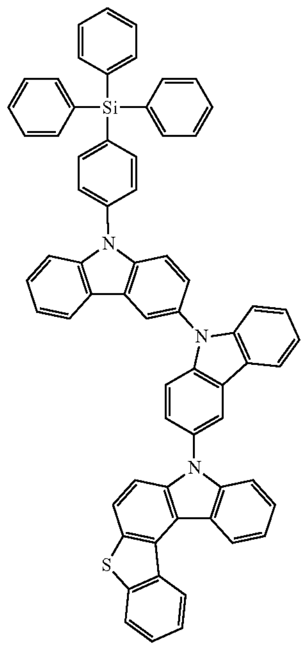
932
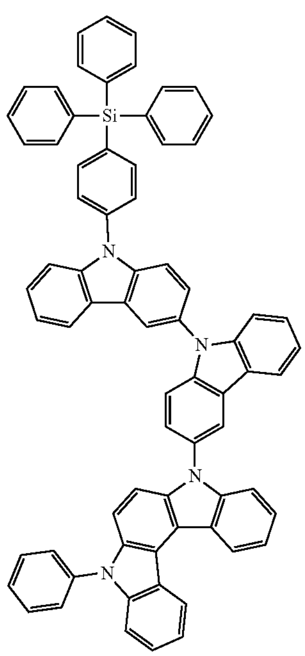
933
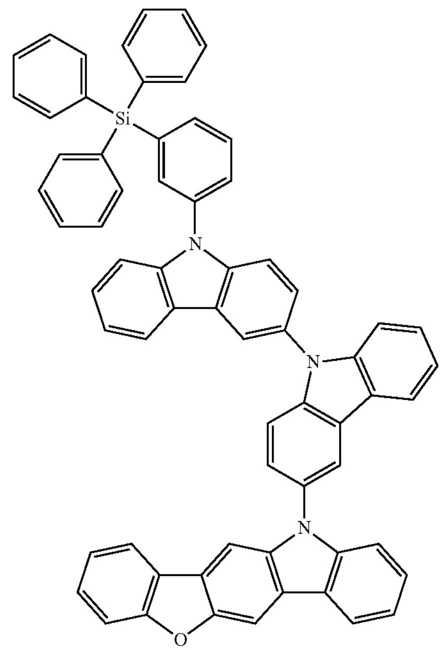
934
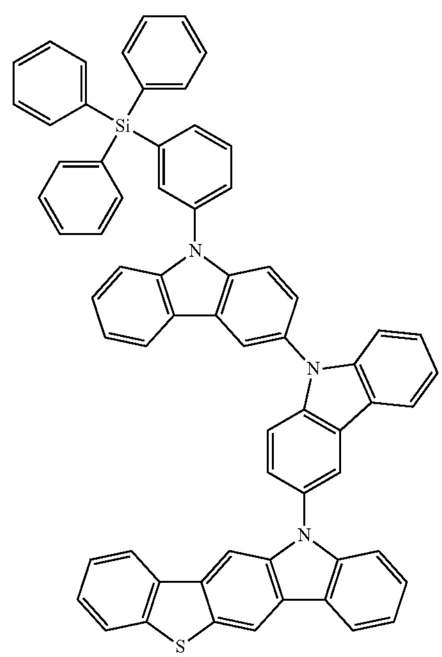

-continued
935
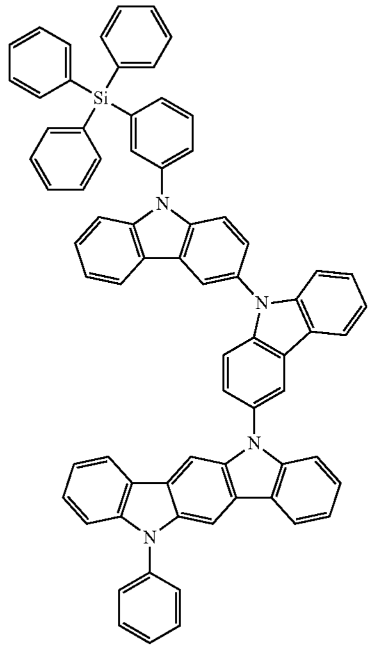
936
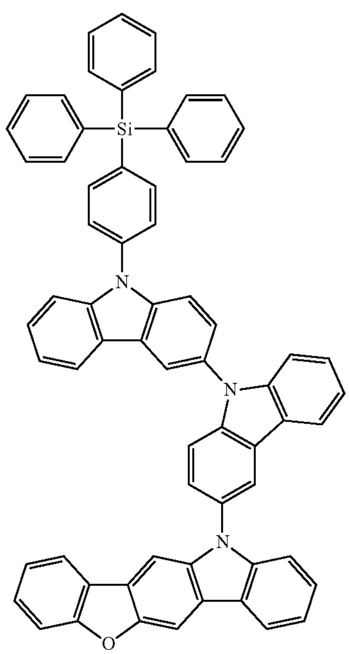
-continued
937
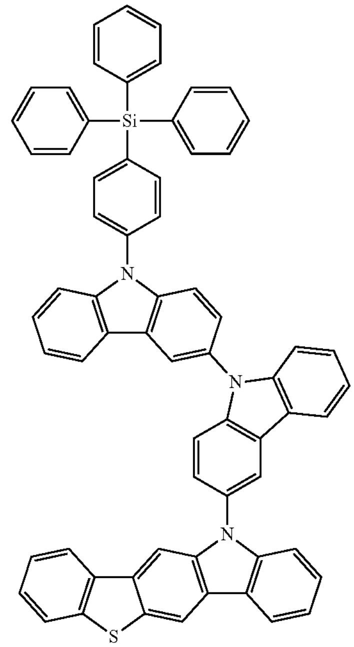
938
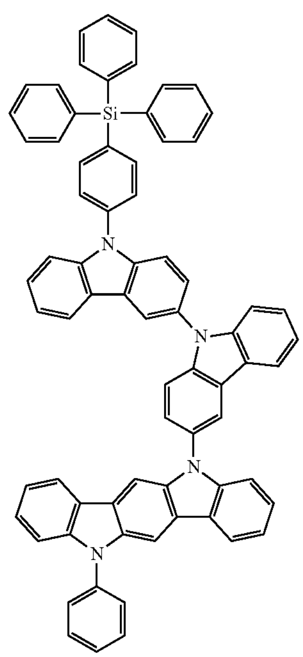

-continued
939
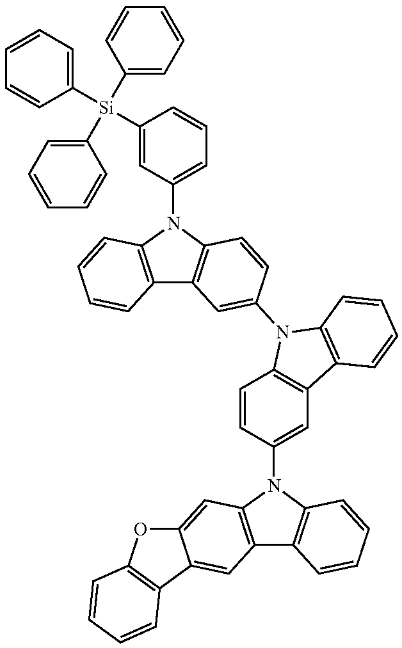
940
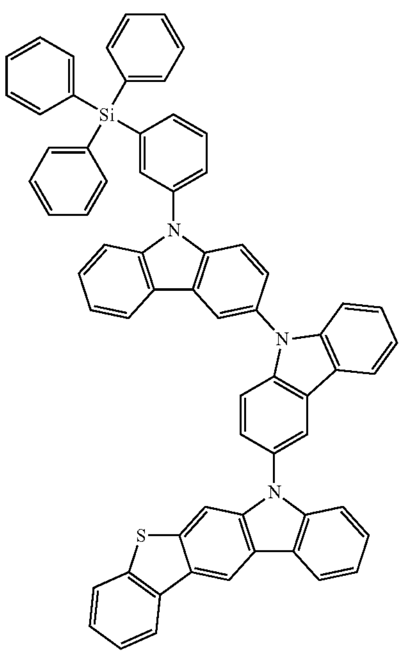
-continued
941
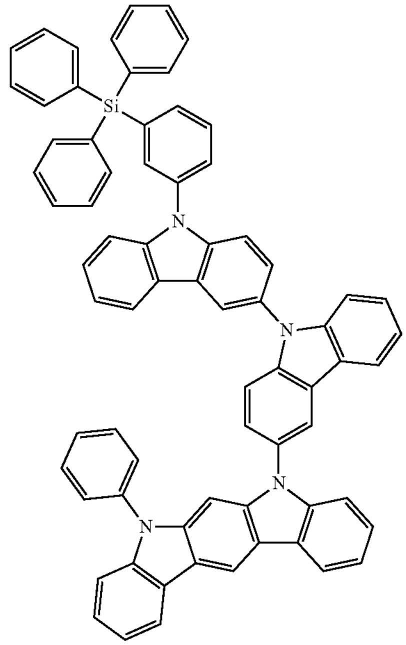
942
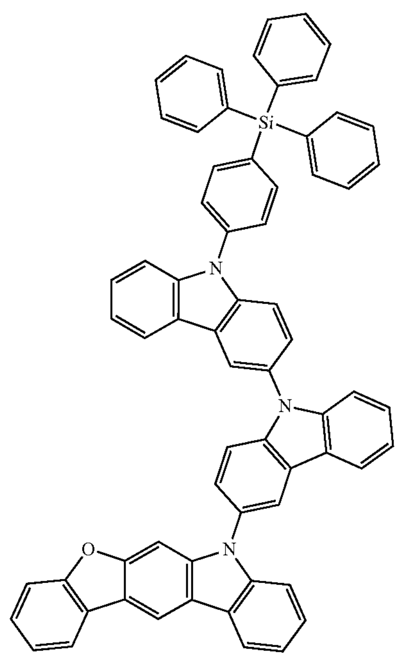

-continued
943
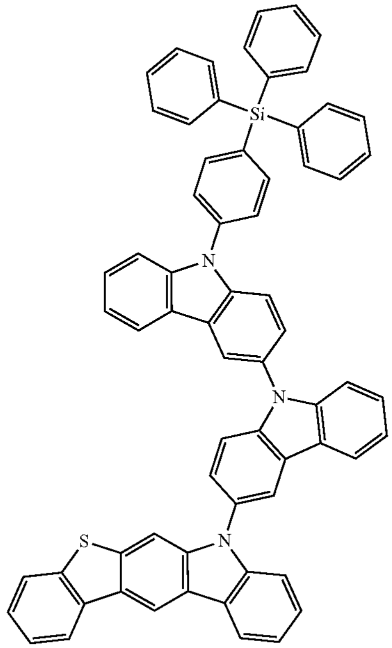
944
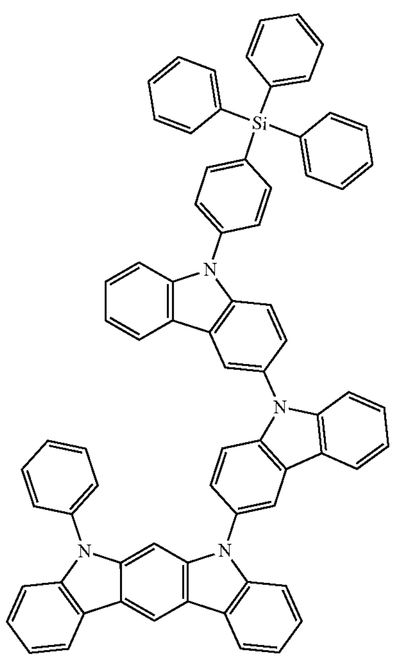
-continued
945
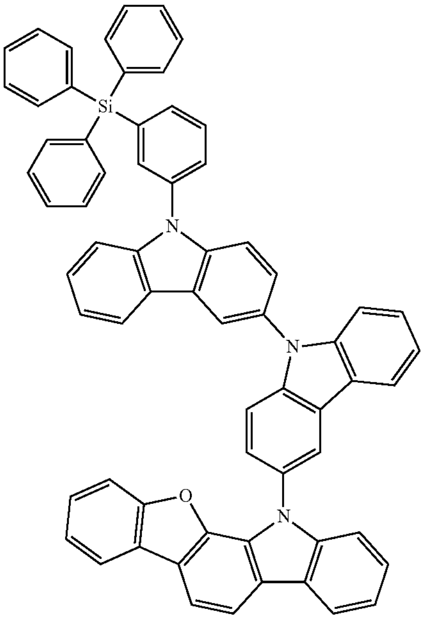
946
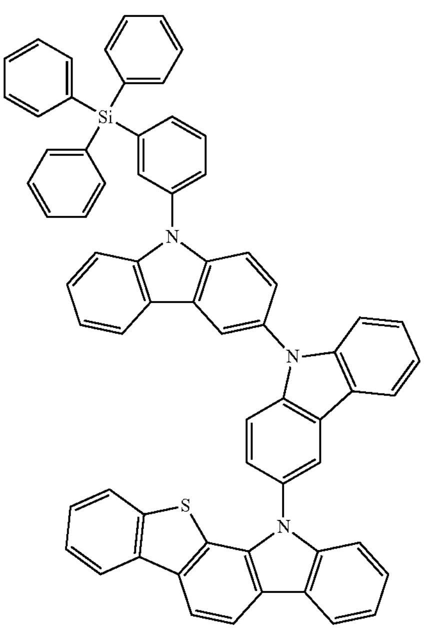

-continued
947
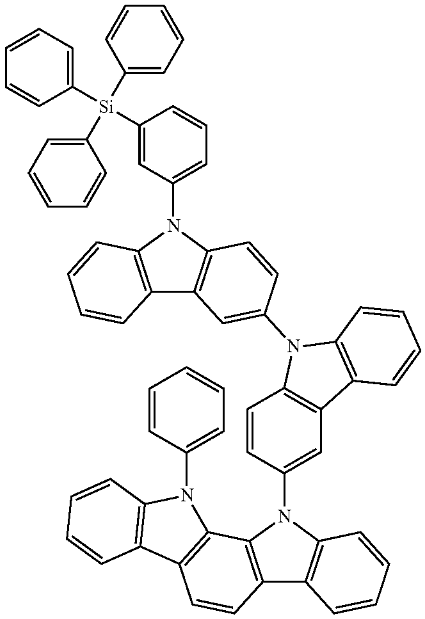
948
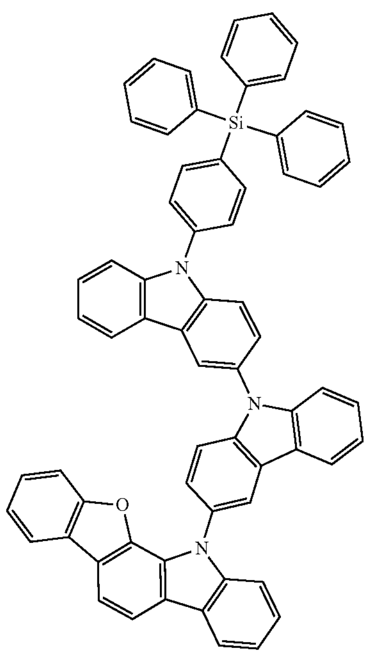
-continued
949
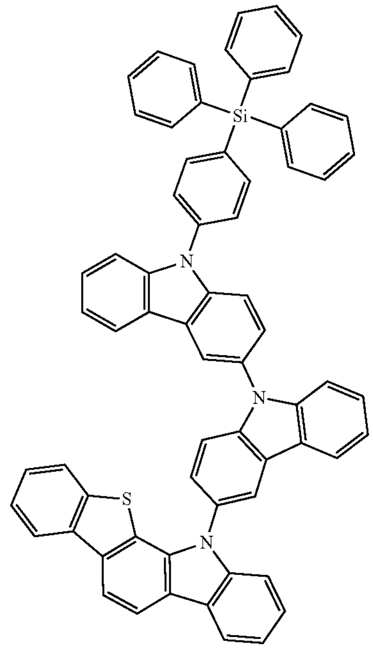
950
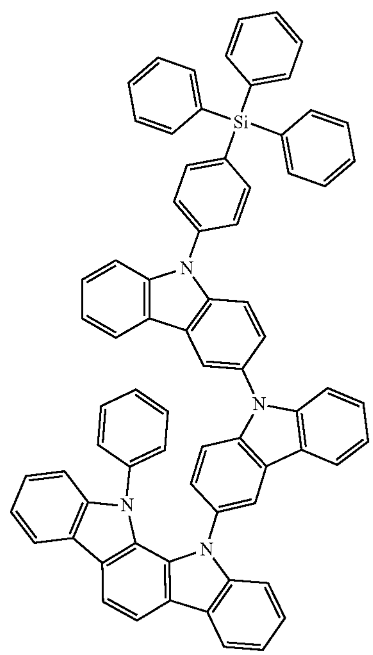

-continued
951
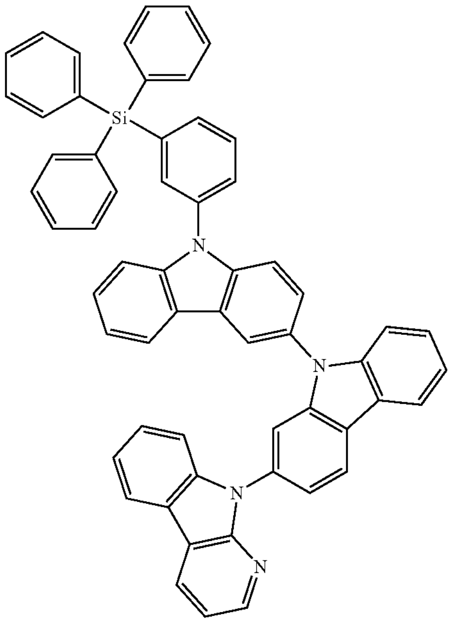
953
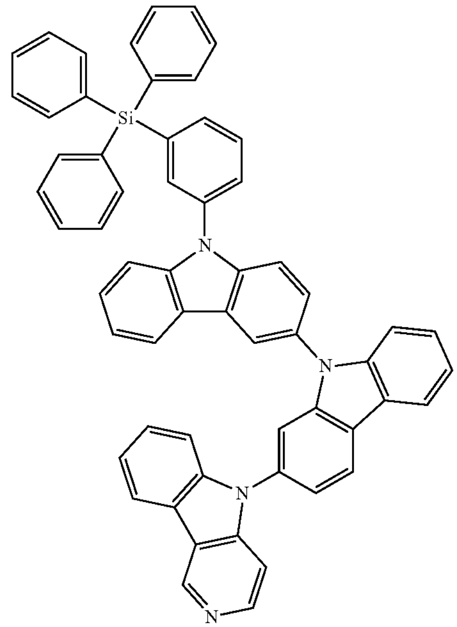
952
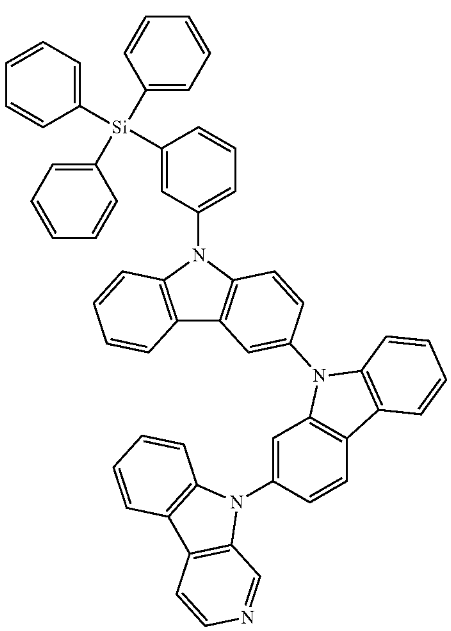
954
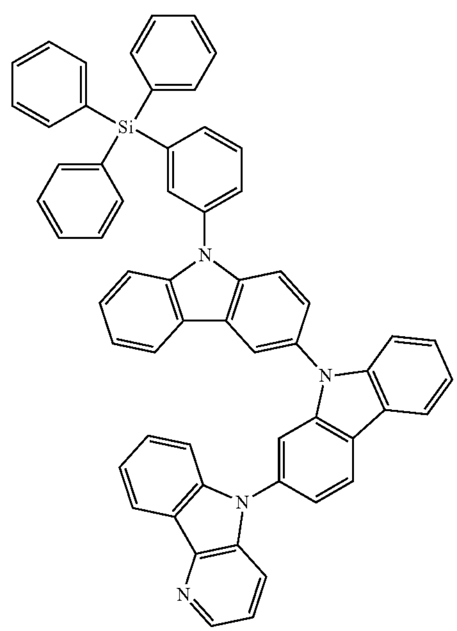

-continued
955
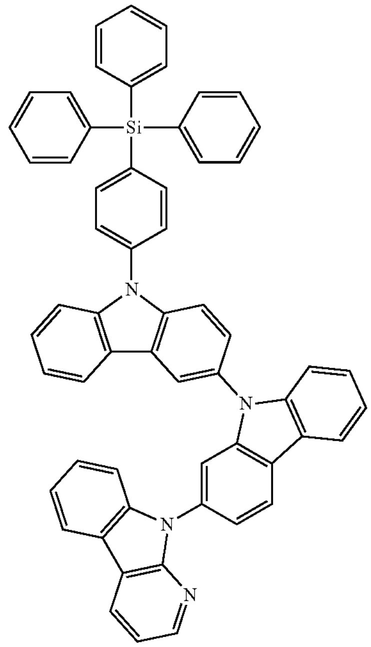
956
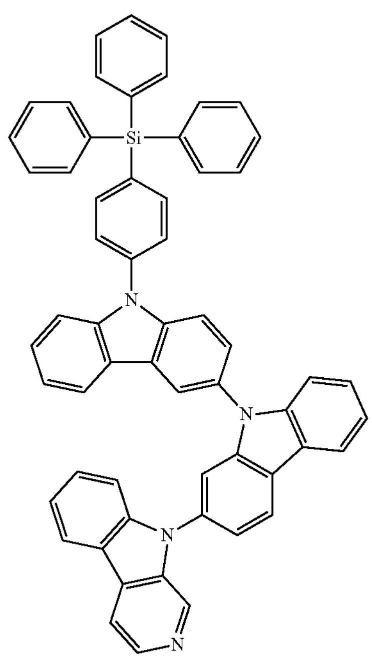
-continued
957
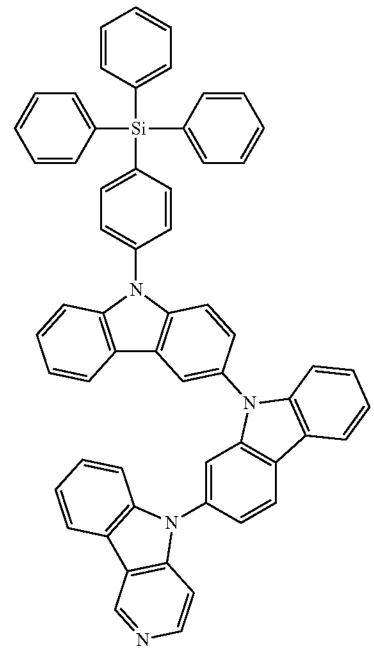
958
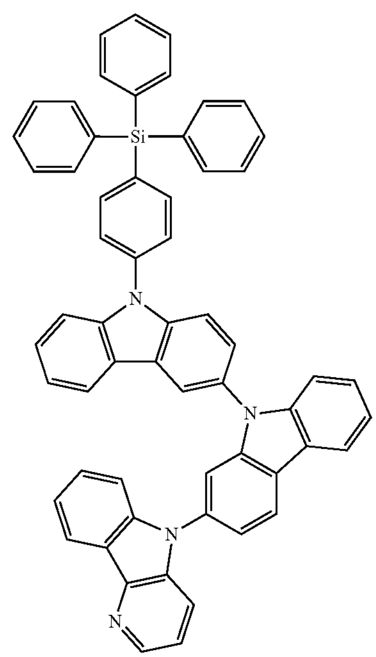

-continued
959
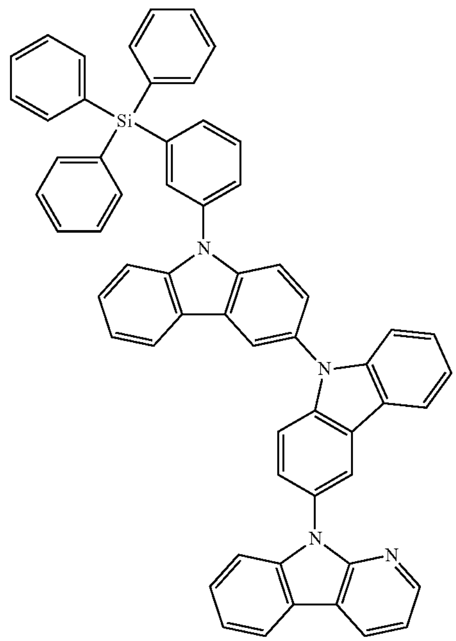
960
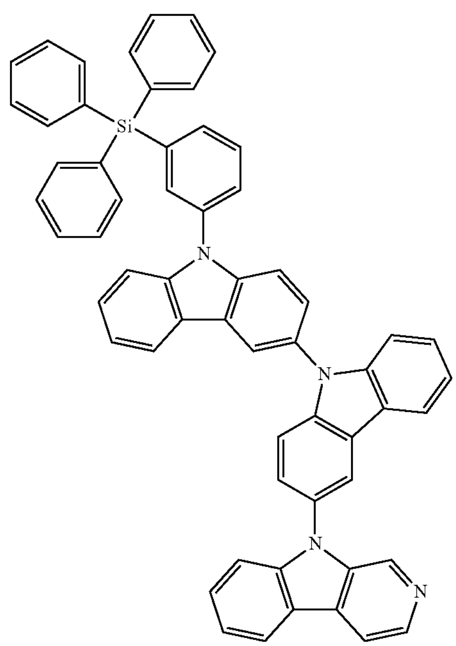
-continued
961
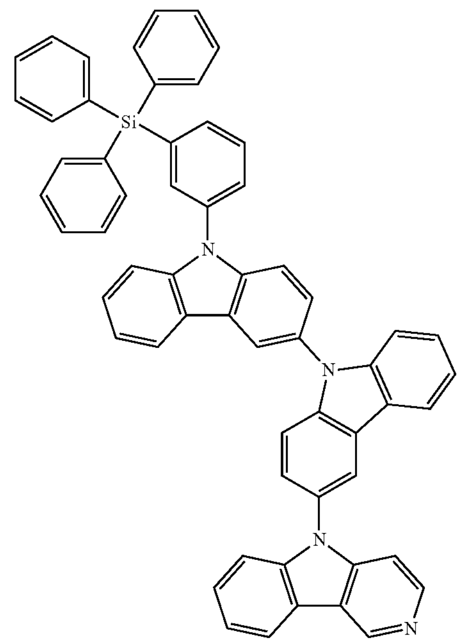
962
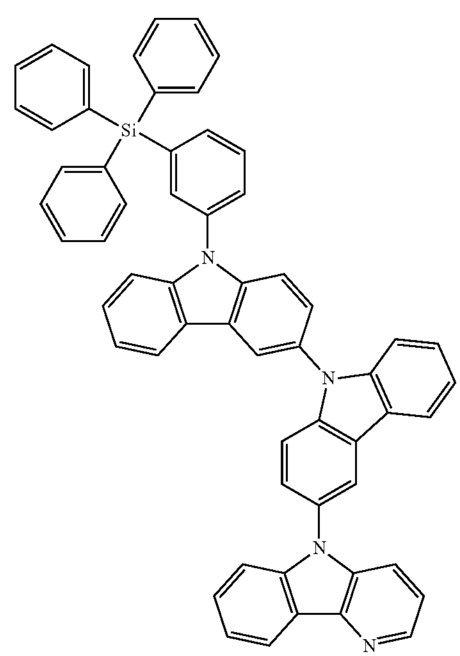

963
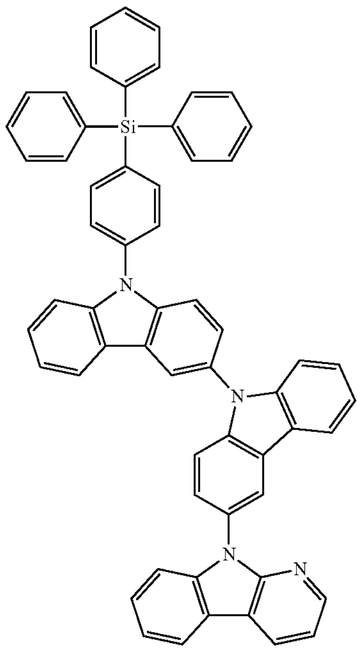
965
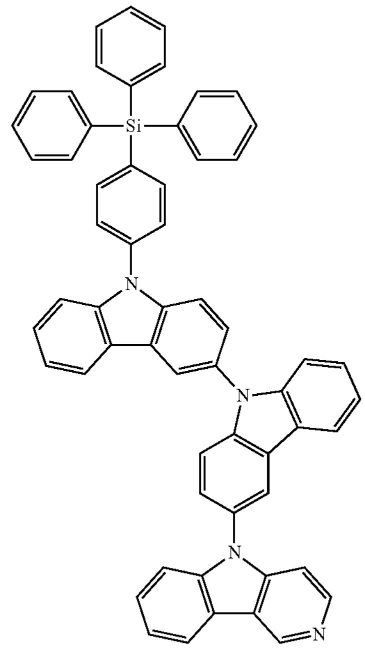
964
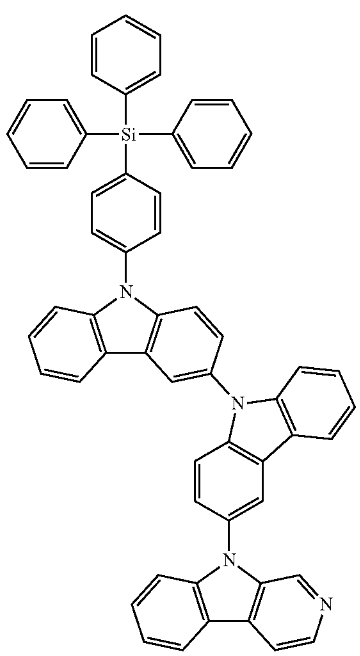
966
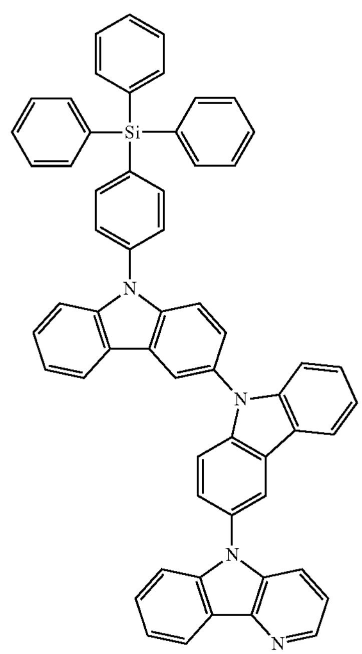

-continued
967
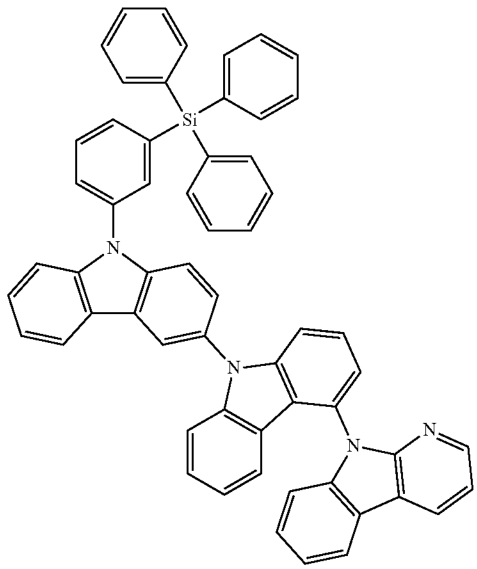
968
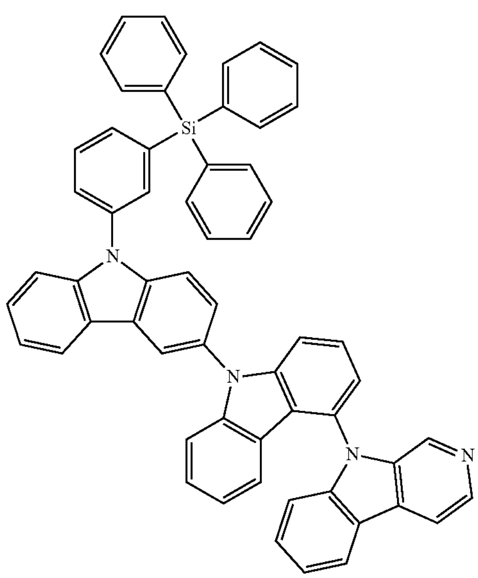
-continued
969
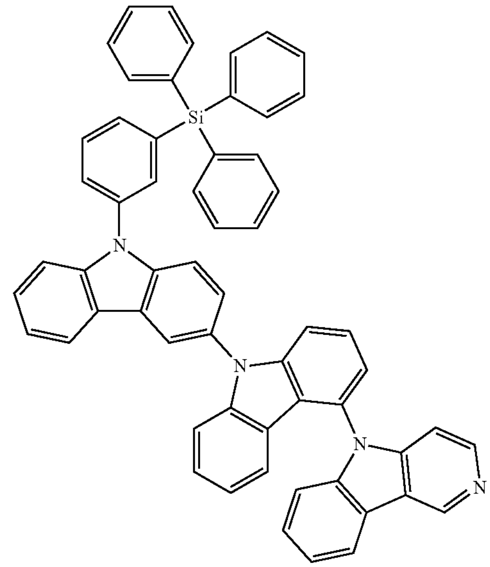
970
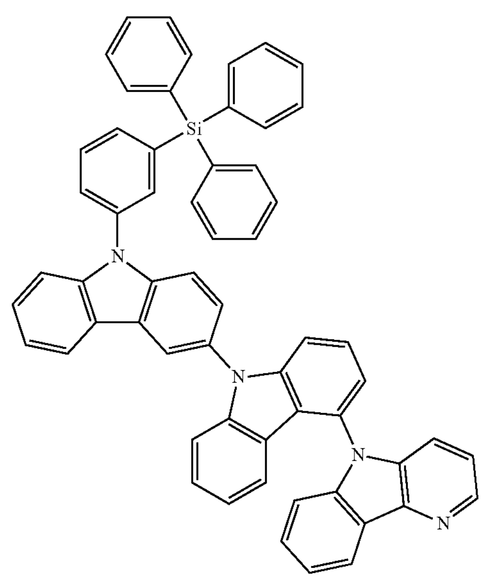

-continued
971
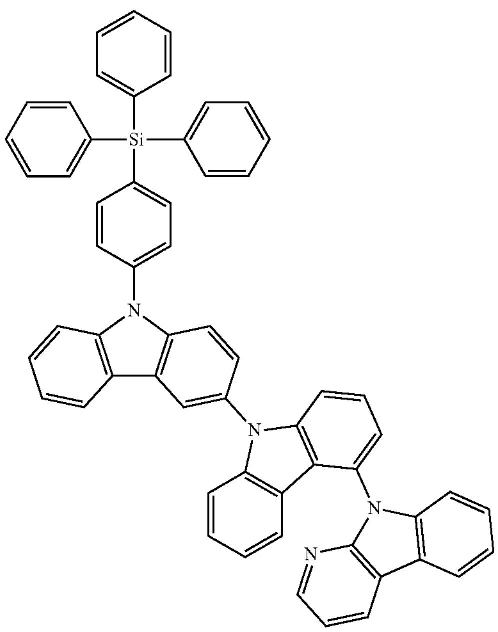
972
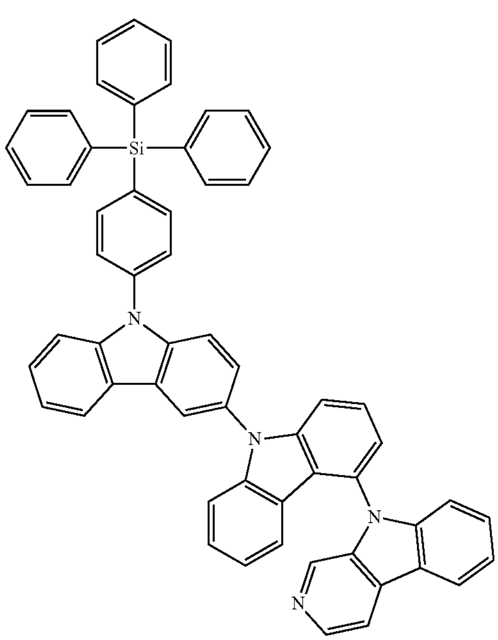
-continued
973
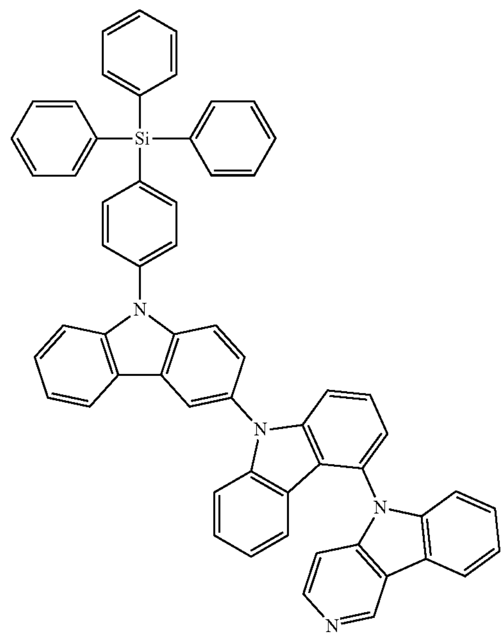
974
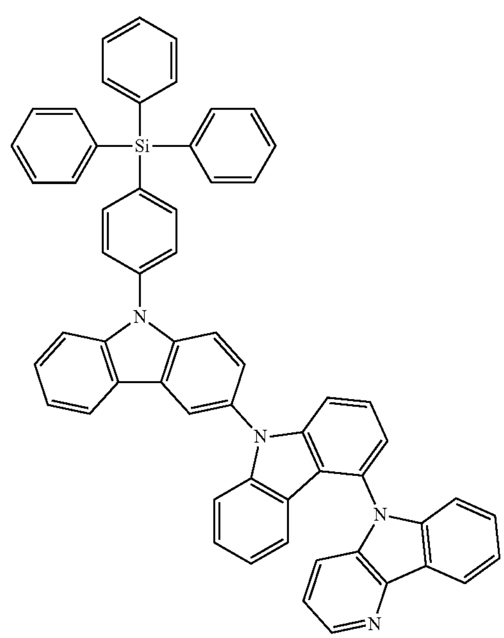

-continued
975
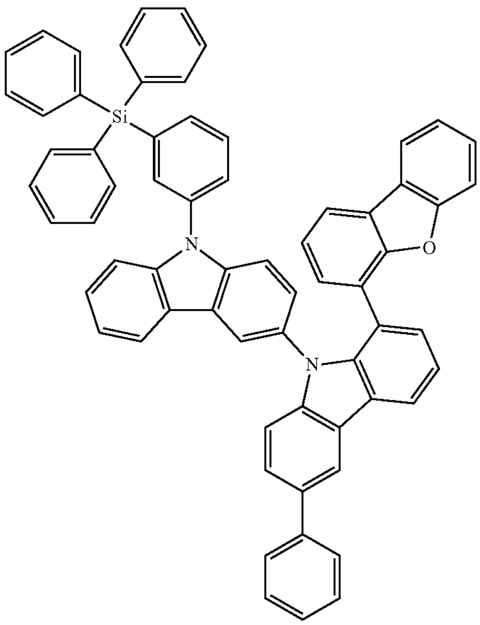
976
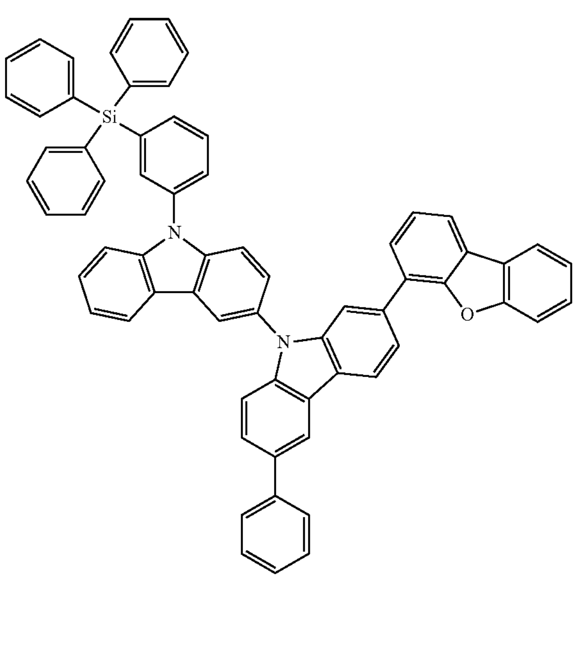
-continued
977
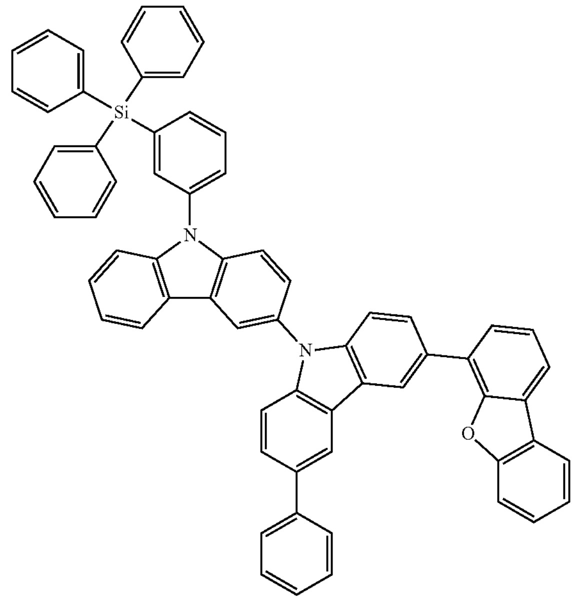
978
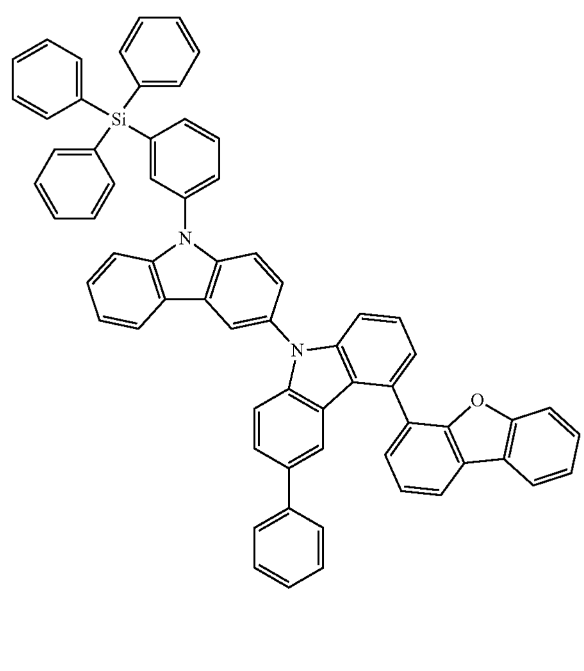

-continued
979
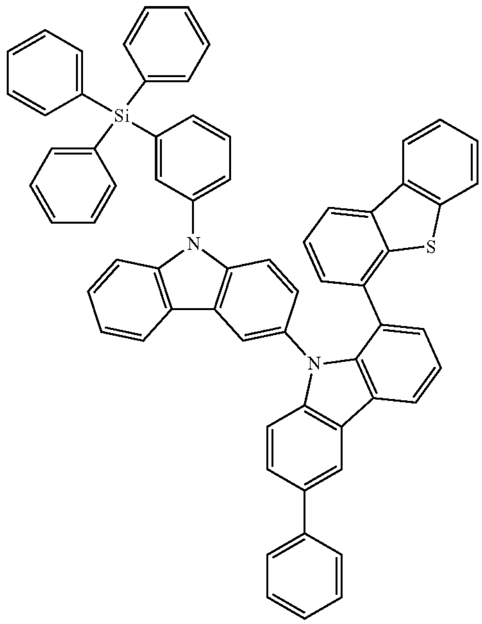
980
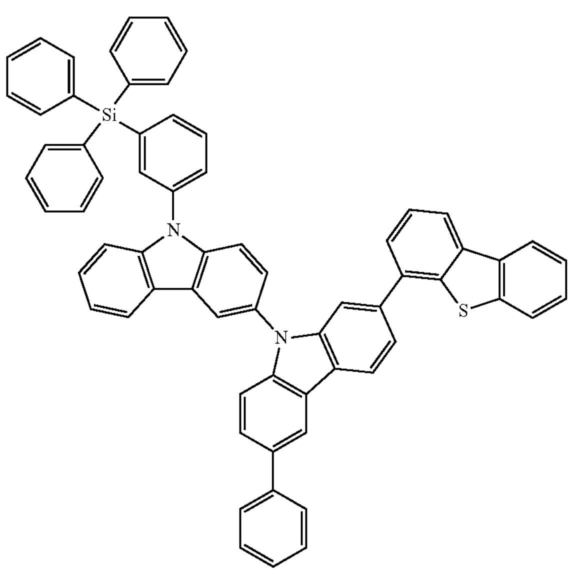
-continued
981
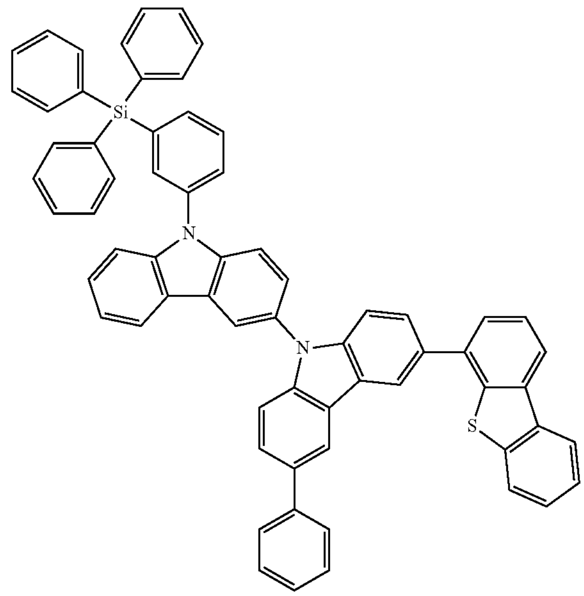
982
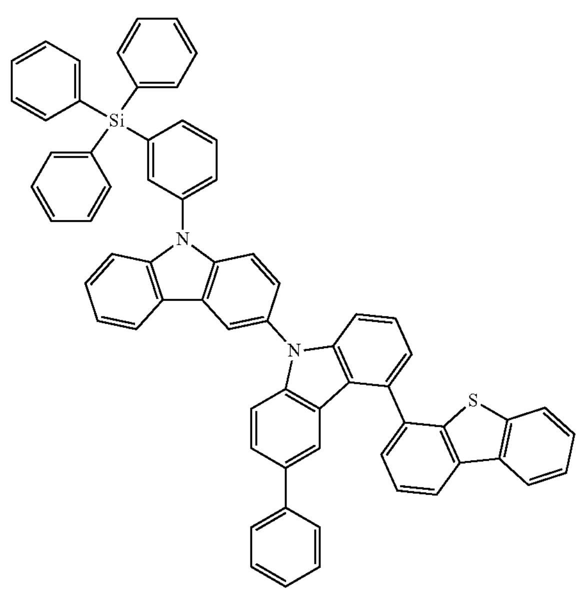

-continued
983
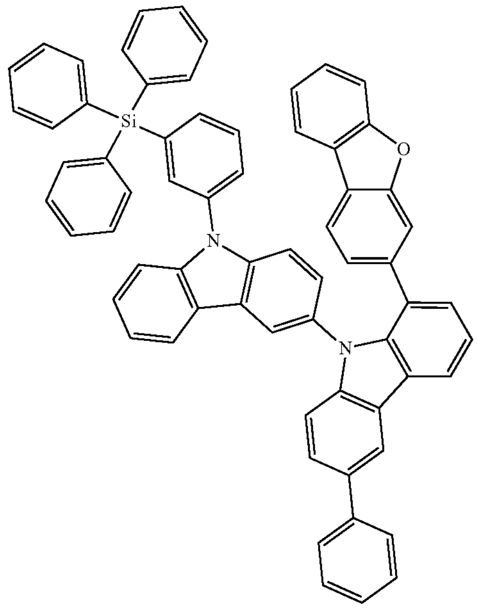
984
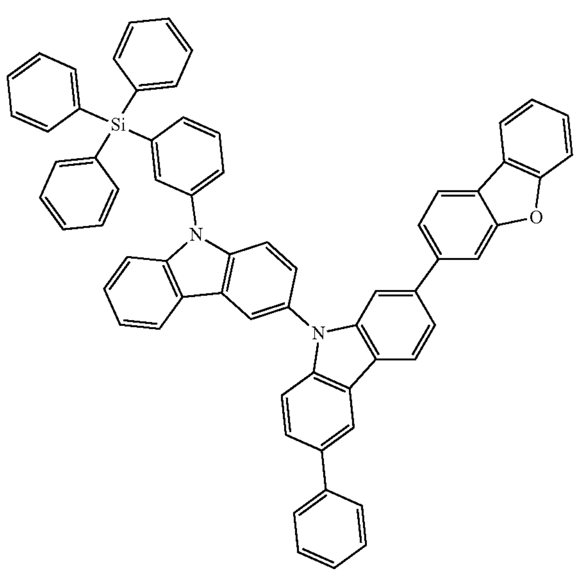
-continued
985
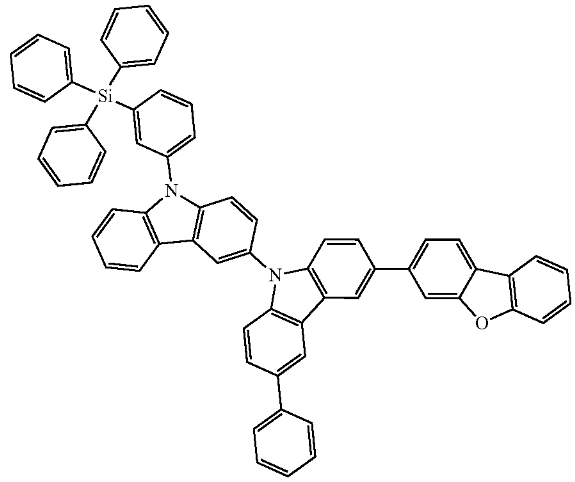
986
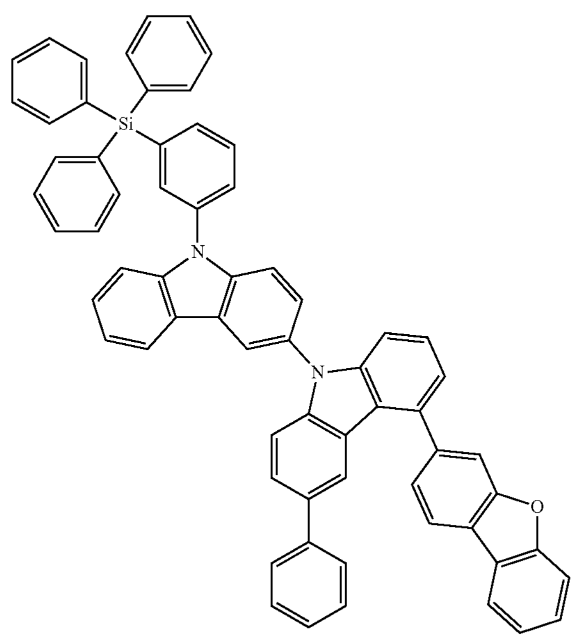

-continued
987
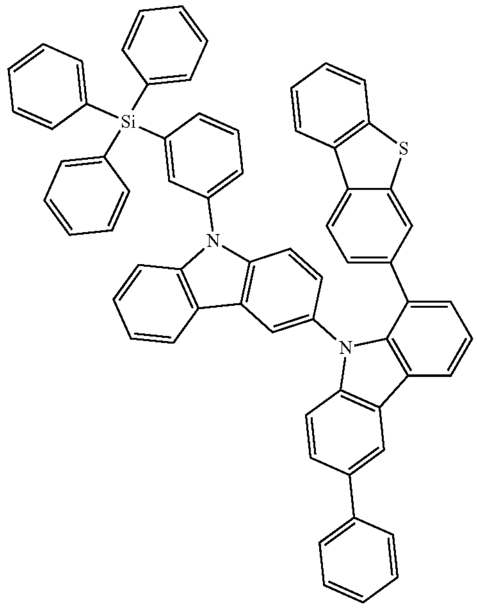
988
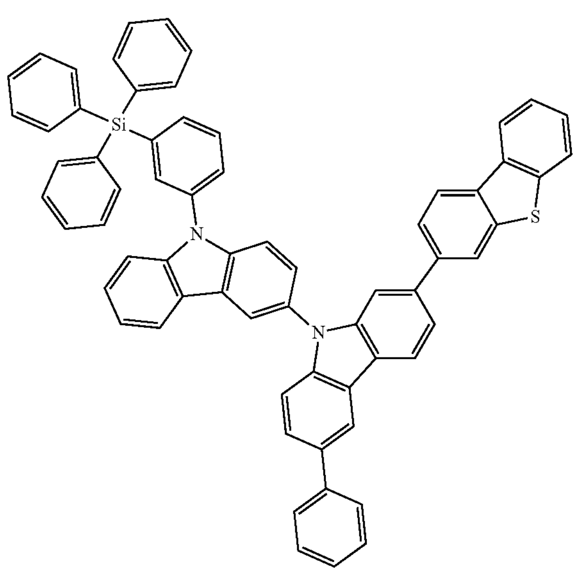
-continued
989
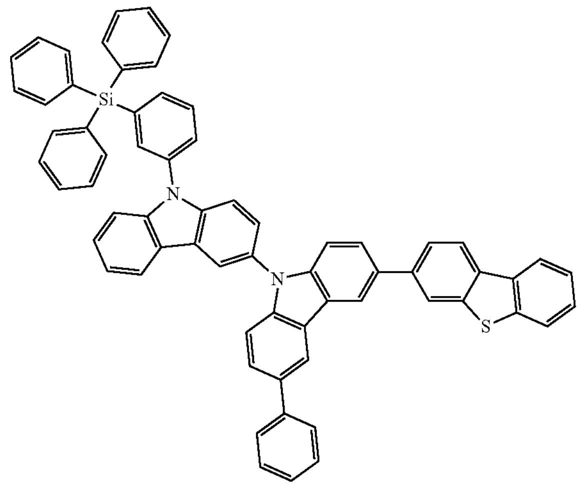
990
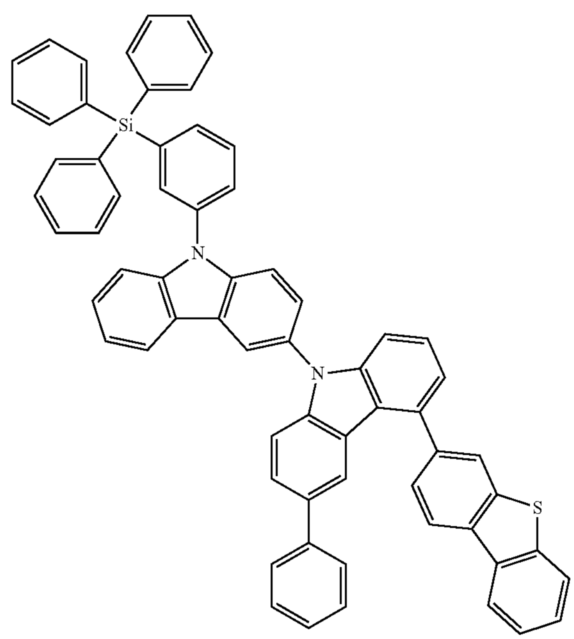

-continued
991
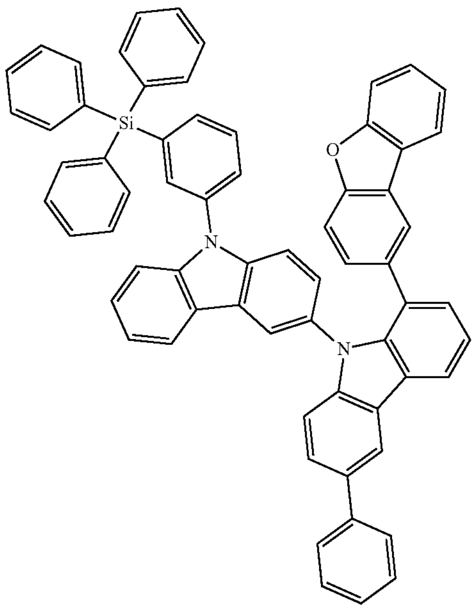
992
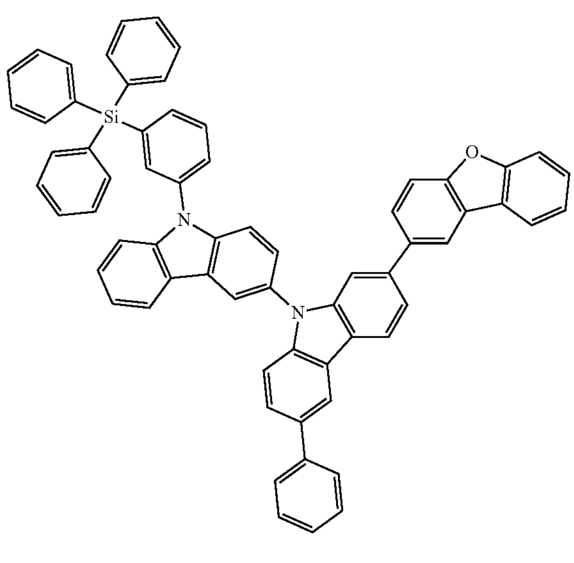
-continued
993
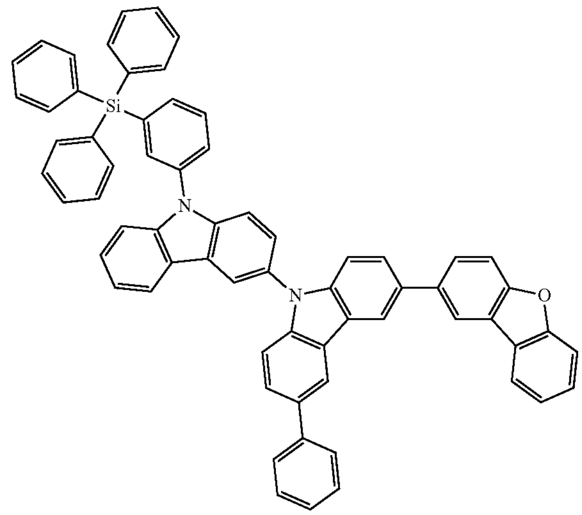
994
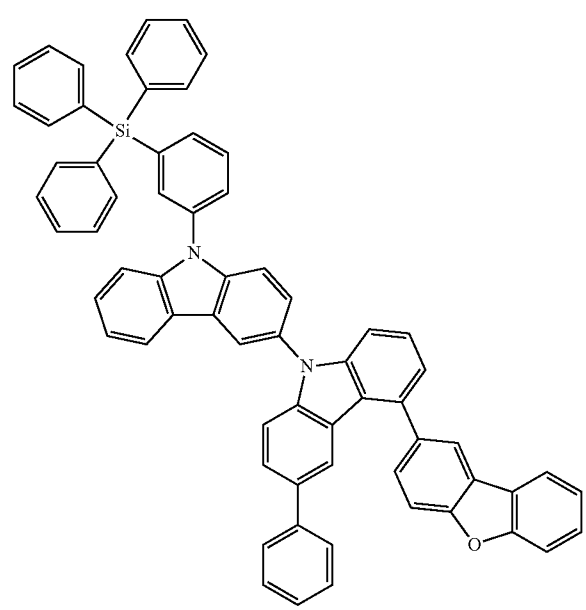

995
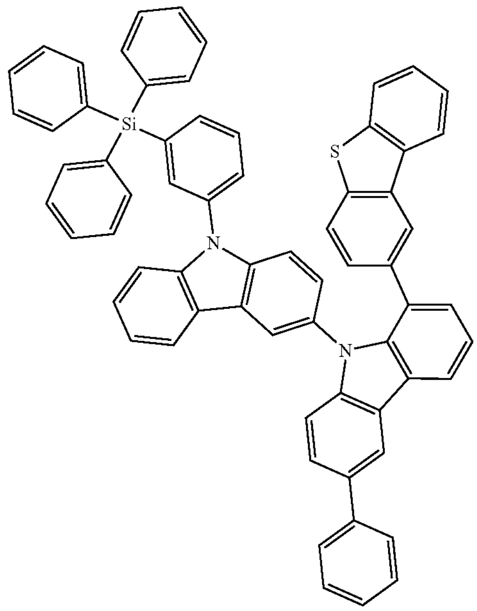
996
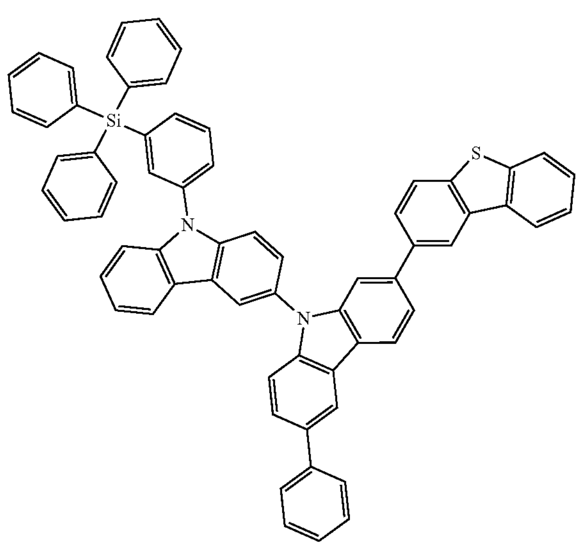
997
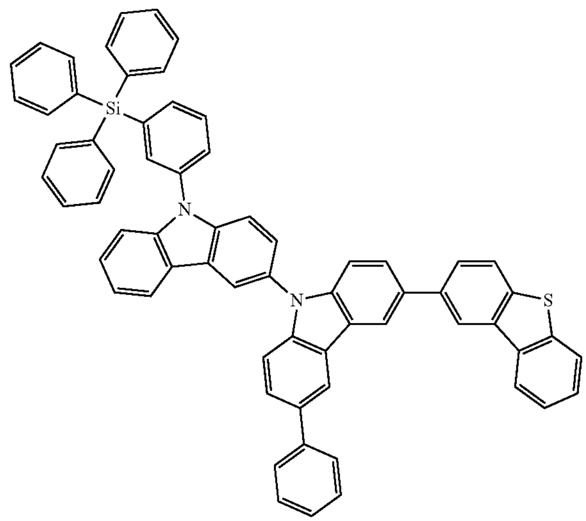
998
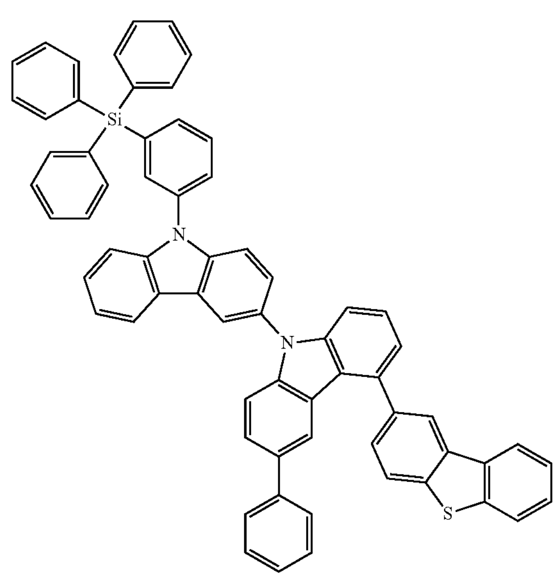

-continued
999
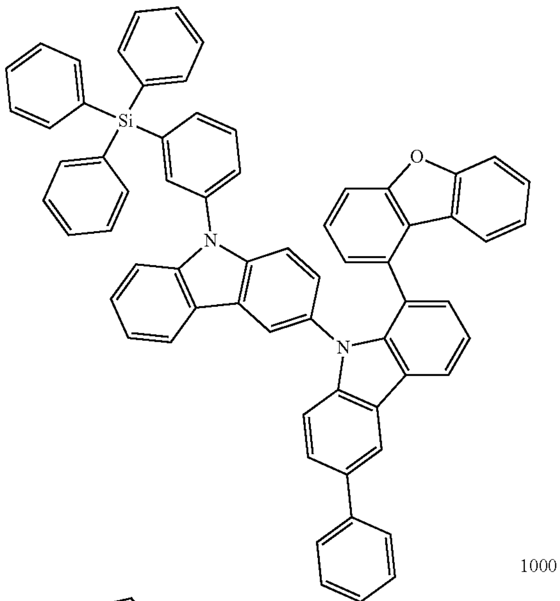
1000
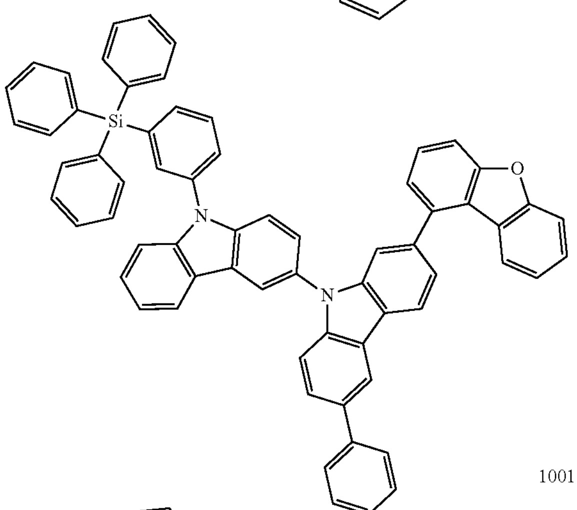
1001
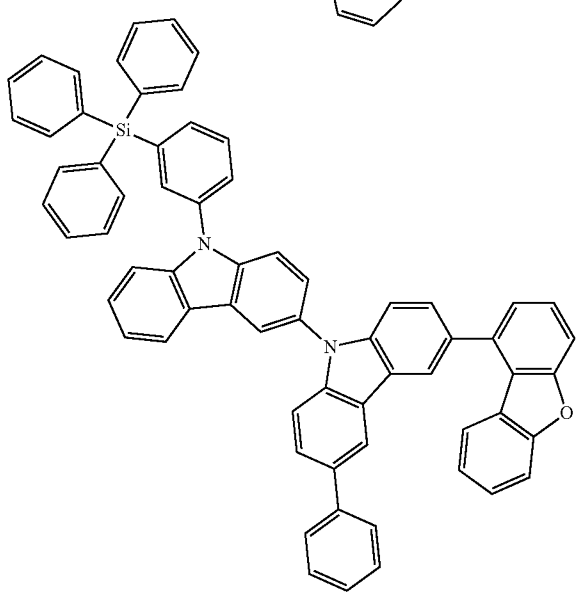
-continued
1002
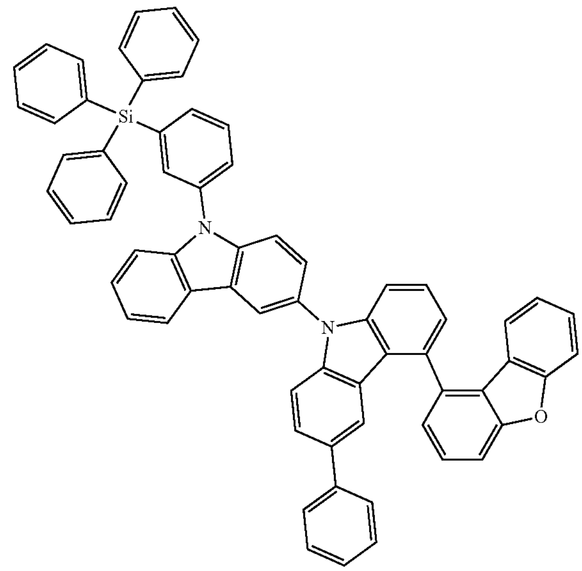
1003
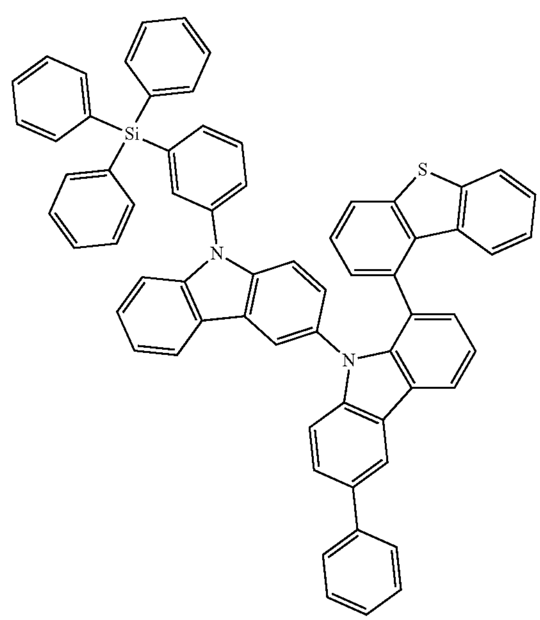

-continued

1004

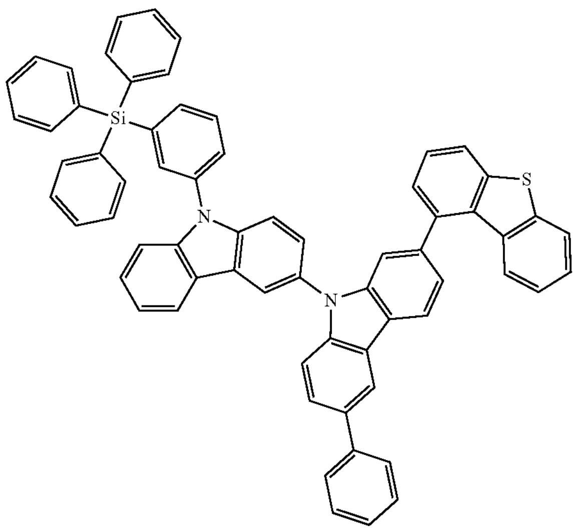

1005

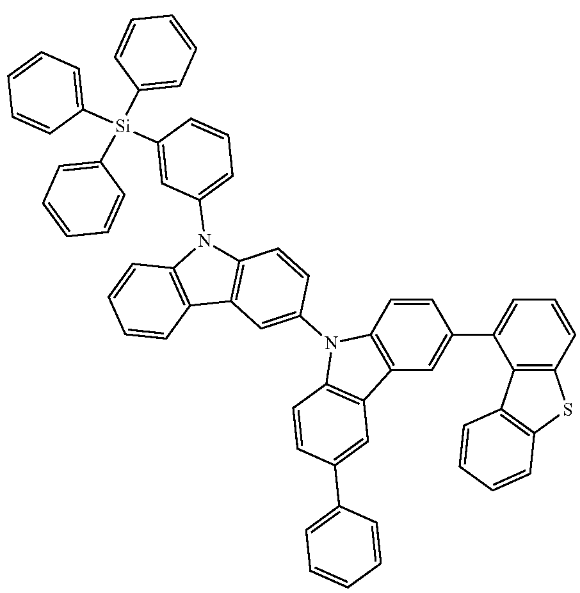

-continued

1006

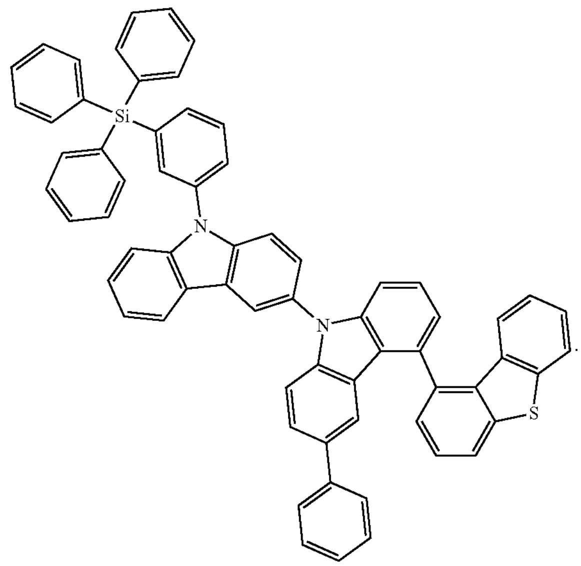

In the heterocyclic compound represented by Formula 1, silicon (Si), a benzene group, a first carbazole group, a second carbazole group, and $Ar_1$ are sequentially bonded via a single bond, and "N" of the first carbazole group is bonded to the benzene group and "N" of the second carbazole group is bonded to the first carbazole group (see Formula 1' below). As a result, it is possible to have a relatively high $T_1$ energy level and a relatively shallow highest occupied molecular orbital (HOMO) energy level, and accordingly, an electronic device, for example, an organic light-emitting device, including the heterocyclic compound represented by Formula 1, may have excellent driving voltage characteristics, excellent current efficiency characteristics, and excellent lifetime characteristics.

Formula 1'

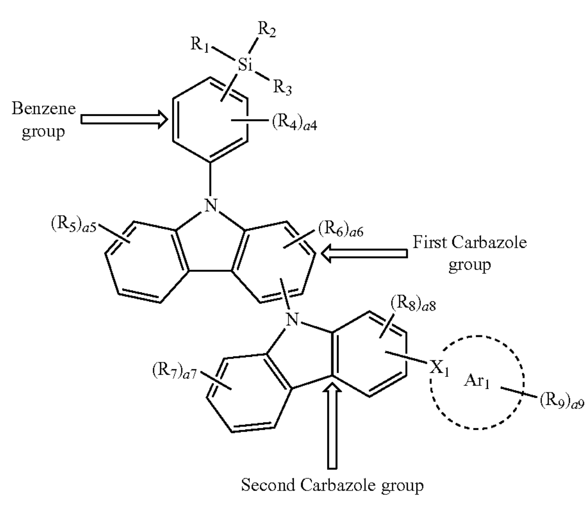

In an embodiment, the heterocyclic compound represented by Formula 1 may have a triplet energy level of about 2.85 eV or more, or, about 2.85 eV to about 3.5 eV (for example, see Table 1 below).

In an embodiment, the absolute value of the HOMO energy level of the heterocyclic compound represented by Formula 1 may be in the range of about 5.2 eV or less, about 5.1 eV or less, about 4.8 eV to about 5.2 eV, or about 5.0 eV to about 5.1 eV (for example, see Table 1 below)).

The triplet energy level, and the HOMO energy level may be evaluated by a density functional theory (DFT).

In an embodiment, the HOMO energy level, lowest unoccupied molecular orbital (LUMO) energy level, triplet ($T_1$) energy level, and singlet ($S_1$) energy level of compounds belonging to the heterocyclic compound represented by Formula 1 and Compounds A1, A2, B1, B2, B3 and C are evaluated by the structure-optimized DFT (for example, the DFT method of the Gaussian program) at the B3LYP/6-31G (d,p) level, and evaluation results thereof are shown in Table 1:

TABLE 1

| Compound No. | HOMO (eV) | LUMO (eV) | $T_1$ (eV) | $S_1$ (eV) |
|---|---|---|---|---|
| 11 | −5.031 | −1.016 | 3.153 | 3.594 |
| 27 | −5.040 | −1.064 | 3.012 | 3.577 |
| 238 | −5.042 | −0.944 | 2.852 | 3.578 |
| 715 | −5.075 | −1.112 | 2.913 | 3.403 |
| A1 | −5.223 | −1.477 | 2.752 | 3.091 |
| A2 | −4.840 | −0.970 | 2.795 | 3.578 |
| B1 | −5.058 | −1.205 | 2.486 | 3.289 |
| B2 | −5.270 | −1.044 | 2.806 | 3.814 |
| B3 | −5.288 | −0.738 | 3.080 | 3.961 |

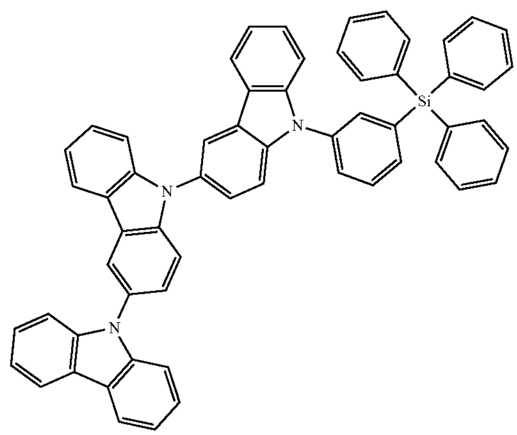

11

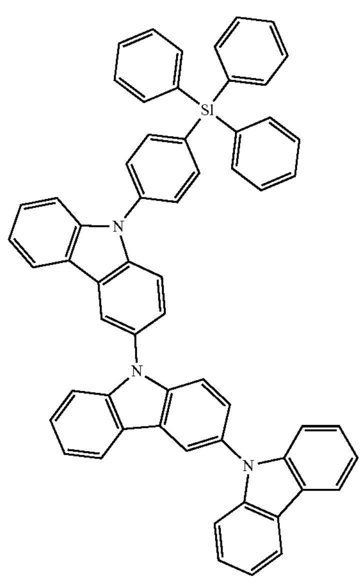

27

TABLE 1-continued
| Compound No. | HOMO (eV) | LUMO (eV) | $T_1$ (eV) | $S_1$ (eV) |
|---|---|---|---|---|
| 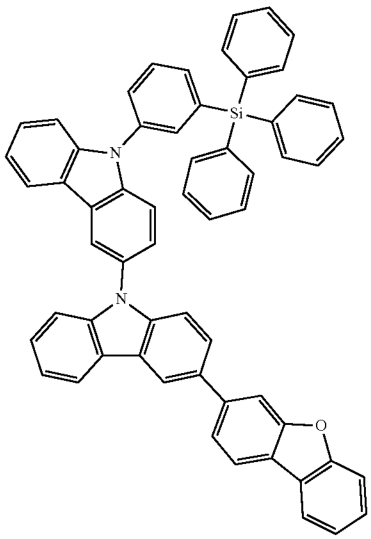 238 | | | | |
| 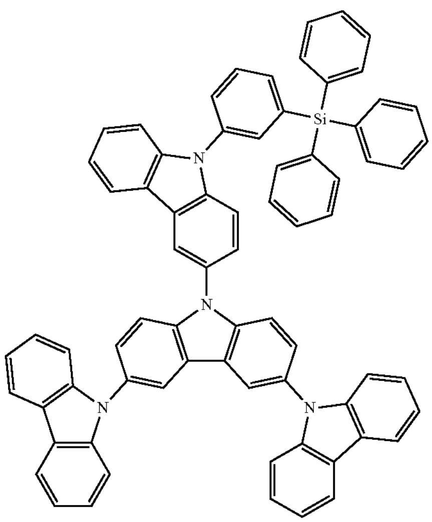 715 | | | | |
| 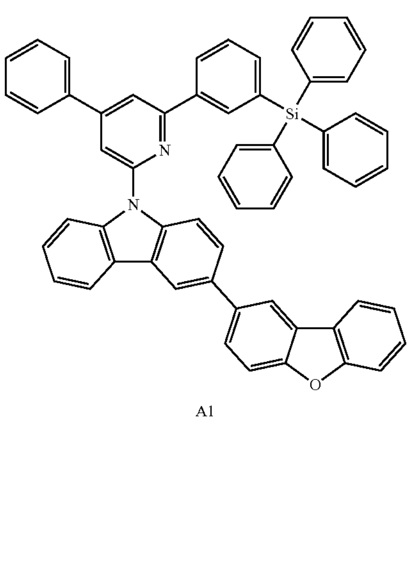 [SMILES: c1ccc(-c2cc(-c3cccc([Si](c4ccccc4)(c4ccccc4)c4ccccc4)c3)nc(-n3c4ccccc4c4cc(-c5ccc6oc7ccccc7c6c5)ccc43)c2)cc1 ; "A1"] A1 | | | | |

TABLE 1-continued
| Compound No. | HOMO (eV) | LUMO (eV) | $T_1$ (eV) | $S_1$ (eV) |
| --- | --- | --- | --- | --- |
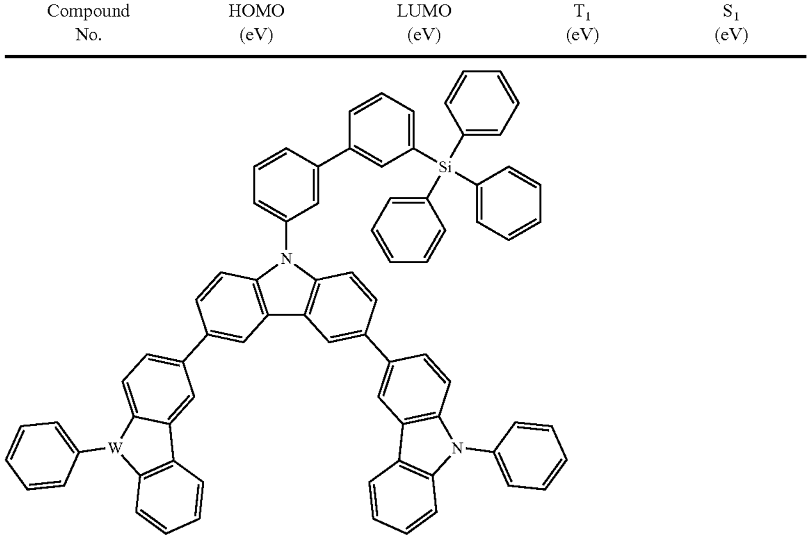
A2
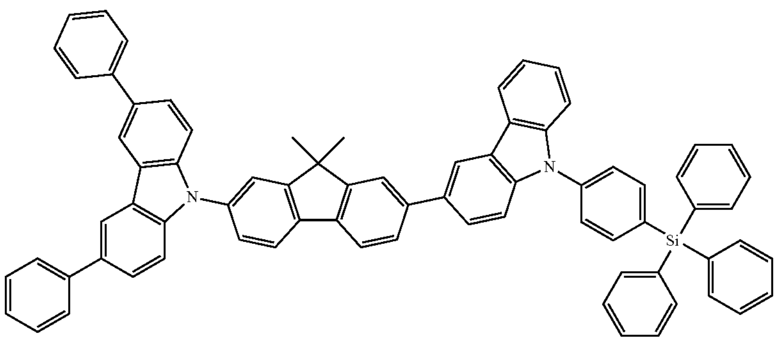
B1
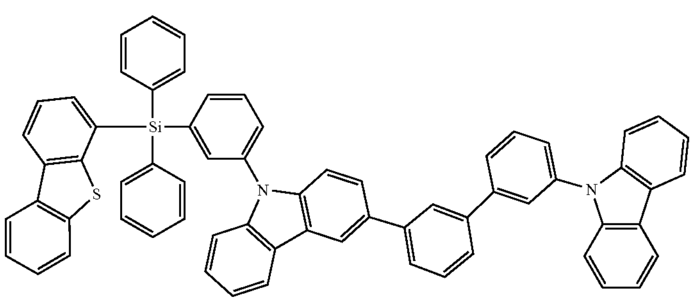
B2
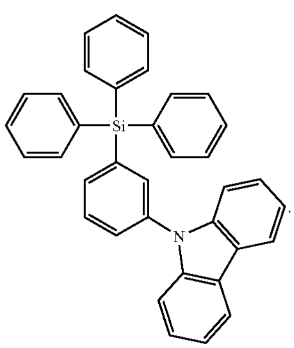
B3

Referring to Table 1, it can be seen that Compounds 11, 27, 238, and 715 may have 1) a triplet energy level that is greater than the triplet energy levels of Compounds A1, A2, B1, B2 and/or B3 and/or 2) the absolute value of the HOMO energy level which is smaller than the absolute values of the HOMO energy level of Compounds A1, A2, B1, B2 and/or B3.

The method of synthesizing the heterocyclic compound represented by Formula 1 may be recognized by those skilled in the art with reference to Synthesis Example to be described later.

According to another aspect, an organic light-emitting device includes a first electrode, a second electrode, and an organic layer located between the first electrode and the second electrode and including an emission layer, wherein the organic layer includes at least one heterocyclic compound represented by Formula 1.

Due to the inclusion of an organic layer including the heterocyclic compound represented by Formula 1, the organic light-emitting device may have high external quantum efficiency and long lifetime characteristics.

The heterocyclic compound represented by Formula 1 may be used between a pair of electrodes of an organic light-emitting device. In an embodiment, the heterocyclic compound represented by Formula 1 may be included in the emission layer. In this regard, the heterocyclic compound may act as a host, and the emission layer may further include a dopant (that is, the amount of the heterocyclic compound represented by Formula 1 is greater than the amount of the dopant). The emission layer may emit, for example, blue light.

In an embodiment, the emission layer may include a host and a dopant, and the heterocyclic compound may be included in the host. In an embodiment, the amount (weight) of the host may be greater than the amount (weight) of the dopant.

In one or more embodiments, blue light may be emitted by the emission layer.

The dopant may be a fluorescent dopant or a phosphorescent dopant. In an embodiment, the dopant may be a phosphorescent dopant. In an embodiment, the dopant may include a platinum complex.

In an embodiment, the dopant may include a platinum complex,

The platinum complex may include platinum and n ligands bound to the platinum, n may be an integer from 1 to 4, and at least one of the n ligands may include a carbene moiety bound to the platinum.

In an embodiment, the dopant may include a platinum complex, and the platinum complex may emit blue light.

As used herein, the expression the "(organic layer) includes at least one heterocyclic compound" may be construed as meaning the "(organic layer) may include one heterocyclic compound of Formula 1 or two different heterocyclic compounds of Formula 1".

For example, the organic layer may include only Compound 1 as the heterocyclic compound. In this embodiment, Compound 1 may be included in the emission layer of the organic light-emitting device. In some embodiments, the organic layer may include Compounds 1 and 2 as the heterocyclic compounds. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron-blocking layer, an auxiliary layer, or any combination thereof, and the electron transport region may include a buffer layer, a hole-blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

Description of FIG. 1

FIG. 1 is a schematic cross-sectional view of an organic light-emitting device 10 according to an exemplary embodiment. Hereinafter, the structure and manufacturing method of the organic light-emitting device 10 according to an embodiment of the present disclosure will be described in connection with FIG. 1.

In FIG. 1, an organic light-emitting device 10 includes a first electrode 11, a second electrode 19 facing the first electrode 11, and an organic layer 10A between the first electrode 11 and the second electrode 19.

In FIG. 1, the organic layer 10A includes an emission layer 15, a hole transport region 12 is between the first electrode 11 and an emission layer 15, and an electron transport region 17 is between the emission layer 15 and the second electrode 19.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

First Electrode 11

The first electrode 11 may be produced by depositing or sputtering, onto the substrate, a material for forming the first electrode 11. The first electrode 11 may be an anode. The material for forming the first electrode 11 may include materials with a high work function to facilitate hole injection.

The first electrode 11 may be a reflective electrode, a semi-transmissive electrode, or a transmissive electrode. When the first electrode 11 is a transmissive electrode, the material for forming the first electrode 11 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, a material for forming a first electrode may include magnesium (Mg), silver (Ag), aluminum (Al), aluminum-lithium (Al—Li), calcium (Ca), magnesium-indium (Mg—In), magnesium-silver (Mg—Ag), or any combinations thereof.

The first electrode 11 may have a single-layered structure or a multi-layered structure including a plurality of layers.

Emission Layer 15

A thickness of the emission layer 15 may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host in Emission Layer 15

A host in the emission layer 15 may include the heterocyclic compound represented by Formula 1.

In addition to the heterocyclic compound represented by Formula 1 (for example, refer to the first host in Examples below), an arbitrary host (for example, refer to the second host in the Examples) may be further included. Hereinafter, a host that may be included in the emission layer 15 in addition to the heterocyclic compound represented by Formula 1 will be described.

The host may not include a transition metal.

The host may be one kind of compound, or a mixture of two or more different types of compounds.

In an embodiment, the host may include at least one of a bipolar host, an electron-transporting host, a hole-transporting host, or any combination thereof. The bipolar host, the electron-transporting host, and the hole-transporting host may be different from each other.

The electron-transporting host may include at least one electron-transporting group.

The hole-transporting host may not include an electron-transporting group.

The term "electron-transporting group" used herein may include a cyano group, a TT electron-deficient nitrogen-containing $C_1$-$C_{60}$ cyclic group, a group represented by one of the following formulae, or any combination thereof.

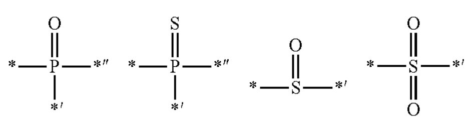

wherein *, *', and *" in the formulae above are each a binding site to a neighboring atom.

According to an embodiment, the electron-transporting host may include at least one of a cyano group, a TT-electron deficient nitrogen-containing $C_1$-$C_{60}$ cyclic group, or any combination thereof.

In one or more embodiments, the electron-transporting host may include at least one cyano group.

In an embodiment, the electron-transporting host may include at least one cyano group, a π electron deficient nitrogen-containing $C_1$-$C_{60}$ cyclic group, or any combination thereof.

In an embodiment, the host may include a bipolar host.

In an embodiment, the host may include an electron-transporting host.

In an embodiment, the host may include a hole-transporting host.

In an embodiment, the hole-transporting host may not be 1,3-bis(9-carbazolyl)benzene (mCP), tris(4-carbazoyl-9-ylphenyl)amine (TCTA), 4,4'-bis(N-carbazolyl)-1,1'-biphenyl (CBP), 3,3-bis(carbazol-9-yl)biphenyl (mCBP), N,N'-di(1-naphthyl)-N, N'-diphenyl-(1,1'-biphenyl)-4,4'-diamine (NPB), 4,4',4"-tris[phenyl(m-tolyl)amino]triphenylamine (m-MTDATA), or N,N'-bis(3-methylphenyl)-N, N'-diphenylbenzidine (TPD).

The host may include an electron-transporting host and a hole-transporting host.

The electron-transporting host may include at least one π electron-rich $C_3$-$C_{60}$ cyclic group and at least one electron-transporting group, the hole-transporting host may include at least one π electron-rich $C_3$-$C_{60}$ cyclic group, and may not include an electron-transporting group, and the electron-transporting group may include a cyano group, a π electron deficient nitrogen-containing $C_1$-$C_{60}$ cyclic group, or any combination thereof.

In an embodiment, the electron-transporting host may include i) at least one of a cyano group, a pyrimidine group, a pyrazine group, a triazine group, or any combination thereof, and ii) at least one of a triphenylene group, a carbazole group, or any combination thereof.

In an embodiment, the hole-transporting host may include at least one carbazole group.

In an embodiment, the electron-transporting host may include a compound represented by Formula E-1 below, and the hole-transporting host may include a compound represented by Formula H-1 below:

$$[Ar_{301}]_{xb11}\text{-}[(L_{301})_{xb1}\text{-}R_{301}]_{xb21} \qquad \text{Formula E-1}$$

wherein, in Formula E-1, $Ar_{301}$ may be a $C_5$-$C_{60}$ carbocyclic group unsubstituted or substituted with at least one $R_{301a}$ or a $C_1$-$C_{60}$ heterocyclic group unsubstituted or substituted with at least one $R_{301a}$, $x_{b11}$ may be 1, 2, or 3, $L_{301}$ may each independently be a single bond, a group represented by one of the following formulae, a $C_5$-$C_{60}$ carbocyclic group unsubstituted or substituted with at least one $R_{301a}$, or a $C_1$-$C_{60}$ heterocyclic group unsubstituted or substituted with at least one $R_{301a}$, and *, ", and *" in the following formulae each indicate a binding site to a neighboring atom,

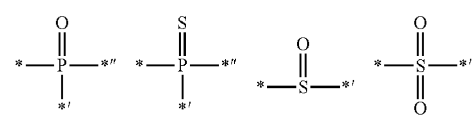

xb1 may be an integer from 1 to 5, $R_{301a}$ and $R_{301}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{301})(Q_{302})(Q_{303})$, —$N(Q_{301})(Q_{302})$, —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), or —P(=S)($Q_{301}$)($Q_{302}$), xb21 may be an integer from 1 to 5, $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, and at least one of Condition 1 to Condition 3 is satisfied:

Condition 1

At least one of $Ar_{301}$, $L_{301}$, and $R_{301}$ in Formula E-1 may each independently include a π electron-deficient nitrogen-containing $C_1$-$C_{60}$ cyclic group.

Condition 2

In Formula E-1, $L_{301}$ may be a group represented by one of the following Formulae.

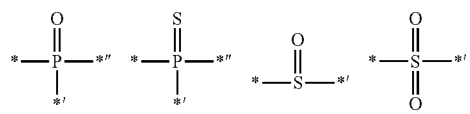

Condition 3

$R_{301}$ in Formula E-1 is a cyano group, —S(=O)$_2$($Q_{301}$), —S(=O)($Q_{301}$), —P(=O)($Q_{301}$)($Q_{302}$), or —P(=S)($Q_{301}$)($Q_{302}$).

Formula H-1

$$Ar_{401}—(L_{401})_{xc1}—(Ar_{402})_{xc11}$$

11

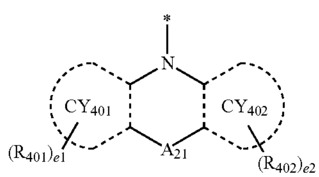

12

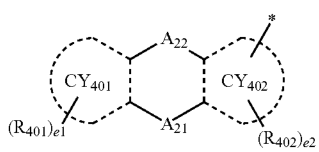

wherein, in Formulae H-1, 11, and 12, $L_{401}$ may be:

a single bond; or a π electron-rich $C_3$-$C_{60}$ cyclic group, unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or any combination thereof, xc1 may be an integer from 1 to 10, wherein, when xc1 is 2 or more, two or more of $L_{401}$(s) may be identical to or different from each other, $Ar_{401}$ may be a group represented by Formula 11 or 12, $Ar_{402}$ may be:

a group represented by Formula 11 or 12; or a π electron-rich $C_3$-$C_{60}$ cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group), each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or any combination thereof, xc11 may be an integer from 1 to 10, wherein, when xc11 is 2 or more, two or more of $Ar_{402}$(s) may be identical to or different from each other, $CY_{401}$ and $CY_{402}$ may each independently be a π electron-rich $C_3$-$C_{60}$ cyclic group (for example, a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group), $A_{21}$ may be a single bond, O, S, N($R_{411}$), C($R_{411}$)($R_{412}$), or Si($R_{411}$)($R_{412}$), $A_{22}$ may be a single bond, O, S, N($R_{411}$), C($R_{411}$)($R_{412}$), or Si($R_{411}$)($R_{412}$), at least one of $A_{21}$ and $A_{22}$ in Formula 12 may not be a single bond, $R_{401}$, $R_{402}$, $R_{411}$, and $R_{412}$ may each independently be:

hydrogen, deuterium, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, a phenyl group, a naphthyl group, a fluorenyl group, a carbazolyl group, a dibenzofuranyl group, a dibenzothiophenyl group, or any combination thereof;

π electron-rich $C_3$-$C_{60}$ cyclic group, unsubstituted or substituted with deuterium, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, or any combination thereof; or —Si($Q_{404}$)($Q_{405}$)($Q_{406}$), wherein e1 and e2 may each independently be an integer from 0 to 10, $Q_{401}$ to $Q_{406}$ may each independently be hydrogen, deuterium, a $C_1$-$C_{20}$ alkyl group, a phenyl group, a naphthyl group, a fluorenyl group, a carbazolyl group, a dibenzofuranyl group, a dibenzothiophenyl group, a biphenyl group, a terphenyl group, or a triphenylenyl group, and indicates a binding site to an adjacent atom.

In an embodiment, $Ar_{301}$ and $L_{301}$ in Formula E-1 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, a isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof, at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a cyano group-containing a phenyl group, a cyano group-containing a biphenyl group, a cyano group-containing a terphenyl group, a cyano group-containing a naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof, and $R_{301}$ may be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a tetraphenyl group, a naphthyl group, a cyano group-containing phenyl group, a cyano group-containing biphenyl group, a cyano group-containing terphenyl group, a cyano group-containing tetraphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, $Ar_{301}$ may be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or a group represented by one of Formulae 5-1 to 5-3 and 6-1 to 6-33, and
$L_{301}$ may be a group represented by one of Formulae 5-1 to 5-3 and Formulae 6-1 to 6-33:
5-1
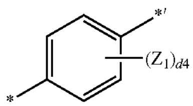
5-2
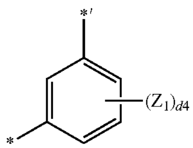
5-3
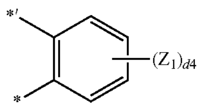
6-1
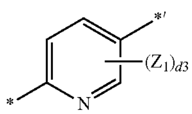
6-2
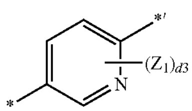
6-3
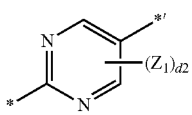
6-4
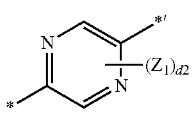
6-5
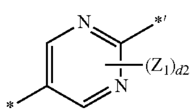
6-6
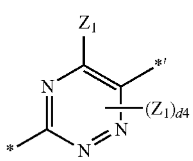
6-7
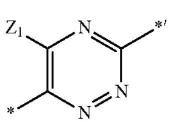
6-8
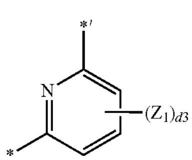
-continued
6-9
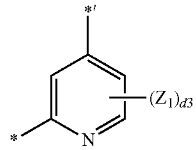
6-10
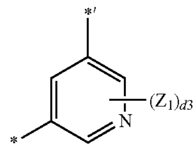
6-11
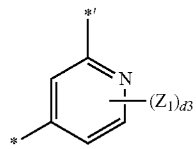
6-12
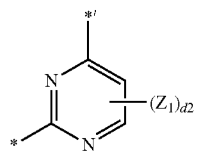
6-13
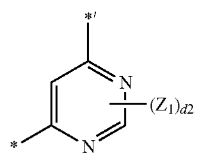
6-14
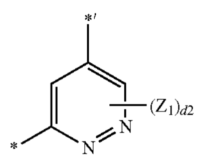
6-15
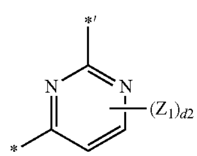
6-16
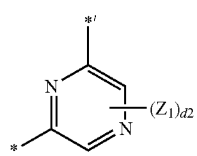
6-17
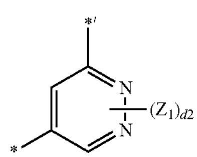
6-18
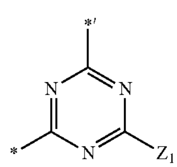

6-19

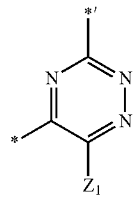

6-20

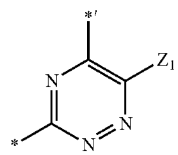

6-21

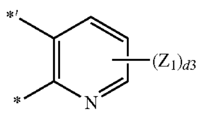

6-22

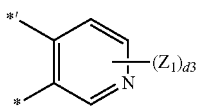

6-23

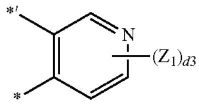

6-24

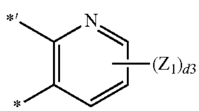

6-25

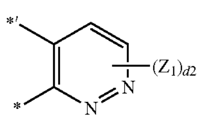

6-26

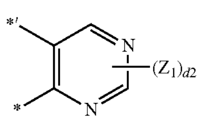

6-27

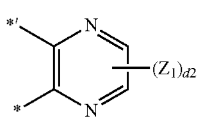

6-28

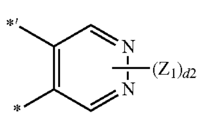

6-29

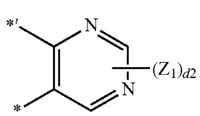

6-30

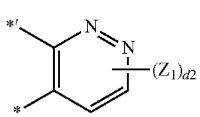

6-31

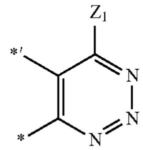

6-32

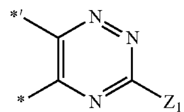

6-33

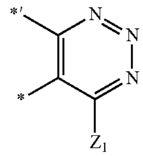

wherein, in Formulae 5-1 to 5-3 and 6-1 to 6-33, $Z_1$ may be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, d4 may be 0, 1, 2, 3, or 4, d3 may be 0, 1, 2, or 3, d2 may be 0, 1, or 2, and

* and *' each indicate a binding site to an adjacent atom.

wherein $Q_{31}$ to $Q_{33}$ may respectively be understood by referring to the descriptions of $Q_{31}$ to $Q_{33}$ provided herein.

In one or more embodiments, $L_{301}$ may be a group represented by one of Formulae 5-2, 5-3, and 6-8 to 6-33.

In an embodiment, $R_{301}$ may be a cyano group or a group represented by one of Formulae 7-1 to 7-18, and at least one of $Ar_{402}$(s) in the number of xc11 is a group represented by one of Formulae 7-1 to 7-18:

7-1

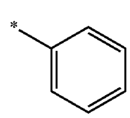

-continued
7-2
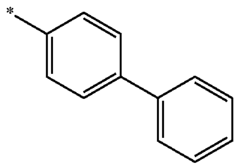
7-3
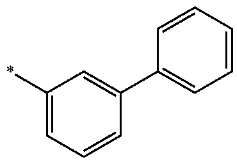
7-4
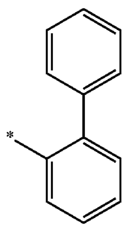
7-5
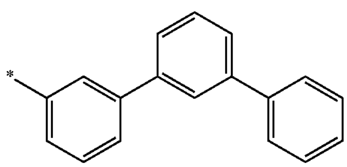
7-6
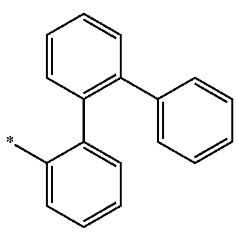
7-7
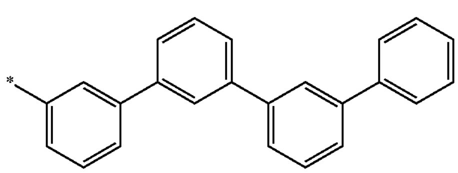
7-8
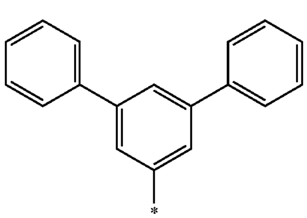
-continued
7-9
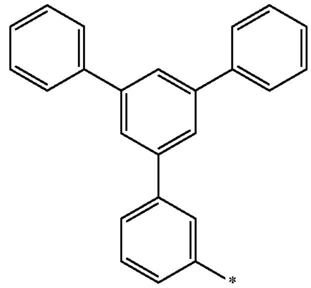
7-10
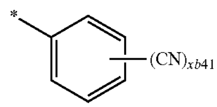
7-11
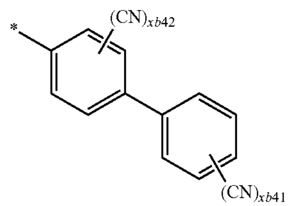
7-12
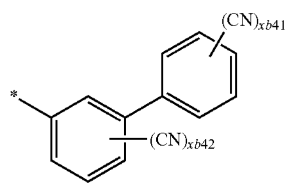
7-13
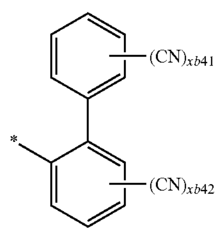
7-14
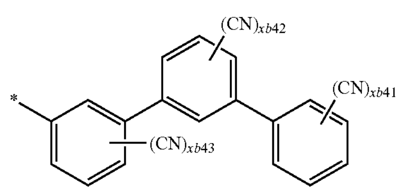
7-15
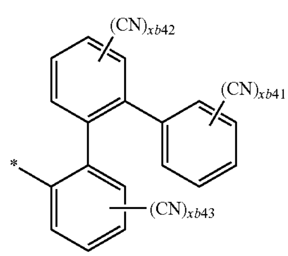

-continued 7-16

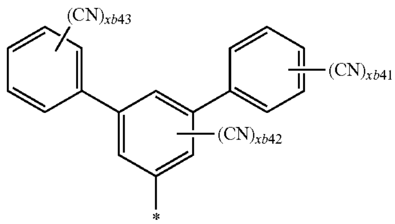

7-17

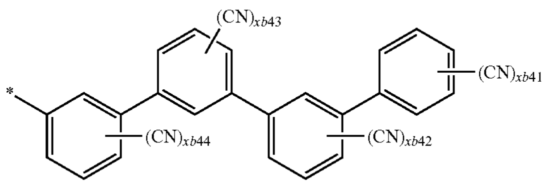

7-18

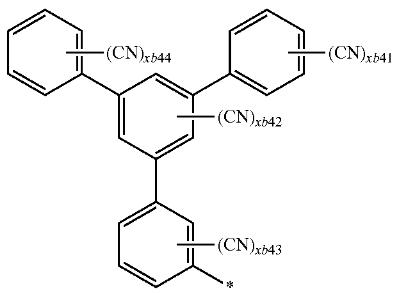

wherein, in Formulae 7-1 to 7-18, xb41 to xb44 may each be 0, 1, or 2, provided that xb41 in Formula 7-10 may not be 0, xb41+xb42 in Formulae 7-11 to 7-13 may not be 0, xb41+xb42+xb43 in Formulae 7-14 to 7-16 may not be 0, xb41+xb42+xb43+xb44 in Formulae 7-17 and 7-18 may not be 0, and * indicates a binding site to an adjacent atom.

In Formula E-1, at least two $Ar_{301}$(s) may be identical to or different from each other, and at least two $L_{301}$(s) may be identical to or different from each other. In Formula H-1, at least two $L_{401}$(s) may be identical to or different from each other, and at least two $Ar_{402}$(s) may be identical to or different from each other.

Specific examples of the electron-transporting host may include, for example, compounds of Groups HE1 to HE7:

Group HE1

H-E1

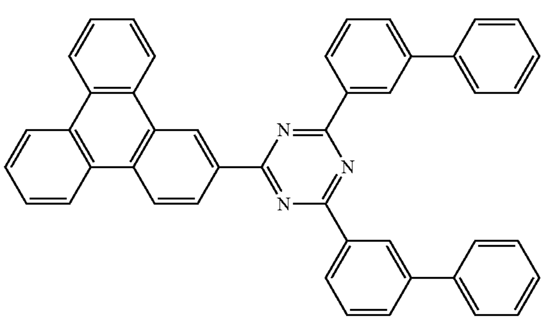

-continued

H-E2

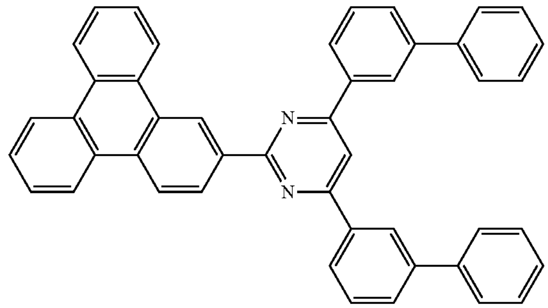

H-E3

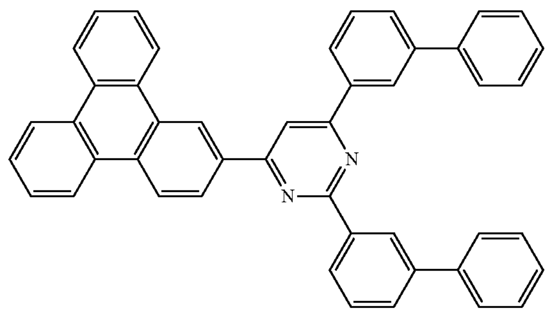

H-E4

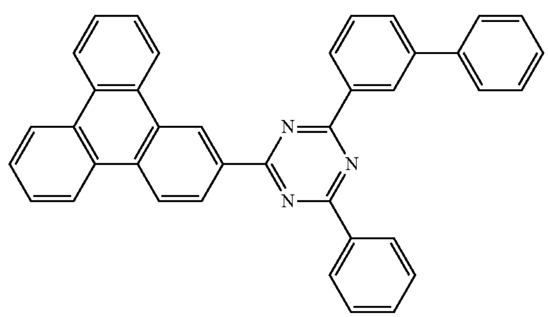

H-E5

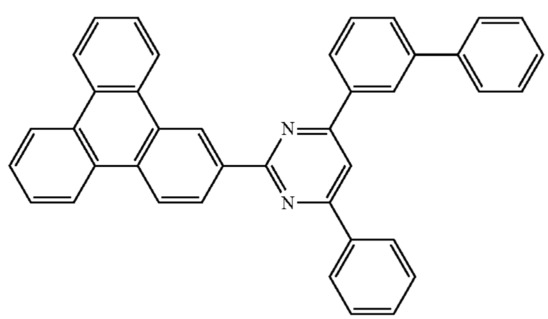

-continued
H-E6
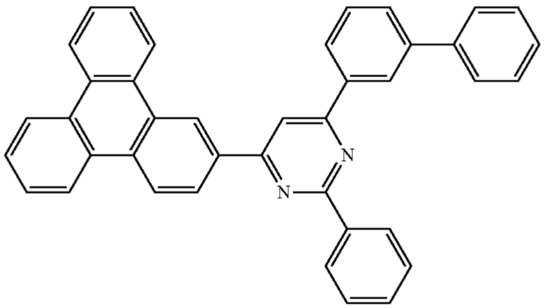
H-E7
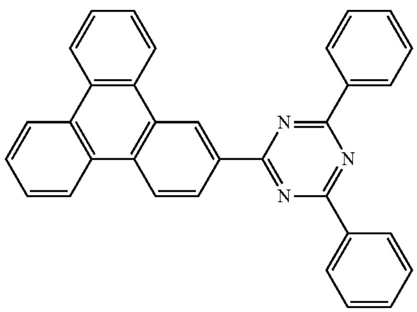
H-E8
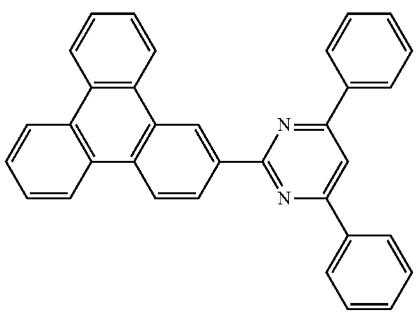
H-E9
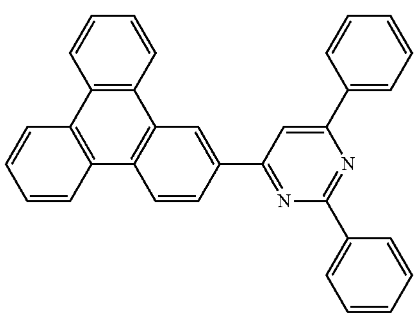
H-E10
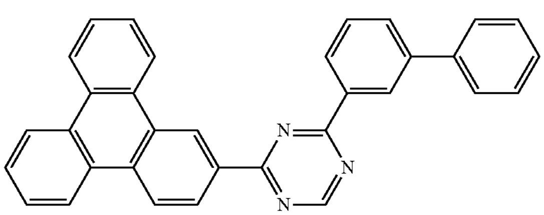
-continued
H-E11
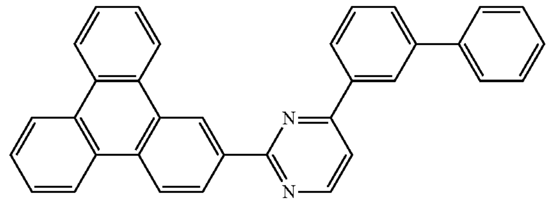
H-E12
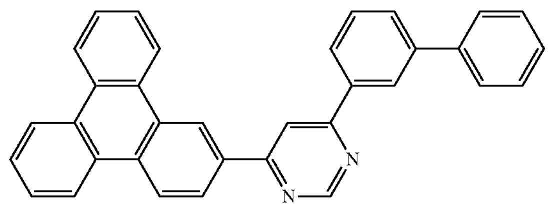
H-E13
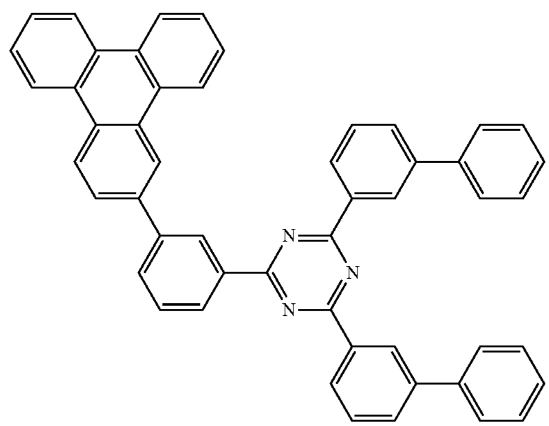
H-E14
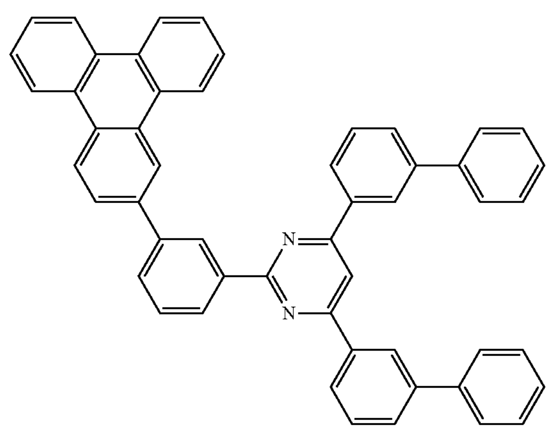

-continued
H-E15
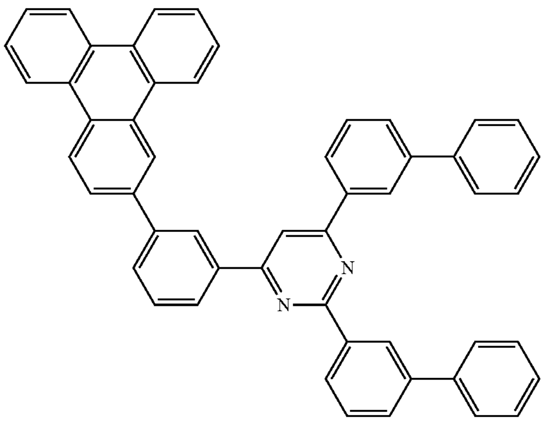
H-E16
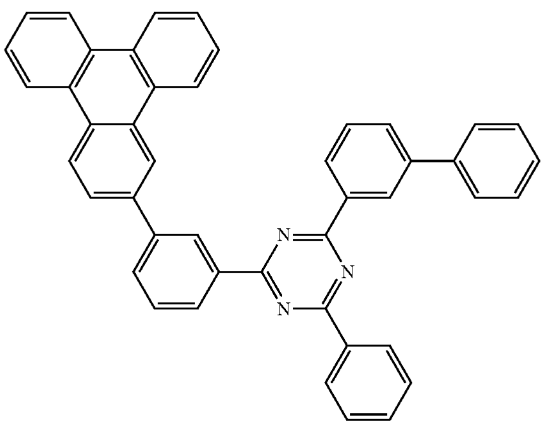
H-E17
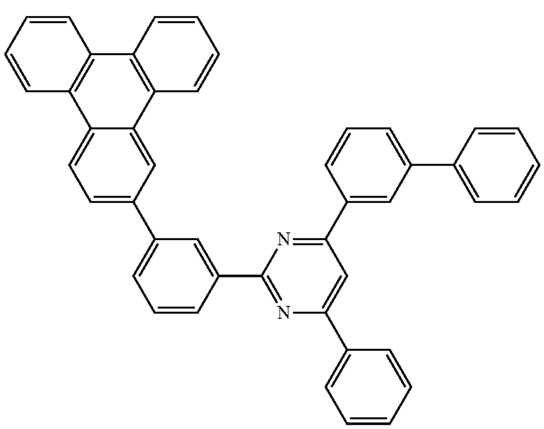
-continued
H-E18
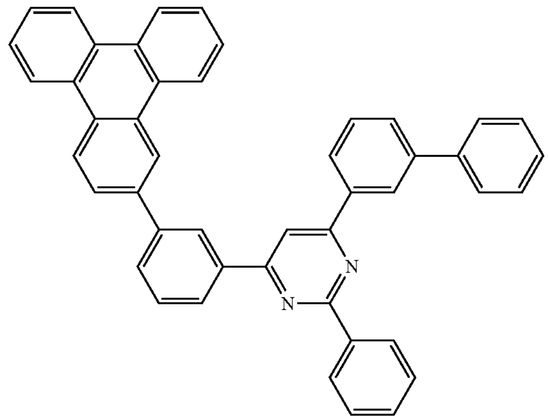
H-E19
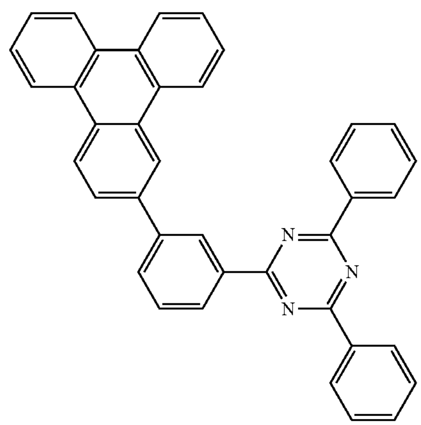
H-E20
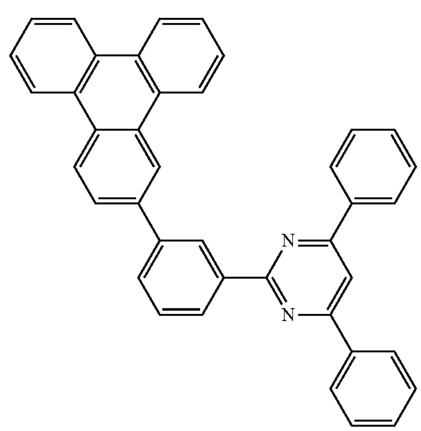

H-E21
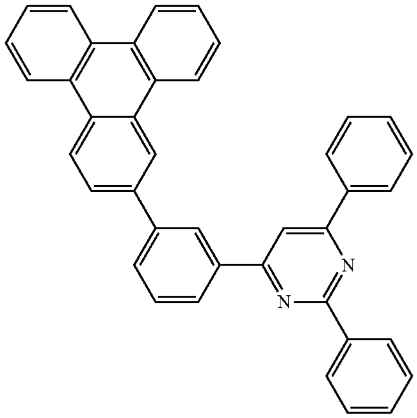
H-E22
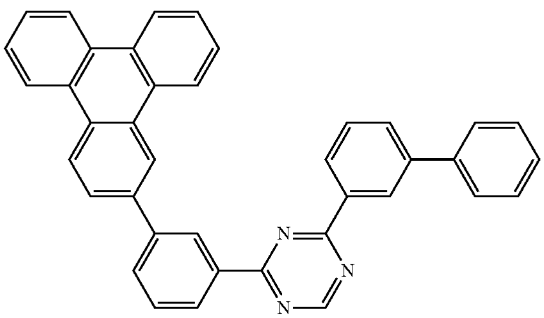
H-E23
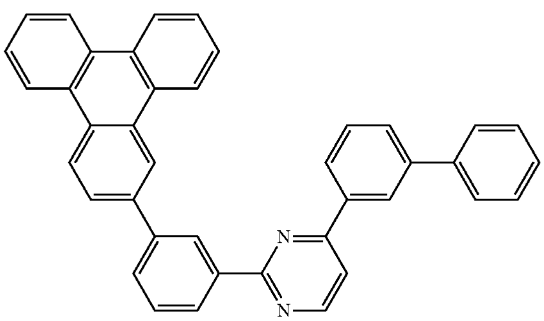
H-E24
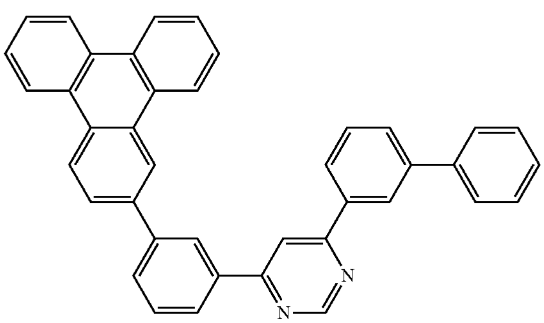
H-E25
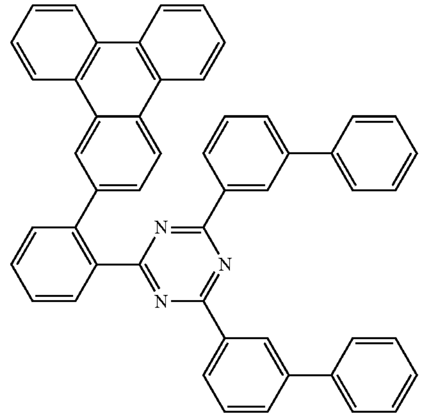
H-E26
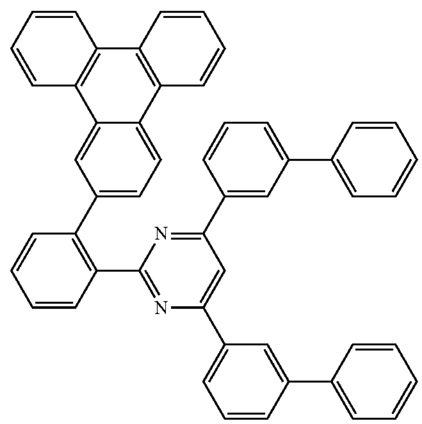
H-E27
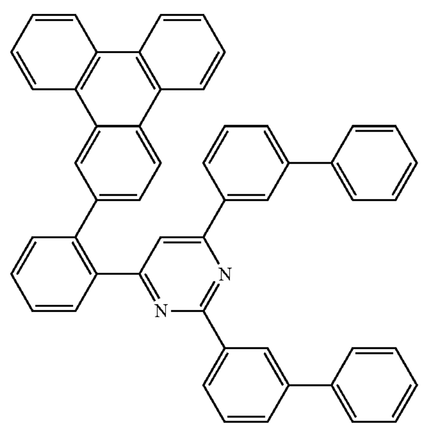

-continued
H-E28
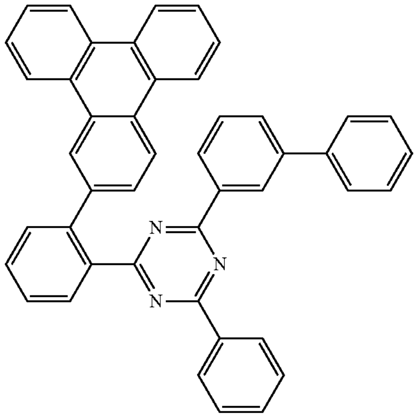
H-E29
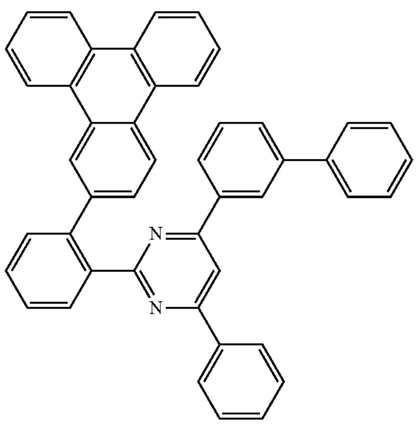
H-E30
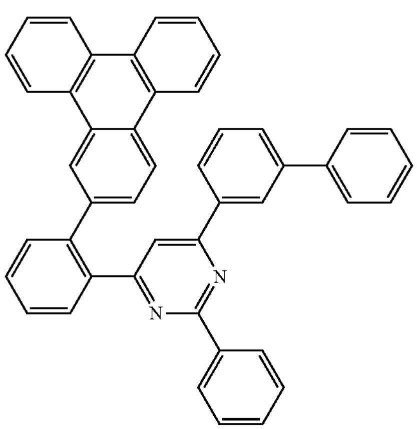
-continued
H-E31
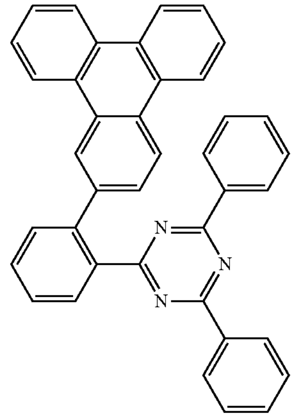
H-E32
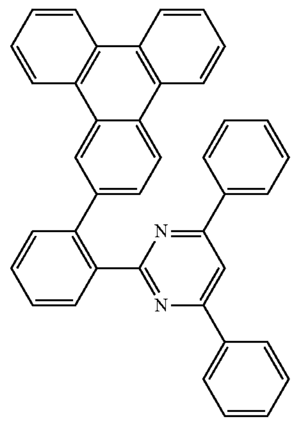
H-E33
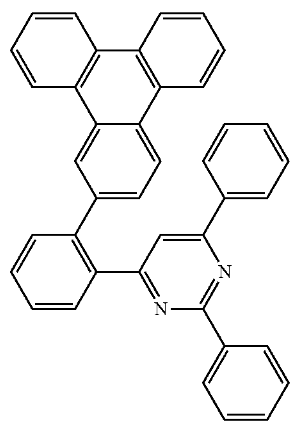
H-E34
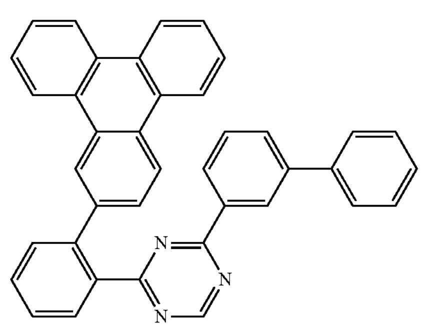

-continued
H-E35
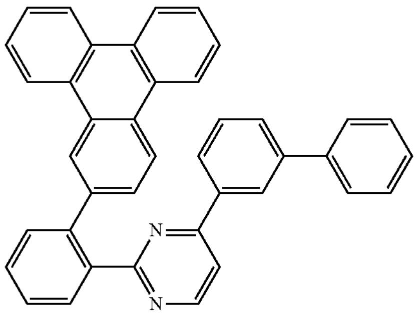
H-E36
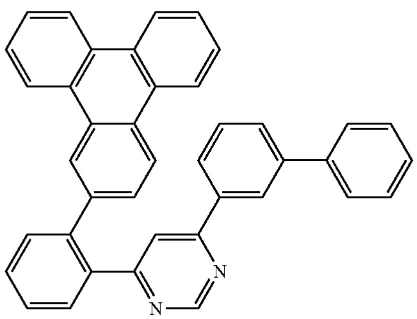
H-E37
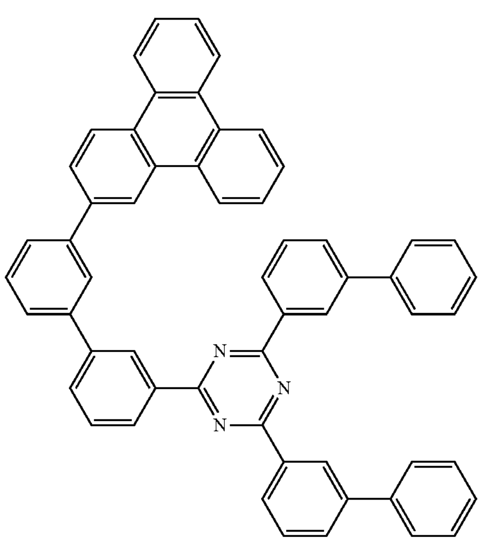
-continued
H-E38
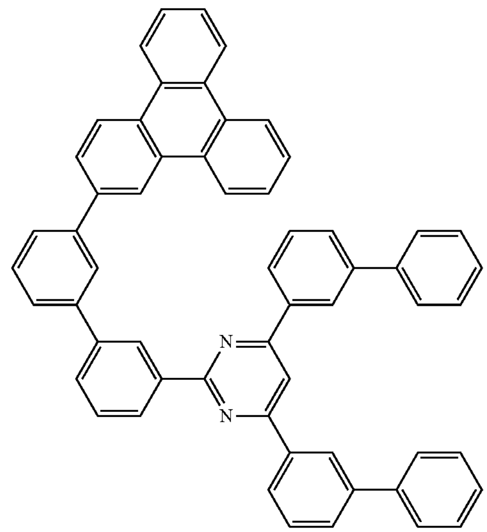
H-E39
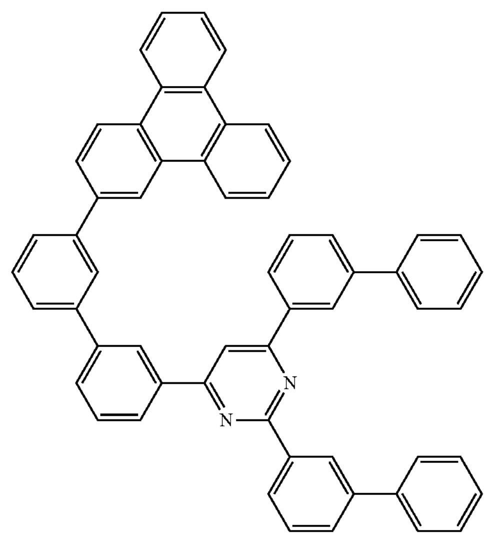
H-E40
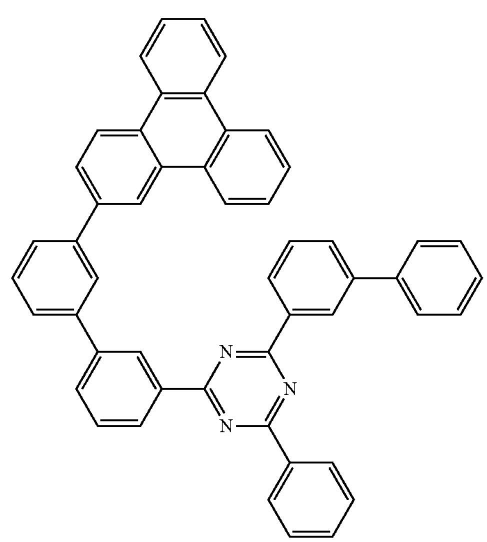

H-E41
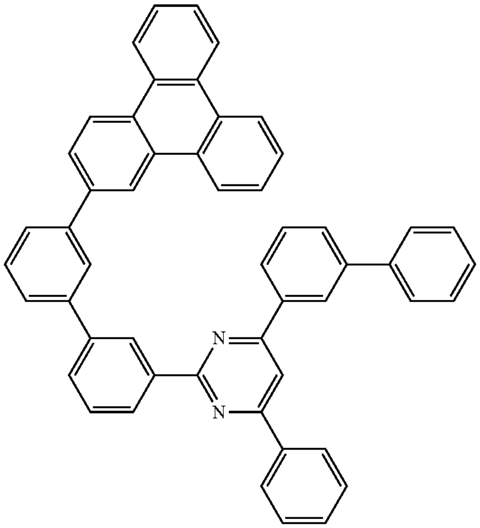
H-E42
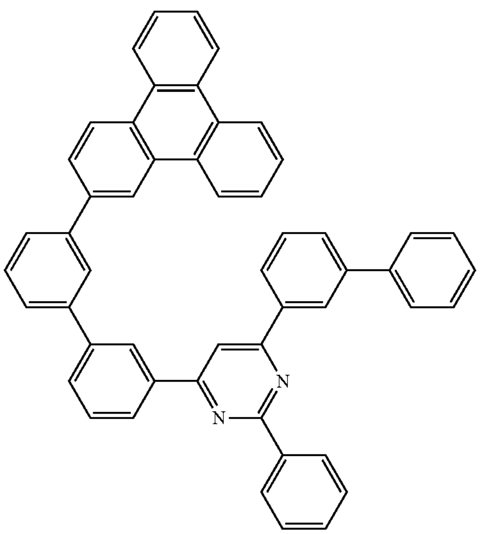
H-E43
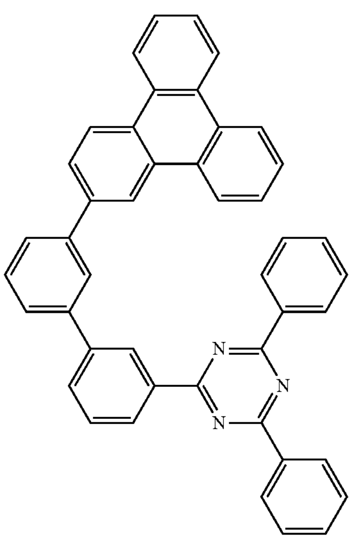
H-E44
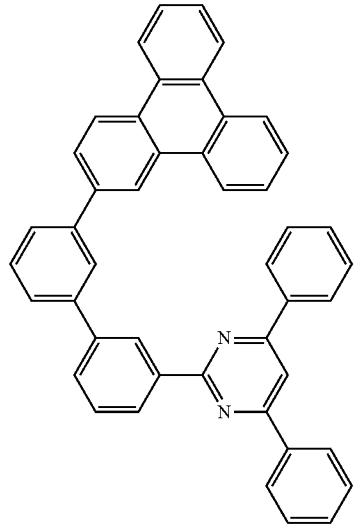
H-E45
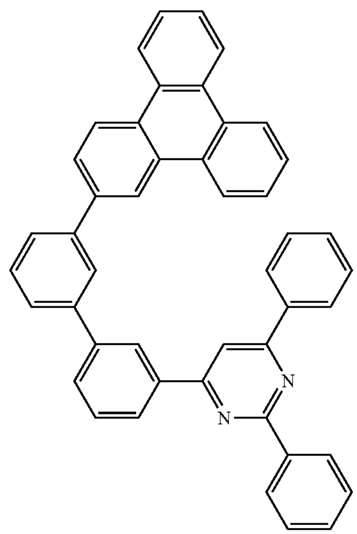
H-E46
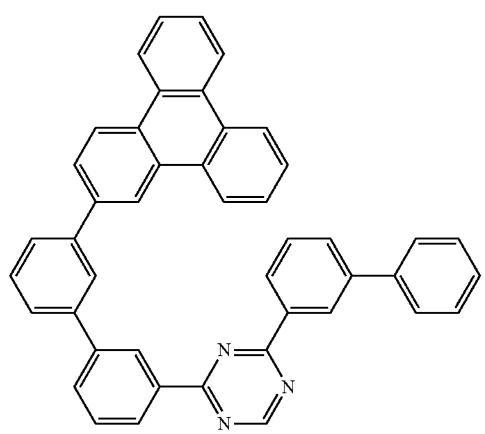

-continued
H-E47
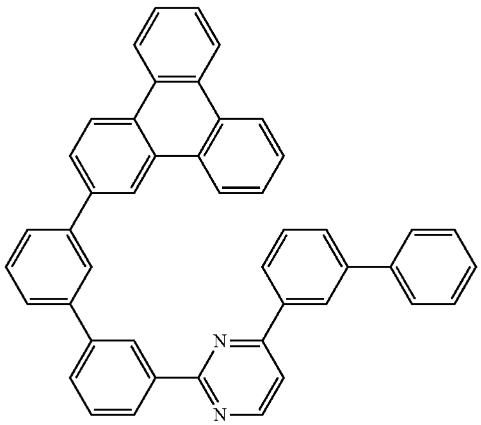
H-E48
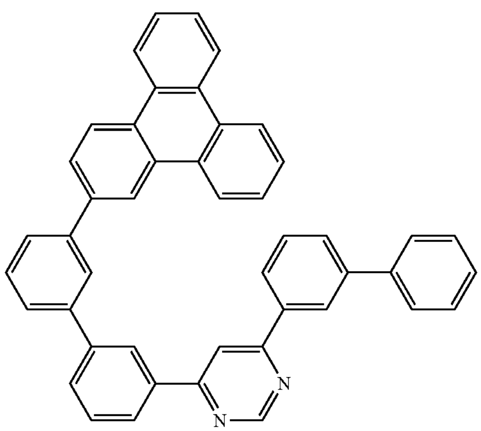
H-E49
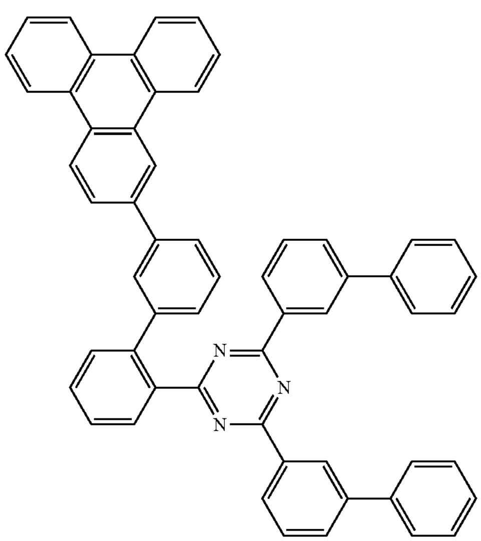
-continued
H-E50
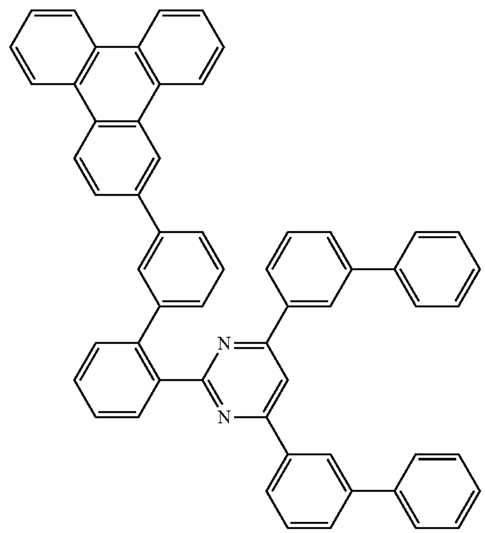
H-E51
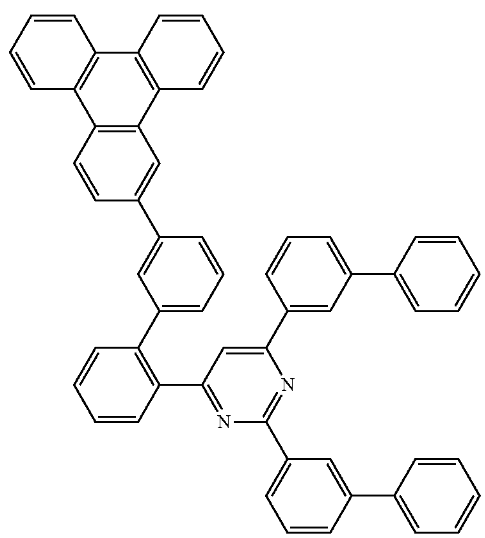
H-E52
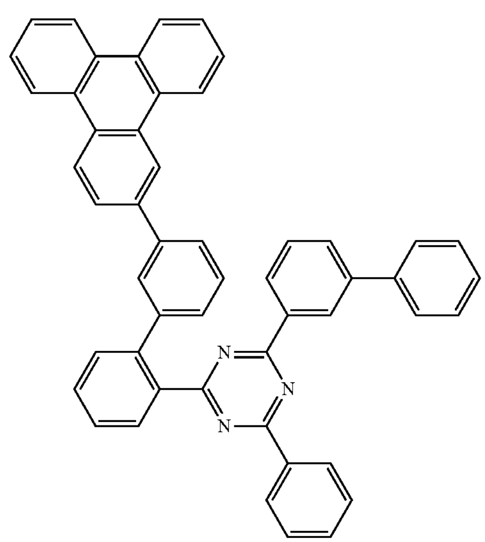

H-E53
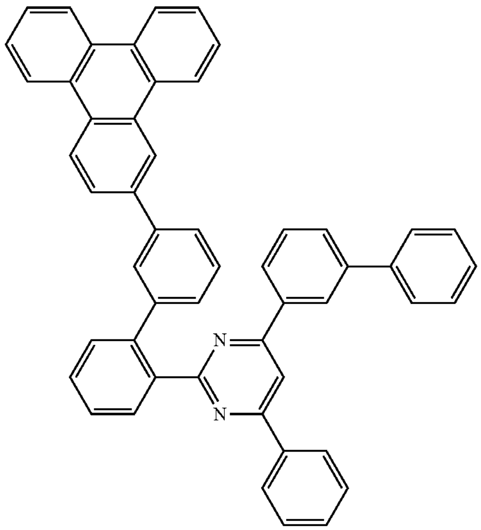
H-E54
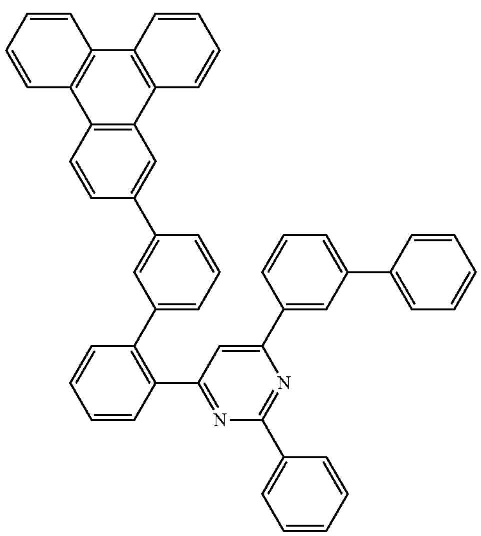
H-E55
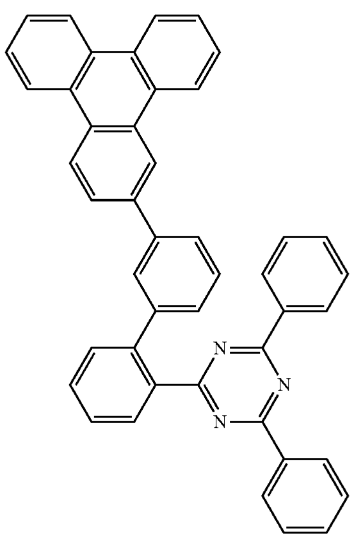
H-E56
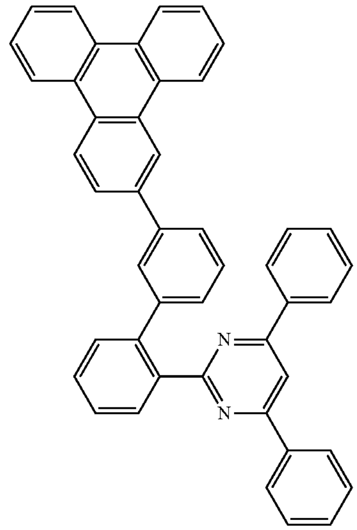
H-E57
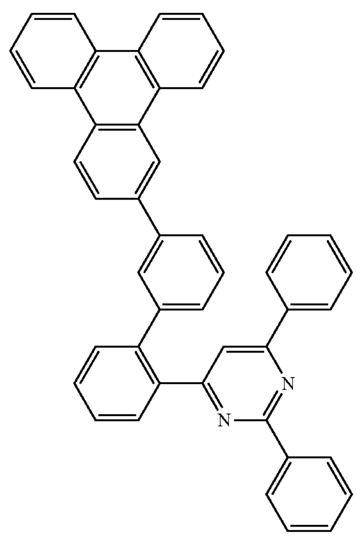
H-E58
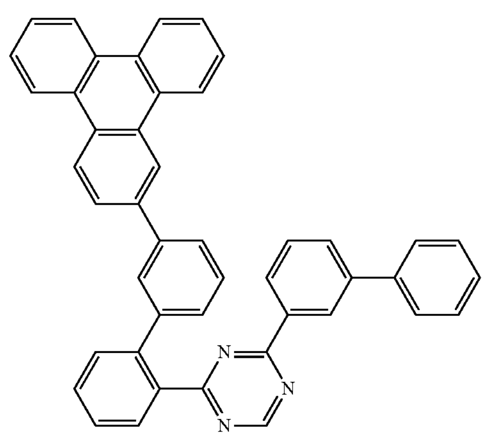

-continued
H-E59
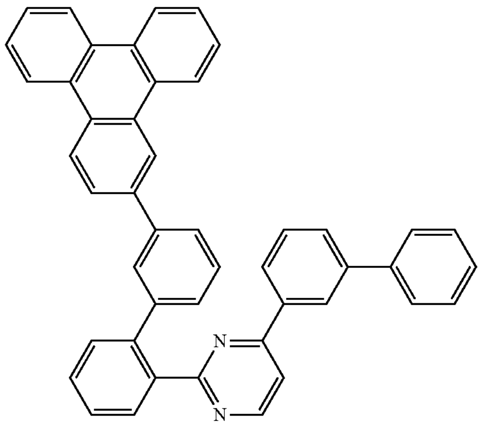
H-E60
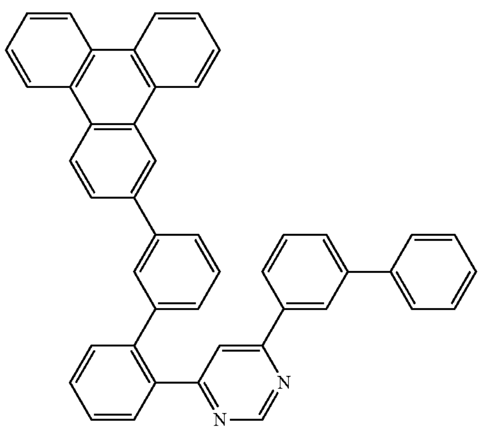
H-E61
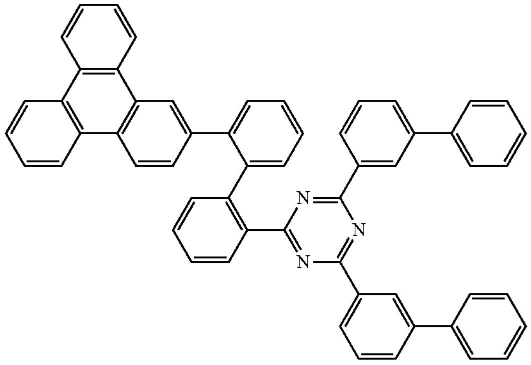
-continued
H-E62
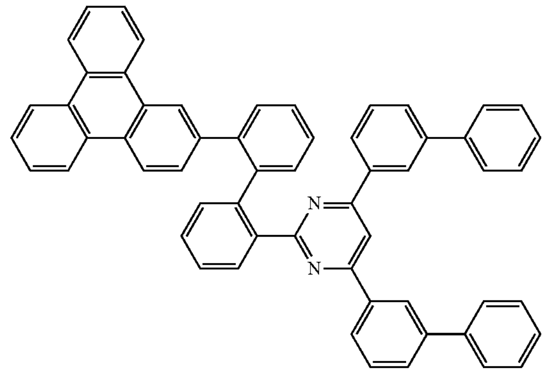
H-E63
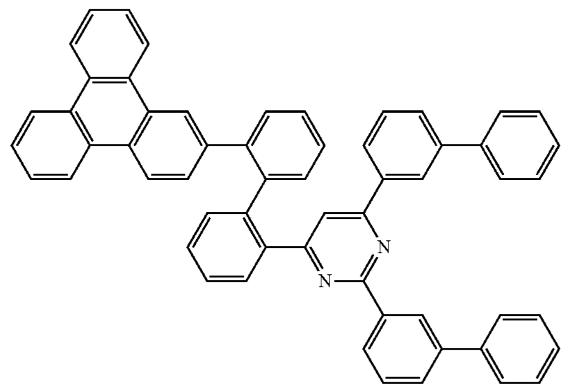
H-E64
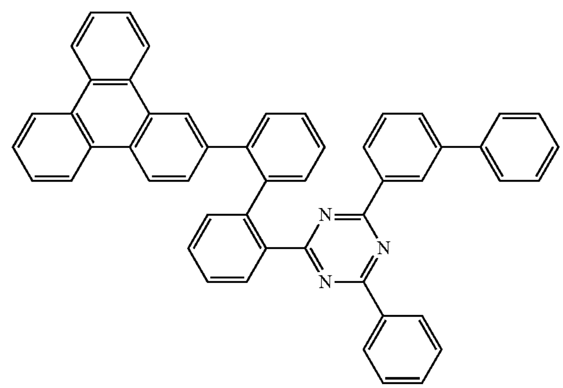
H-E65
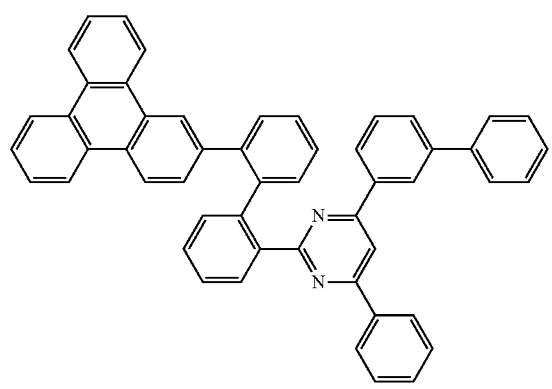

-continued
H-E66
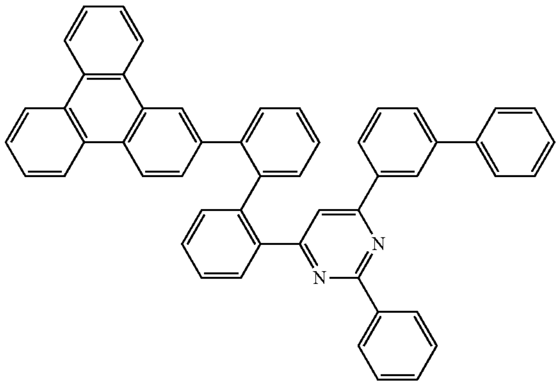
H-E67
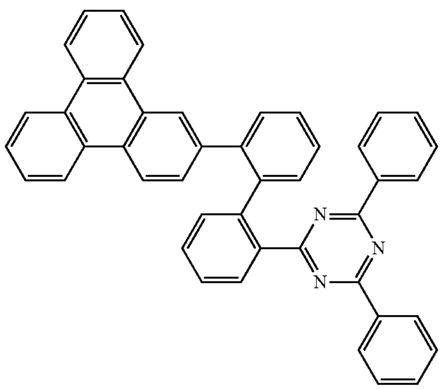
H-E68
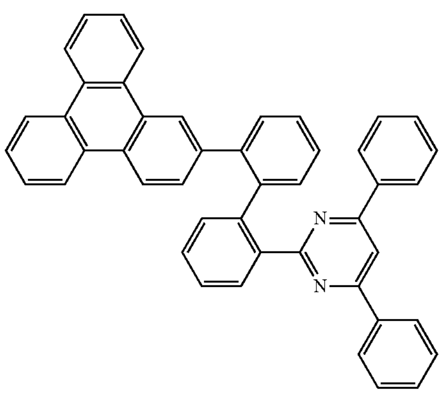
H-E69
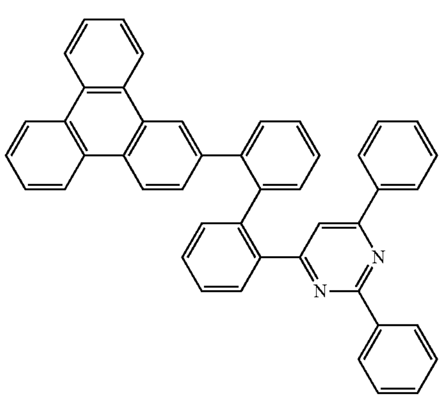
-continued
H-E70
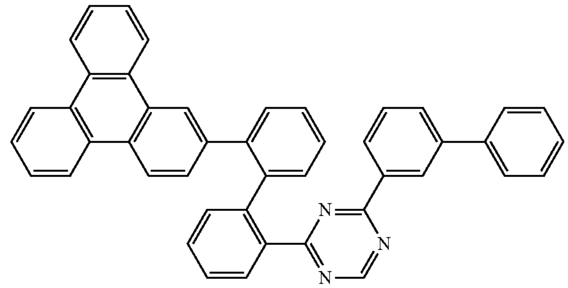
H-E71
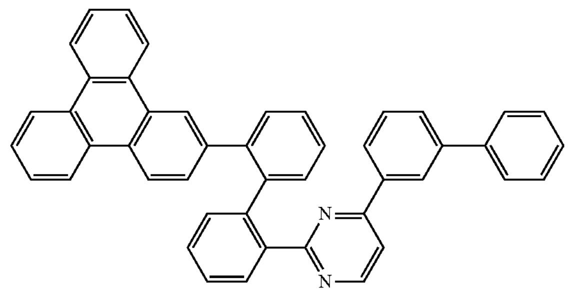
H-E72
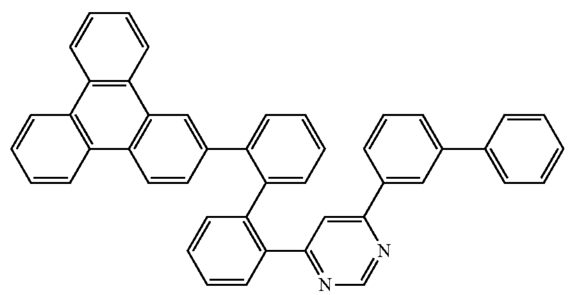
H-E73
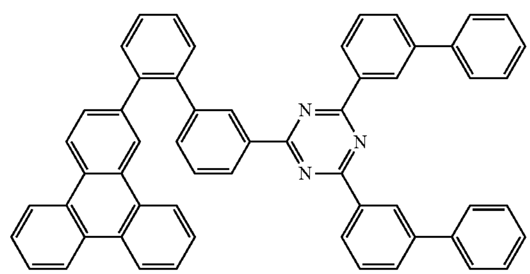
H-E74
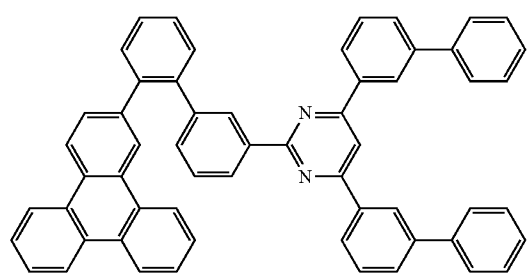

-continued
H-E75
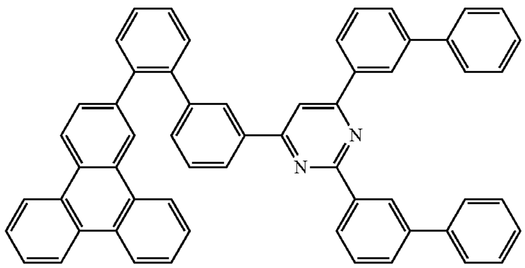
H-E76
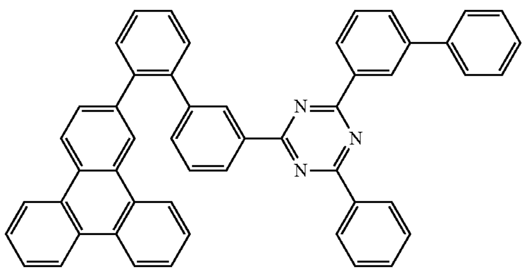
H-E77
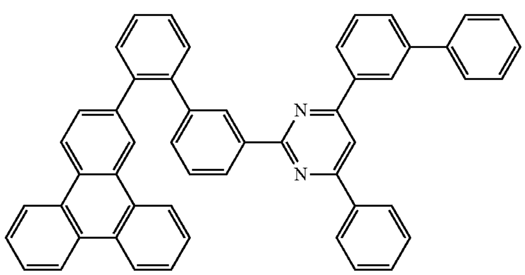
H-E78
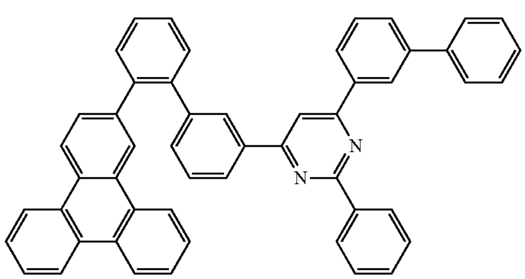
H-E79
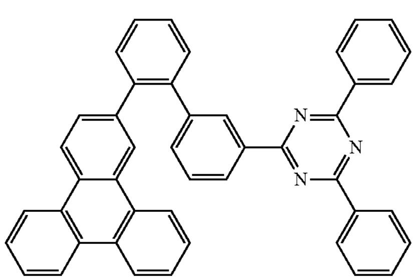
-continued
H-E80
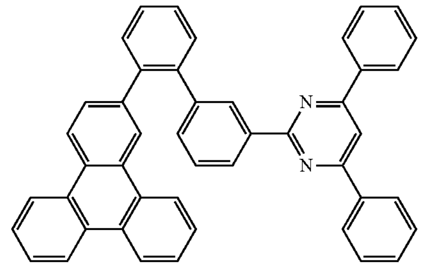
H-E81
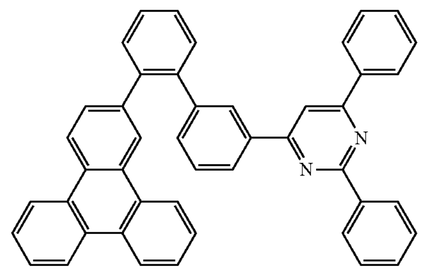
H-E82
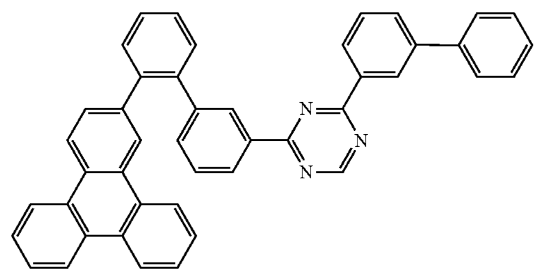
H-E83
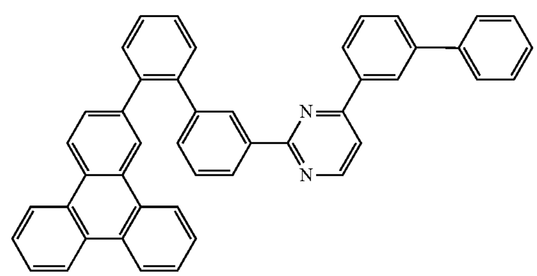
H-E84
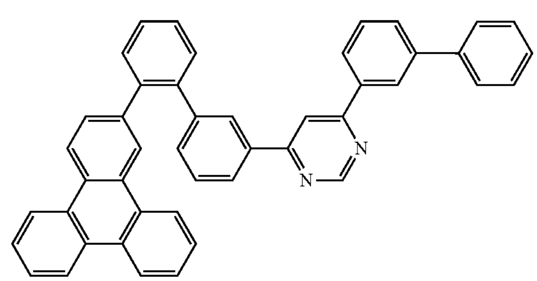

H-E(1)
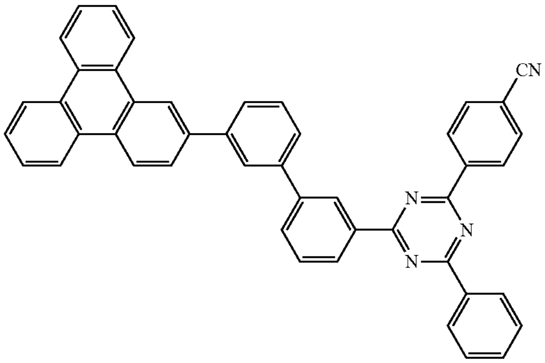
H-E(2)
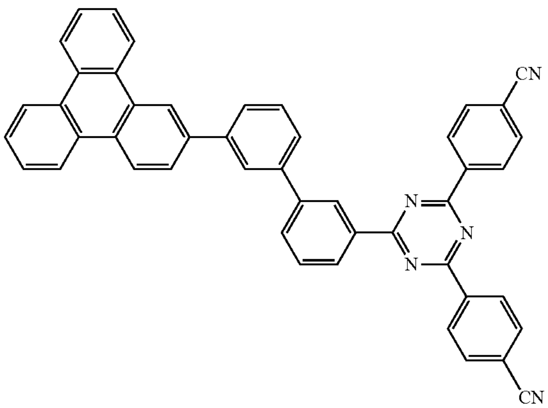
H-E(3)
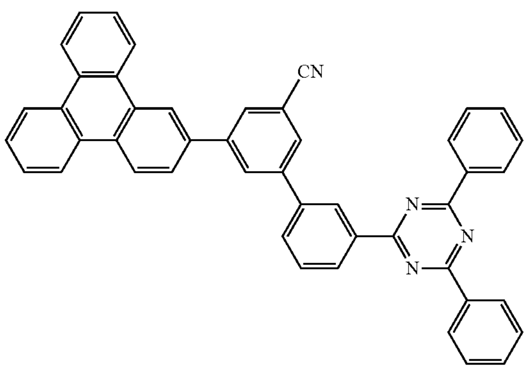
H-E(4)
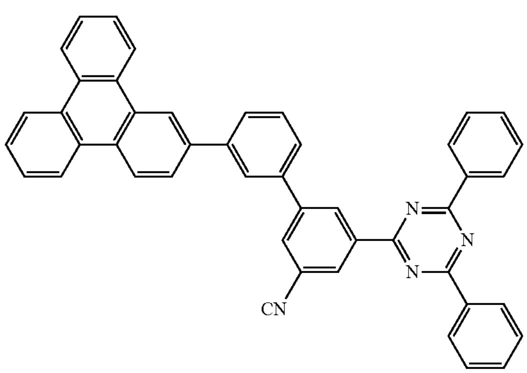
A-1
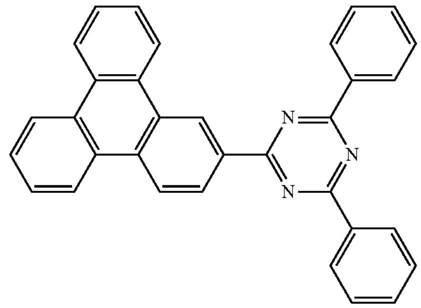
A-2
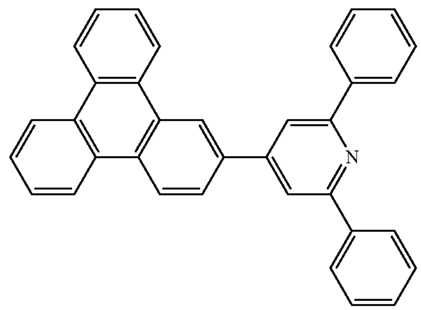
A-3
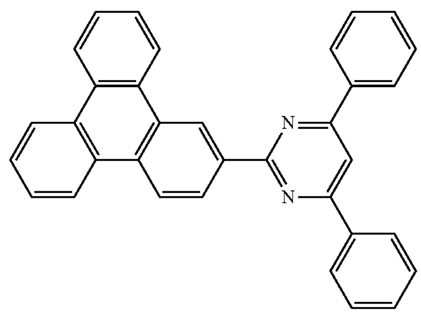
A-4
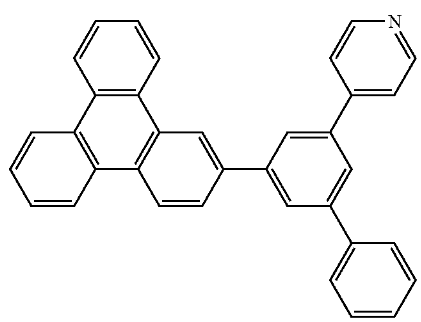
A-5
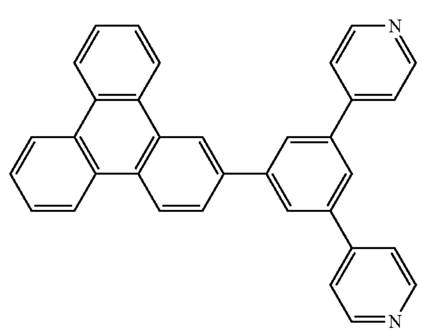

-continued
A-6
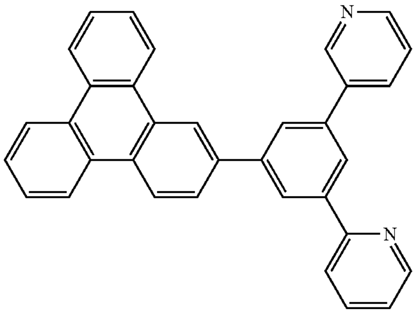
A-7
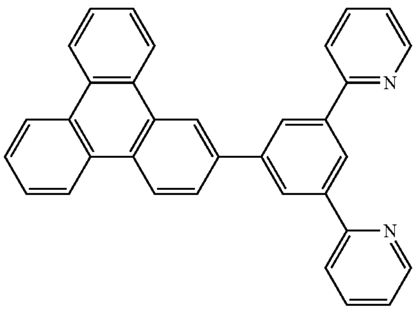
A-8
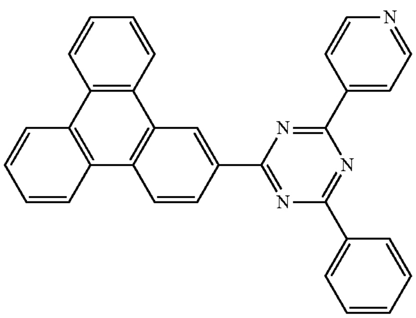
-continued
A-9
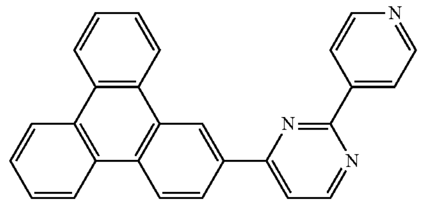
A-10
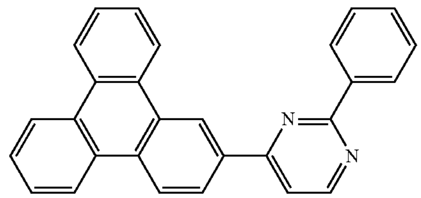
A-11
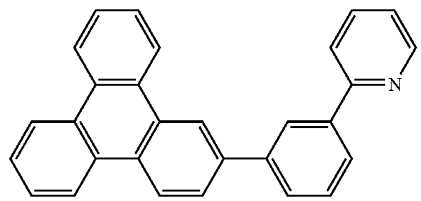
A-12
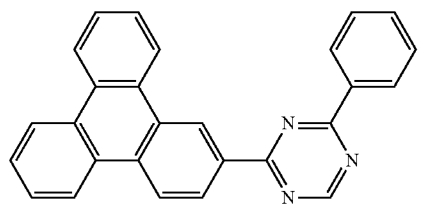
A-13
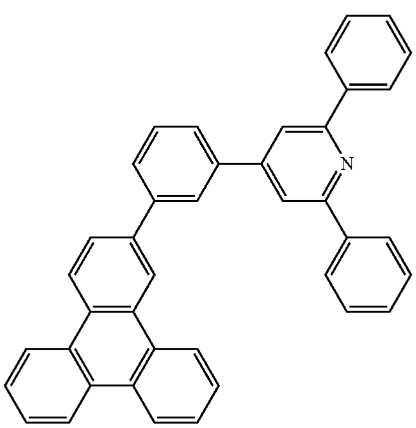
A-14
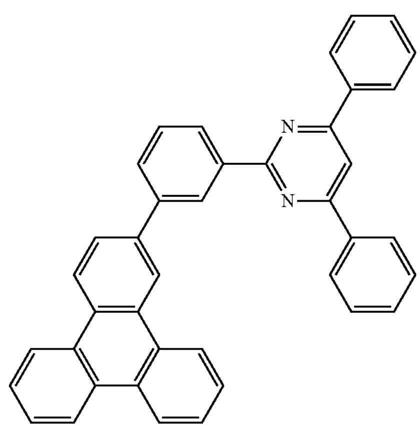

-continued
A-15
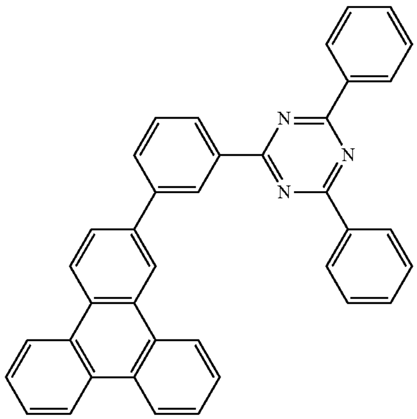
A-16
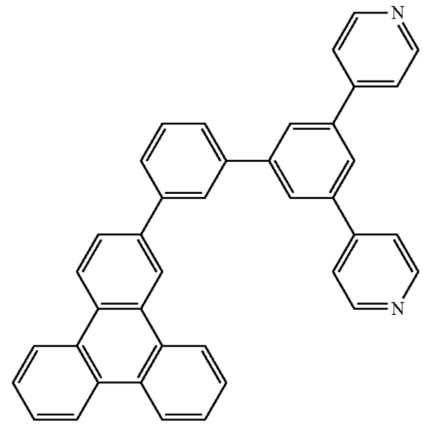
A-17
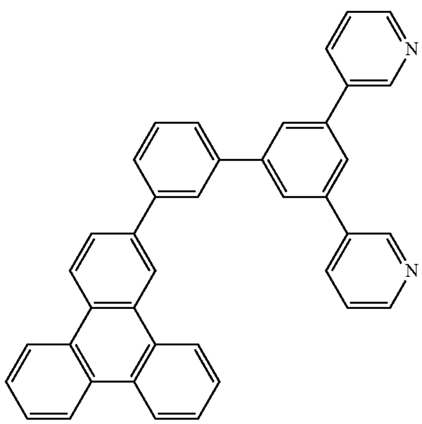
A-18
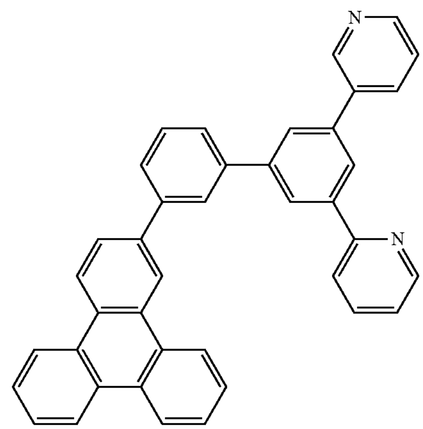
A-19
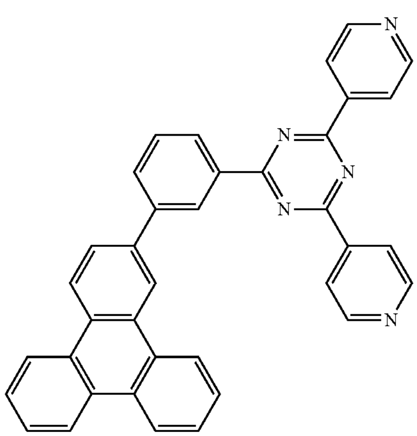
A-20
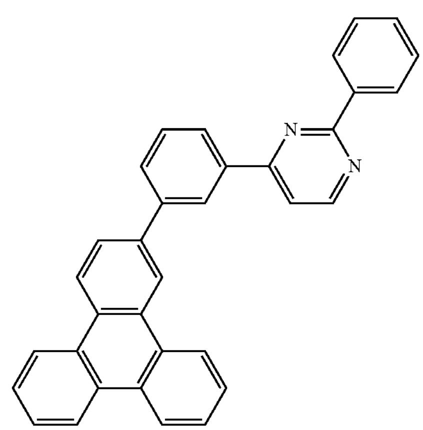

-continued
A-21
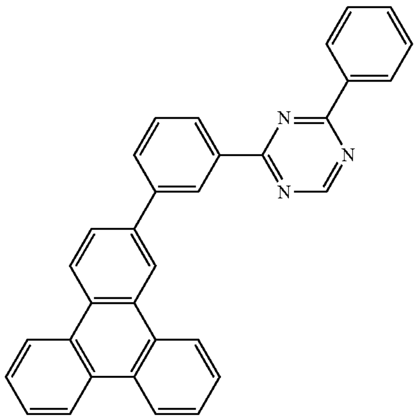
A-22
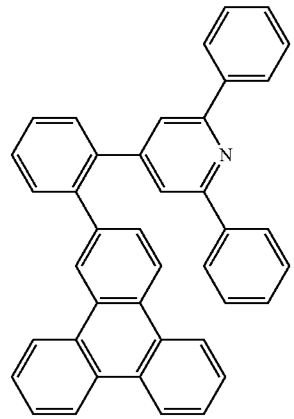
A-23
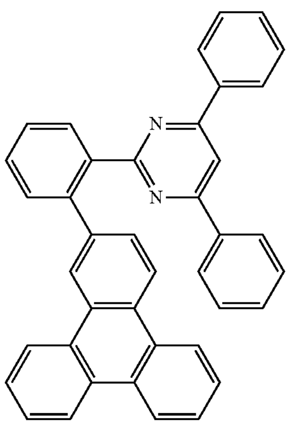
A-24
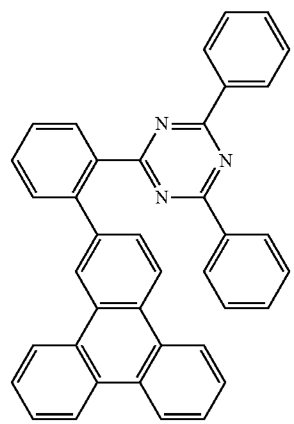
A-25
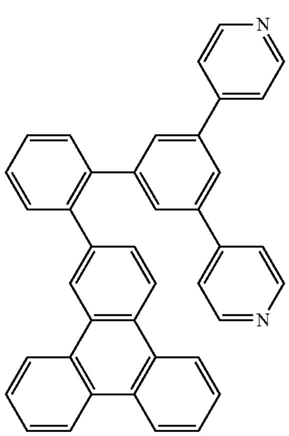
A-26
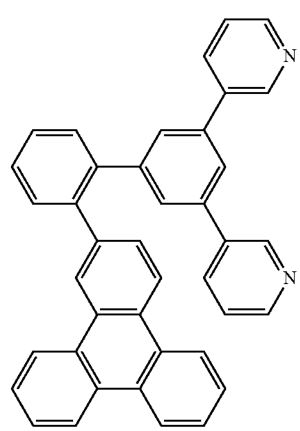

-continued
A-27
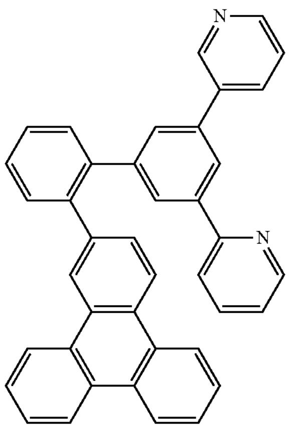
A-28
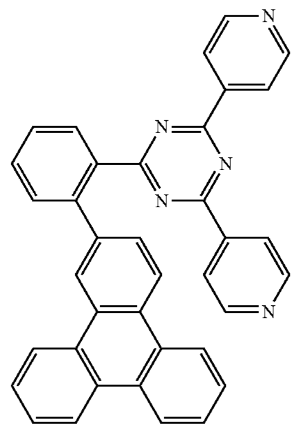
A-27
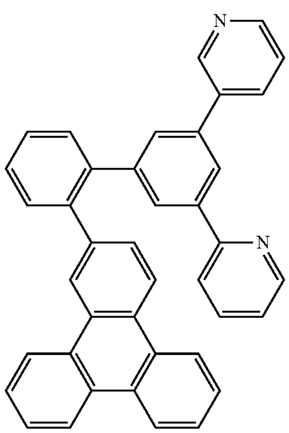
A-28
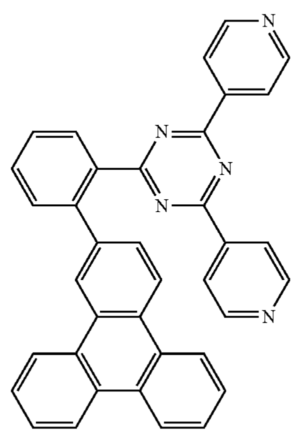
A-29
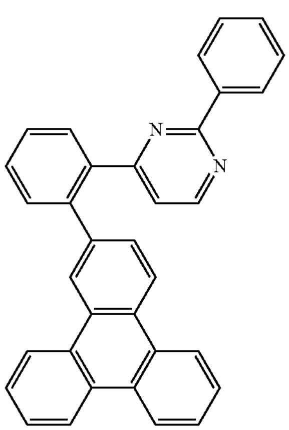
A-30
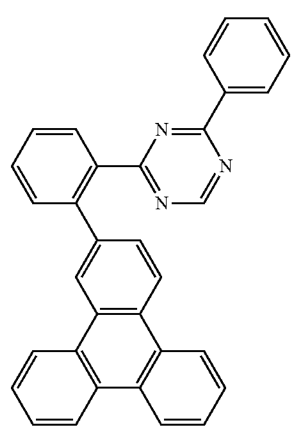

-continued
A-31
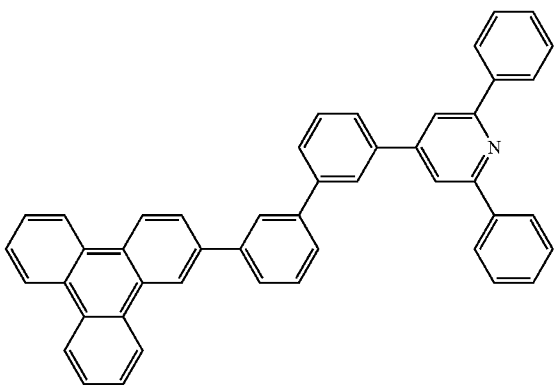
A-32
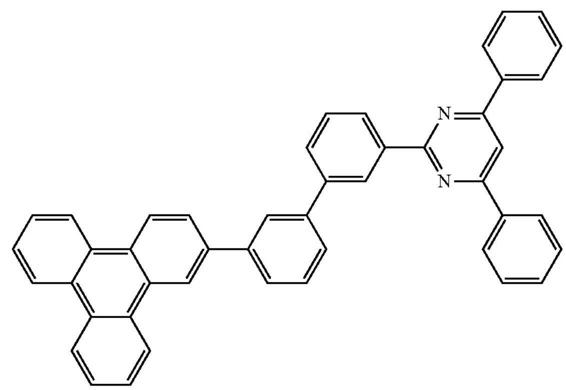
A-33
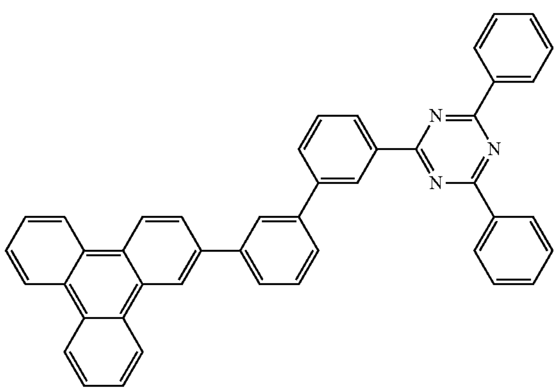
A-34
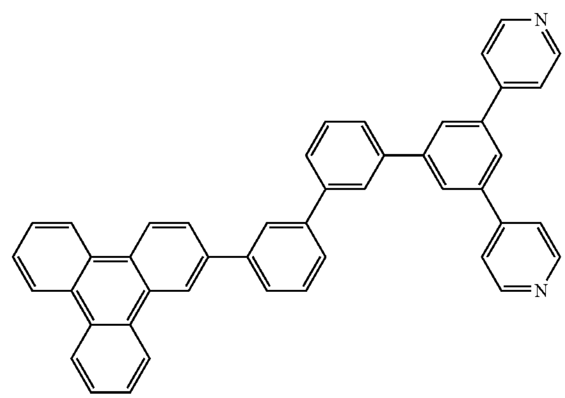
A-35
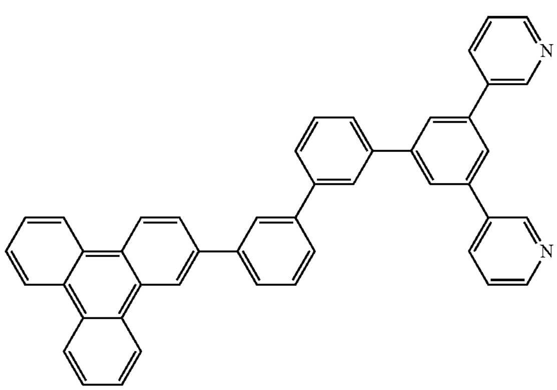
A-36
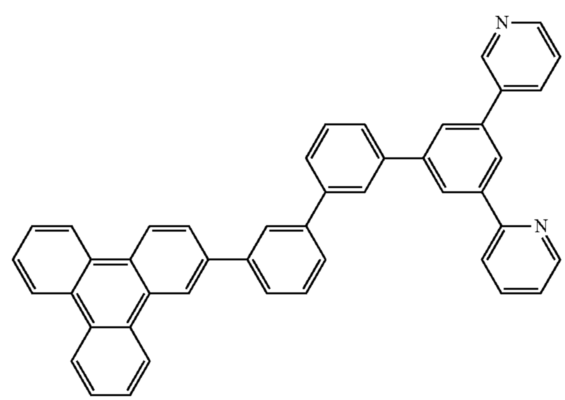
A-37
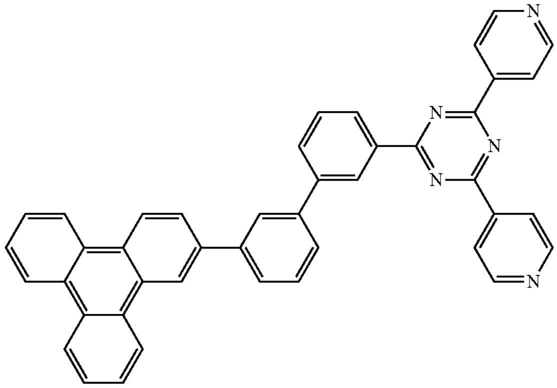
A-38
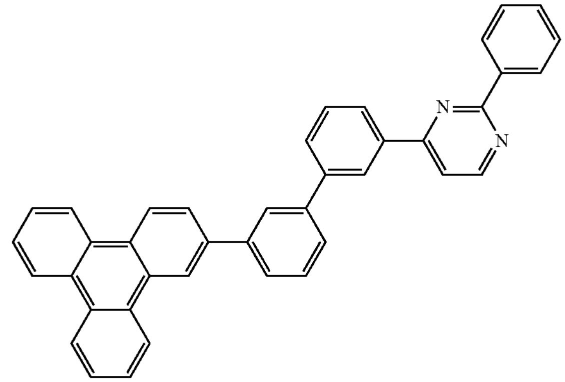

-continued
A-39
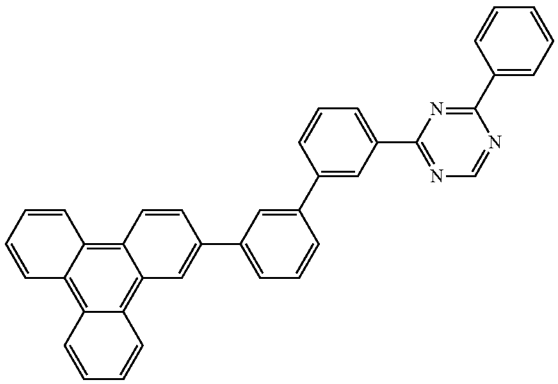
A-40
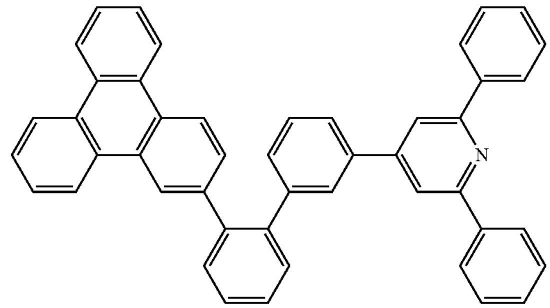
A-41
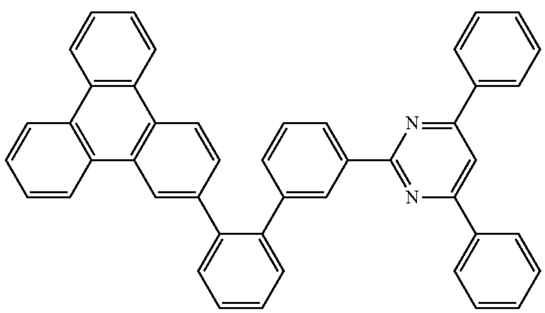
A-42
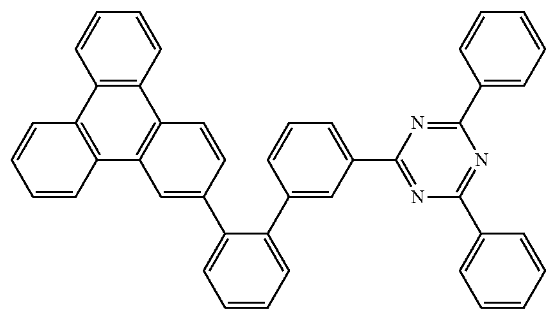
A-43
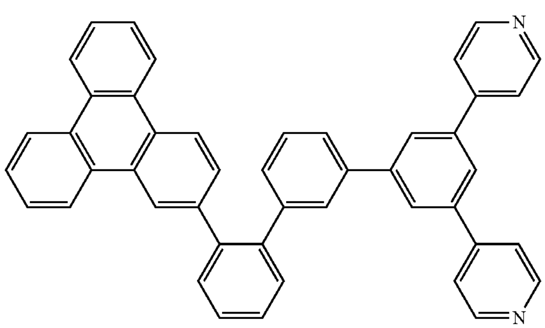
A-44
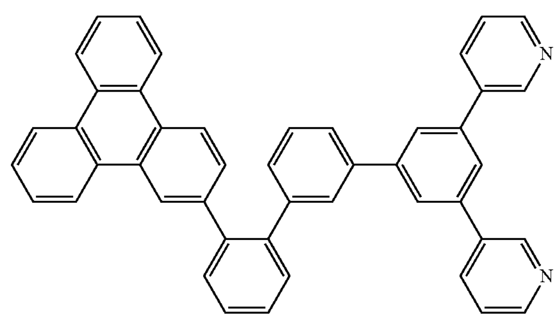
A-45
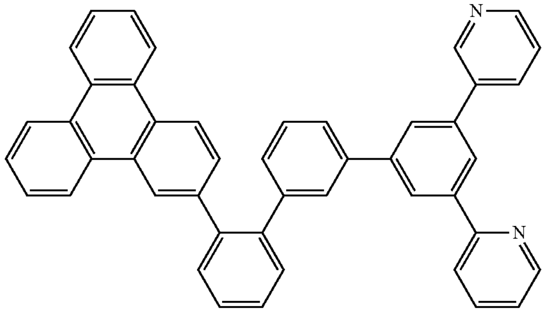
A-46
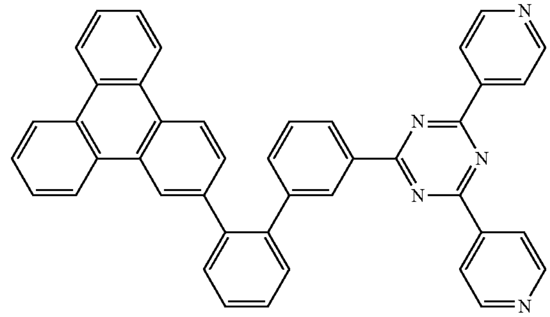

-continued
A-47
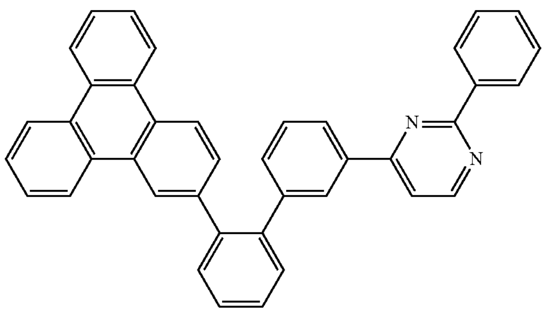
A-48
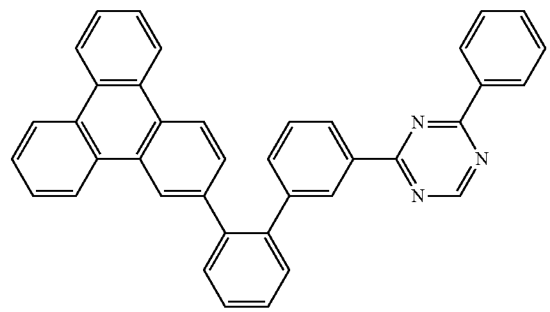
A-49
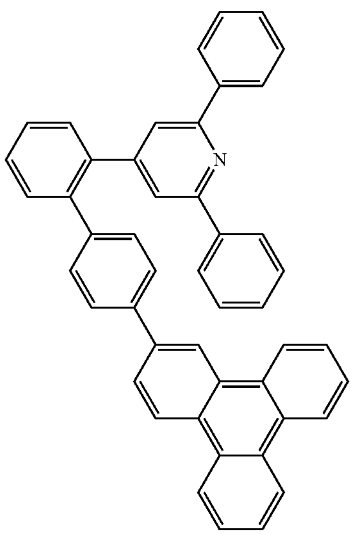
A-50
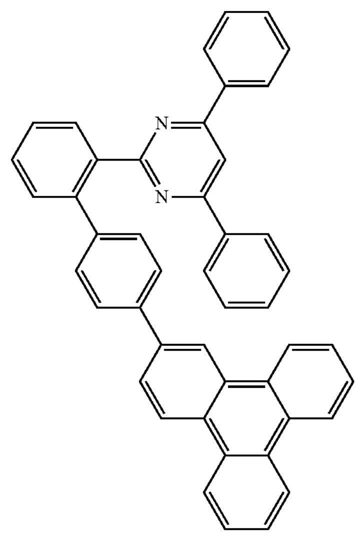
A-51
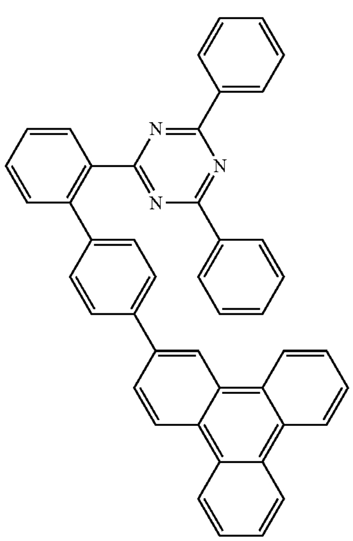
A-52
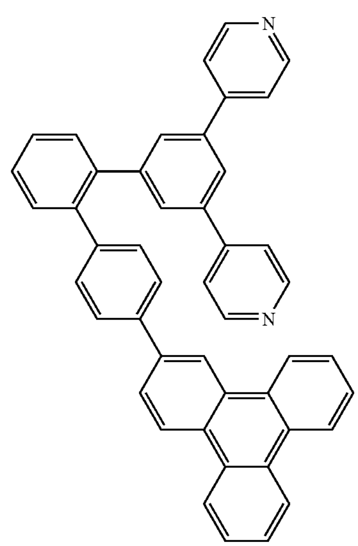

-continued
A-53
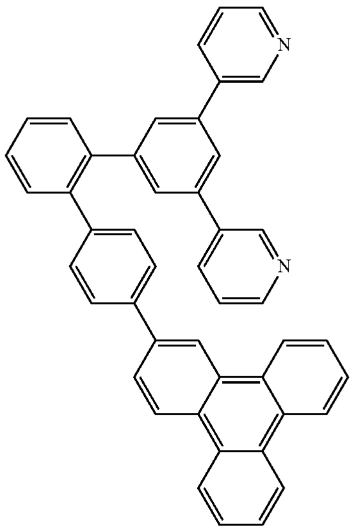
A-54
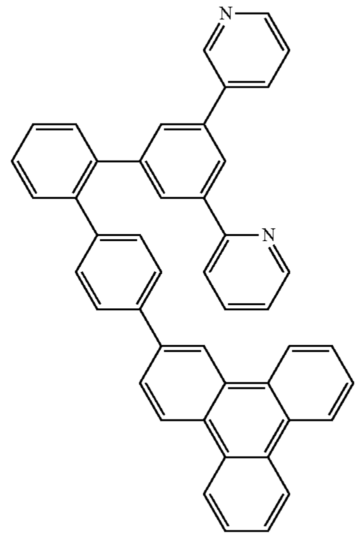
A-55
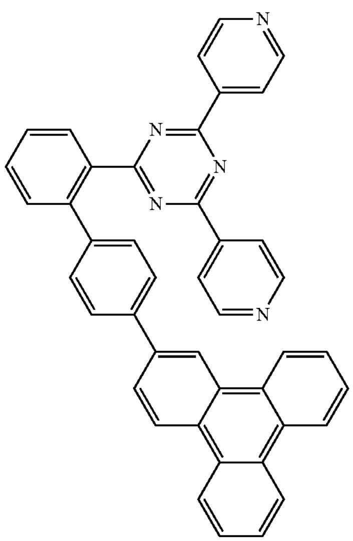
A-56
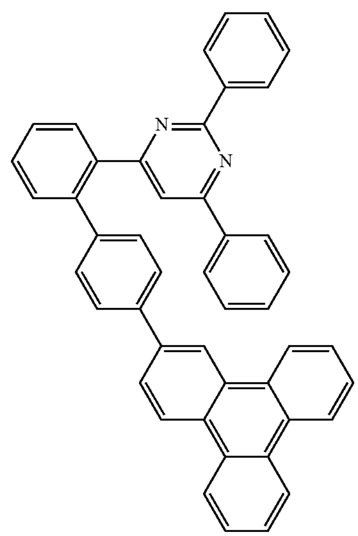
A(1)
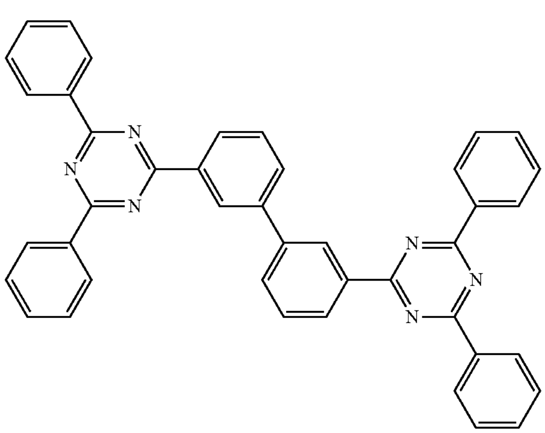
A(2)
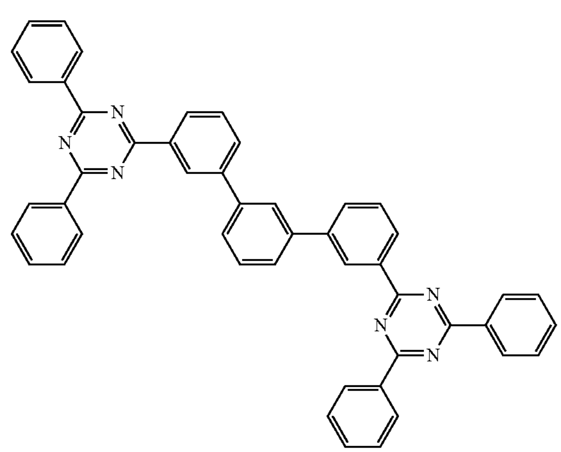

-continued
A(3)
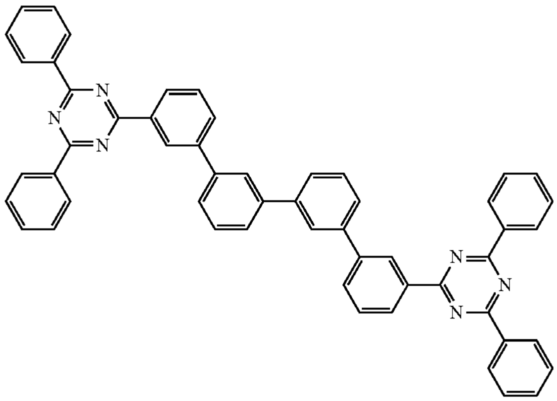
A(4)
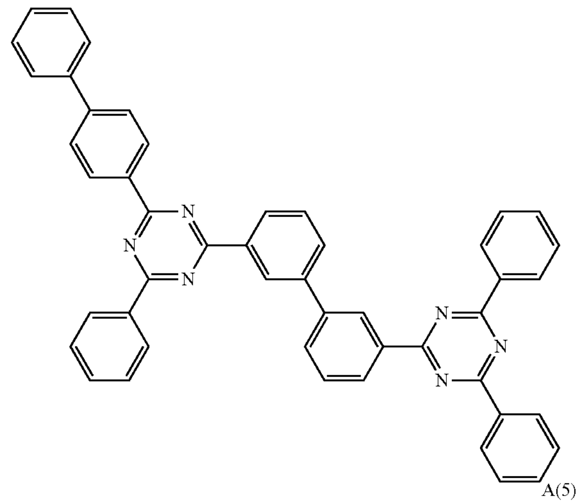
A(5)
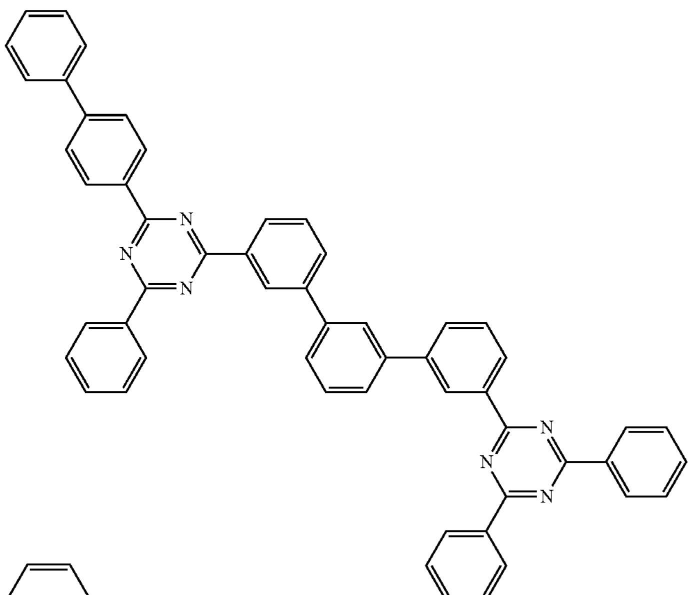
A(6)
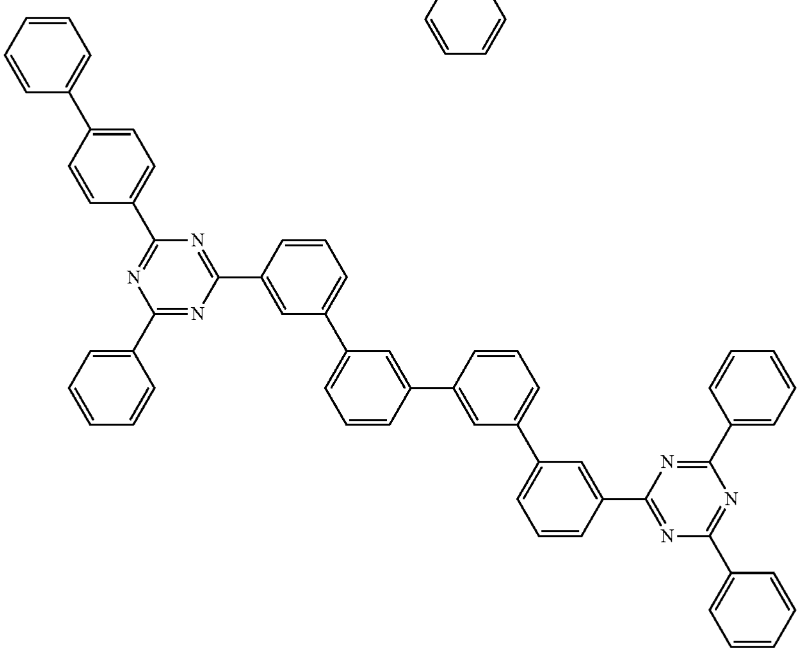

-continued
A(7)
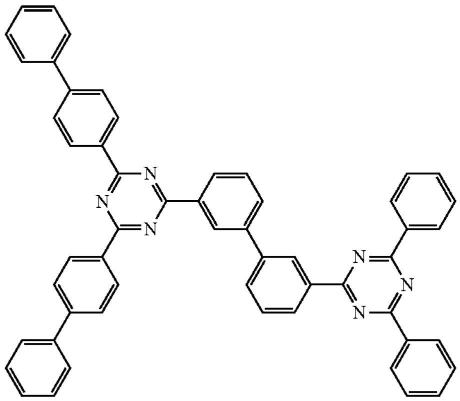
A(8)
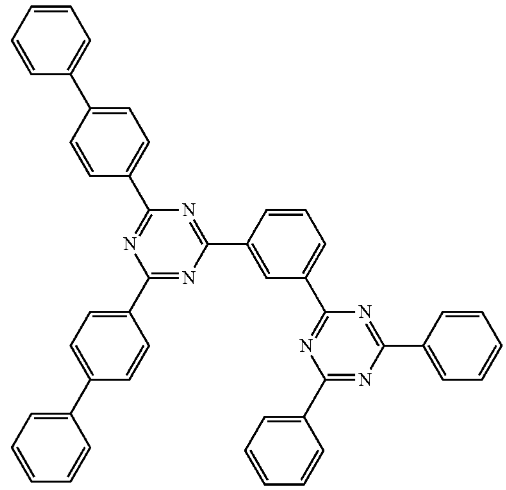
A(9)
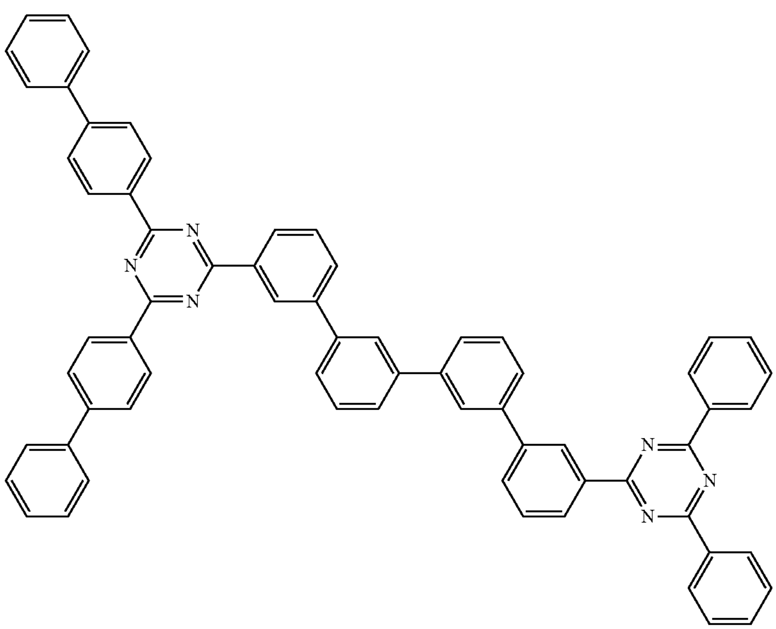

-continued
A(10)
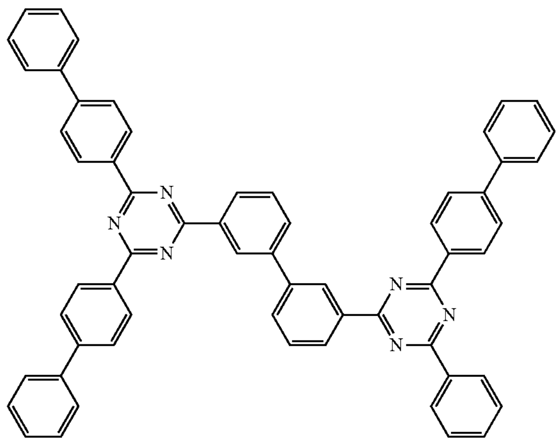
A(11)
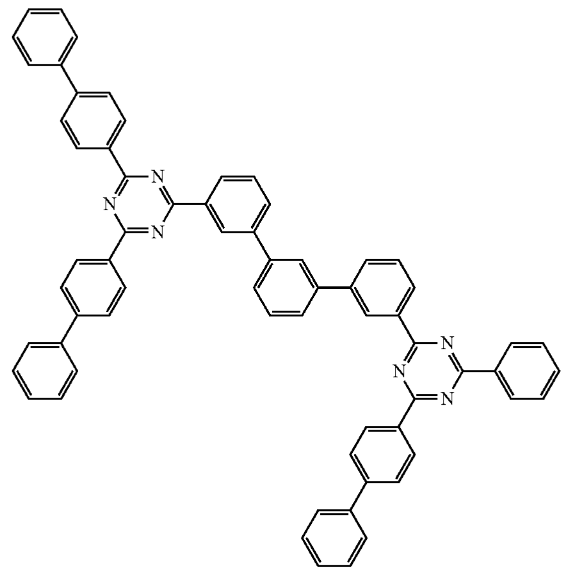
A(12)
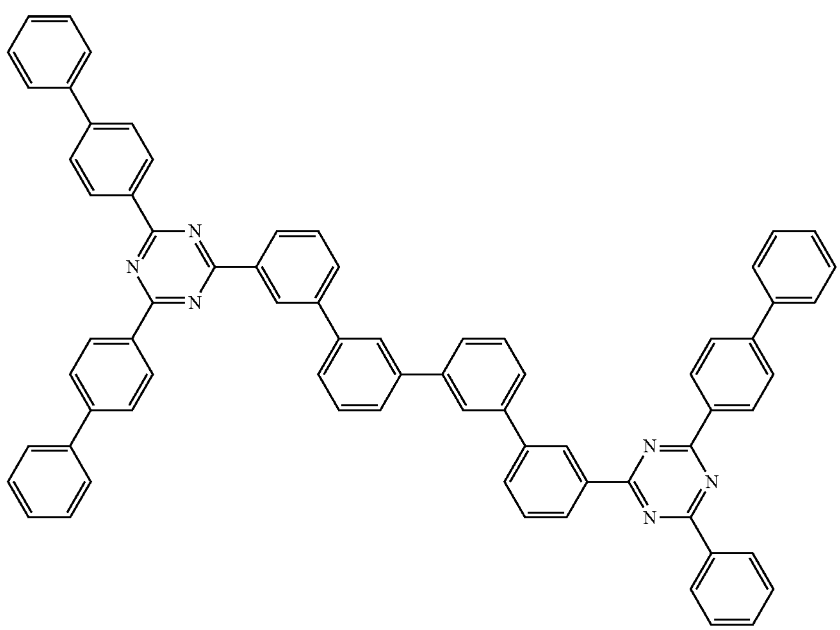

-continued
A(13)
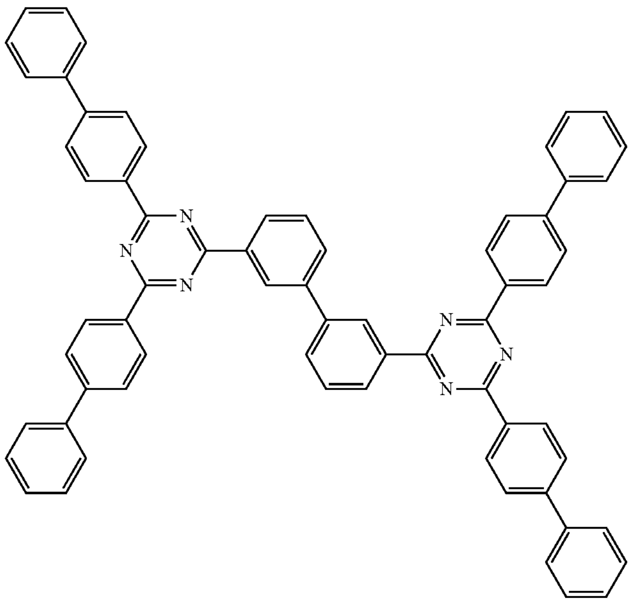
A(14)
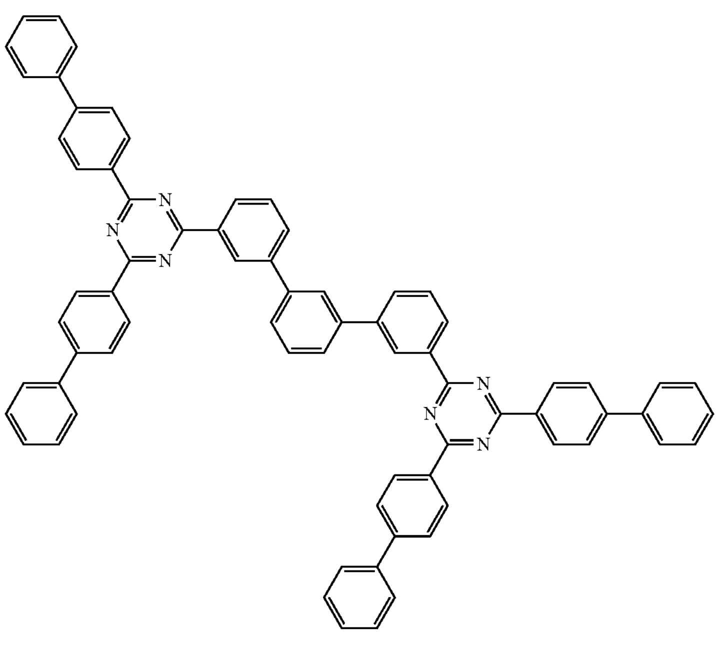

-continued
A(15)
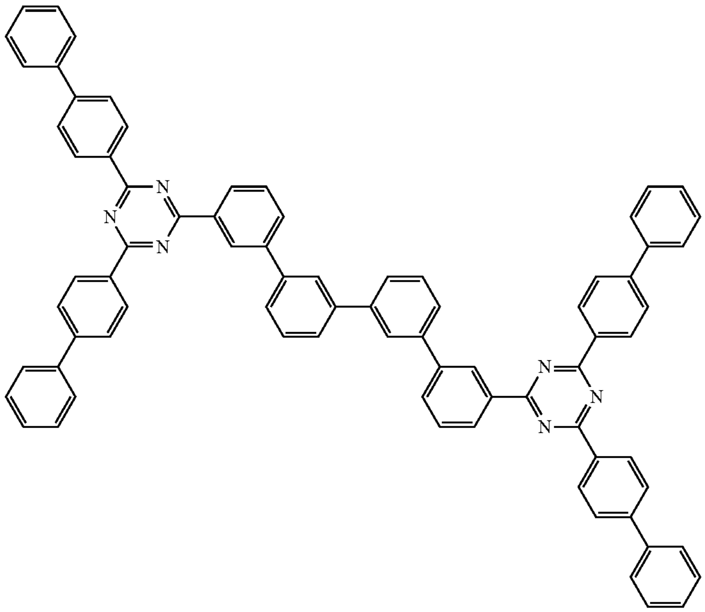
A(16)
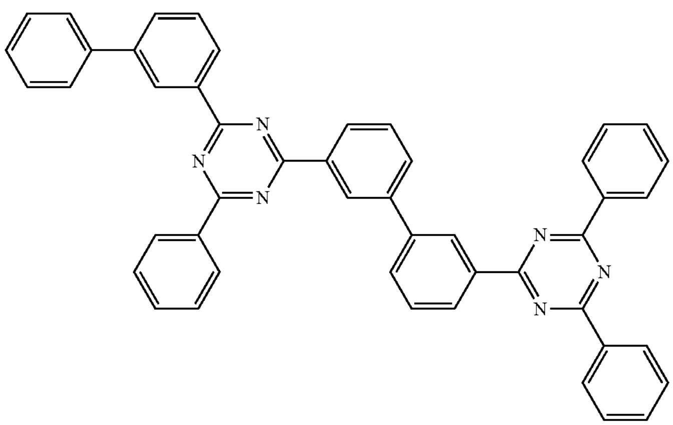
A(17)
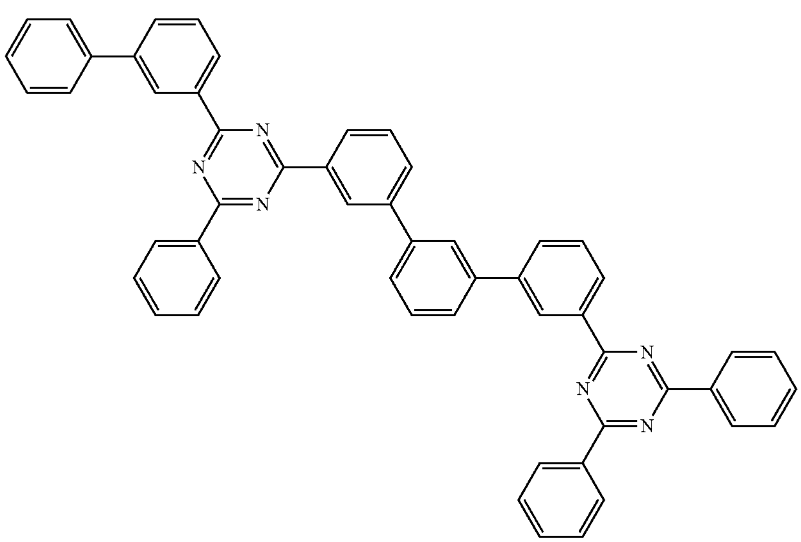

-continued
A(18)
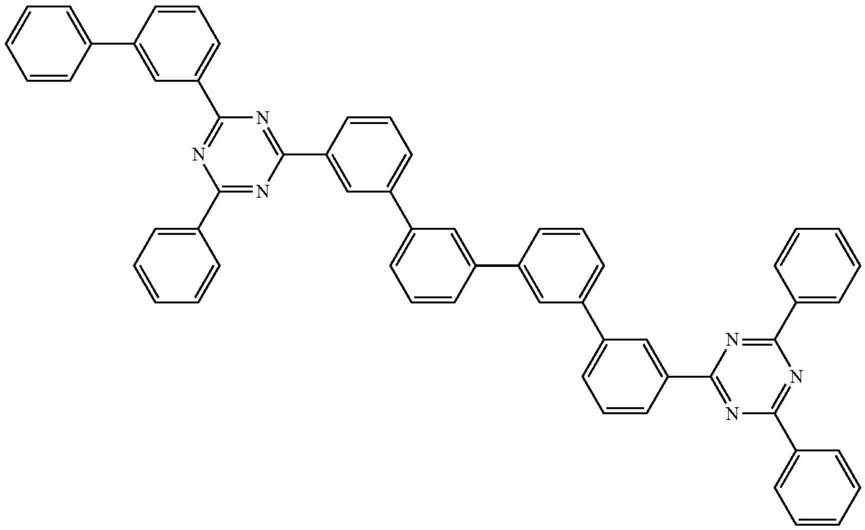
A(19)
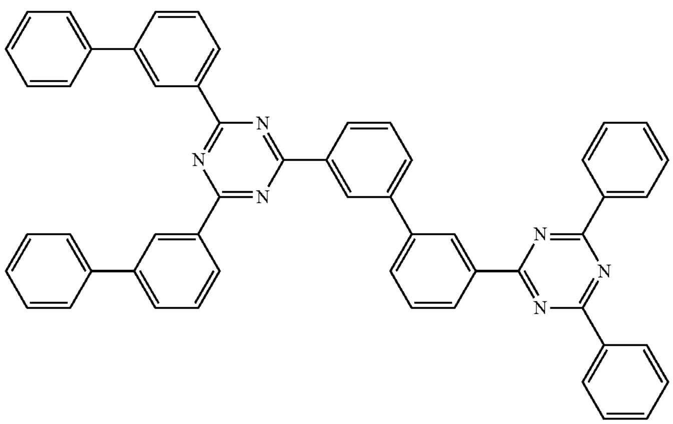
A(20)
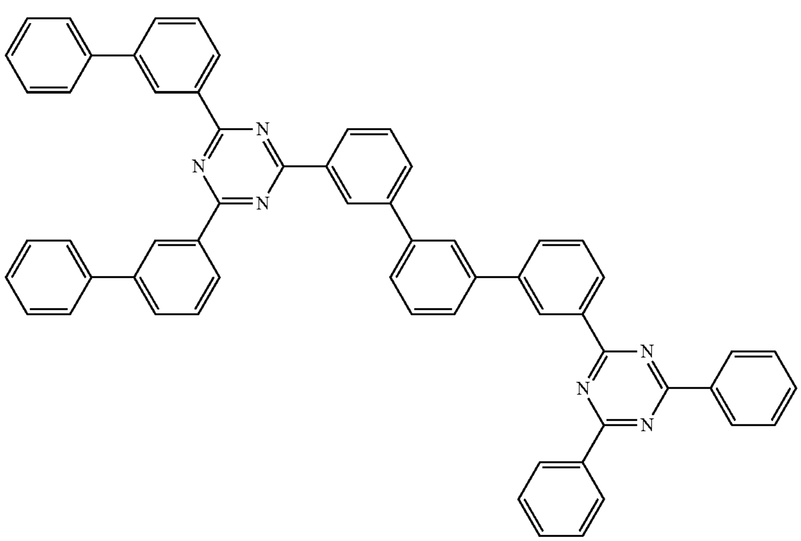

-continued
A(21)
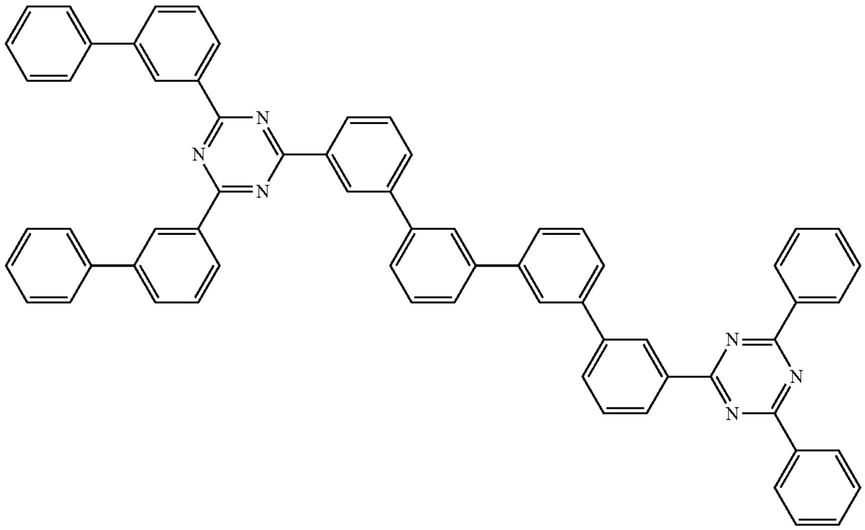
A(22)
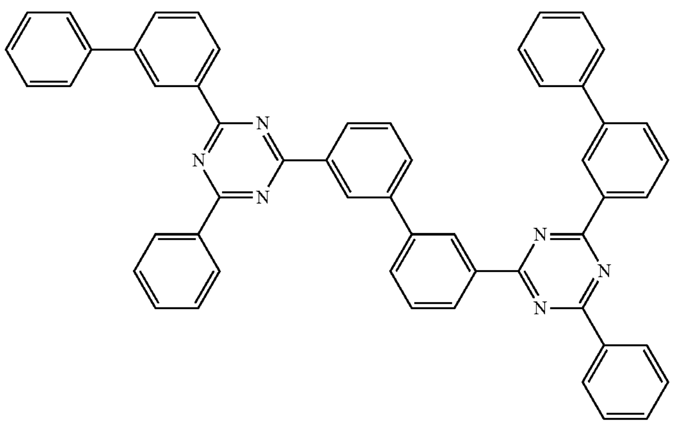
A(23)
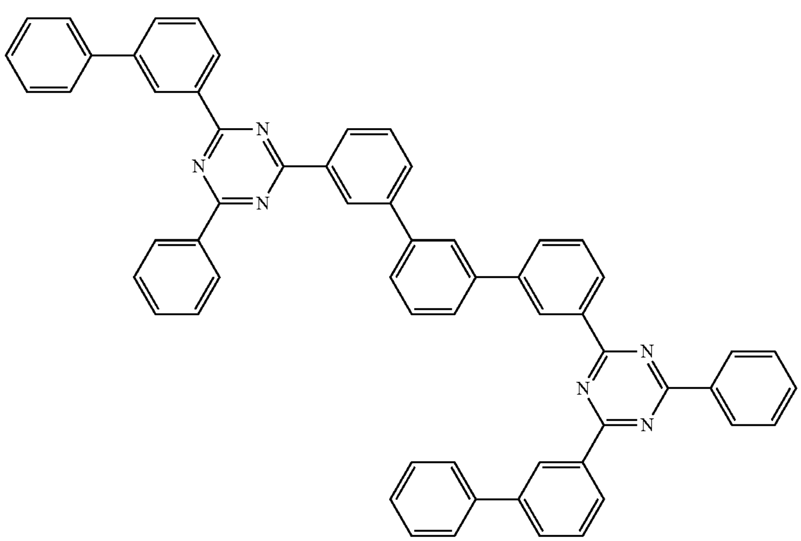

-continued
A(24)
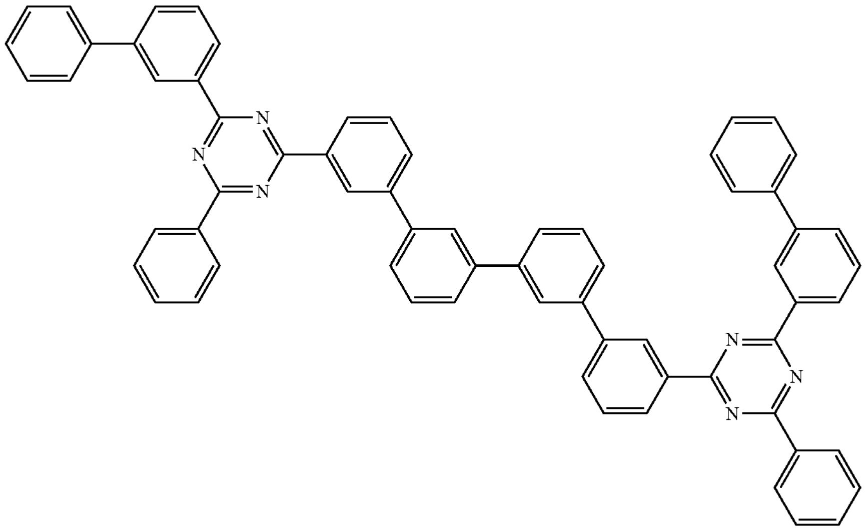
A(25)
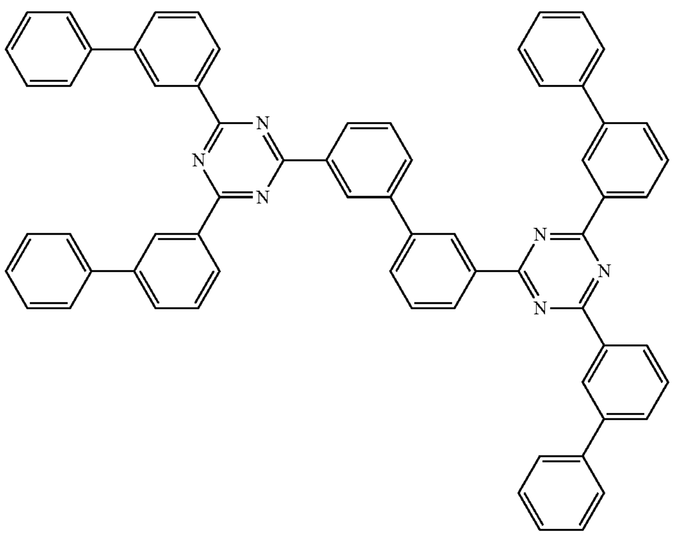
A(26)
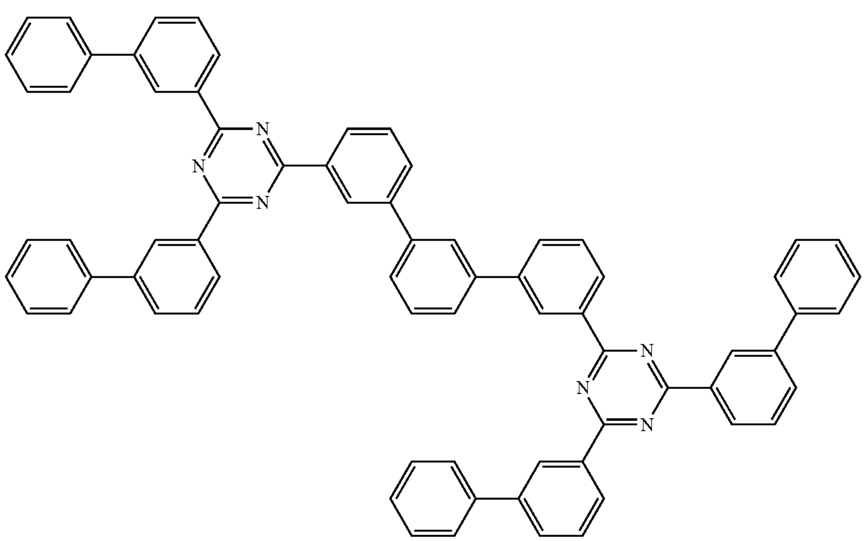

-continued
A(27)
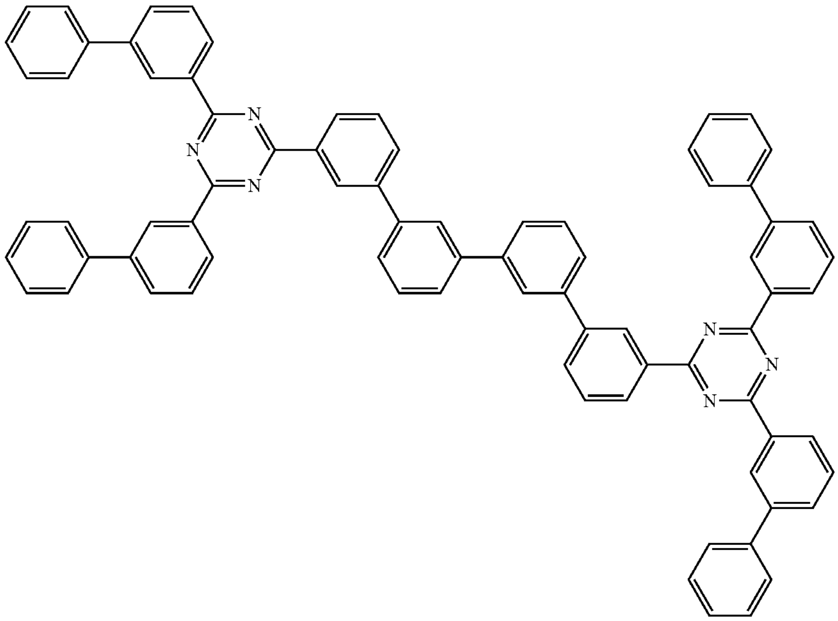
A(28)
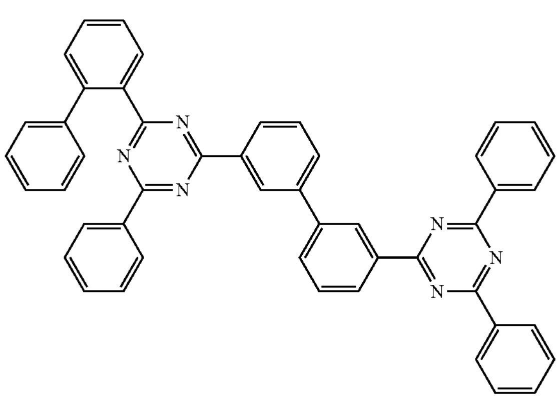
A(29)
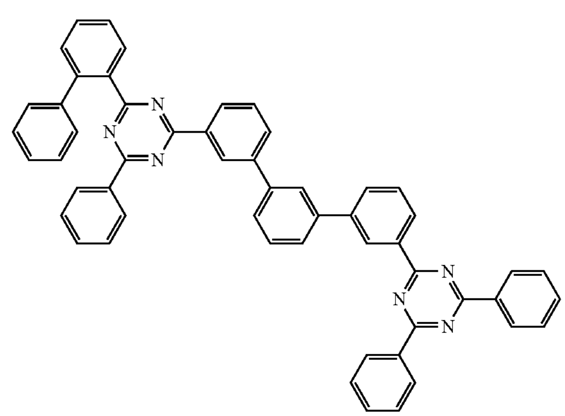

-continued
A(30)
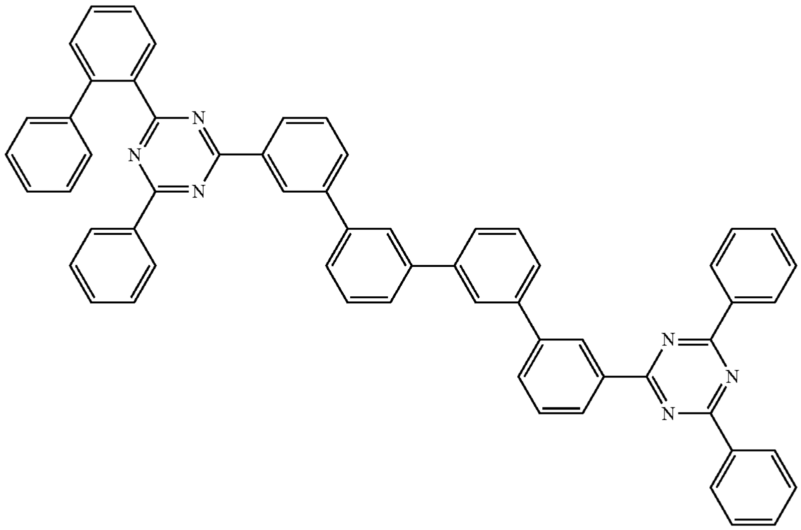
A(31)
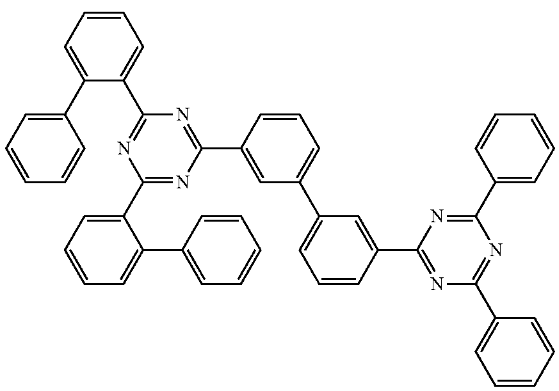
A(32)
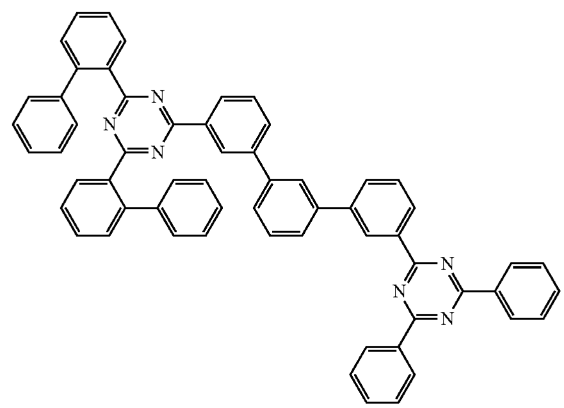
A(33)
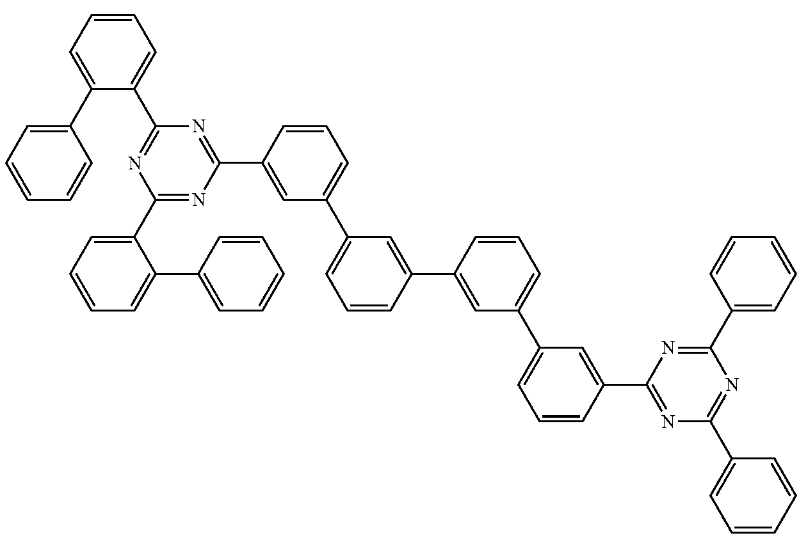

-continued
A(34)
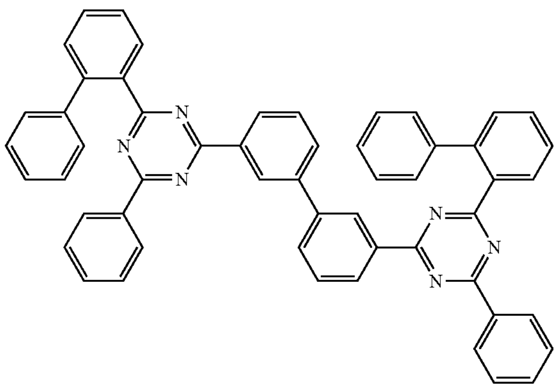
A(35)
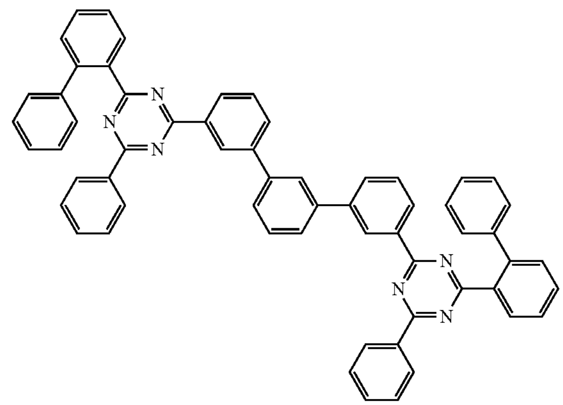
A(36)
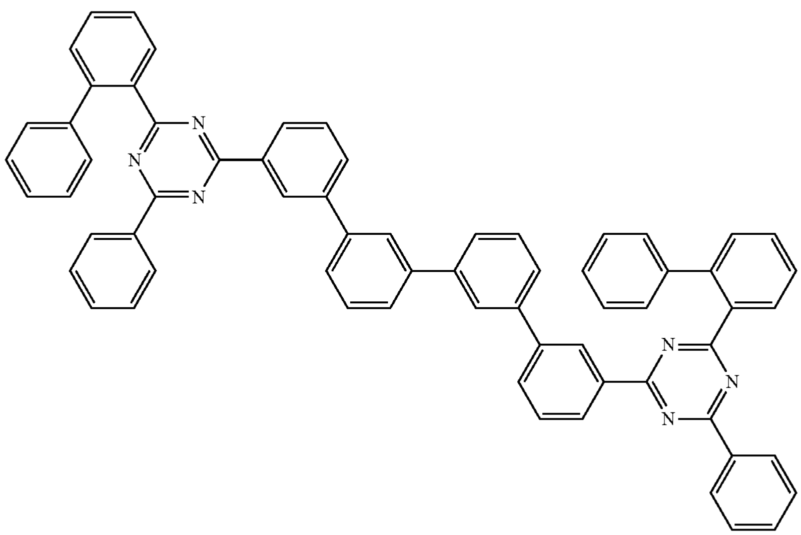
A(37)
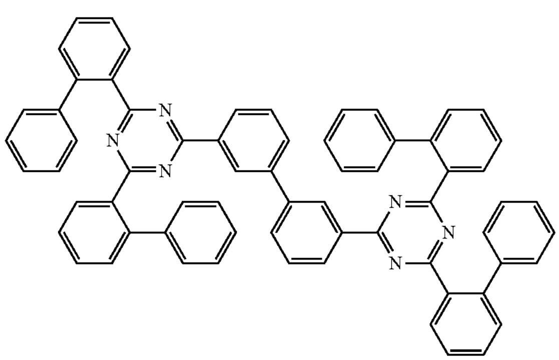
A(38)
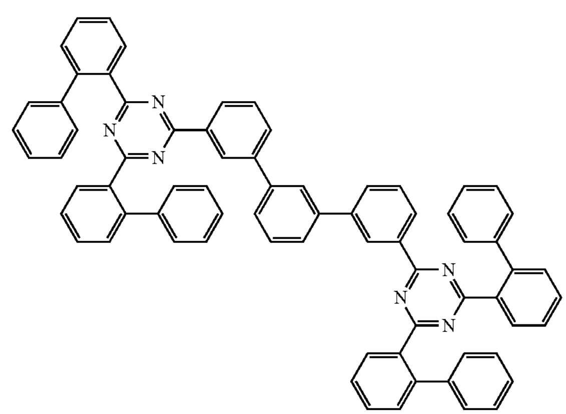

-continued
A(39)
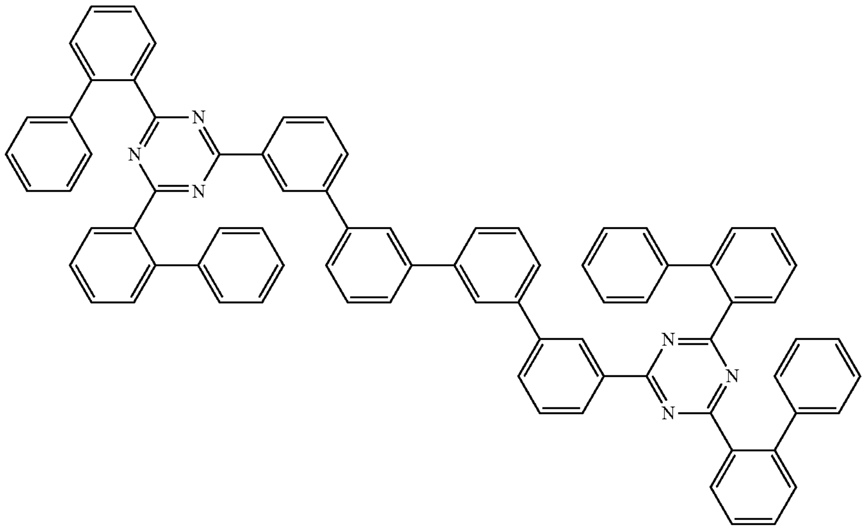
A(40)
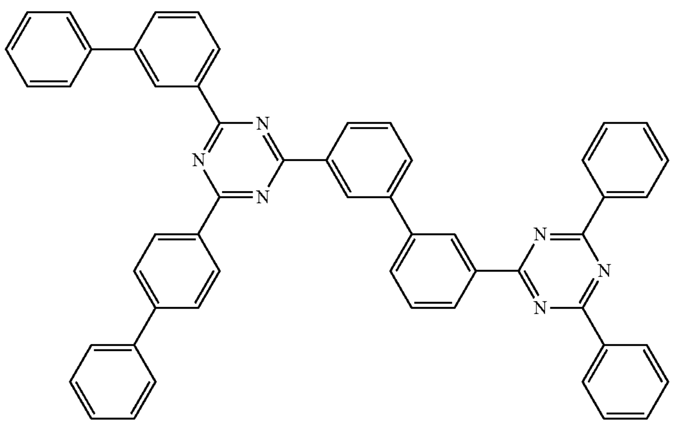
A(41)
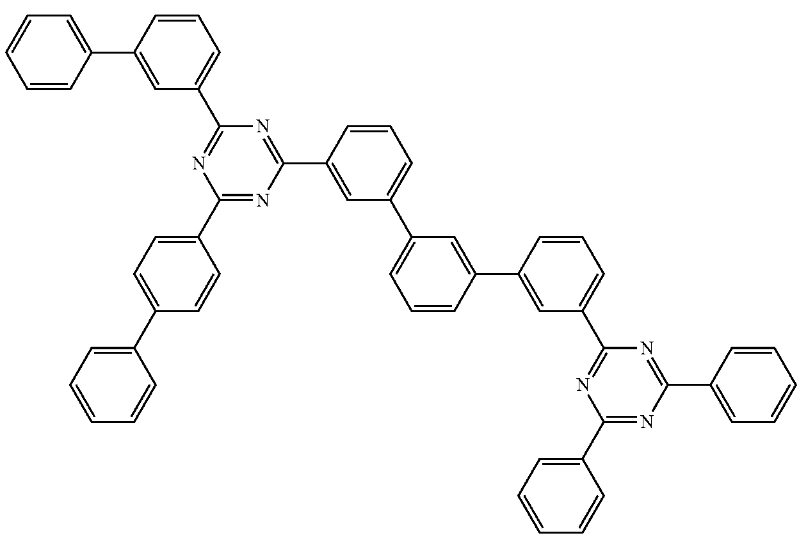

-continued
A(42)
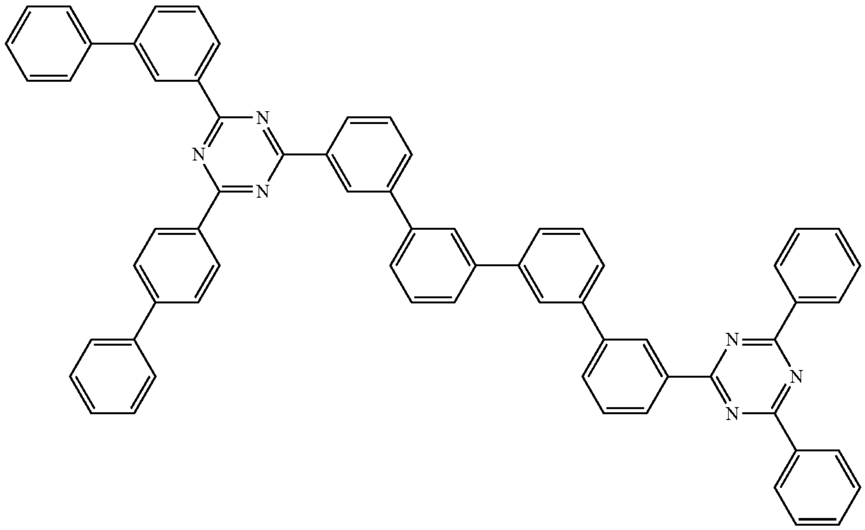
A(43)
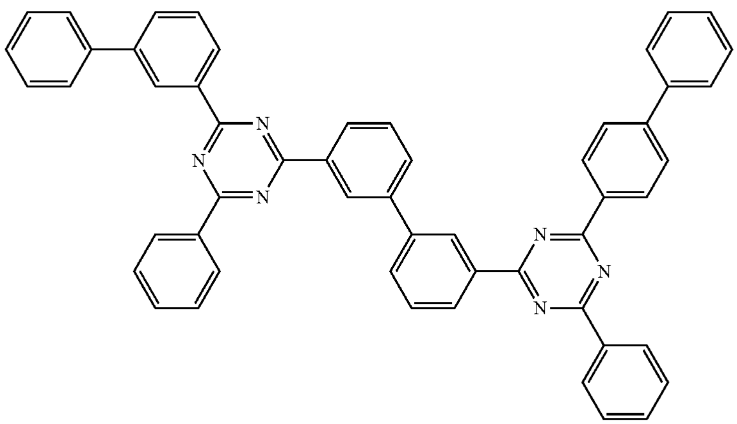
A(44)
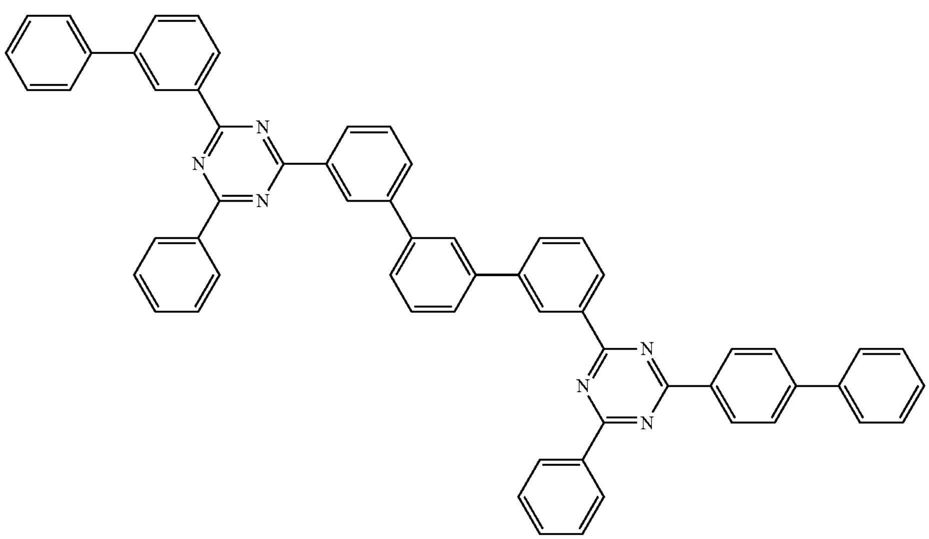

-continued
A(45)
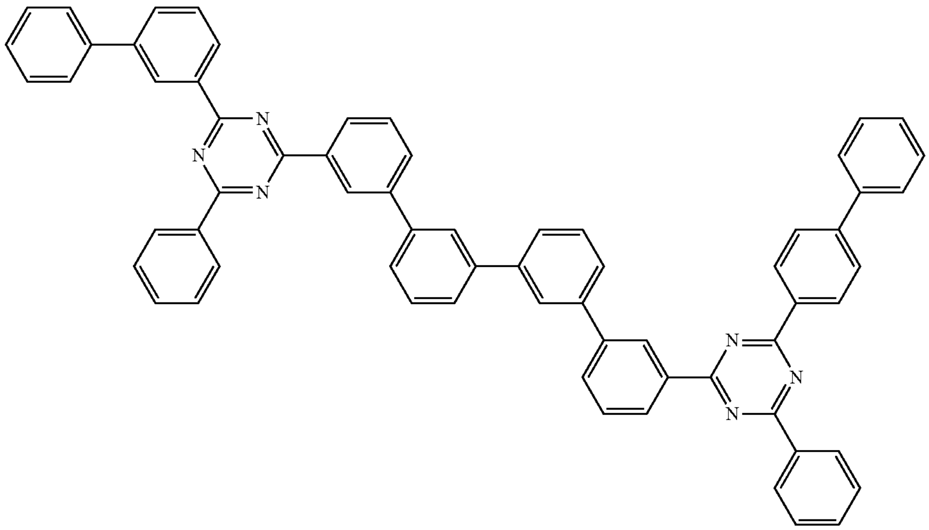
A(46)
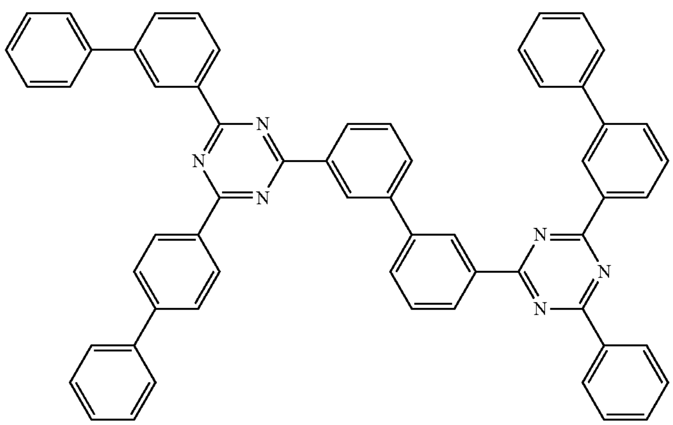
A(47)
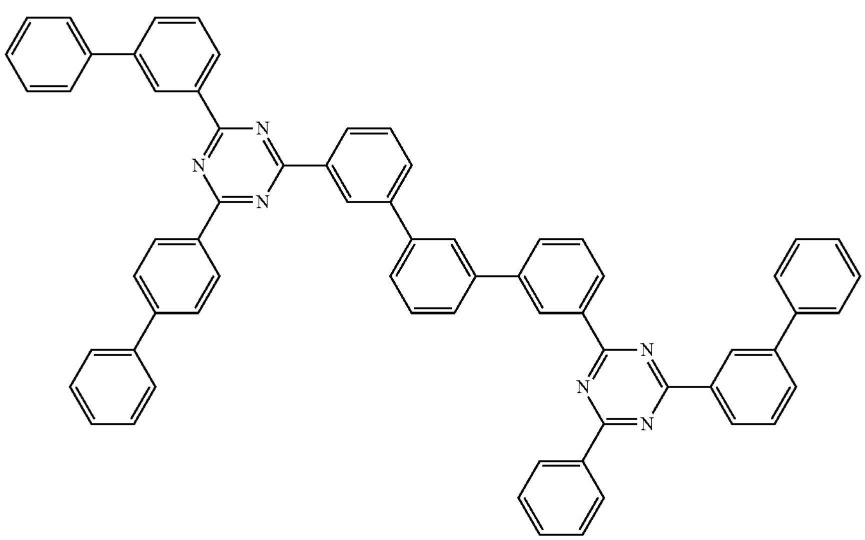

-continued
A(48)
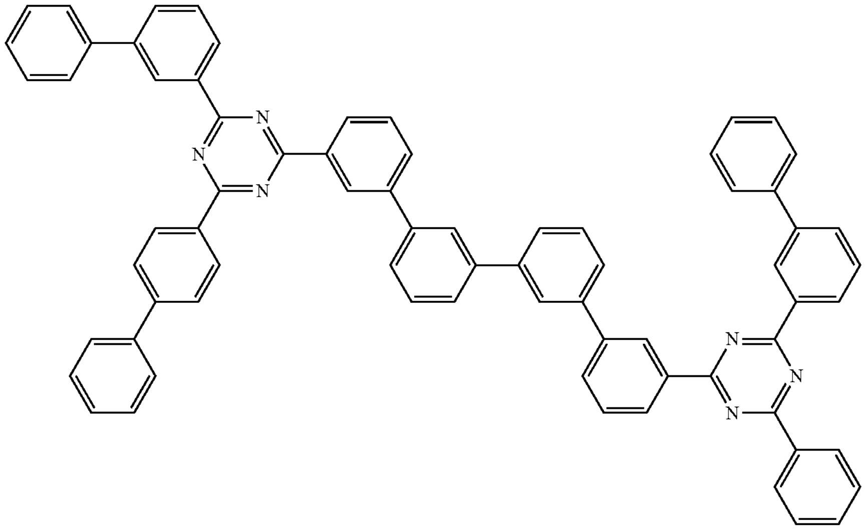
A(49)
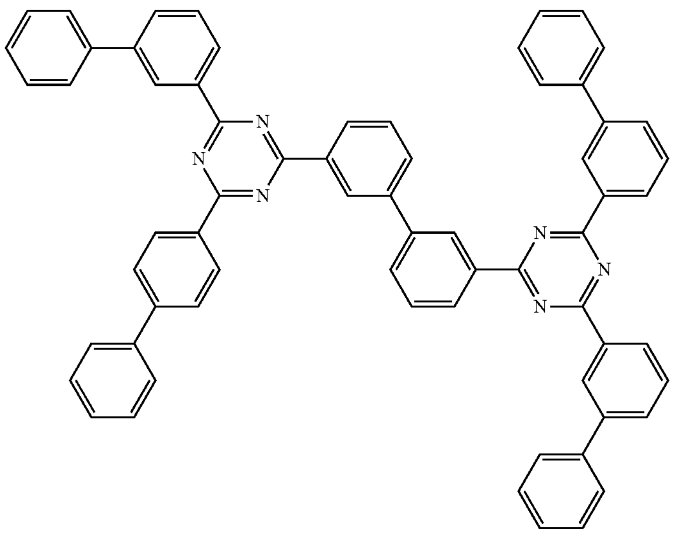
A(50)
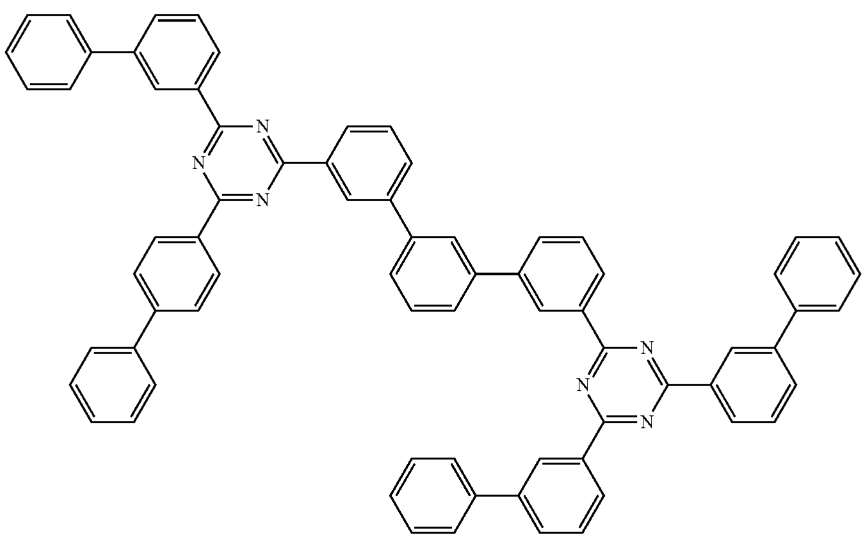

-continued
A(51)
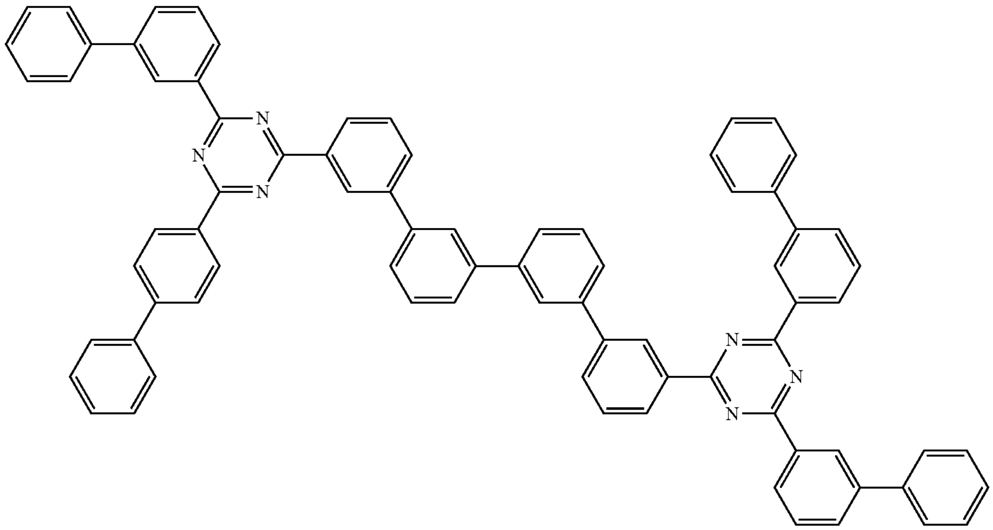
Group HE2
1
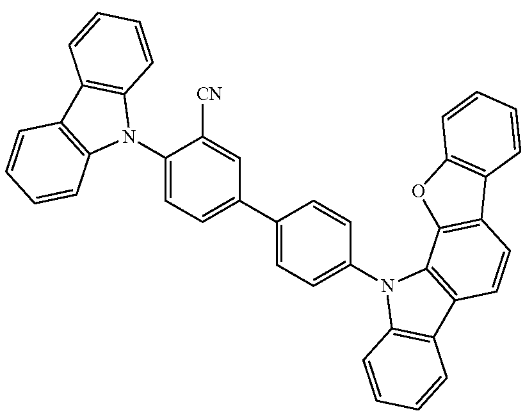
2
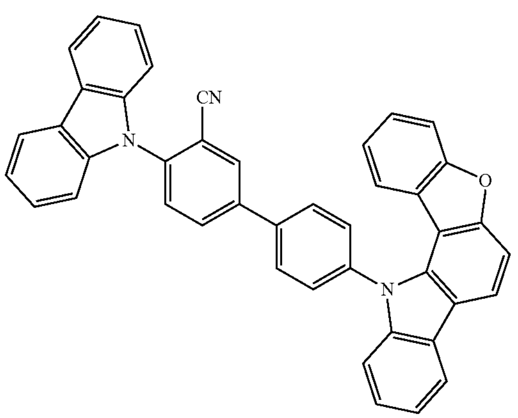
-continued
3
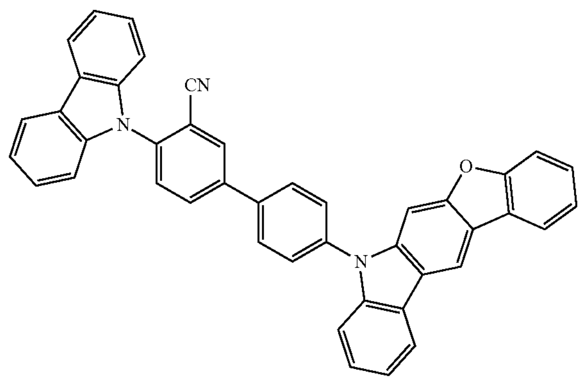
4
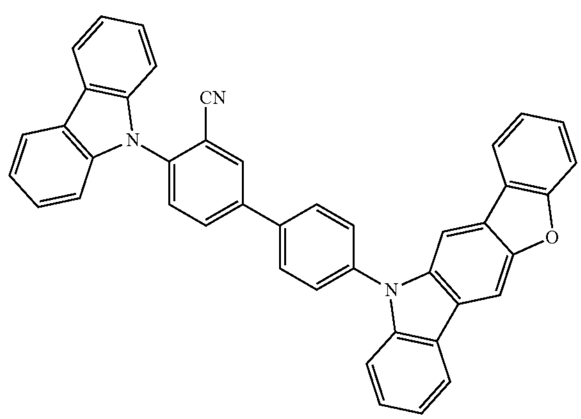

-continued
5
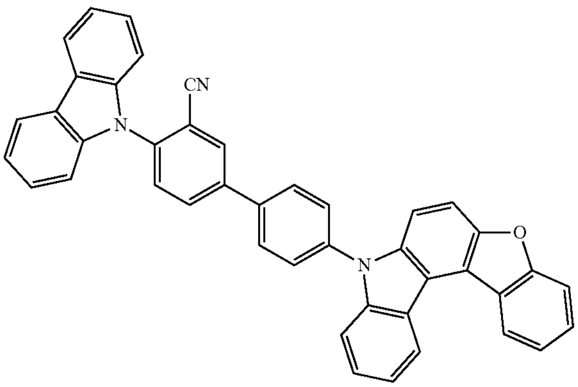
6
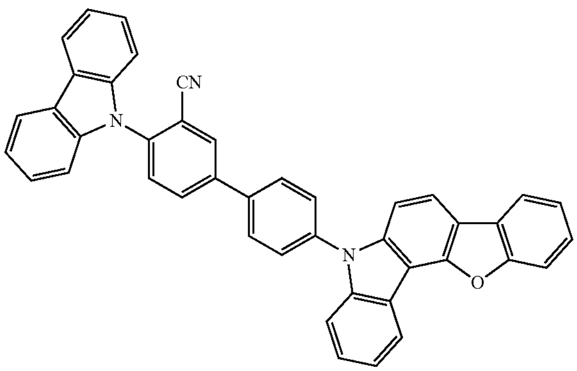
7
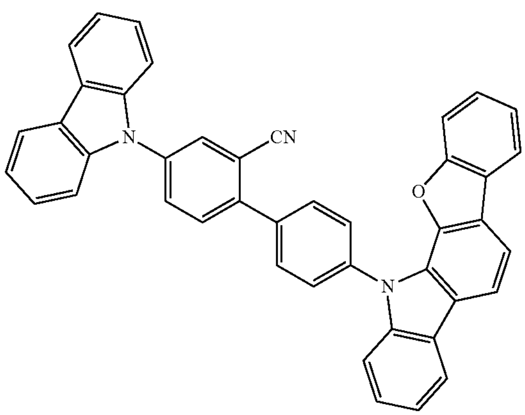
8
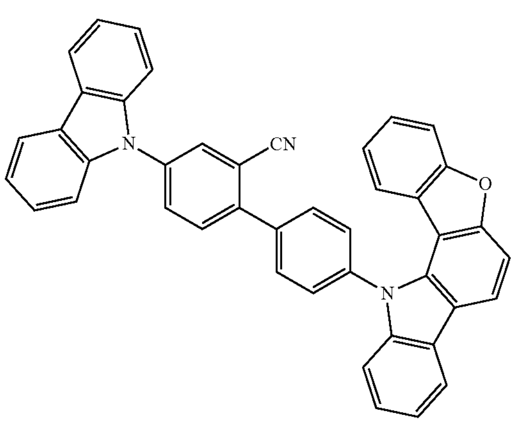
-continued
9
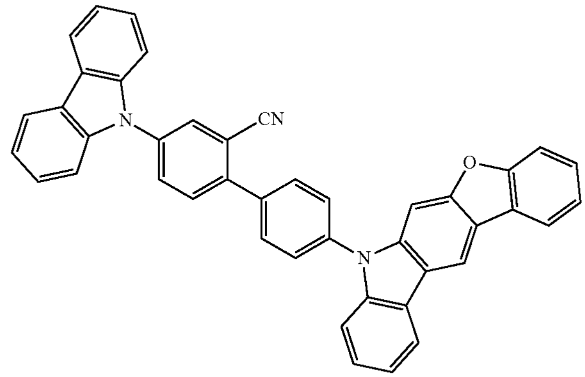
10
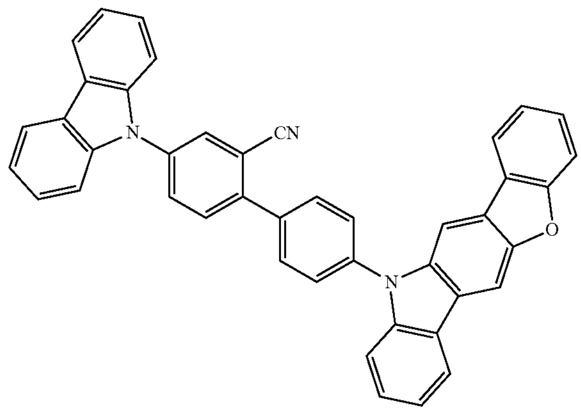
11
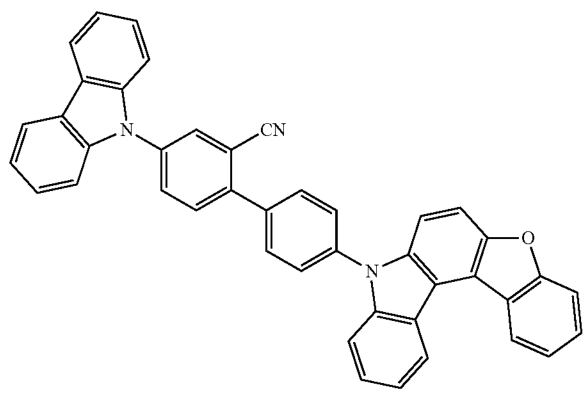
12
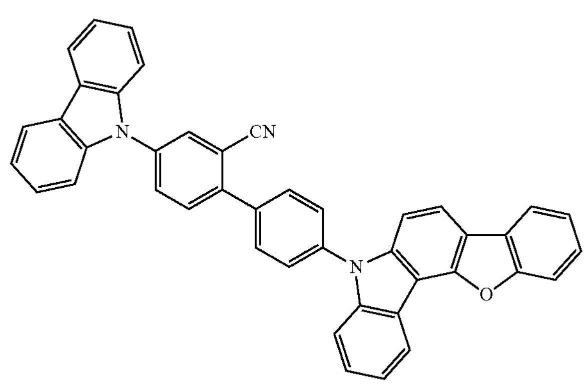

-continued
13
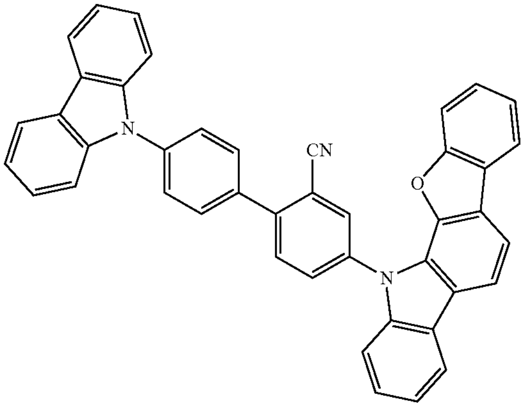
14
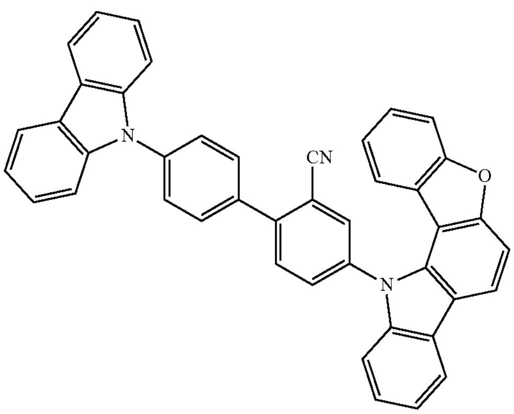
15
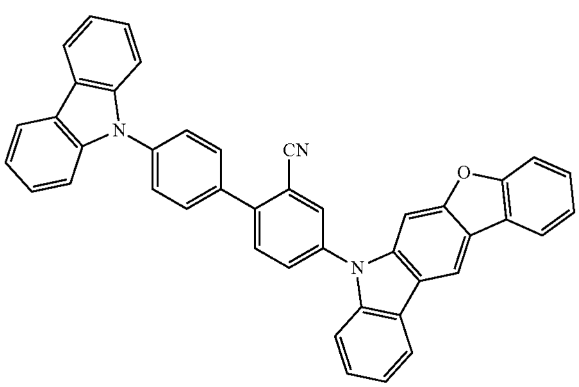
-continued
16
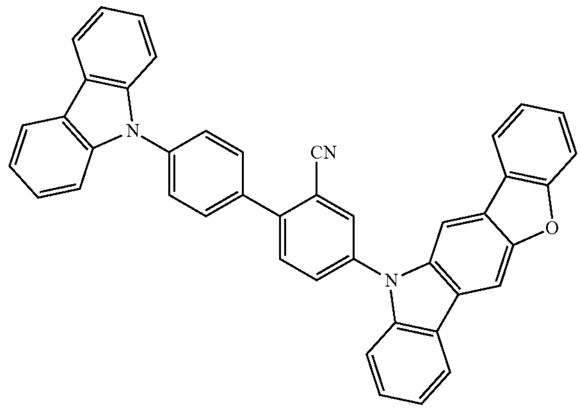
17
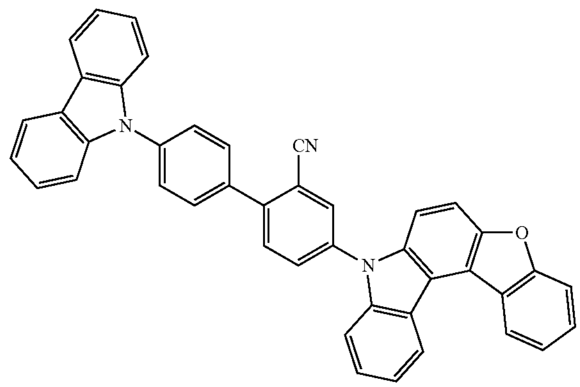
18
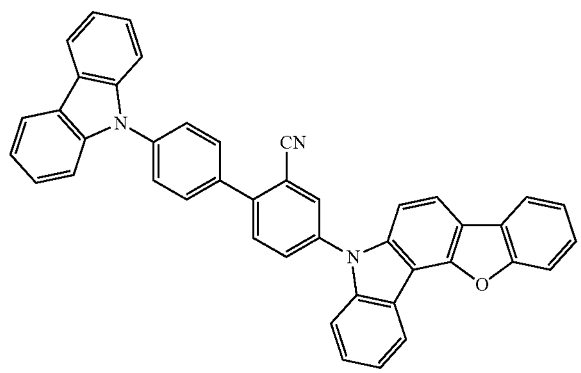
19
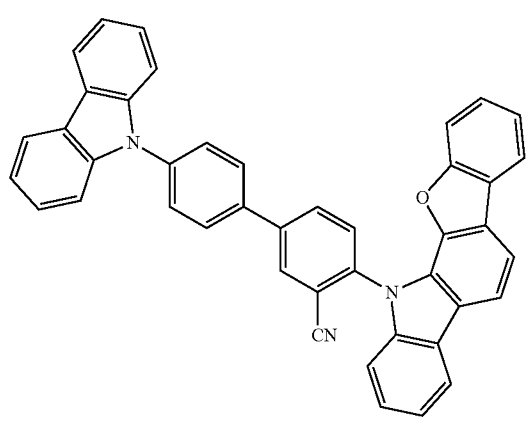

20
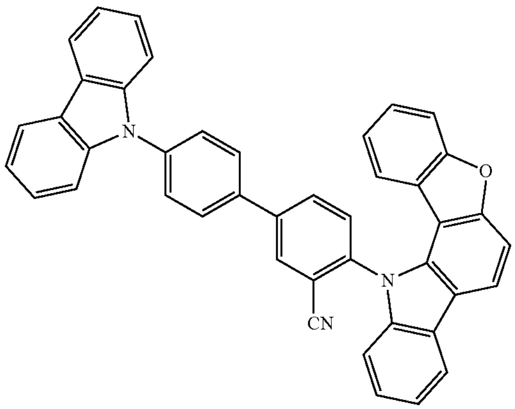
21
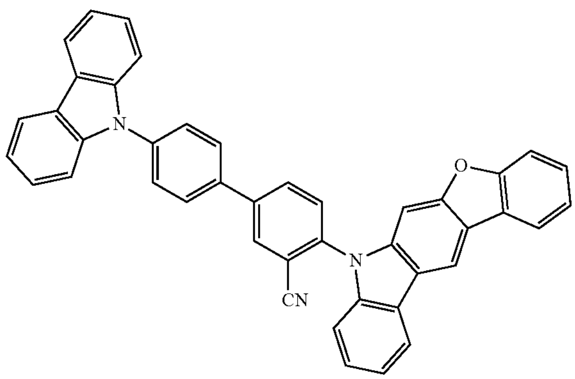
22
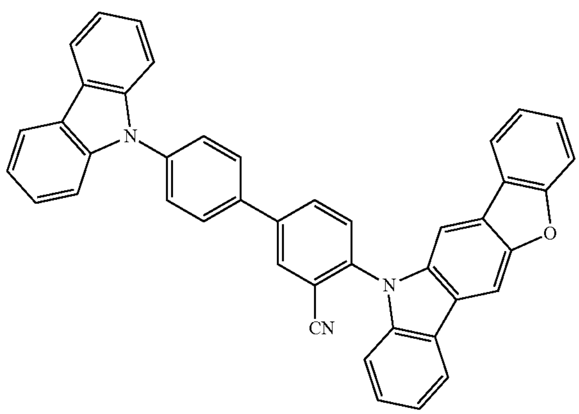
23
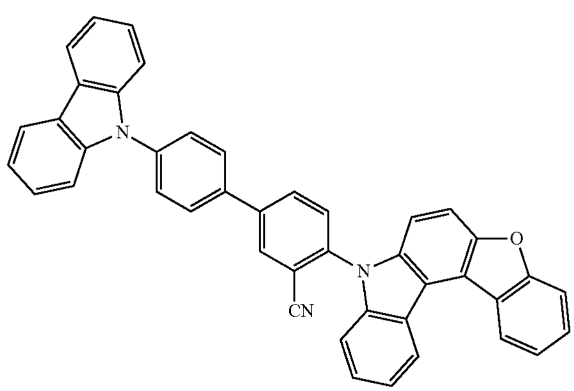
24
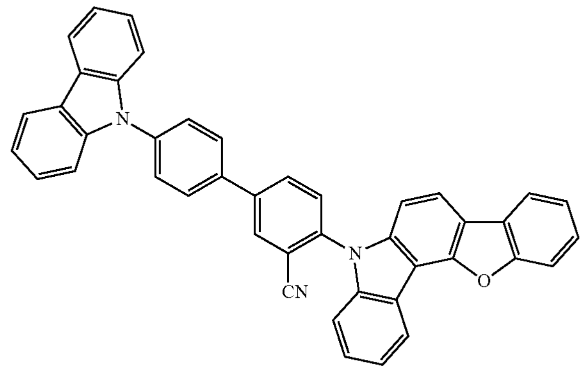
25
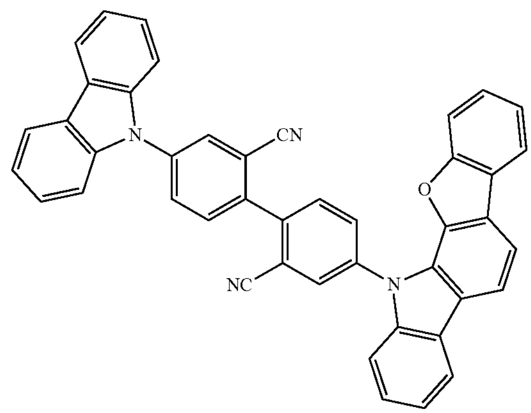
26
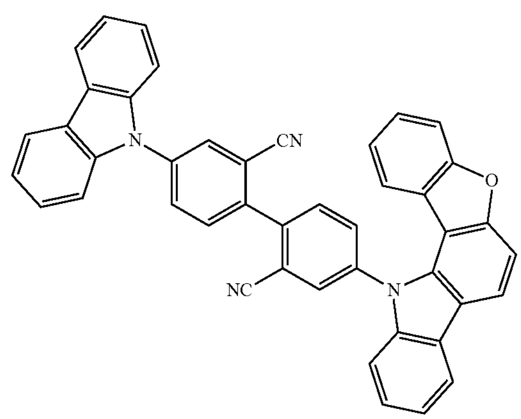
27
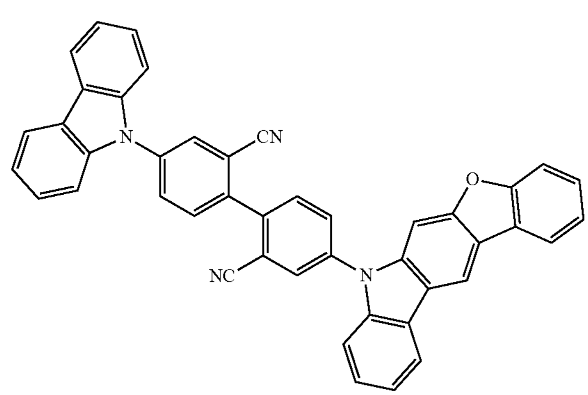

-continued
28
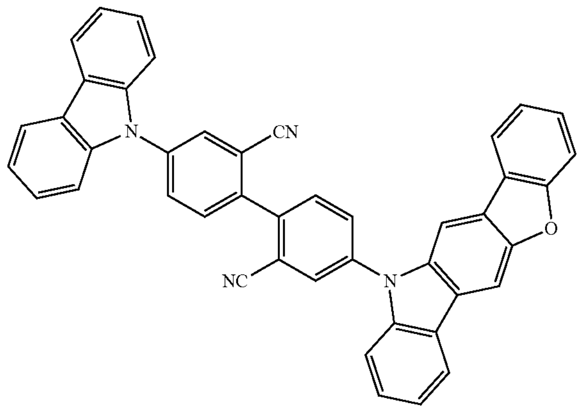
29
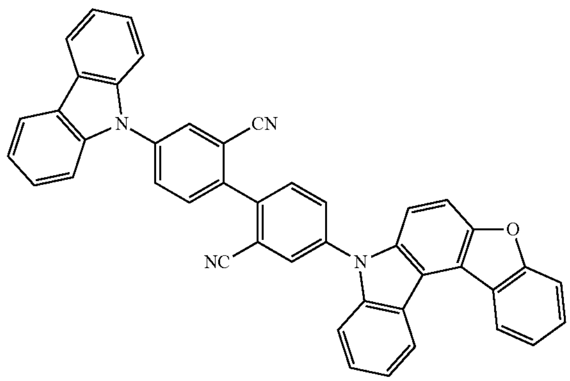
30
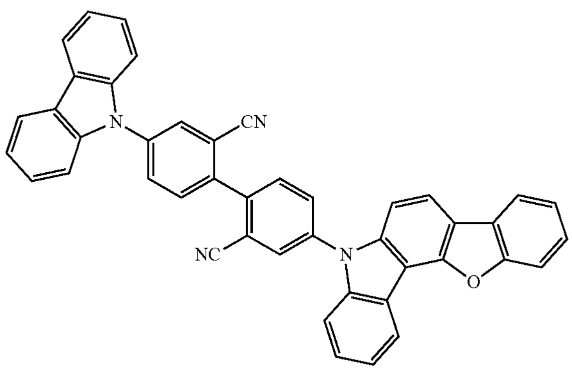
31
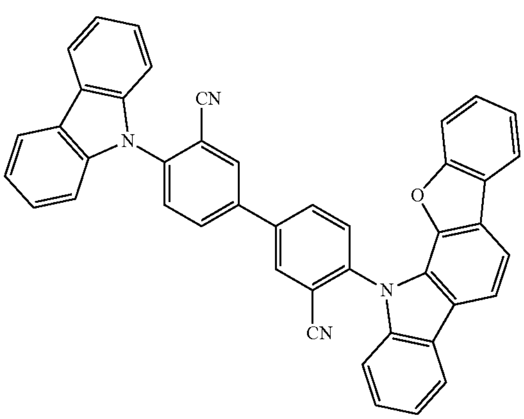
-continued
32
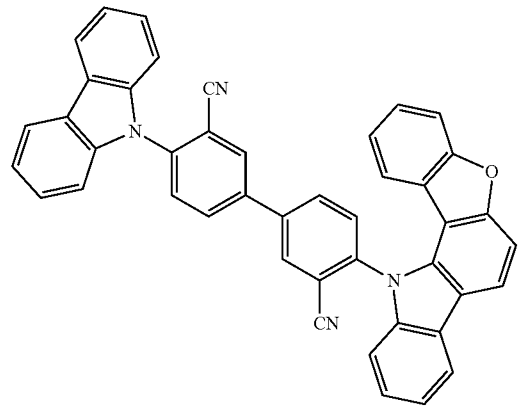
33
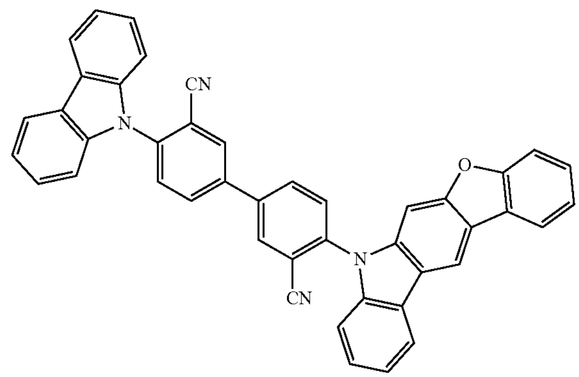
34
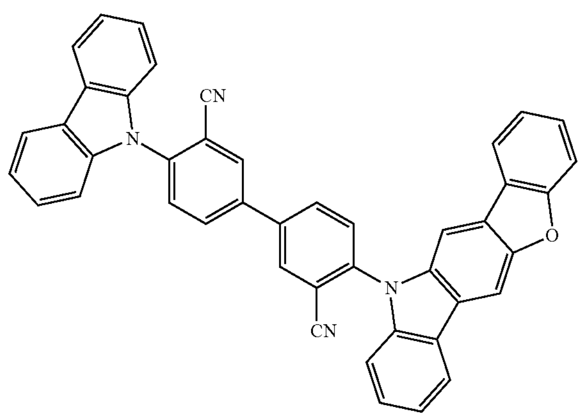
35
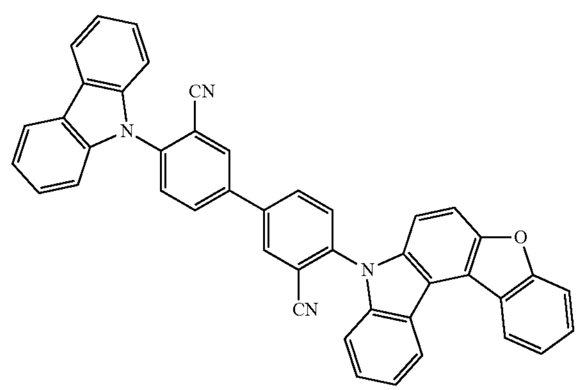

-continued
36
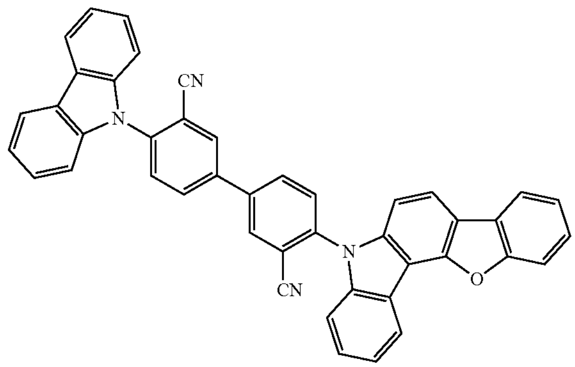
37
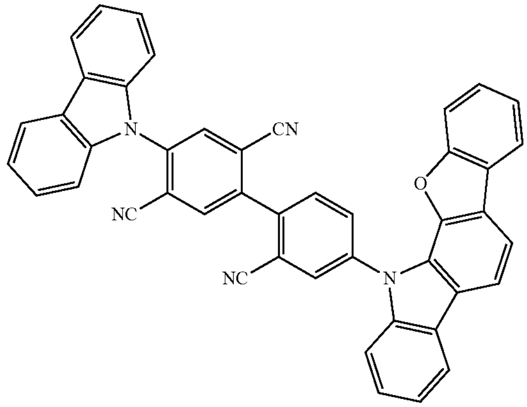
38
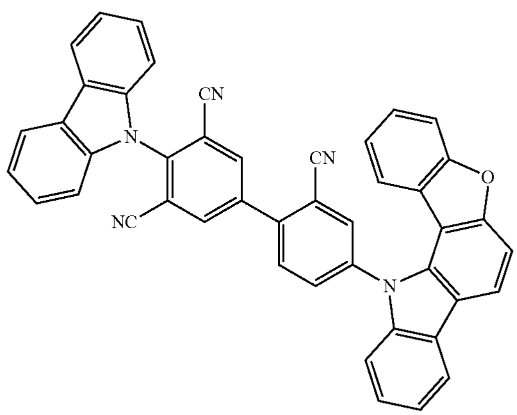
39
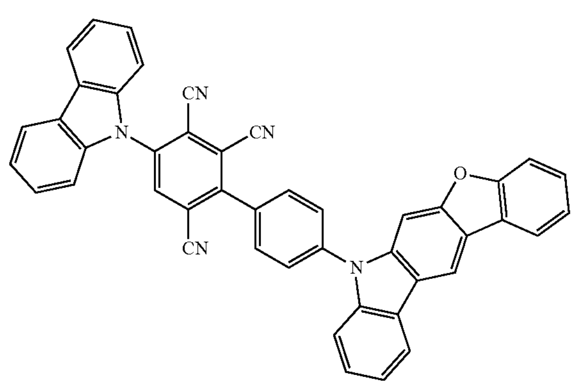
-continued
40
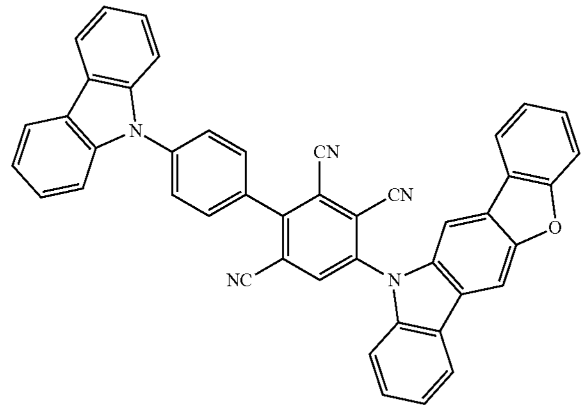
41
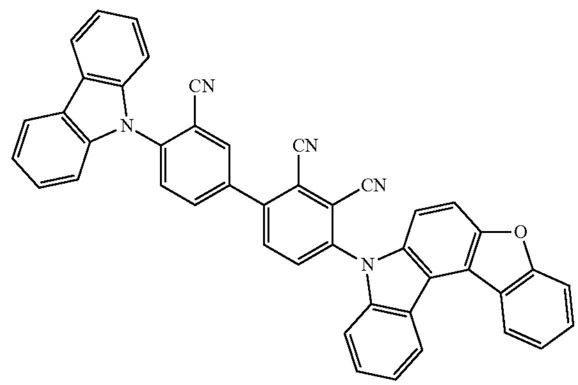
42
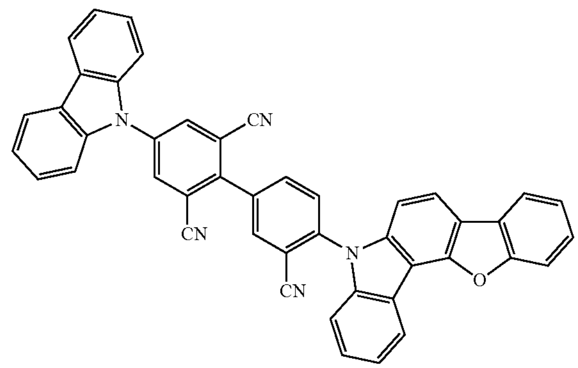
43
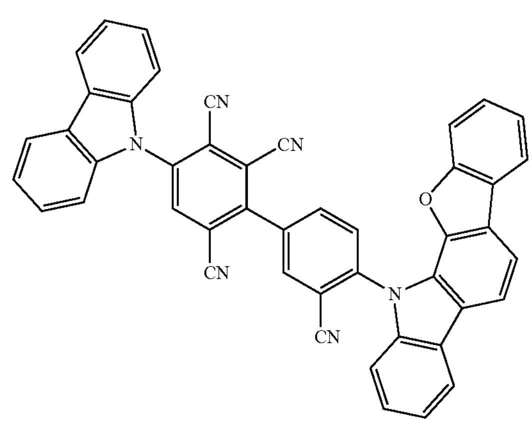

-continued
44
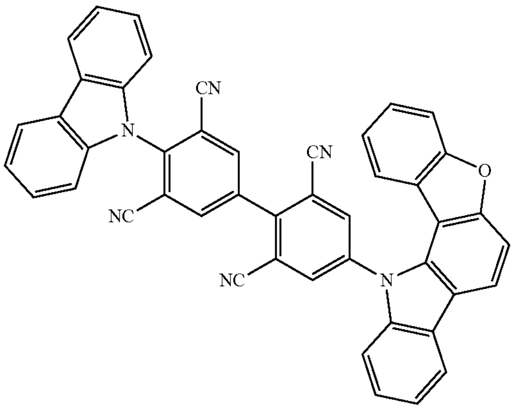
45
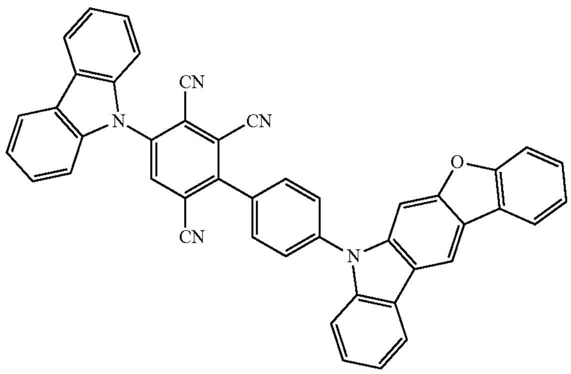
46
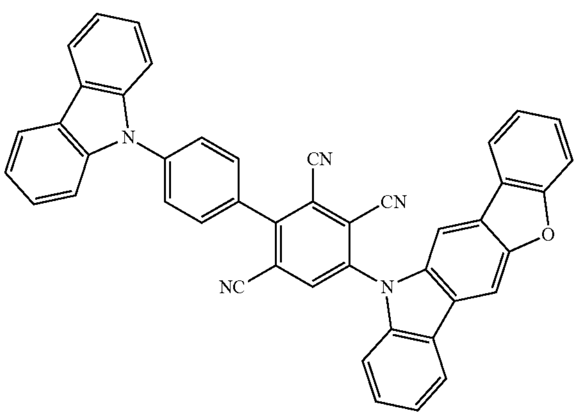
47
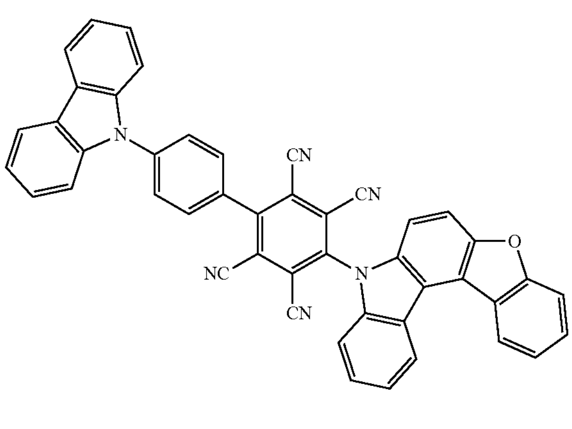
-continued
48
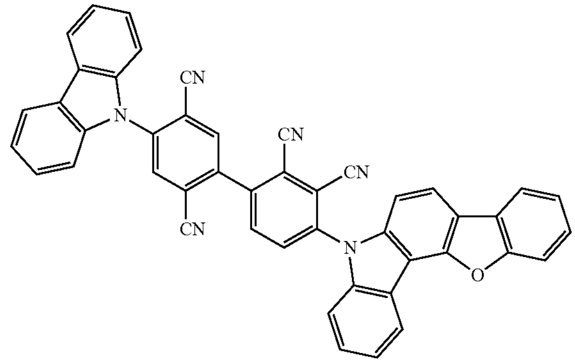
[00101] Group HE3
1
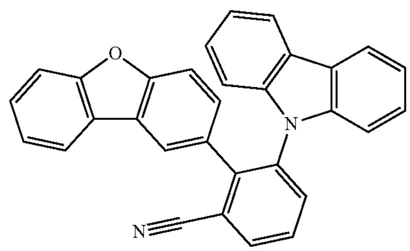
2
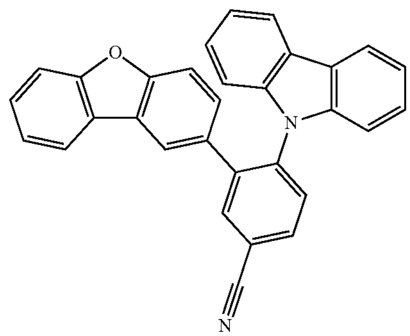
3
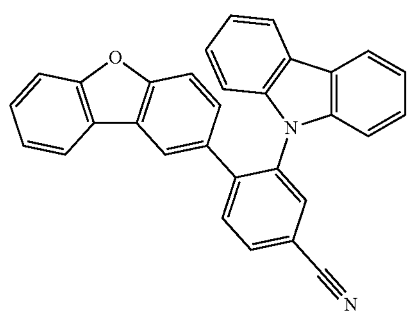
4
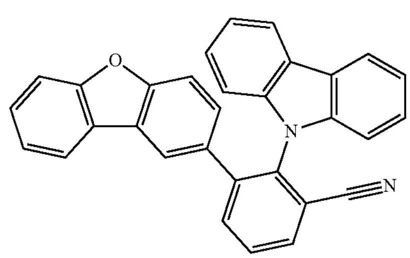

-continued
5
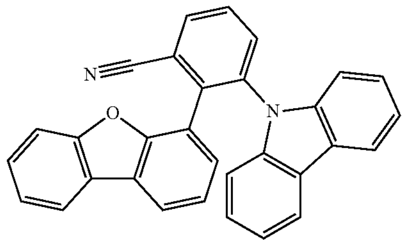
6
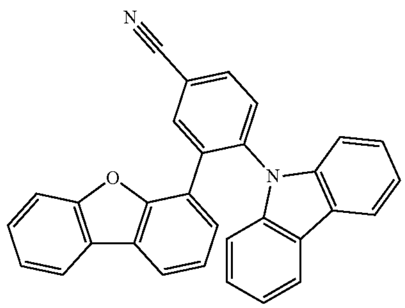
7
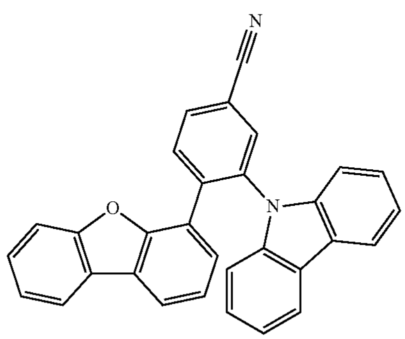
8
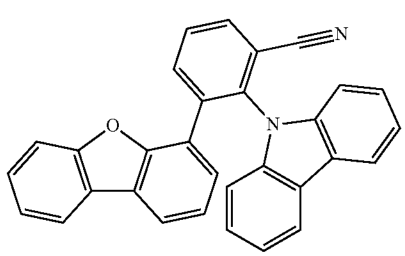
9
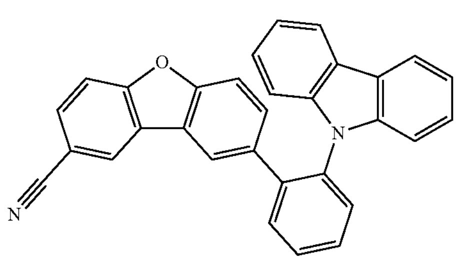
-continued
10
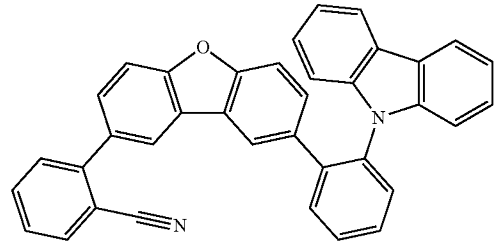
11
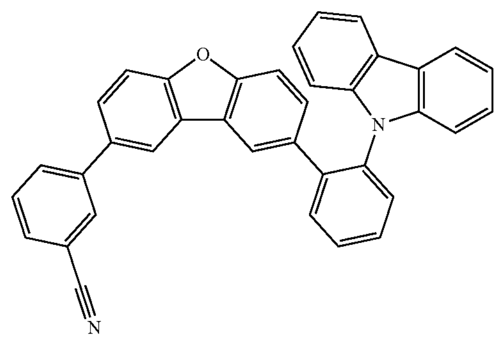
12
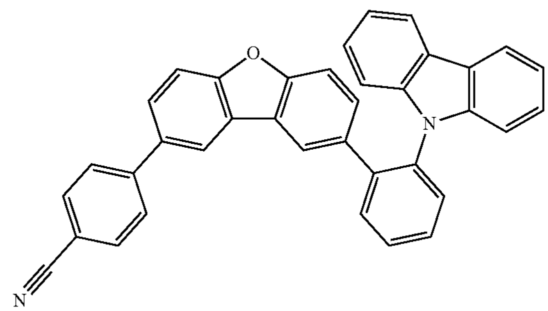
13
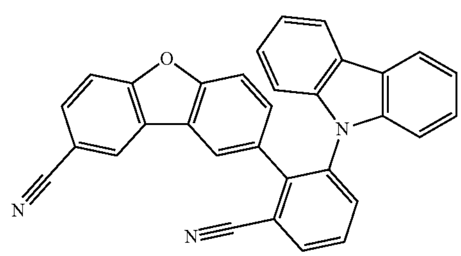
14
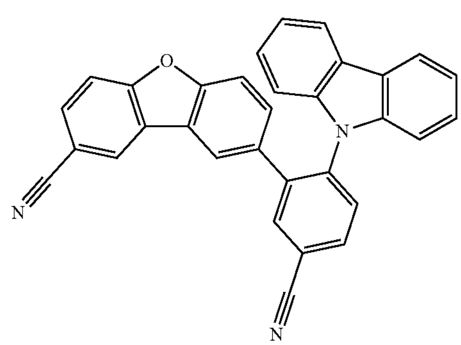

-continued
15
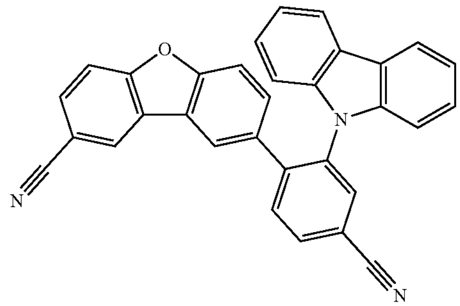
16
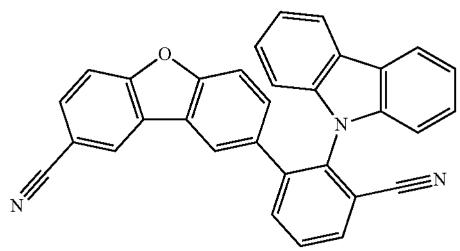
17
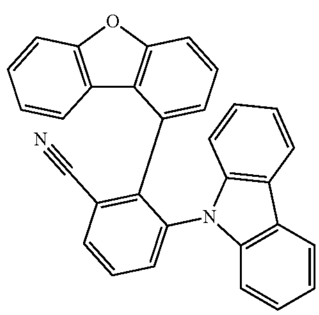
18
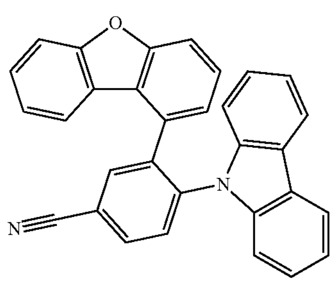
19
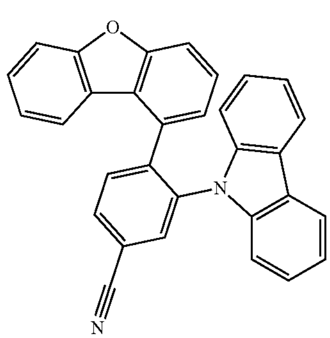
-continued
20
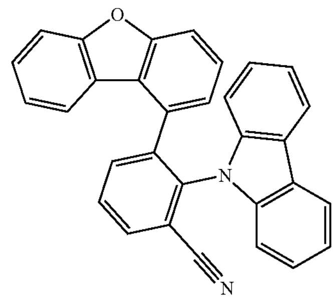
21
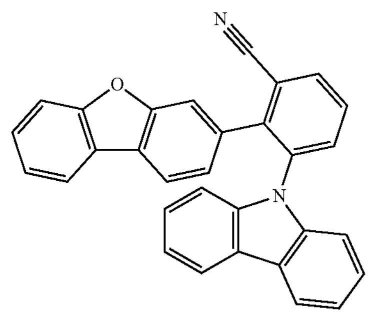
22
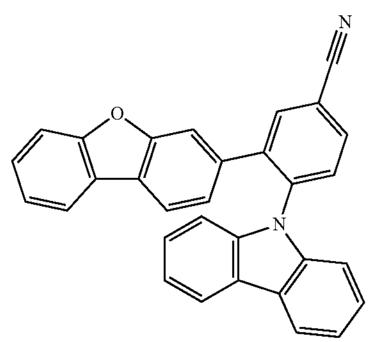
23
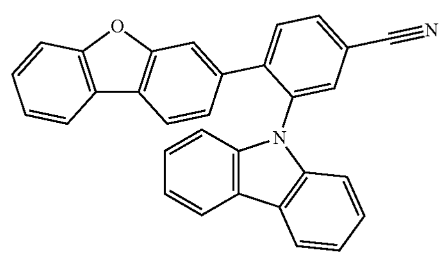
24
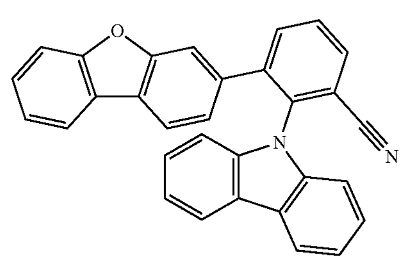

25
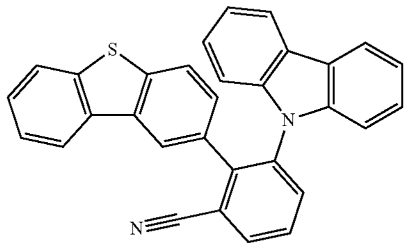
26
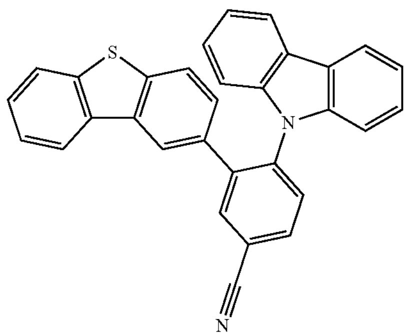
27
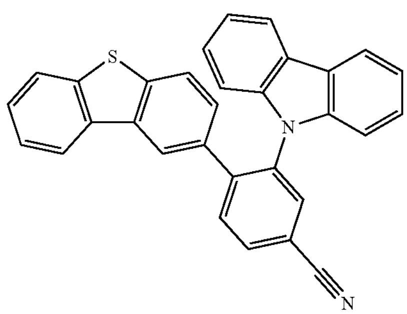
28
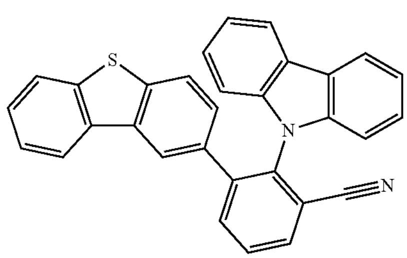
29
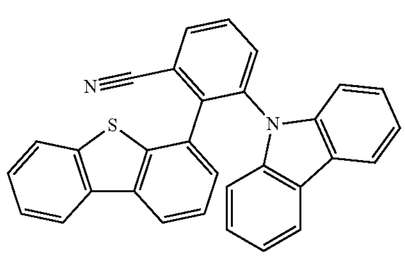
30
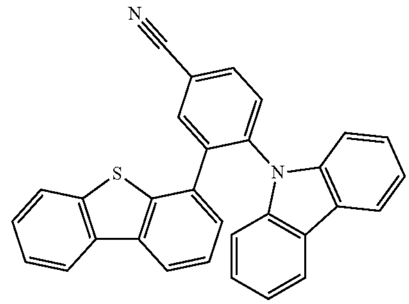
31
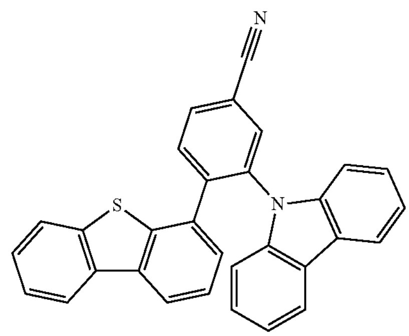
32
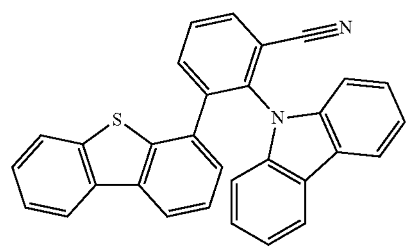
33
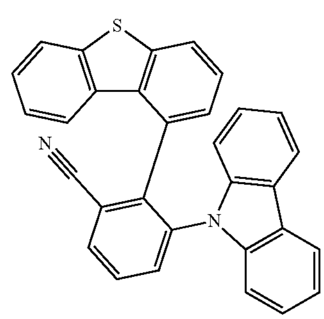
34
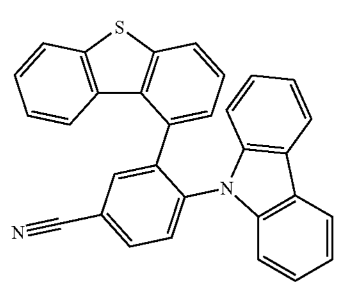

-continued
35
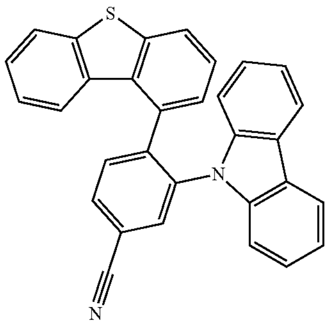
36
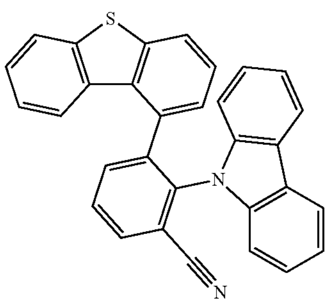
37
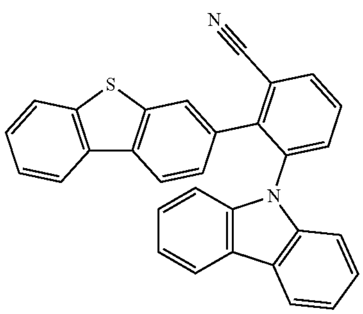
38
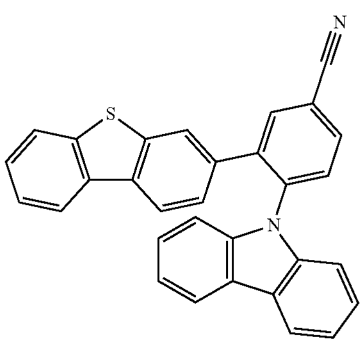
39
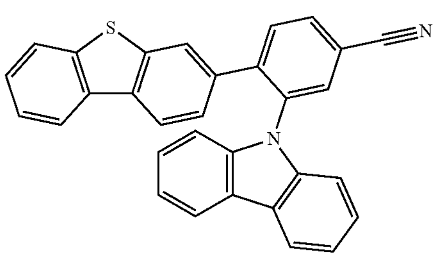
-continued
40
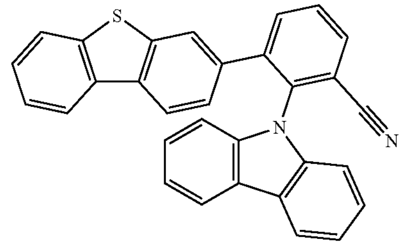
41
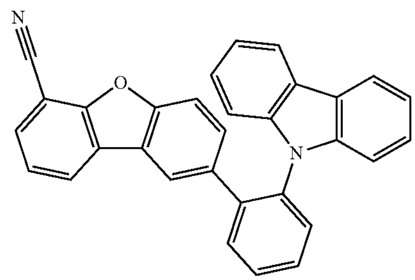
42
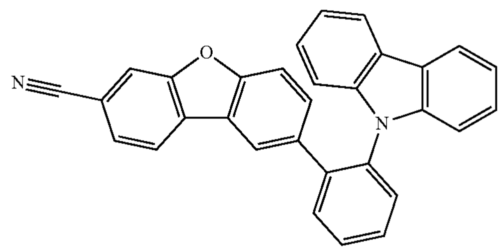
43
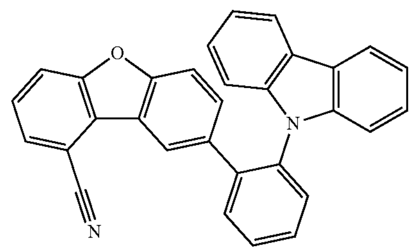
44
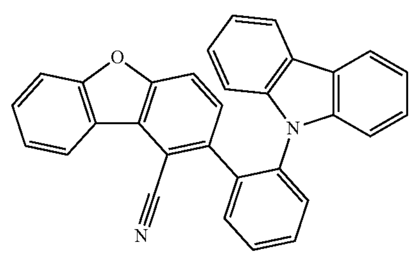
45
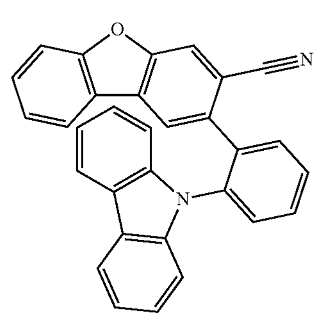

-continued
46
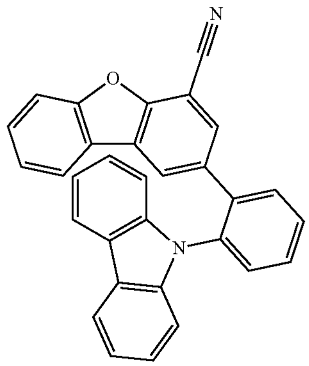
47
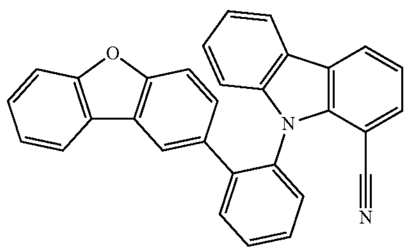
48
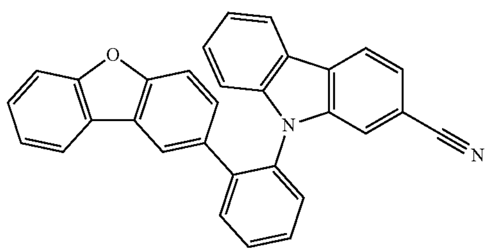
49
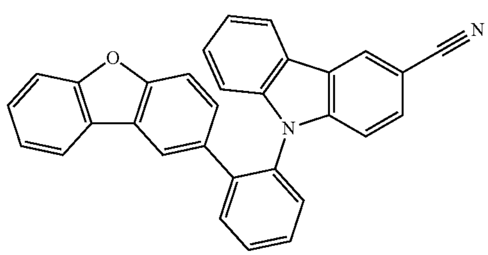
50
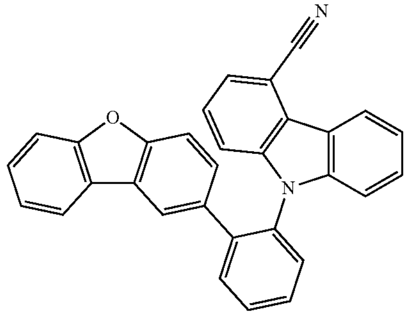
-continued
51
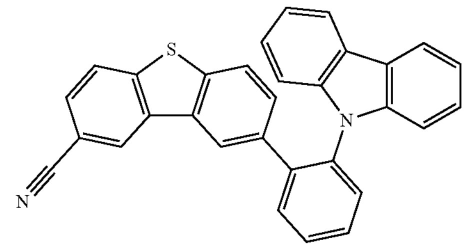
52
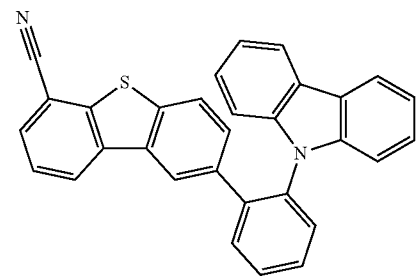
53
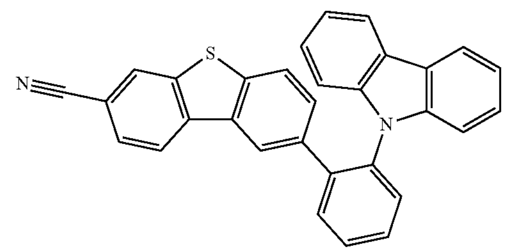
54
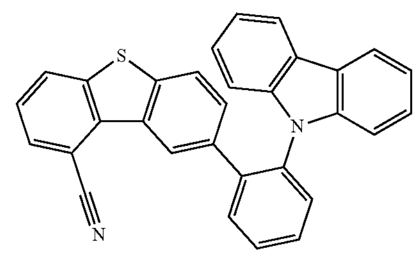
55
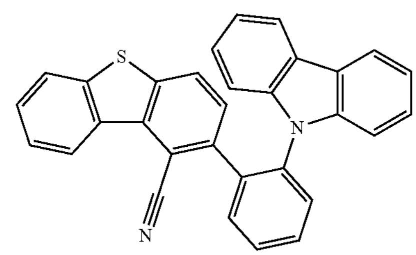
56
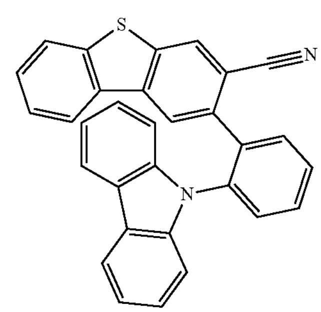

-continued
57
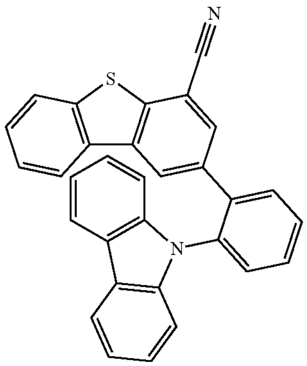
58
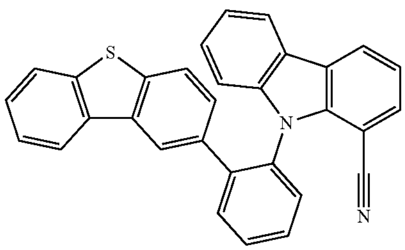
[00102] Group HE4
1
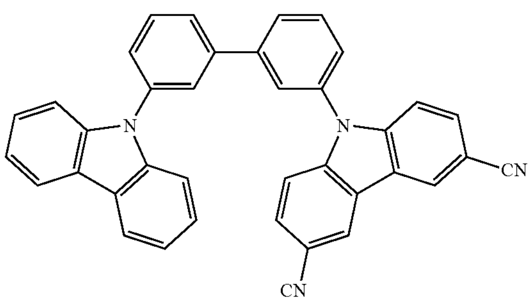
2
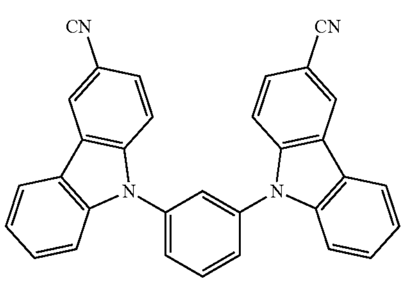
3
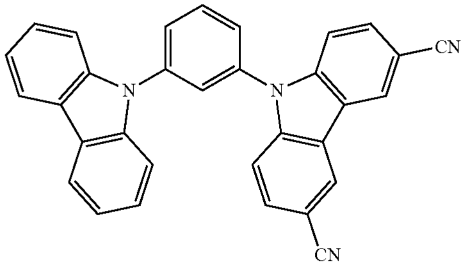
-continued
4
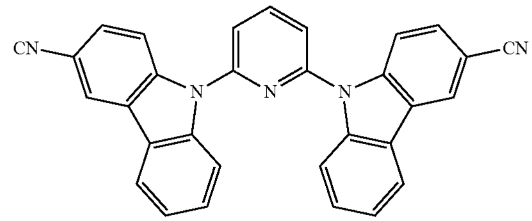
5
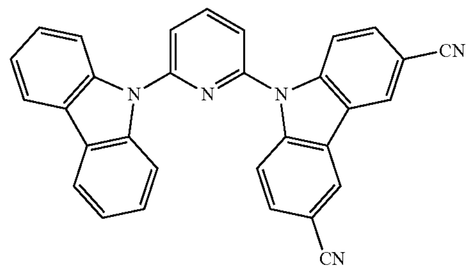
6
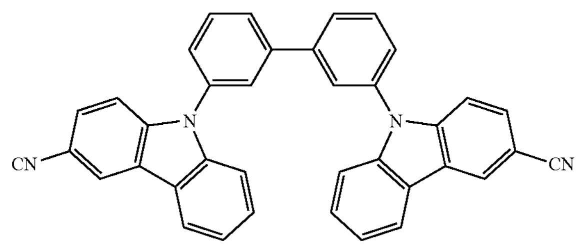
7
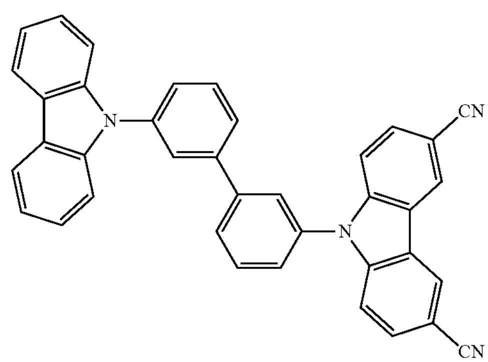
8
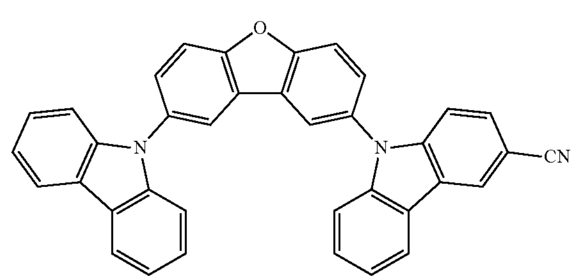

-continued
9
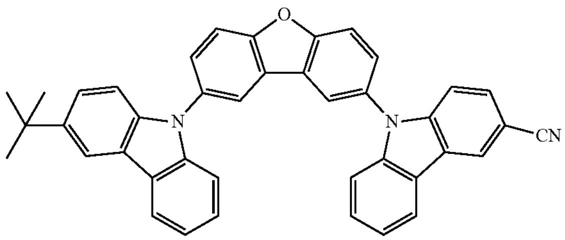
10
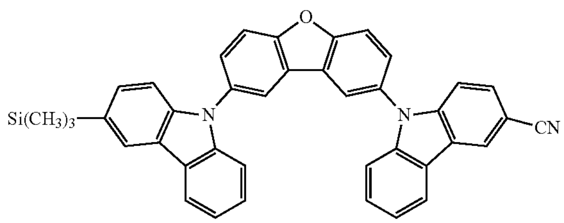
11
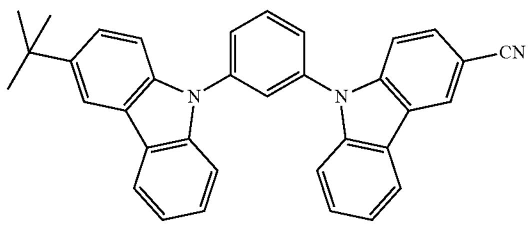
12
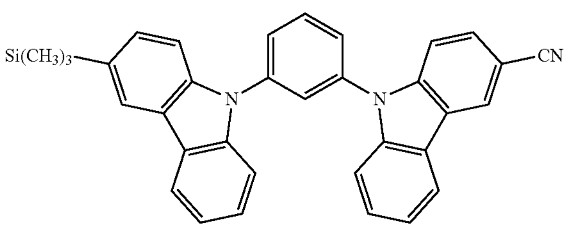
13
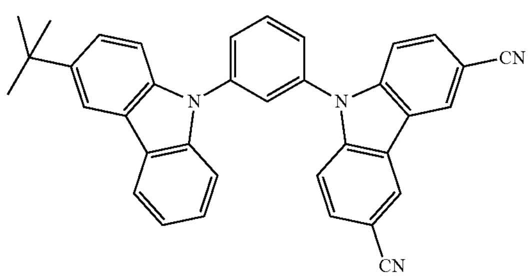
14
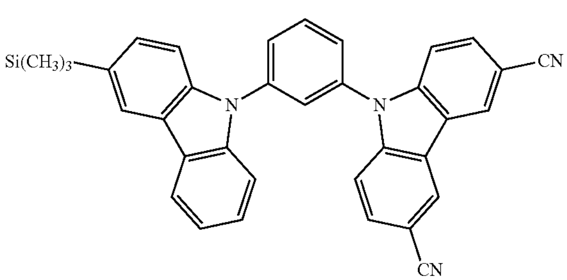
15
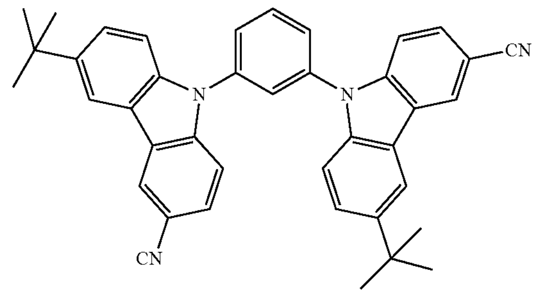
16
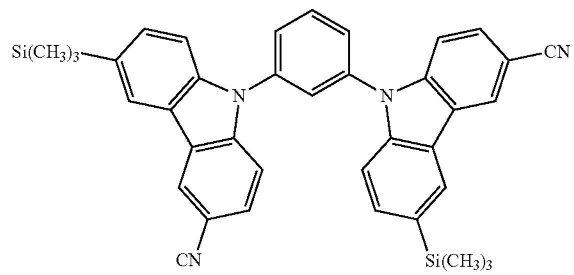
17
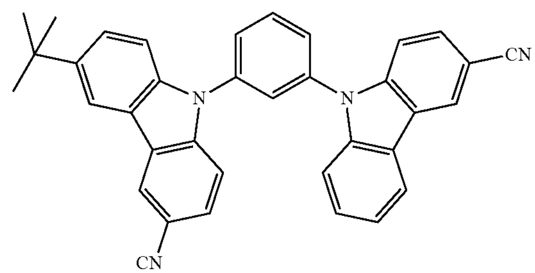
18
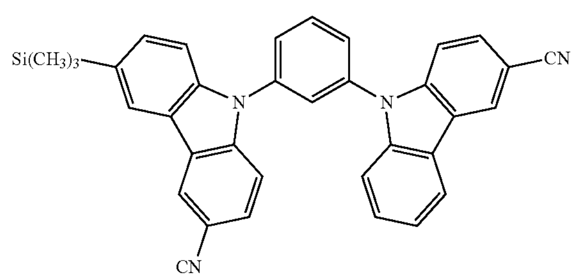
19
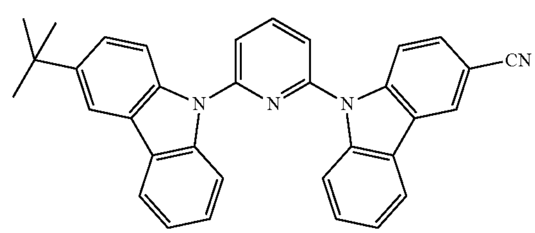

-continued
20
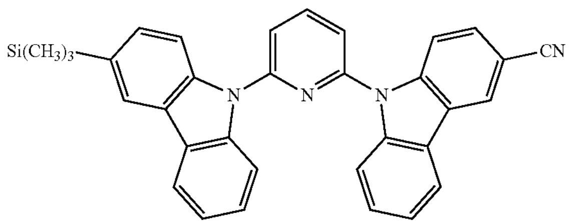
21
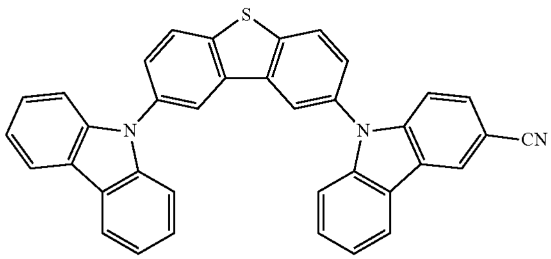
22
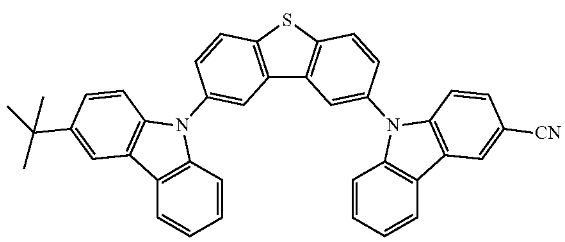
23
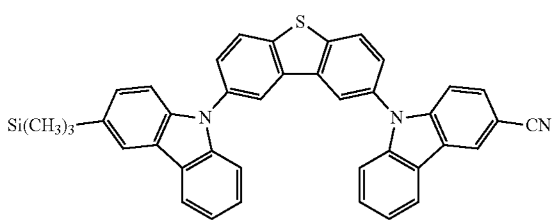
24
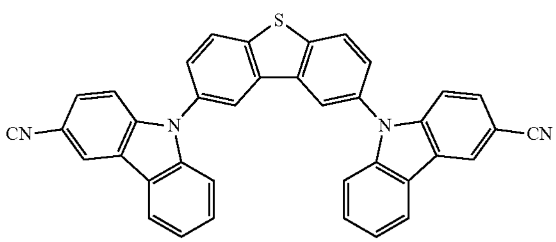
25
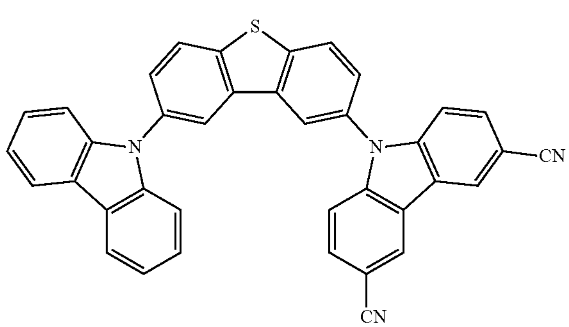
-continued
26
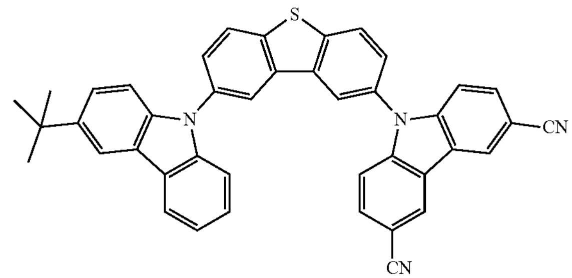
27
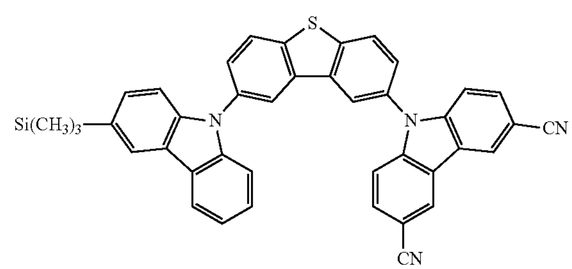
28
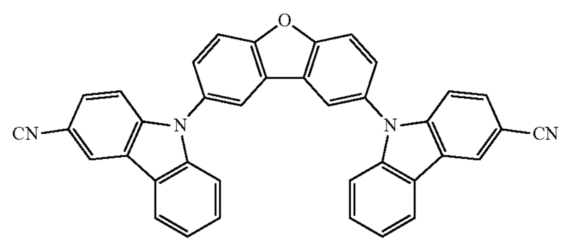
29
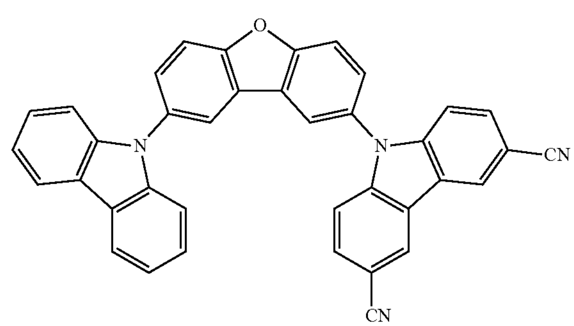
30
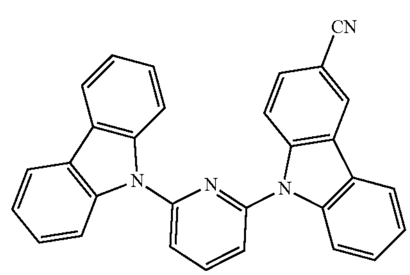

-continued
31
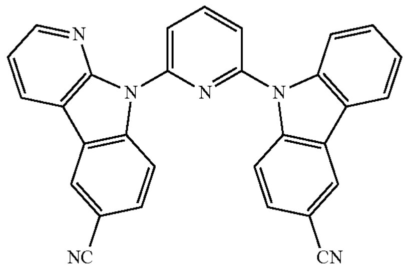
32
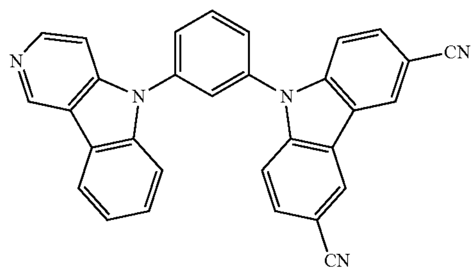
33
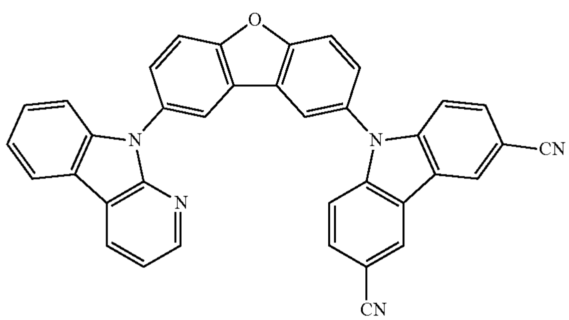
34
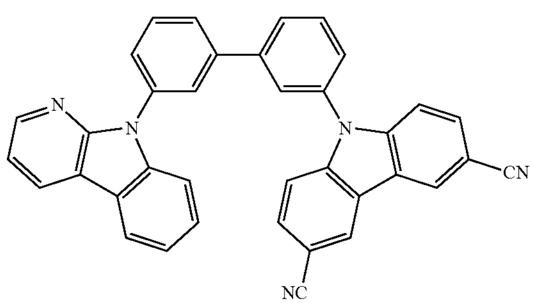
35
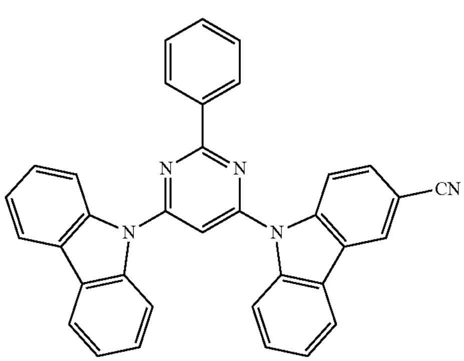
-continued
36
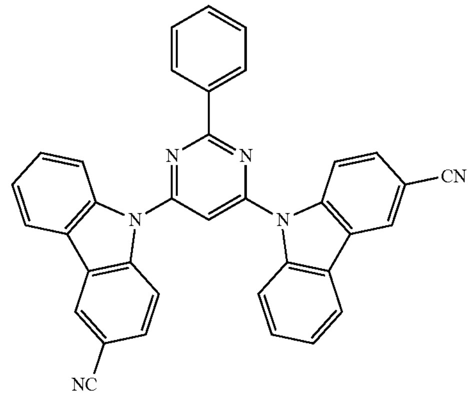
37
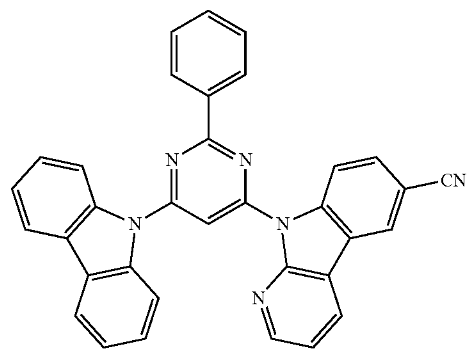
38
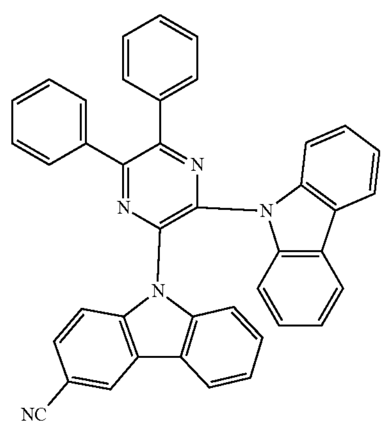
39
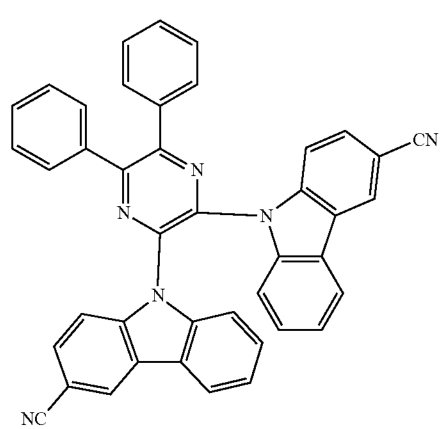

40
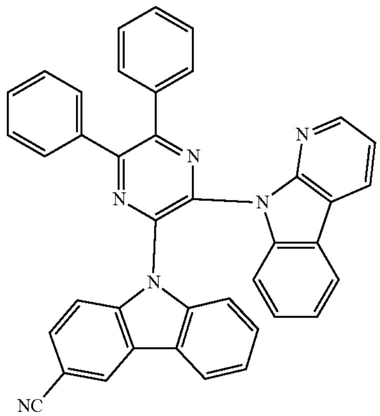
41
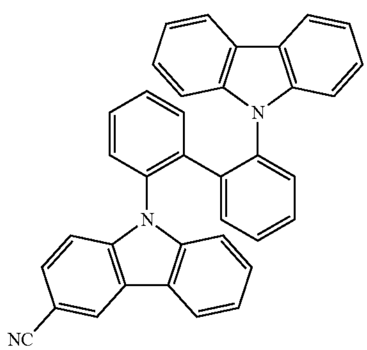
42
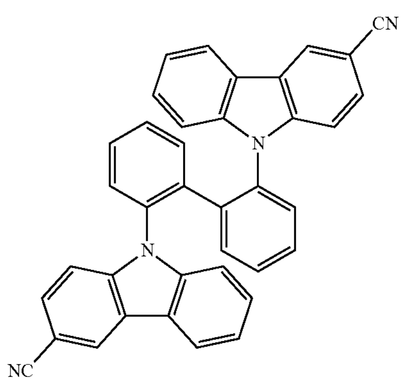
43
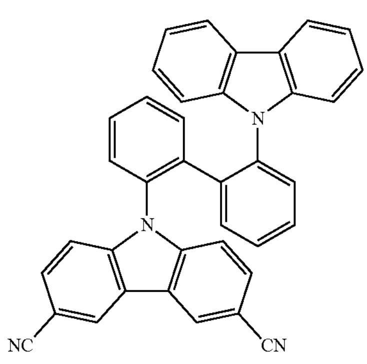
44
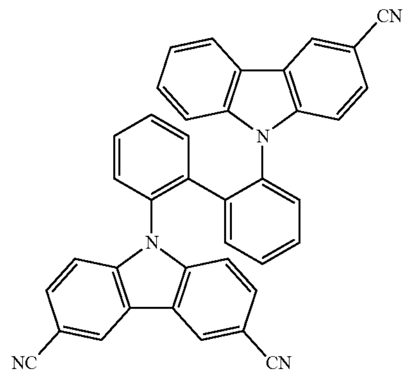
45
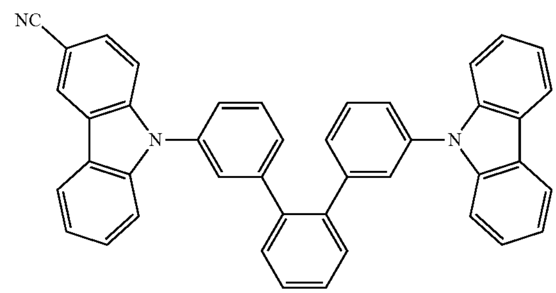
46
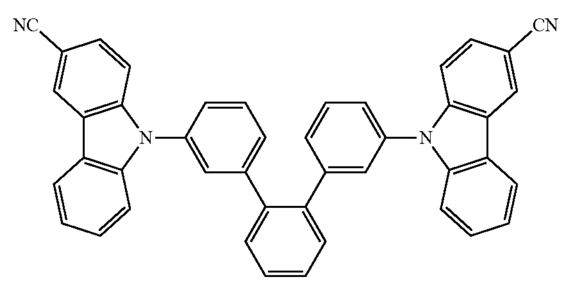
47
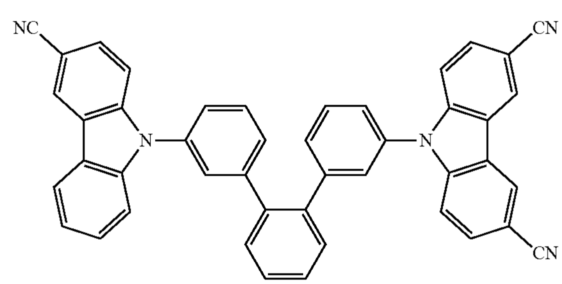
48
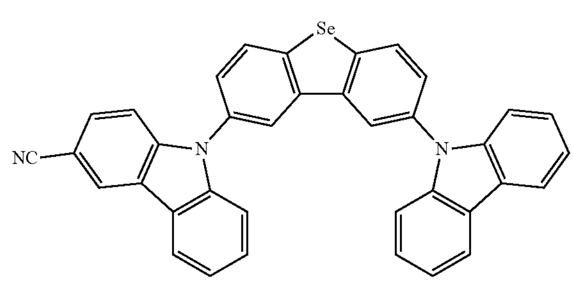

-continued
49
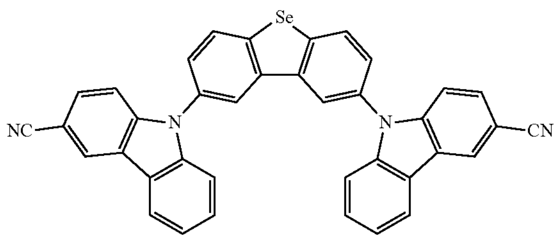
50
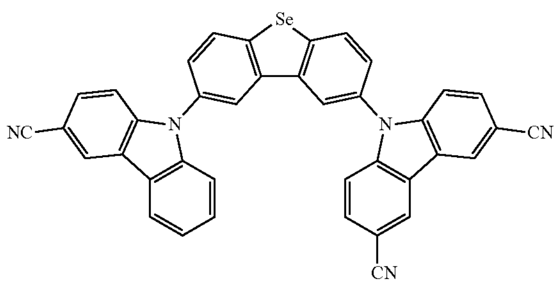
51
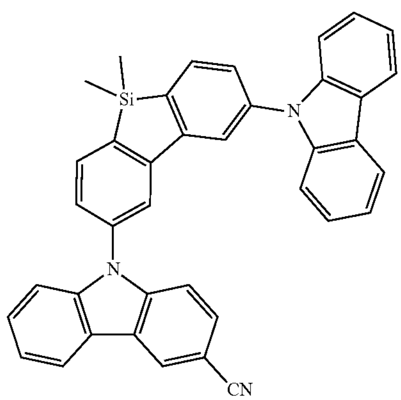
52
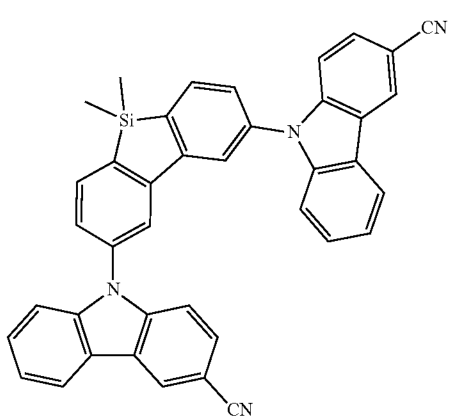
53
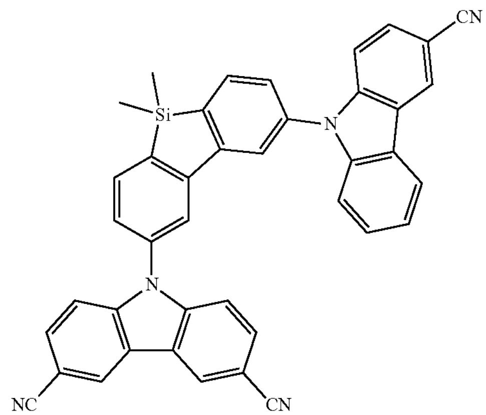
54
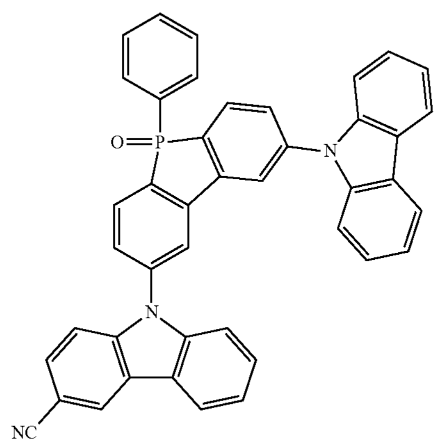
55
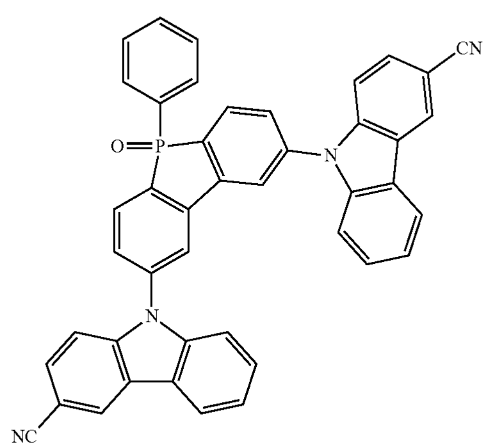

-continued
56
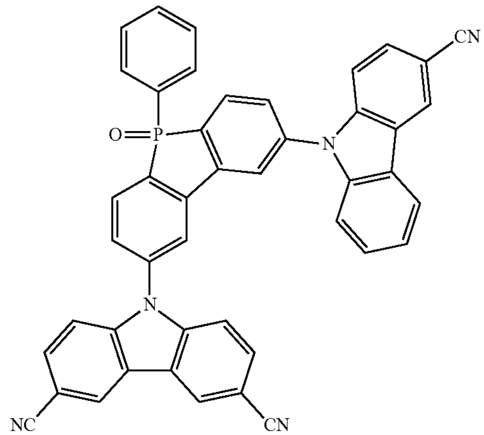
Group HE5
1
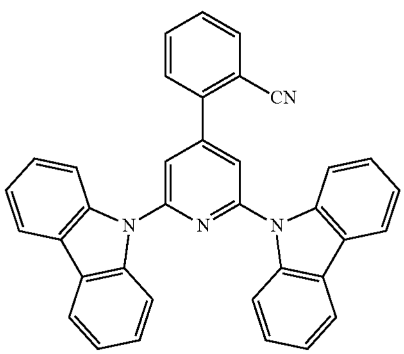
2
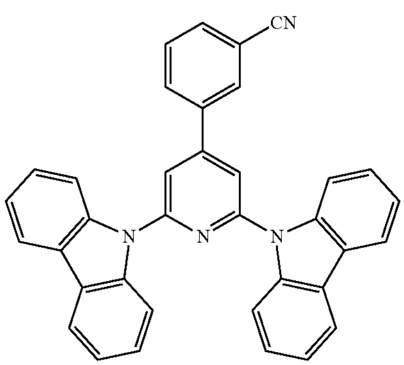
3
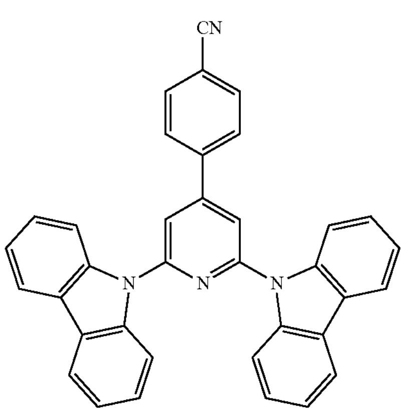
-continued
4
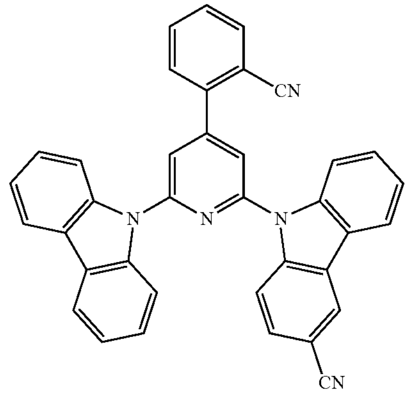
5
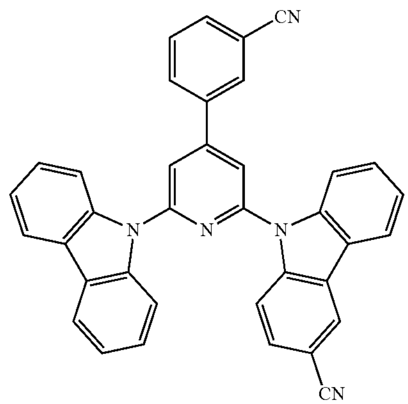
6
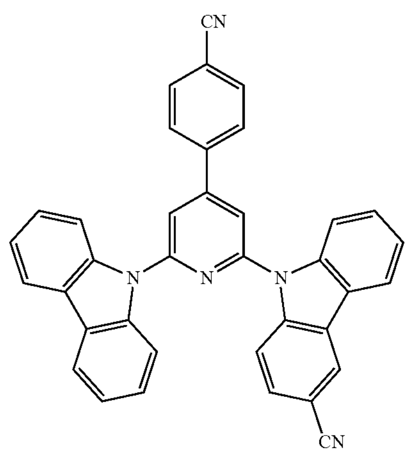
7
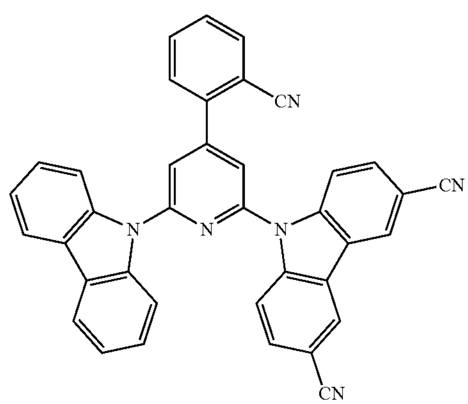

-continued
8
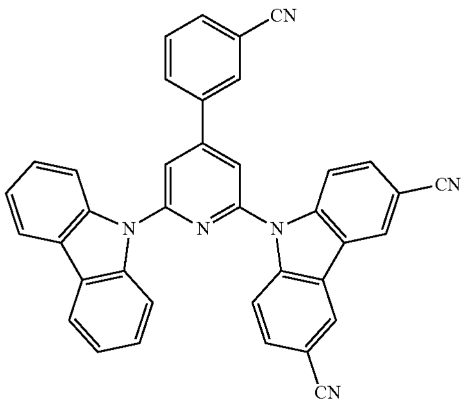
9
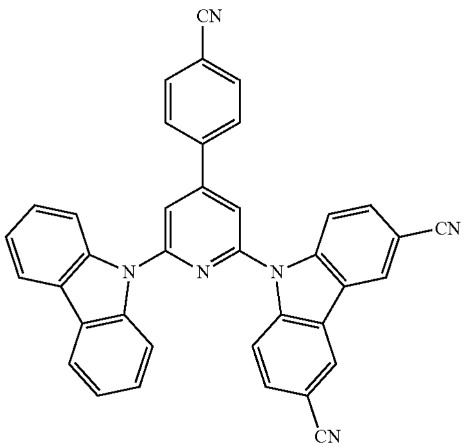
10
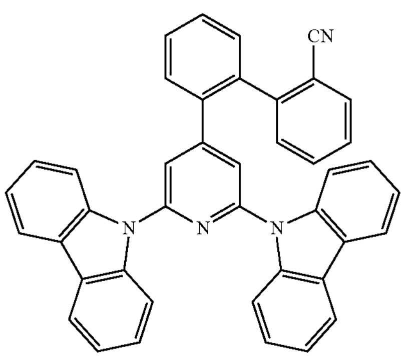
11
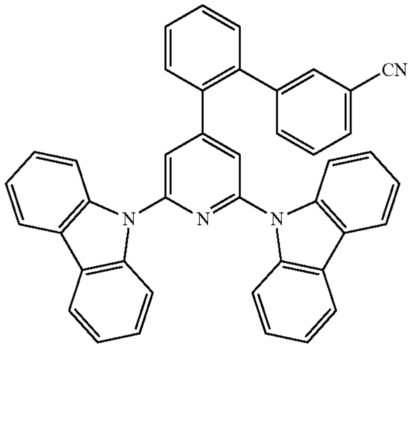
-continued
12
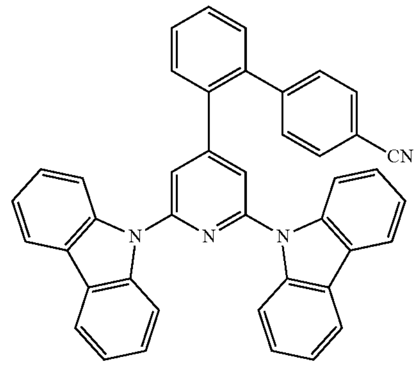
13
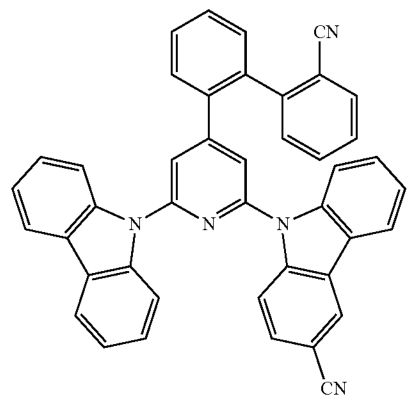
14
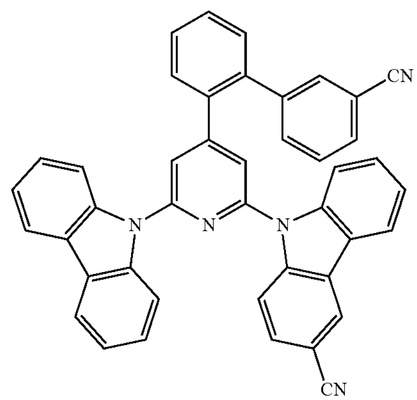
15
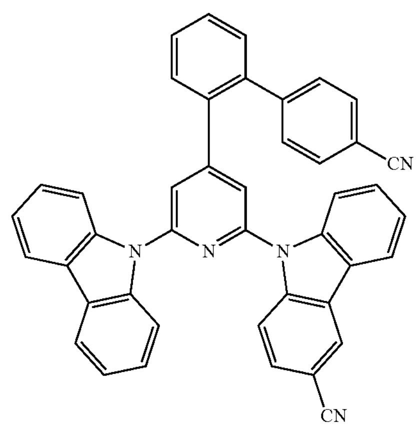

-continued
16
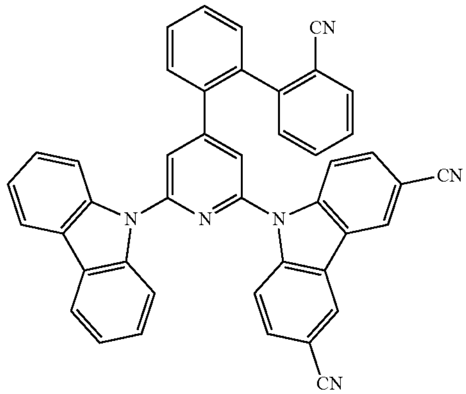
17
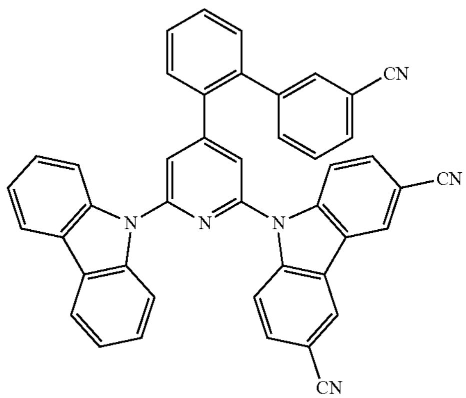
18
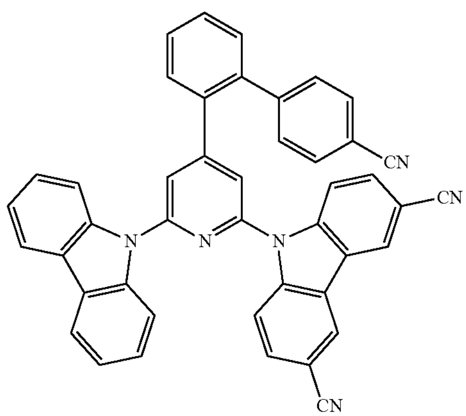
19
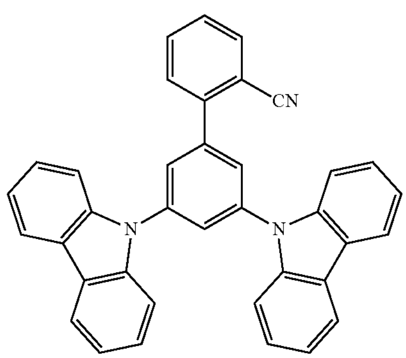
-continued
20
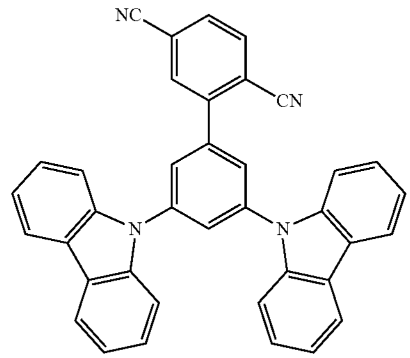
21
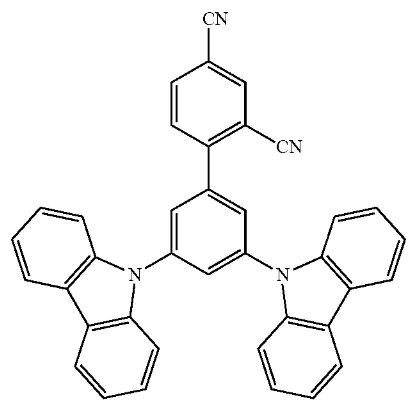
22
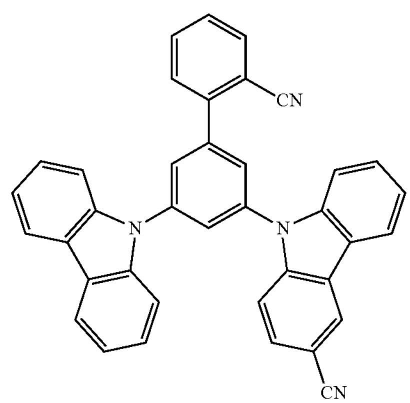
23
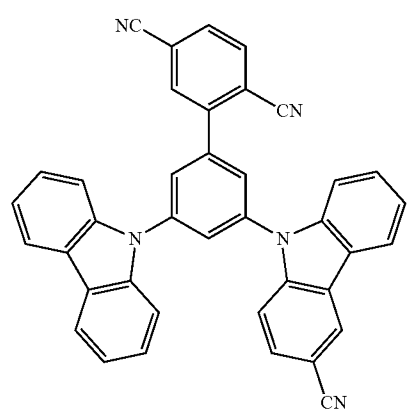

-continued
24
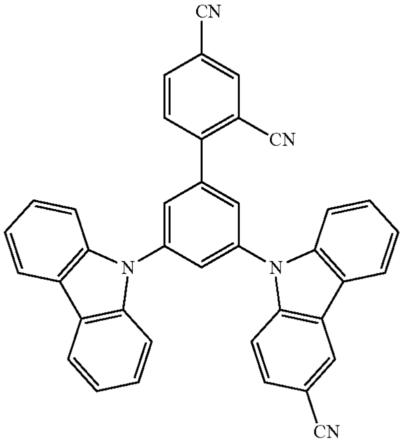
25
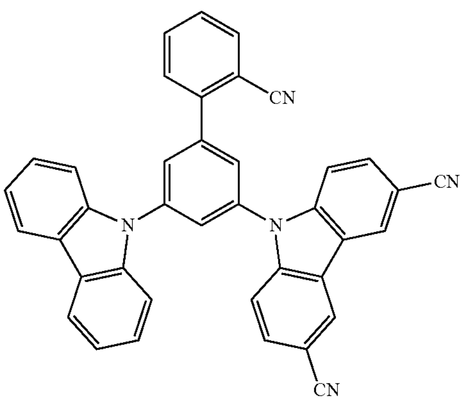
26
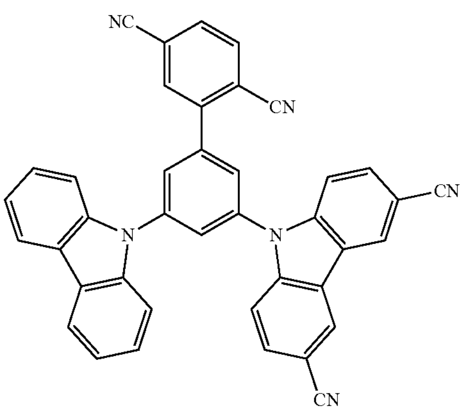
-continued
27
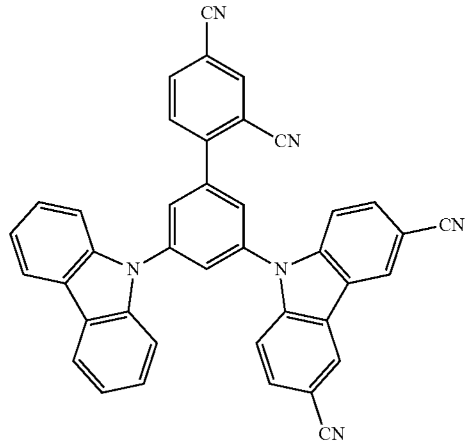
28
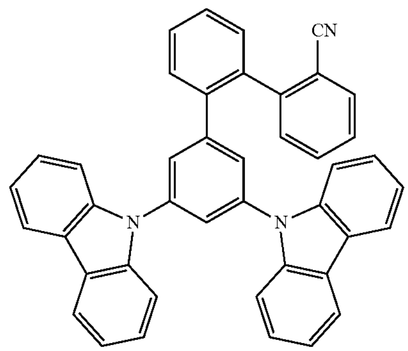
29
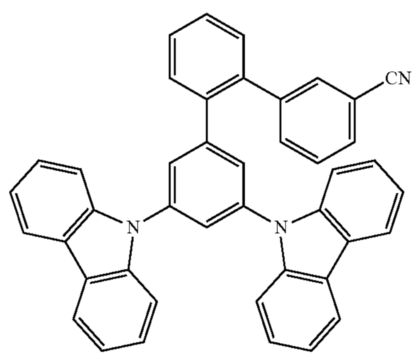
30
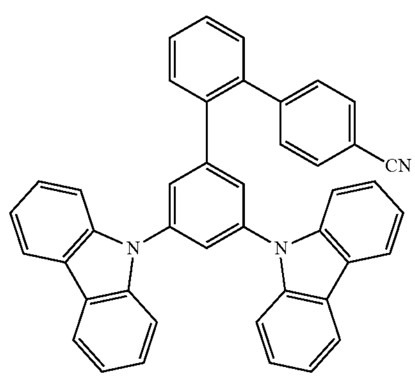

-continued
31
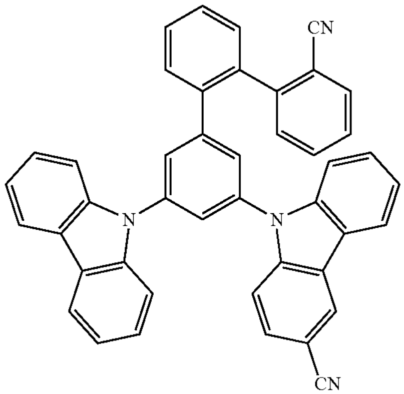
32
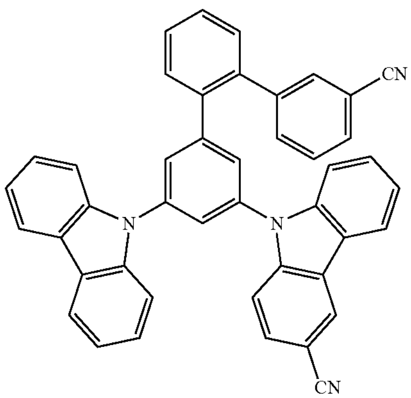
33
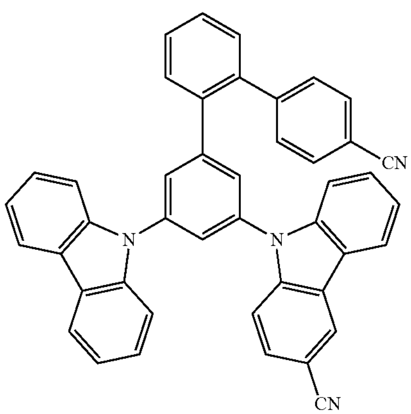
34
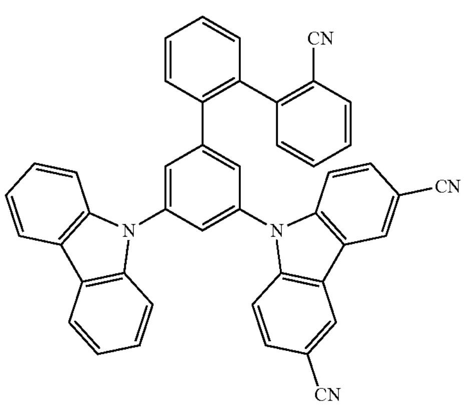
-continued
35
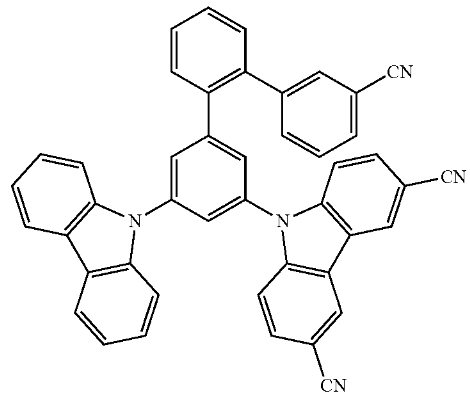
36
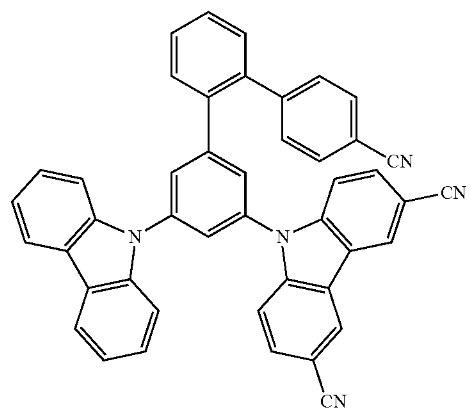
37
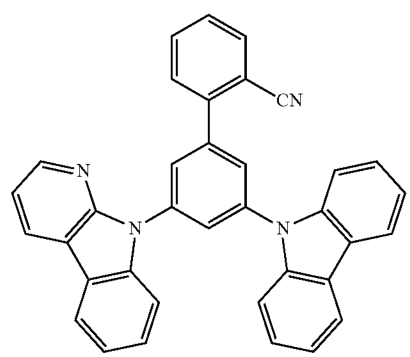
38
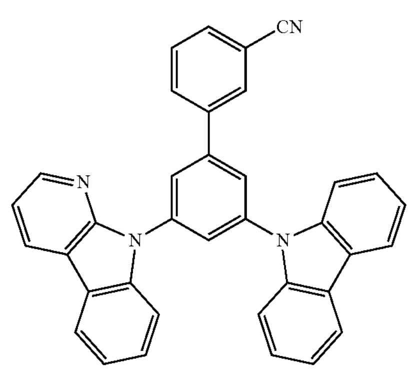

39
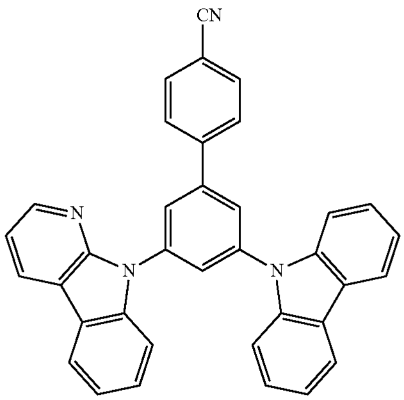
40
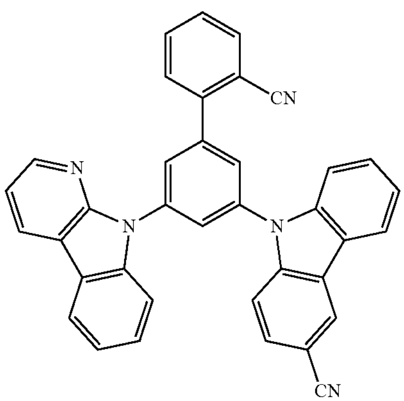
41
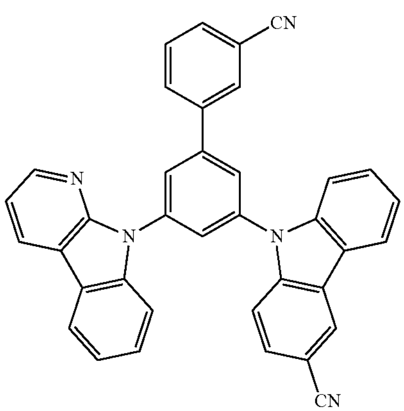
42
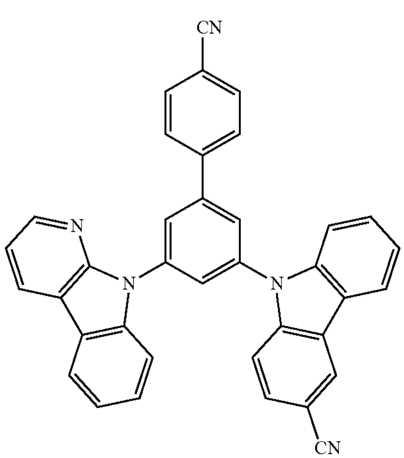
43
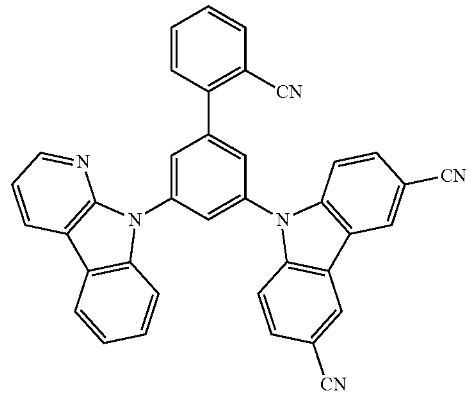
44
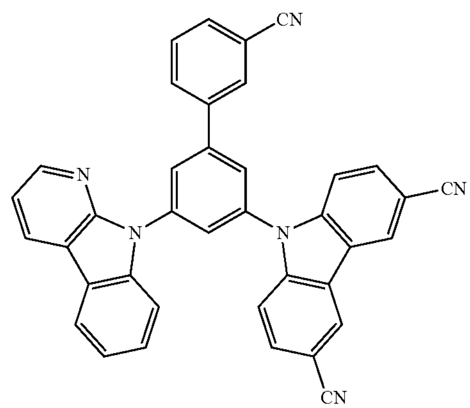
45
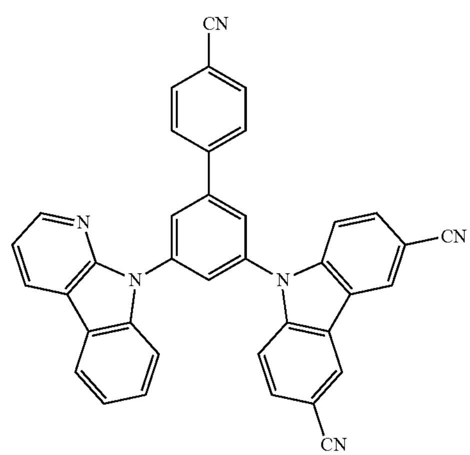
46
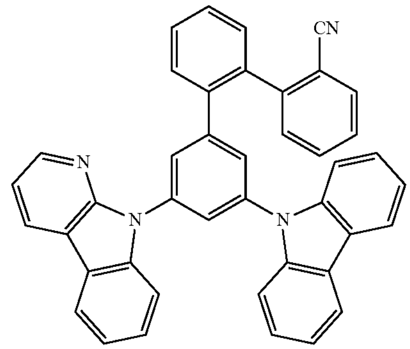

-continued
47
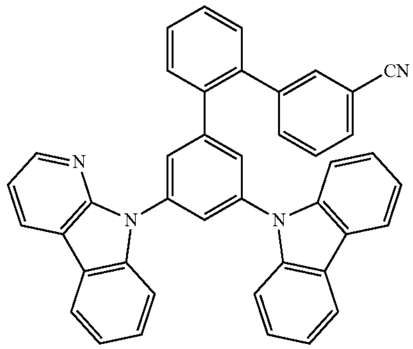
48
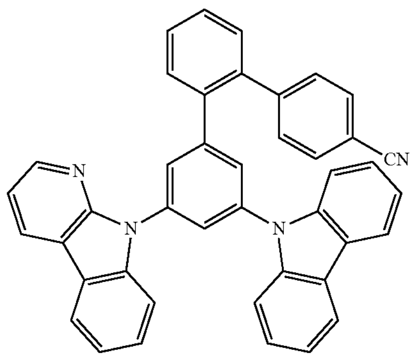
49
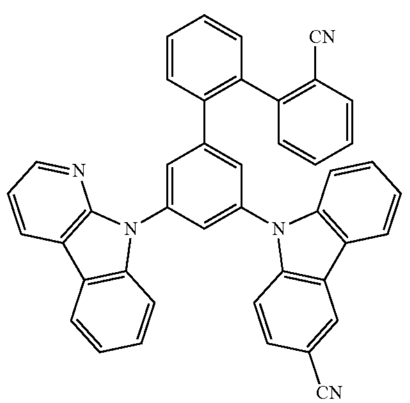
50
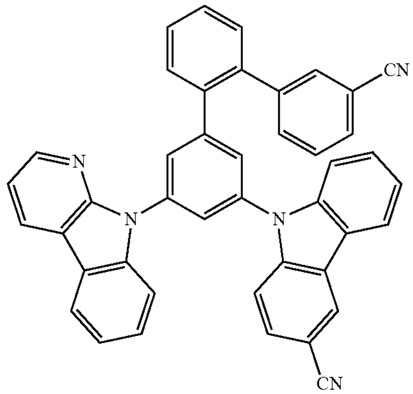
-continued
51
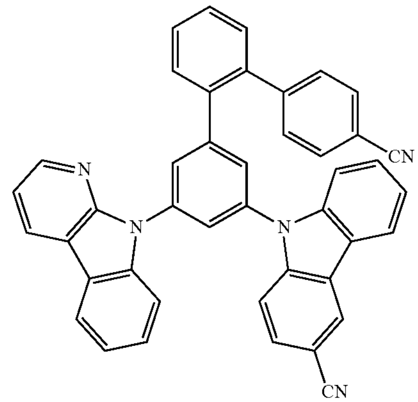
52
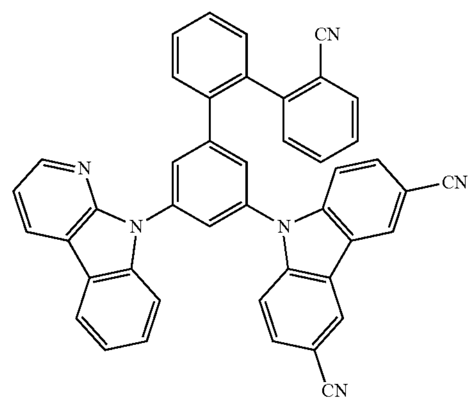
53
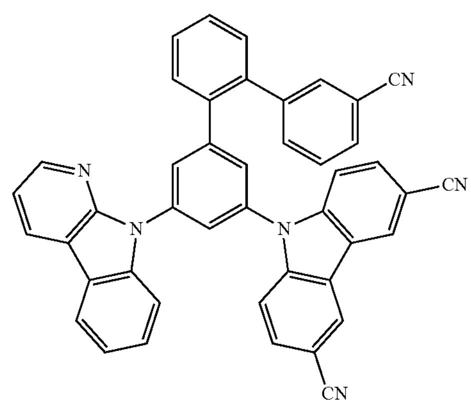
54
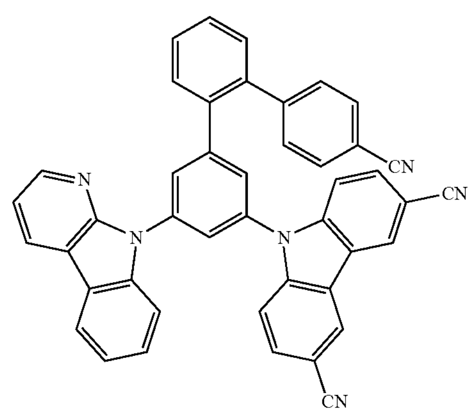

Group HE6
1
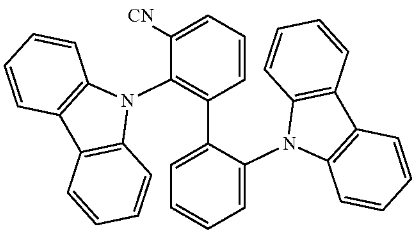
2
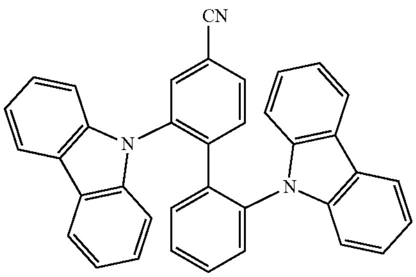
3
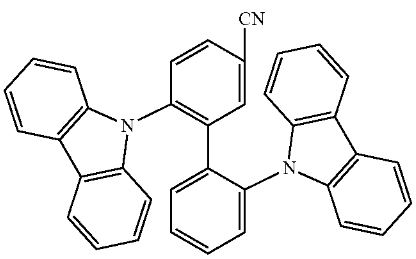
4
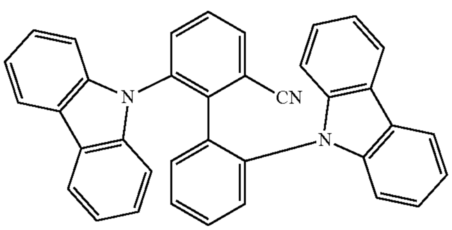
5
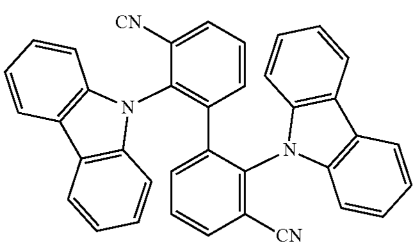
6
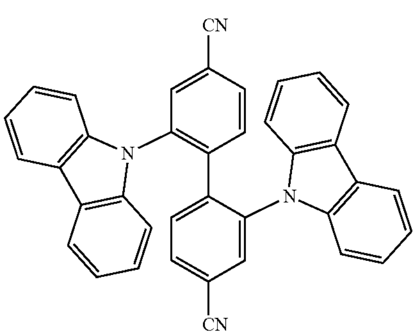
7
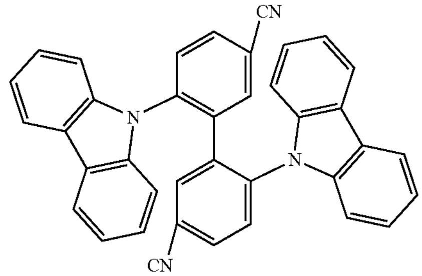
8
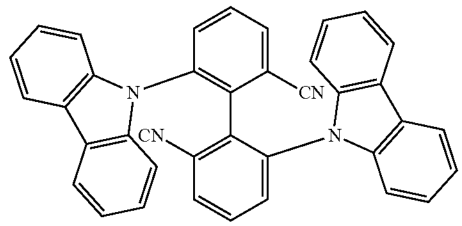
9
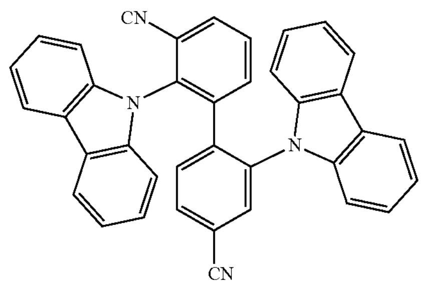
10
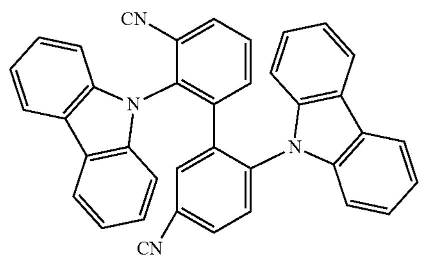
11
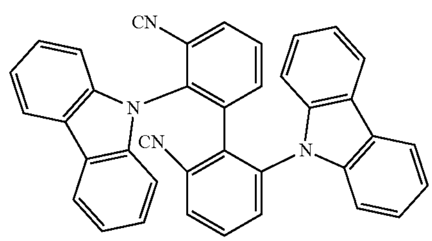
12
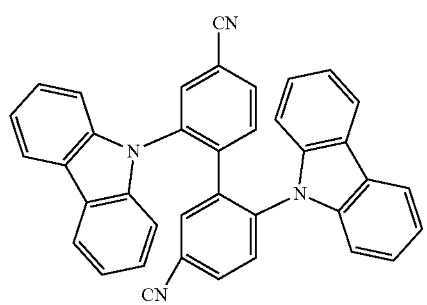

-continued
13
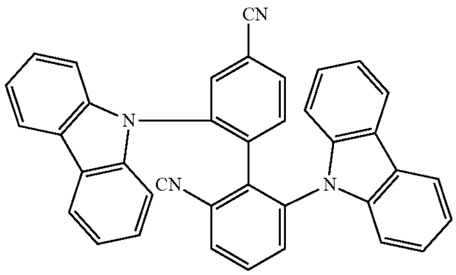
14
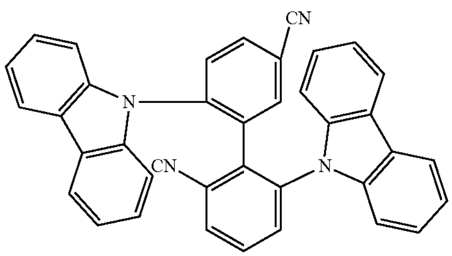
15
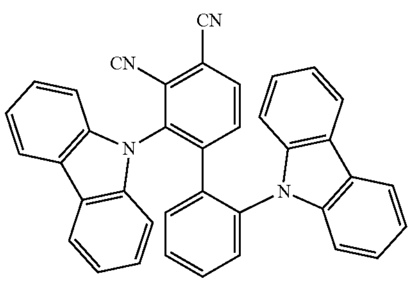
16
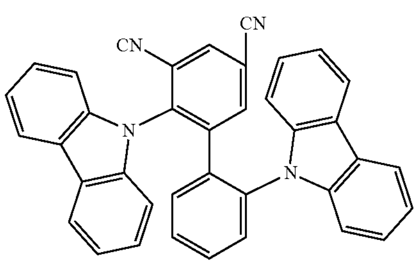
17
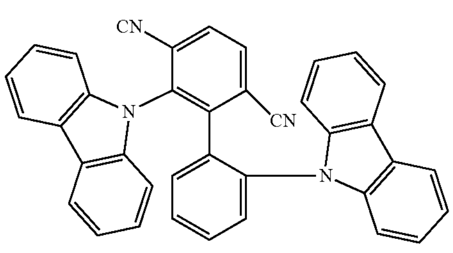
18
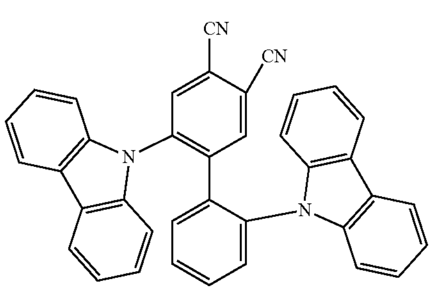
-continued
19
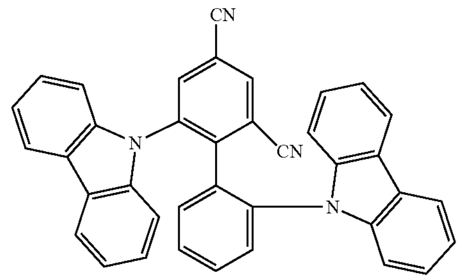
20
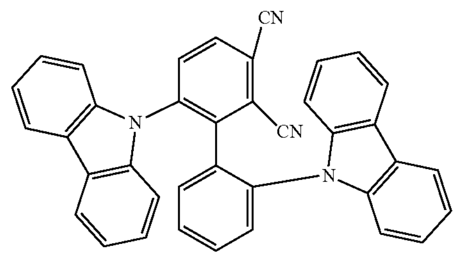
21
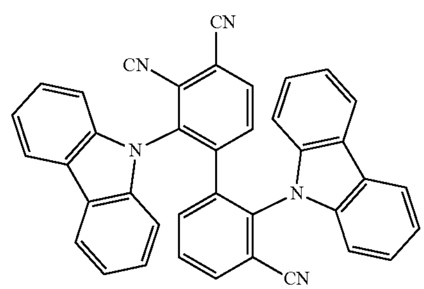
22
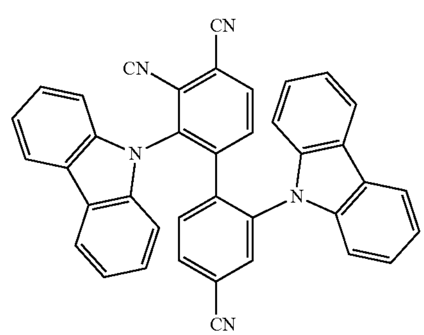
23
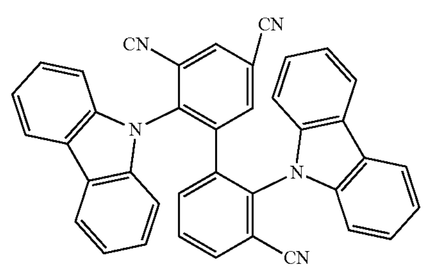

-continued
24
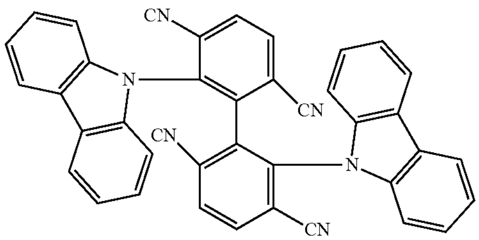
25
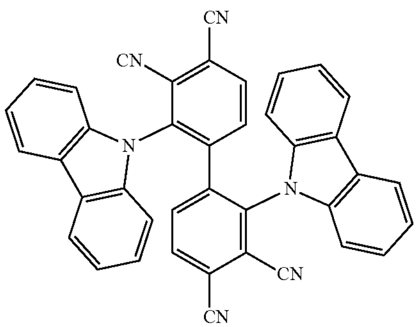
26
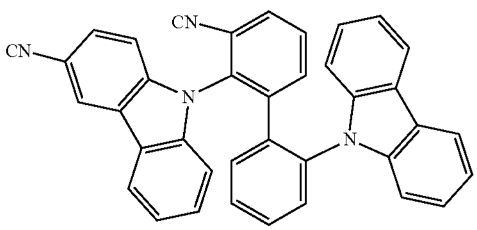
27
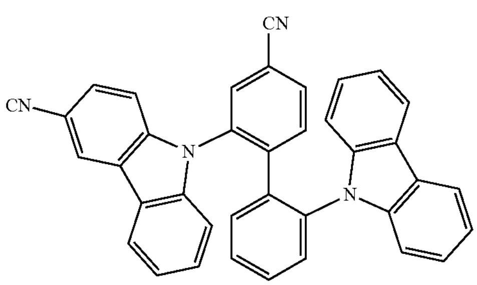
28
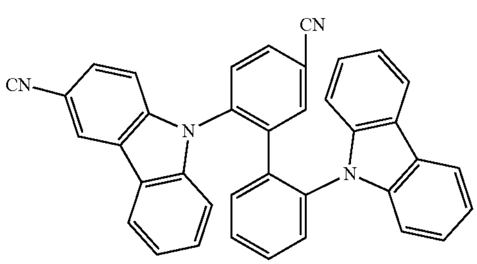
29
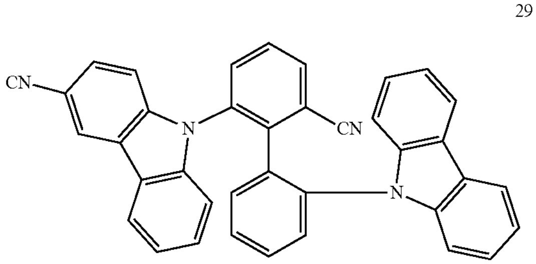
-continued
30
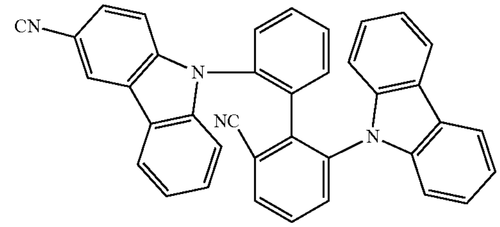
31
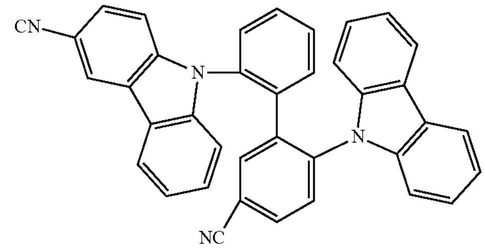
32
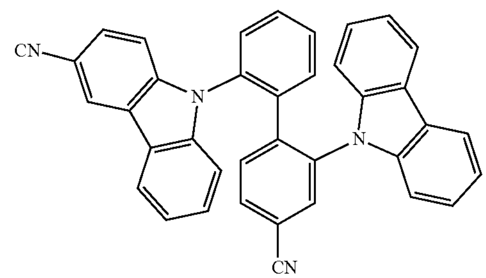
33
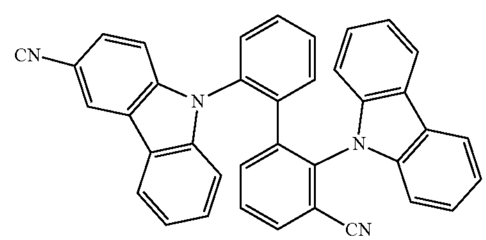
34
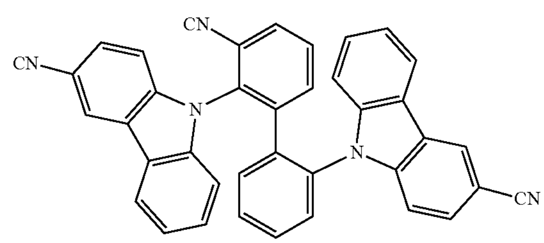
35
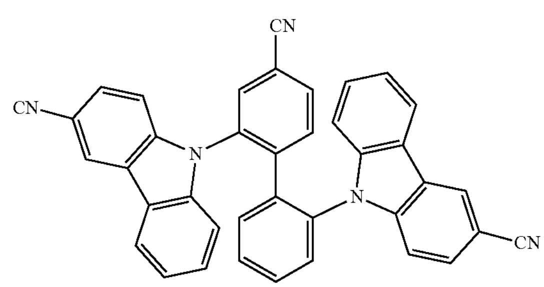

36
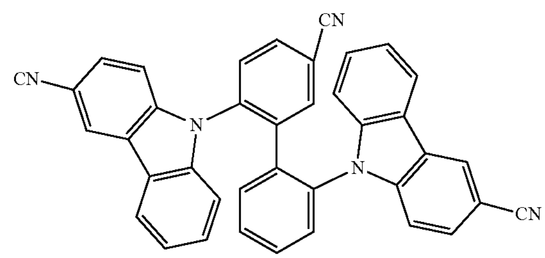
37
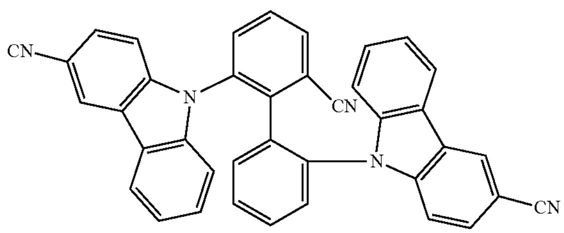
38
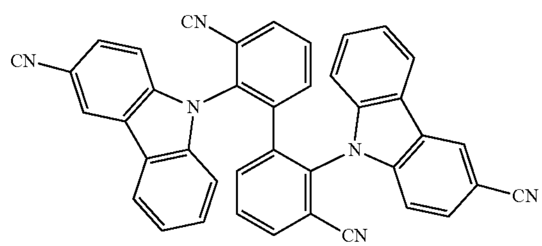
39
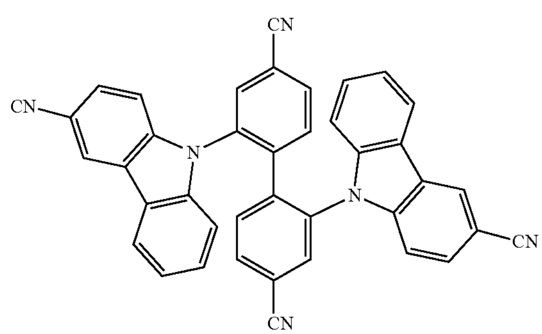
40
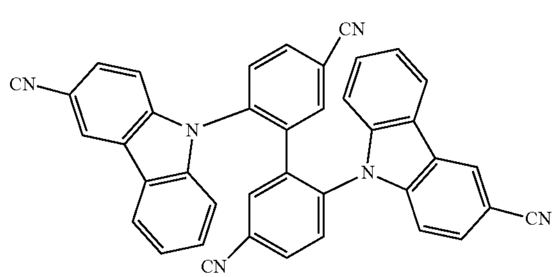
41
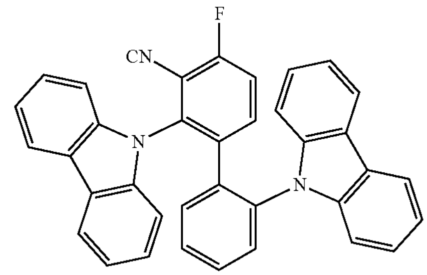
42
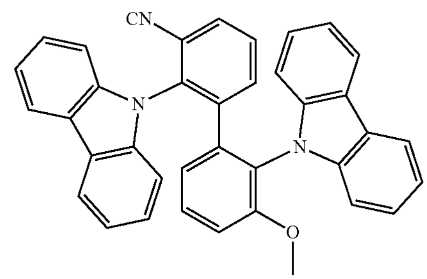
43
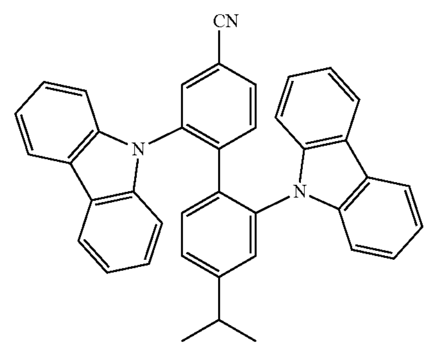
44
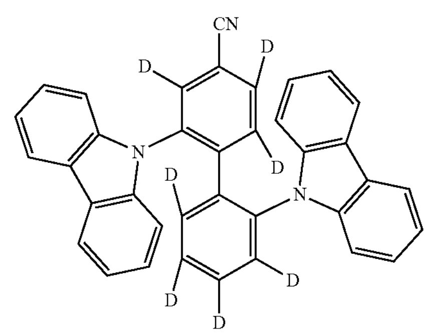
45
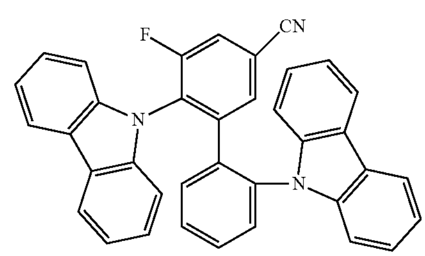

-continued
46
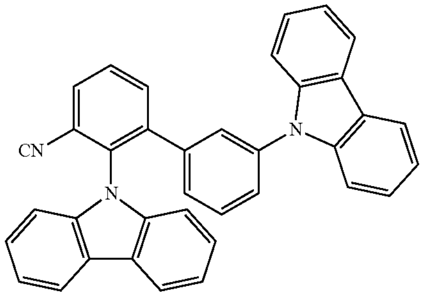
47
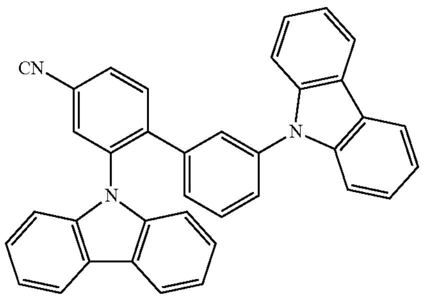
48
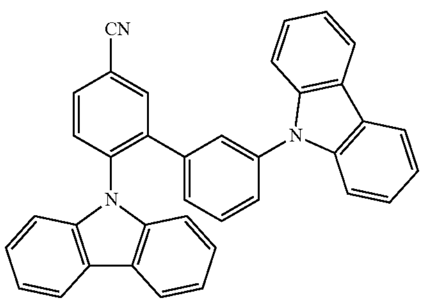
49
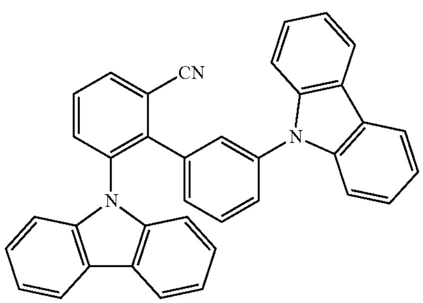
50
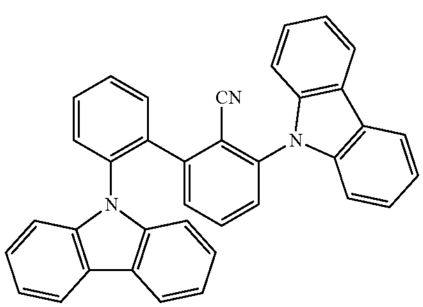
-continued
51
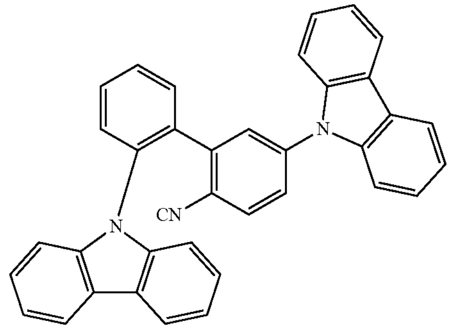
52
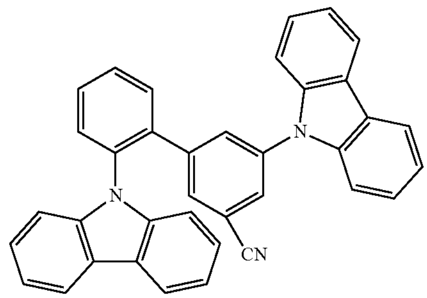
53
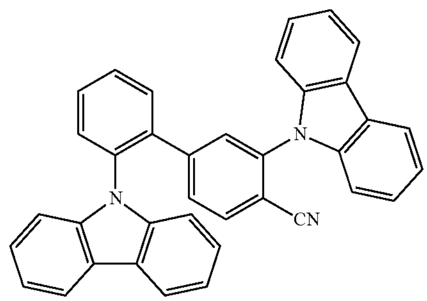
54
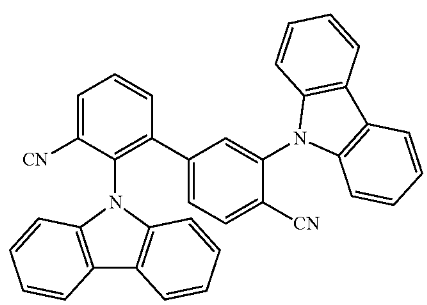
55
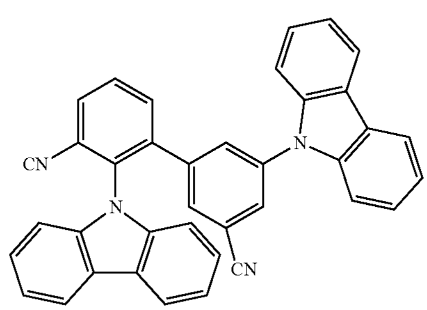

-continued
56
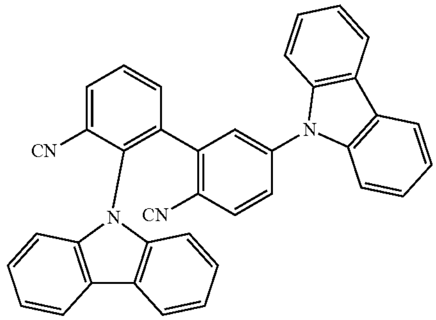
57
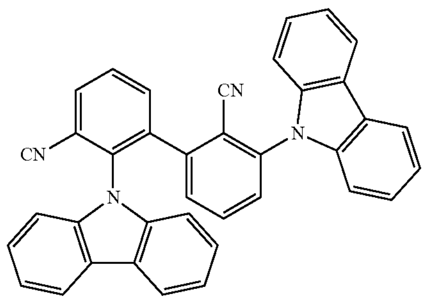
58
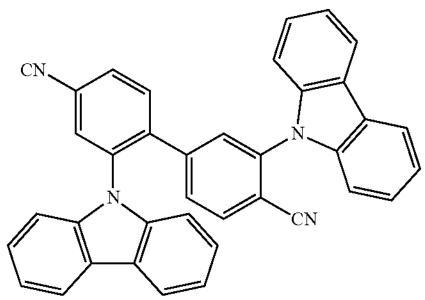
59
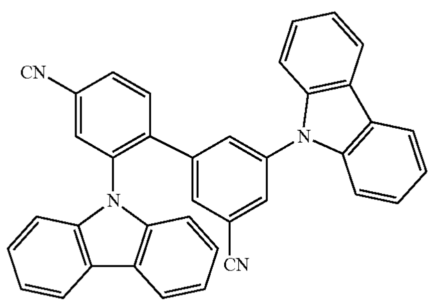
60
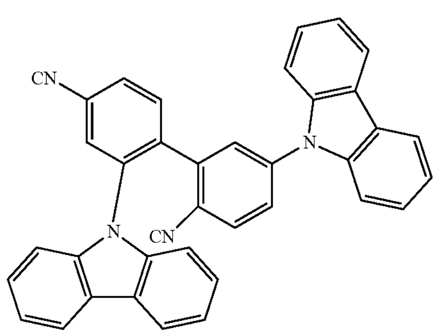
-continued
Group HE7
1
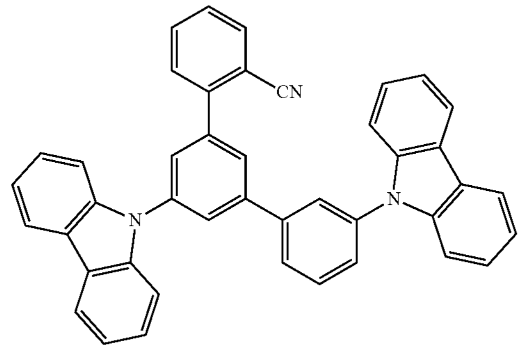
2
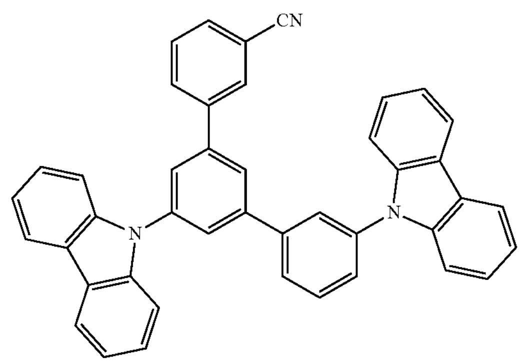
3
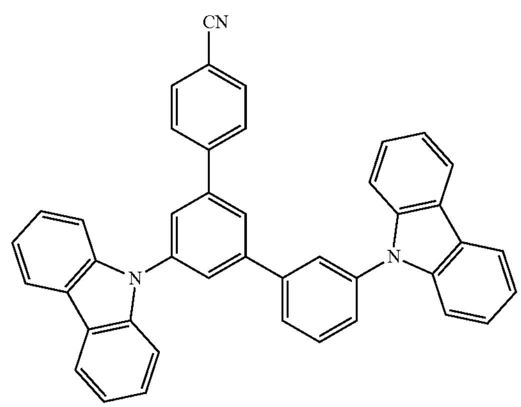
4
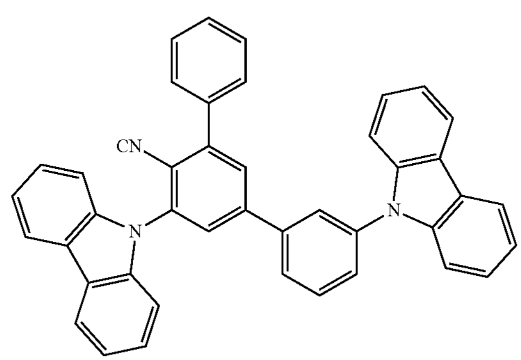

5
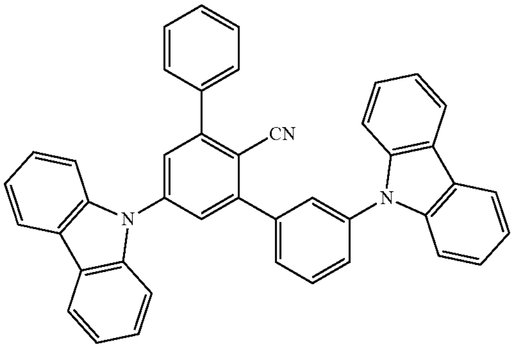
6
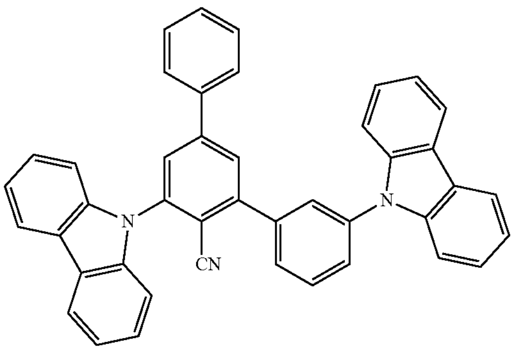
7
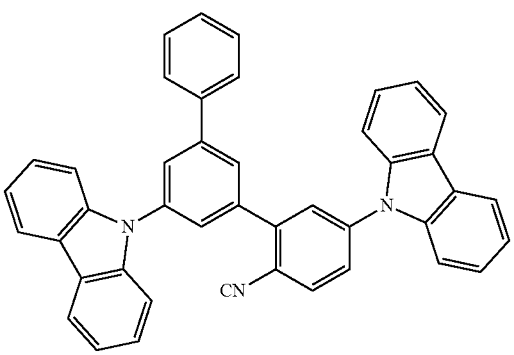
8
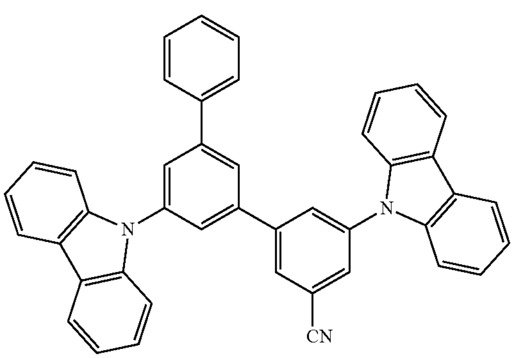
9
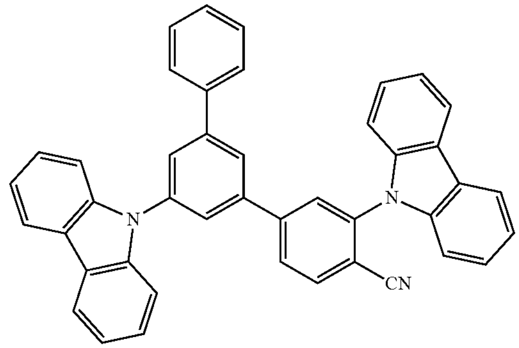
10
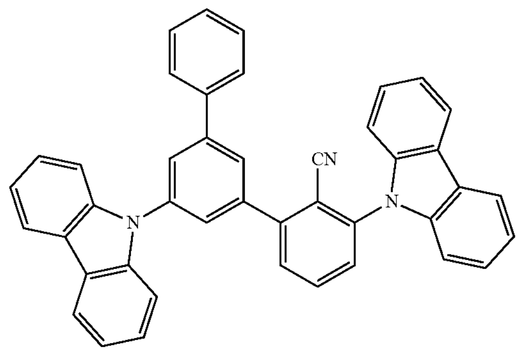
11
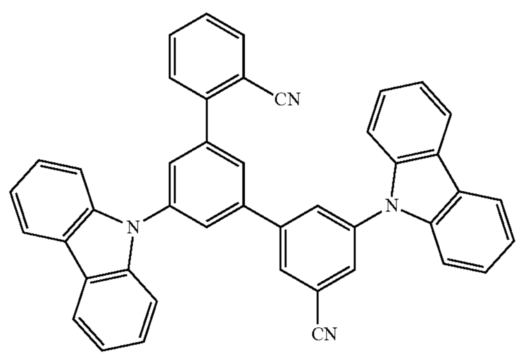
12
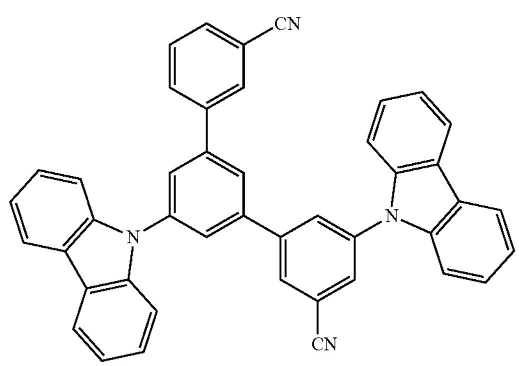

-continued
13
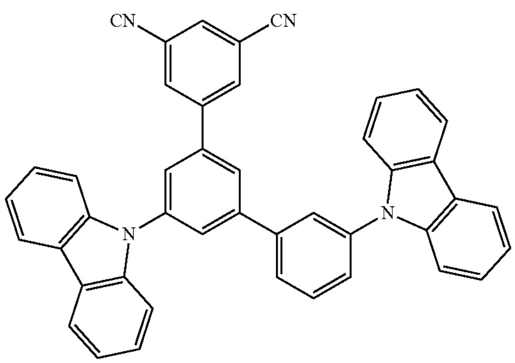
14
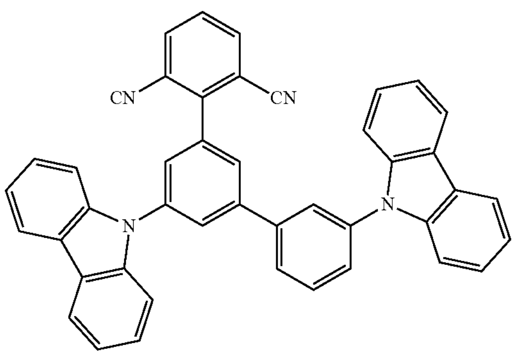
15
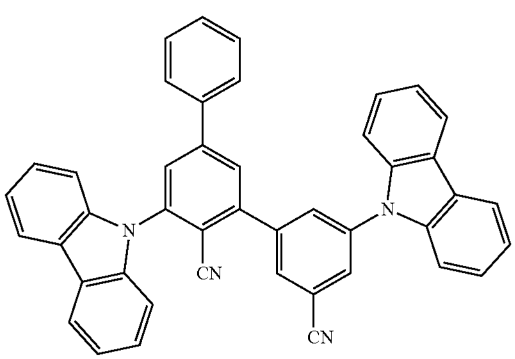
16
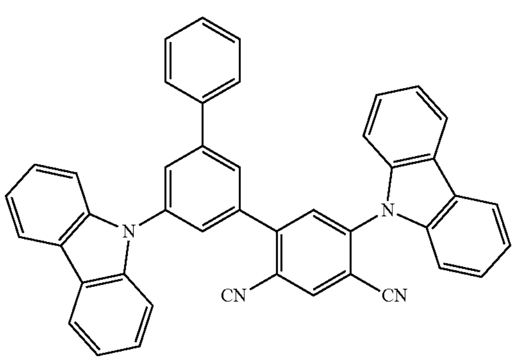
-continued
17
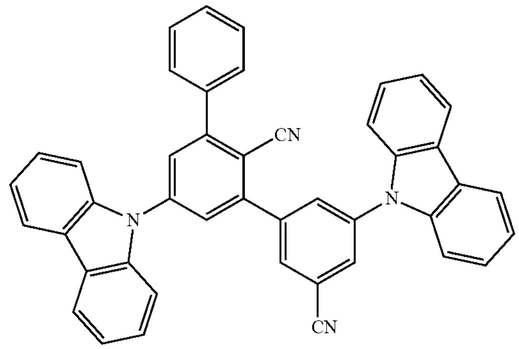
18
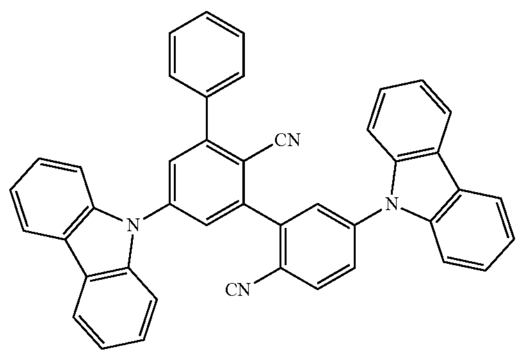
19
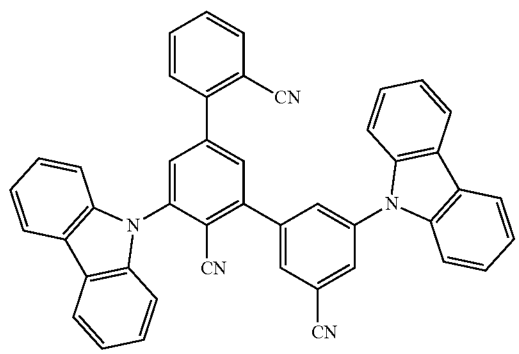
20
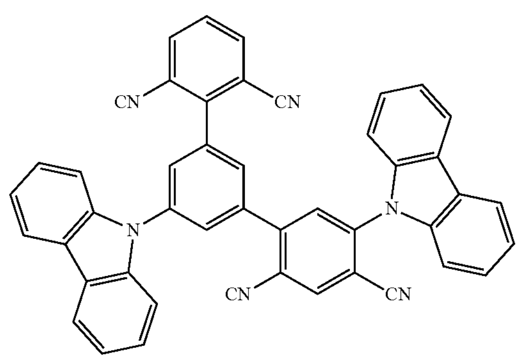

21
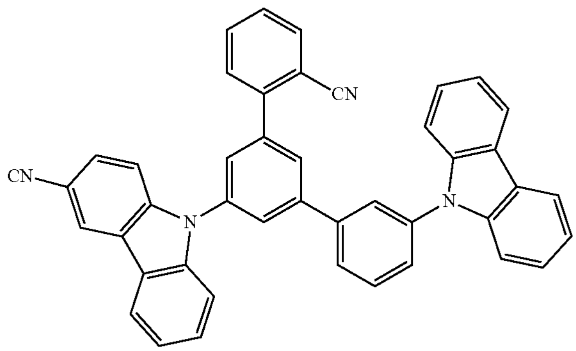
22
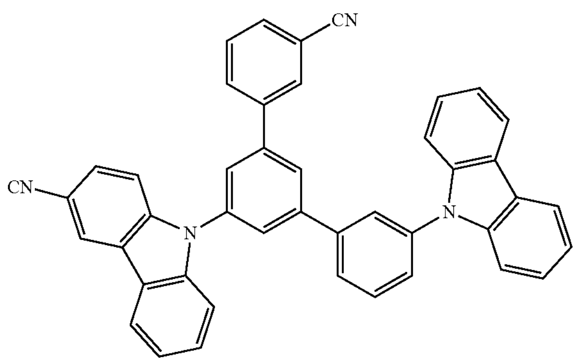
23
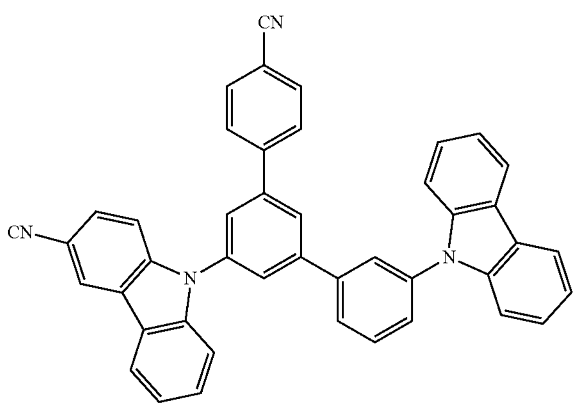
24
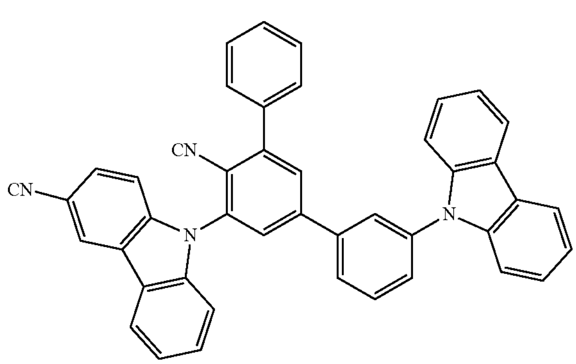
25
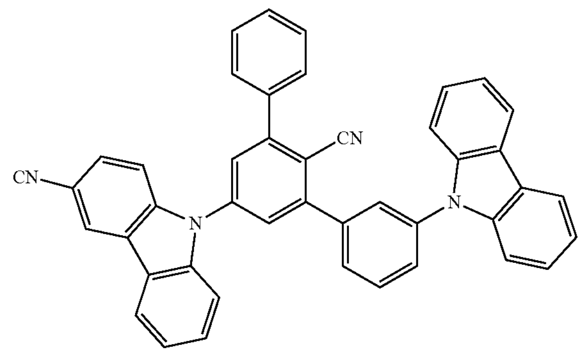
26
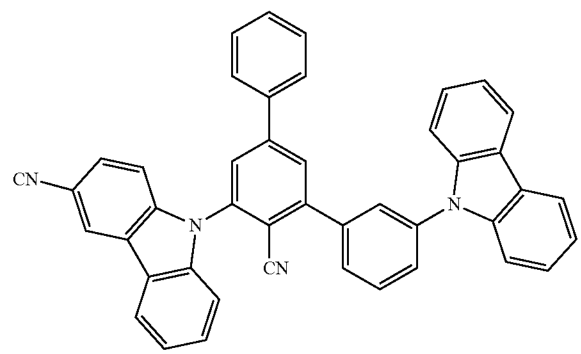
27
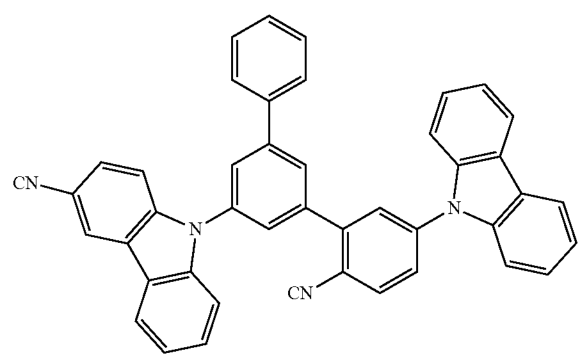
28
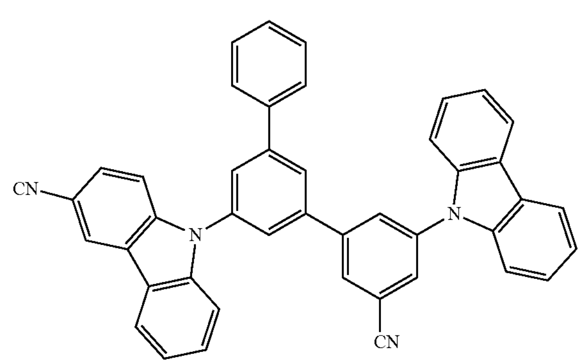

-continued
29
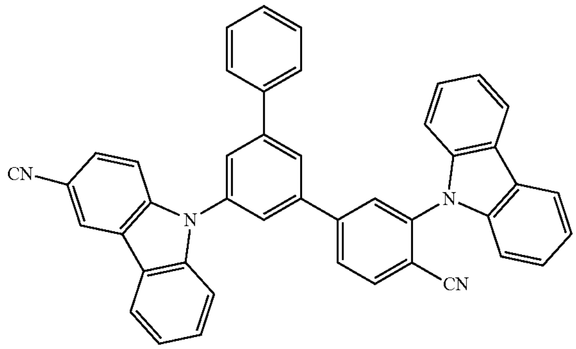
30
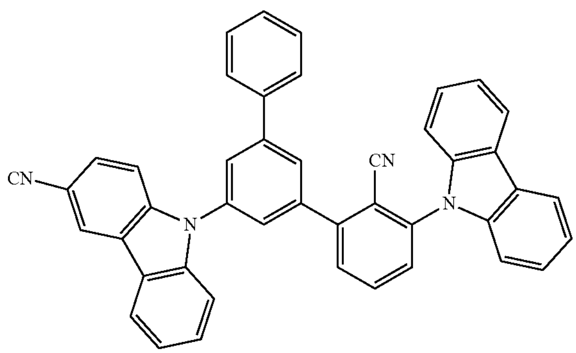
31
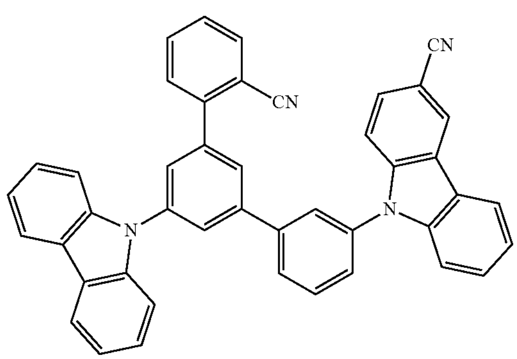
32
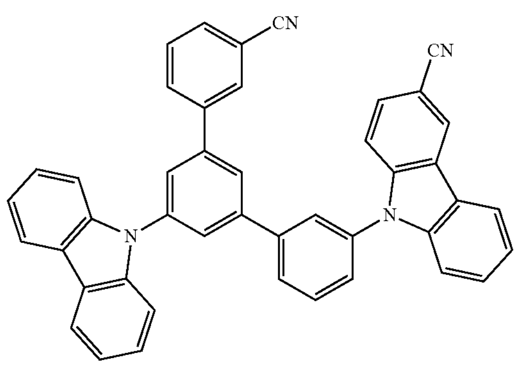
-continued
33
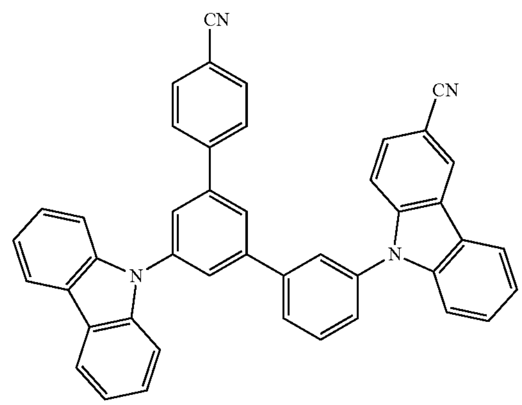
34
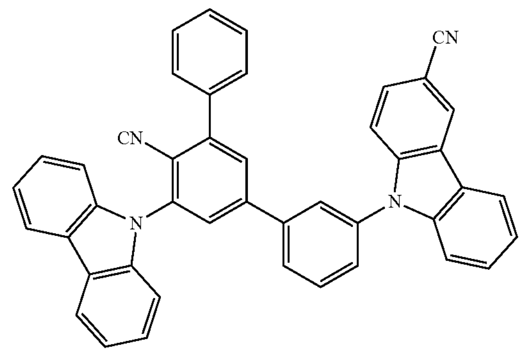
35
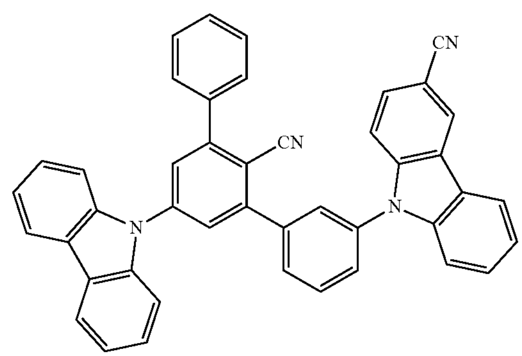
36
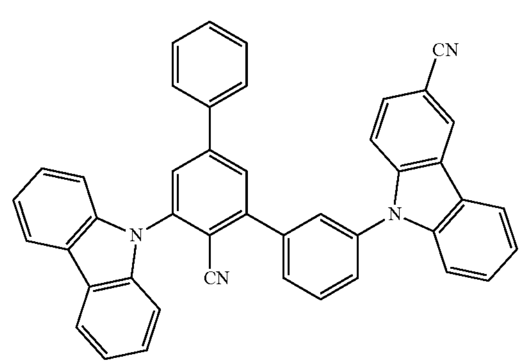

-continued
37
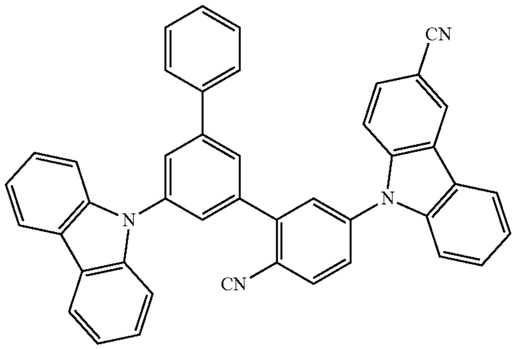
38
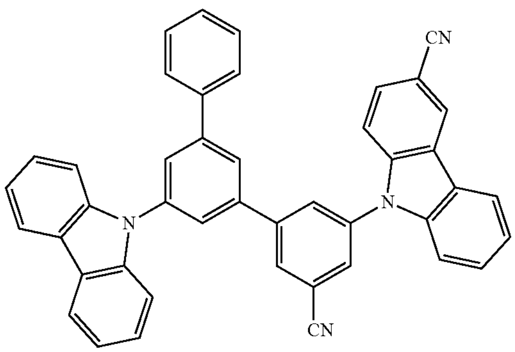
39
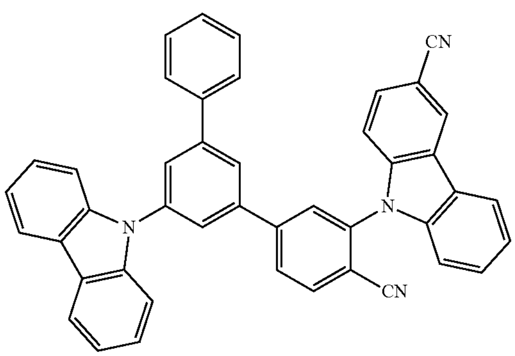
40
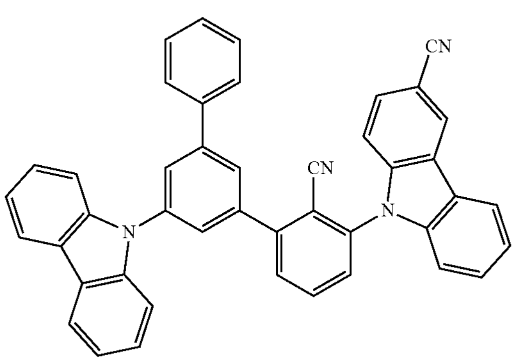
-continued
41
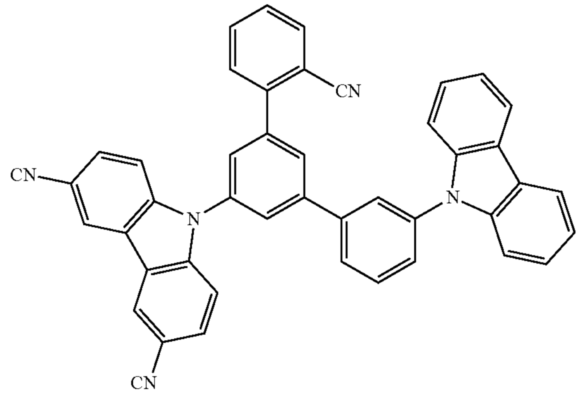
42
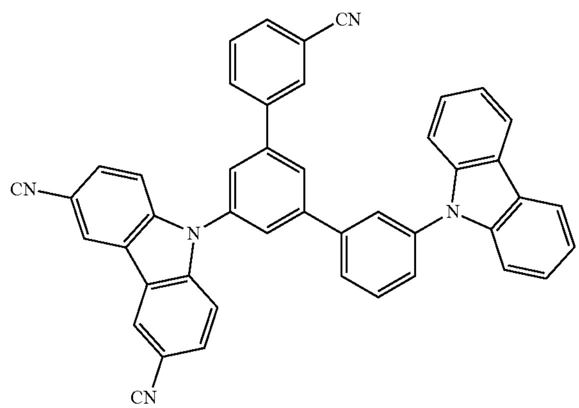
43
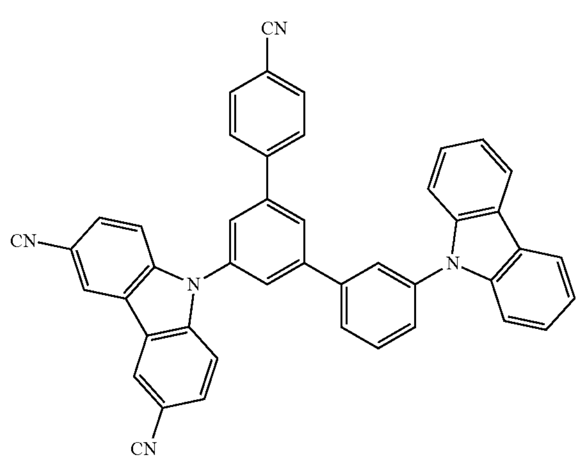

-continued
44
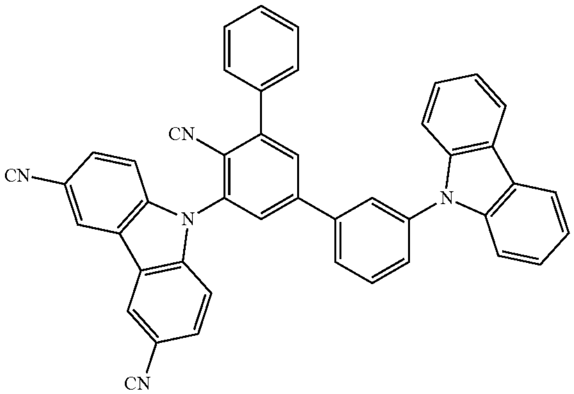
45
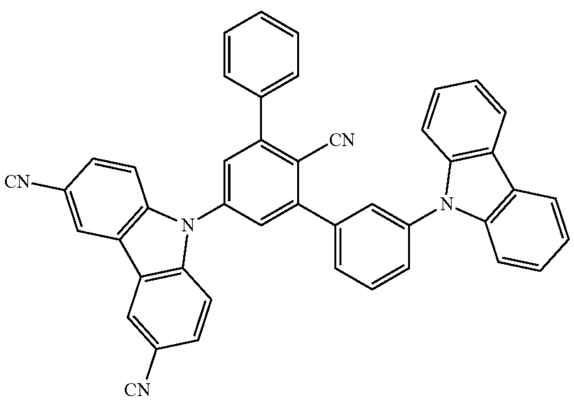
46
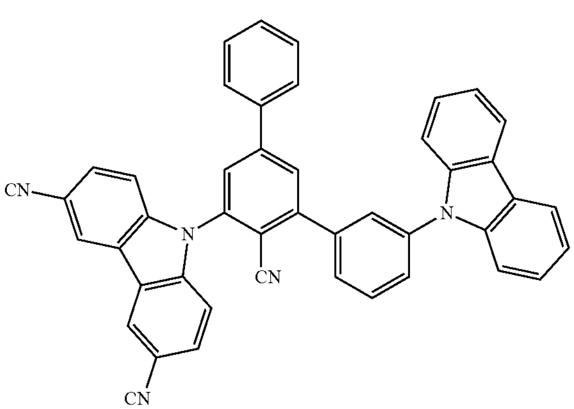
-continued
47
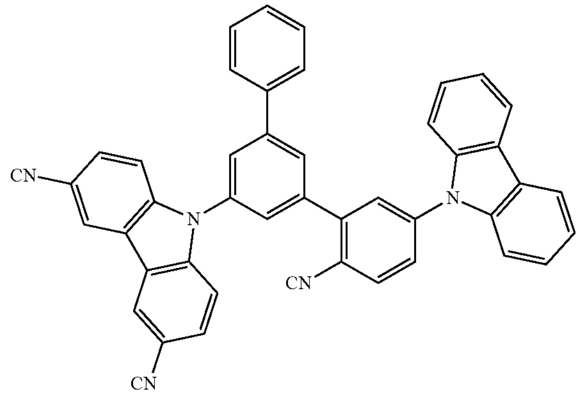
48
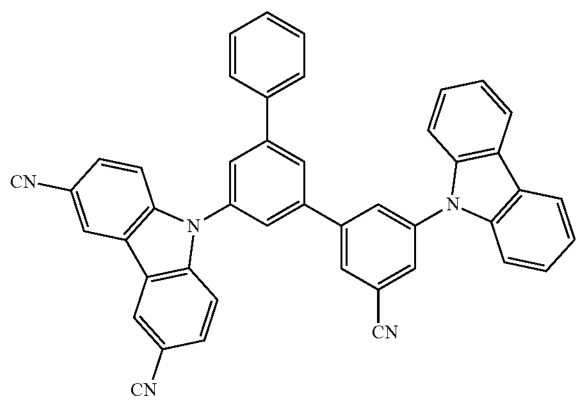
49
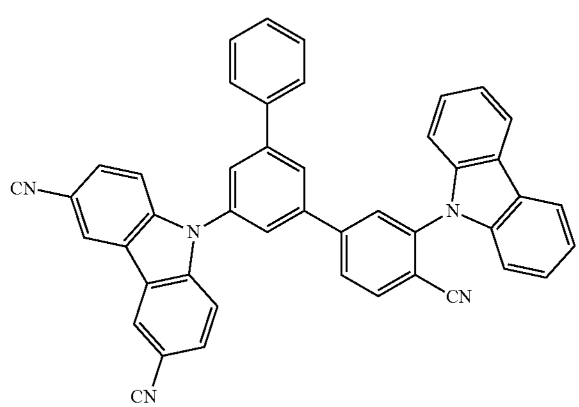

-continued
50
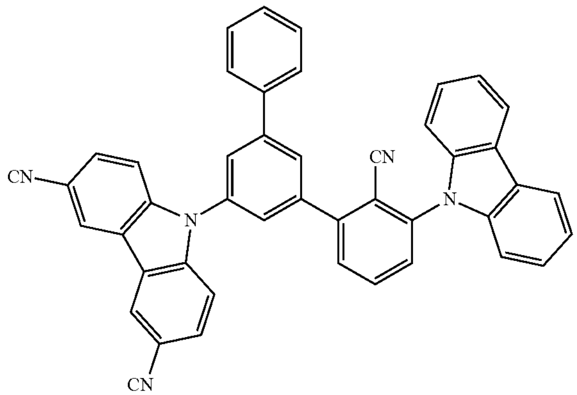
51
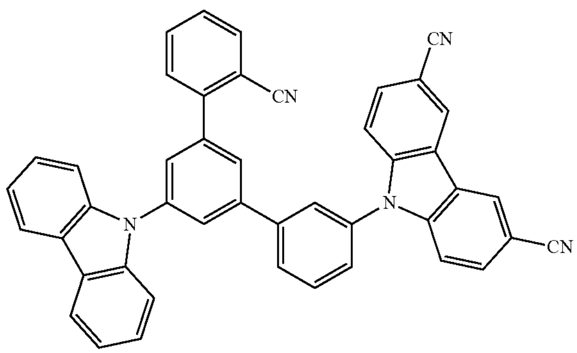
52
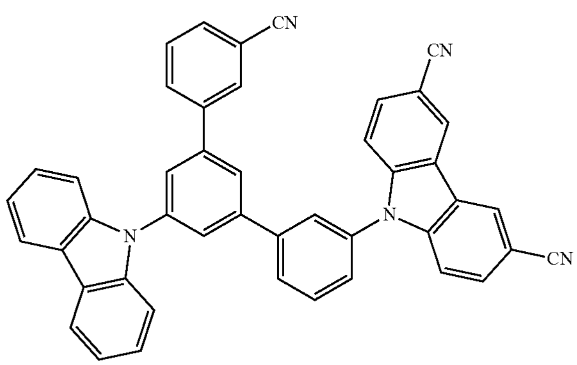
53
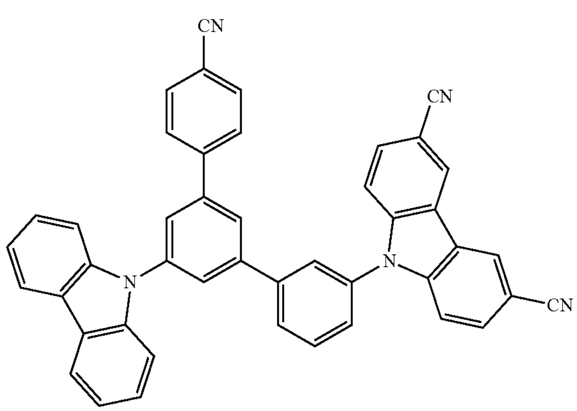
-continued
54
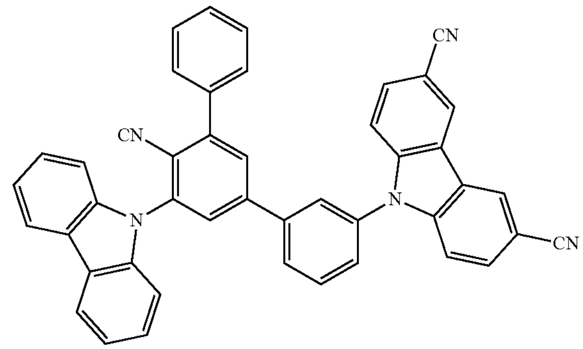
55
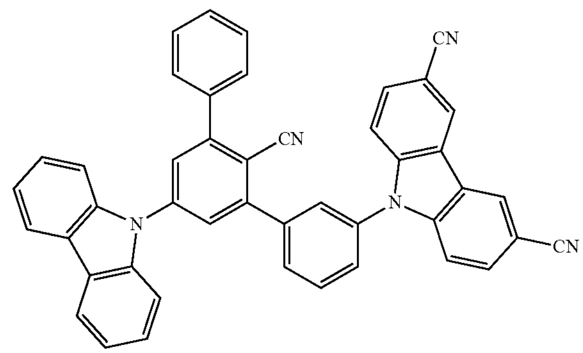
56
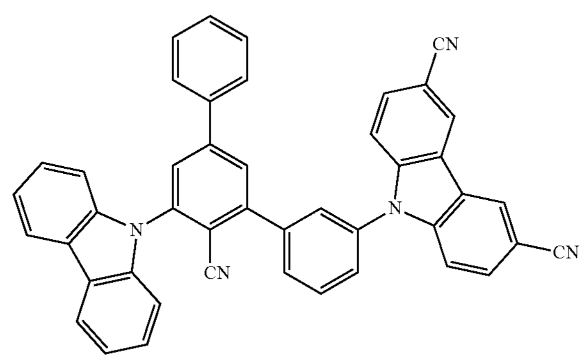
57
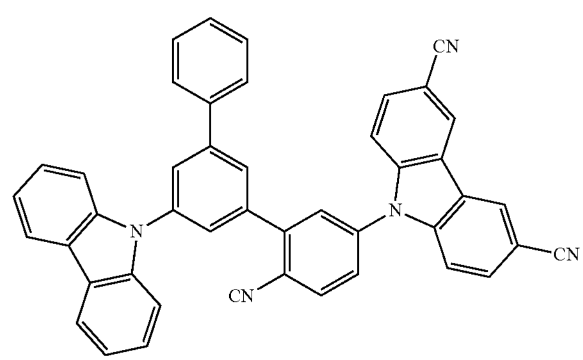

-continued
58
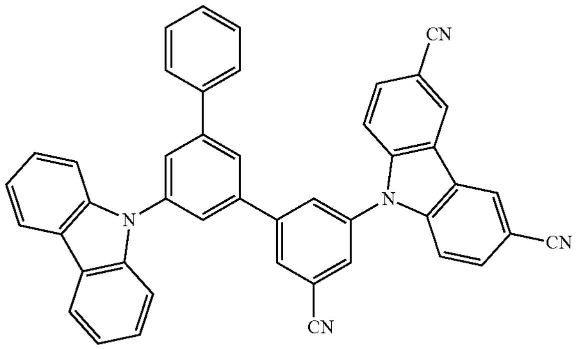
59
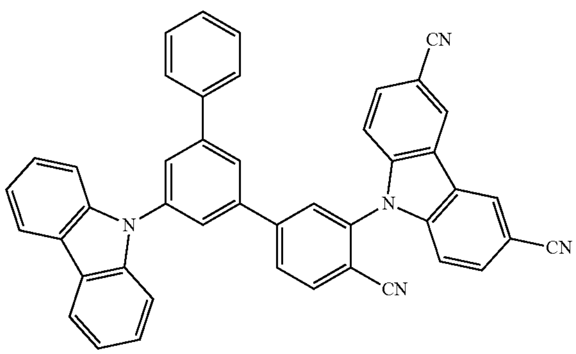
60
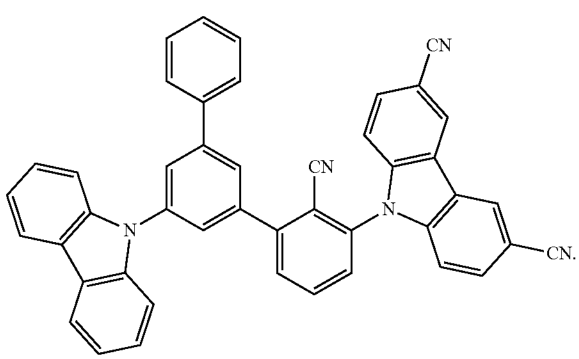
In an embodiment, the hole-transporting host may include at least one of Compounds H-H1 to H-H103:
H-H1
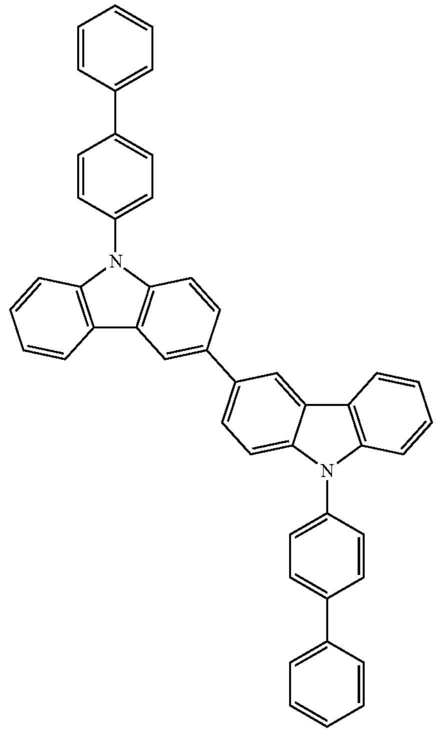
H-H2
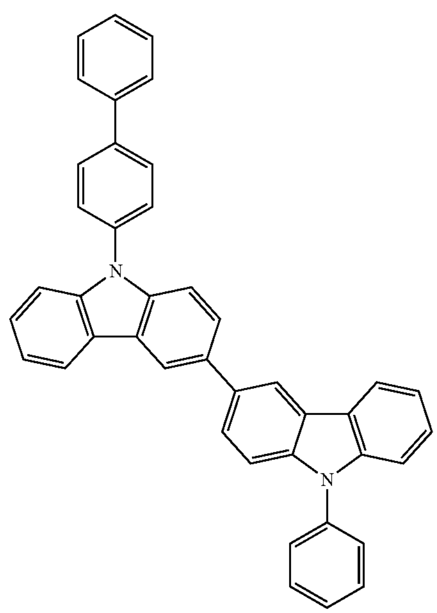

-continued
H-H3
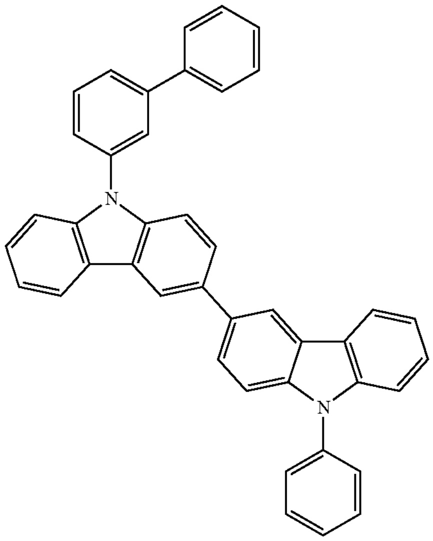
H-H4
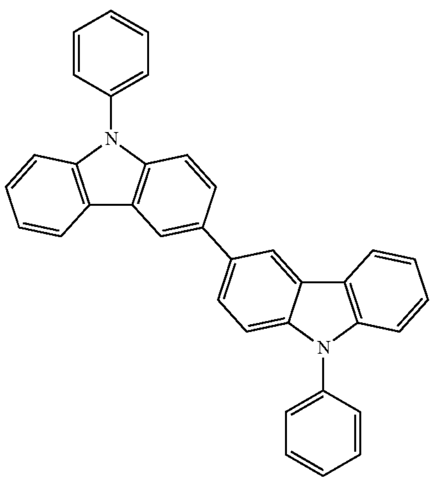
H-H5
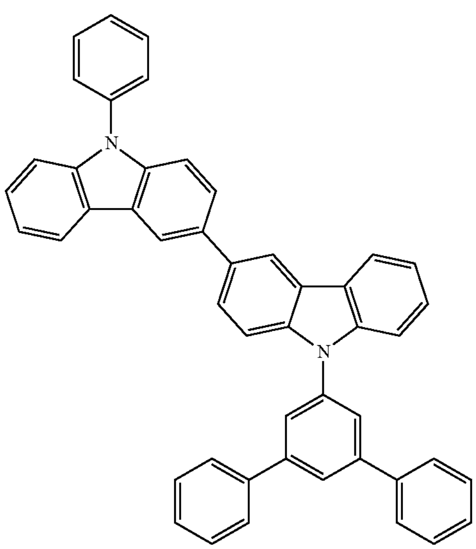
-continued
H-H6
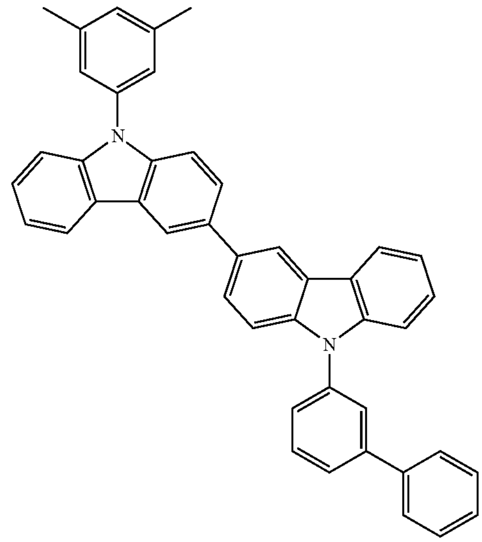
H-H7
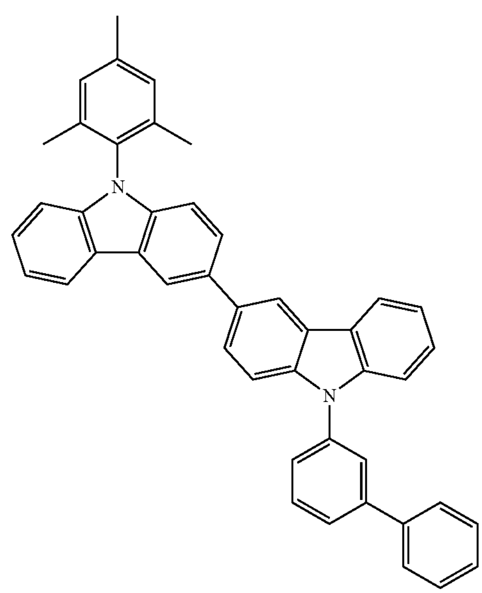

-continued
H-H8
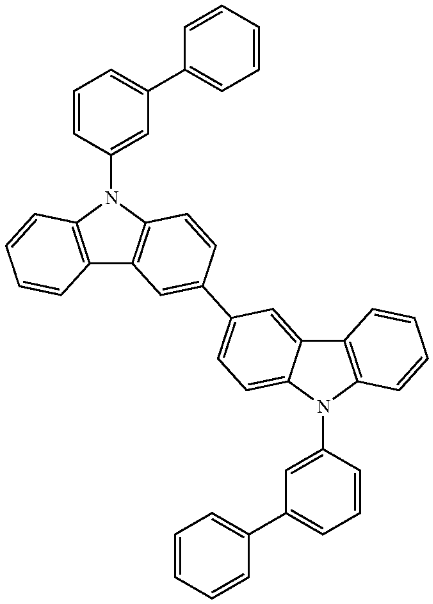
H-H9
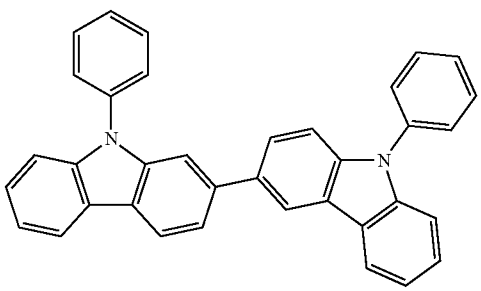
H-H10
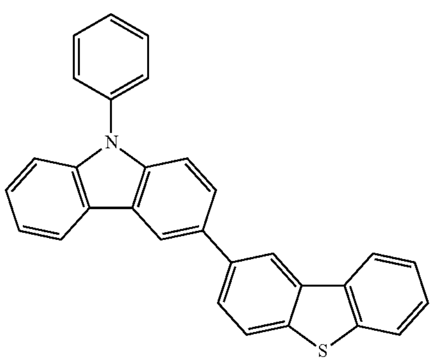
H-H11
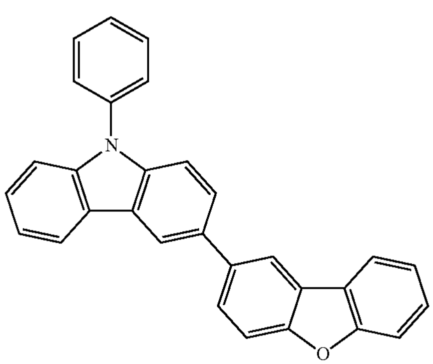
-continued
H-H12
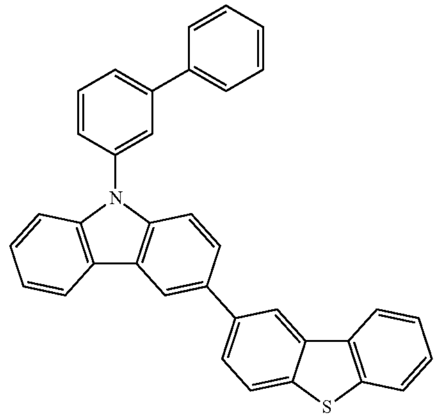
H-H13
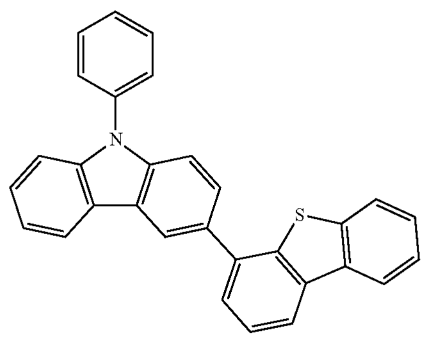
H-H14
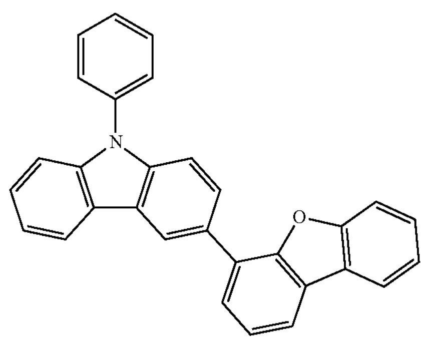
H-H15
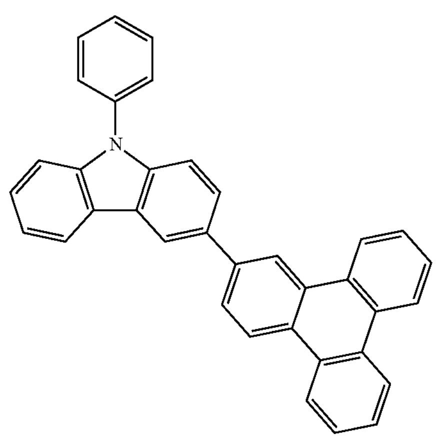

H-H16
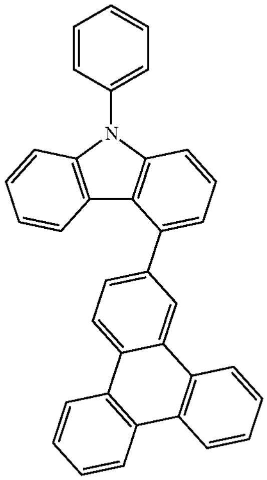
H-H17
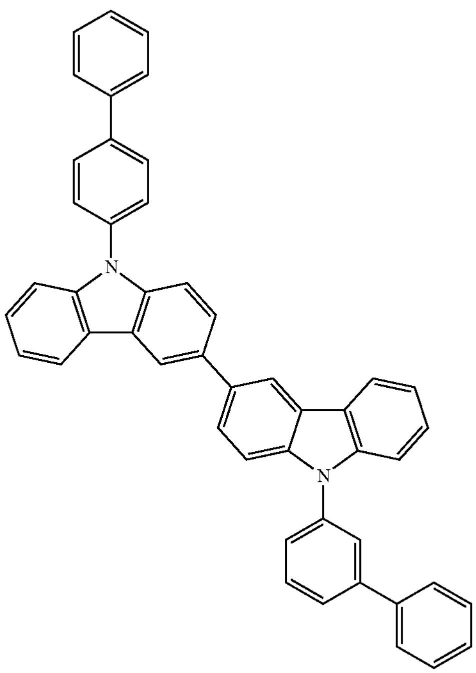
H-H18
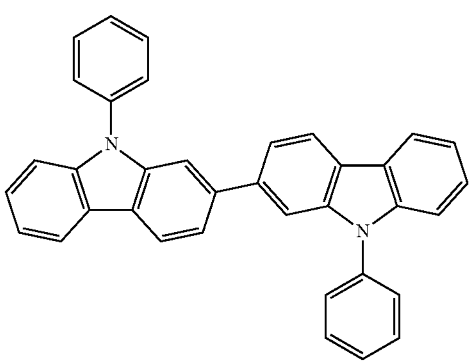
H-H19
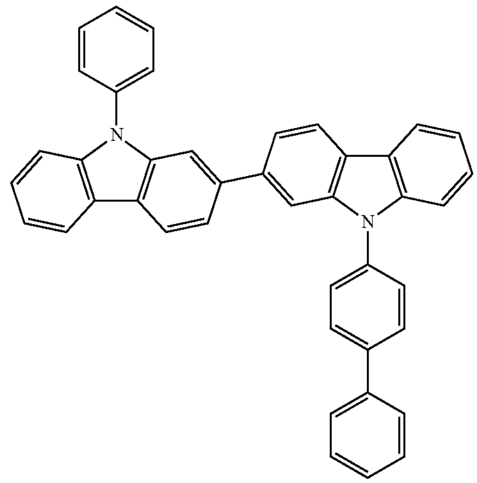
H-H20
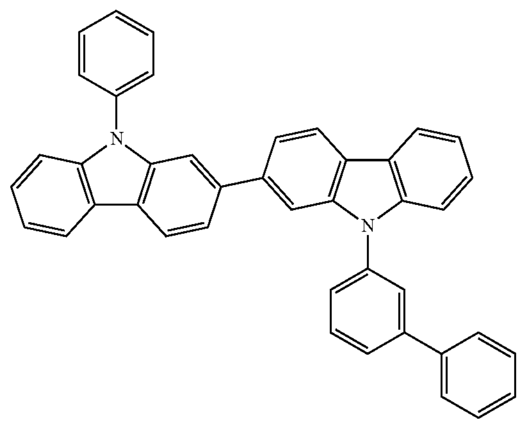
H-H21
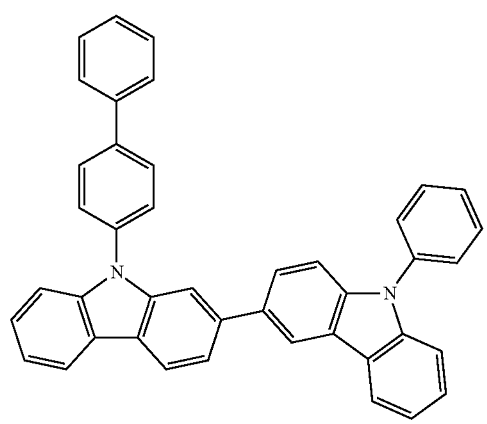

H-H22
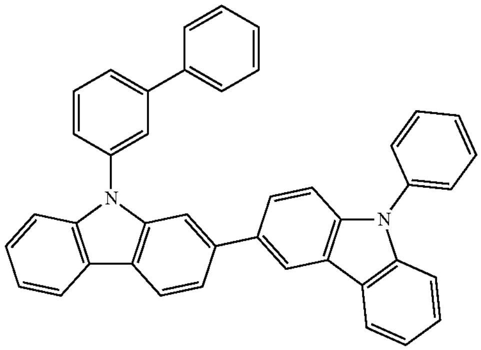
H-H23
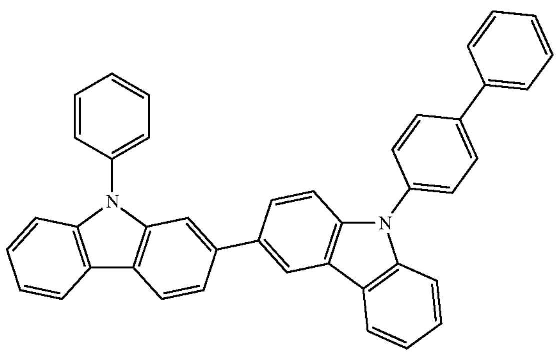
H-H24
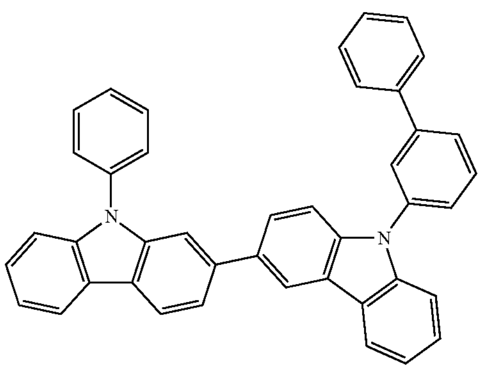
H-H25
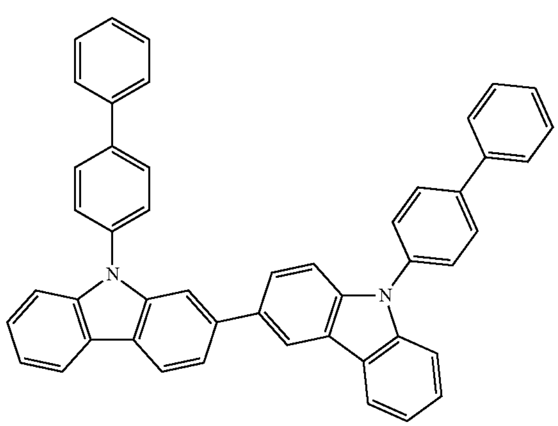
H-H26
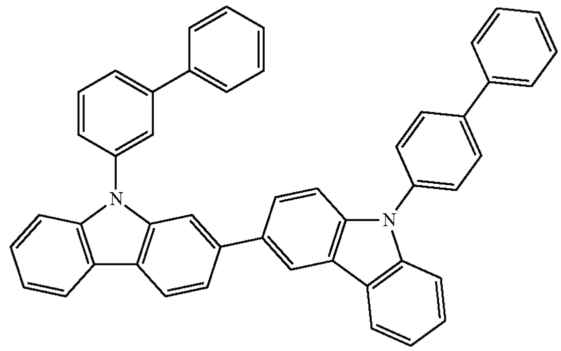
H-H27
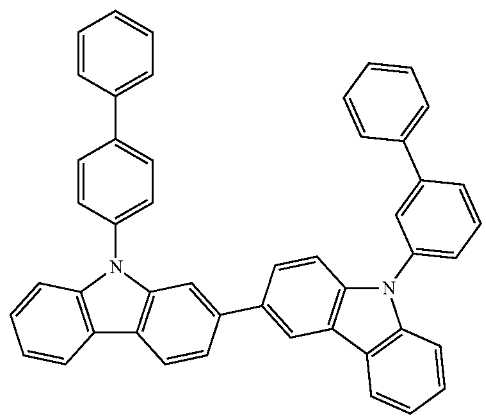
H-H28
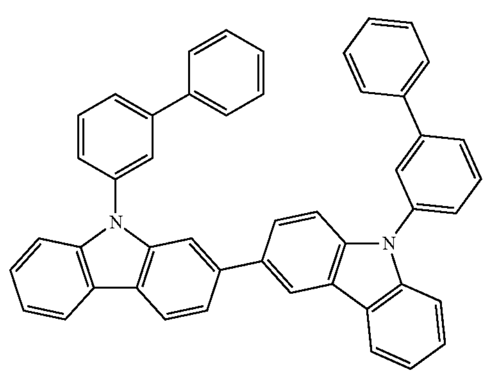

-continued
H-H29
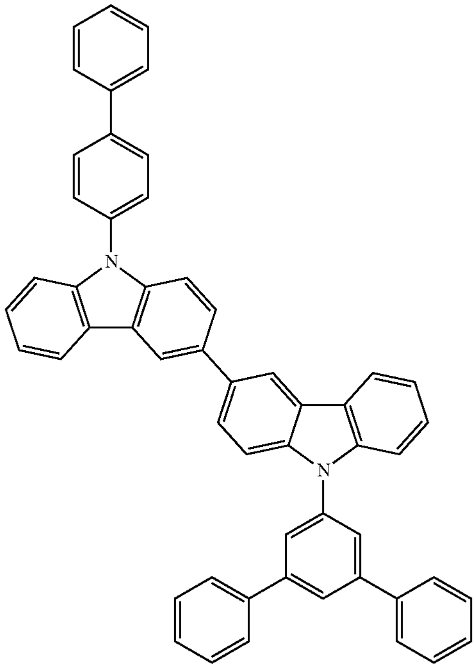
H-H30
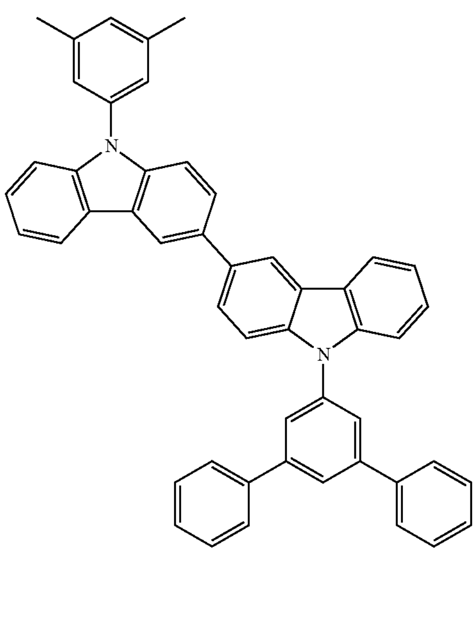
-continued
H-H31
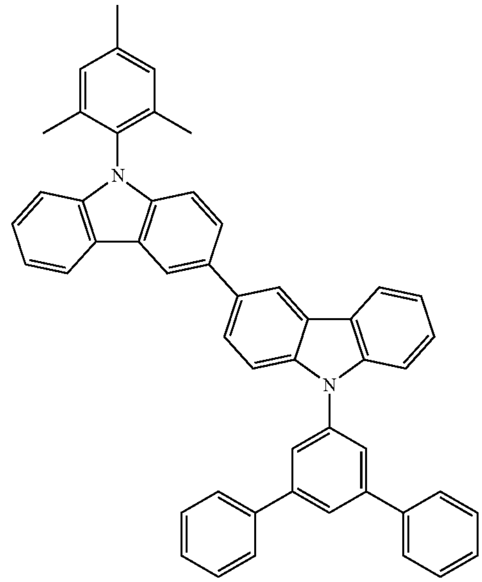
H-H32
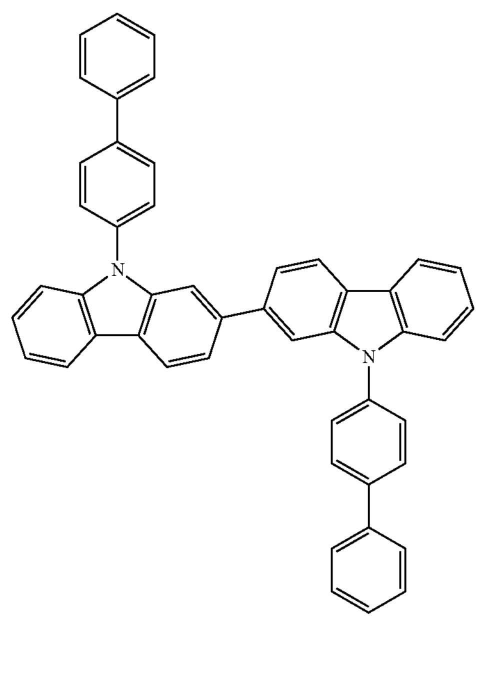

-continued
H-H33
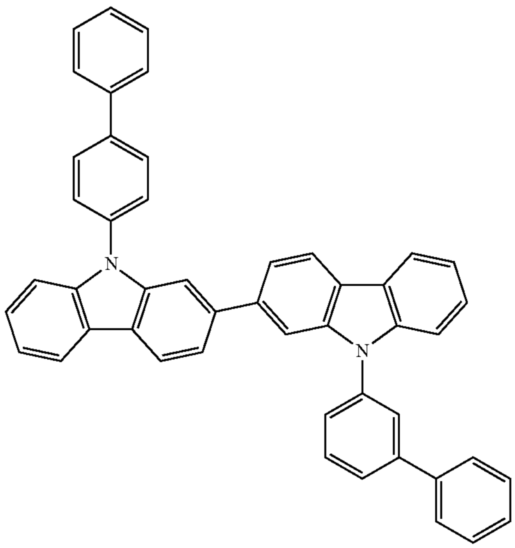
H-H34
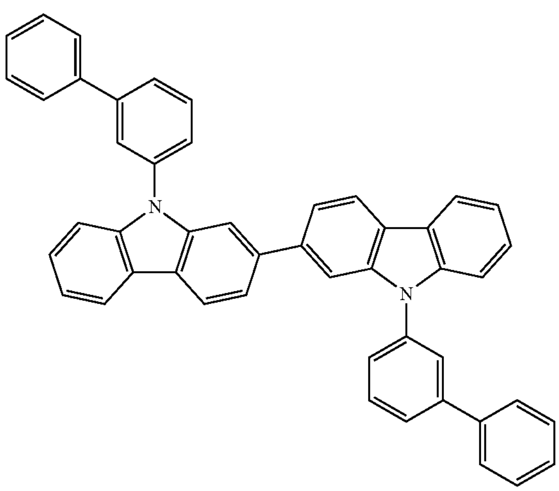
H-H35
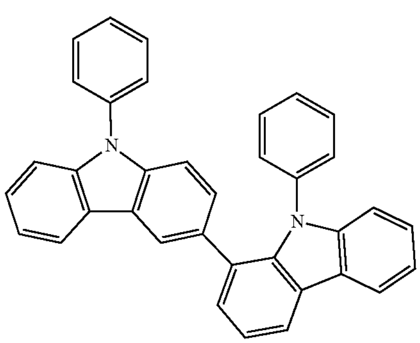
-continued
H-H36
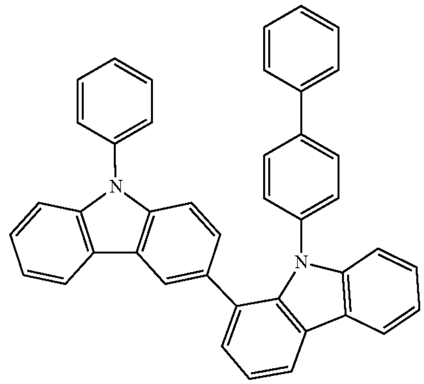
H-H37
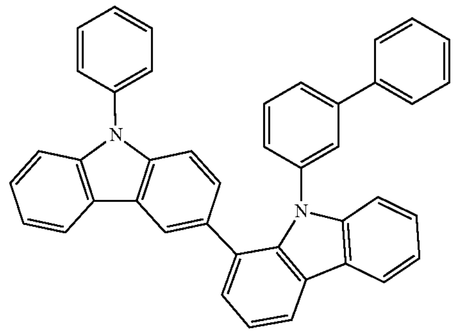
H-H38
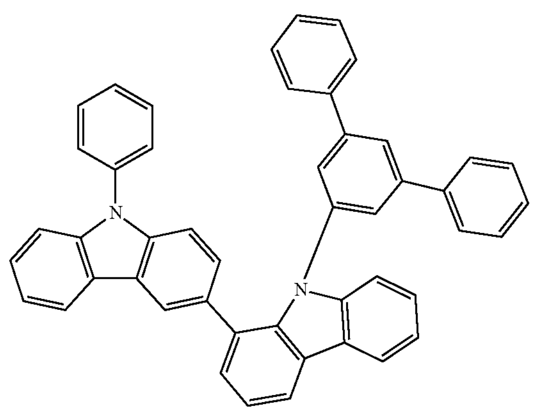
H-H39
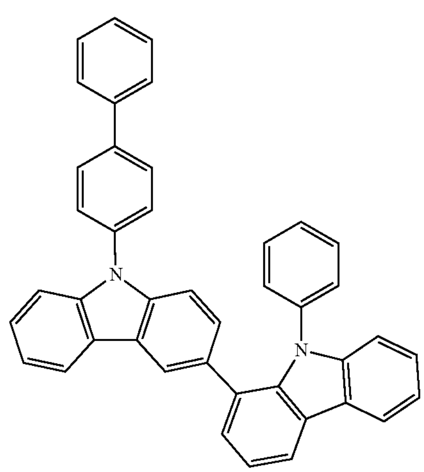

-continued
H-H40
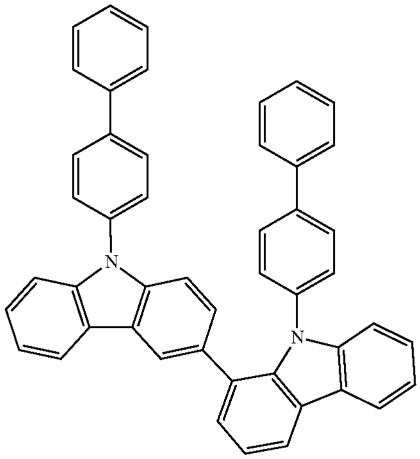
H-H41
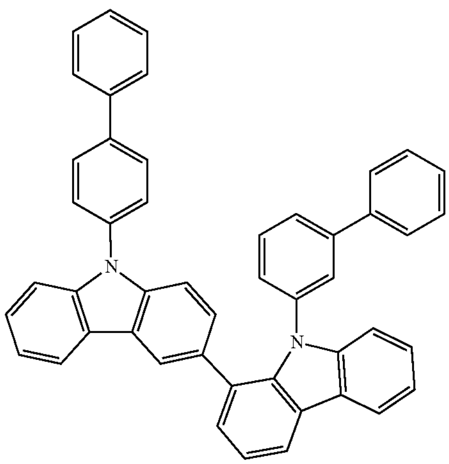
H-H42
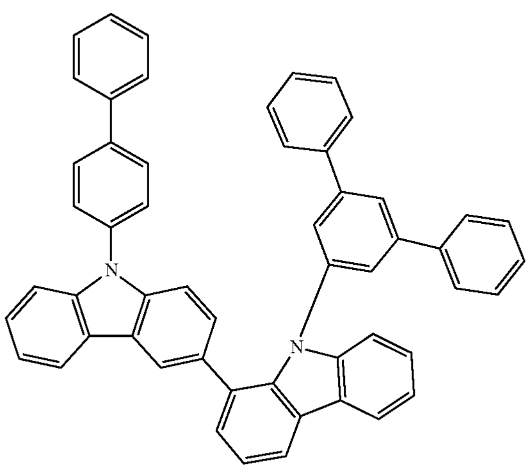
-continued
H-H43
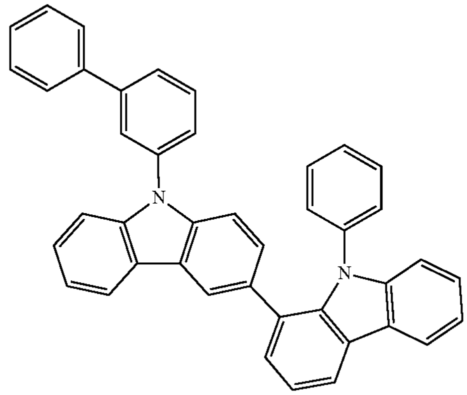
H-H44
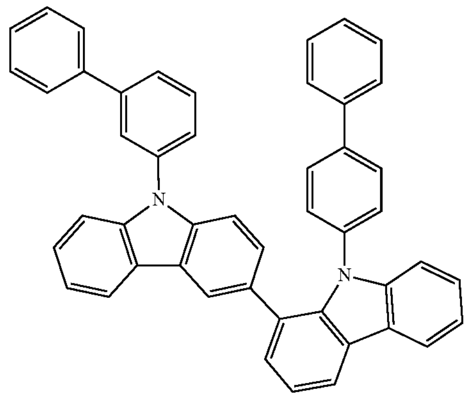
H-H45
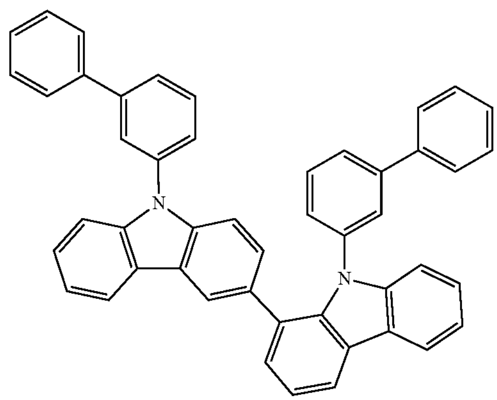
H-H46
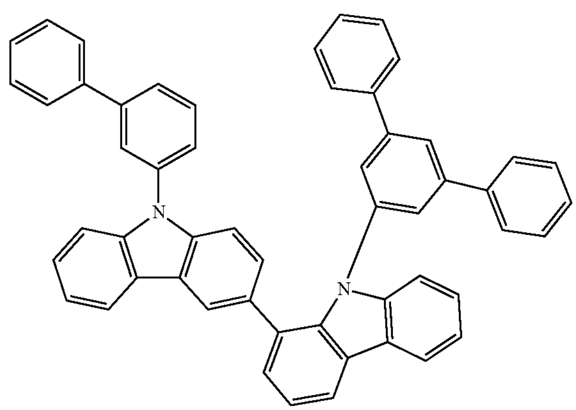

-continued
H-H47
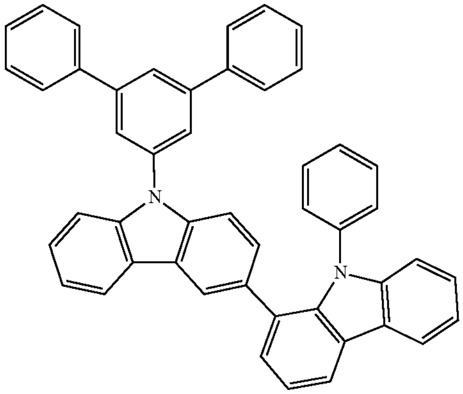
H-H48
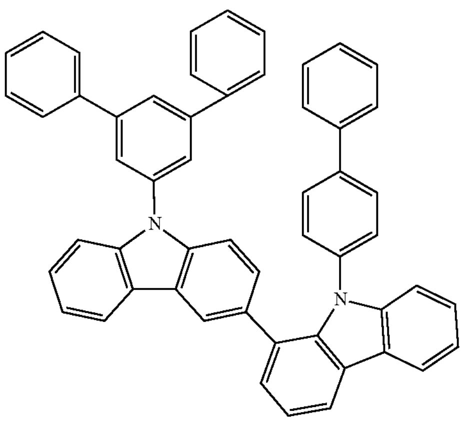
H-H49
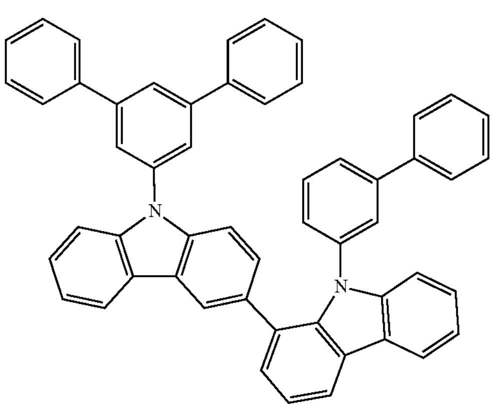
-continued
H-H50
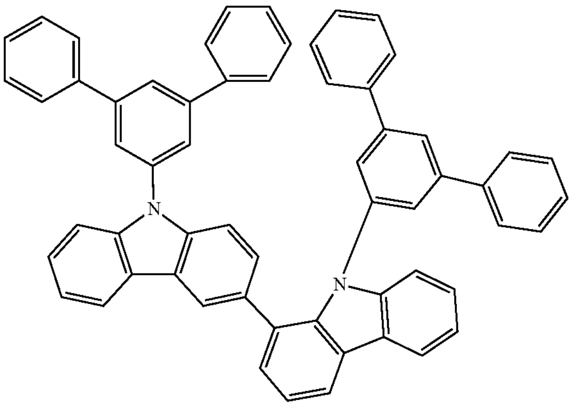
H-H51
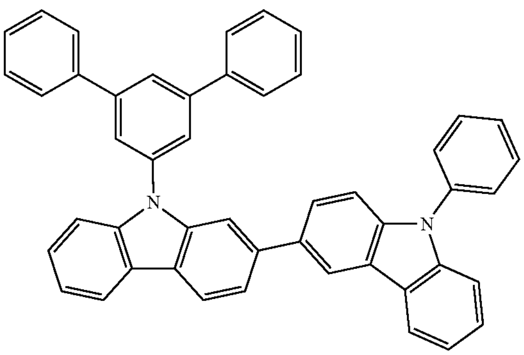
H-H52
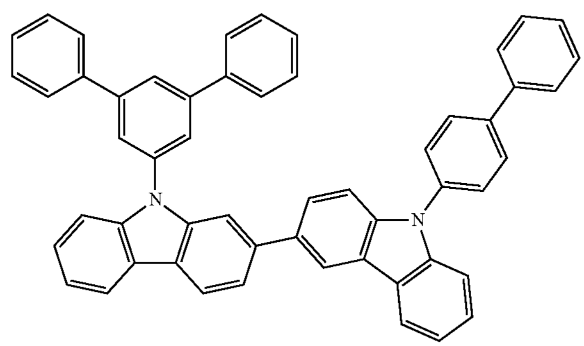
H-H53
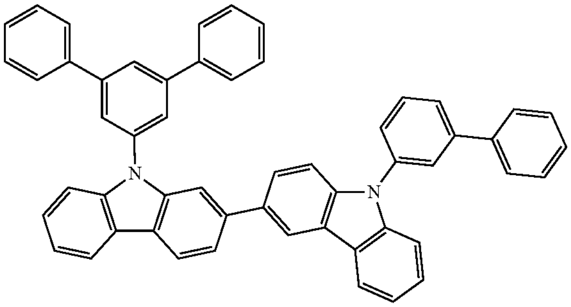

H-H54
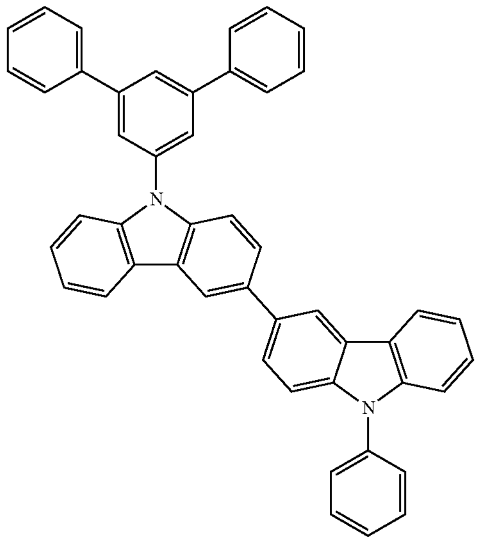
H-H55
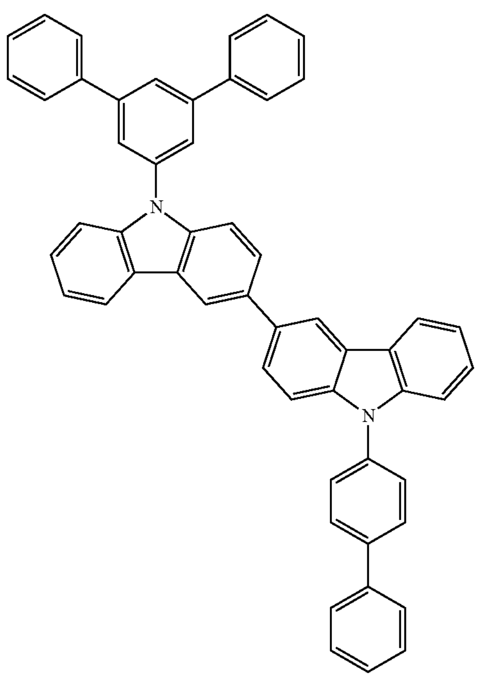
H-H56
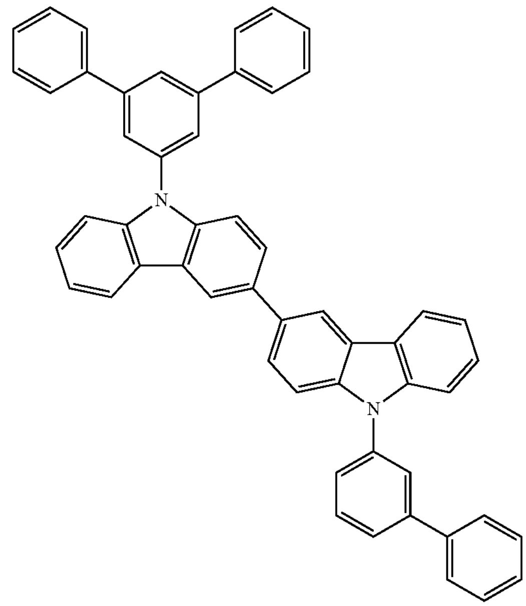
H-H57
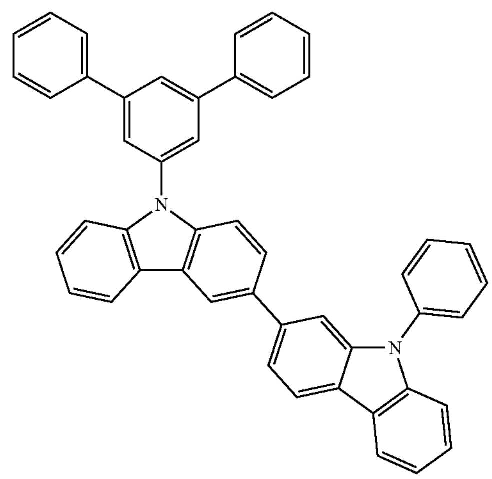
H-H58
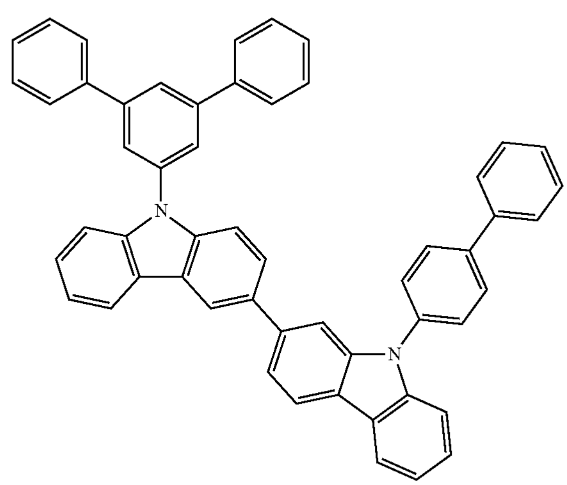

-continued
H-H59
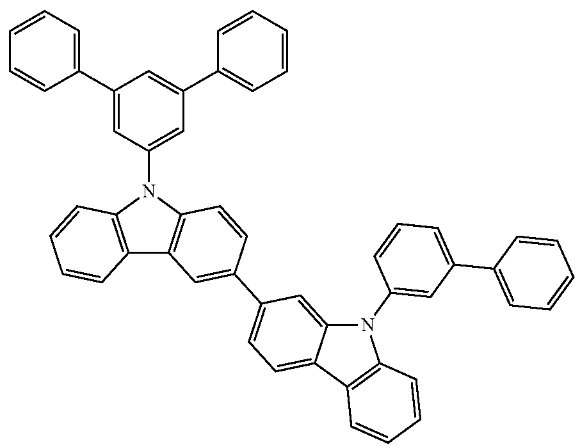
H-H60
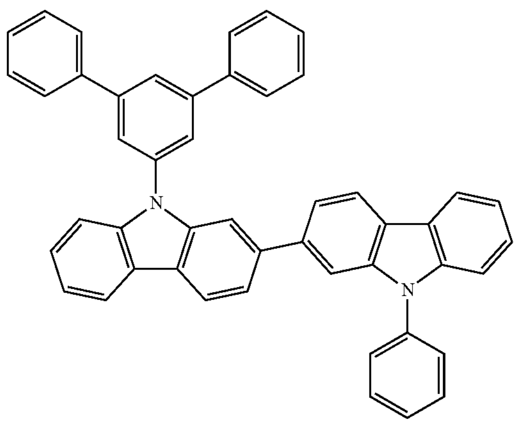
H-H61
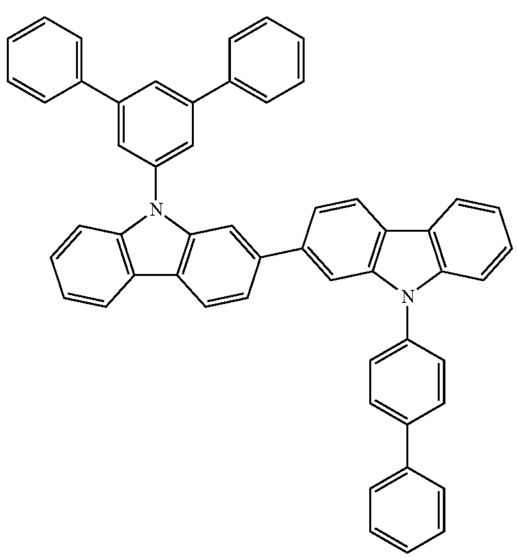
-continued
H-H62
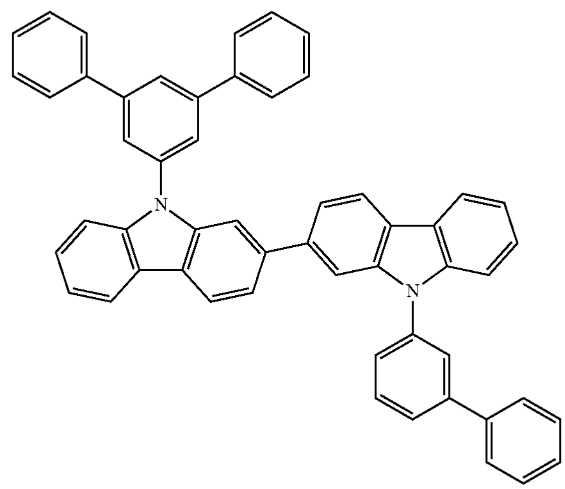
H-H63
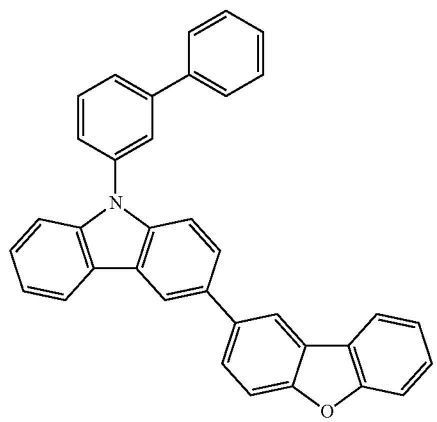
H-H64
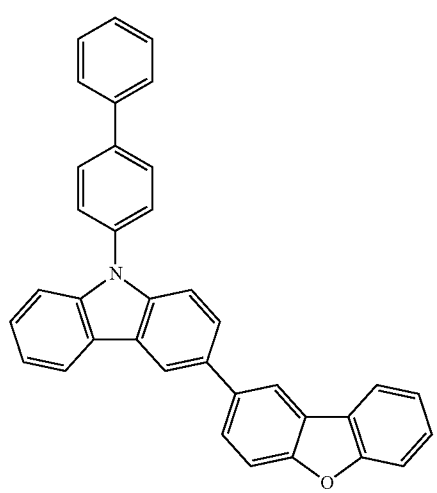

-continued
H-H65
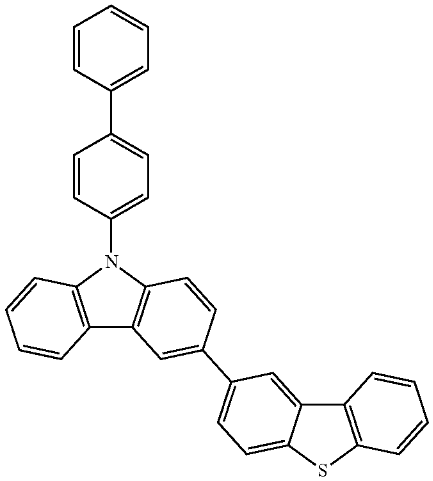
H-H66
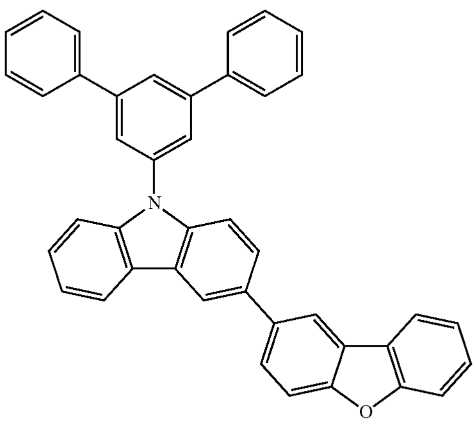
H-H67
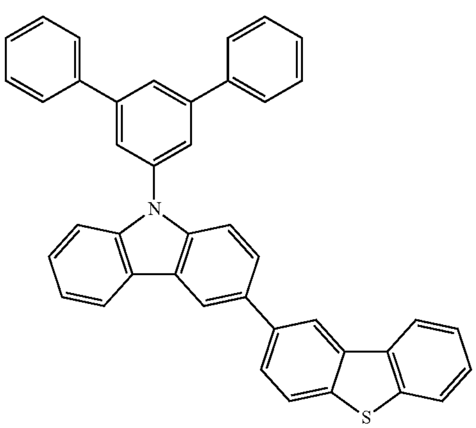
-continued
H-H68
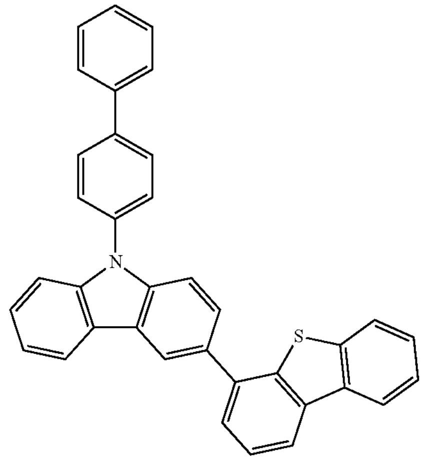
H-H69
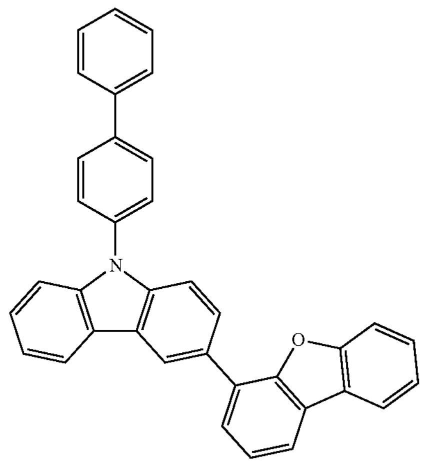
H-H70
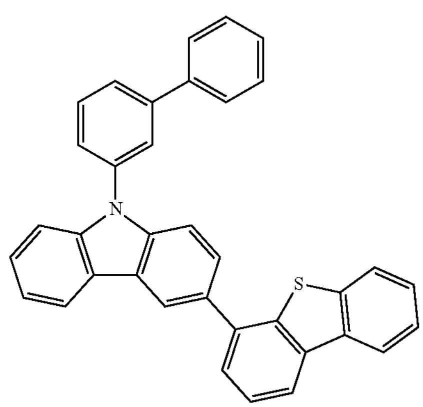

H-H71
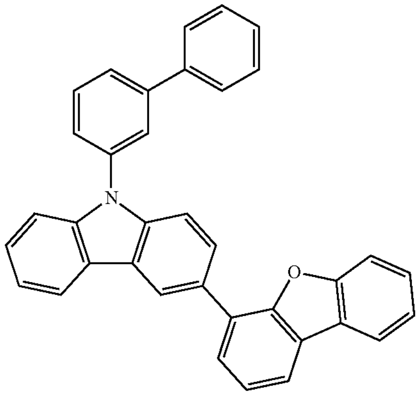
H-H72
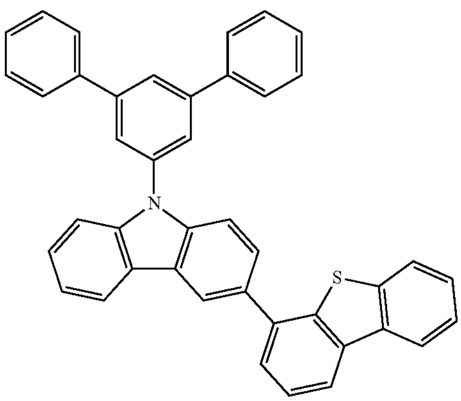
H-H73
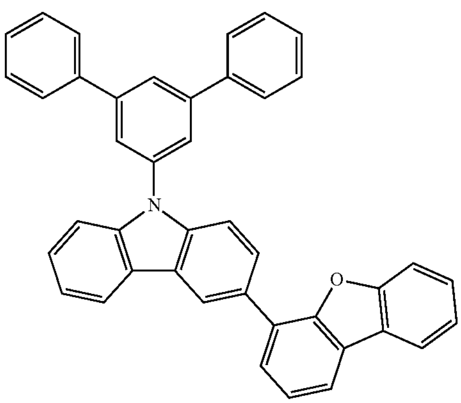
H-H74
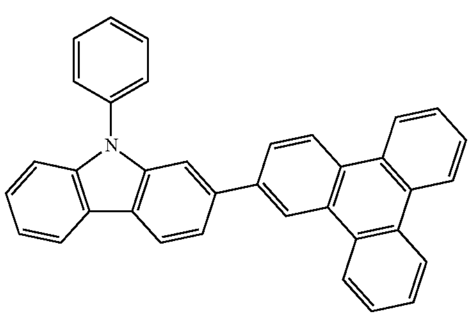
H-H75
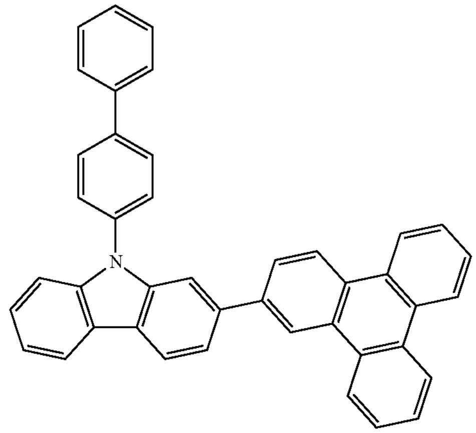
H-H76
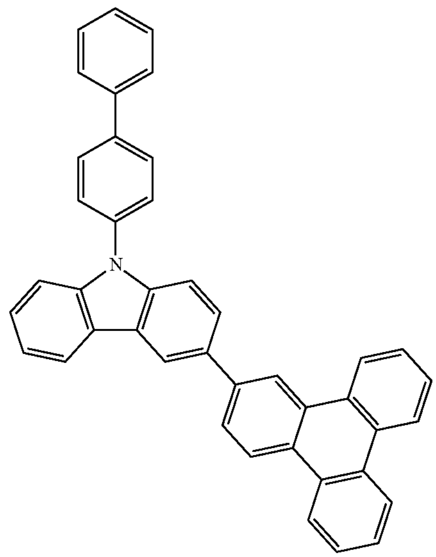
H-H77
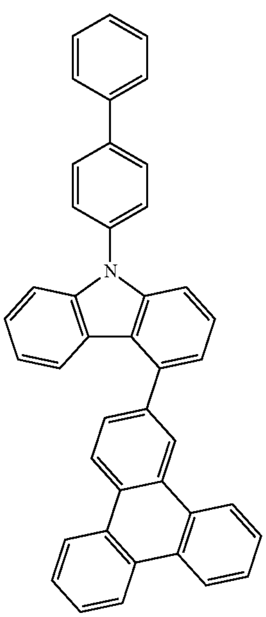

-continued
H-H78
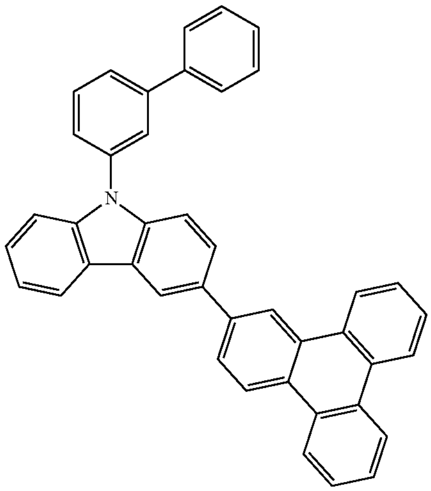
H-H79
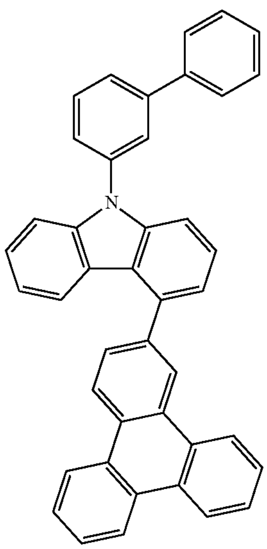
H-H80
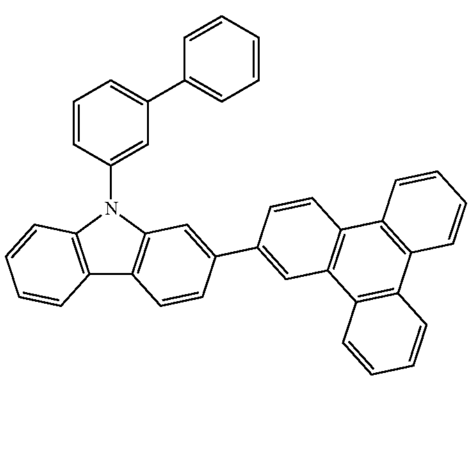
-continued
H-H81
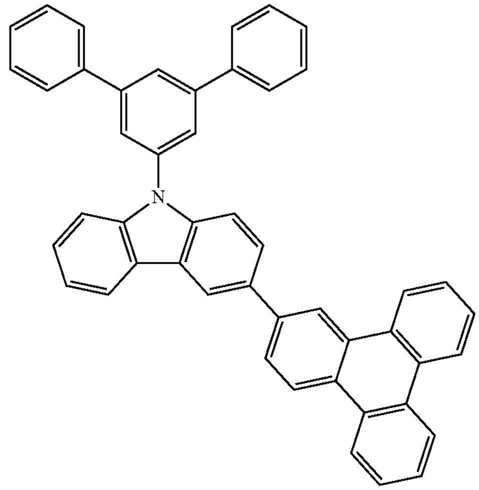
H-H82
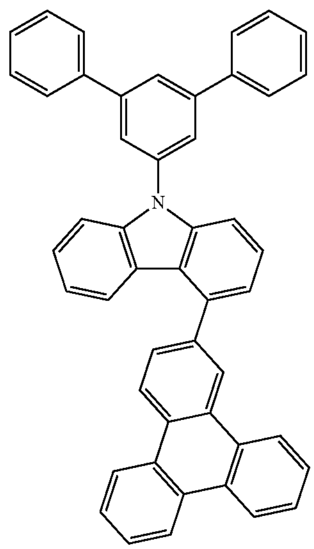
H-H83
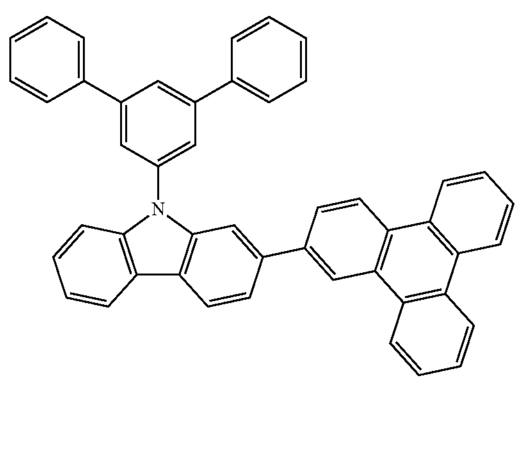

H-H84
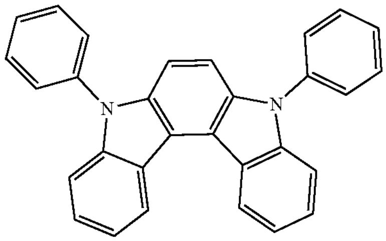
H-H85
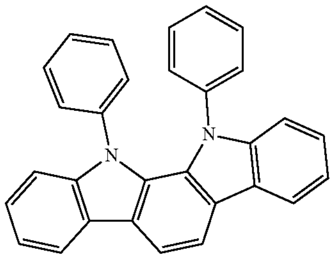
H-H86
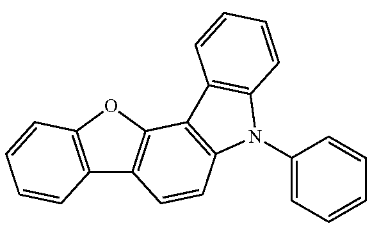
H-H87
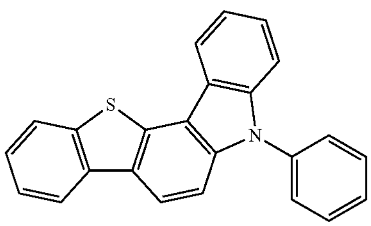
H-H88
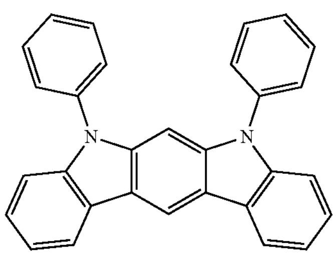
H-H89
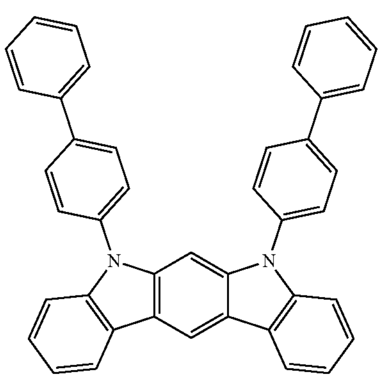
H-H90
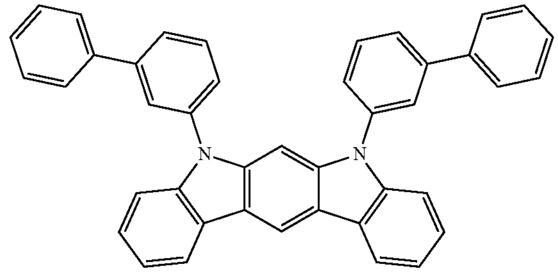
H-H91
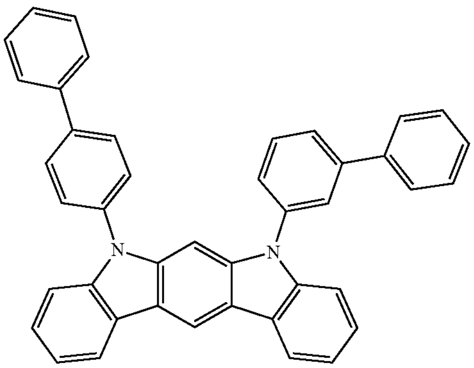
H-H92
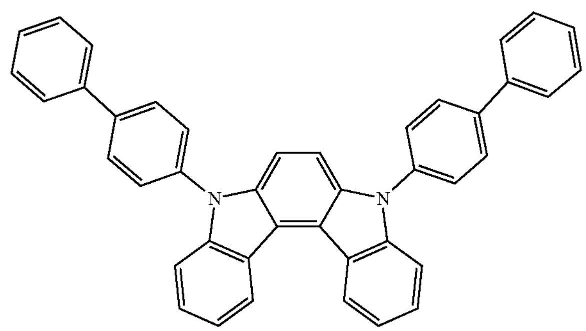
H-H93
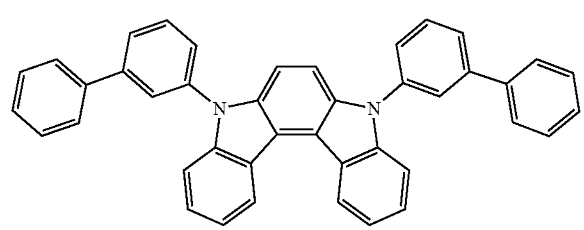

H-H94
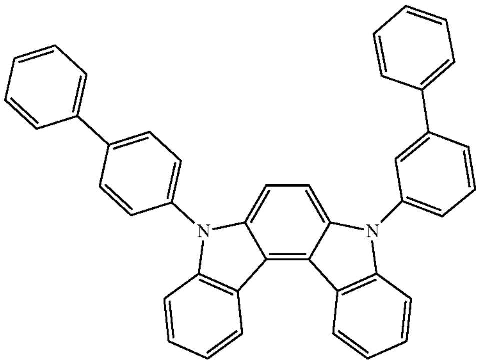
H-H95
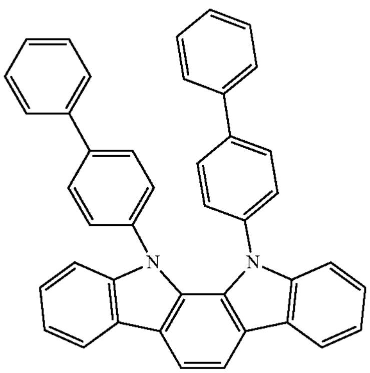
H-H96
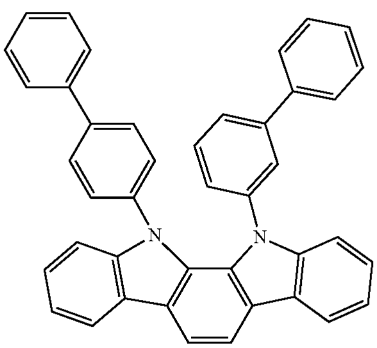
H-H97
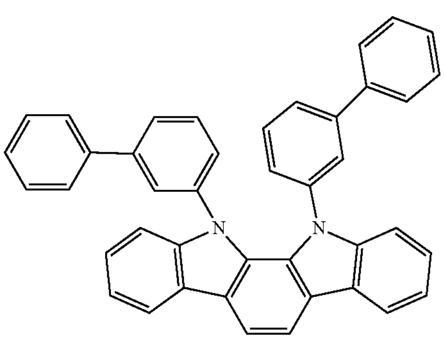
H-H98
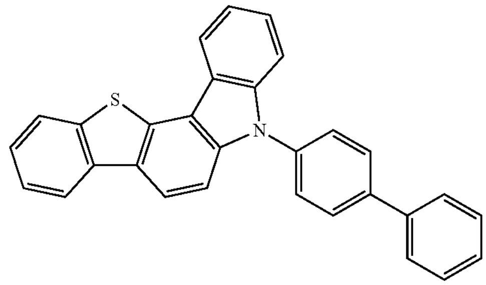
H-H99
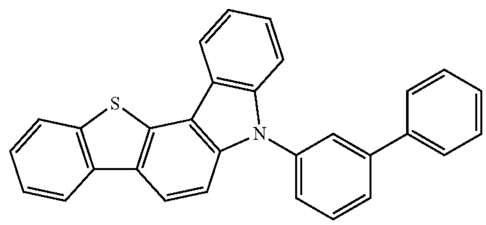
H-H100
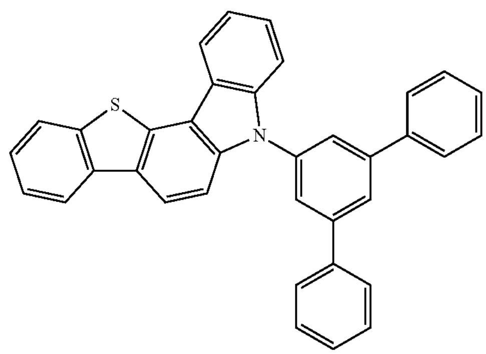
H-H101
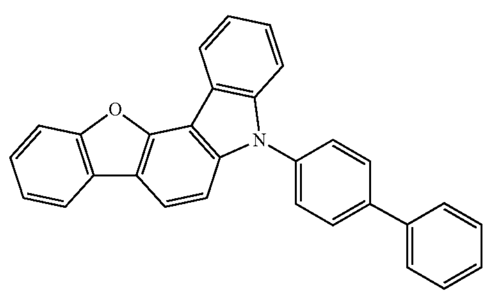
H-H102
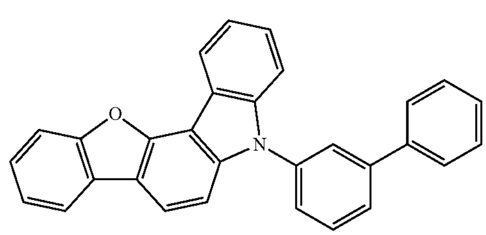

-continued
H-H103
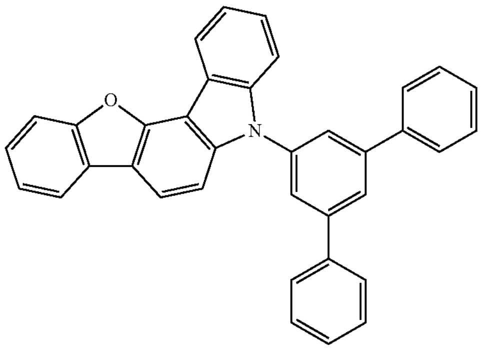
In an embodiment, the bipolar host may be a compound of Group HEH1:
Group HEH1
1
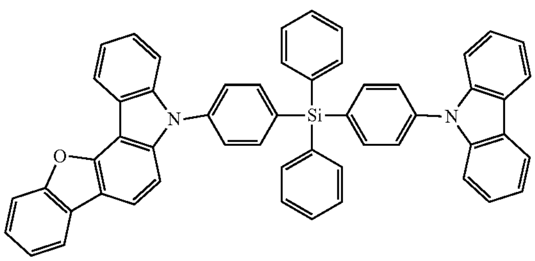
2
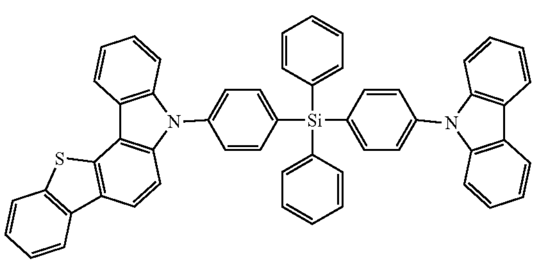
3
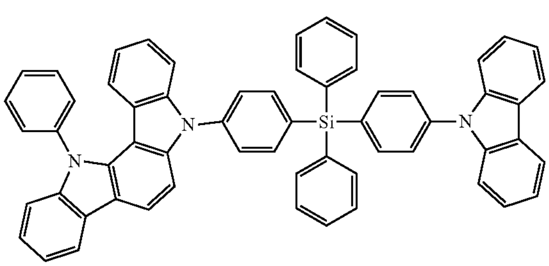
-continued
4
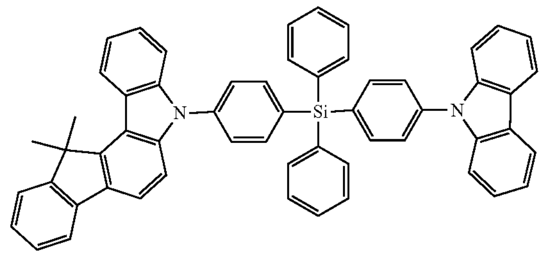
5
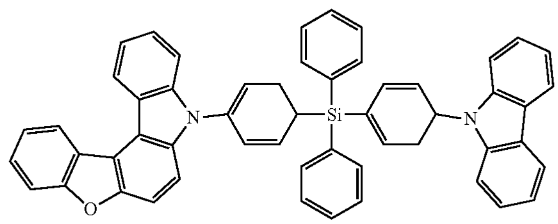
6
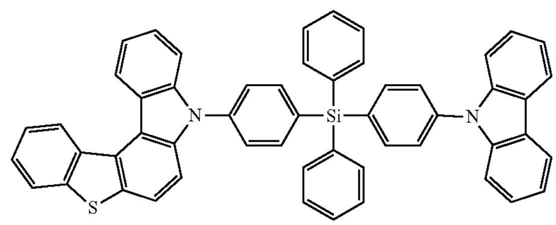
7
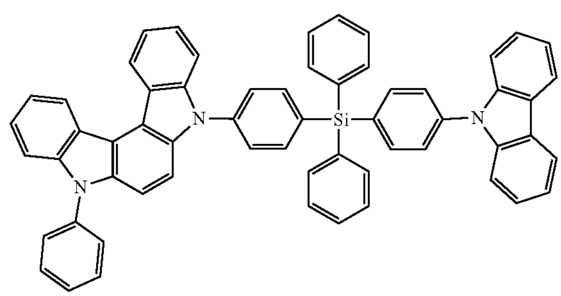
8
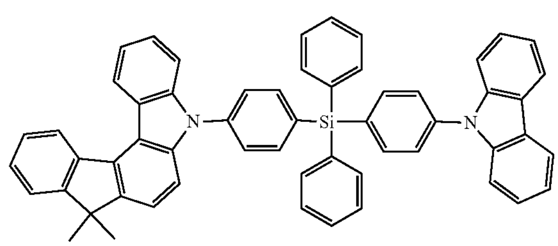

-continued
18
9
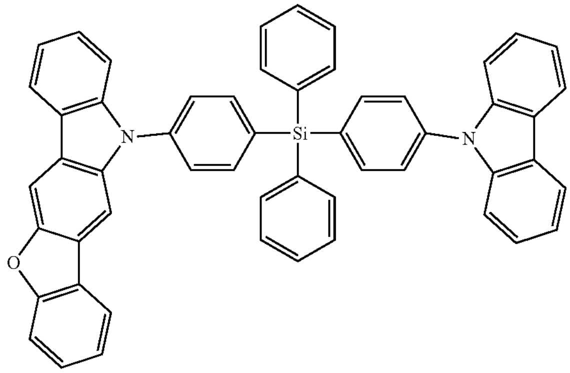
10
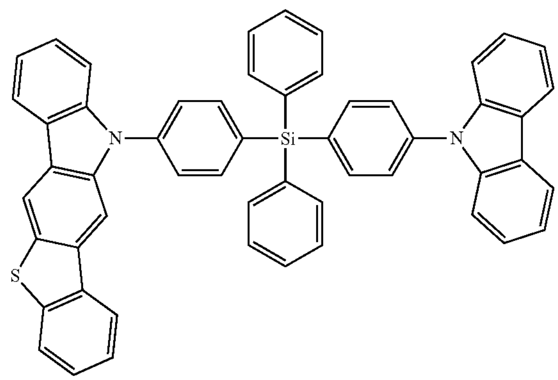
11
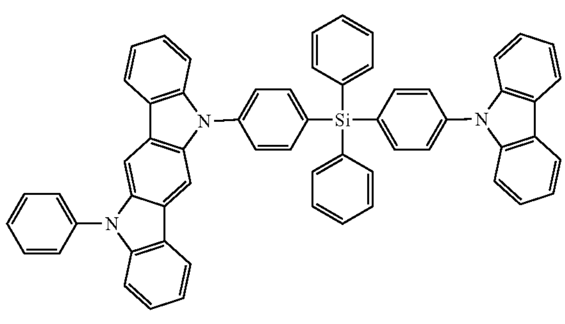
12
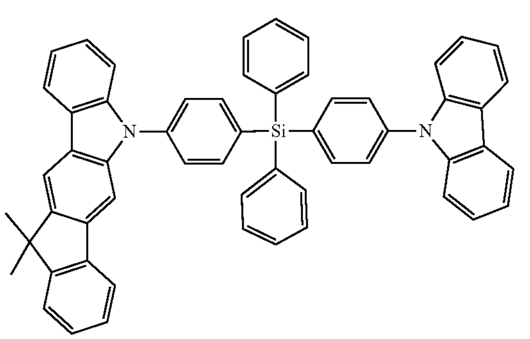
-continued
13
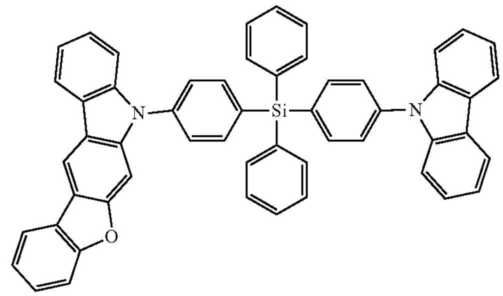
14
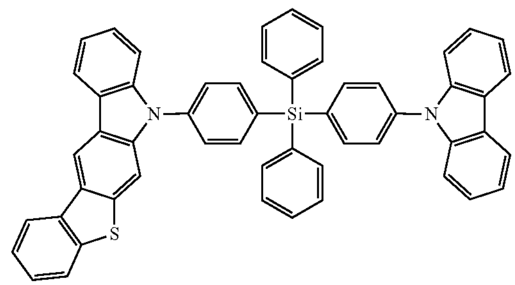
15
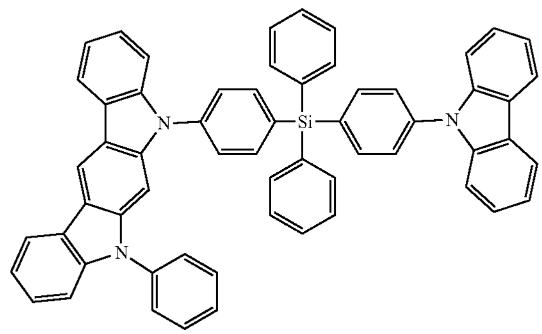
16
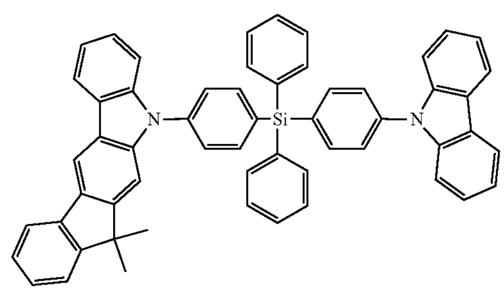
17
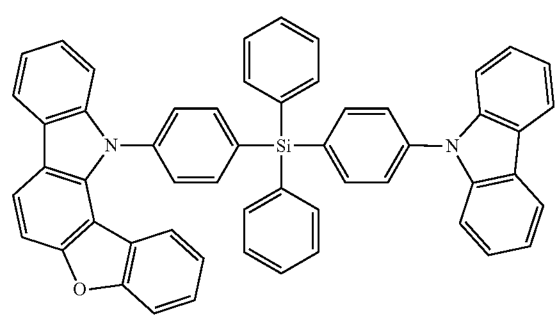

-continued
18
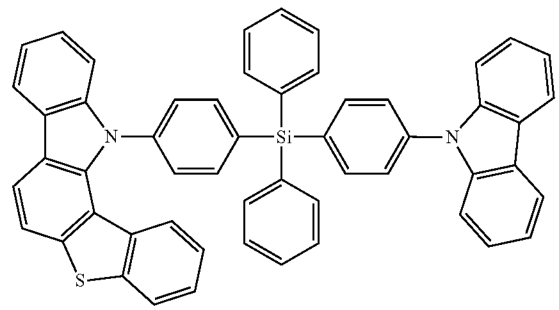
19
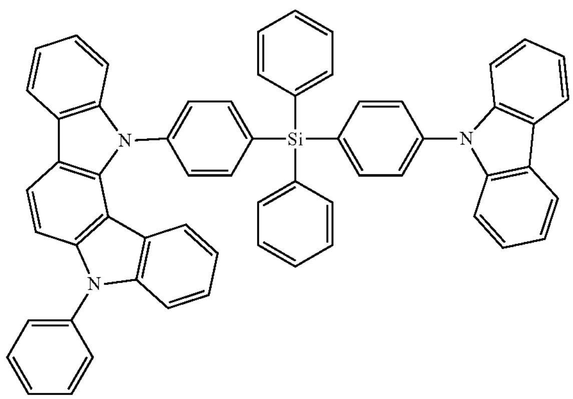
20
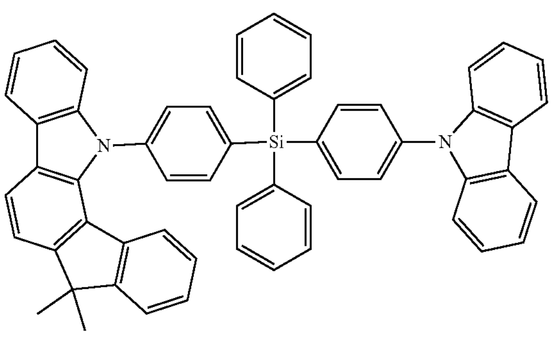
21
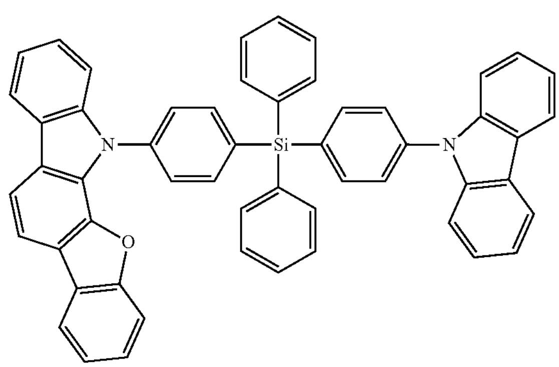
-continued
22
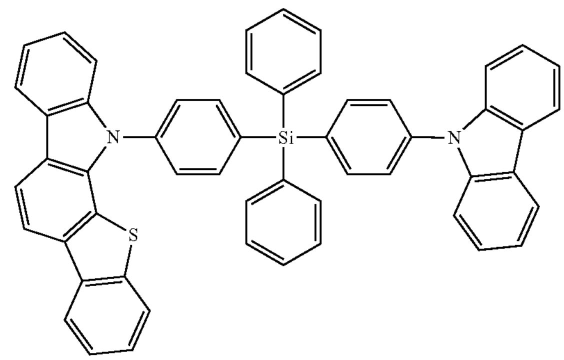
23
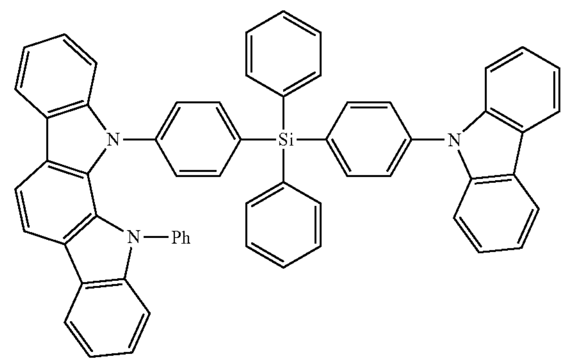
24
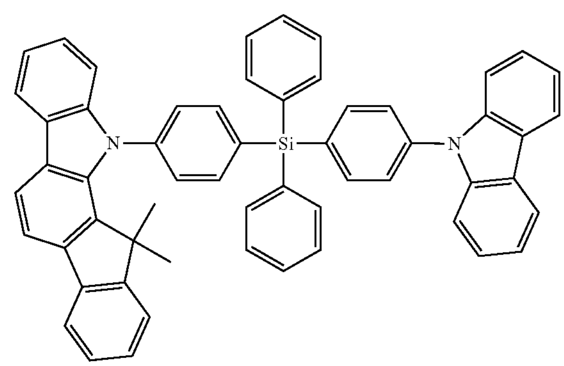
25
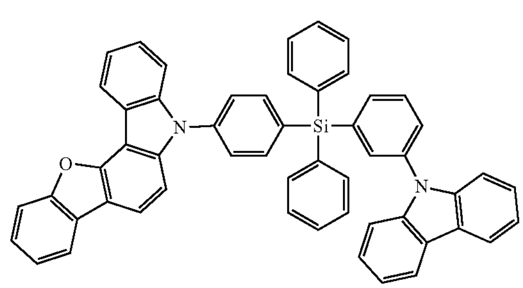

-continued
26
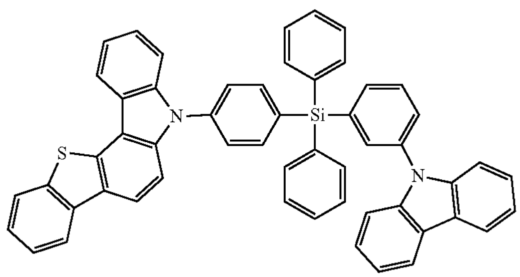
27
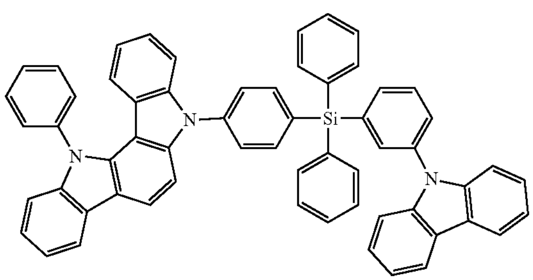
28
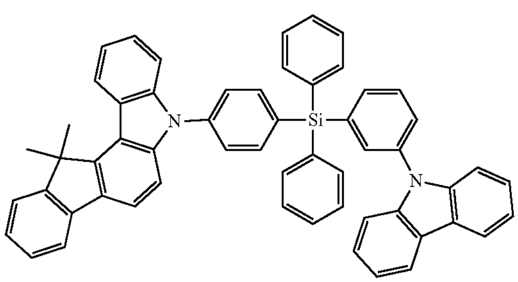
29
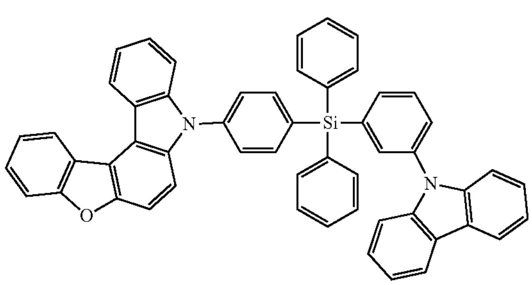
30
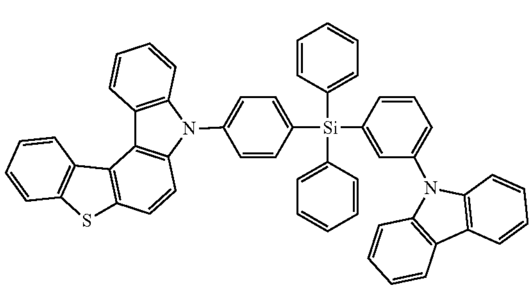
-continued
31
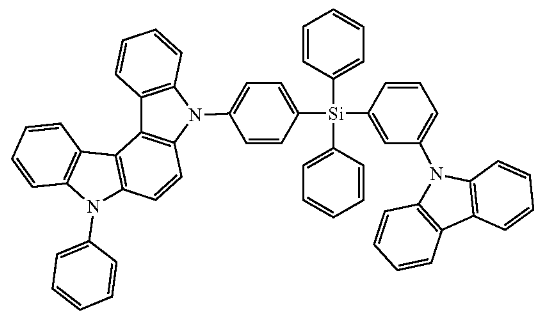
32
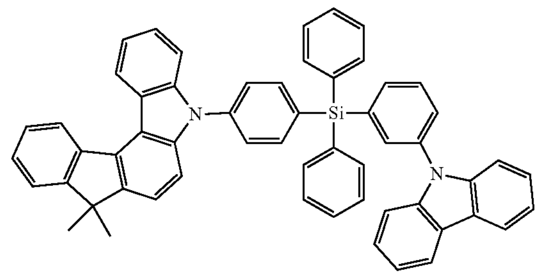
33
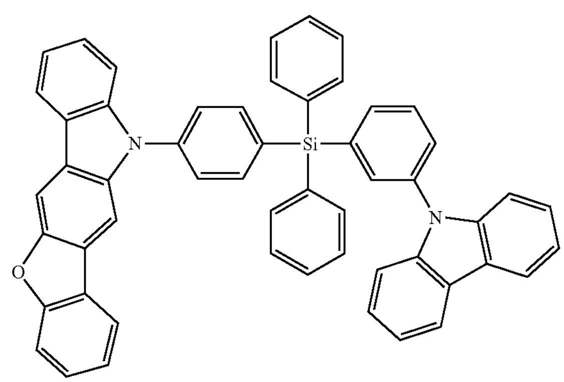
34
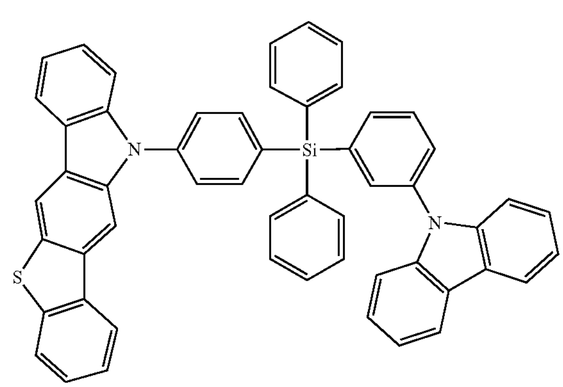

-continued
35
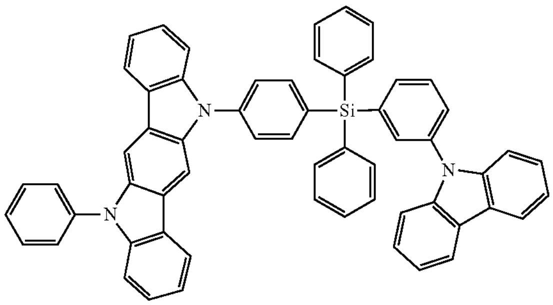
36
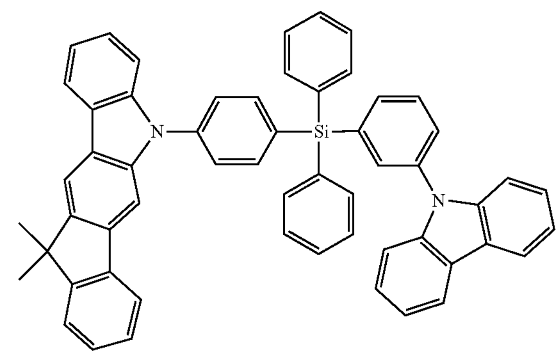
37
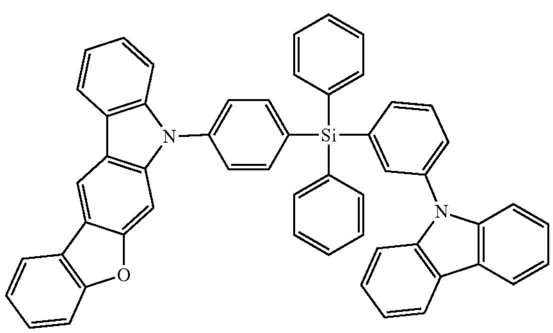
38
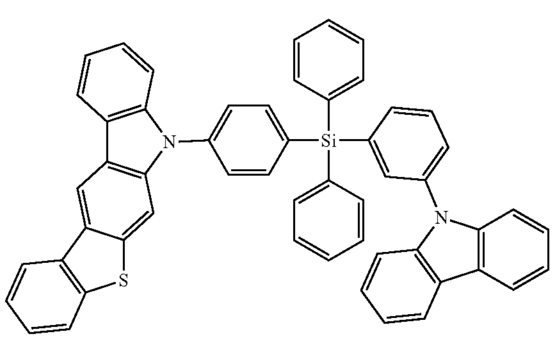
-continued
39
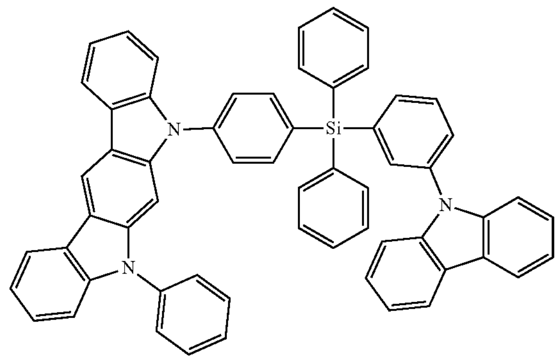
40
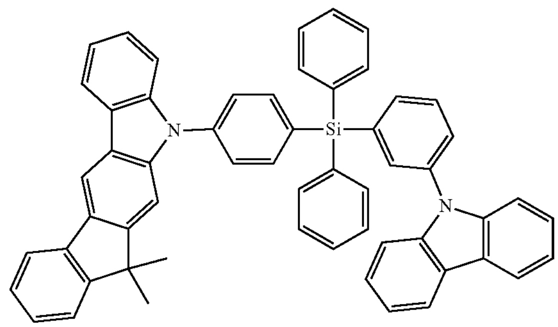
41
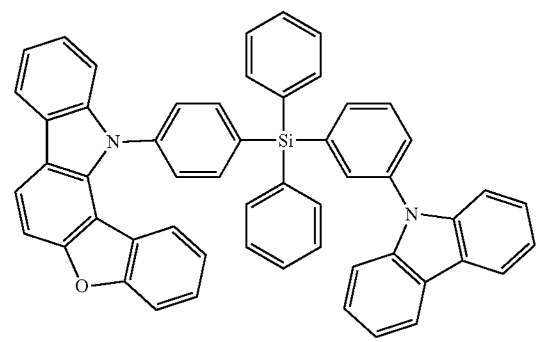
42
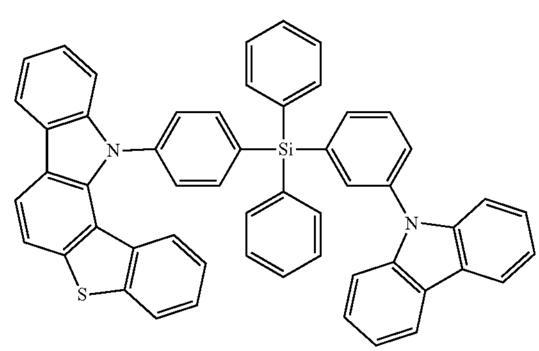

43
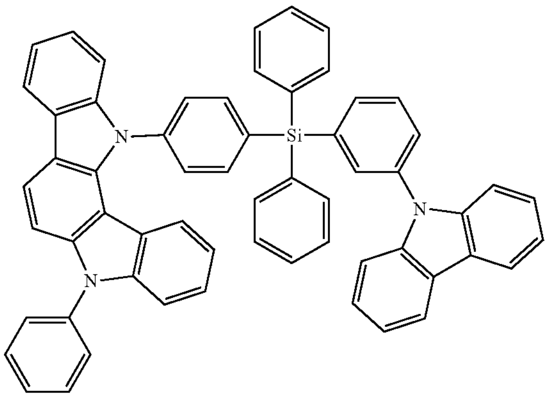
44
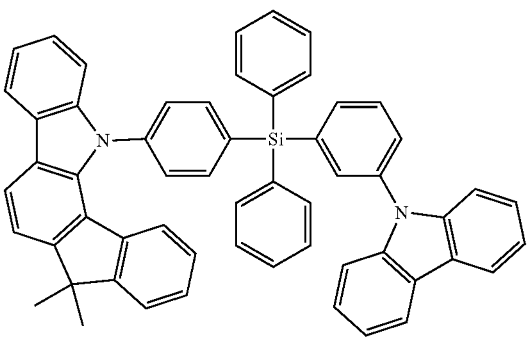
45
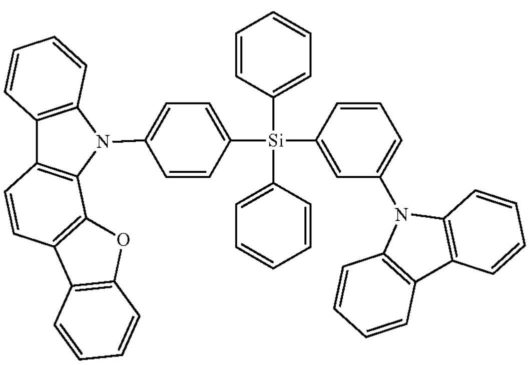
46
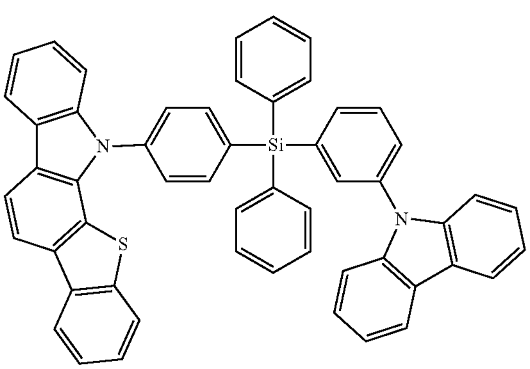
47
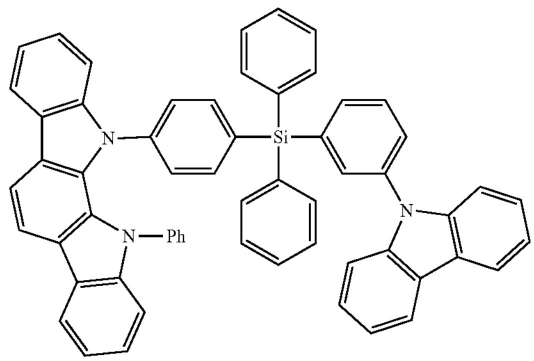
48
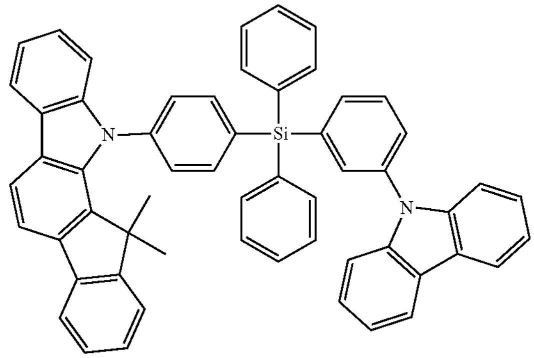
49
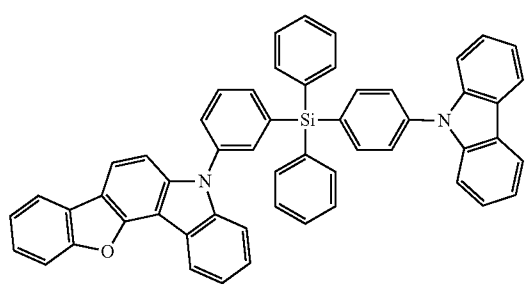
50
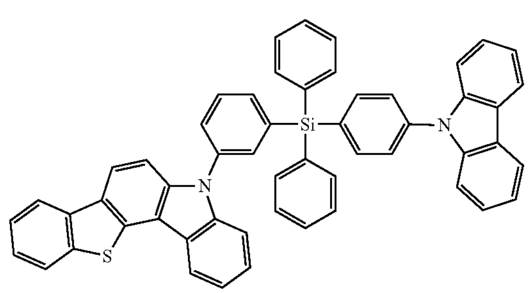

-continued
51
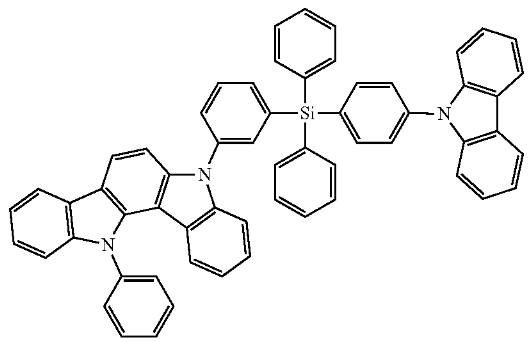
52
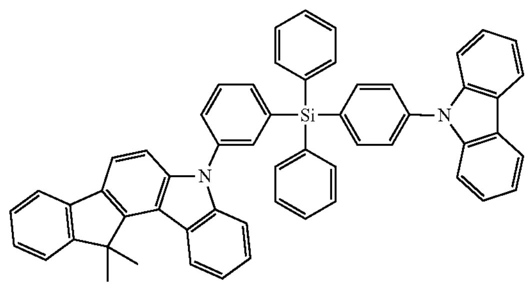
53
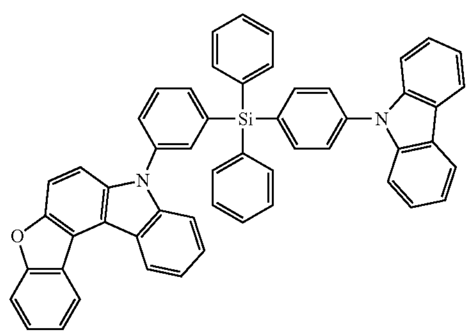
54
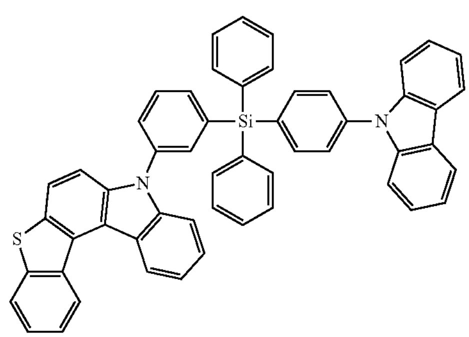
-continued
55
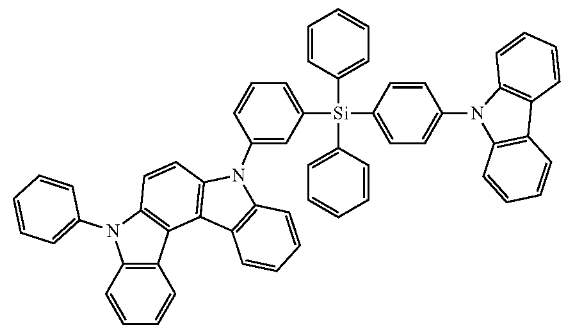
56
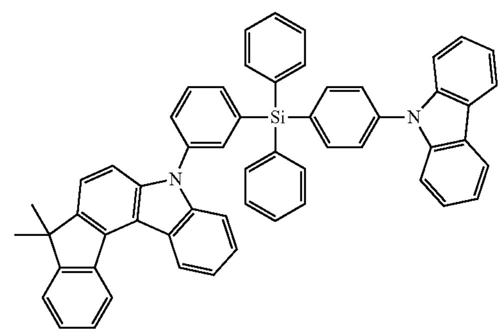
57
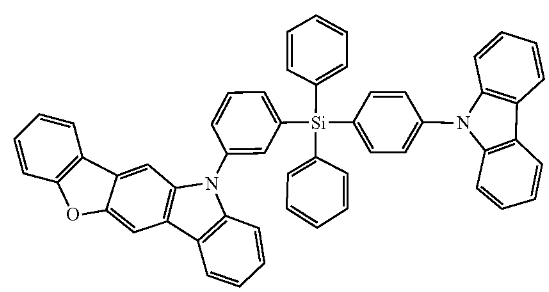
58
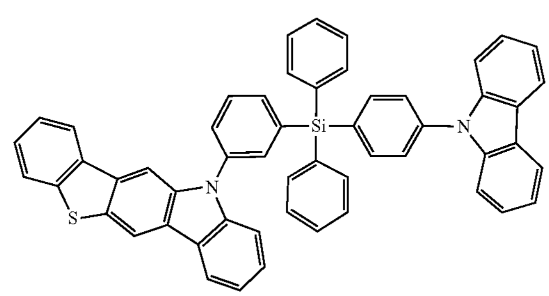
59
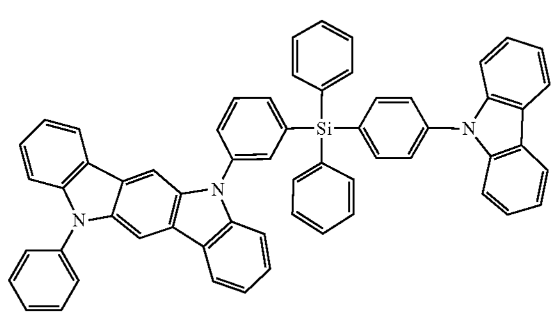

-continued
60
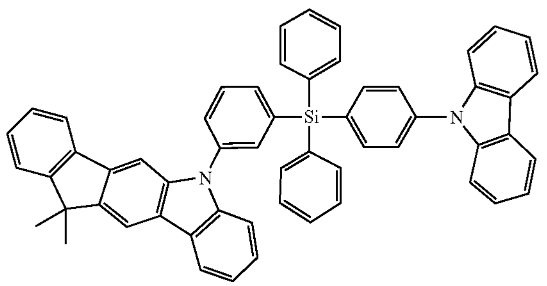
61
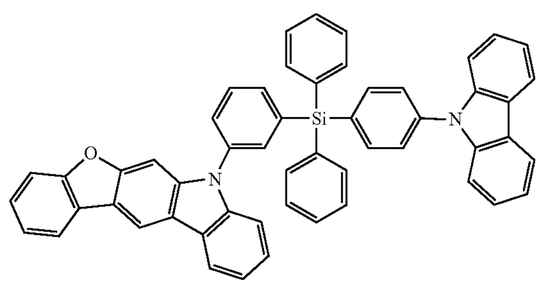
62
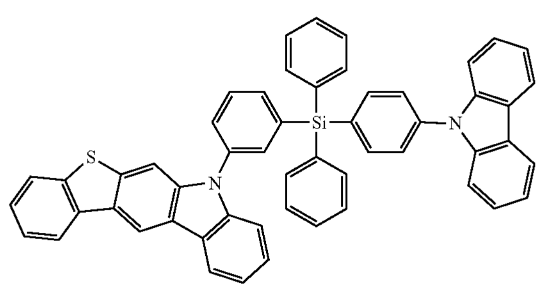
63
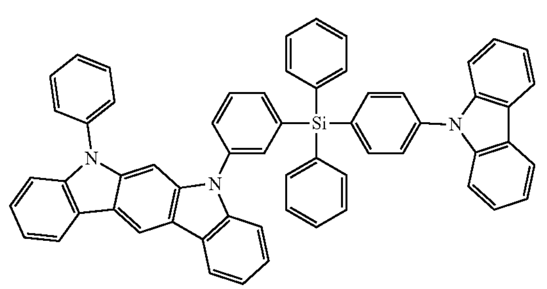
64
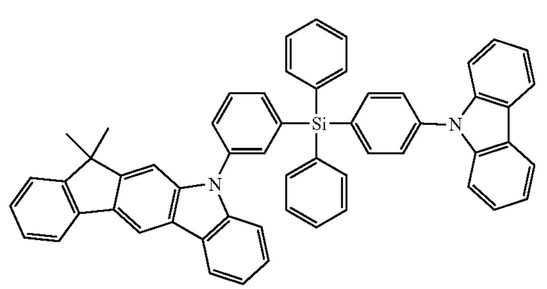
-continued
65
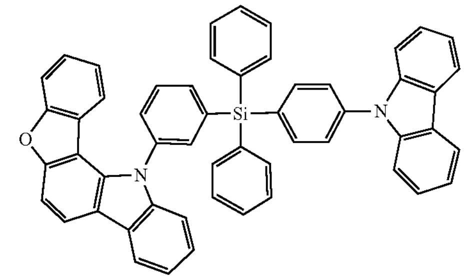
66
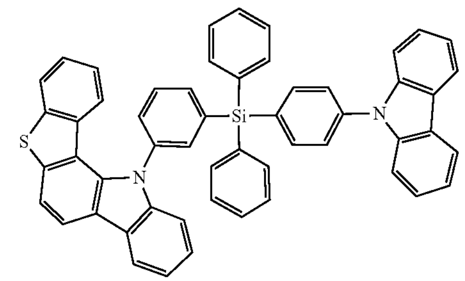
67
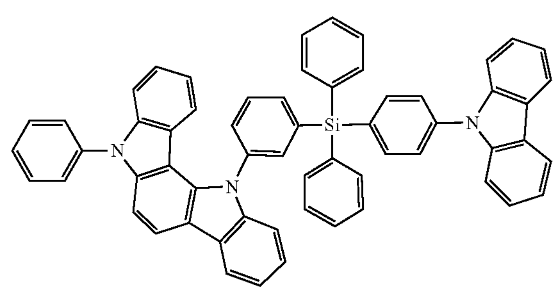
68
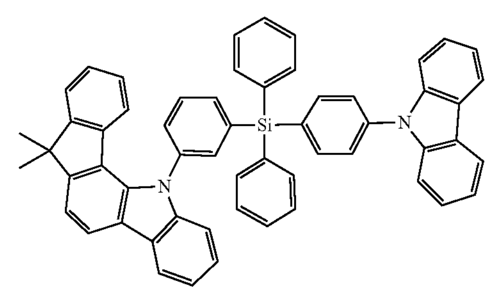
69
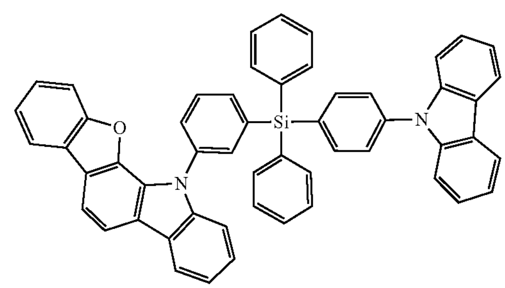

-continued
70
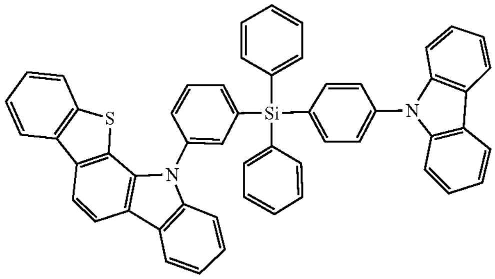
71
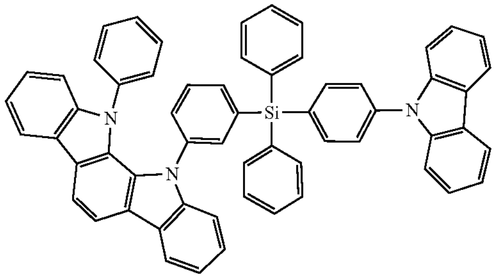
72
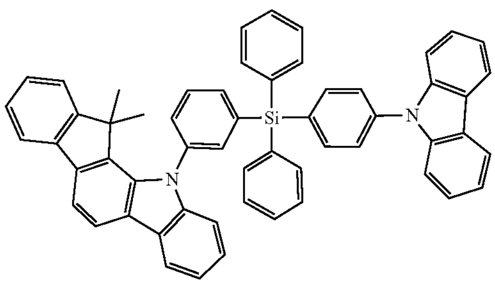
73
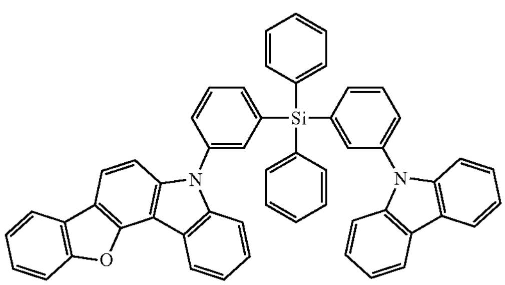
74
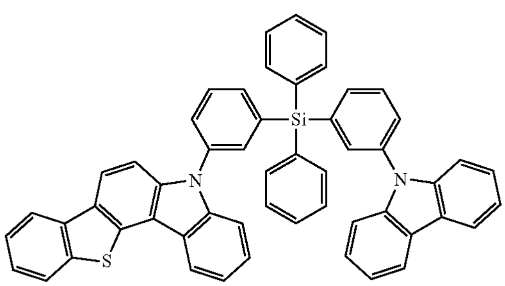
-continued
75
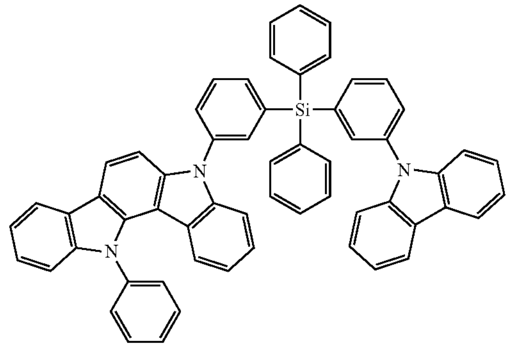
76
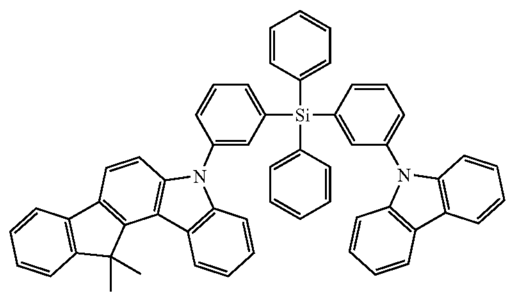
77
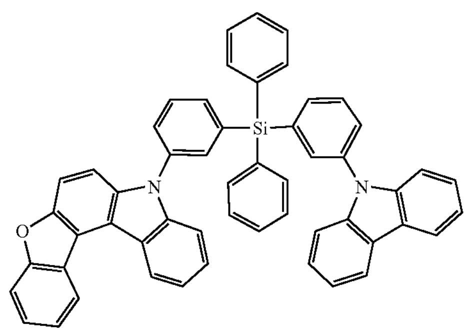
78
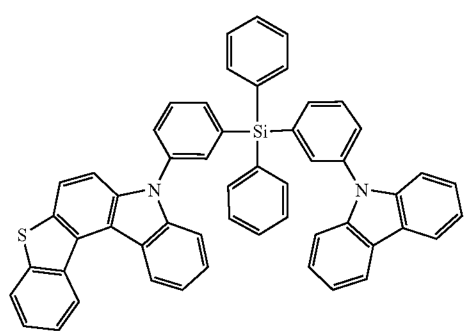

-continued
79
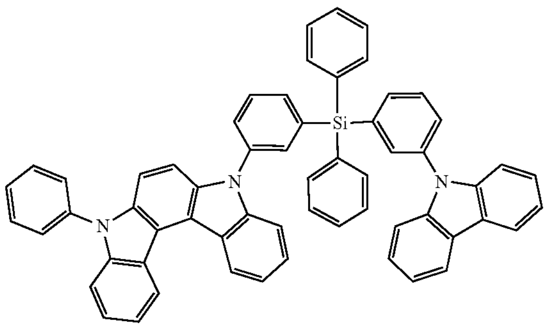
80
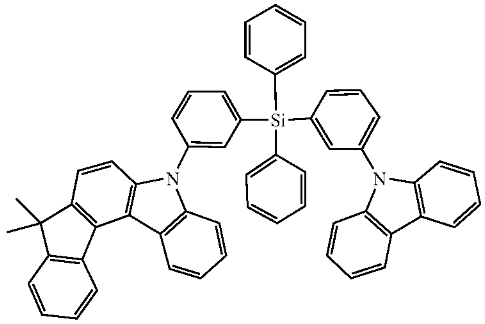
81
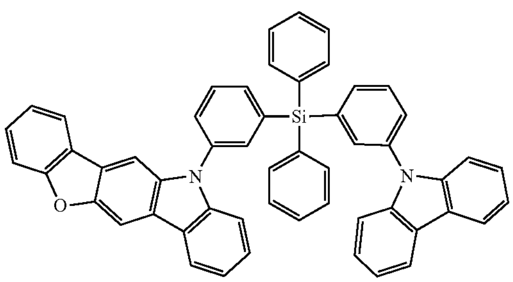
82
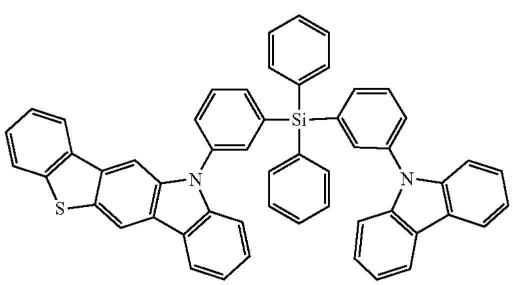
83
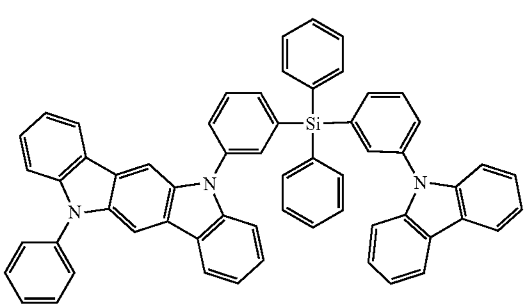
-continued
84
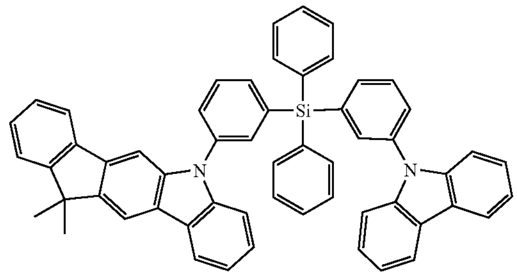
85
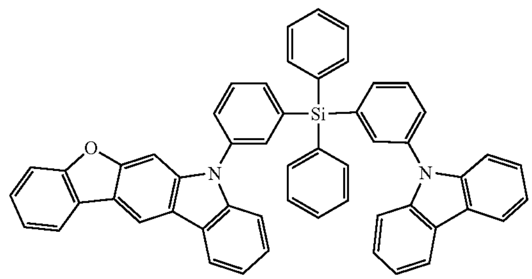
86
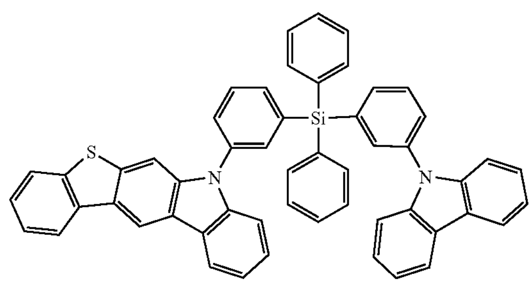
87
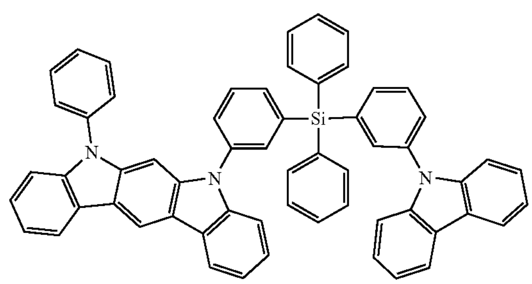
88
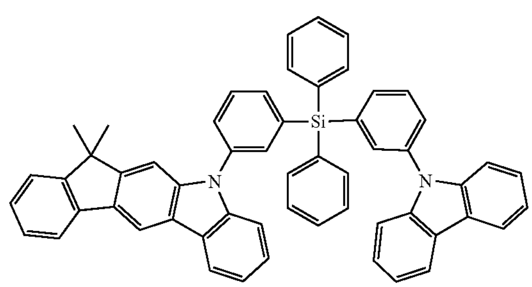

-continued
89
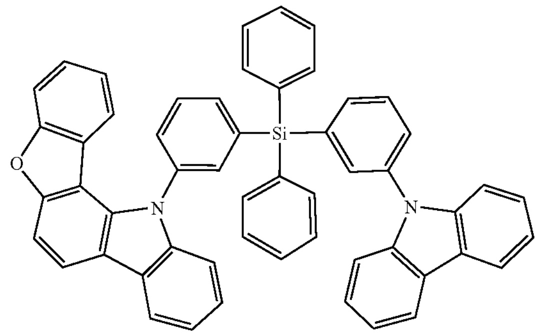
90
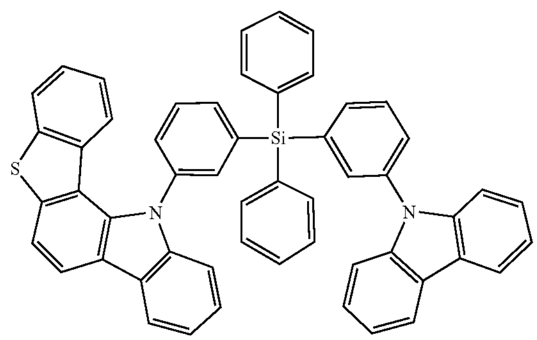
91
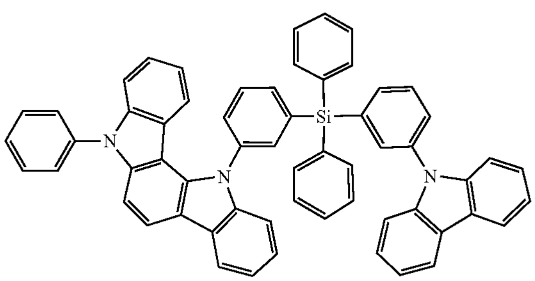
92
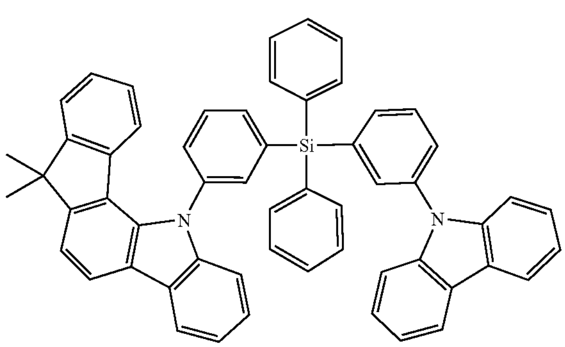
-continued
93
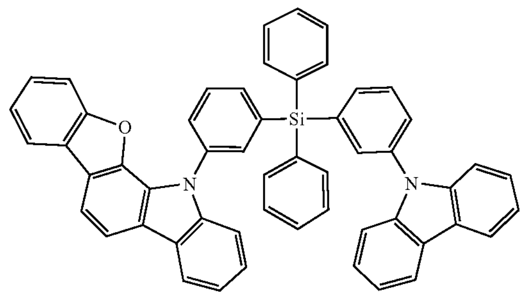
94
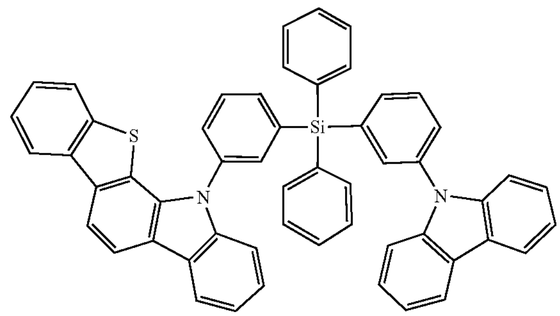
95
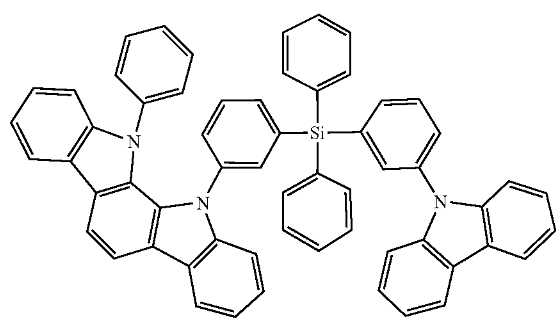
96
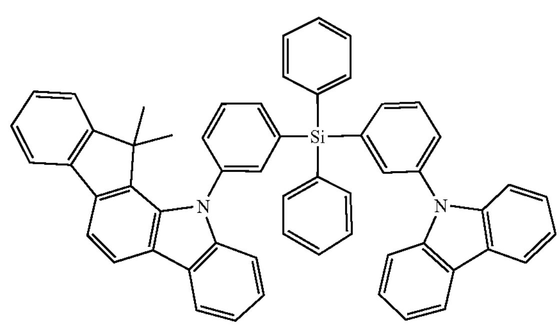
97
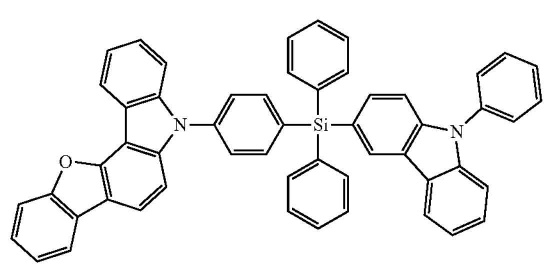

98
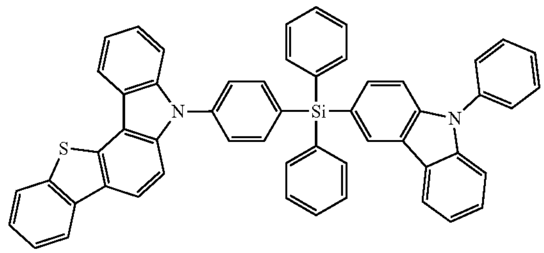
99
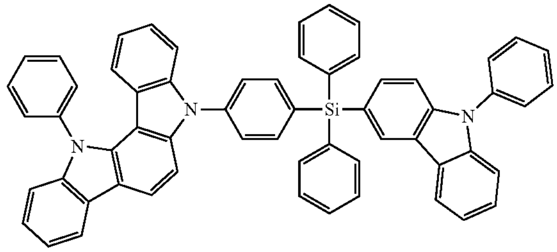
100
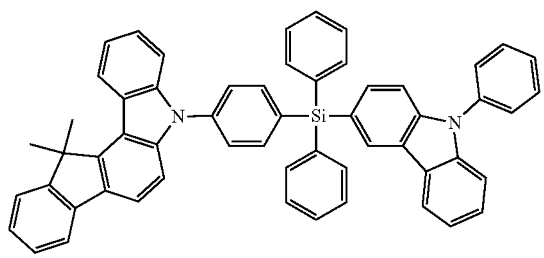
101
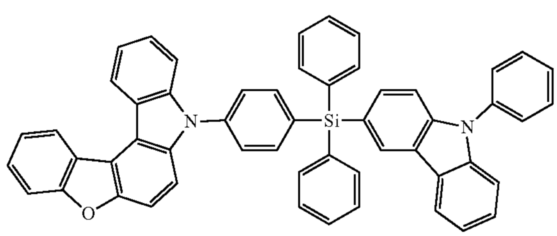
102
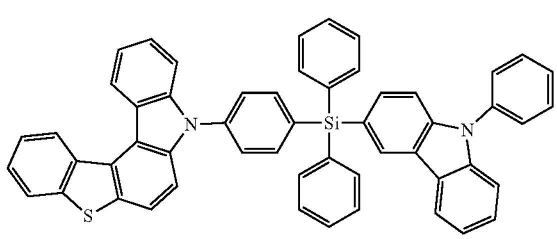
103
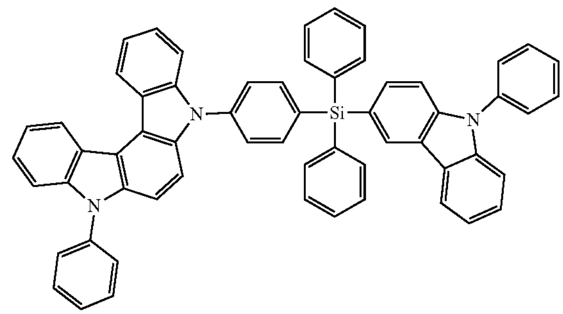
104
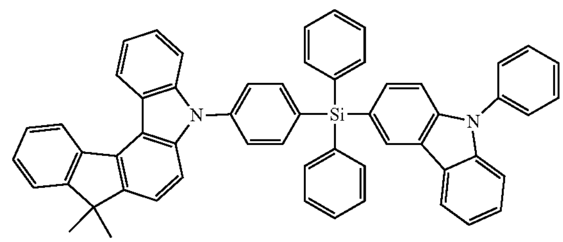
105
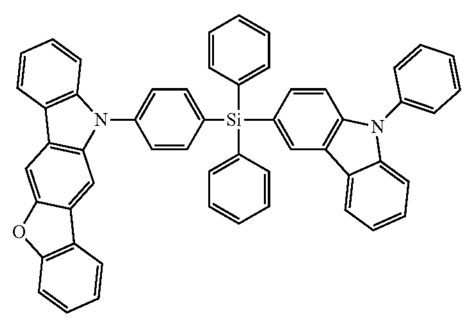
106
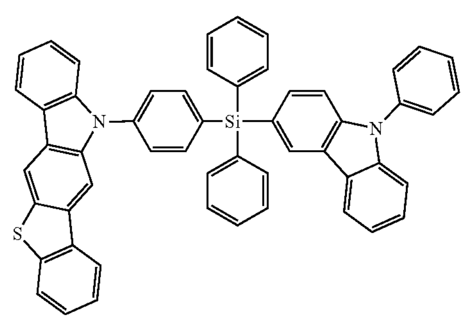
107
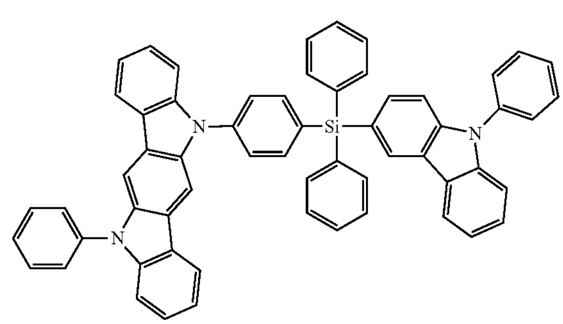

-continued
108
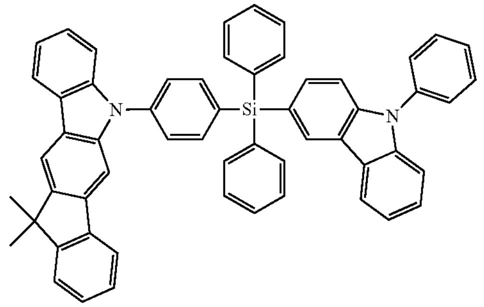
109
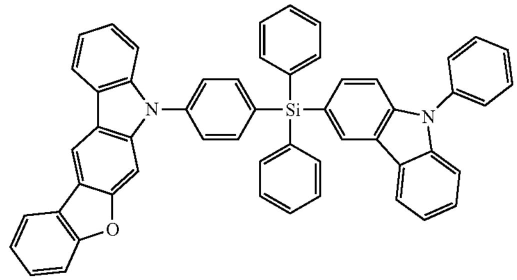
110
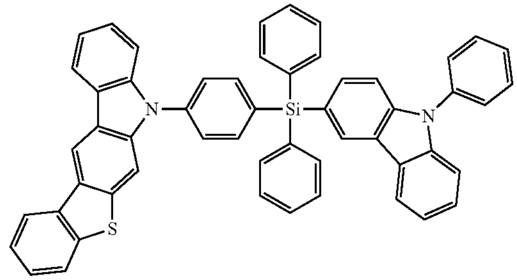
111
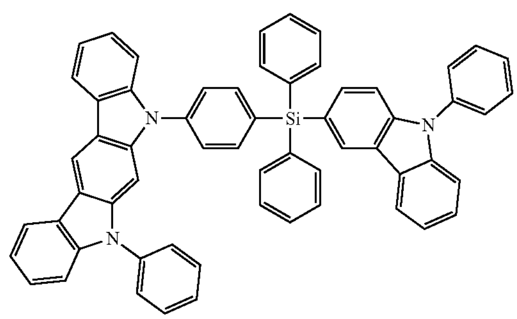
112
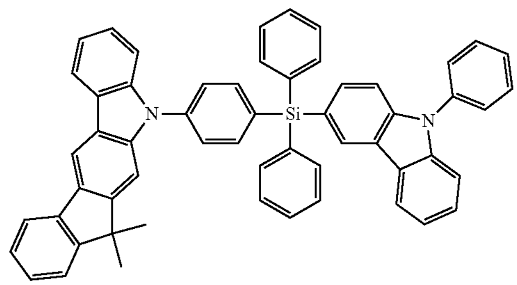
-continued
113
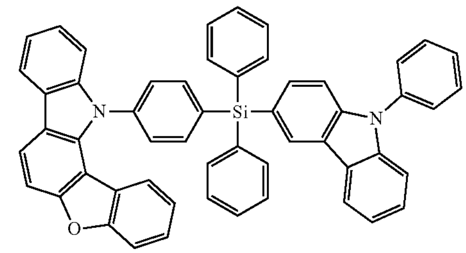
114
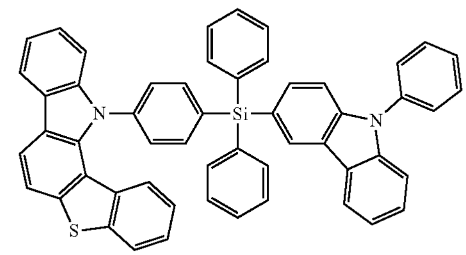
115
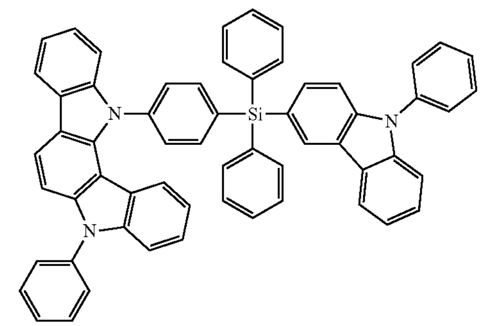
116
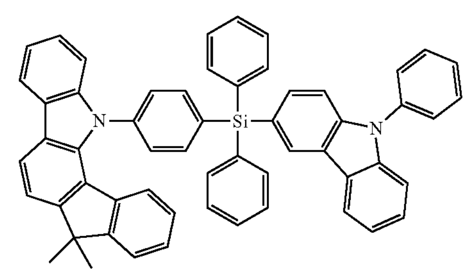
117
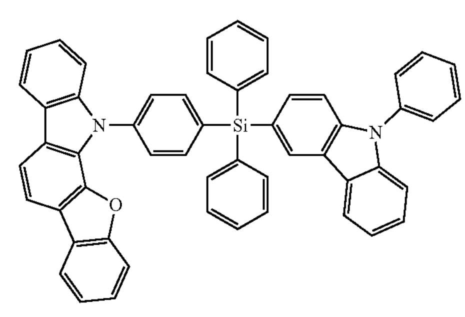

-continued
118
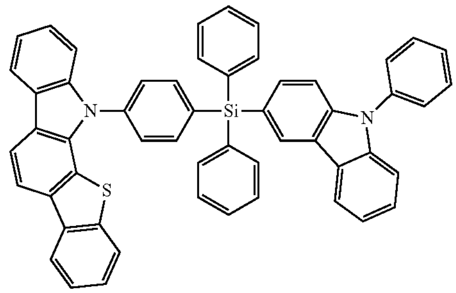
119
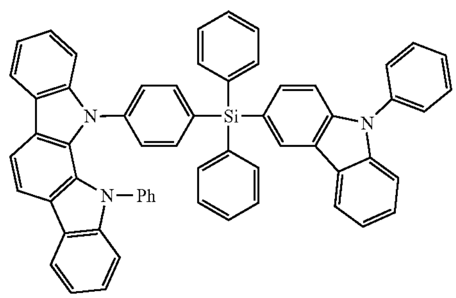
120
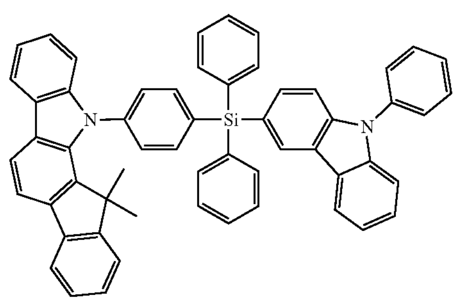
121
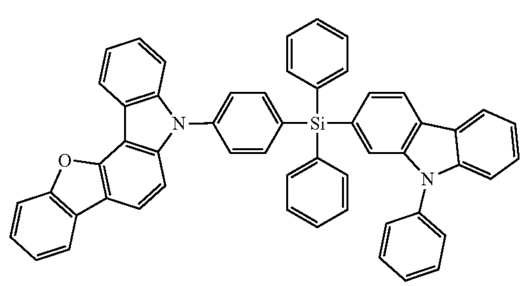
122
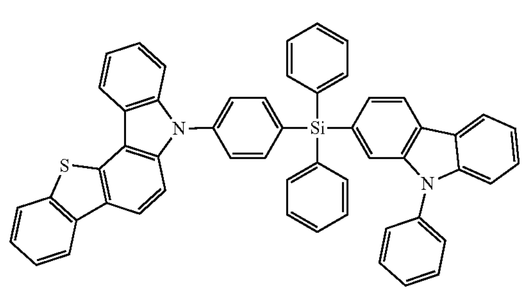
-continued
123
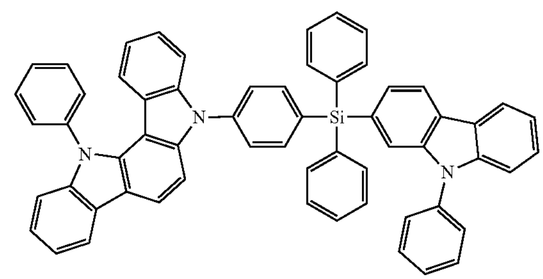
124
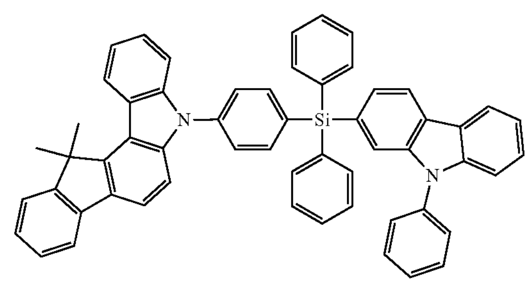
125
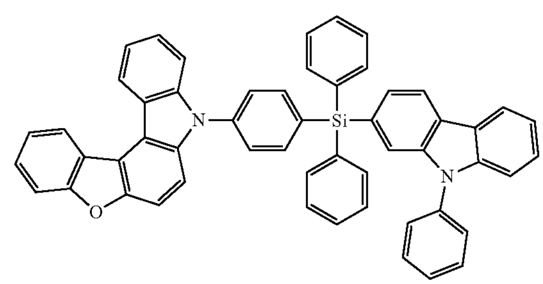
126
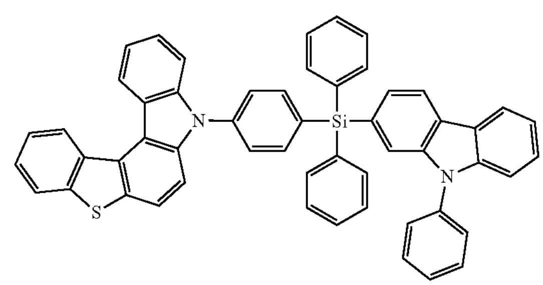
127
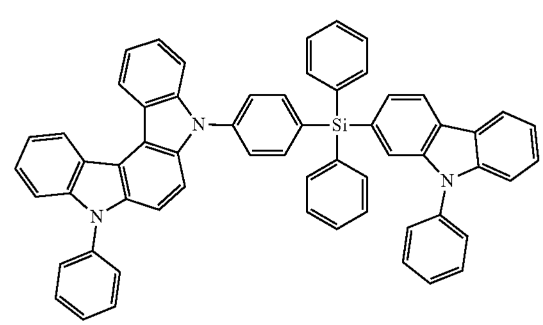

-continued
128
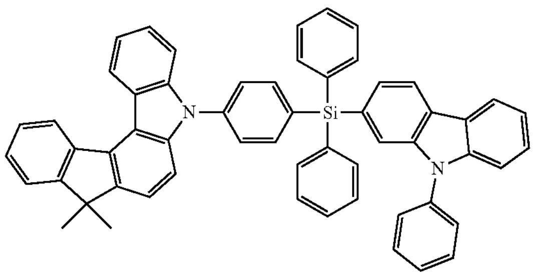
129
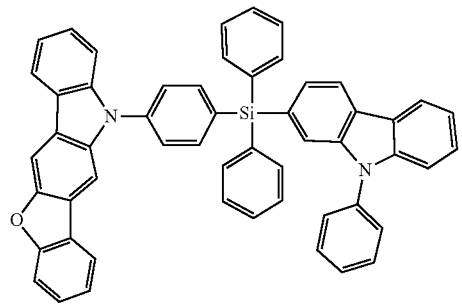
130
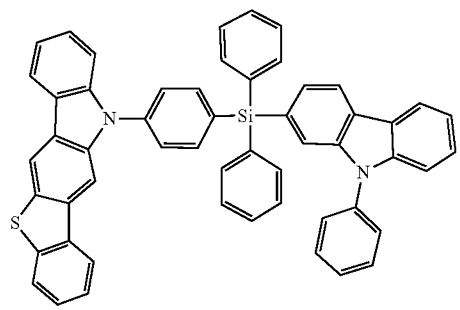
131
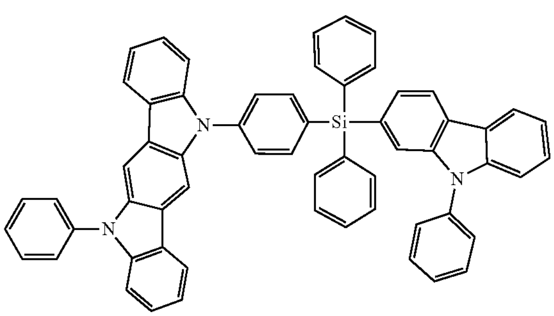
132
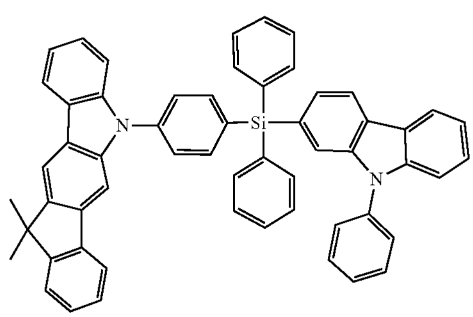
-continued
133
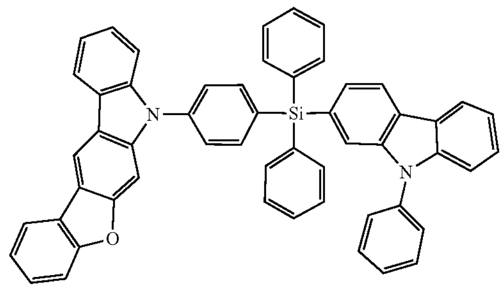
134
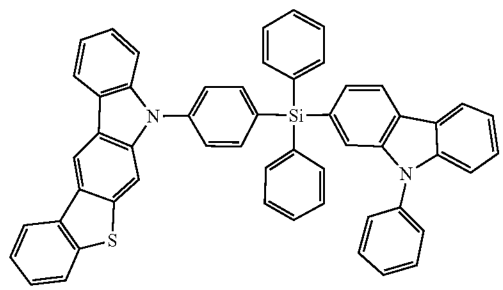
135
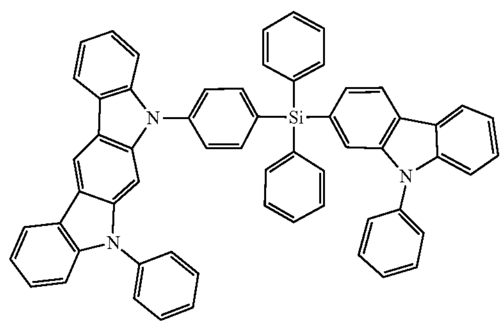
136
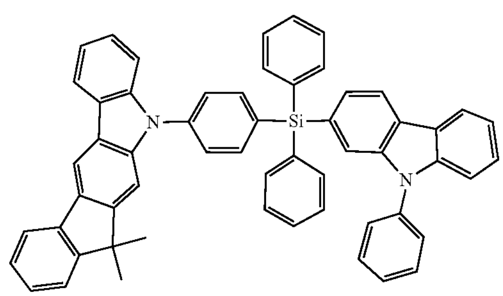
137
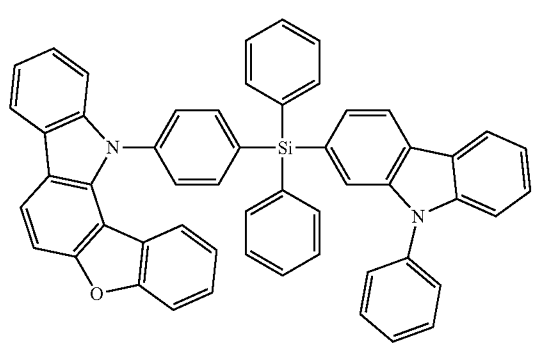

-continued
138
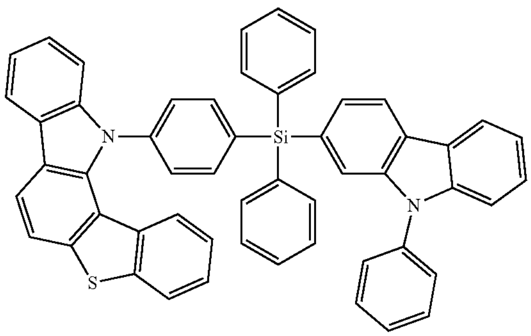
139
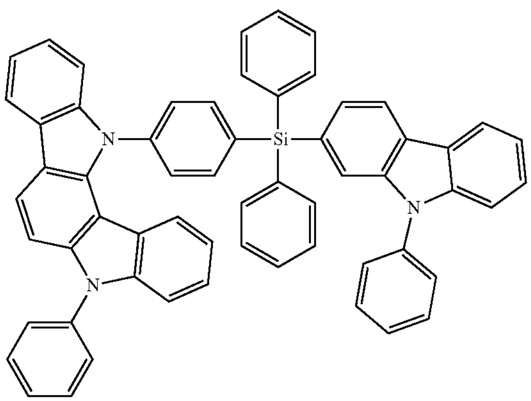
140
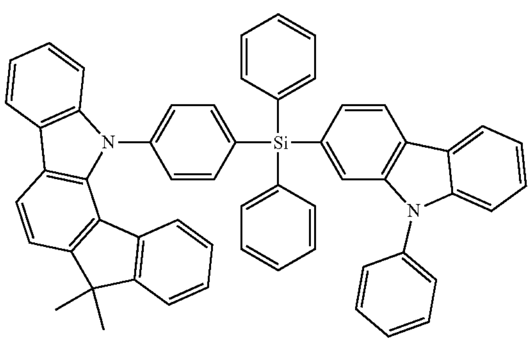
141
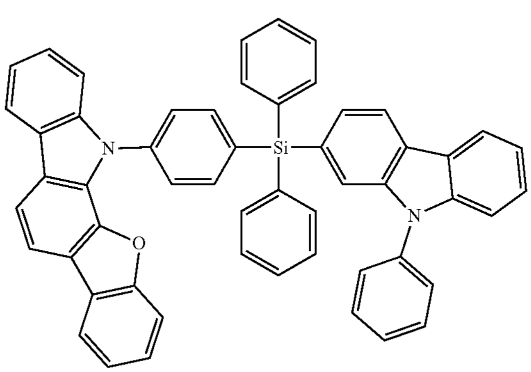
-continued
142
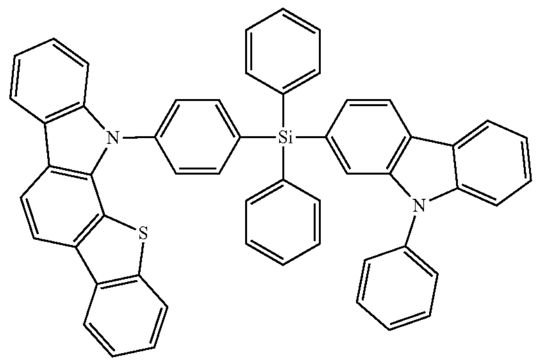
143
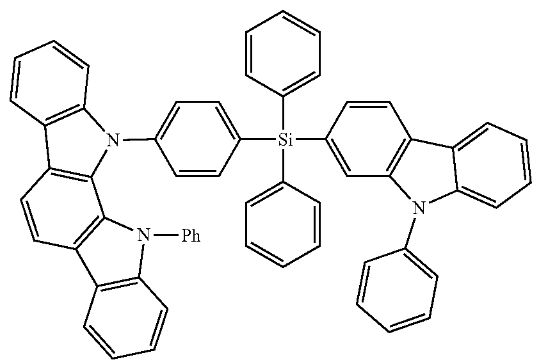
144
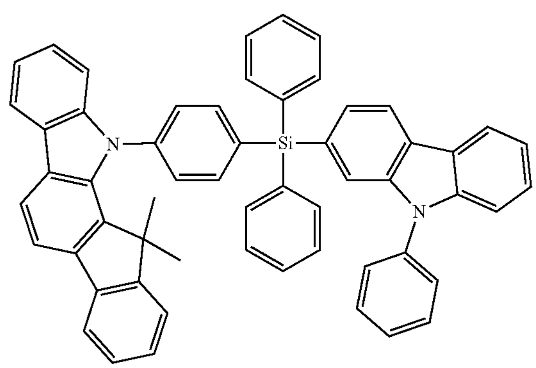
145
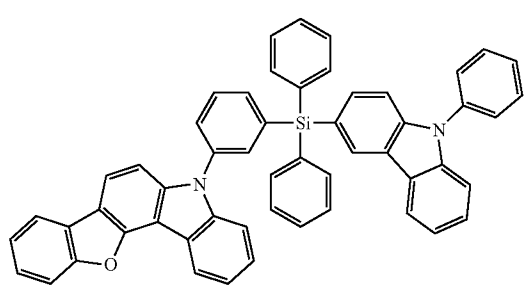

-continued
146
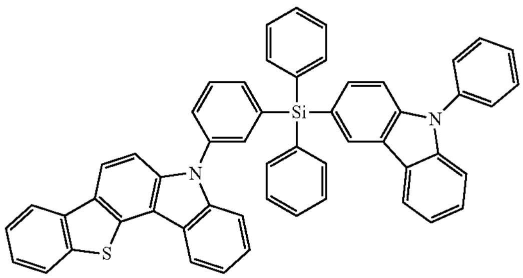
147
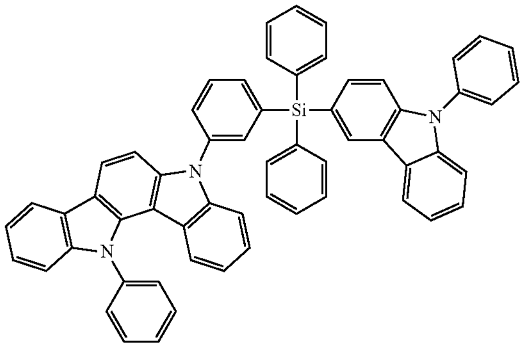
148
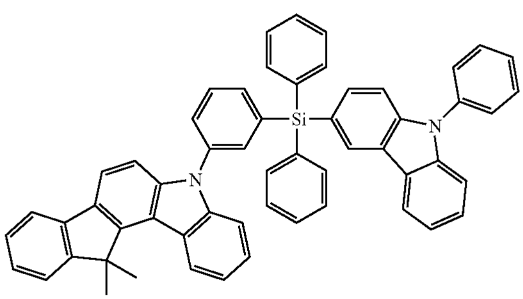
149
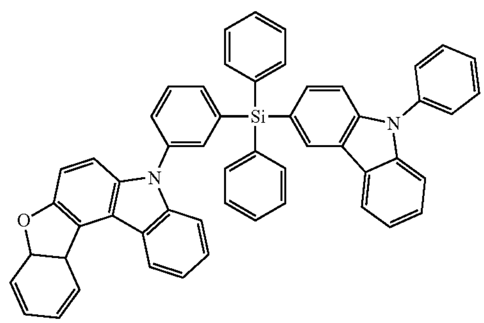
150
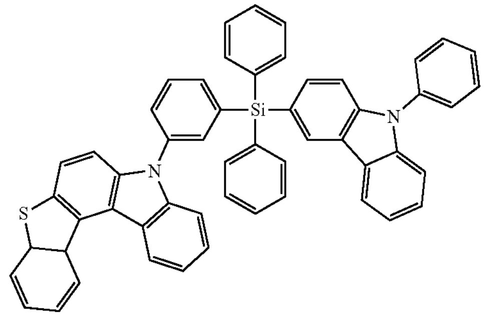
-continued
151
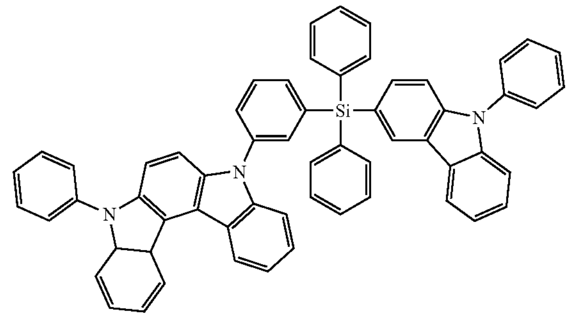
152
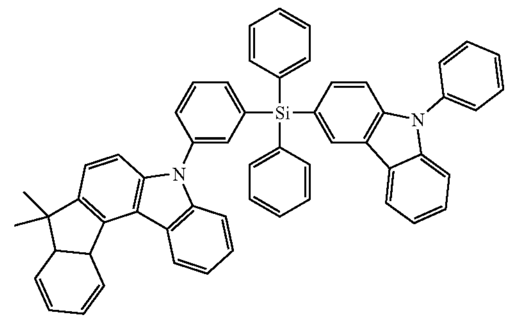
153
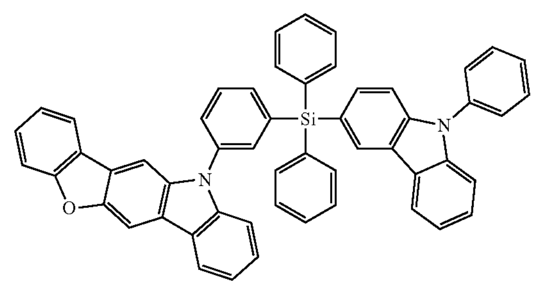
154
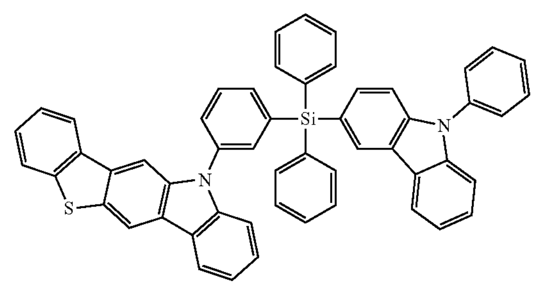
155
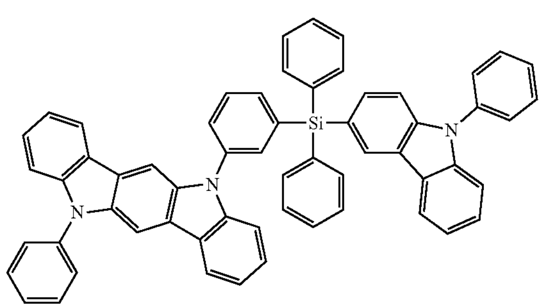

-continued
156
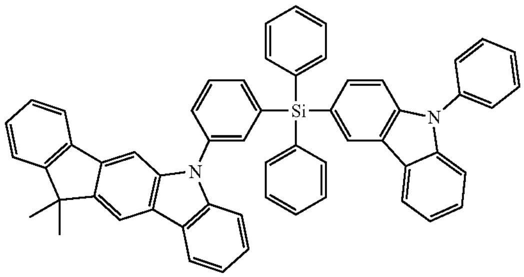
157
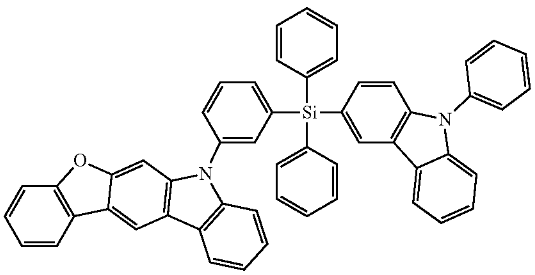
158
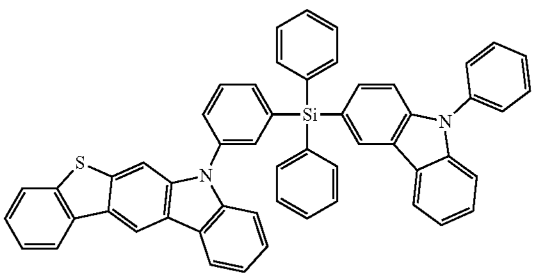
159
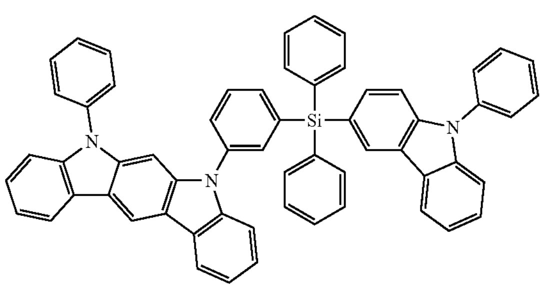
160
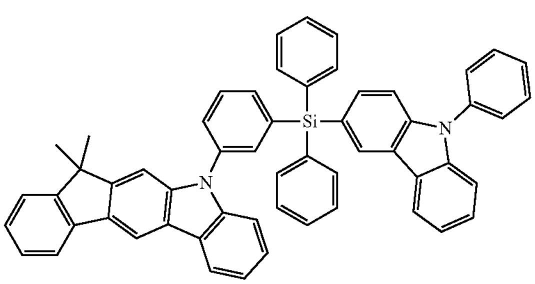
-continued
161
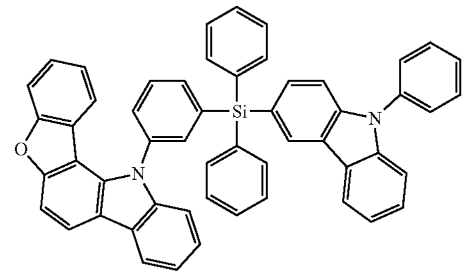
162
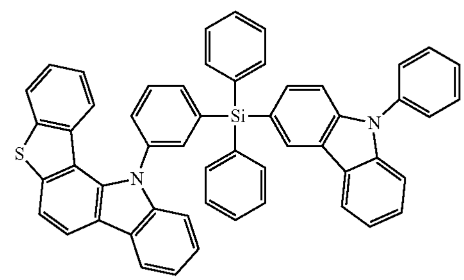
163
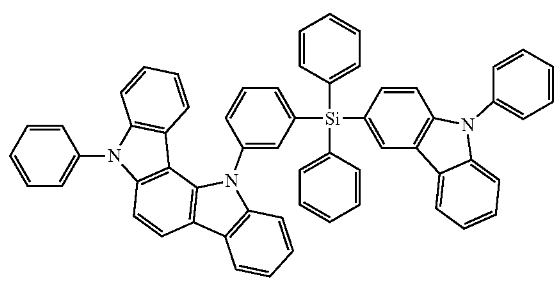
164
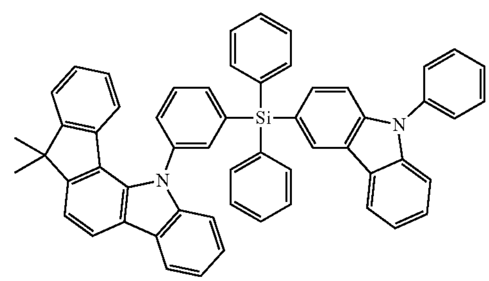
165
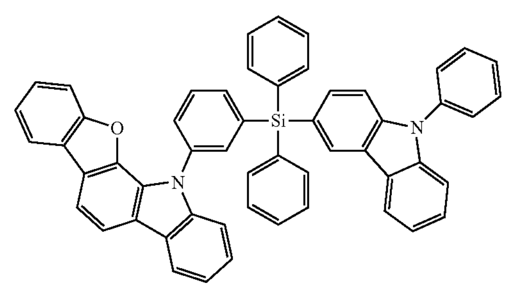

-continued
166
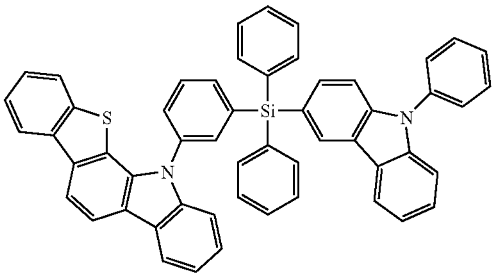
167
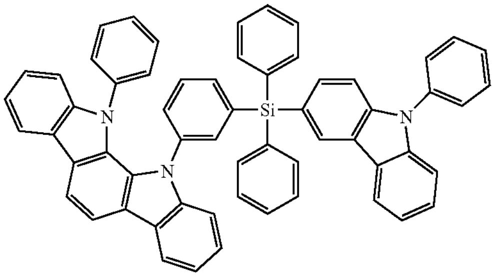
168
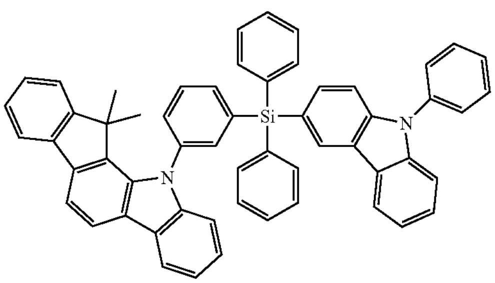
169
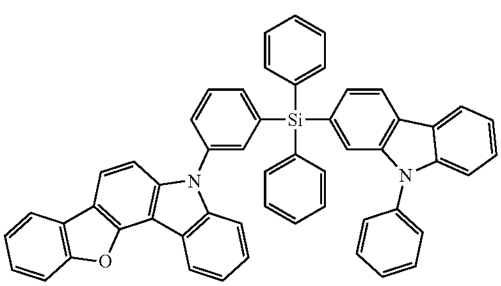
170
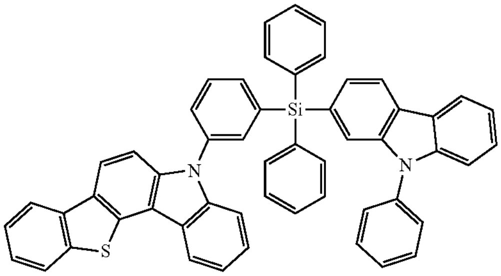
-continued
171
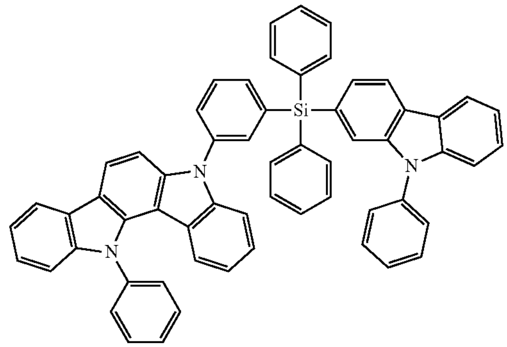
172
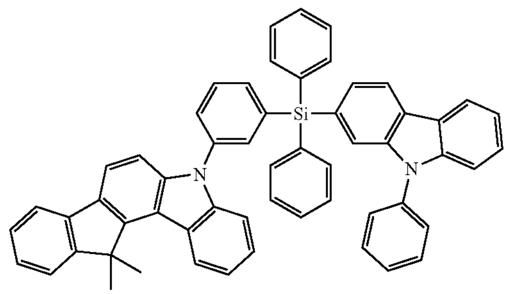
173
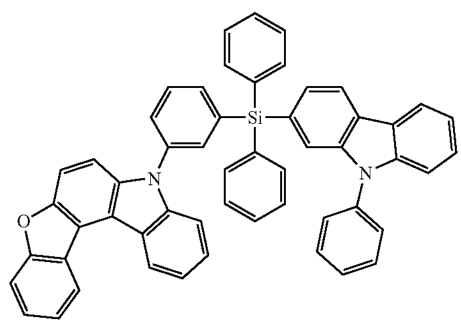
174
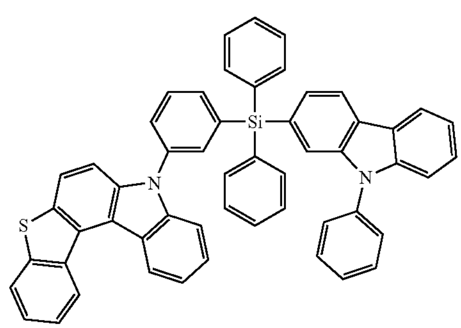

-continued
175
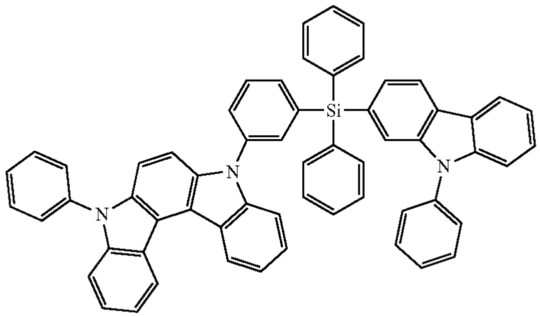
176
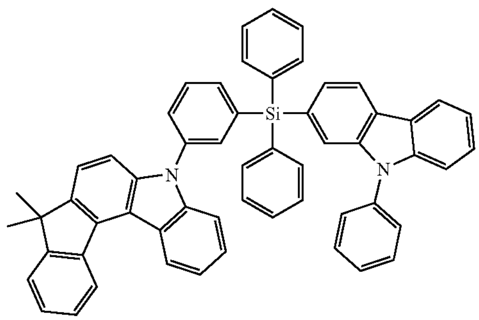
177
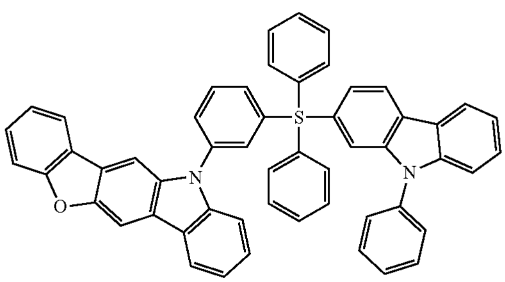
178
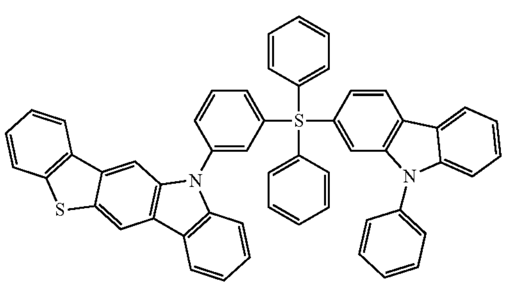
179
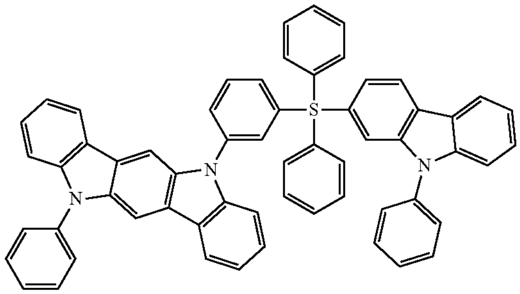
-continued
180
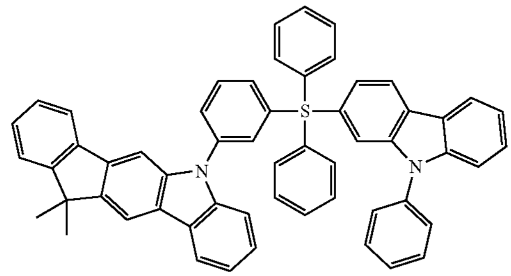
181
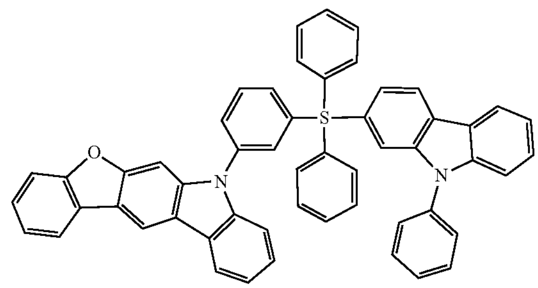
182
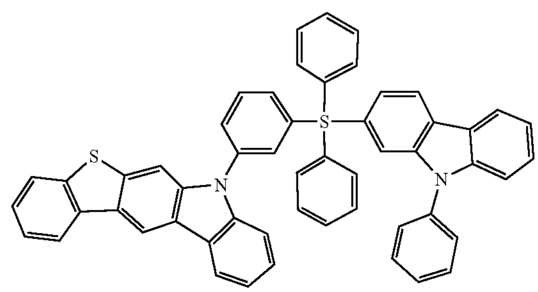
183
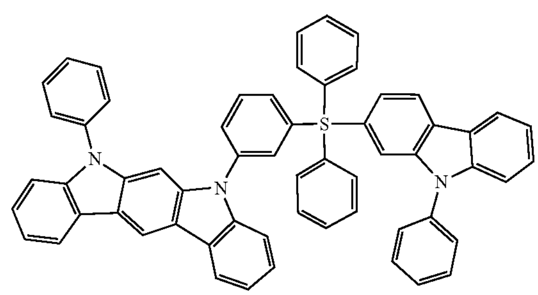
184
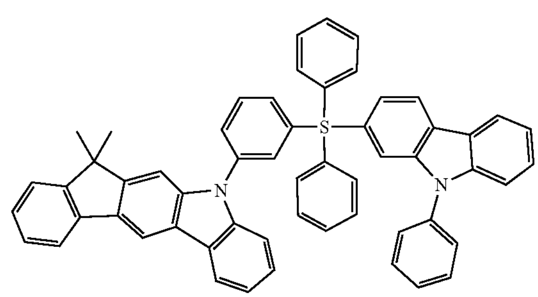

185
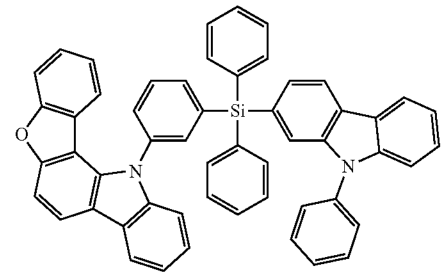
186
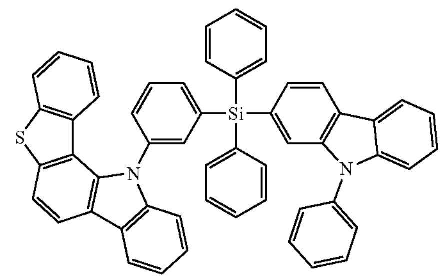
187
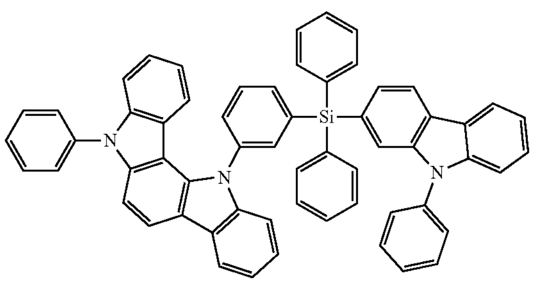
188
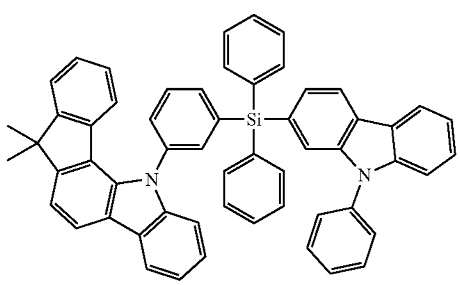
189
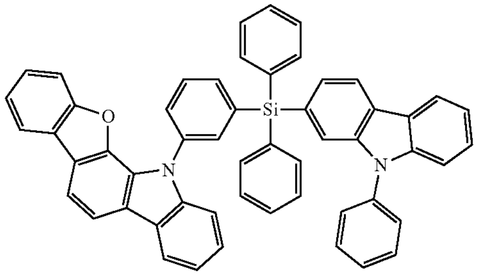
190
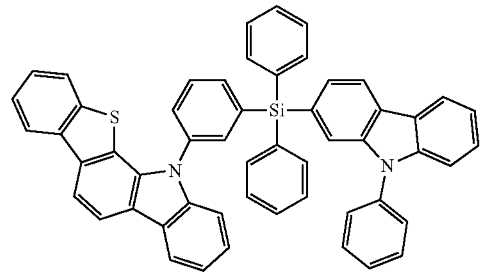
191
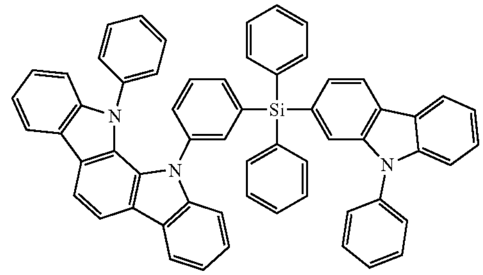
192
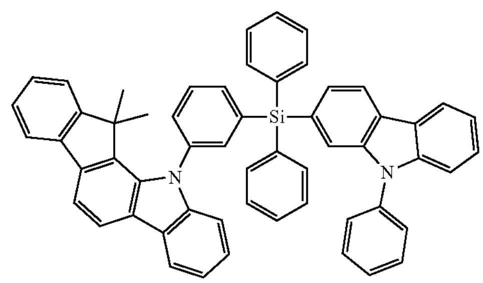
193
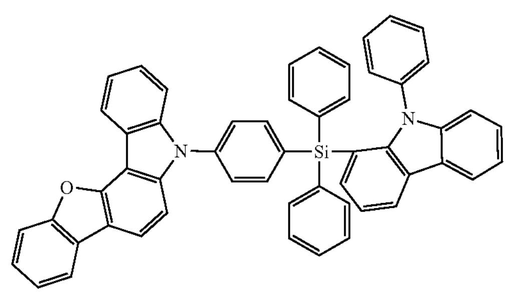
194
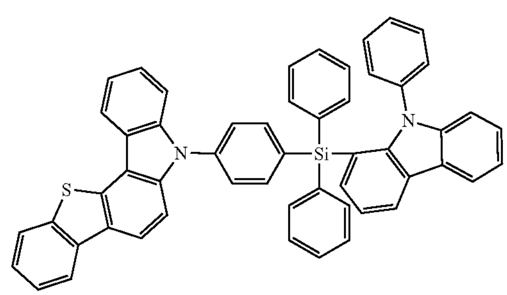

195
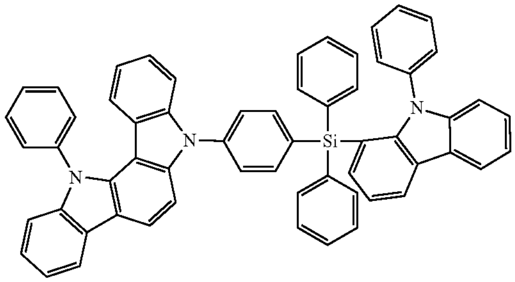
196
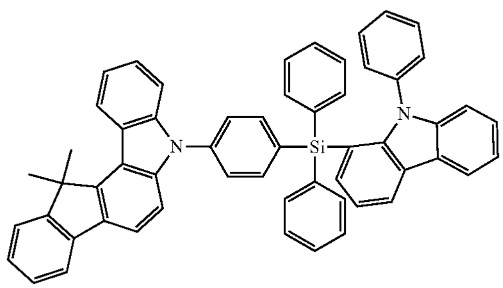
197
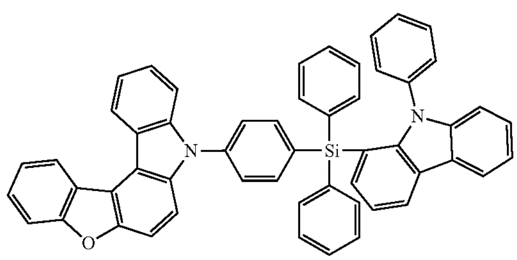
198
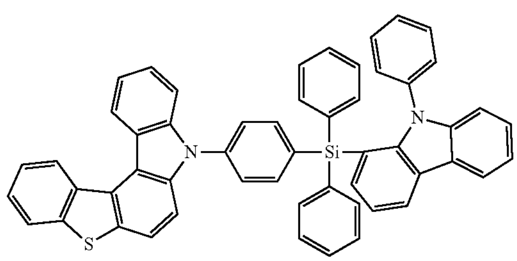
199
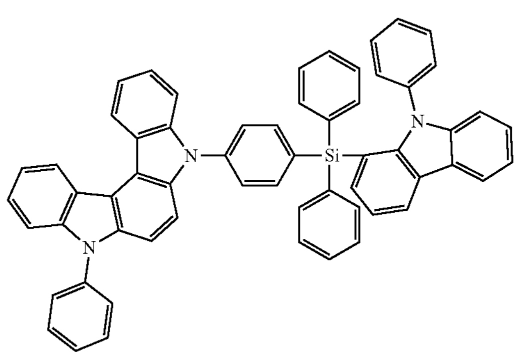
200
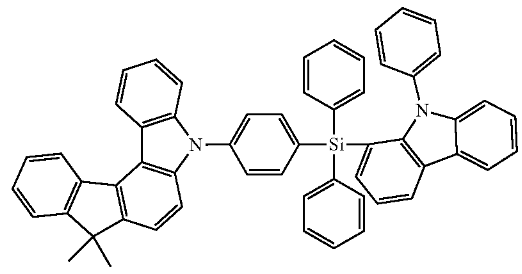
201
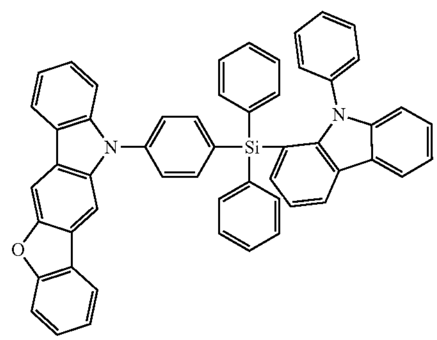
202
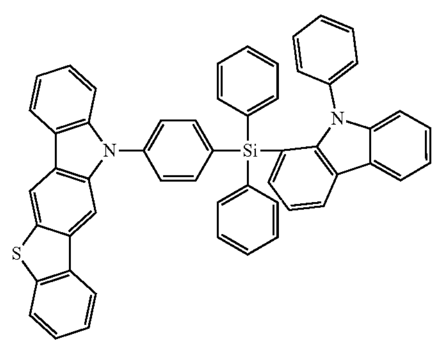
203
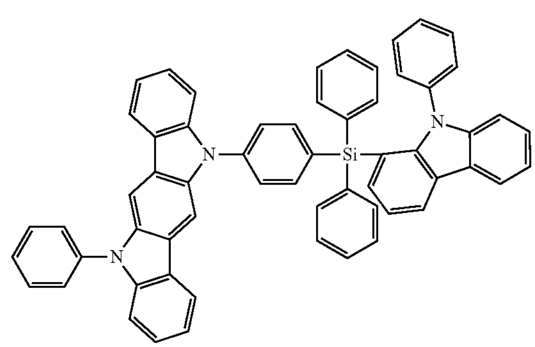

204
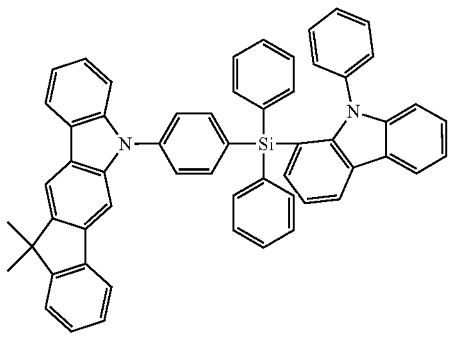
205
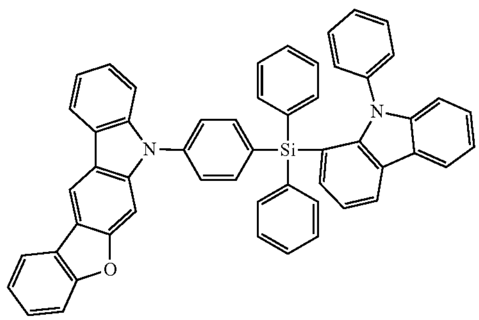
206
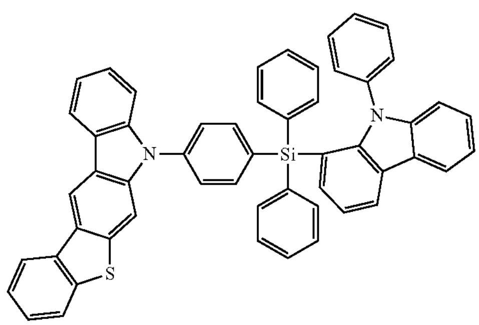
207
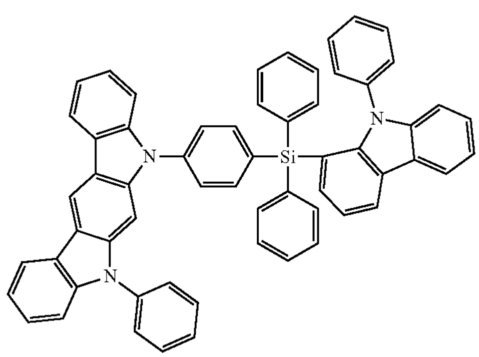
208
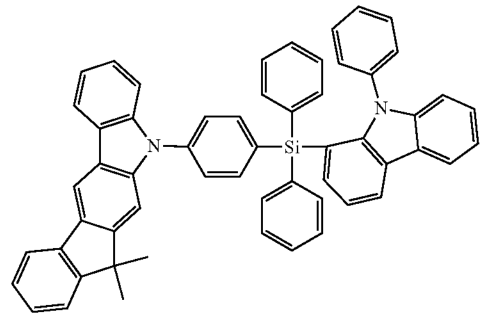
209
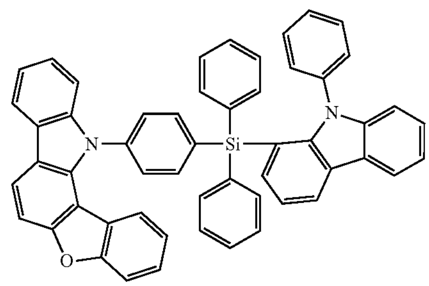
210
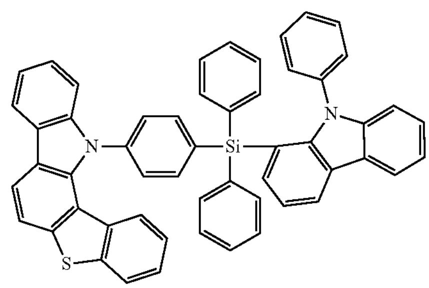
211
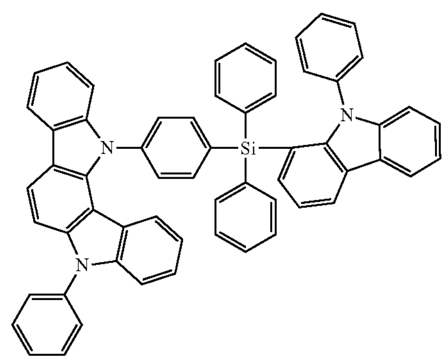
212
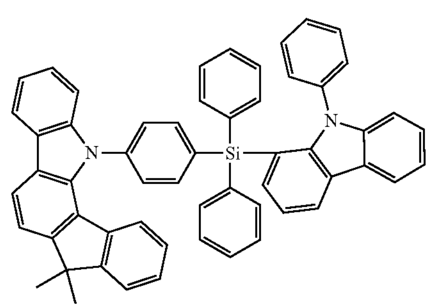

213
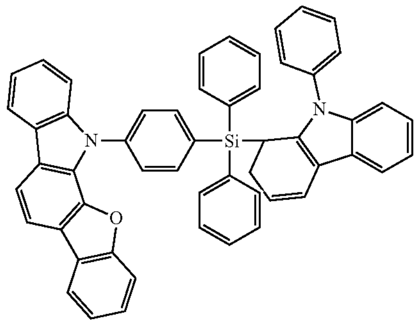
214
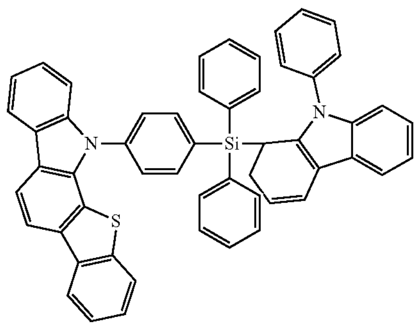
215
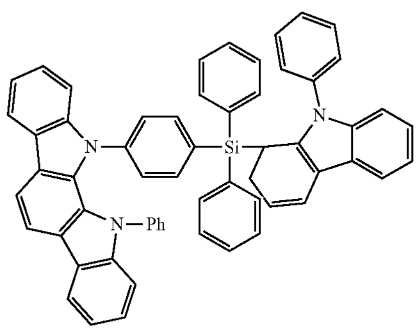
216
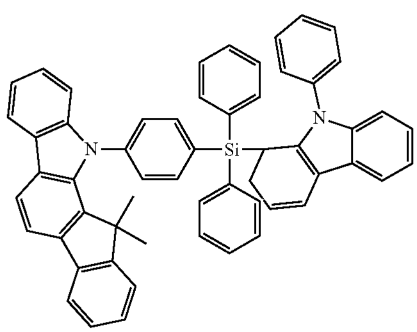
217
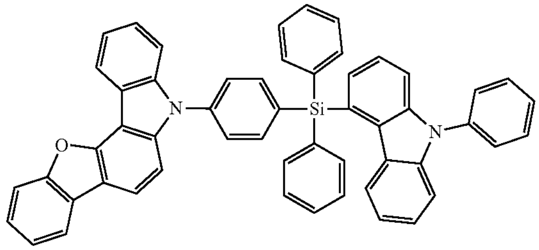
218
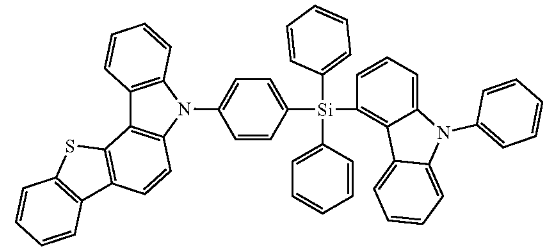
219
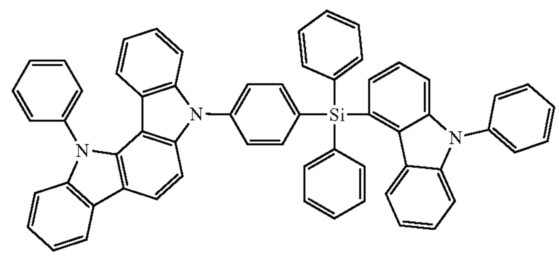
220
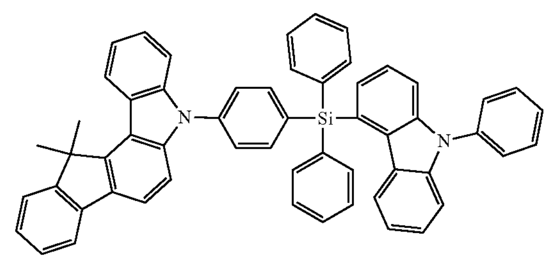
221
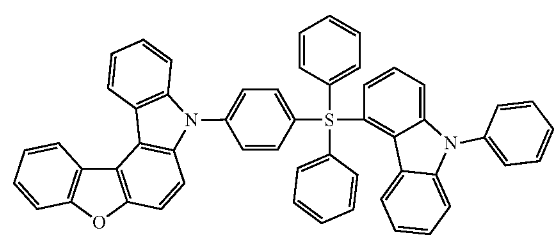
222
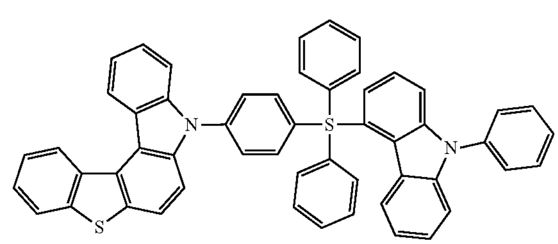

-continued
223
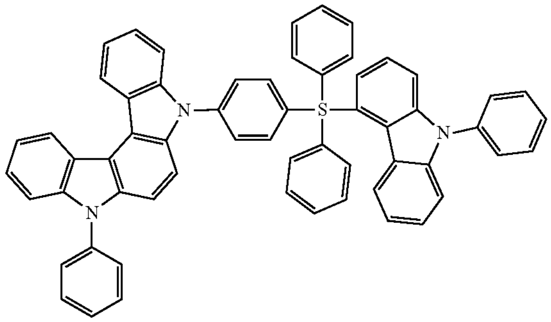
224
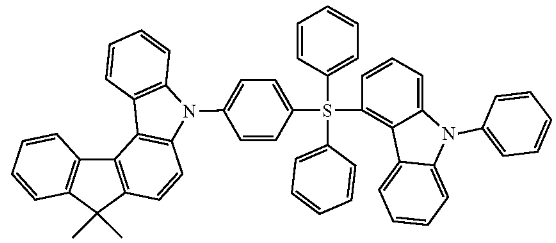
225
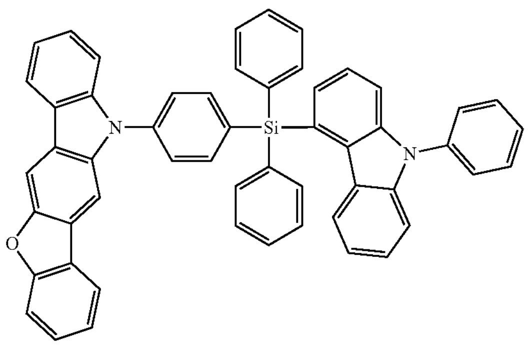
226
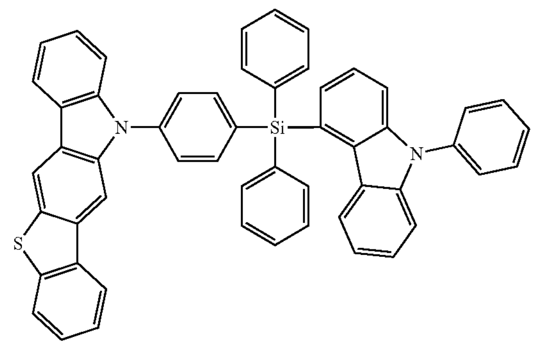
227
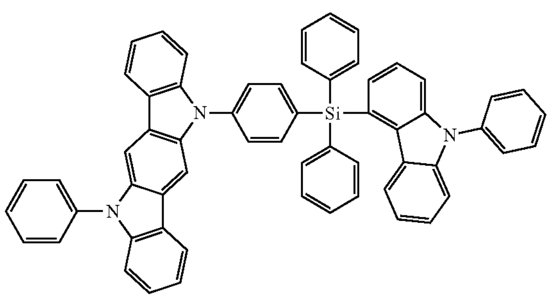
228
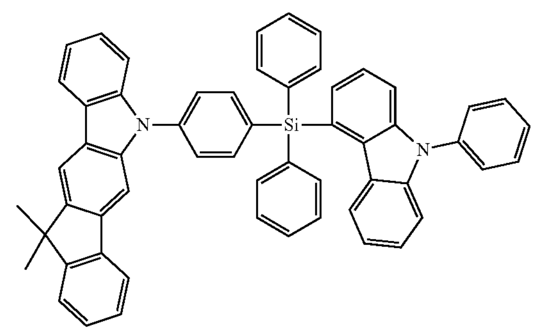
229
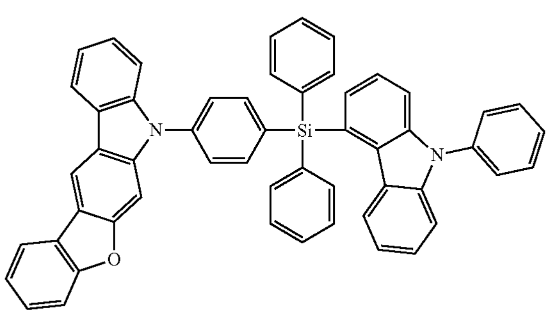
230
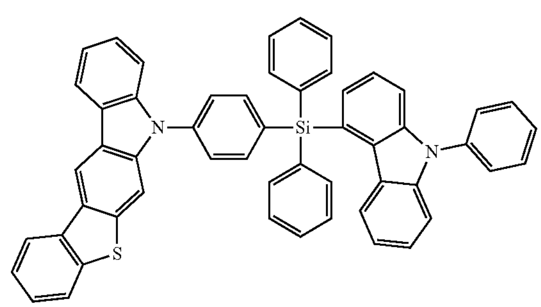

-continued
231
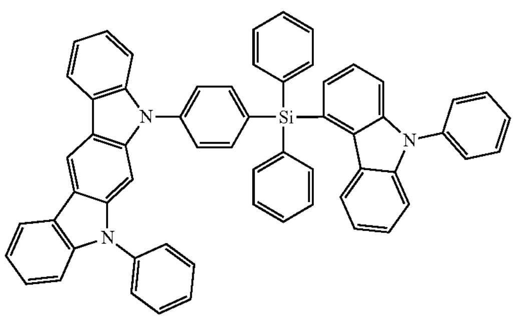
232
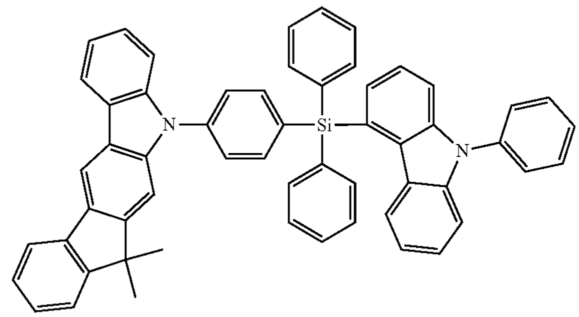
233
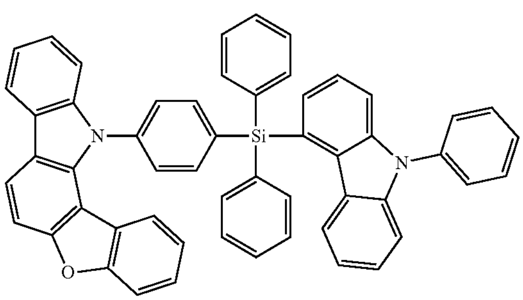
234
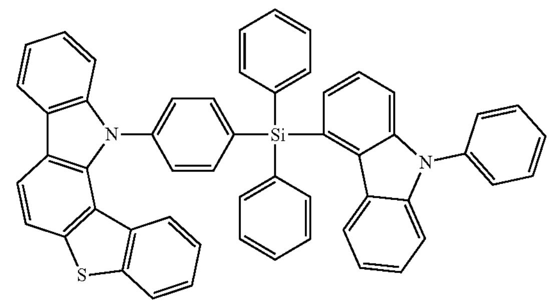
235
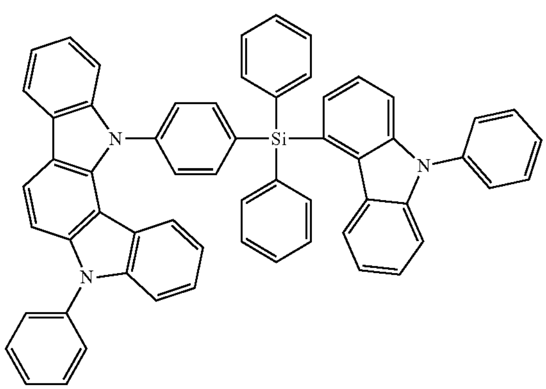
236
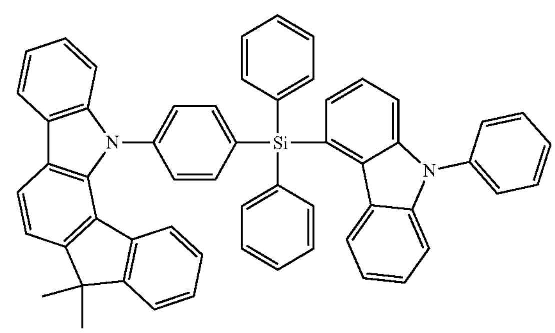
237
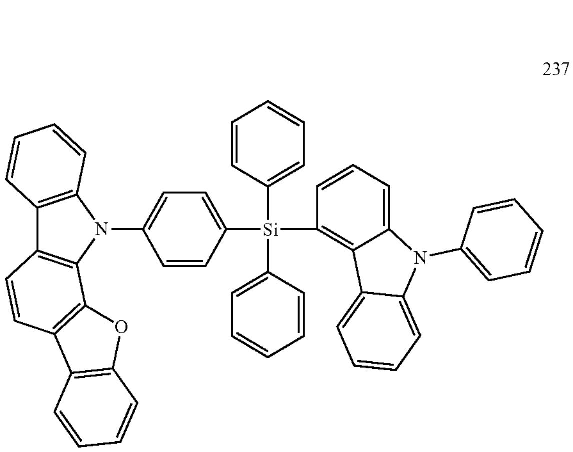
238
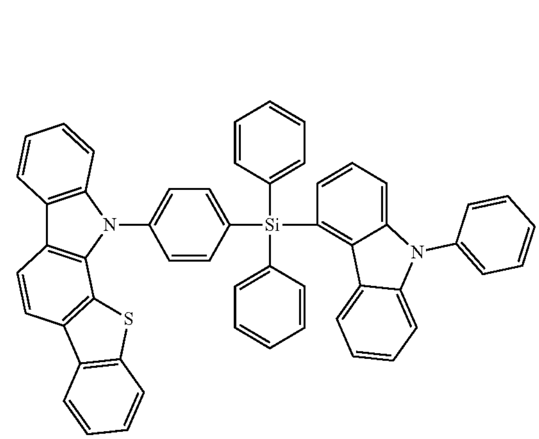

-continued
239
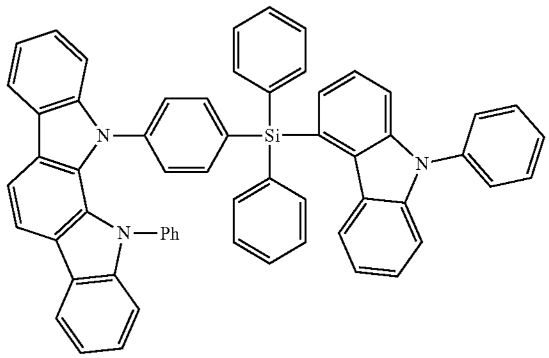
240
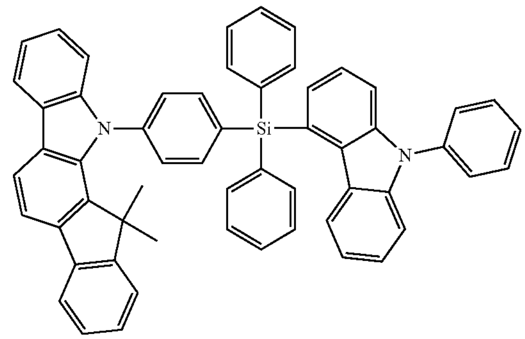
241
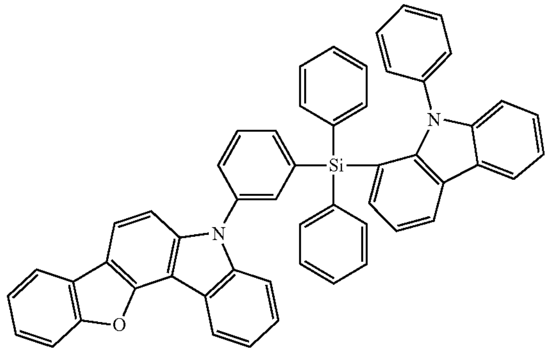
242
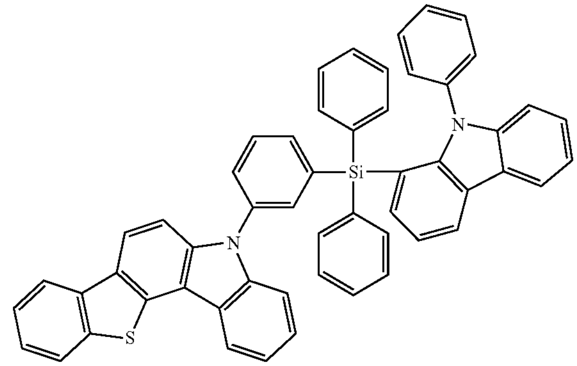
243
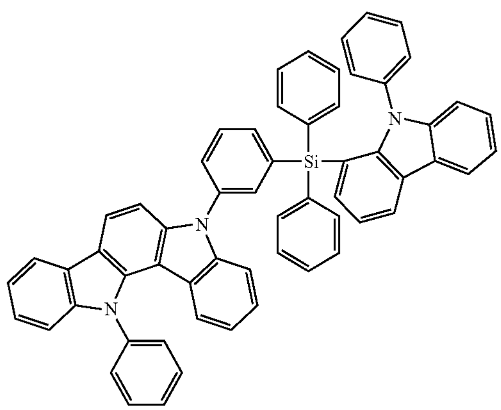
244
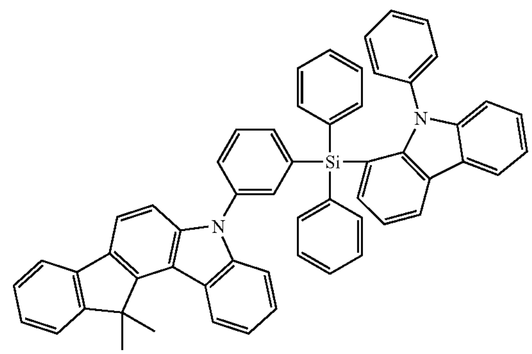
245
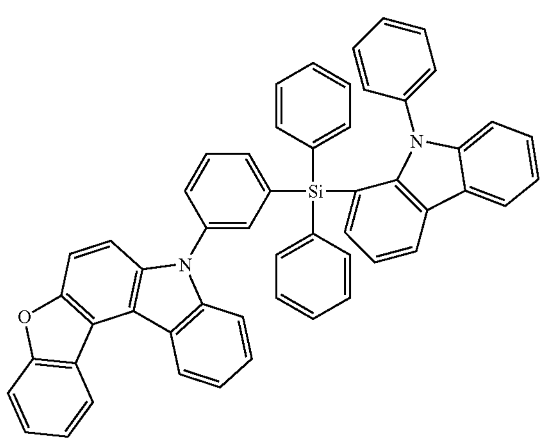
246
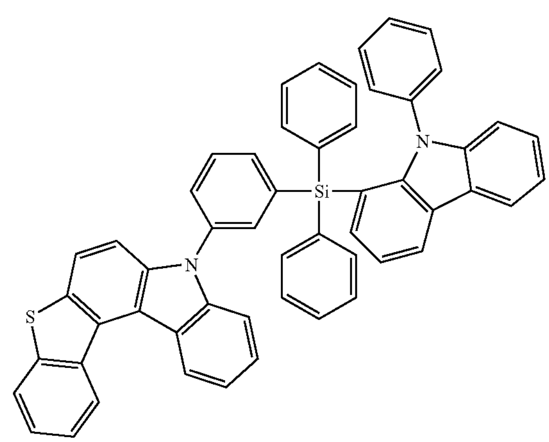

-continued
247
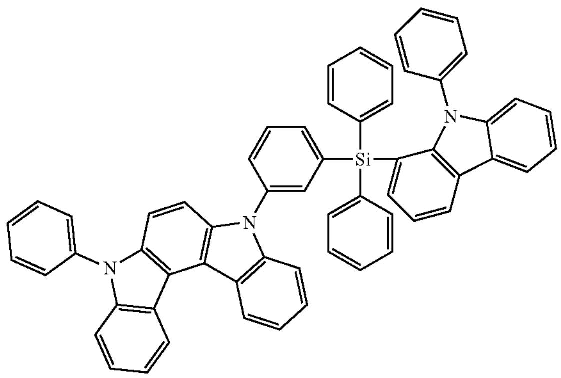
248
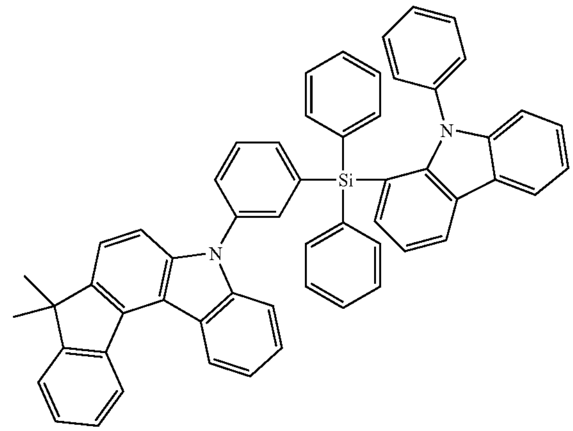
249
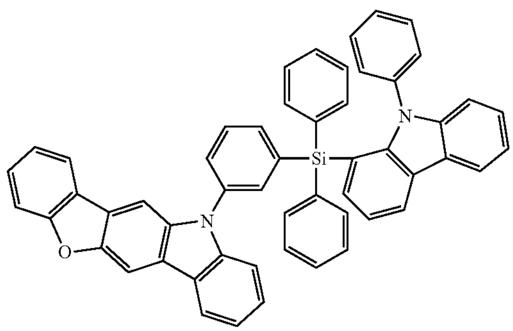
250
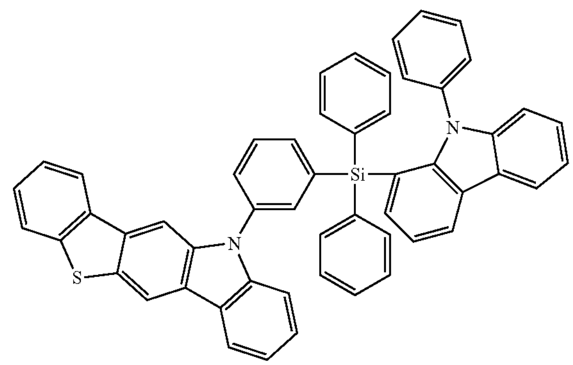
251
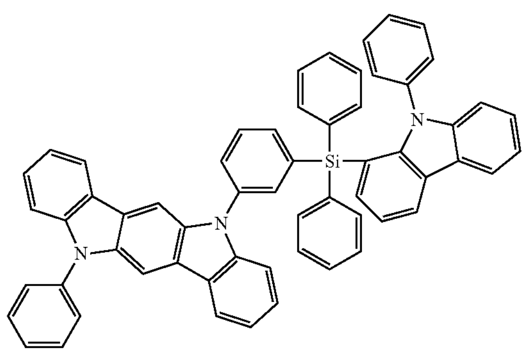
252
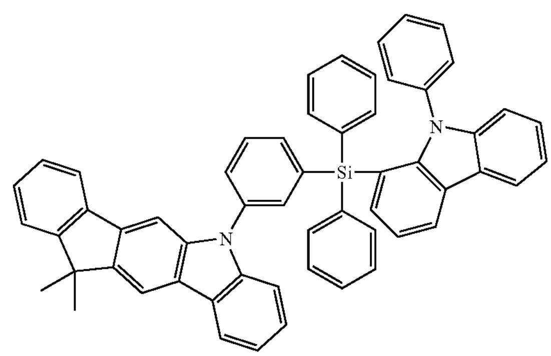
253
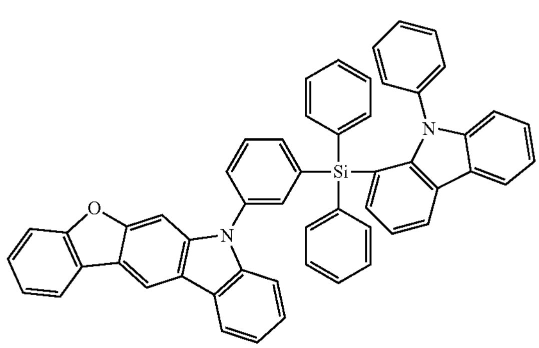
254
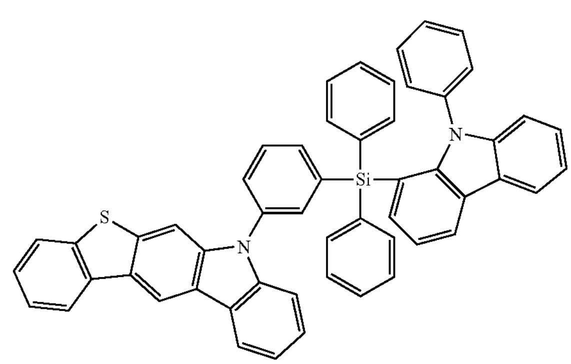

-continued
255
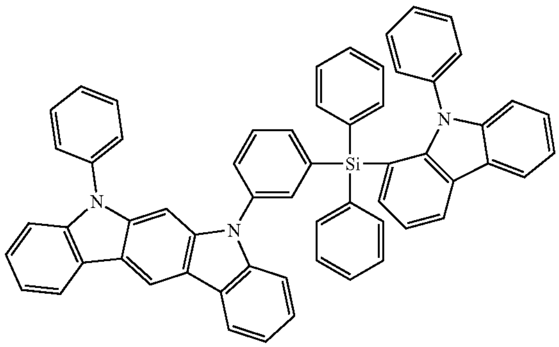
256
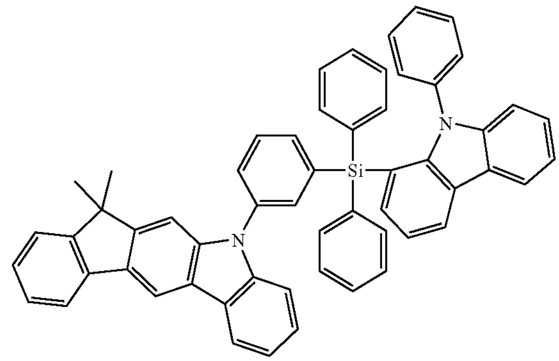
257
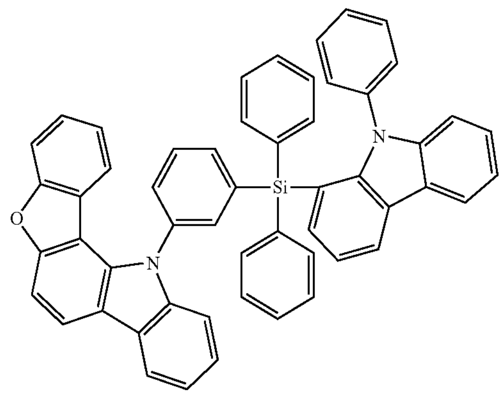
258
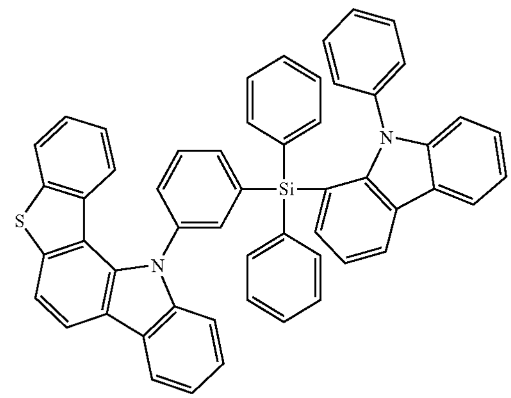
259
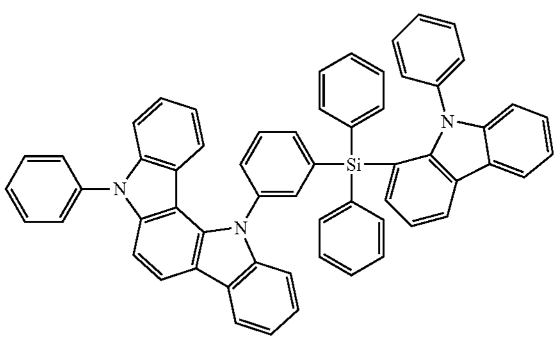
260
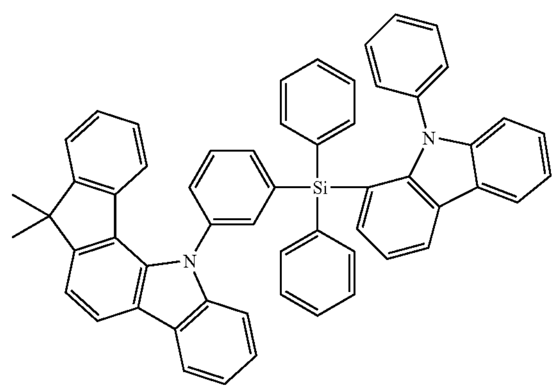
261
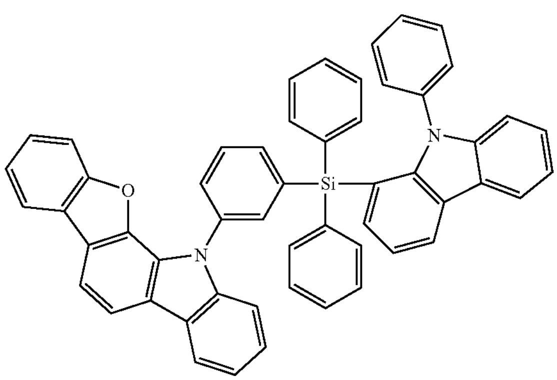
262
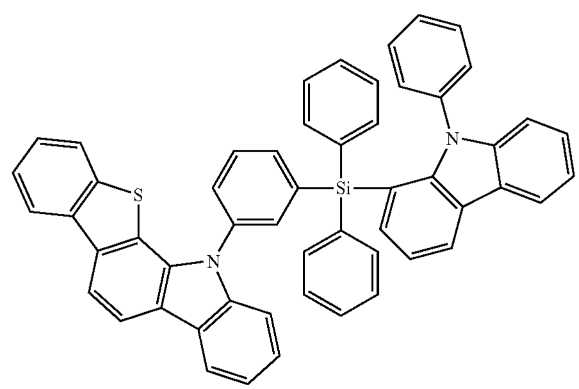

-continued
263
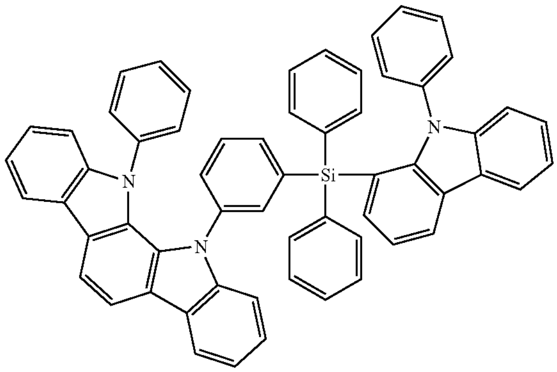
264
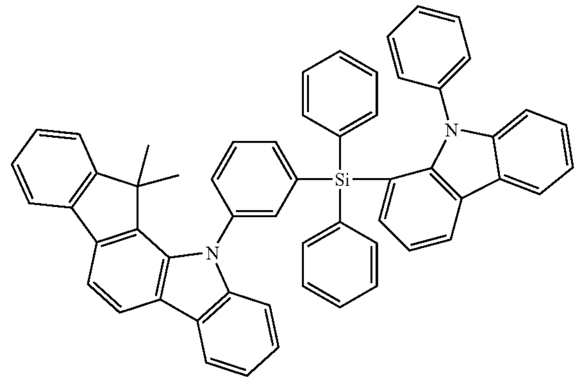
265
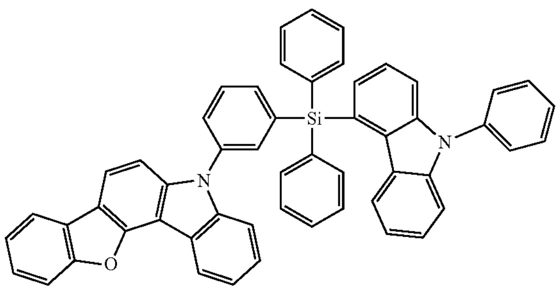
266
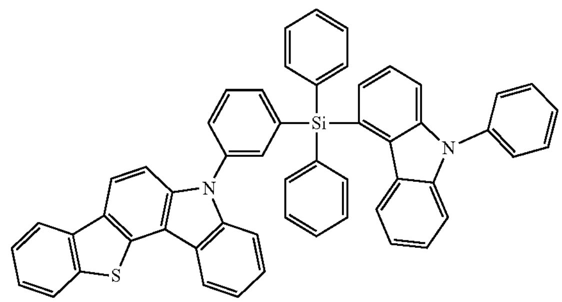
267
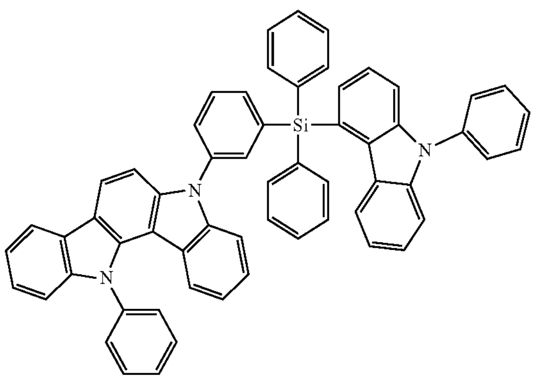
268
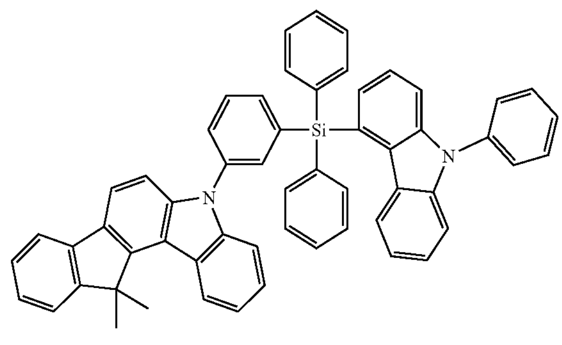
269
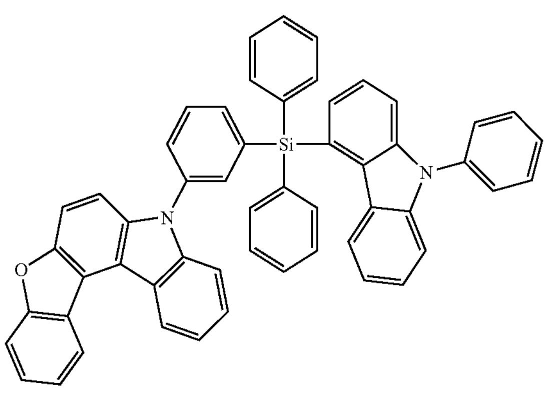
270
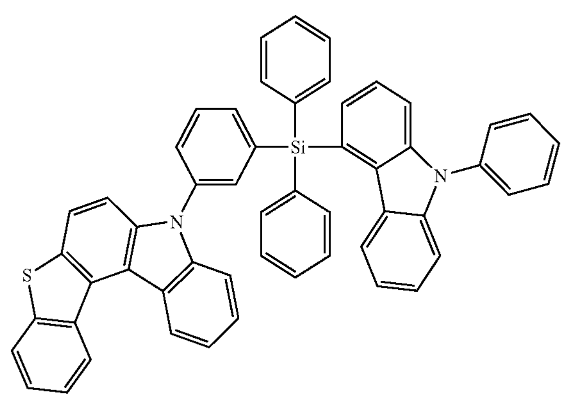

-continued
271
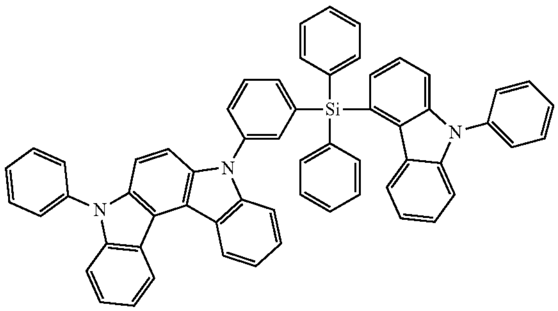
272
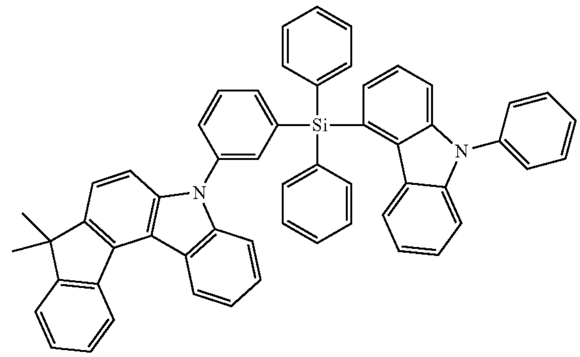
273
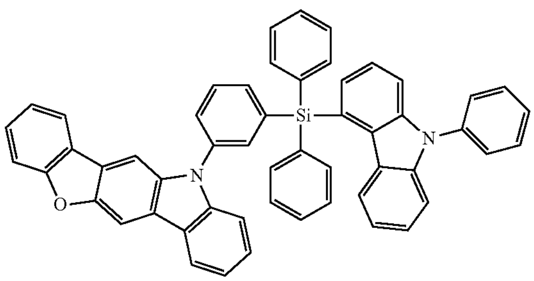
274
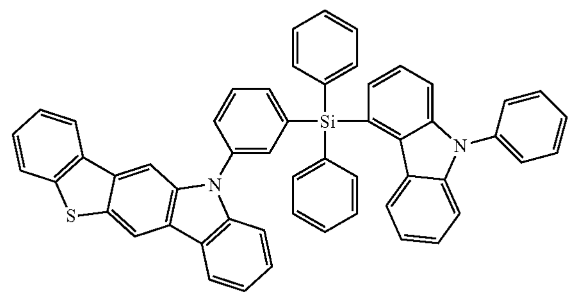
275
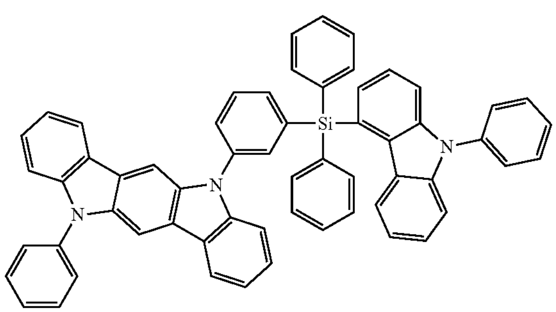
276
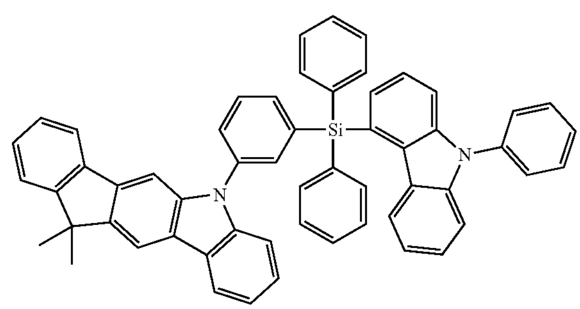
277
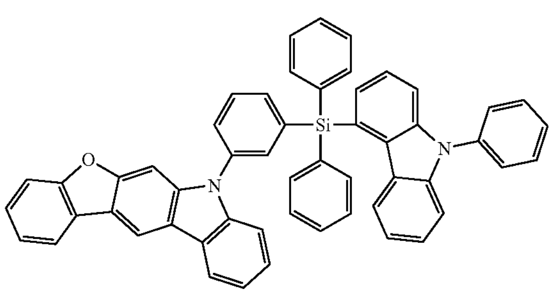
278
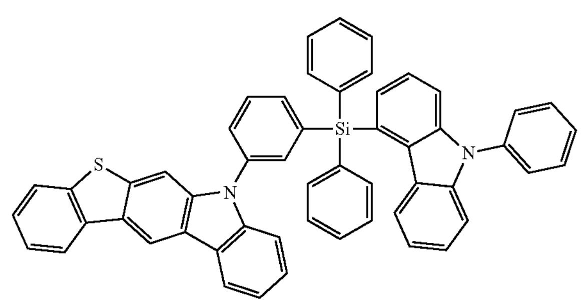

-continued
279
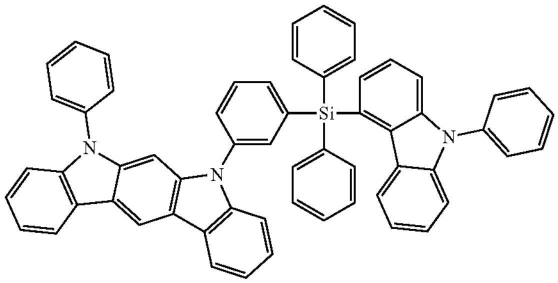
280
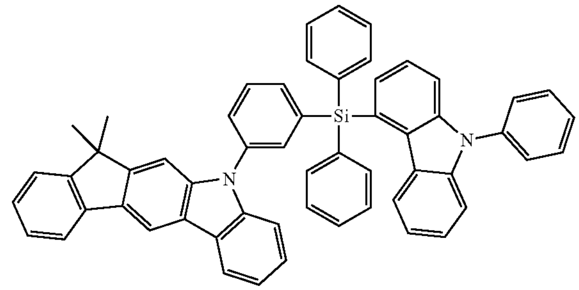
281
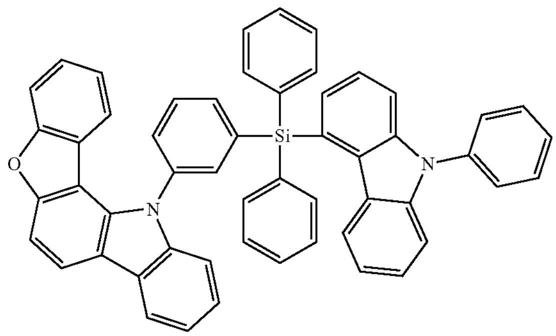
282
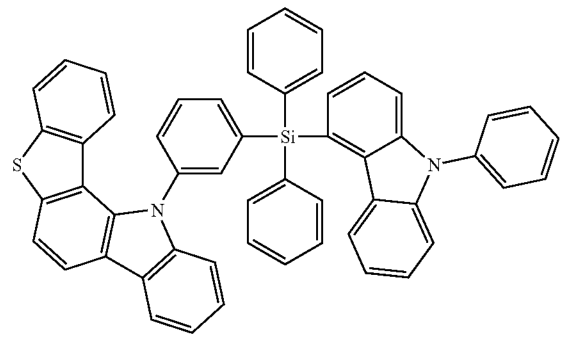
283
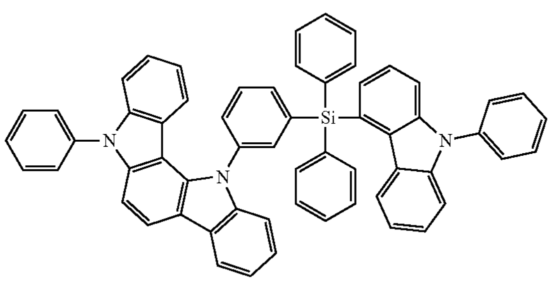
284
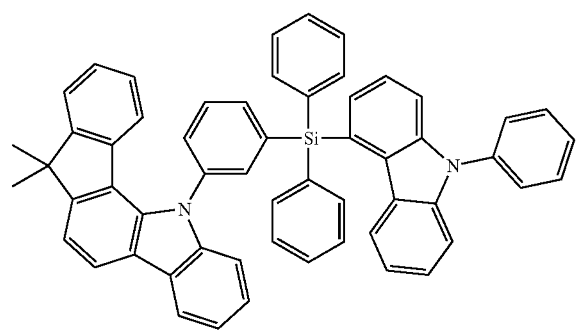
285
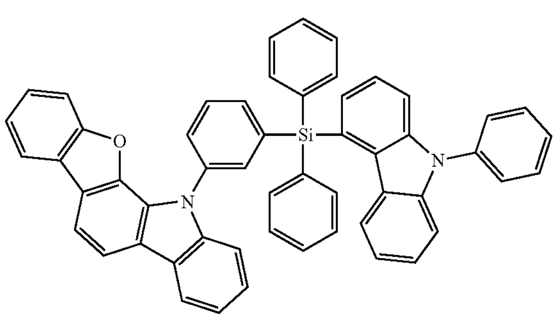
286
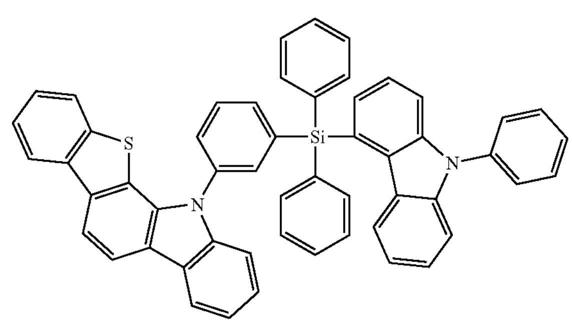

-continued
287
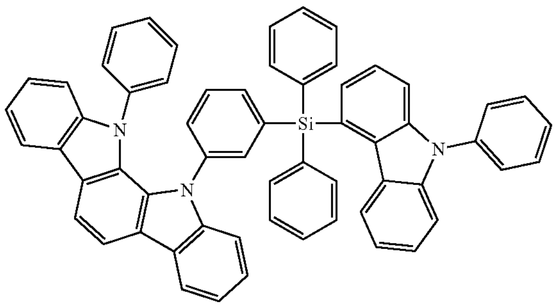
288
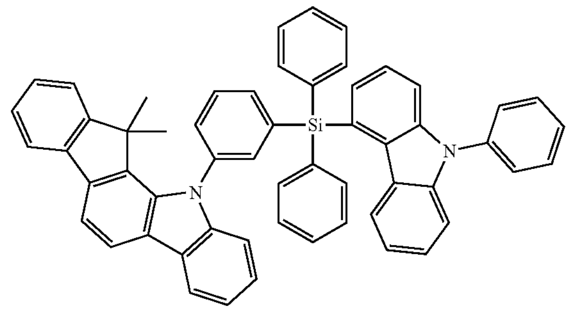
289
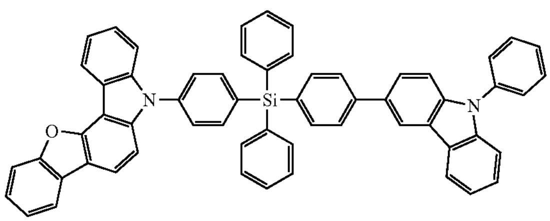
290
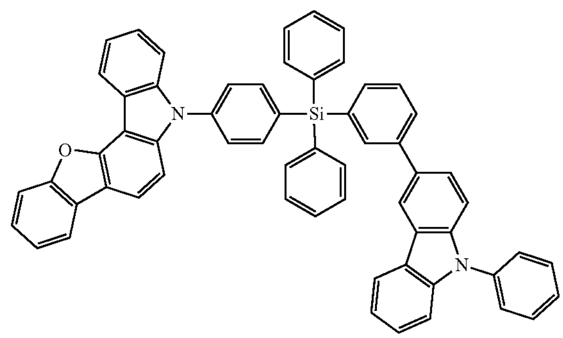
291
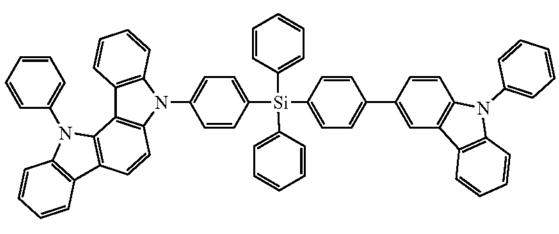
292
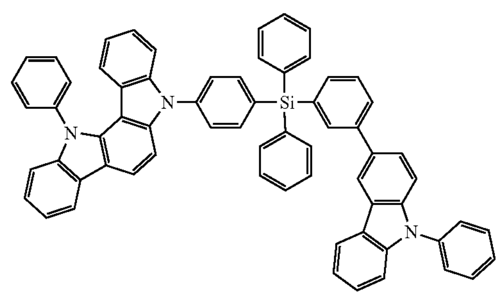
293
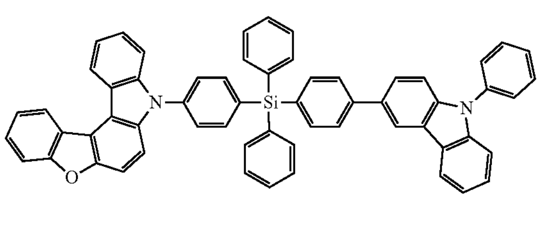
294
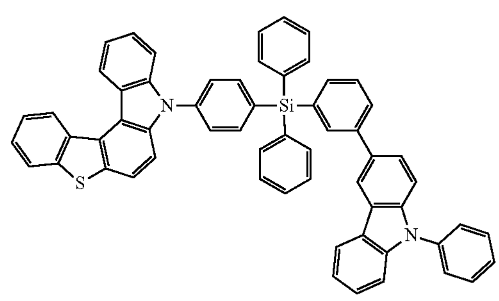

-continued
295
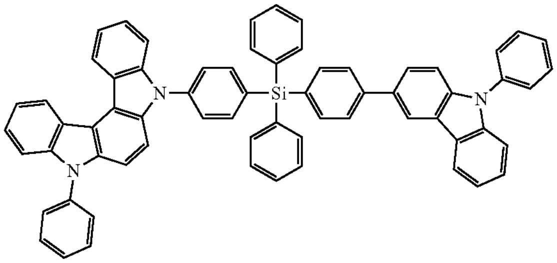
296
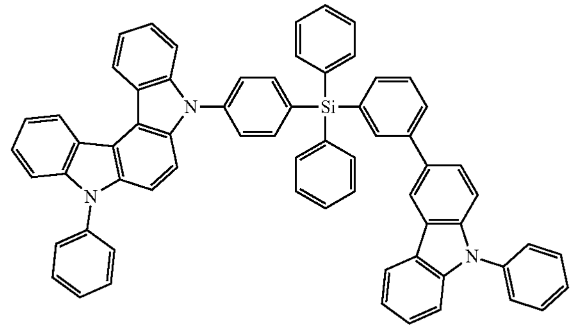
297
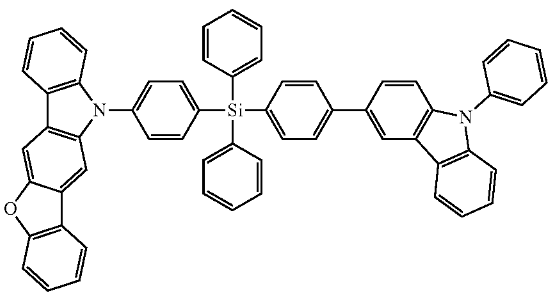
298
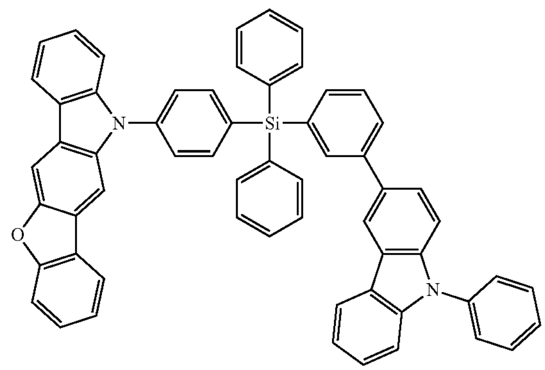
299
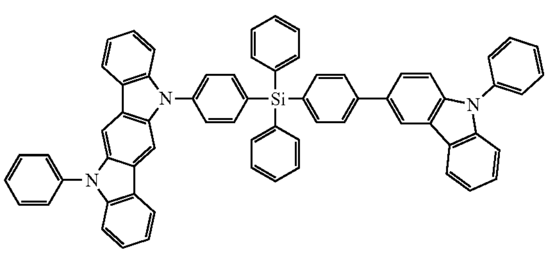
300
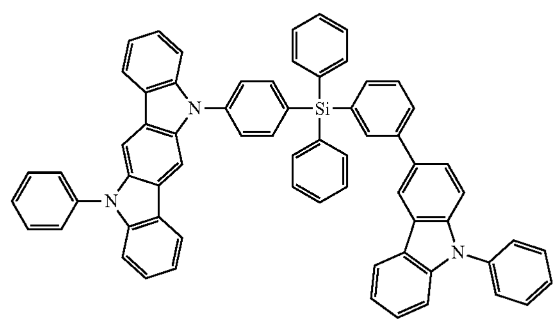
301
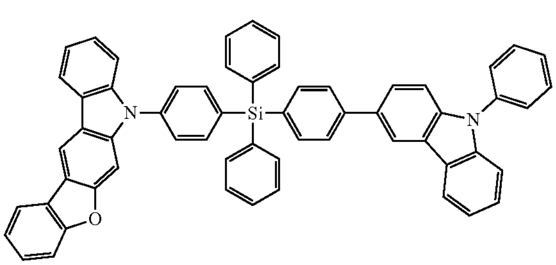
302
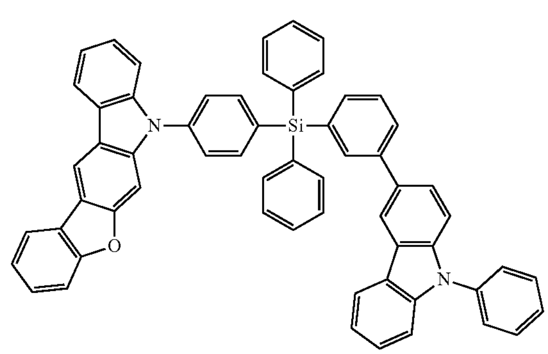

-continued
303
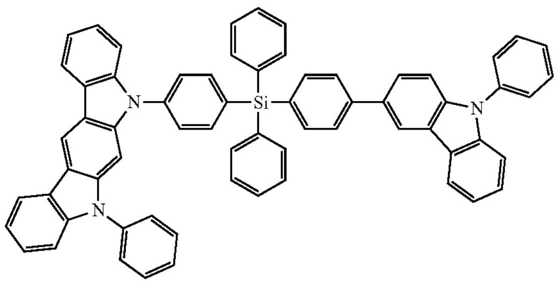
304
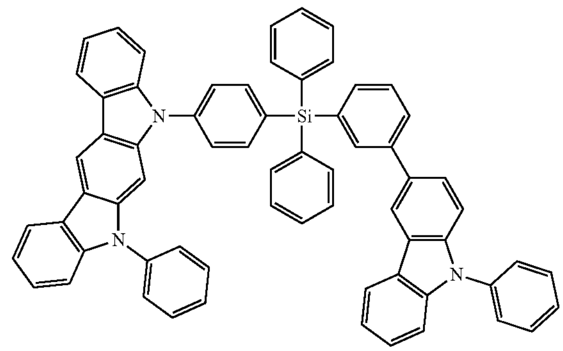
305
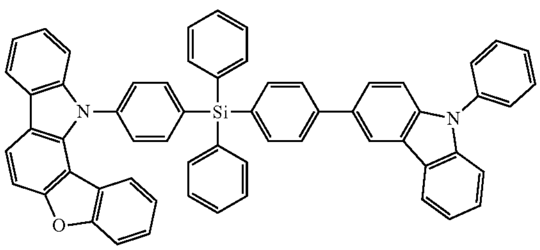
306
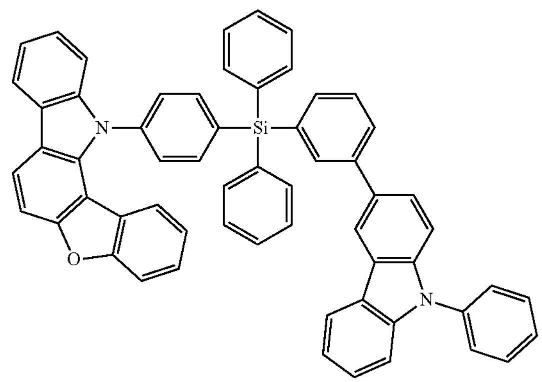
307
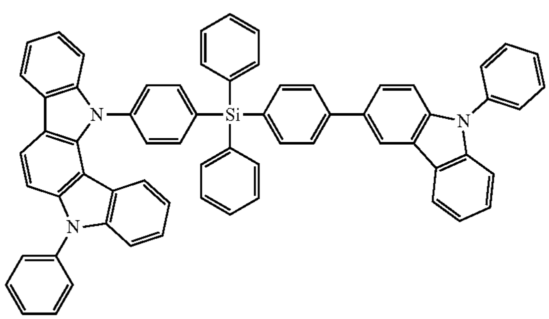
308
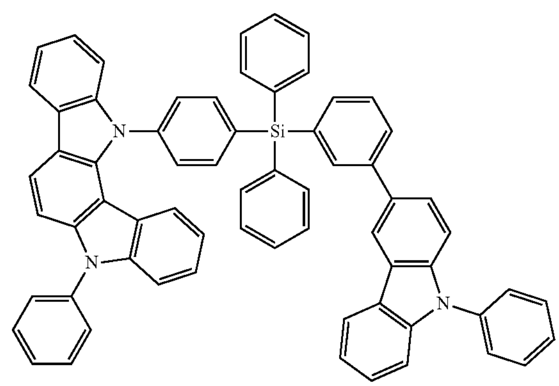
309
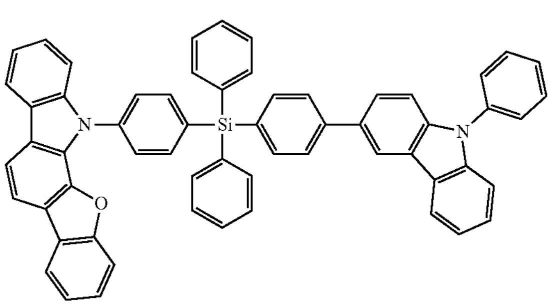
310
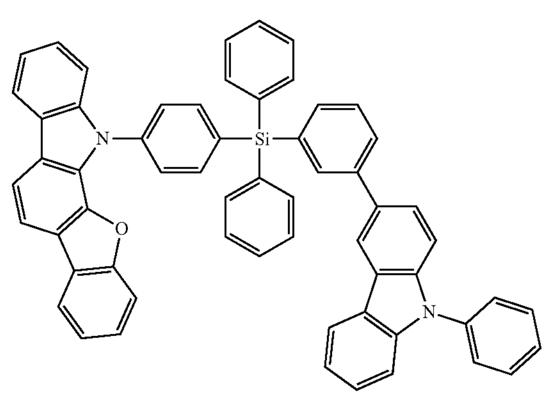

-continued
311
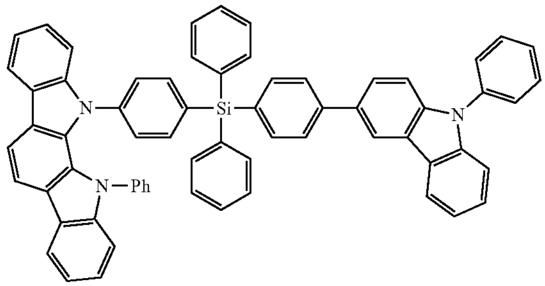
312
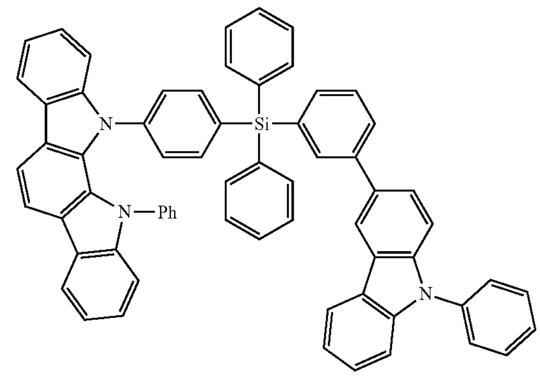
313
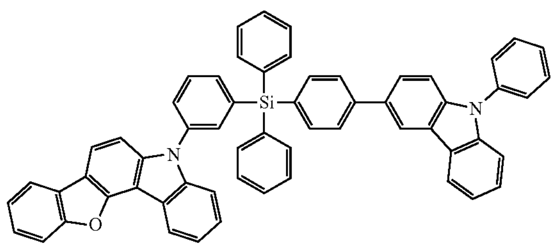
314
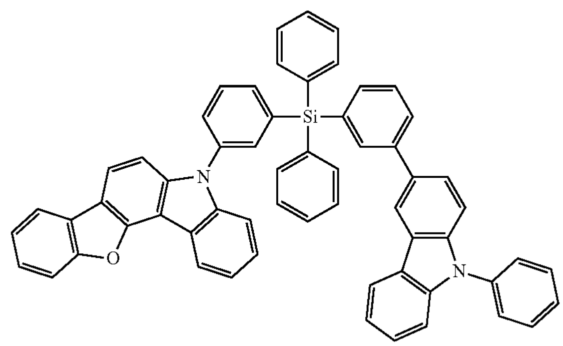
315
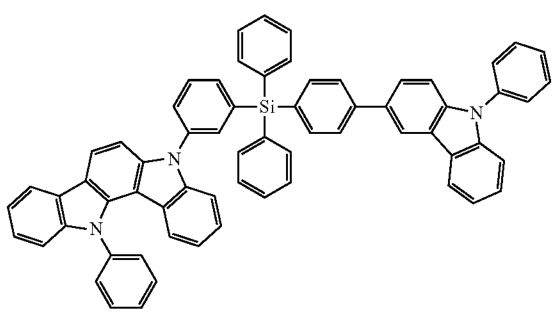
316
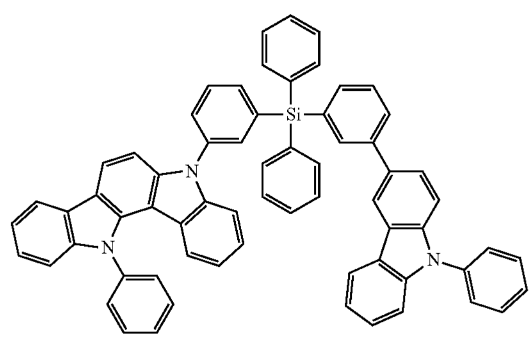
317
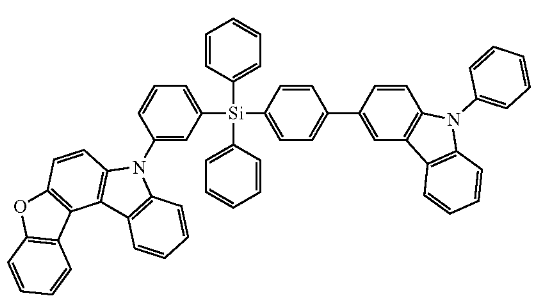
318
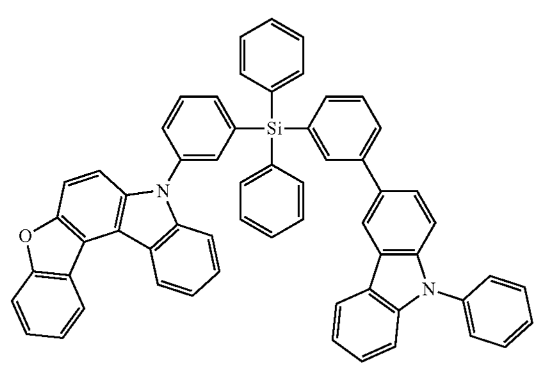

-continued
319
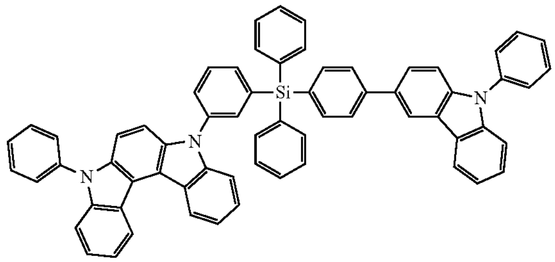
320
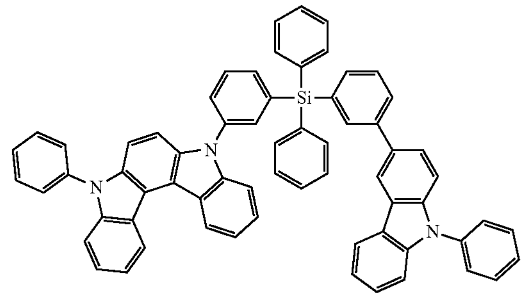
321
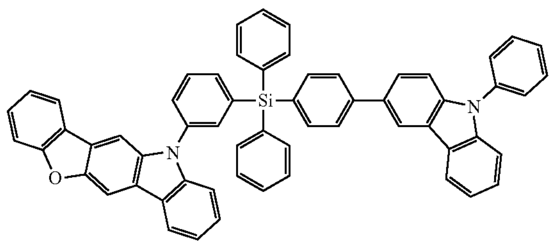
322
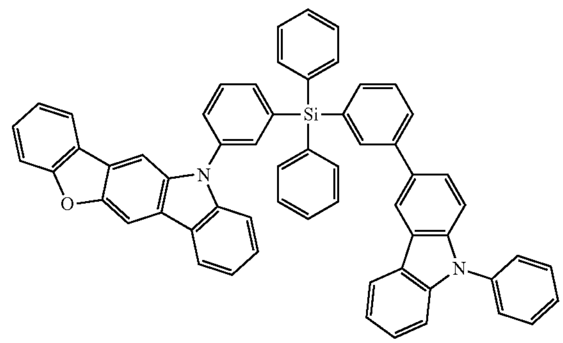
323
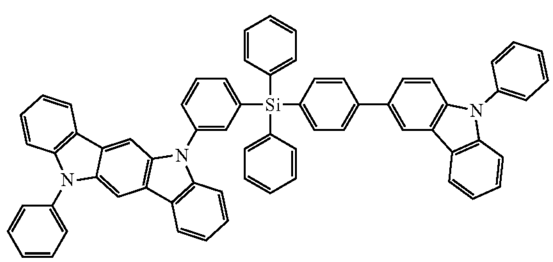
324
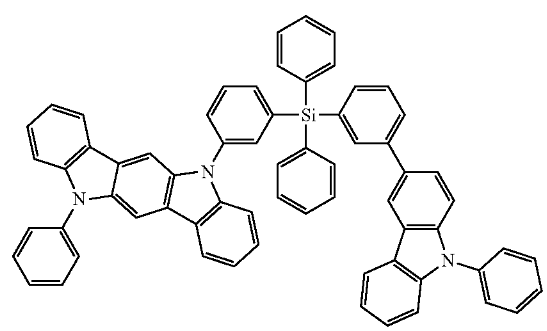
325
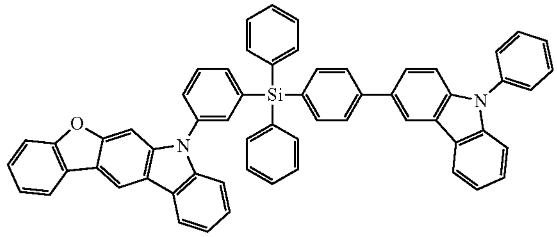
326
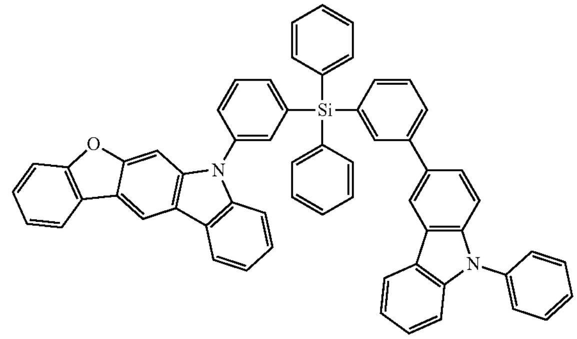

-continued
327
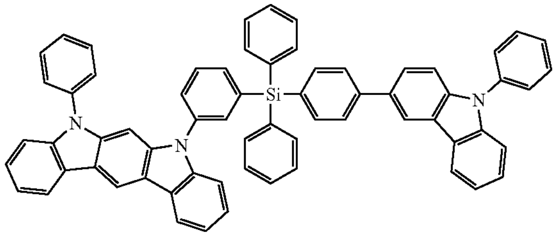
328
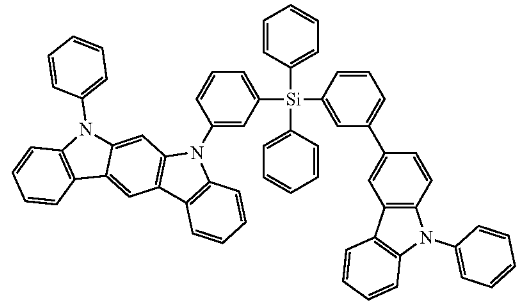
329
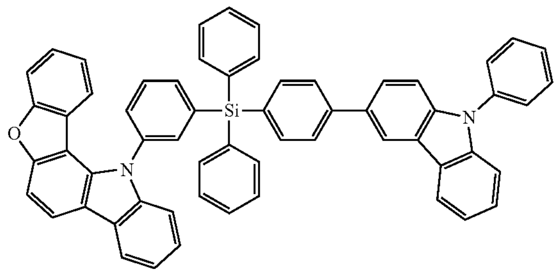
330
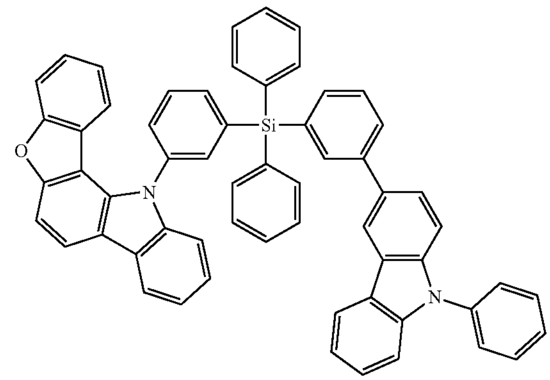
331
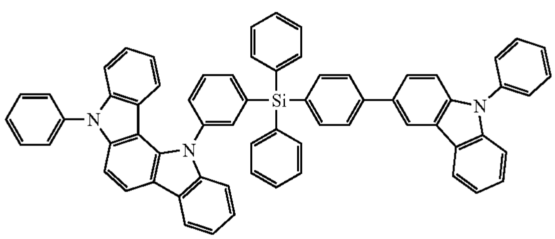
332
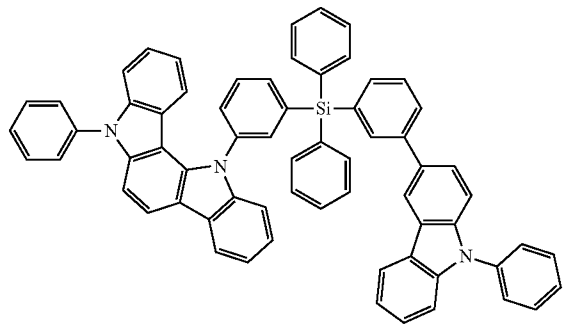
333
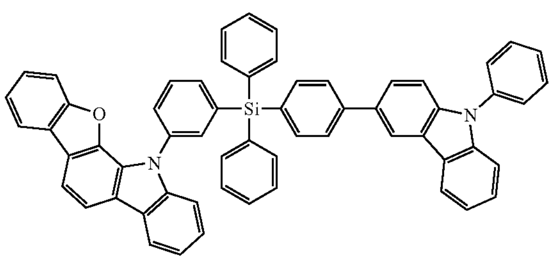
334
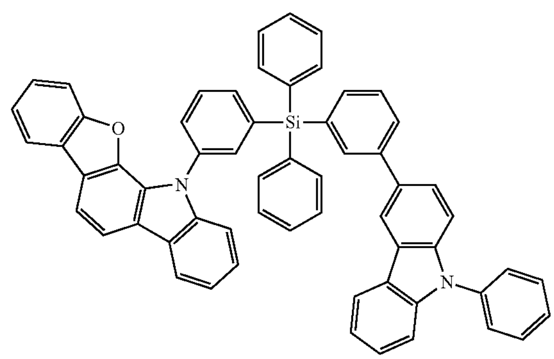

-continued
335
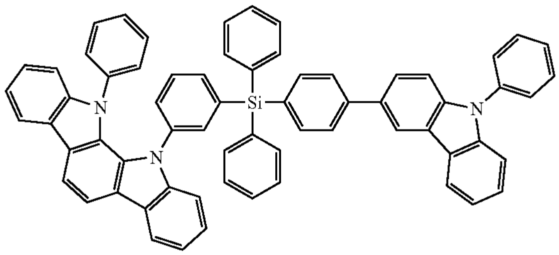
336
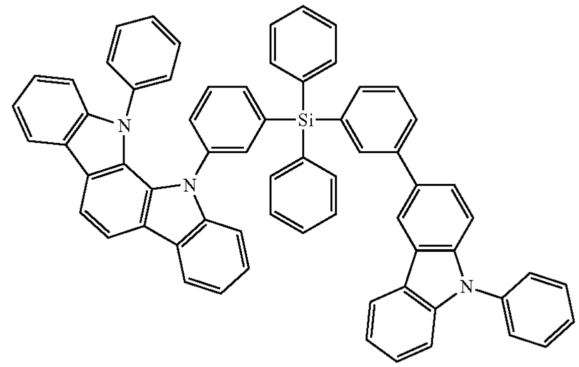
337
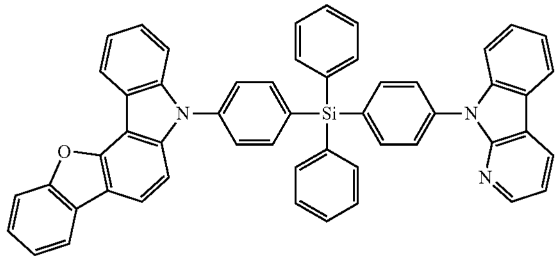
338
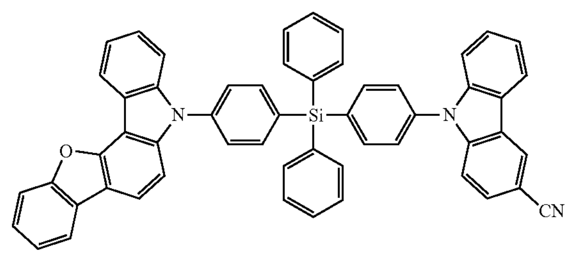
339
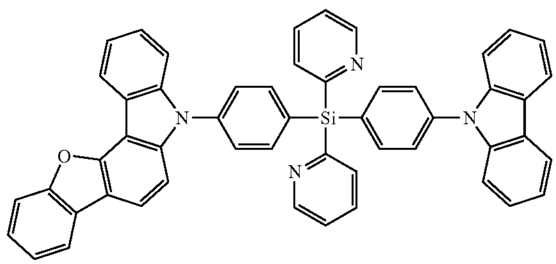
340
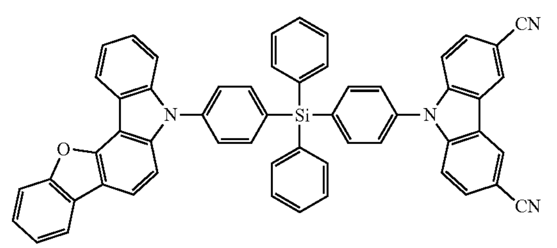
341
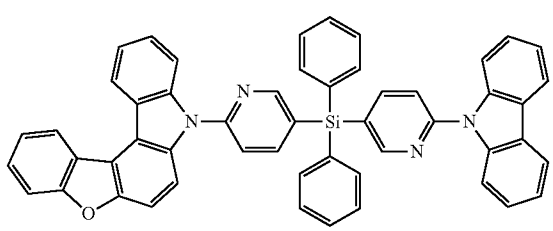
342
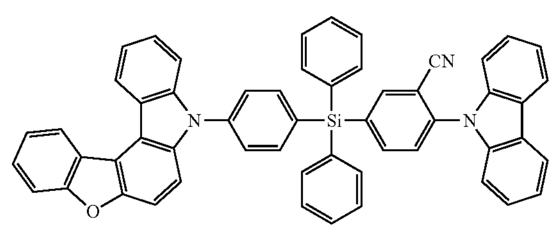
343
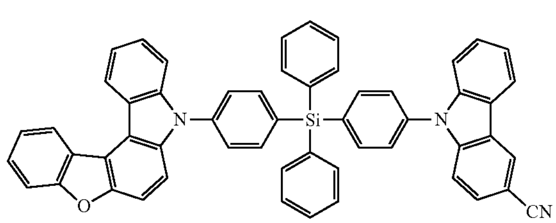
344
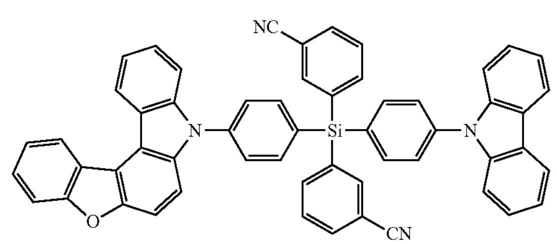

-continued
345
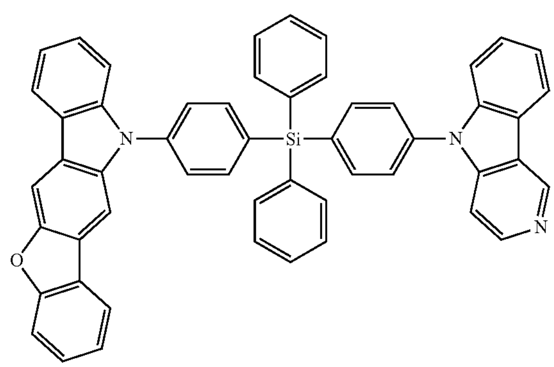
346
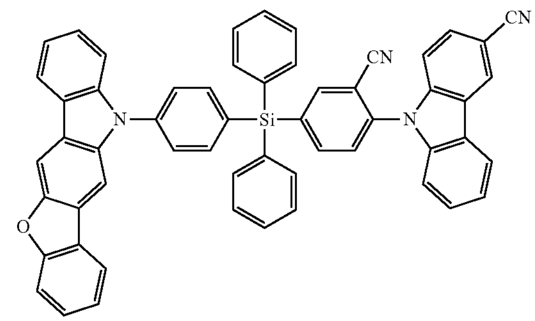
347
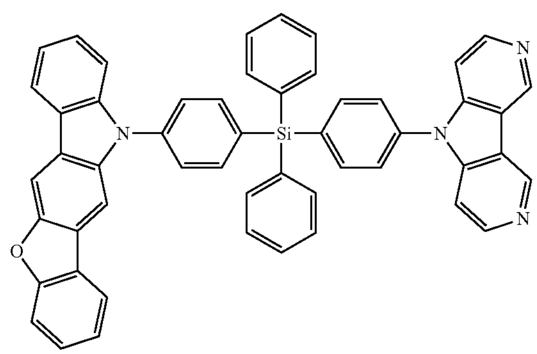
348
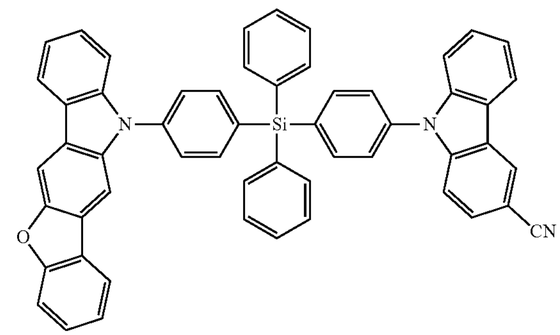
349
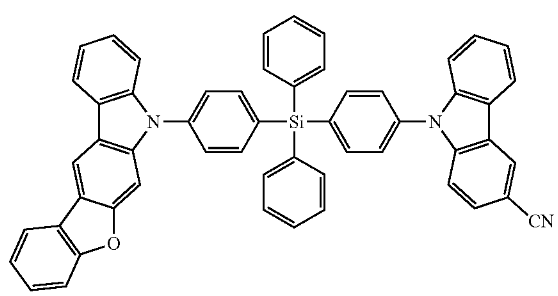
350
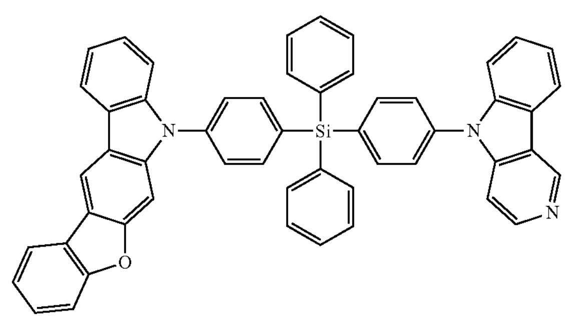
351
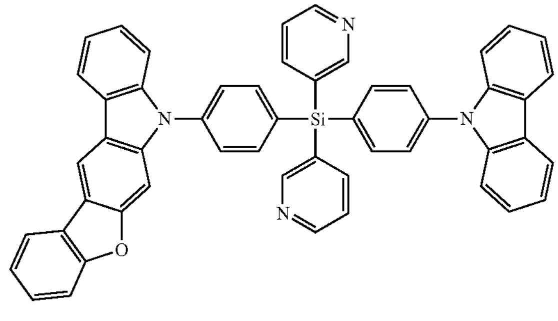
352
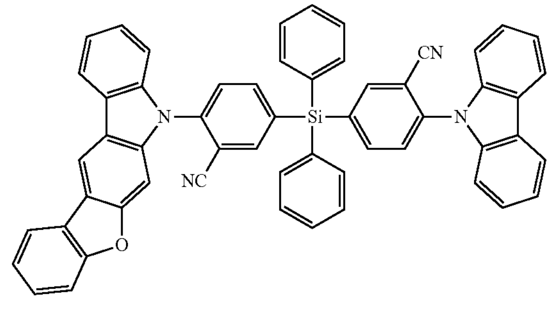

-continued
353
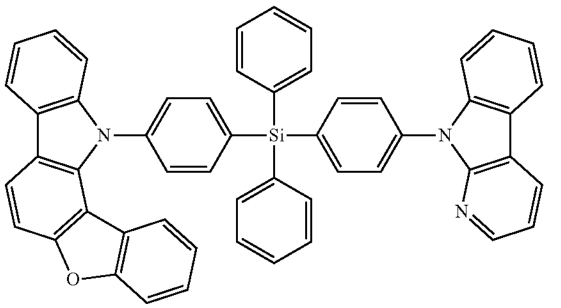
354
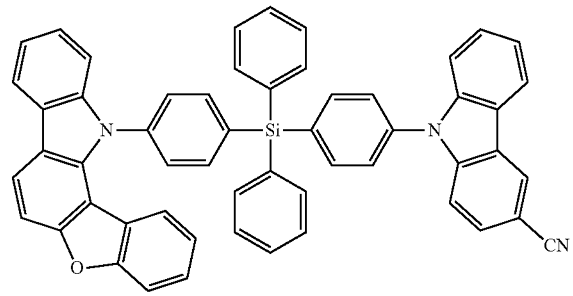
355
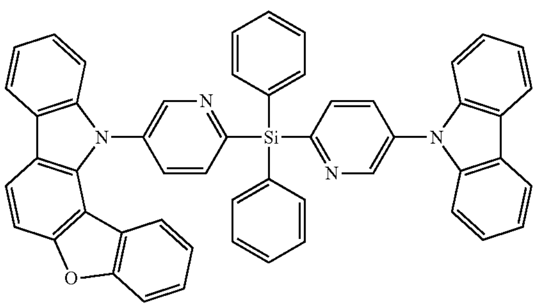
356
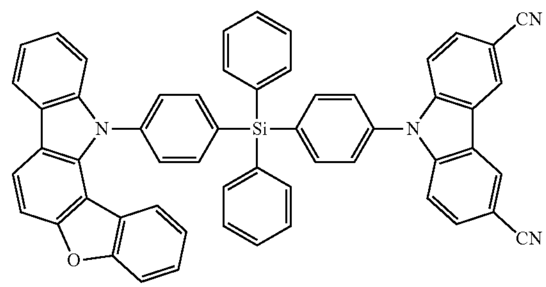
357
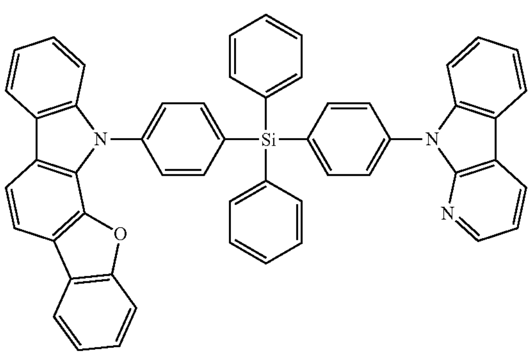
358
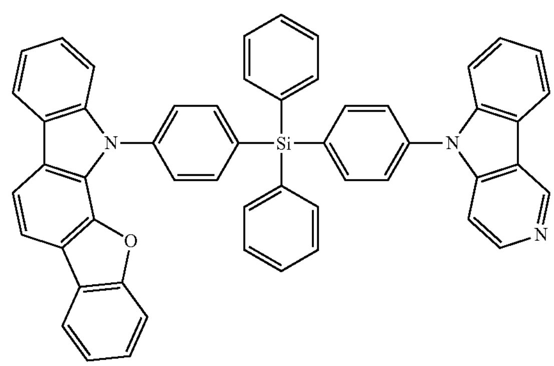
359
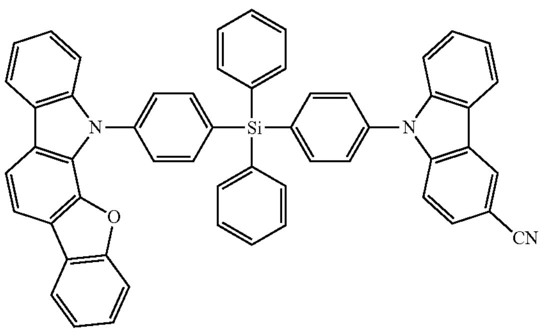
360
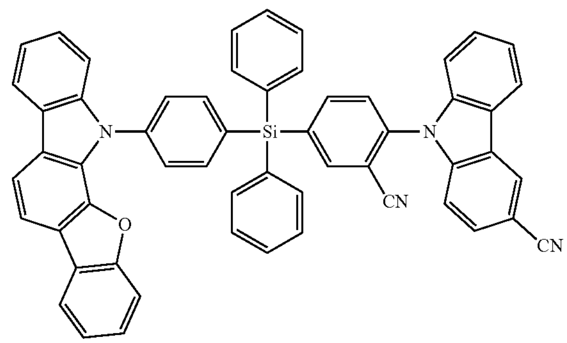

-continued
361
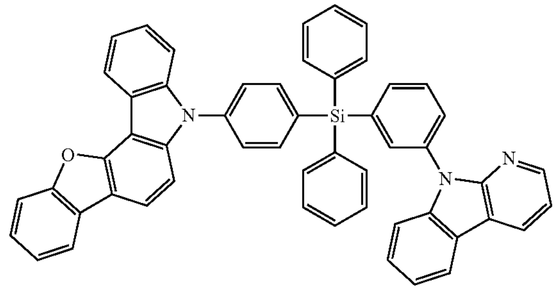
362
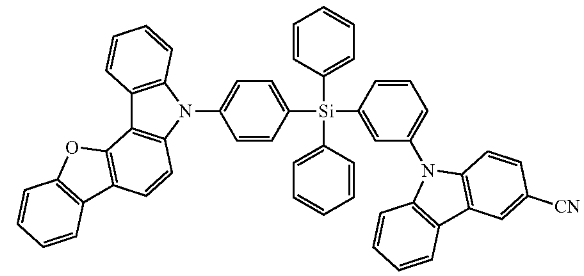
363
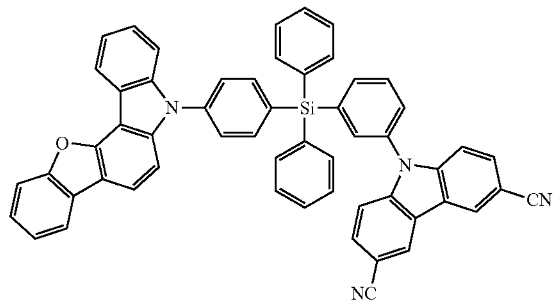
364
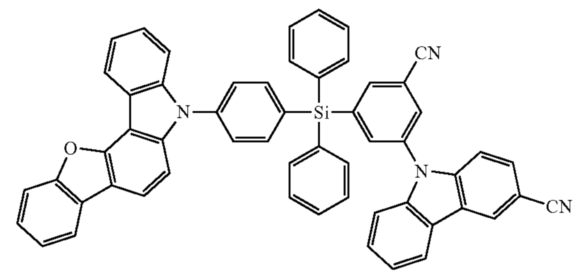
365
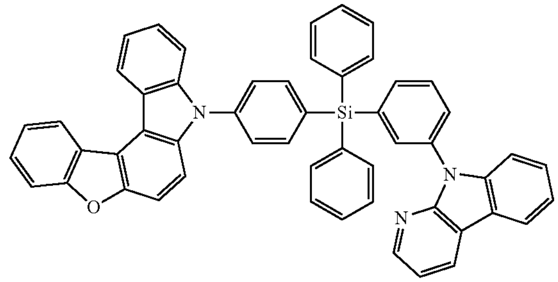
366
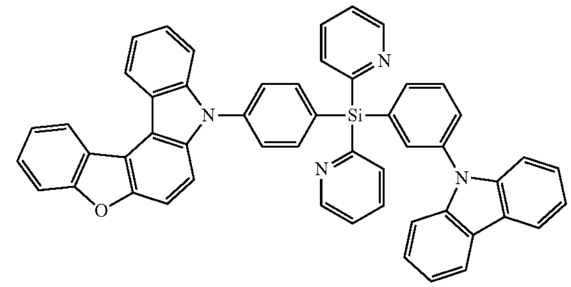
367
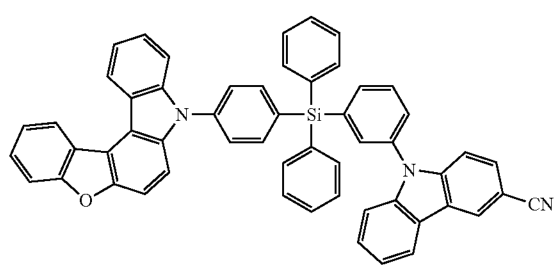
368
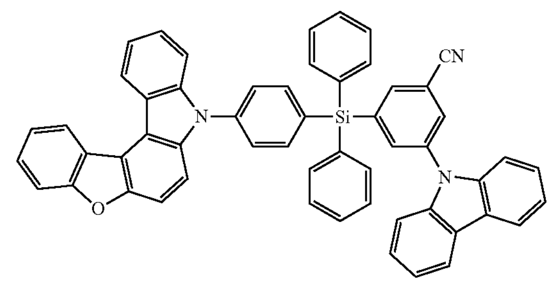
369
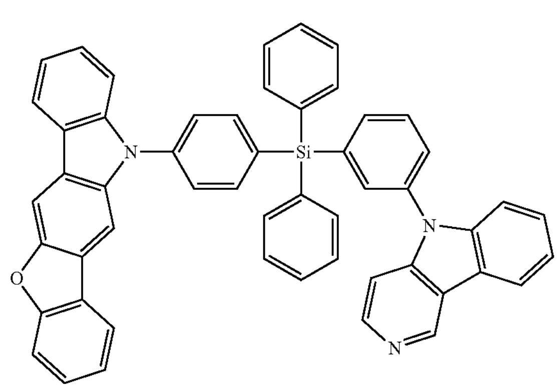
370
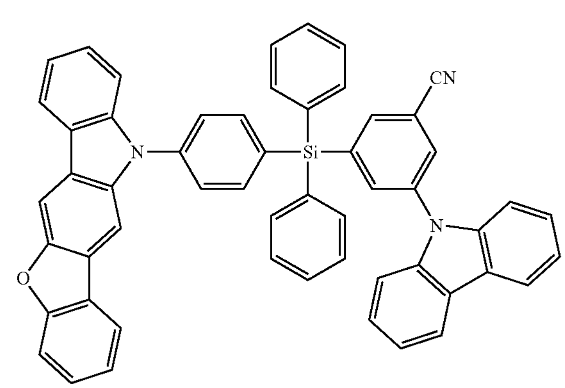

-continued
371
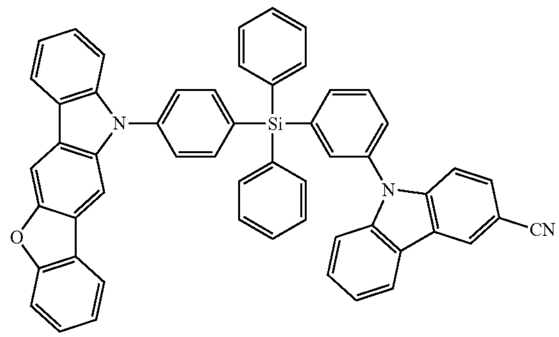
372
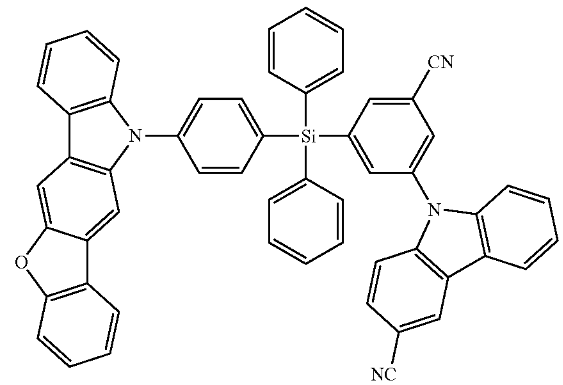
373
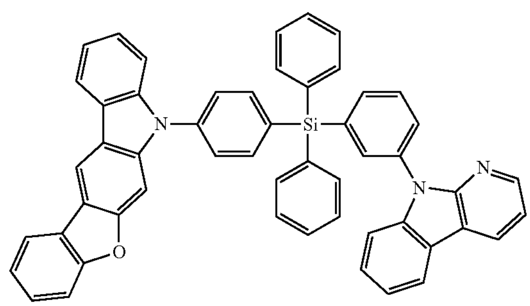
374
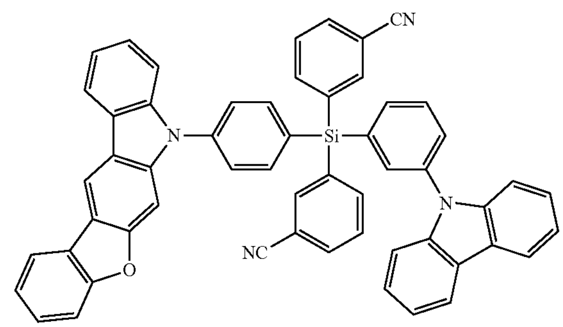
375
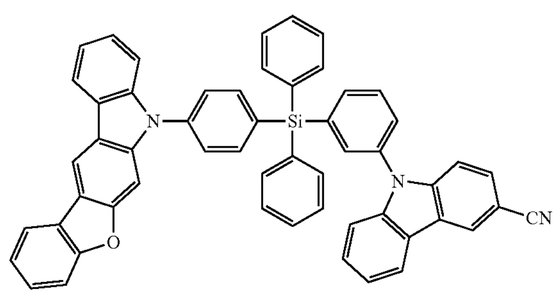
376
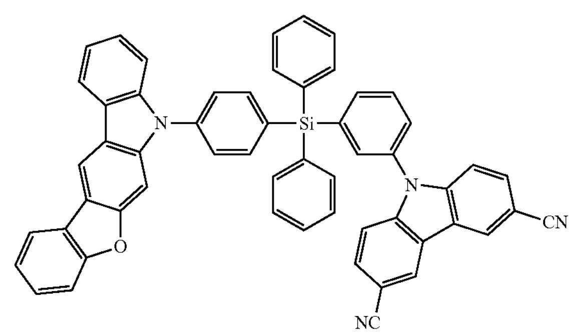
377
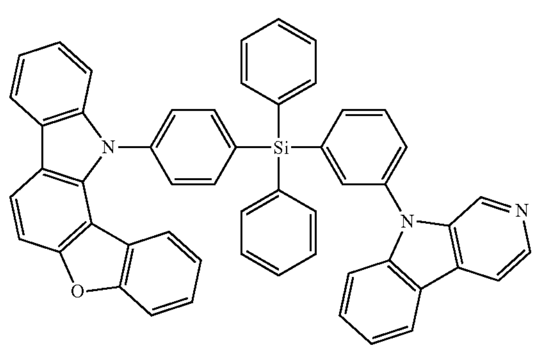
378
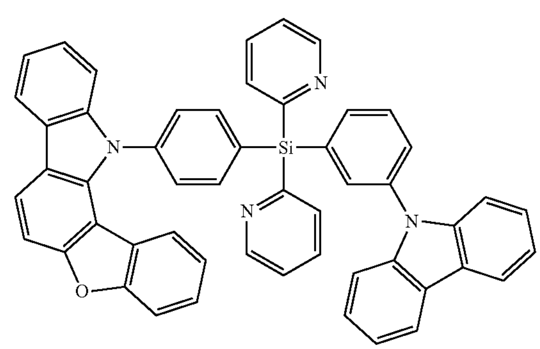

-continued
379
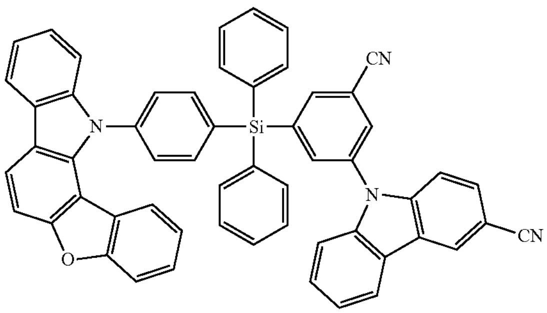
380
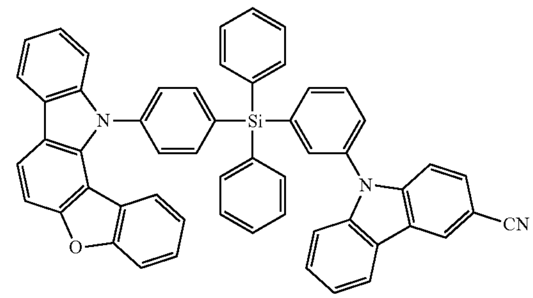
381
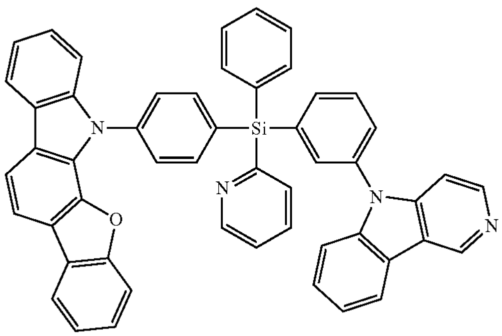
382
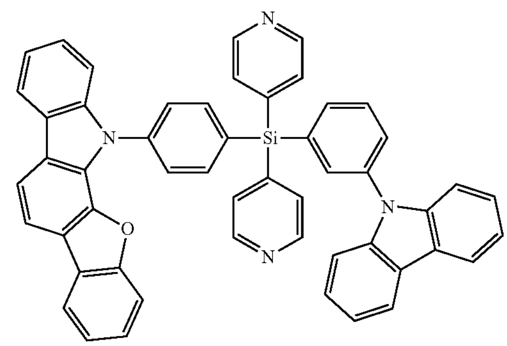
383
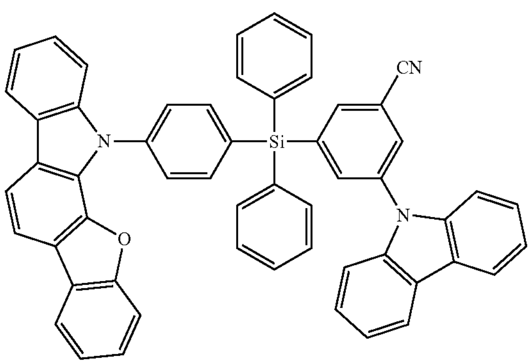
384
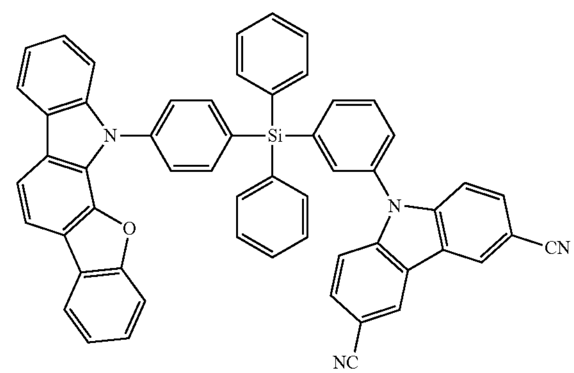
385
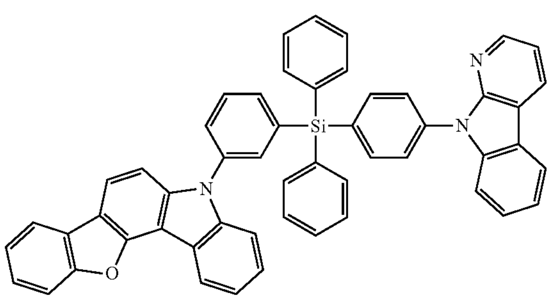
386
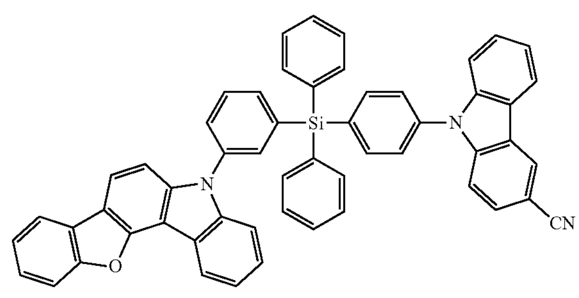

-continued
387
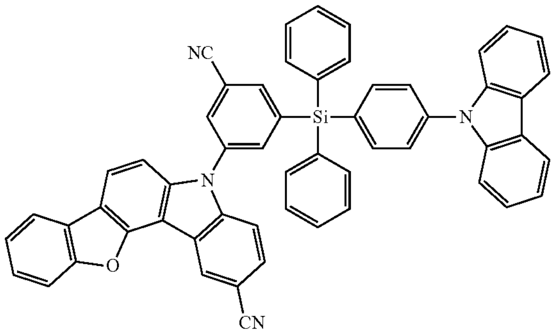
388
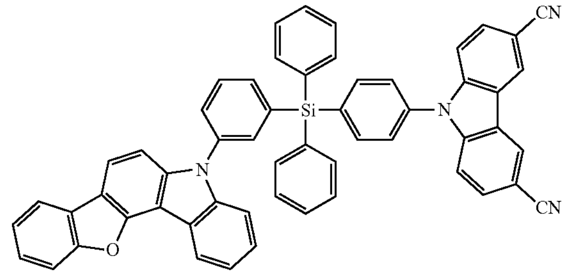
389
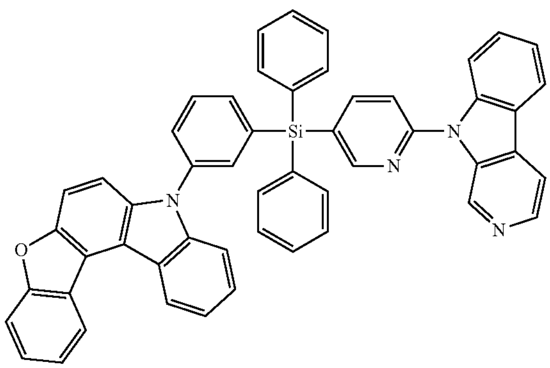
390
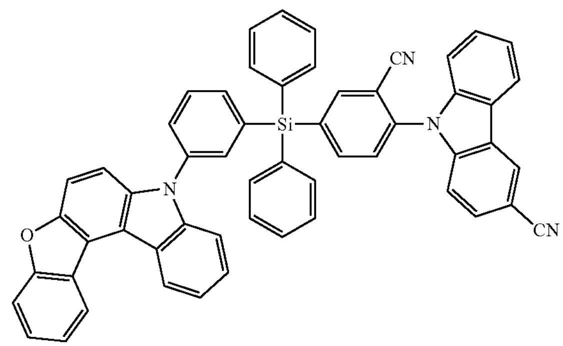
391
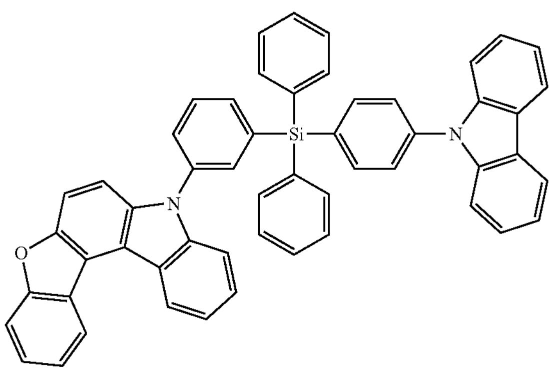
392
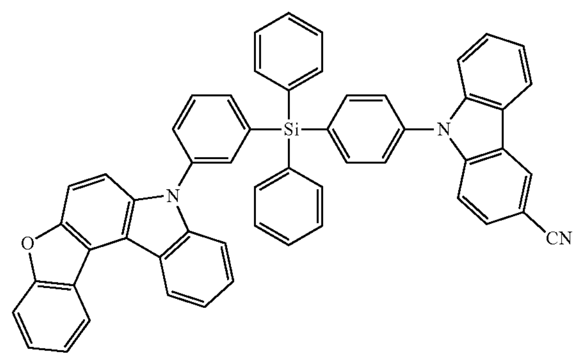
393
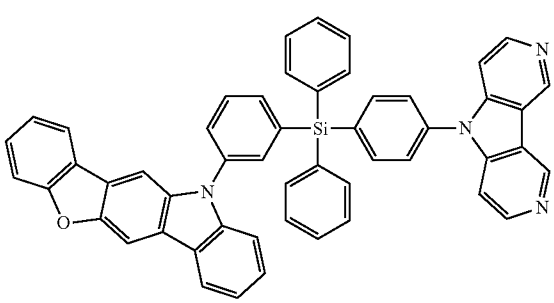
394
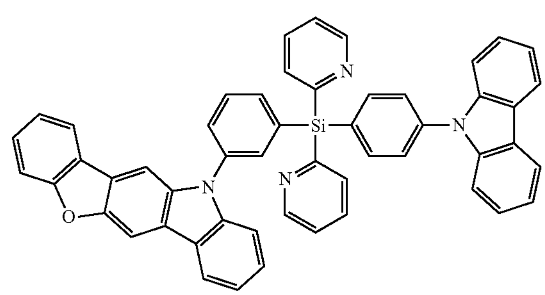

-continued
395
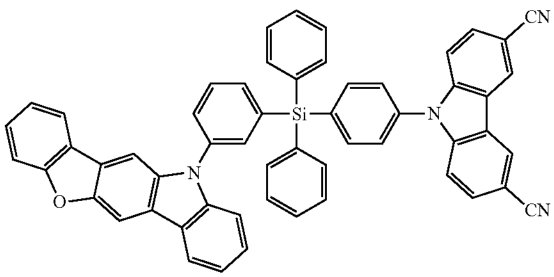
396
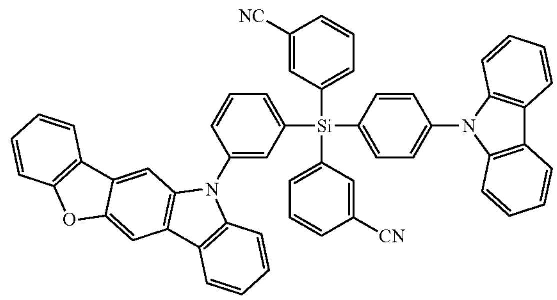
397
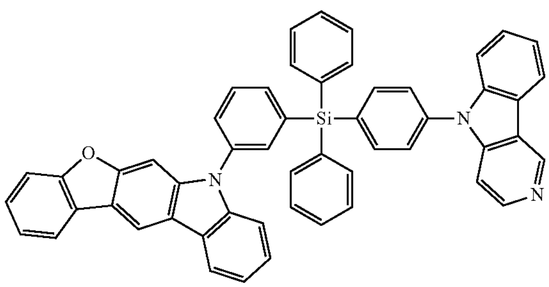
398
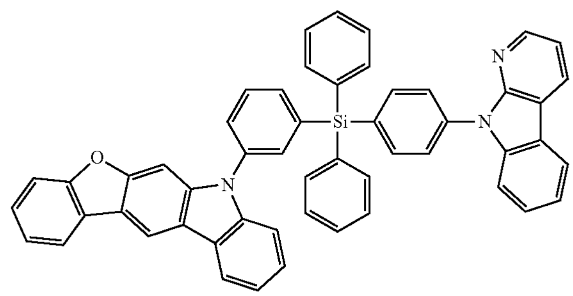
399
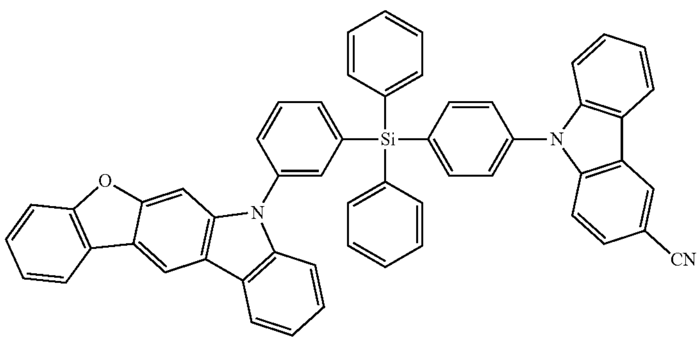
400
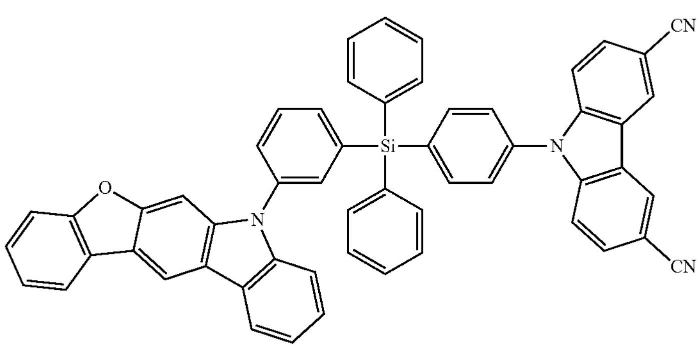

-continued
401
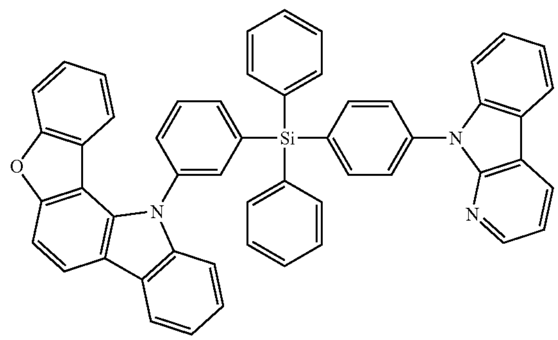
402
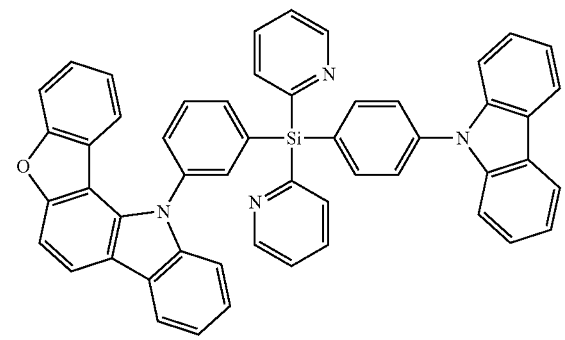
403
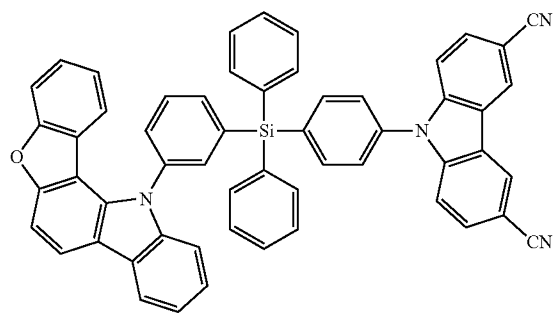
404
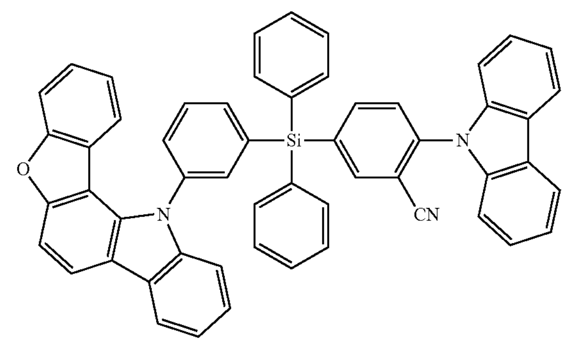
405
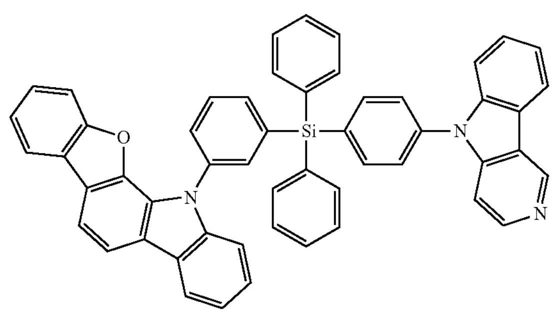
406
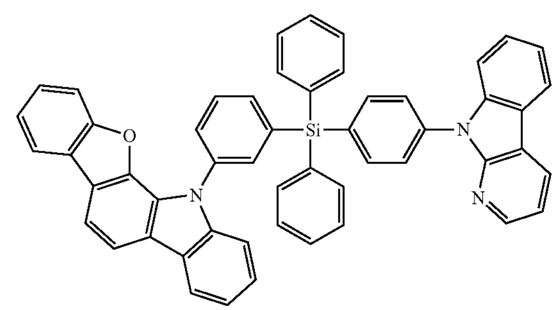
407
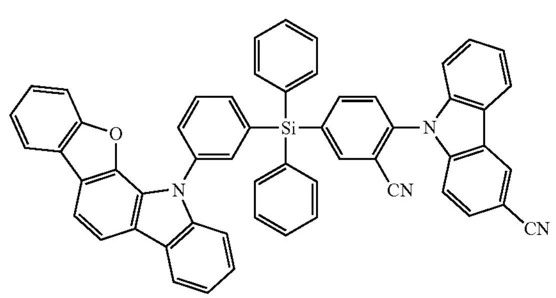
408
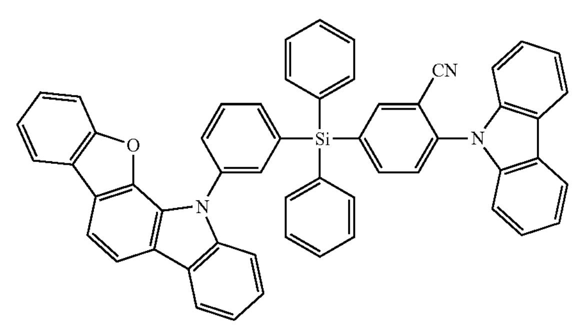

-continued
409
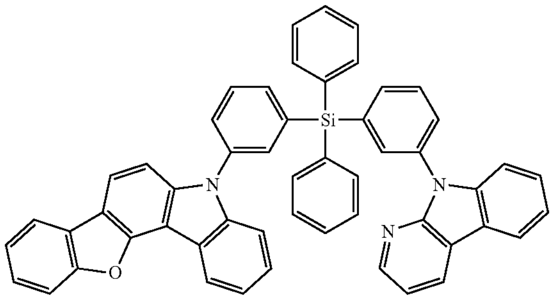
410
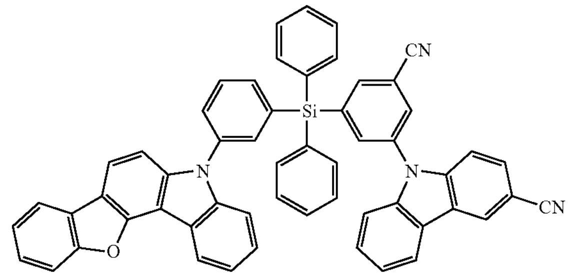
411
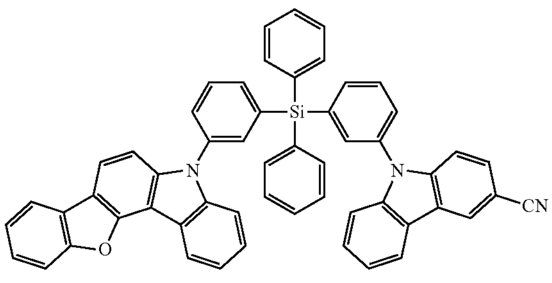
412
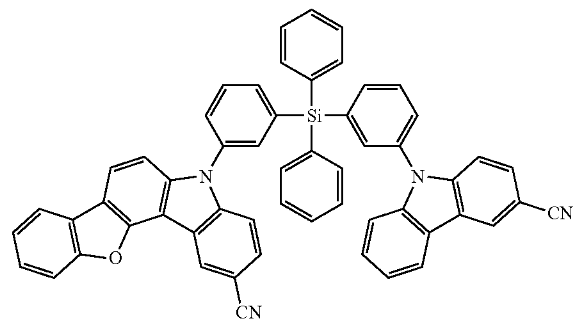
413
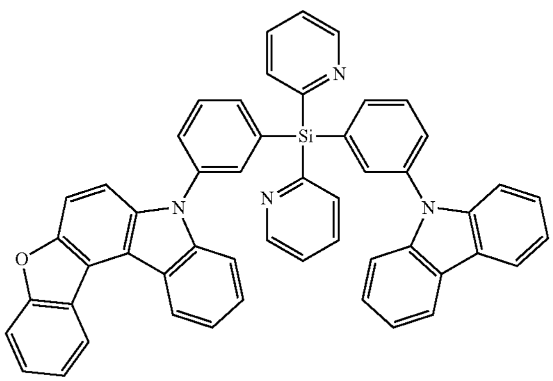
414
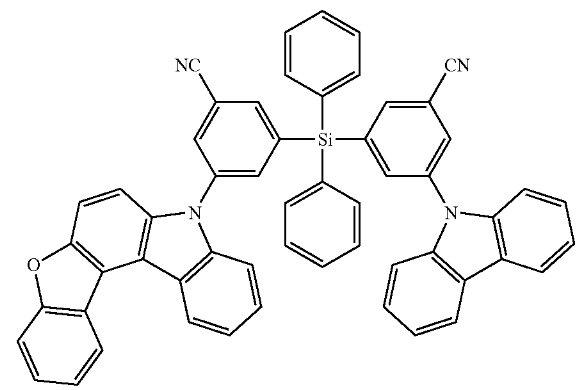
415
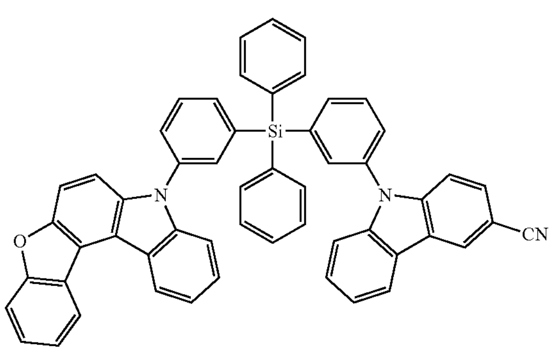
416
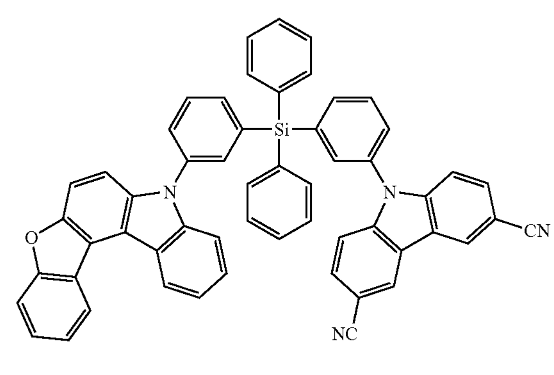

-continued
417
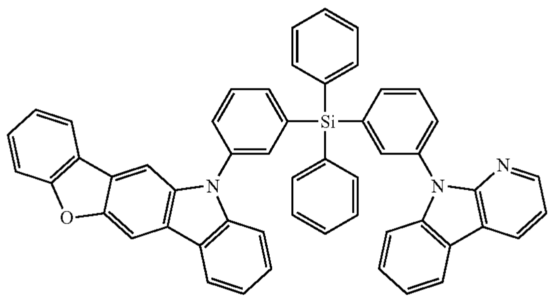
418
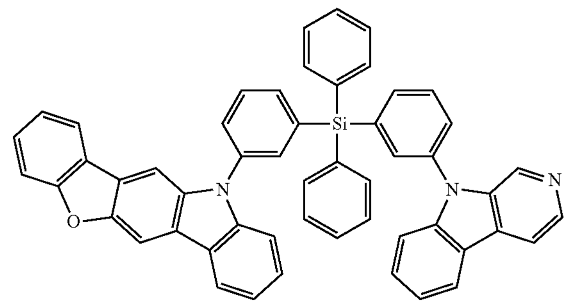
419
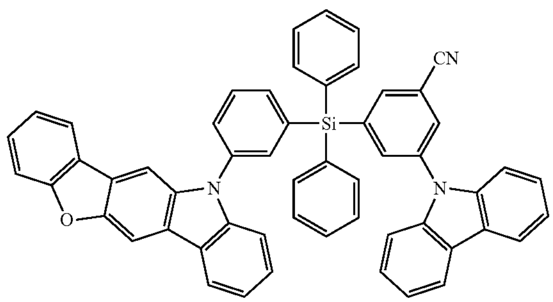
420
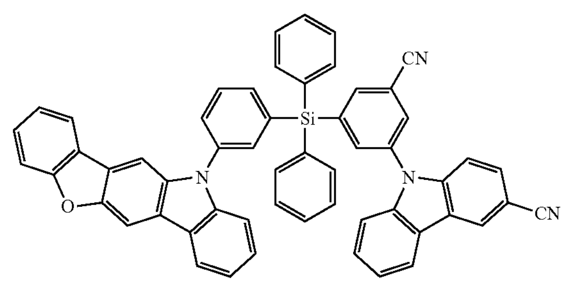
421
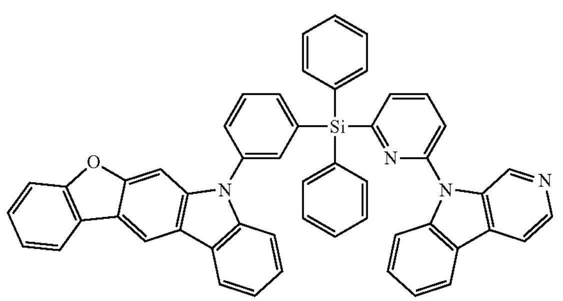
422
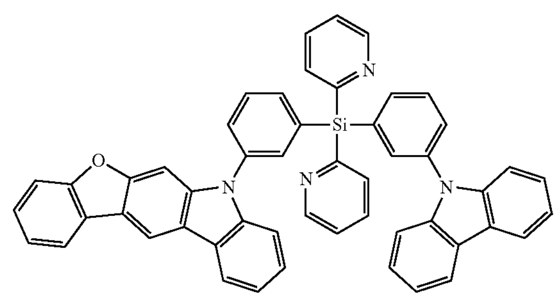
423
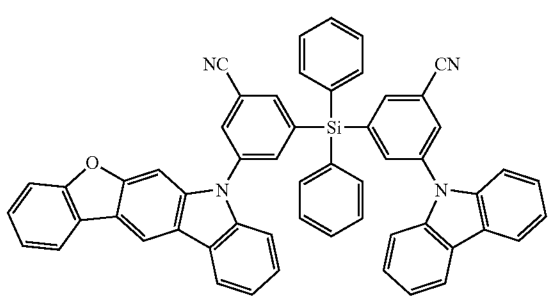
424
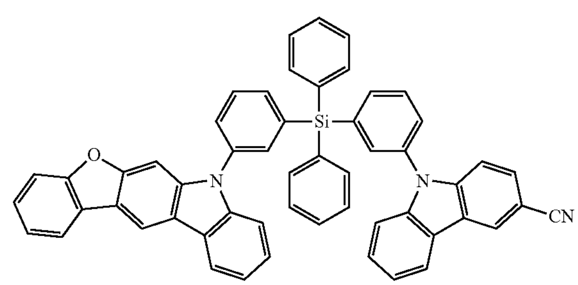
425
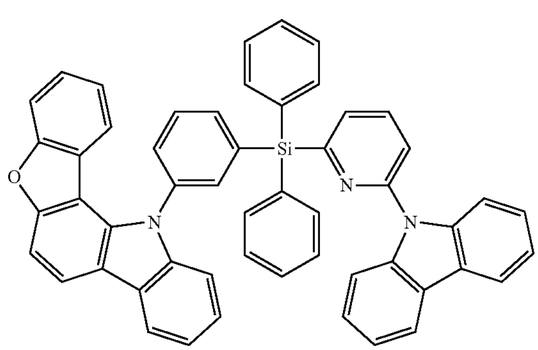
426
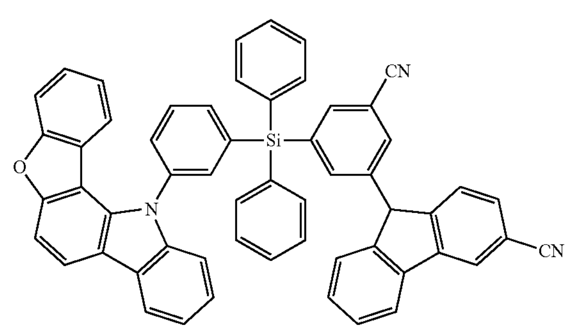

-continued
427
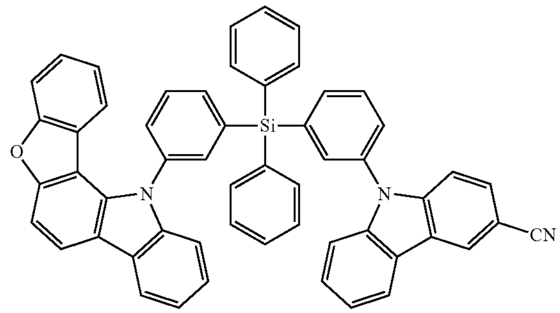
428
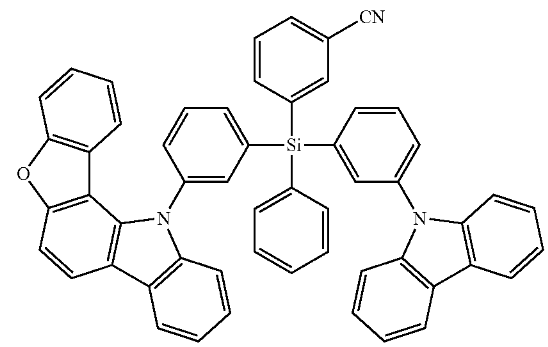
429
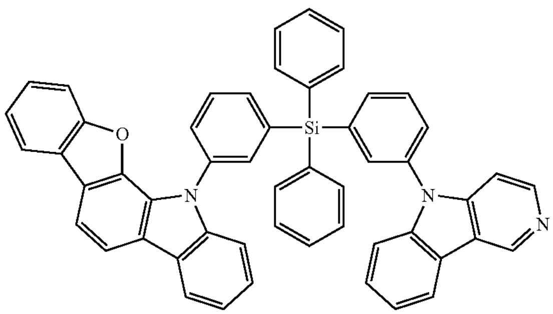
430
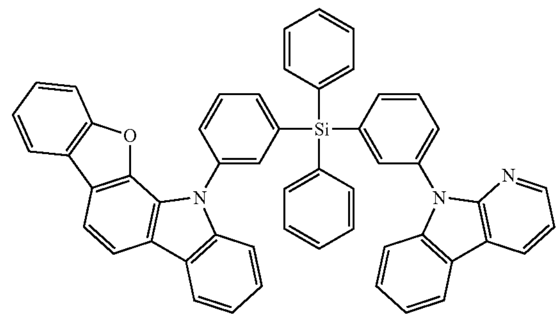
431
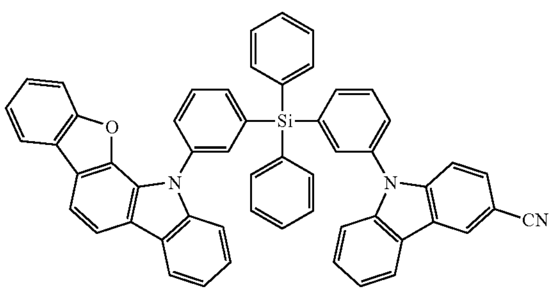
432
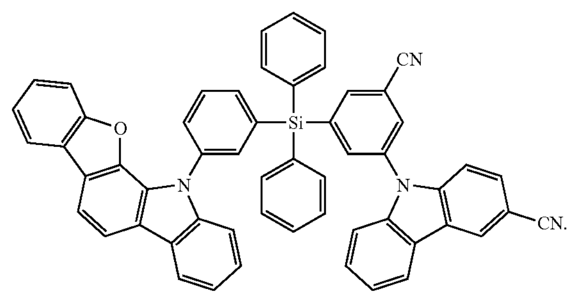
The term "Ph" used herein is a phenyl group.
In an embodiment, an example of the hole-transporting host may be Compound H1. In an embodiment, an example of the electron-transporting host may be Compound H2:
H1
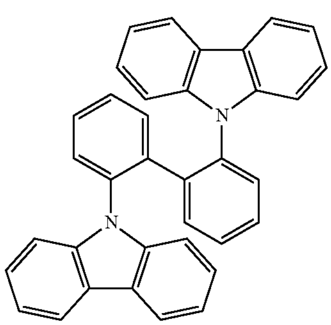
-continued
H2
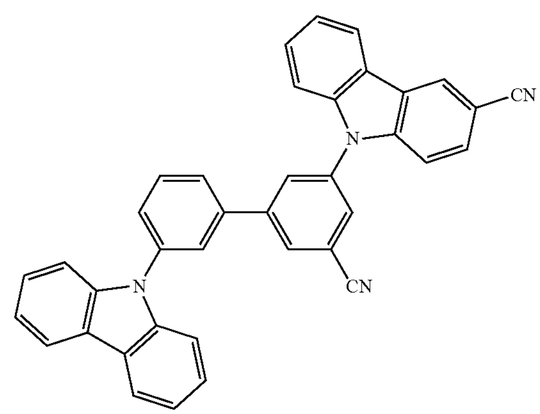

Dopant in Emission Layer 15

A dopant in the emission layer 15 may be a phosphorescent dopant.

In an embodiment, the phosphorescent dopant may be a blue dopant.

In an embodiment, the phosphorescent dopant may be a blue platinum dopant.

In an embodiment, the phosphorescent dopant may include a transition metal and a tetradentate ligand.

In an embodiment, the phosphorescent dopant may include an organometallic compound represented by Formula 11 below:

Formula 11

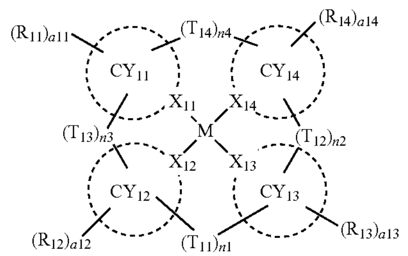

wherein, in Formula 11,

M may be a transition metal, $X_{11}$ to $X_{14}$ may each independently be C or N, two of a bond between $X_{11}$ and M, a bond between $X_{12}$ and M, a bond between $X_{13}$ and M, and a bond between $X_{14}$ and M may be coordinate bonds, and the other two bonds may be covalent bonds, ring $CY_{11}$ to ring $CY_{14}$ may each independently be a $C_5$-$C_{30}$ carbocyclic group or a $C_1$-$C_{30}$ heterocyclic group, $T_{11}$ may be a single bond, a double bond, *—N($R_{15a}$)—*', *—B($R_{15a}$)—*', *—P($R_{15a}$)—*', *—C($R_{15a}$)($R_{15b}$)—*', *—Si($R_{15a}$)($R_{15b}$)—*', *—Ge($R_{15a}$)($R_{15b}$)—*', *—S—*', *—Se—*', *—O—*', *—C(═O)—*', *—S(═O)—*', *—S(═O)$_2$—*', *—C($R_{15a}$)═*', *═C($R_{15a}$)—*', *—C($R_{15a}$)═C($R_{15b}$)—*', *—C(═S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $T_{12}$ may be a single bond, a double bond, *—N($R_{16a}$)—*', *—B($R_{16a}$)—*', *—P($R_{16a}$)—*', *—C($R_{16a}$)($R_{16b}$)—*', *—Si($R_{16a}$)($R_{16b}$)—*', *—Ge($R_{16a}$)($R_{16b}$)—*', *—S—*', *—Se—*', *—O—*', *—C(═O)—*', *—S(═O)—*', *—S(═O)$_2$—*', *—C($R_{16a}$)═*', *═C($R_{16a}$)—*', *—C($R_{16a}$)═C($R_{16b}$)—*', *—C(═S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $T_{13}$ may be a single bond, a double bond, *—N($R_{17a}$)—*', *—B($R_{17a}$)—*', *—P($R_{17a}$)—*', *—C($R_{17a}$)($R_{17b}$)—*', *—Si($R_{17a}$)($R_{17b}$)—*', *—Ge($R_{17a}$)($R_{17b}$)—*', *—S—*', *—Se—*', *—O—*', *—C(═O)—*', *—S(═O)—*', *—S(═O)$_2$—*', *—C($R_{17a}$)═*', *═C($R_{17a}$)—*', *—C($R_{17a}$)═C($R_{17b}$)—*', *—C(═S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $T_{14}$ may be a single bond, a double bond, *—N($R_{18a}$)—*', *—B($R_{18a}$)—*', *—P($R_{18a}$)—*', *—C($R_{18a}$)($R_{18b}$)—*', *—Si($R_{18a}$)($R_{18b}$)—*', *—Ge($R_{18a}$)($R_{18b}$)—*', *—S—*', *—Se—*', *—O—*', *—C(═O)—*', *—S(═O)—*', *—S(═O)$_2$—*', *—C($R_{18a}$)═*', *═C($R_{18a}$)—*', *—C($R_{18a}$)═C($R_{18b}$)—*', *—C(═S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, n1 to n4 may each independently be an integer from 0 to 5, and three or more of n1 to n4 may each independently be an integer from 1 to 5, when n1 is 0, $T_{11}$ does not exist, when n2 is 0, $T_{12}$ does not exist, when n3 is 0, $T_{13}$ does not exist, when n4 is 0, $T_{14}$ does not exist, when n1 is 2 or more, two or more of $T_{11}$(s) may be identical to or different from each other, when n2 is 2 or more, two or more of $T_{12}$(s) may be identical to or different from each other, when n3 is 2 or more, two or more of $T_{13}$(s) may be identical to or different from each other, and when n4 is 2 or more, two or more of $T_{14}$(s) may be identical to or different from each other, $R_{11}$ to $R_{14}$, $R_{15a}$, $R_{15b}$, $R_{16a}$, $R_{16b}$, $R_{17a}$, $R_{17b}$, $R_{18a}$, and $R_{18b}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a11 to a14 may each independently be an integer from 0 to 20, two or more of $R_{11}$(s) in the number of a11 may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{12}$(s) in the number of a12 may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{13}$(s) in the number of a13 may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{14}$(s) in the number of a14 may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{11}$ to $R_{14}$, $R_{15a}$, $R_{15b}$, $R_{16a}$, $R_{16b}$, $R_{17a}$, $R_{17b}$, $R_{18a}$, and $R_{18b}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is understood by referring to the description of $R_1$ provided herein,

* and *' each indicate a binding site to an adjacent atom, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_3)(Q_{34})(Q_{35})$, $—B(Q_{36})(Q_{37})$, $—P(=O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group which is unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group which is unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

In an embodiment, M in Formula 11 may be Pt, Pd, or Au.

In one or more embodiments, a bond between $X_{11}$ and M in Formula 11 may be a coordinate bond.

In one or more embodiments, in Formula 11, $X_{11}$ may be C, and a bond between $X_{11}$ and M may be a coordinate bond. That is, $X_{11}$ in Formula 11 may be C in a carbene moiety.

In one or more embodiments, ring $CY_{11}$ to ring $CY_{14}$ in Formula 11 may each independently be i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, the first ring may be a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilane group.

An amount (weight) of the dopant in the emission layer 15 may be in a range of about 0.1 part by weight to about 20 parts by weight based on 100 parts by weight of the emission layer 15.

Hole-Transporting Region 12

The hole-transporting region 12 may be located between the first electrode 11 and the emission layer 15 of the organic light-emitting device 10.

The hole-transporting region 12 may have a single-layered structure or a multi-layered structure.

For example, the hole transport region 12 may have a hole injection layer, a hole transport layer, a hole injection layer/hole transport layer structure, a hole injection layer/first hole transport layer/second hole transport layer structure, a hole injection layer/first hole transport layer/second hole transport layer/electron-blocking layer structure, a hole transport layer/interlayer structure, a hole injection layer/hole transport layer/interlayer structure, a hole transport layer/electron-blocking layer structure, or a hole injection layer/hole transport layer/electron-blocking layer structure.

The hole-transporting region 12 may include any compound having hole-transporting properties.

For example, the hole-transporting region 12 may include an amine-based compound.

In an embodiment, the hole-transporting region 12 may include, for example, m-MTDATA, TDATA, 2-TNATA, NPB, B-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), one of a compound represented by Formula 201 to a compound represented by Formula 205, or any combination thereof:

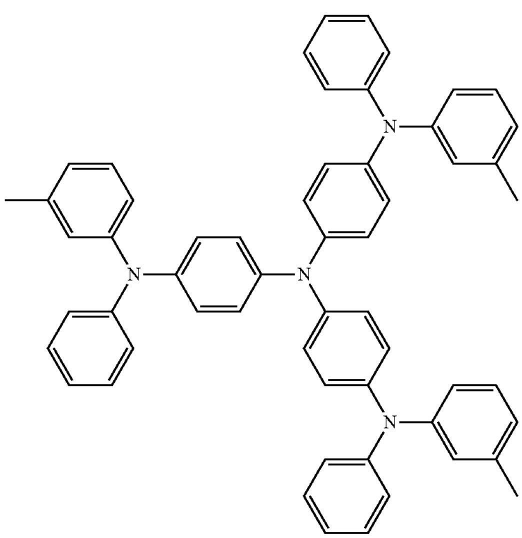

m-MTDATA

-continued

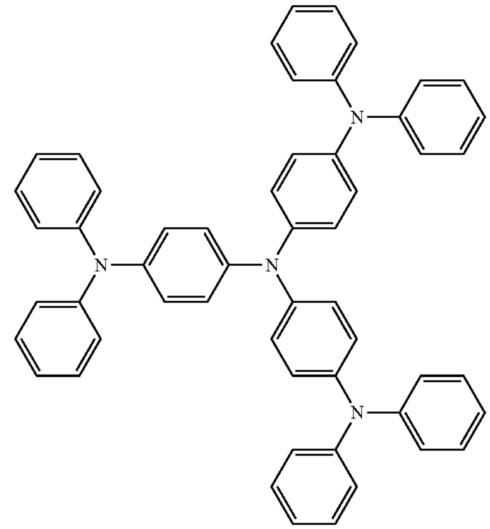

TDATA

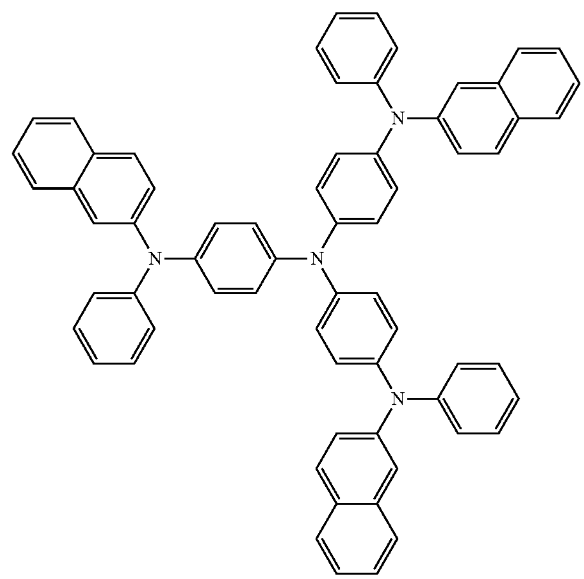

2-TNATA

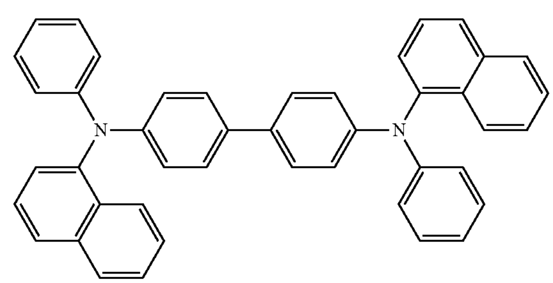

NPB

-continued
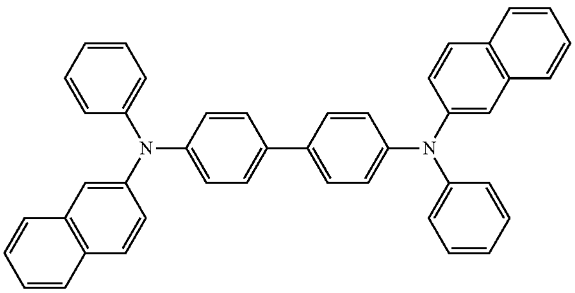
β-NPB
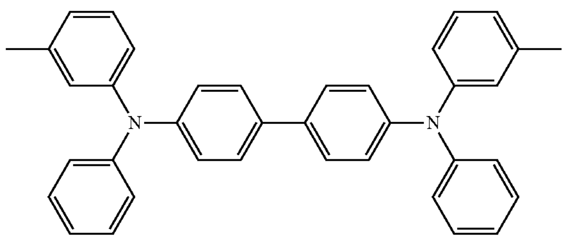
TPD
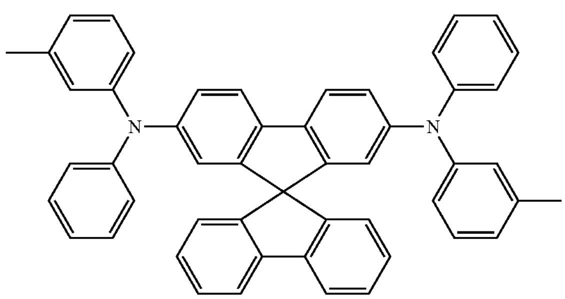
Spiro-TPD
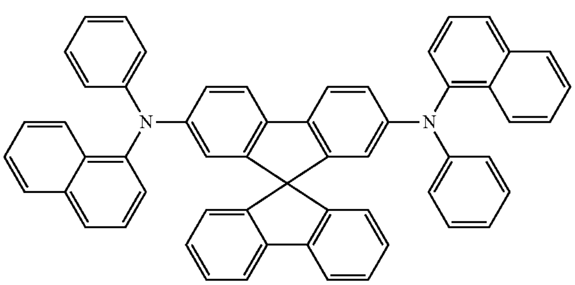
Spiro-NPB
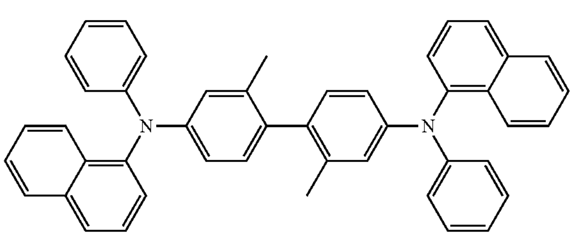
methylated NPB
-continued
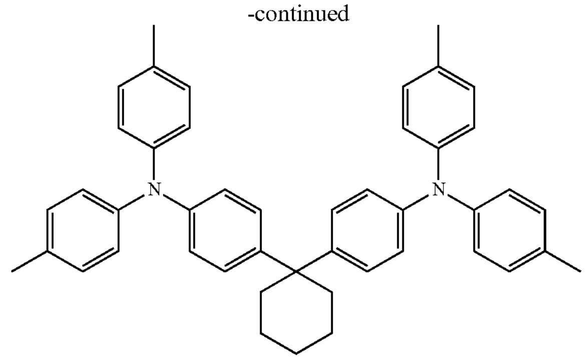
TAPC
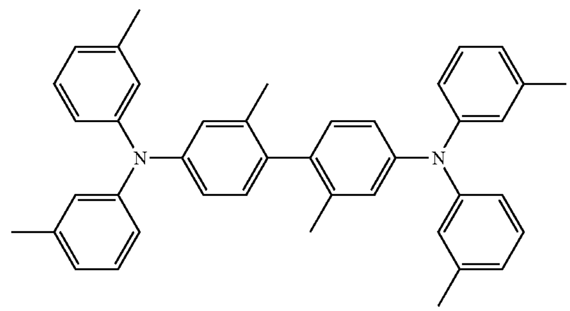
HMTPD
Formula 201
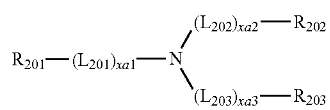
Formula 202
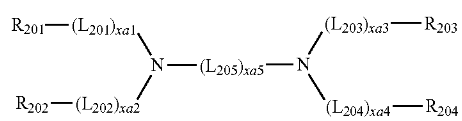
Formula 203
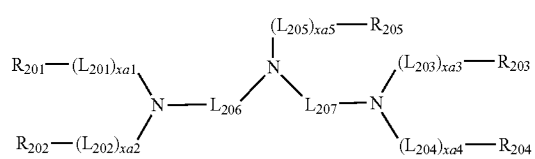
Formula 204
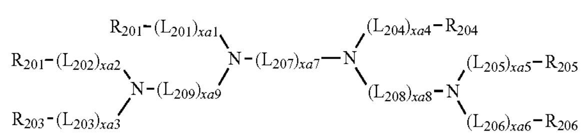
Formula 205
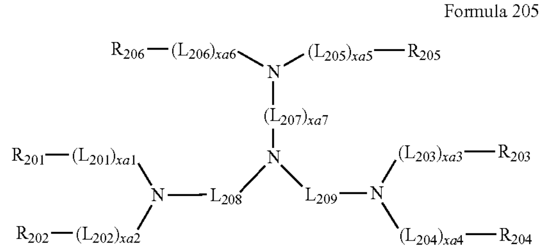
wherein, in Formulae 201 to 205,
$L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

For example, $L_{201}$ to $L_{209}$ may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —$Si(Q_{11})(Q_{12})(Q_{13})$, or any combination thereof, xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof.

$Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, the hole-transporting region 12 may include a carbazole-containing amine-based compound.

In an embodiment, the hole-transporting region 12 may include a carbazole-containing amine-based compound and a carbazole-free amine-based compound.

The carbazole-containing amine-based compound may include, for example, a compound represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

The carbazole-free amine-based compound may include, for example, a compound represented by Formula 201 not including a carbazole group and including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In one or more embodiments, the hole transport region 12 may include a compound represented by Formula 201, a compound represented by Formula 202, or any combination thereof.

In an embodiment, the hole transport region 12 may include a compound represented by Formula 201-1, 202-1, or 201-2, or any combination thereof:

Formula 201-1

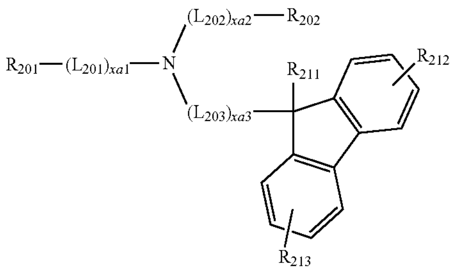

Formula 202-1

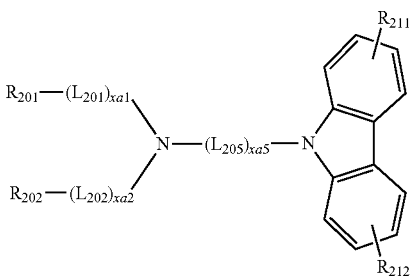

-continued

Formula 201-2

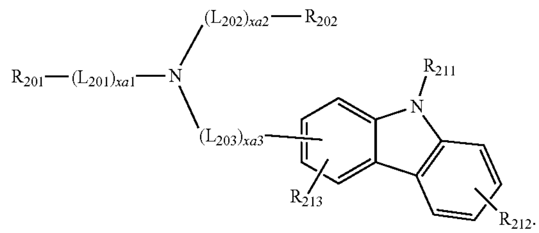

In Formulae 201-1, 202-1, and 201-2, $L_{201}$ to $L_{203}$, $L_{205}$, xa1 to xa3, xa5, $R_{201}$ and $R_{202}$ are the same as described herein, and $R_{211}$ to $R_{213}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole transport region 12 may include one of Compounds HT1 to HT39 or any combination thereof:

HT1

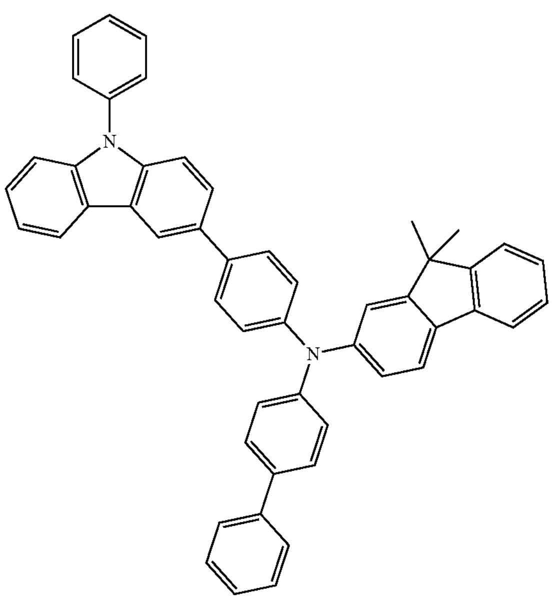

HT2

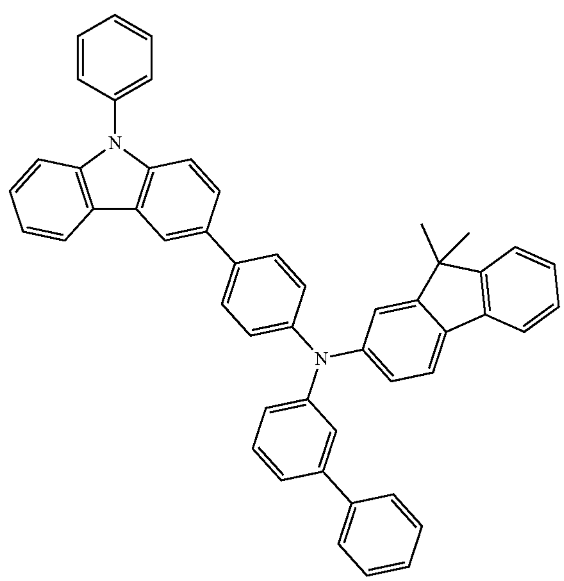

-continued
HT3
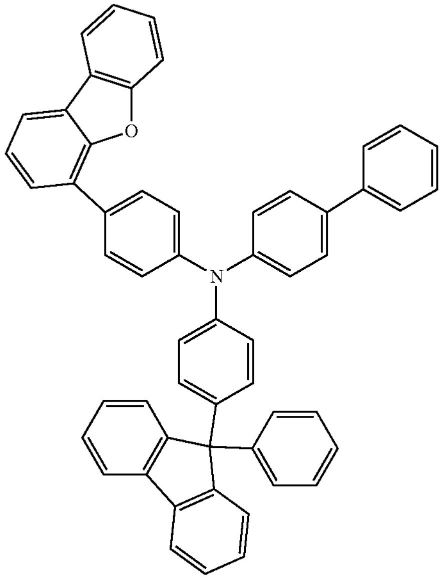
HT4
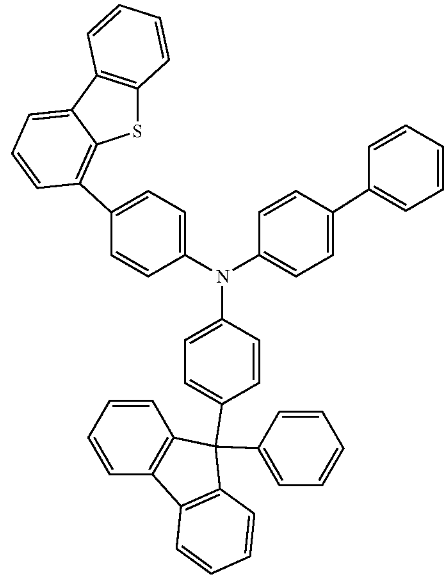
HT5
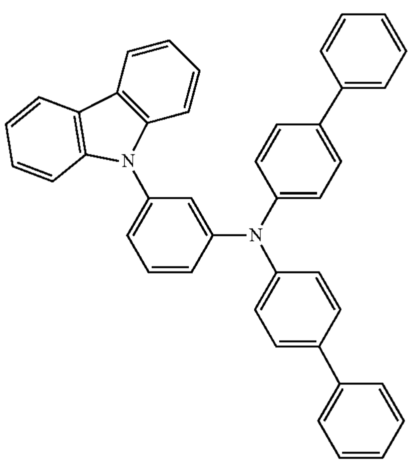
HT6
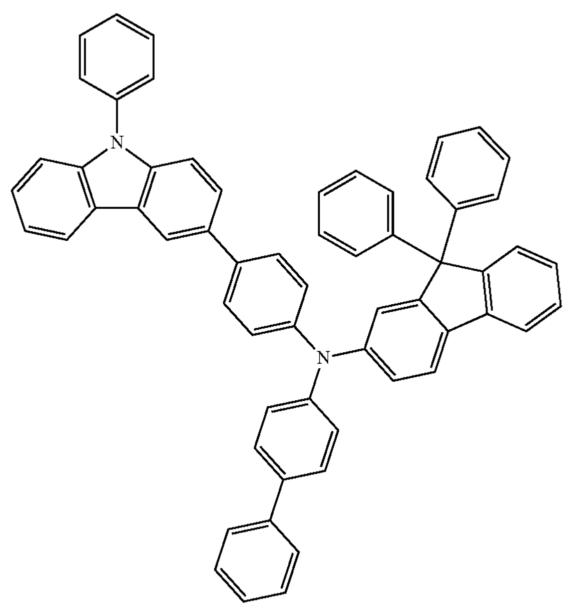

-continued
HT7
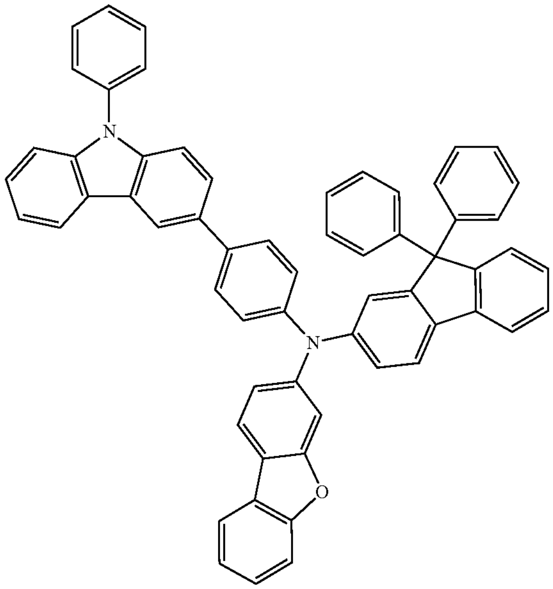
HT8
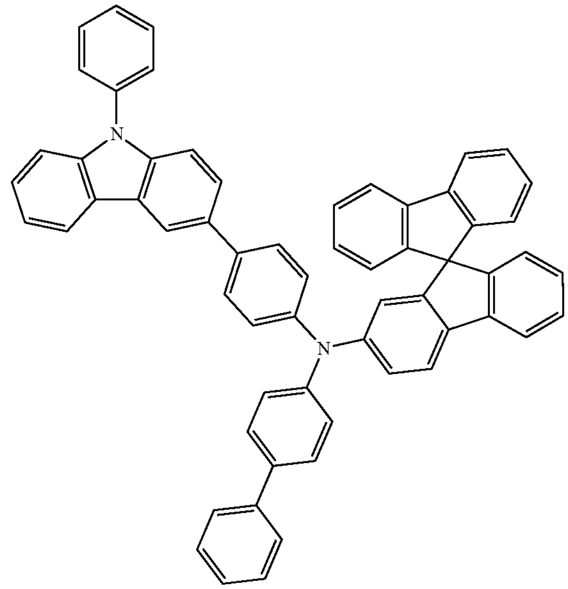
HT9
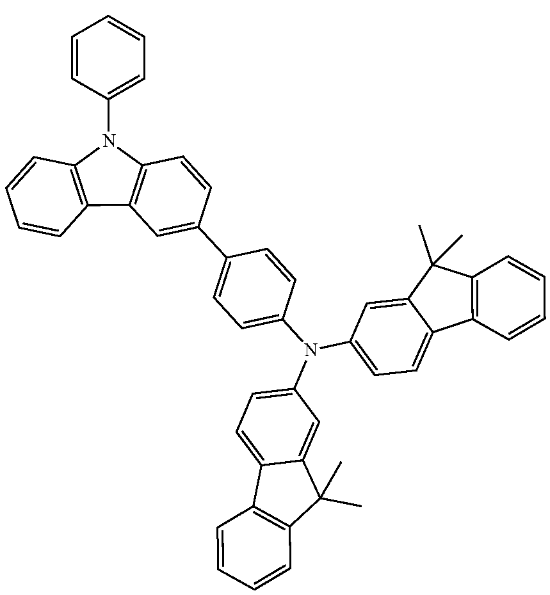
HT10
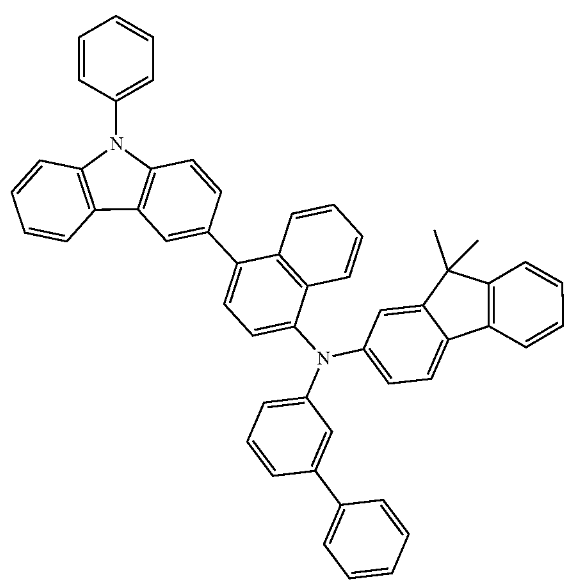

-continued
HT11
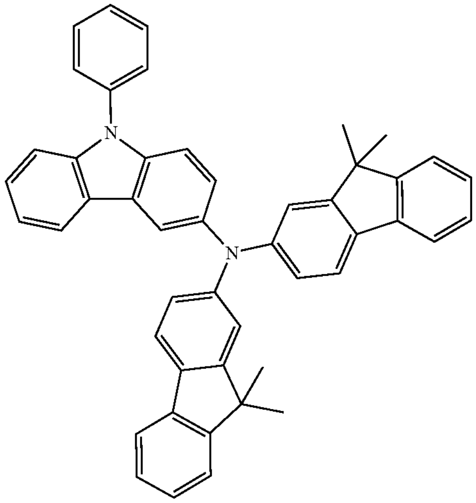
HT12
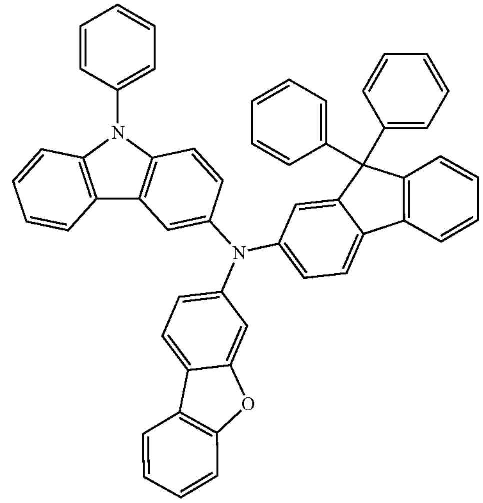
HT13
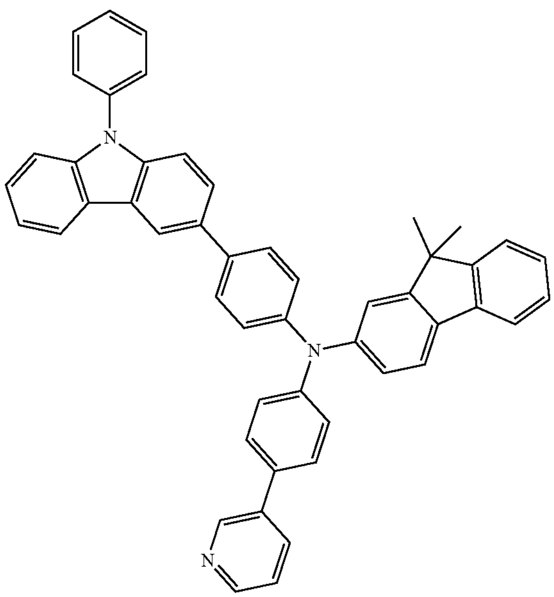
HT14
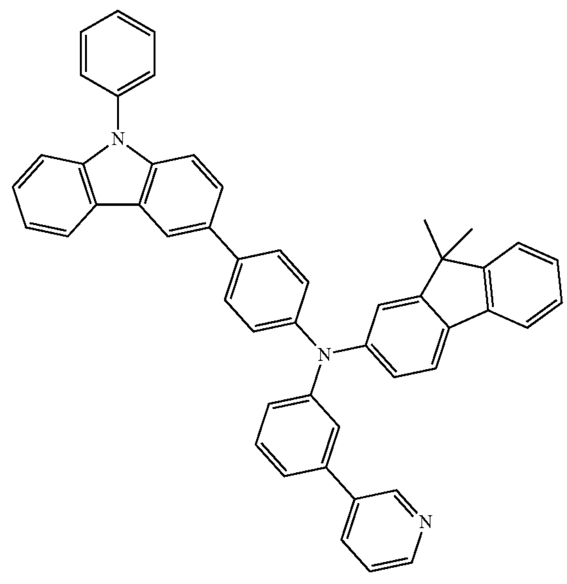
HT15
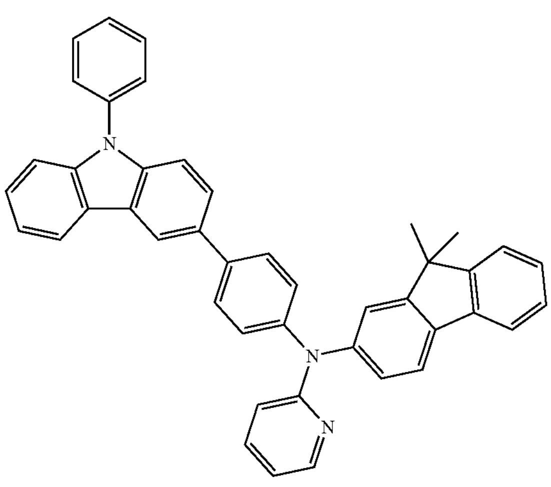
HT16
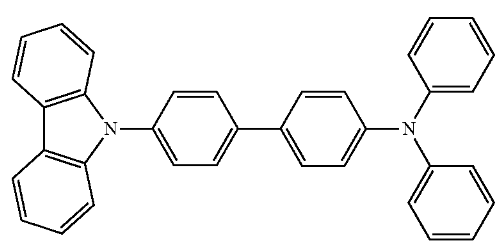

-continued
HT17
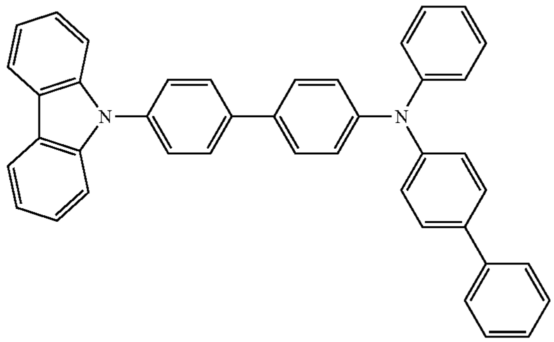
HT18
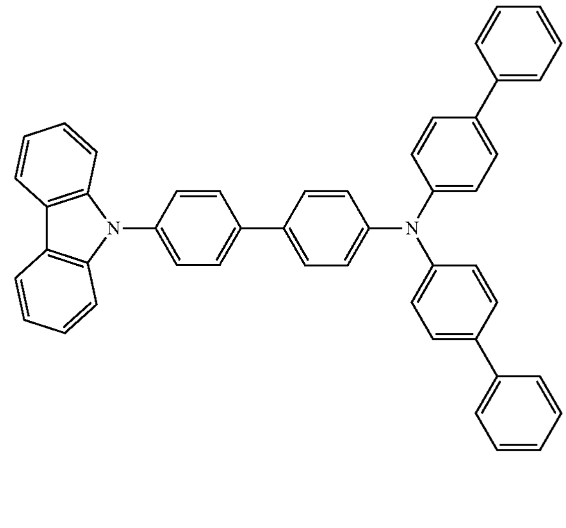
HT19
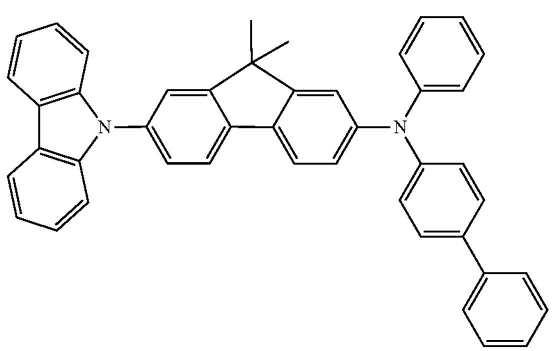
HT20
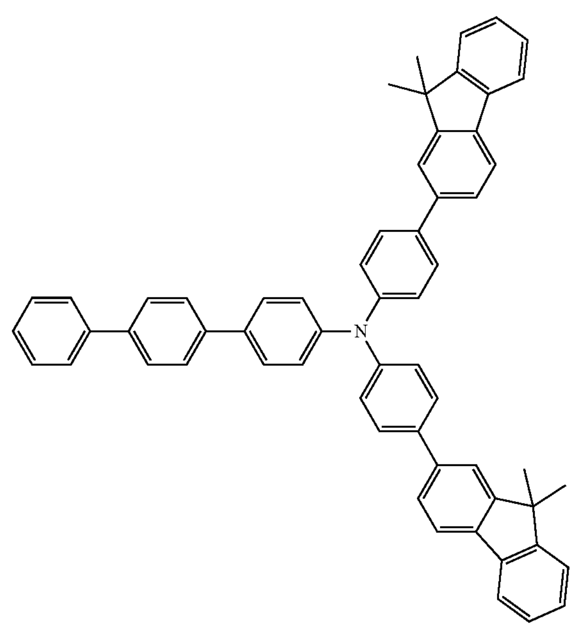

-continued
HT21
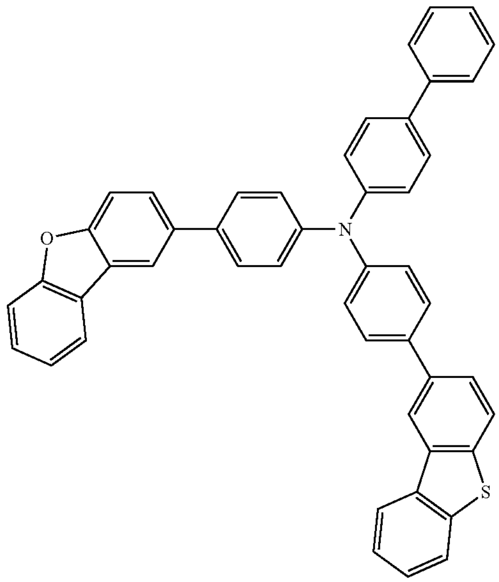
HT22
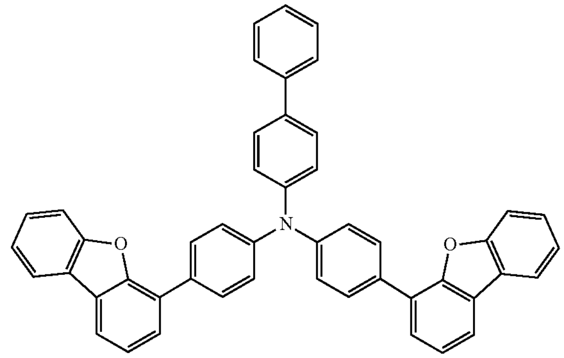
HT23
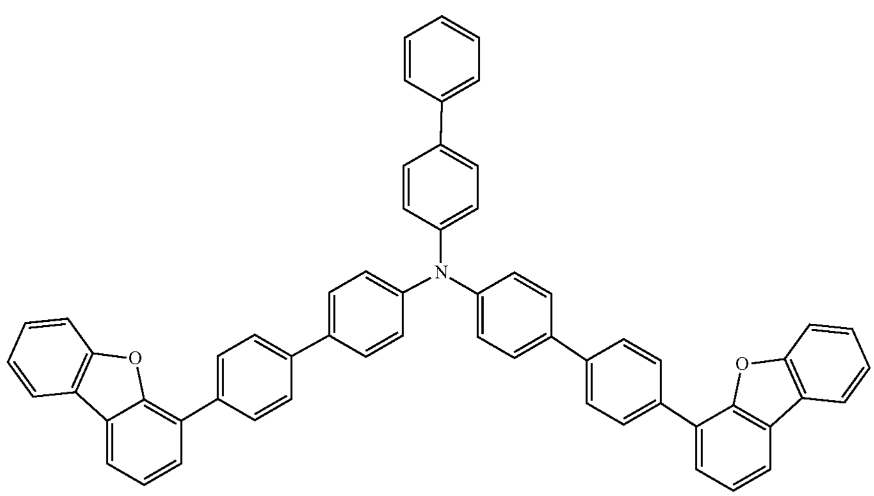

-continued
HT24
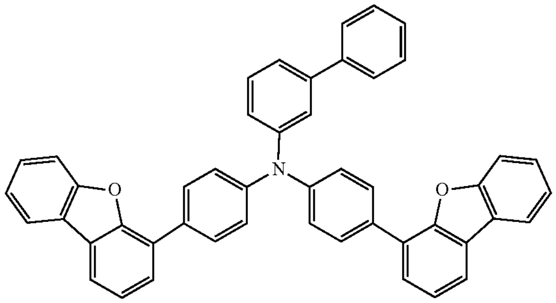
HT25
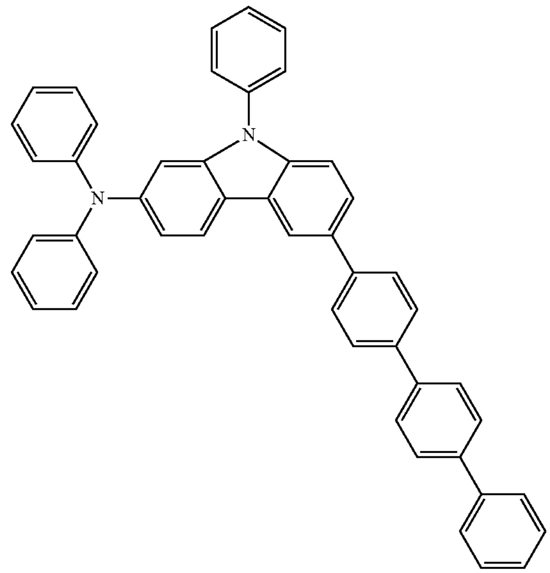
HT26
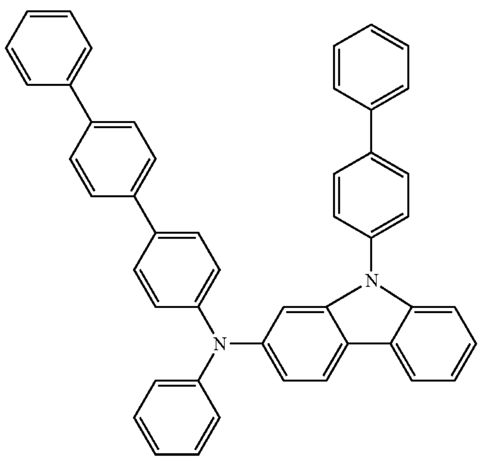
HT27
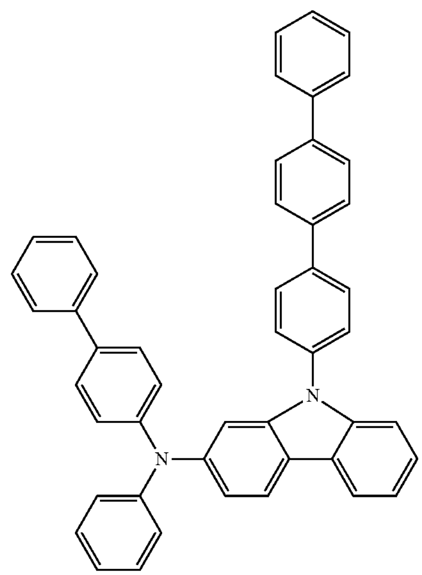
HT28
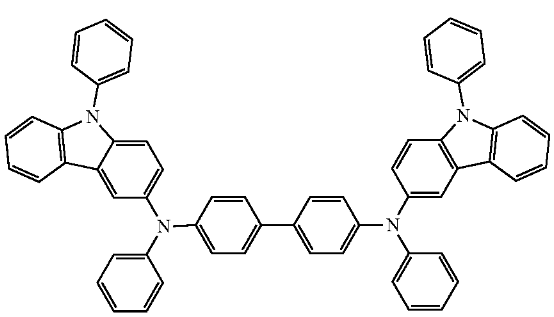
HT29
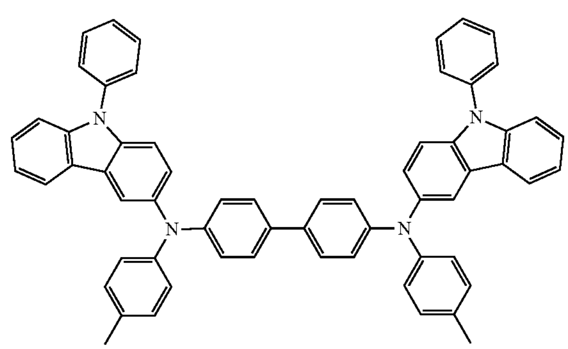

-continued
HT30
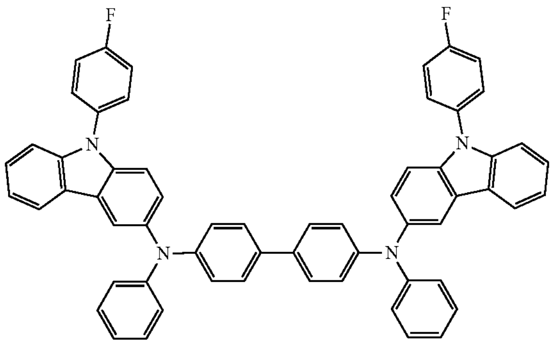
HT31
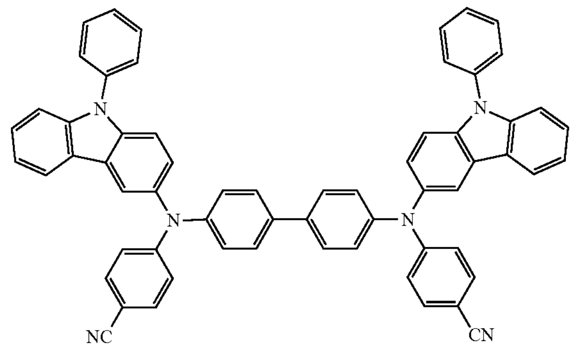
HT32
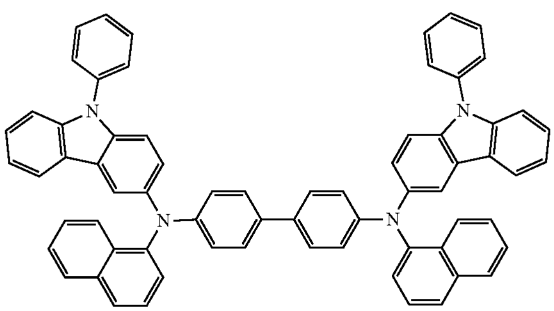
HT33
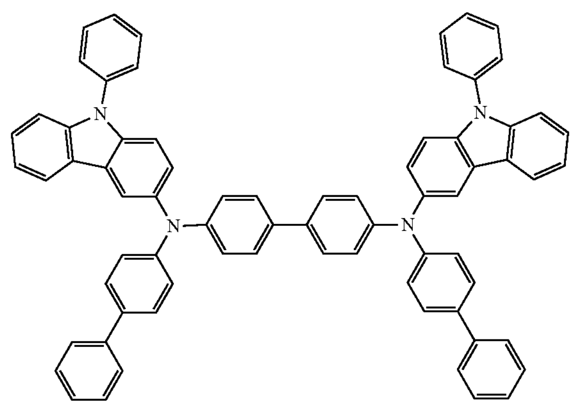
HT34
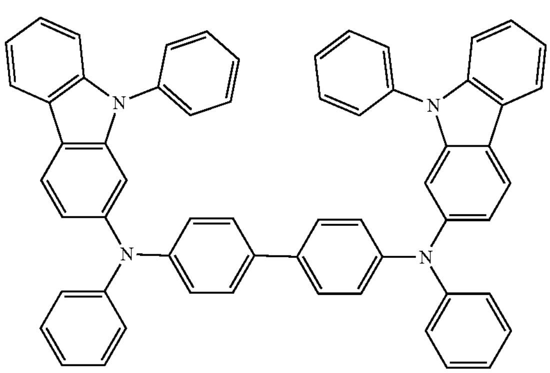
HT35
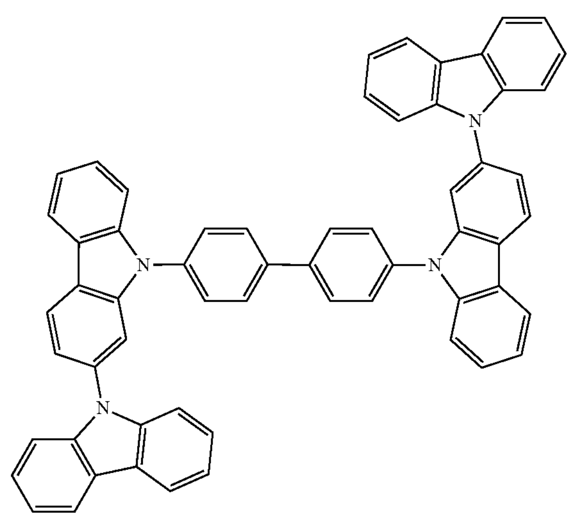

-continued

HT36

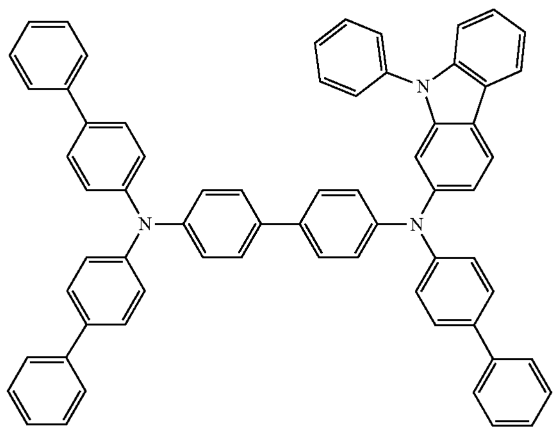

HT37

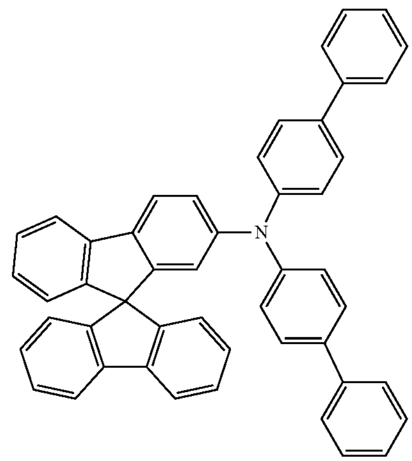

HT38

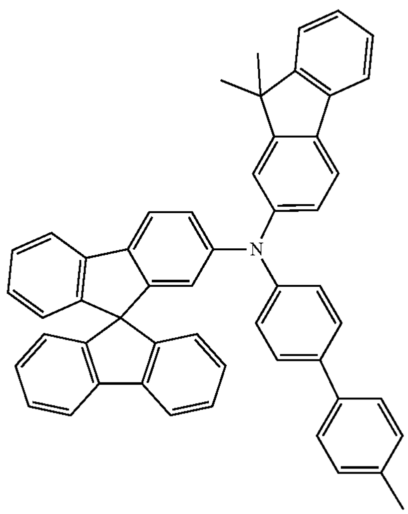

HT39

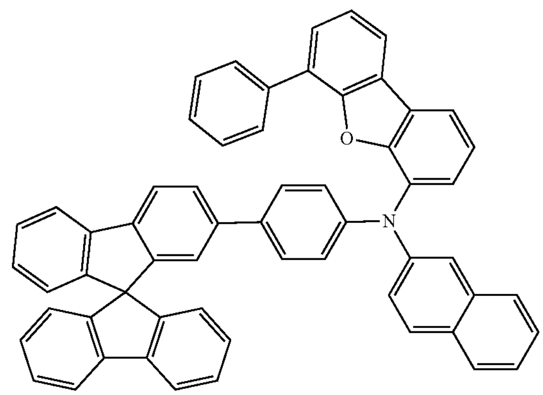

In one or more embodiments, hole-transporting region 12 of the organic light-emitting device 10 may further include a p-dopant. When the hole-transporting region 12 further includes a p-dopant, the hole-transporting region 12 may have a matrix (for example, at least one of compounds represented by Formulae 201 to 205) and a p-dopant included in the matrix. The p-dopant may be uniformly or non-uniformly doped in the hole-transporting region 12.

In an embodiment, the LUMO energy level of the p-dopant may be about-3.5 eV or less.

The p-dopant may include a quinone derivative, a metal oxide, a cyano group-containing compound, or any combination thereof.

In an embodiment, the p-dopant may include:

a quinone derivative, such as tetracyanoquinodimethane (TCNQ),2,3,5,6-tetrafluoro-7,7,8,8-tetracyanoquinodimethane (F4-TCNQ), or F6-TCNNQ;

a metal oxide, such as tungsten oxide or molybdenum oxide;

1,4,5,8,9,12-hexaazatriphenylene-hexacarbonitrile (HAT-CN);

a compound represented by Formula 221; or any combination thereof:

Formula 221

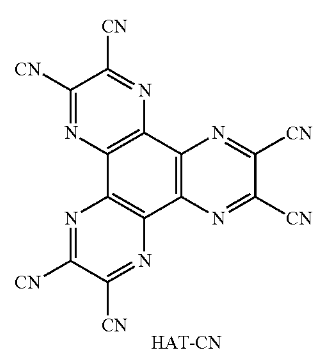

HAT-CN

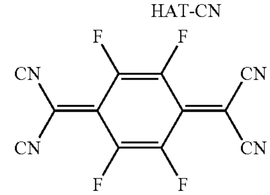

F4-TCNQ

-continued

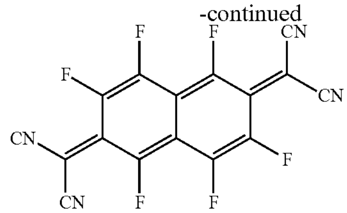

F6-TCNNQ

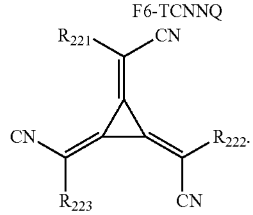

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one substituent of $R_{221}$ to $R_{223}$ may be: a cyano group; —F; —$C_1$; —Br; —I; a $C_1$-$C_{20}$ alkyl group substituted with —F; a $C_1$-$C_{20}$ alkyl group substituted with —Cl; a $C_1$-$C_{20}$ alkyl group substituted with —Br; a $C_1$-$C_{20}$ alkyl group substituted with —I; or any combination thereof.

The compound represented by Formula 221 may include, for example, Compound HT-D2:

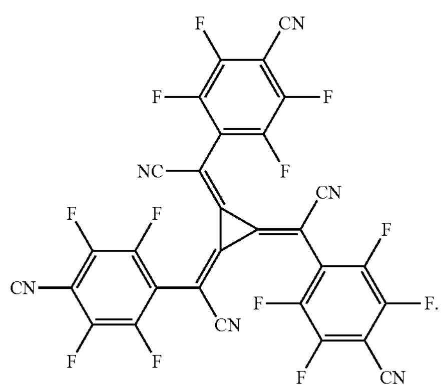

HT-D2

The hole-transporting region 12 may have a thickness of about 100 Å to about 10000 Å, for example, about 400 Å to about 2000 Å, and the emission layer 15 may have a thickness of about 100 Å to about 3000 Å, for example, about 300 Å to about 1000 Å. When the thickness of each of the hole-transporting region 12 and the emission layer 15 is within these ranges described above, satisfactory hole transportation characteristics and/or luminescent characteristics may be obtained without a substantial increase in driving voltage.

The hole transport region 12 may further include a buffer layer.

Also, the buffer layer may compensate for an optical resonance distance according to a wavelength of light emitted from the emission layer, and thus, efficiency of a formed organic light-emitting device may be improved.

The hole transport region 12 may further include an electron-blocking layer. The electron-blocking layer may include a known material, for example, mCP or DBFPO:

mCP

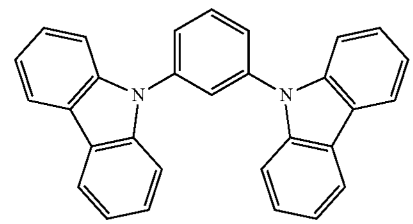

DBFPO

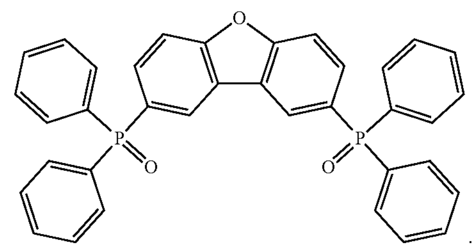

Electron-Transporting Region 17

The electron-transporting region 17 is placed between the emission layer 15 and the second electrode 19 of the organic light-emitting device 10.

The electron-transporting region 17 may have a single-layered structure or a multi-layered structure.

For example, the electron transport region 17 may have an electron transport layer, an electron transport layer/electron injection layer structure, a buffer layer/electron transport layer structure, hole-blocking layer/electron transport layer structure, a buffer layer/electron transport layer/electron injection layer structure, or a hole-blocking layer/electron transport layer/electron injection layer structure. The electron-transporting region 17 may further include an electron control layer.

The electron-transporting region 17 may include known electron-transporting materials.

The electron transport region 17 (for example, a buffer layer, a hole-blocking layer, an electron control layer, or an electron transport layer in the electron transport region) may include a metal-free compound containing at least one π electron-deficient nitrogen-containing $C_1$-$C_{60}$ cyclic group. The π electron-deficient nitrogen-containing $C_1$-$C_{60}$ cyclic group is the same as described above.

For example, the electron transport region 17 may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a substituted or unsubstituted $C_5$-$C_{60}$ carbocyclic group unsubstituted or substituted with at least one $R_{601a}$ or a $C_1$-$C_{60}$ heterocyclic group unsubstituted or substituted with at least one $R_{601a}$, xe11 may be 1, 2, or 3, xe1 may be an integer from 0 to 5, $R_{601a}$ and $R_{601}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-deficient nitrogen-containing $C_1$-$C_{60}$ cyclic group.

In an embodiment, $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, —$P(=O)(Q_{31})(Q_{32})$, or any combination thereof, $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

Formula 601-1

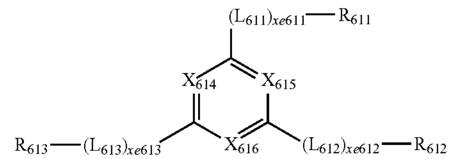

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof; or —S(═O)$_2$(Q$_{601}$), or —P(═O)(Q$_{601}$)(Q$_{602}$), wherein Q$_{601}$ and Q$_{602}$ are the same as described above.

The electron transport region 17 may include one of Compounds ET1 to ET36 or any combination thereof:

ET1

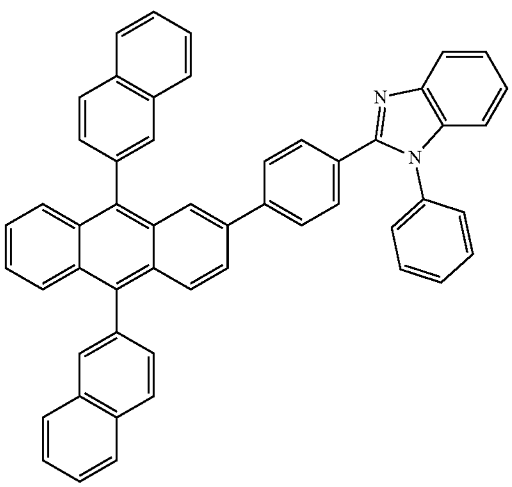

ET2

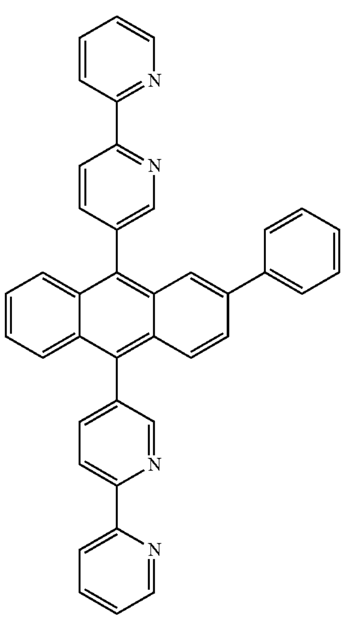

-continued

ET3

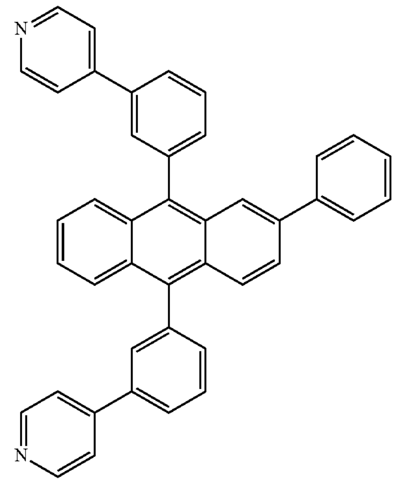

ET4

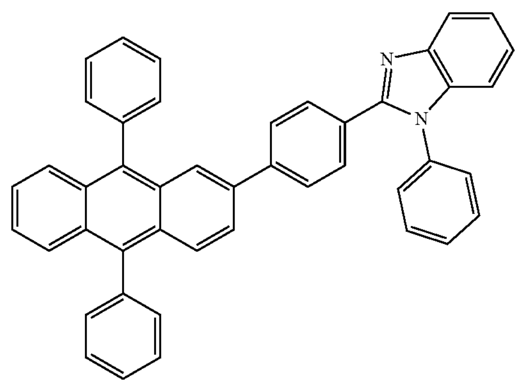

ET5

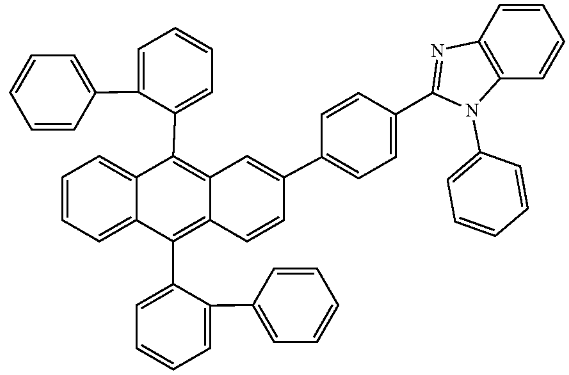

-continued
ET6
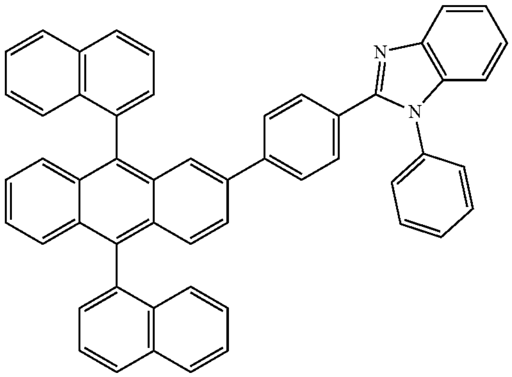
ET7
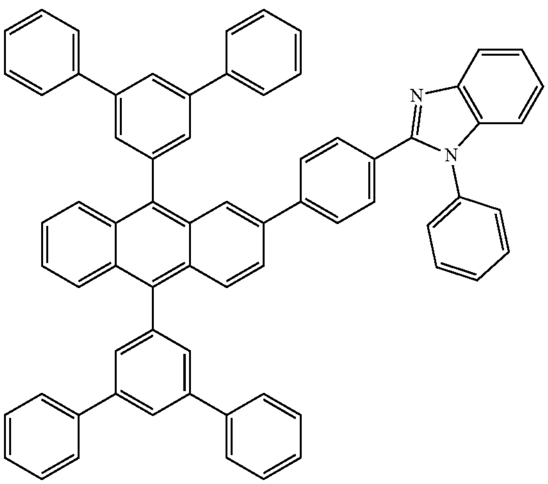
ET8
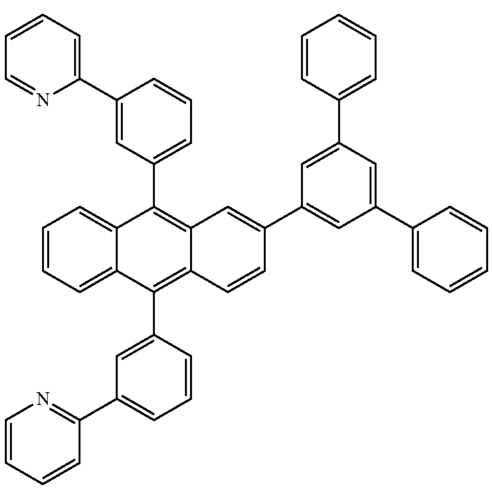
-continued
ET9
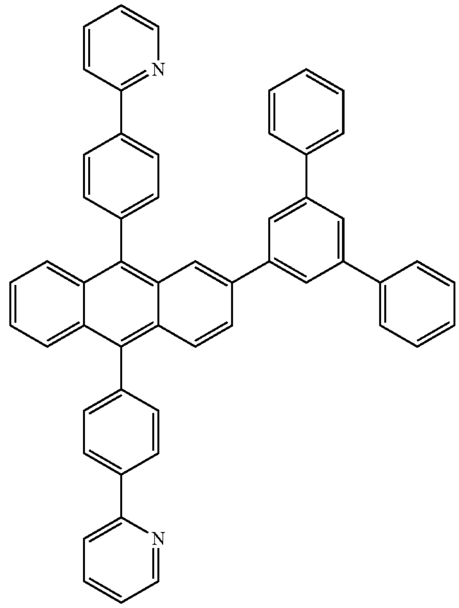
ET10
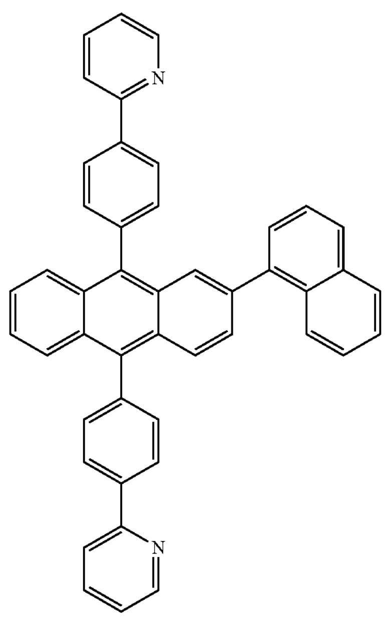

ET11
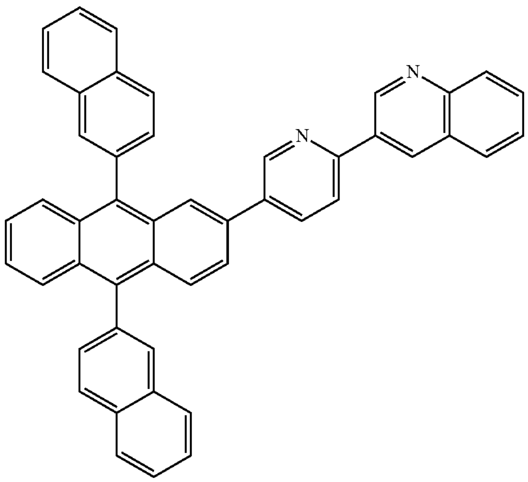
ET12
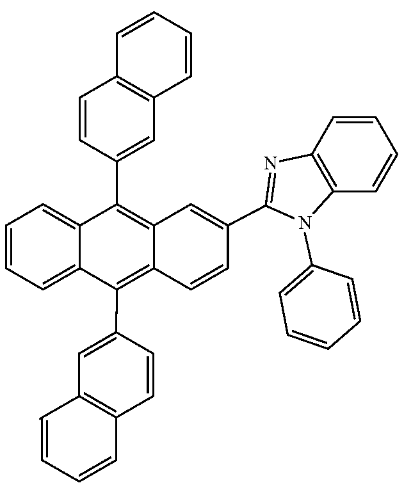
ET13
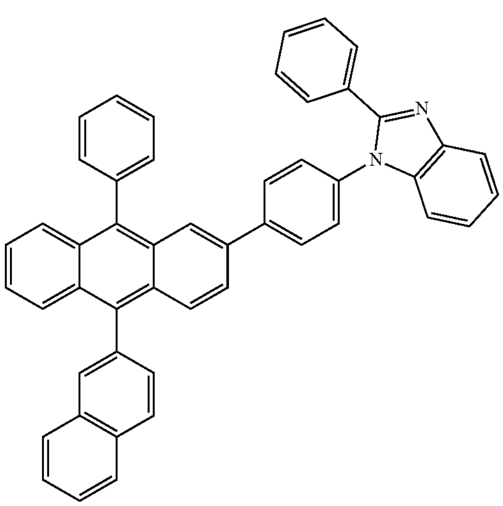
ET14
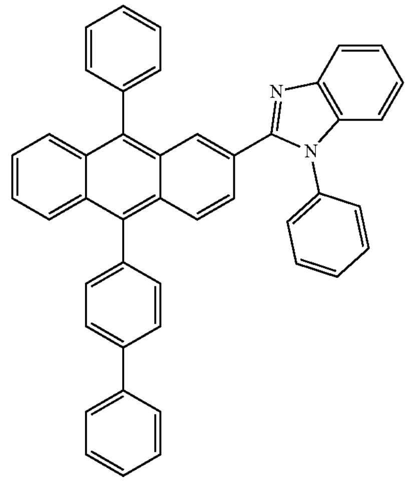
ET15
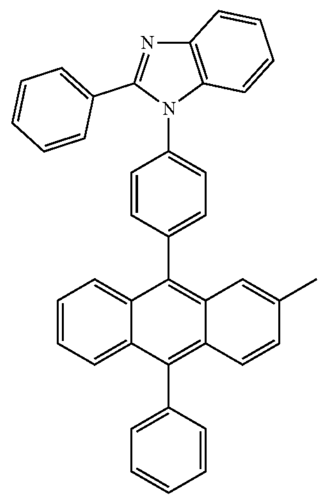
ET16
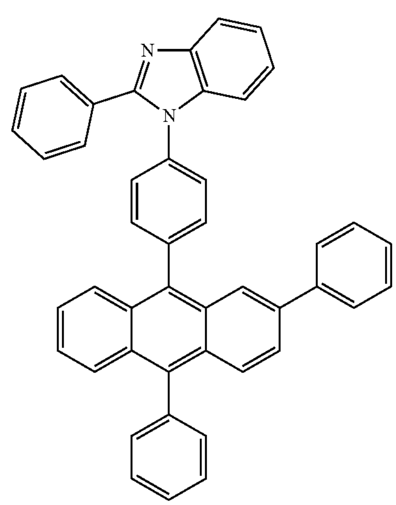

-continued
ET17
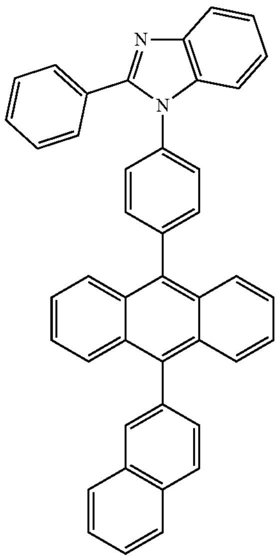
ET18
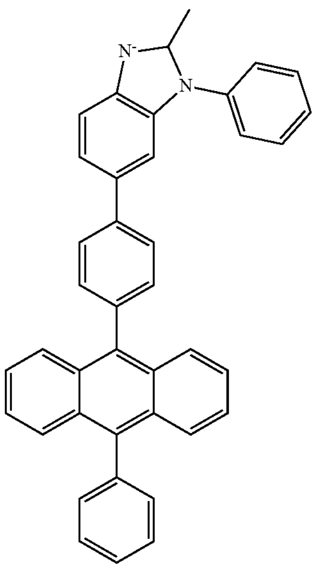
ET19
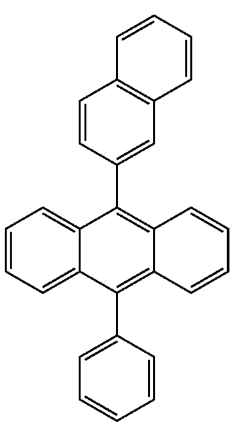
-continued
ET20
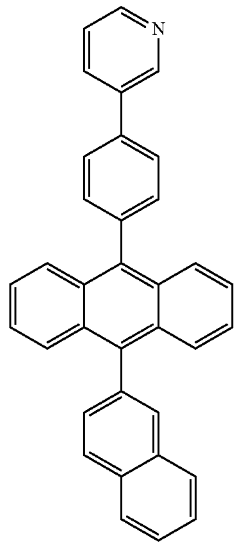
ET21
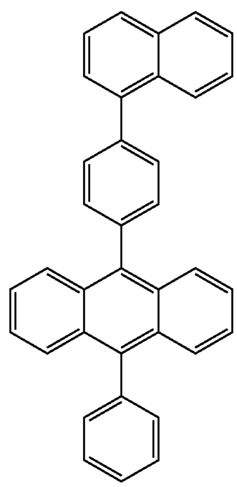
ET22
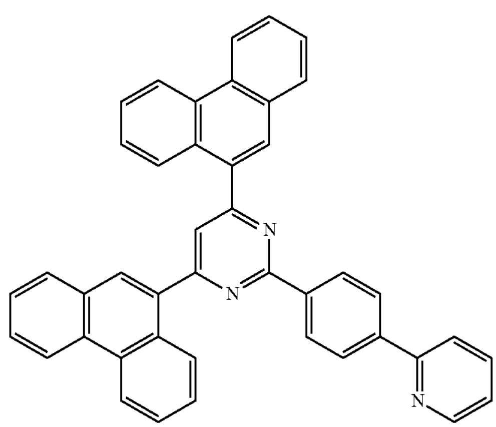

-continued
ET23
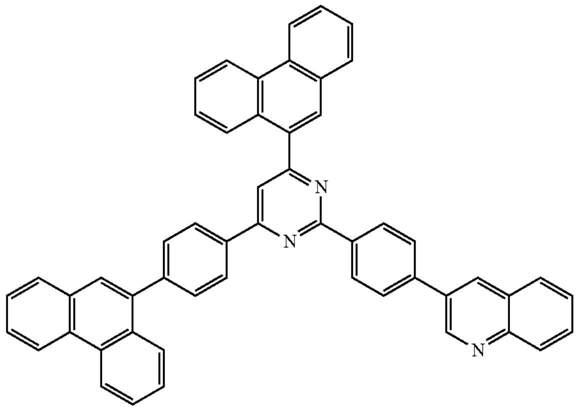
ET24
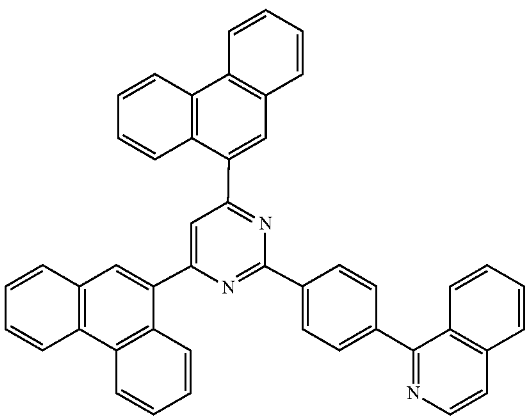
ET25
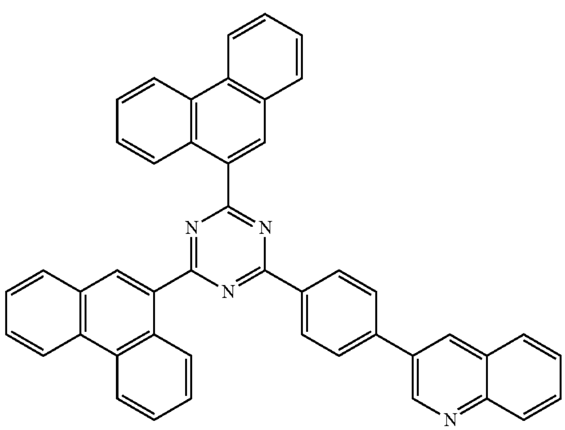
-continued
ET26
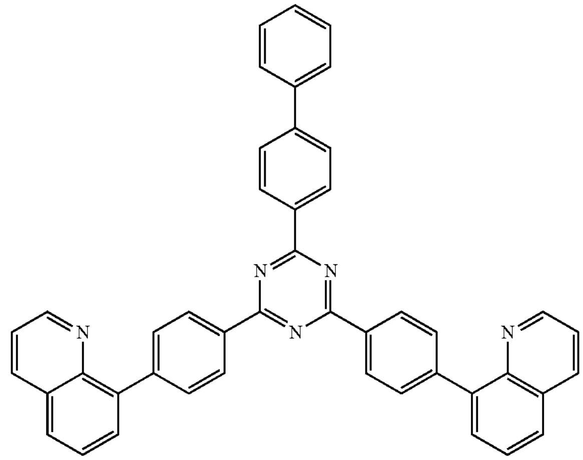
ET27
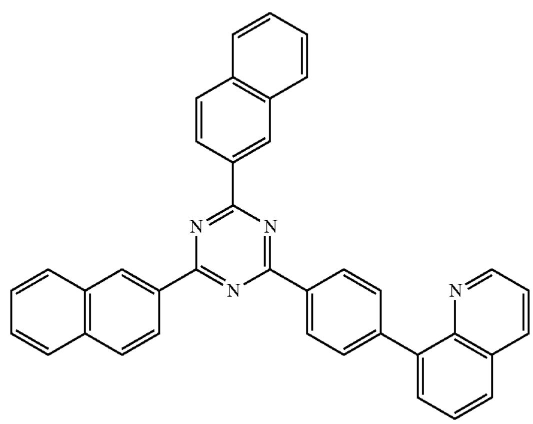
ET28
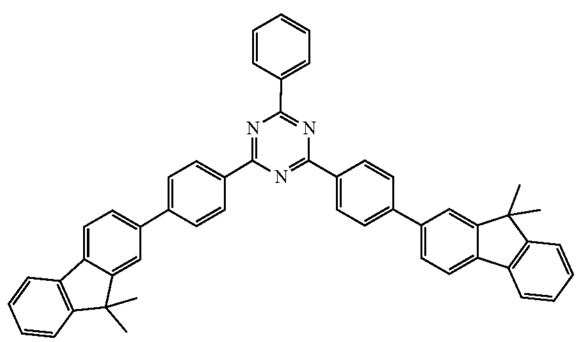

ET29
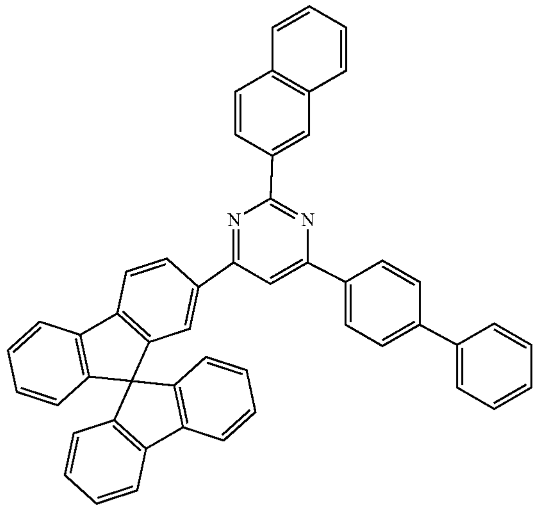
ET30
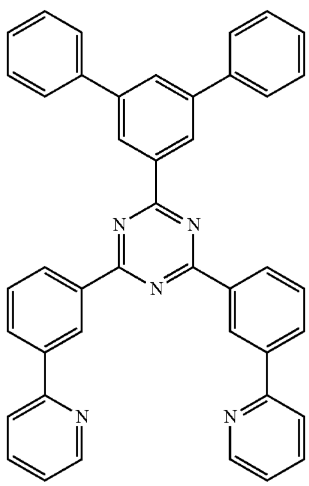
ET31
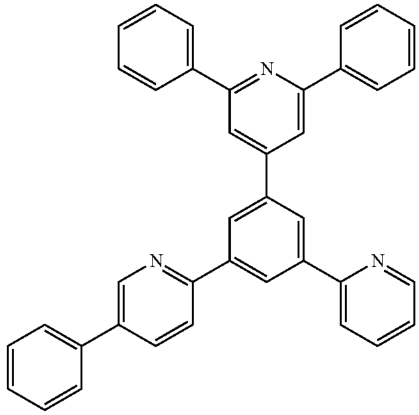
ET32
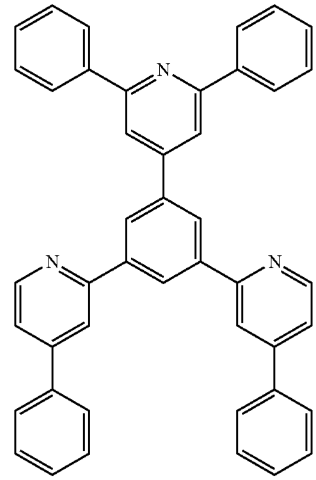
ET33
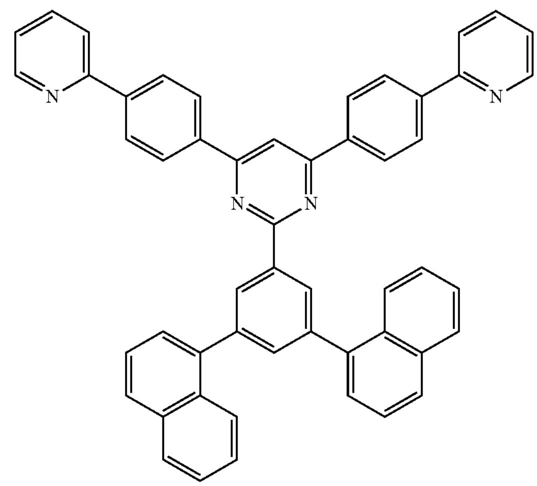
ET34
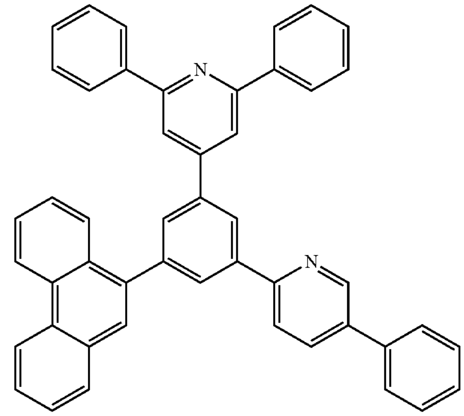

-continued

ET35

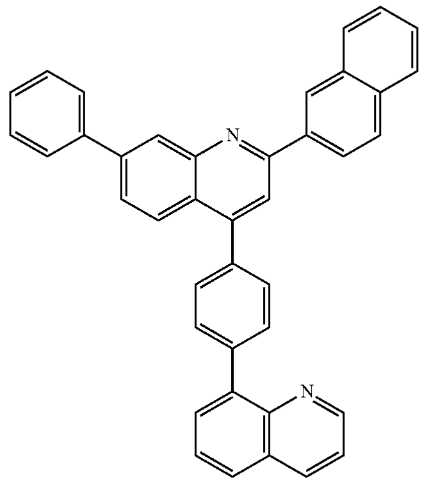

ET36

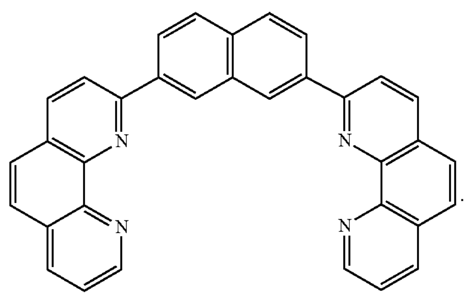

In one or more embodiments, the electron transport region 17 may include 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, DBFPO, or any combination thereof. For example, when the electron transport region 17 includes a hole-blocking layer, the hole-blocking layer may include BCP or Bphen:

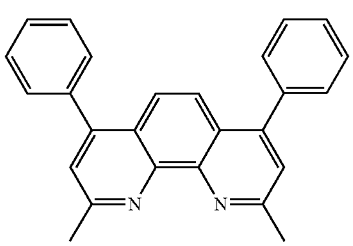

BCP

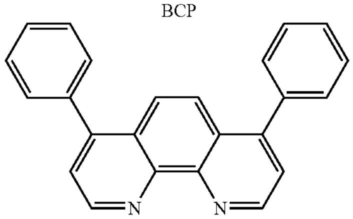

Bphen

-continued

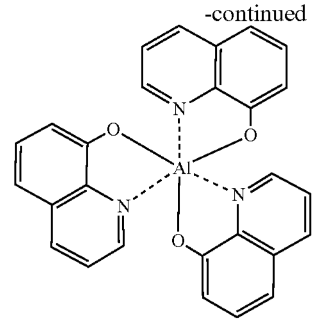

$Alq_3$

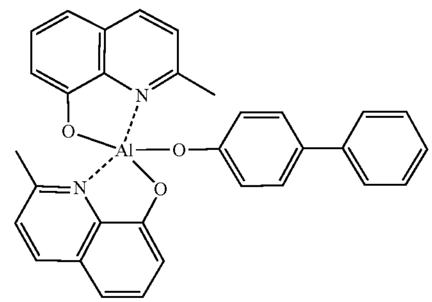

BAlq

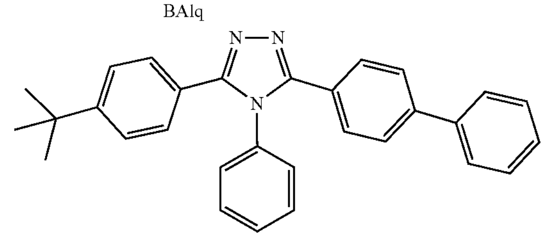

TAZ

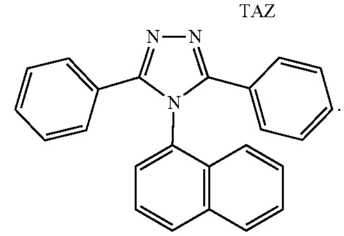

NTAZ

Thicknesses of the buffer layer, the hole-blocking layer, and the electron control layer may each independently be in the range of about 20 Å to about 1,000 Å, for example, about 30 Å to about 300 Å. When the thicknesses of the buffer layer, the hole-blocking layer, and the electron control layer are within these ranges, excellent hole-blocking characteristics or excellent electron control characteristics may be obtained without a substantial increase in driving voltage.

A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport region 17 (for example, the electron transport layer in the electron transport region 17) may further include, in addition to the materials described above, a metal-containing material.

The metal-containing material may include an alkali metal complex, an alkaline earth metal complex, or any combination thereof. A metal ion of the alkali metal complex may include a Li ion, a Na ion, a K ion, a Rb ion, a Cs ion, or any combination thereof, and a metal ion of the alkaline earth metal complex may include a Be ion, a Mg ion, a Ca ion, a Sr ion, a Ba ion, or any combination thereof. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

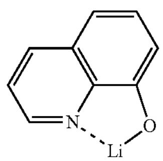

ET-D1

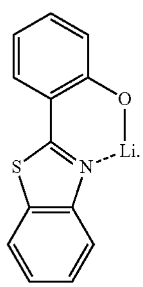

ET-D2

The electron-transporting region 17 may include an electron injection layer that facilitates the injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may include Li, Na, K, Rb, Cs, or any combination thereof. In an embodiment, the alkali metal may be Li, Na, or Cs. In one or more embodiments, the alkali metal may be Li or Cs.

The alkaline earth metal may include Mg, Ca, Sr, Ba, or any combination thereof.

The rare earth metal may include Sc, Y, Ce, Tb, Yb, Gd, or any combination thereof.

The alkali metal compound, the alkaline earth metal compound, and the rare earth metal compound may include oxides and halides (for example, fluorides, chlorides, bromides, or iodides) of the alkali metal, the alkaline earth metal, and the rare earth metal, or any combination thereof.

The alkali metal compound may include: one of alkali metal oxides such as $Li_2O$, $Cs_2O$, or $K_2O$; one of alkali metal halides such as LiF, NaF, CsF, KF, LiI, NaI, CsI, or KI; or any combination thereof. In an embodiment, the alkali metal compound may include LiF, $Li_2O$, NaF, LiI, NaI, CsI, KI, or any combination thereof.

The alkaline earth metal compound may include one of alkaline earth metal compounds, such as BaO, SrO, CaO, $Ba_xSr_{1-x}O$ ($0<x<1$), or $Ba_xCa_{1-x}O$ ($0<x<1$), or any combination thereof. In an embodiment, the alkaline earth metal compound may include BaO, SrO, CaO, or any combination thereof.

The rare earth metal compound may include $YbF_3$, $ScF_3$, $ScO_3$, $Y_2O_3$, $Ce_2O_3$, $GdF_3$, $TbF_3$, or any combination thereof. In an embodiment, the rare earth metal compound may include $YbF_3$, $ScF_3$, $TbF_3$, $YbI_3$, $ScI_3$, $TbI_3$, or any combination thereof.

The alkali metal complex, the alkaline earth metal complex, and the rare earth metal complex may include an ion of alkali metal, alkaline earth metal, and rare earth metal as described above, and a ligand coordinated with a metal ion of the alkali metal complex, the alkaline earth metal complex, or the rare earth metal complex may include hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, cyclopentadiene, or any combination thereof.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 19

The second electrode 19 is located on the organic layer 10A having such a structure. The second electrode 19 may be a cathode which is an electron injection electrode, and in this regard, a material for forming the second electrode 19 may be selected from a metal, an alloy, an electrically conductive compound, and a combination thereof, which have a relatively low work function.

The second electrode 19 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof. The second electrode 19 may be a transmissive electrode, a semi-transmissive electrode, or a reflective electrode.

The second electrode 19 may have a single-layered structure having a single layer or a multi-layered structure including two or more layers.

Explanation of Terms

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl, cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent monocyclic group that includes at least one heteroatom selected from N, O, P, Si, S, Se, Ge, and B as a ring-forming atom and 1 to 10 carbon atoms, and the term "the $C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and tetrahydrothiophenyl group.

The term "$C_3$-$C_{10}$ cycloalkenyl group" as used herein refers to a monovalent cyclic group that includes 3 to 10 carbon atoms and at least one carbon-carbon double bond in the ring thereof and has no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, and B as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group that includes at least one heteroatom selected from N, O, P, Si, S, Se, Ge, and B as a ring-forming atom and a heterocyclic aromatic system having 1 to 60 carbon atoms, and the term "$C_1$-$C_{60}$ heteroarylene group" as used herein refers to a divalent group that includes at least one heteroatom selected from N, O, P, Si, S, Se, Ge, and B as a ring-forming atom and a heterocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60) and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group having two or more rings condensed with each other, a heteroatom selected from N, O, P, Si, S, Se, Ge, and B, other than carbon atoms (for example, having 1 to 60 carbon atoms), as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group described above.

The term "π electron-deficient nitrogen-containing $C_1$-$C_{60}$ cyclic group" as used herein refers to a cyclic group having 1 to 60 carbon atoms and including at least one *—N=*' (wherein * and *' each indicate a binding site to an adjacent atom) as a ring-forming moiety. For example, the π electron-deficient nitrogen-containing $C_1$-$C_{60}$ cyclic group may be a) a first ring, b) a condensed ring in which at least two first rings are condensed, or c) a condensed ring in which at least one first ring and at least one second ring are condensed.

The term "π electron-rich $C_3$-$C_{60}$ cyclic group" as used herein refers to a cyclic group having 3 to 60 carbon atoms and not including *—N=* (wherein * and * each indicate a binding site to an adjacent atom) as a ring-forming moiety. For example, the π electron-rich $C_3$-$C_{60}$ cyclic group may be a) a second ring or b) a condensed ring in which at least two second rings are condensed.

The term "$C_5$-$C_{60}$ cyclic group" as used herein refers to a monocyclic or polycyclic group having 5 to 60 carbon atoms, and may be, for example, a) a third ring or b) a condensed ring in which two or more third rings are condensed with each other.

The term "$C_1$-$C_{60}$ heterocyclic group" as used herein refers to a monocyclic or polycyclic group that has 1 to 60 carbon atoms and includes at least one heteroatom, and may be, for example, a) a fourth ring, b) a condensed ring in which two or more fourth rings are condensed with each other, or c) a condensed ring in which at least one third ring is condensed with at least one fourth ring.

The "first ring" as used herein may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group.

The "second ring" as used herein may be a benzene group, a cyclopentadiene group, a pyrrole group, a furan group, a thiophene group, or a silole group.

The "third ring" as used herein may be a cyclopentane group, a cyclopentadiene group, an indene group, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclohexane group, a cyclohexene group, or a benzene group.

The "fourth ring" as used herein may be a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group.

In some embodiments, the π electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group:

In some embodiments, the π electron-rich $C_3$-$C_{60}$ cyclic group may be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonapthothiophene group, an (indolo) phenanthrene group, a (benzofurano) phenanthrene group, or a (benzothieno) phenanthrene group.

For example, the $C_5$-$C_{60}$ carbocyclic group may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, cyclopentadiene group, an indene group, a fluorene group, a 5,6,7,8-tetrahydroisoquinoline group, a 5,6,7,8-tetrahydroquinoline group, an adamantane group, a norbornane group, or a norbornene group.

For example, the $C_1$-$C_{60}$ heterocyclic group may be a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group.

The term "a π electron-deficient nitrogen-containing $C_1$-$C_{60}$ cyclic group, a TT electron-rich $C_3$-$C_{60}$ cyclic group, a $C_5$-$C_{60}$ cyclic group, and a $C_1$-$C_{60}$ heterocyclic group" may be part of a condensed cycle or may be a monovalent, a divalent, a trivalent, a tetravalent, a pentavalent, or a hexavalent group, depending on the formula structure.

A substituent of the substituted π electron-deficient nitrogen-containing $C_1$-$C_{60}$ cyclic group, the substituted π electron-rich $C_3$-$C_{60}$ cyclic group, the substituted $C_5$-$C_{60}$ cyclic group, the substituted $C_1$-$C_{60}$ heterocyclic group, the substituted $C_1$-$C_{60}$ alkylene group, the substituted $C_2$-$C_{60}$ alkenylene group, the substituted $C_2$-$C_{60}$ alkynylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof, $Q_1$ to $Q_9$, $Q_{11}$ to $Q_{19}$, $Q_{21}$ to $Q_{29}$, and $Q_{31}$ to $Q_{39}$ used herein may each independently be: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

—$CH_3$, —$CD_3$, —$CD_2H$, —$CDH_2$, —$CH_2CH_3$, —$CH_2CD3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

The term “room temperature” used herein refers to a temperature of about 25° C.

The terms “a biphenyl group, a terphenyl group, and a tetraphenyl group” used herein respectively refer to monovalent groups in which two, three, or four phenyl groups which are linked together via a single bond.

Hereinafter, a compound and an organic light-emitting device according to embodiments are described in detail with reference to Synthesis Examples and Examples. However, the organic light-emitting device is not limited thereto. The wording ‘"B’ was used instead of ‘A” used in describing Synthesis Examples means that an amount of ‘A’ used was identical to an amount of ‘B’ used, in terms of a molar equivalent.

EXAMPLES

Synthesis Example 1 (Compound 11)

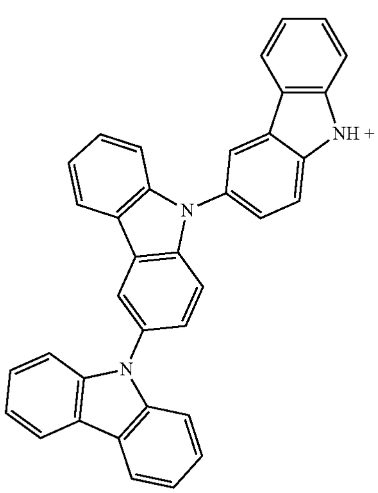

-continued

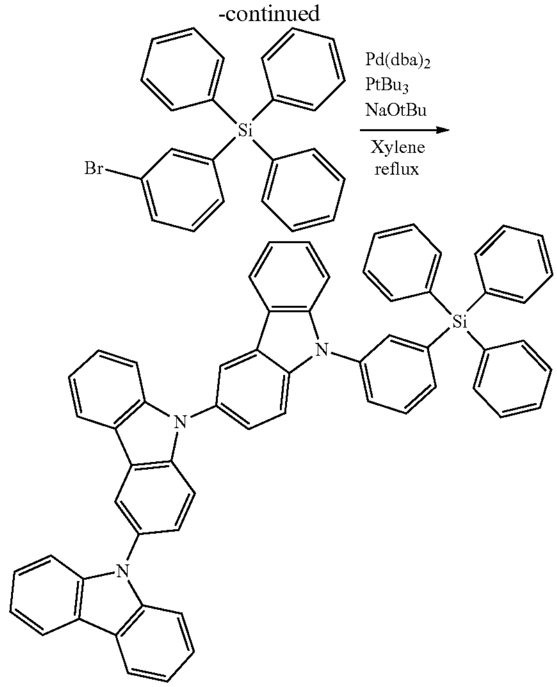

11

9H-3,9': 3', 9'-Tercarbazole (4.0 g, 8.04 mmol), (3-bromophenyl)triphenylsilane (3.67 g, 8.84 mmol), $Pd(dba)_2$ (0.23 g, 0.40 mmol), $PtBu_3$ (50 wt % in toluene, 0.80 mmol), and NaOtBu (1.16 g, 12.06 mmol) were mixed with xylene (100 mL), and stirred while refluxing at a temperature of 120° C. for 12 hours. After the reaction was completed, the temperature was lowered to room temperature, and the resultant product was poured into methanol to filter the formed precipitate, and the filtrate was purified by silica column chromatography, and then recrystallized using dichloromethane and hexane to obtain 4.6 g of Compound 11 (67% yield).

HPLC-MS: 832.25 $[M+H]^+$ $\lambda_{emission}$=376 nm (Room-temperature fluorescence)

$\lambda_{emission}$=415 nm (Low-temperature phosphorescence)

Figure 2:
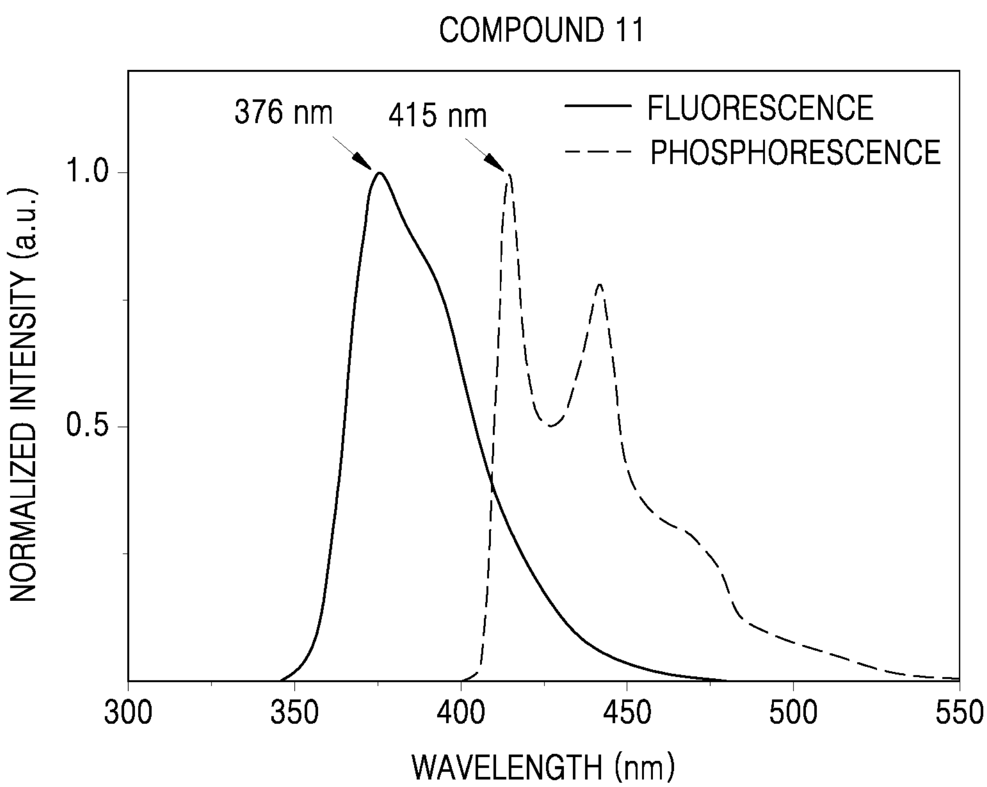
FIG. 2 shows a graph of the photoluminescence (PL) spectrum (fluorescence spectrum and phosphorescence spectrum) of Compound 11.

FIG. 2 shows the PL spectrum (fluorescent spectrum and phosphorescent spectrum) of Compound 11.

Synthesis Example 2 (Compound 27)

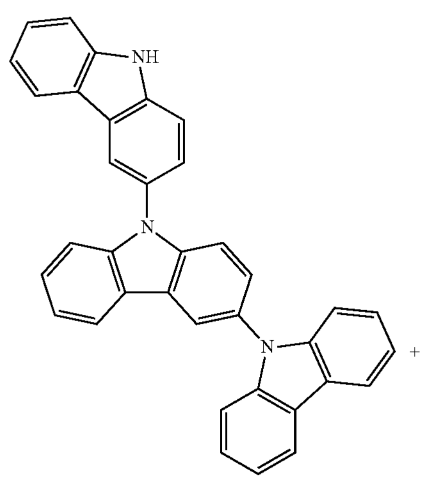

-continued

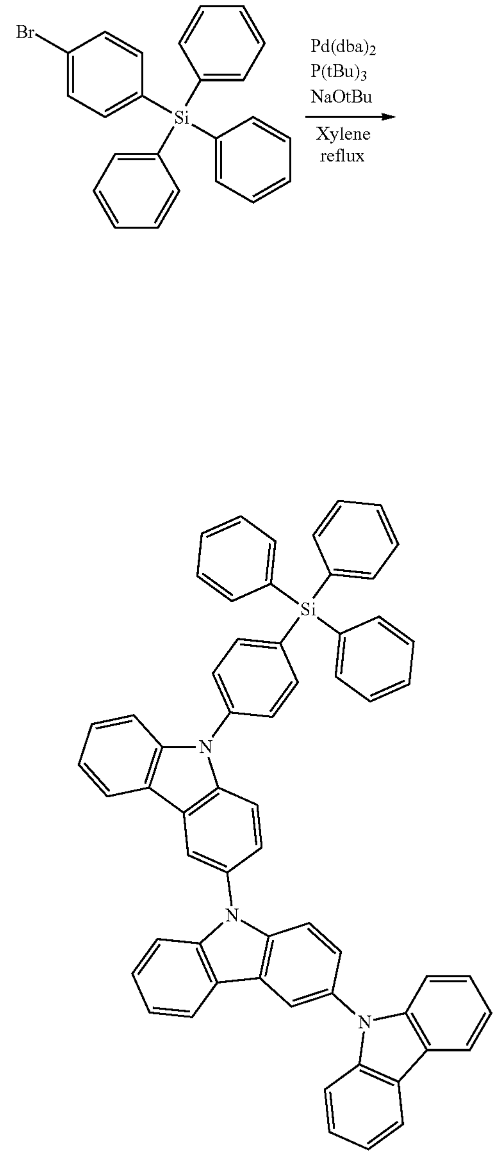

27

9H-3,9': 3',9'-Tercarbazole (3.0 g, 6.03 mmol), (4-bromophenyl)triphenylsilane (2.75 g, 6.63 mmol), $Pd(dba)_2$ (0.17 g, 0.30 mmol), $PtBu_3$ (50 wt % in toluene, 0.60 mmol), and NaOtBu (0.87 g, 9.04 mmol) were mixed with xylene (100 mL), and then, stirred while refluxing at a temperature of 120° C. for 12 hours. After the reaction was completed, the temperature was lowered to room temperature, and the resultant product was poured into methanol to filter the formed precipitate, and the filtrate was purified through silica column chromatography, and then recrystallized using dichloromethane and hexane to obtain 3.2 g of Compound 27 (yield of 64%).

HPLC-MS: 832.25 $[M+H]^+$ $\lambda_{emission}$=376 nm (Room-temperature fluorescence)

$\lambda_{emission}$=415 nm (Low-temperature phosphorescence)

Synthesis Example 3 (Compound 238)

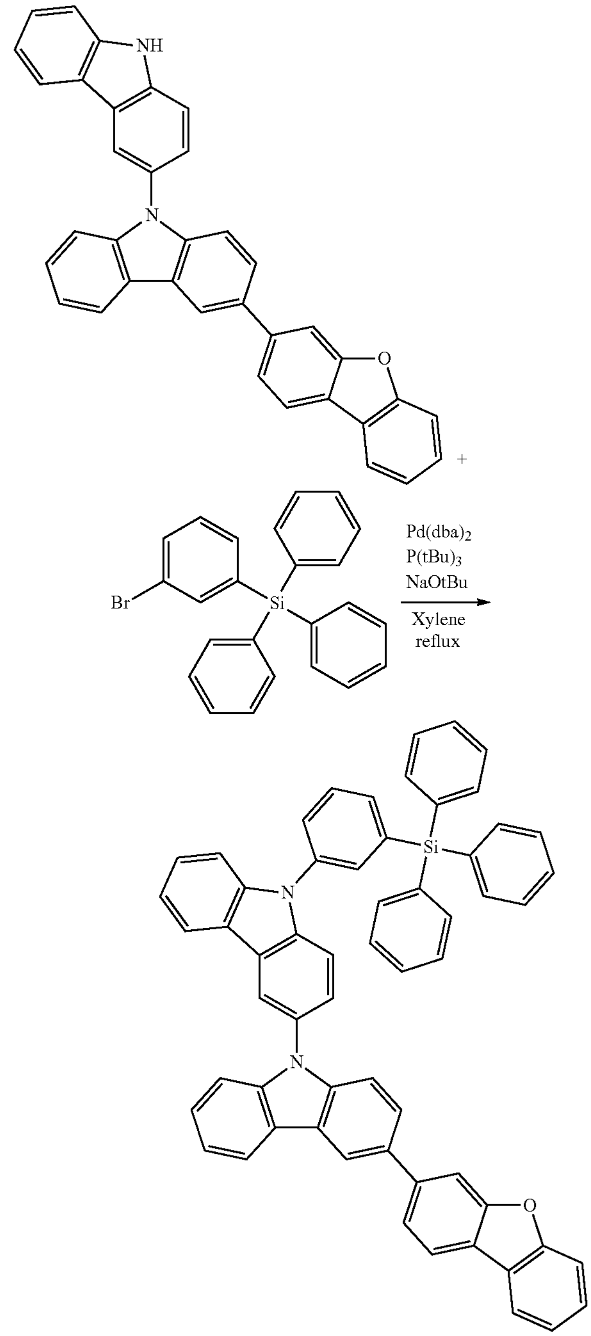

238

3'-(Dibenzo[b,d]furan-3-yl)-9H-3,9'-bicarbazole (3.0 g, 6.02 mmol), (3-bromophenyl)triphenylsilane (2.75 g, 6.62 mmol), $Pd(dba)_2$ (0.17 g, 0.30 mmol), $PtBu_3$ (50 wt % in toluene, 0.60 mmol), and NaOtBu (0.87 g, 9.03 mmol) were mixed with xylene (100 mL), and then stirred while refluxing at a temperature of 120° C. for 12 hours. After the reaction was completed, the temperature was lowered to room temperature, and the resultant product was poured into methanol to filter the formed precipitate, and the filtrate was purified through silica column chromatography, and then recrystallized using dichloromethane and hexane to obtain 2.6 g of Compound 238 (yield of 52%).

HPLC-MS: 834.23 $[M+H]^+$ $\lambda_{emission}$=376 nm (Room-temperature fluorescence)

$\lambda_{emission}$=448 nm (Low-temperature phosphorescence)

Synthesis Example 4 (Compound 715)

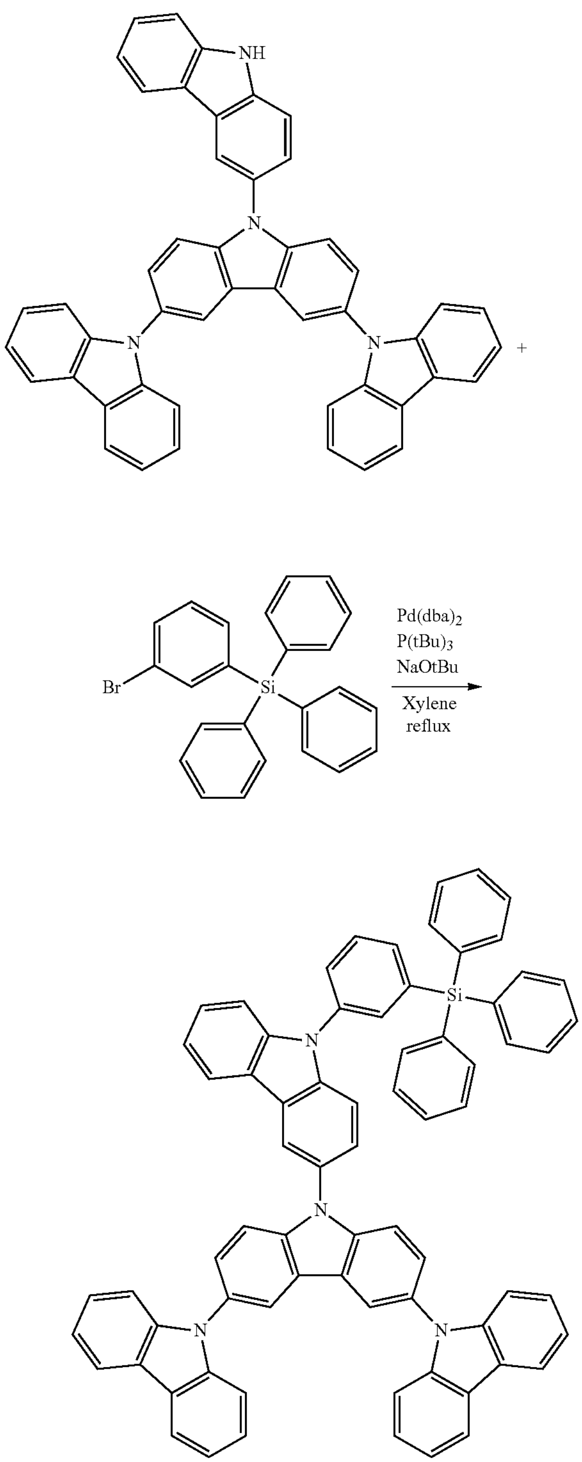

715

9H-3,9': 3',9'-Tercarbazole (3.0 g, 4.53 mmol), (3-bromophenyl)triphenylsilane (2.07 g, 4.98 mmol), $Pd(dba)_2$ (0.13 g, 0.23 mmol), $PtBu_3$ (50 wt % in toluene, 0.46 mmol), and NaOtBu (0.65 g, 6.79 mmol) were mixed with xylene (50 mL), and then stirred while refluxing at a temperature of 120° C. for 12 hours. After the reaction was completed, the temperature was lowered to room temperature, and the resultant product was poured into methanol to filter the formed precipitate, and the filtrate was purified through silica column chromatography, and then recrystallized using dichloromethane and hexane to obtain 2.5 g of Compound 715 (yield of 55%).

HPLC-MS: 997.31 $[M+H]^+$ $\lambda_{emission}$=377 nm (Room-temperature fluorescence)

$\lambda_{emission}$=443 nm (Low-temperature phosphorescence)

Evaluation Example 1: Evaluation of HOMO, $T_1$ and $S_1$ Energy Level

The HOMO, LUMO, $T_1$ and $S_1$ energy levels of the compounds shown in Table 3 below were measured according to the method described in Table 2, and the results are shown in Table 3:

TABLE 2

| | |
|---|---|
| Evaluation method for HOMO energy level and LUMO energy level | HOMO energy level and LUMO energy level were evaluated using atmospheric photoelectron spectroscopy device (RIKEN KEIKI Co., Ltd.: AC3) |
| $S_1$ energy level evaluation method | The photoluminescence spectrum of a mixture of 2-MeTHF and each compound (dissolved to adjust the concentration of the compound to be $1 \times 10^{-4}$M) was measured at room temperature using a photoluminescence measuring instrument, and the peaks were analyzed to calculate the onset $S_1$ energy level. |
| $T_1$ energy level evaluation method | A mixture of 2-MeTHF and each compound (dissolved to adjust the concentration of the compound to be $1 \times 10^{-4}$M) was put in a quartz cell, and then, liquid nitrogen (77 K) is added thereto and the photoluminescence spectrum thereof was measured using a photoluminescence measuring instrument. The obtained photoluminescence spectrum was compared with the normal room temperature photoluminescence spectrum, and only the peak only at low temperature was analyzed to calculate the onset $T_1$ energy level. |

TABLE 3

| Compound No. | HOMO (eV) | LUMO (eV) | $S_1$ (eV) | $T_1$ (eV) |
|---|---|---|---|---|
| 11 | −5.70 | −2.27 | 3.47 | 3.05 |
| 27 | −5.68 | −2.25 | 3.47 | 3.05 |
| 238 | −5.73 | −2.15 | 3.43 | 2.90 |
| 715 | −5.81 | −2.40 | 3.44 | 2.96 |

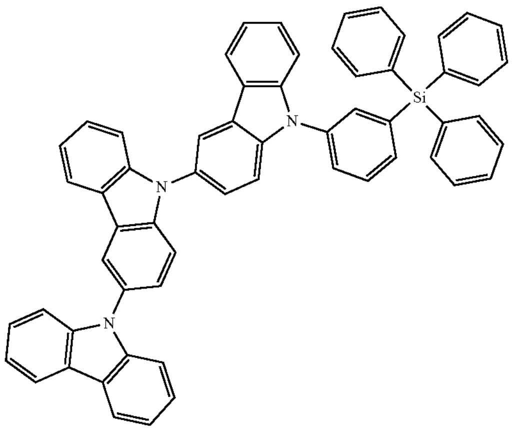

11

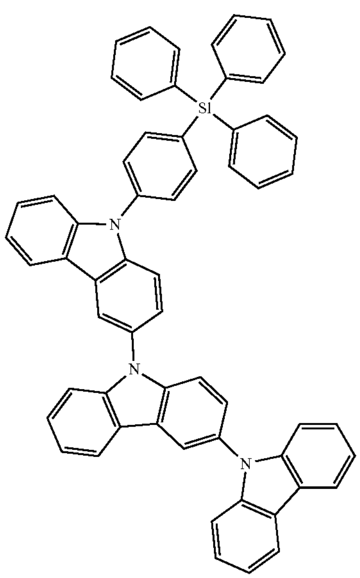

27

TABLE 3-continued

| Compound No. | HOMO (eV) | LUMO (eV) | $S_1$ (eV) | $T_1$ (eV) |
|---|---|---|---|---|

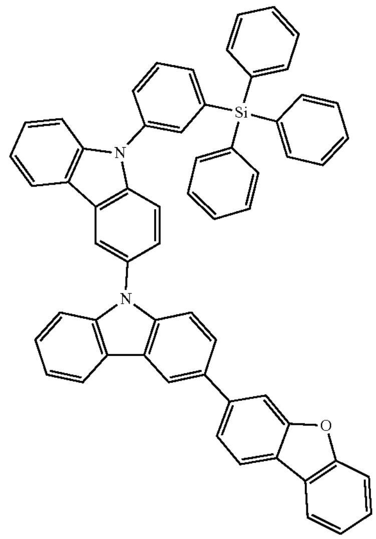

238

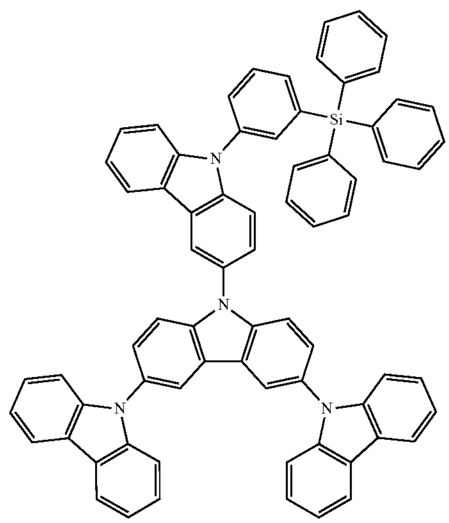

715

According to Table 3, it can be confirmed that Compounds 11, 27, 238 and 715 have excellent electrical characteristics.

Example 1

A glass substrate with a 1,500 Å-thick indium tin oxide (ITO) electrode (first electrode, anode) formed thereon was cleaned by distilled water ultrasonication. After the distilled water ultrasonication, ultrasonic cleaning was performed with a solvent such as isopropyl alcohol, acetone, and methanol, and the glass substrate was dried and transferred to a plasma cleaner. The glass substrate was cleaned by using oxygen plasma for 5 minutes, and then transferred to a vacuum laminator.

Compound HT3 and Compound HT-D2 were co-deposited on the ITO electrode on the glass substrate to form a hole injection layer having a thickness of 100 Å, and Compound HT3 was deposited on the hole injection layer to form a hole transport layer having a thickness of 1,300 Å, and mCP was deposited on the hole transport layer to form an electron-blocking layer having a thickness of 100 Å to form a hole transport region.

Compound 11 (host) and Flr6 (dopant, 10 wt %) were co-deposited on the hole transport region to form an emission layer having a thickness of 400 Å.

BCP was vacuum-deposited on the emission layer to form a hole-blocking layer having a thickness of 100 Å, and Compound ET3 and Liq were co-deposited on the hole-blocking layer to form an electron transport layer having a thickness of 300 Å, and Liq was deposited on the electron transport layer to form an electron injection layer having a thickness of 10 Å, and an Al second electrode (cathode) having a thickness of 1,200 Å was formed on the electron injection layer, thereby completing the manufacture of an organic light-emitting device.

HT3

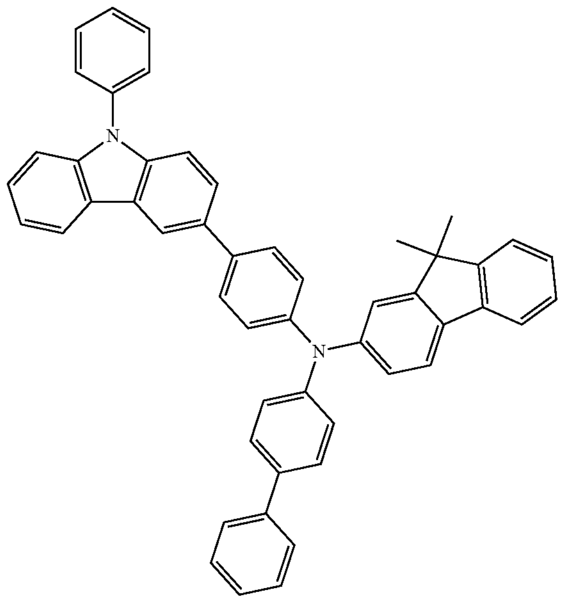

HT-D2

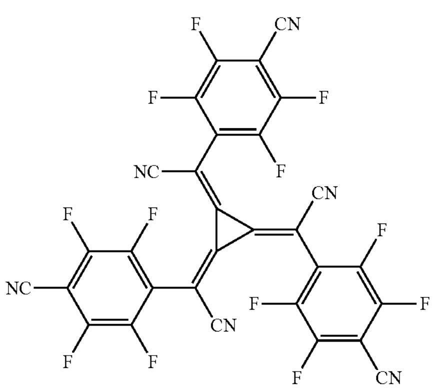

mCP

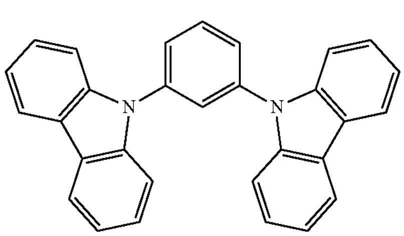

-continued

Flr6

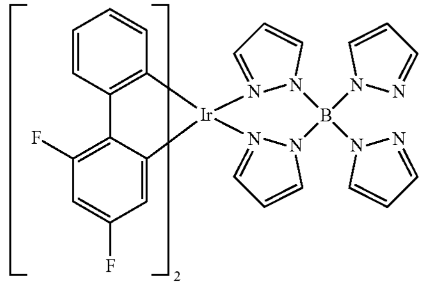

BCP

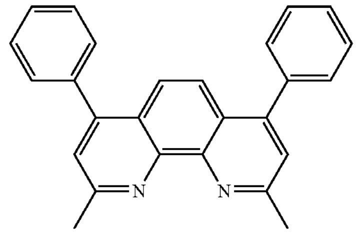

ET3

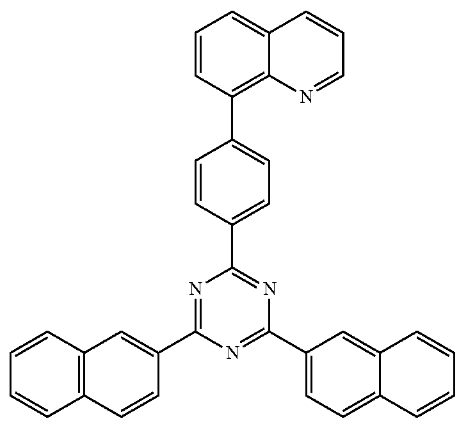

Examples 1 to 4 and Comparative Examples A1, A2, B1, B2, B3, and C

Organic light-emitting devices were manufactured in the same manner as in Example 1, except that compounds described in Table 4 were each used instead of Compound 11 in the formation of the emission layer.

Figure 3:
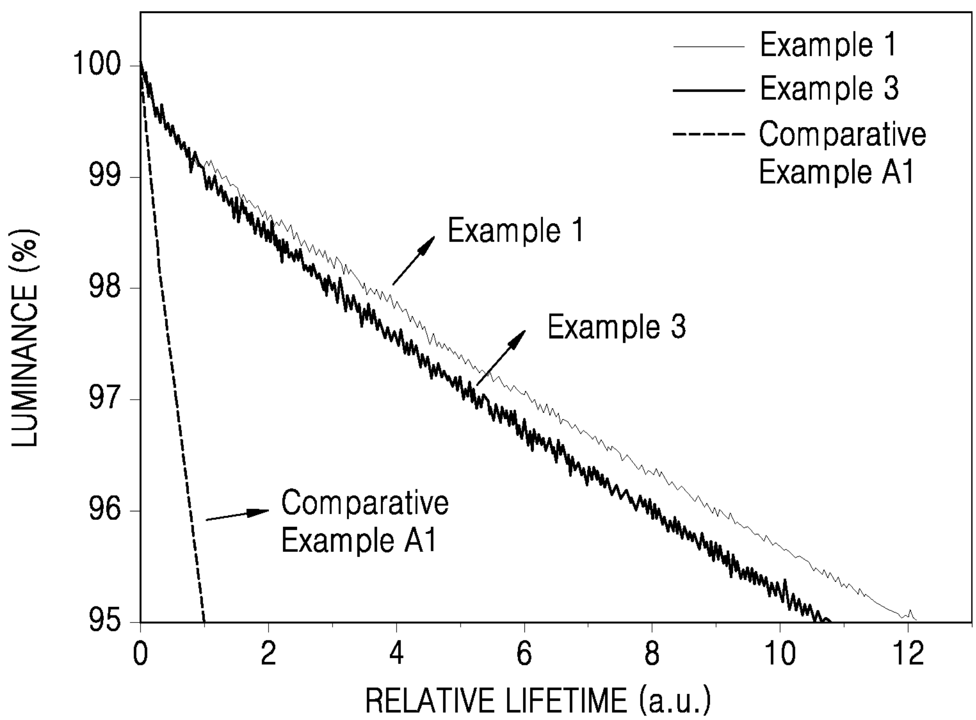
FIG. 3 shows a lifetime-luminance graph of each of the organic light-emitting devices manufactured in Example 1, Example 3, and Comparative Example A1.
Figure 4:
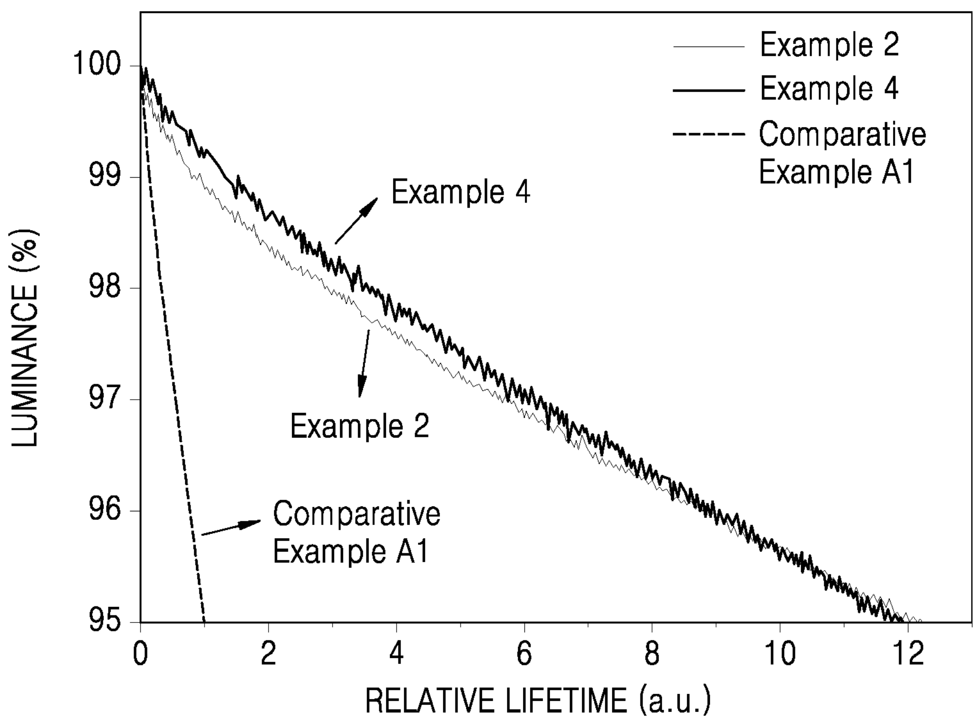
FIG. 4 shows a lifetime-luminance graph of each of the organic light-emitting devices manufactured in Example 2, Example 4, and Comparative Example A1.

Evaluation of Example 2: Evaluation of Properties of Organic Light-Emitting Devices The driving voltage (V), current efficiency (cd/A), and lifetime ($T_{95}$ at 1,000 nit, hr) of the organic light-emitting devices manufactured according to Examples 1 to 4 and Comparative Examples A1, A2, B1, B2, B3, and C were evaluated by using a Current-Voltmeter (Keithley 2400) and luminance meter (Minolta Cs-1000A). The results are shown in Table 2. Lifetime ($T_{95}$) refers to a time that is taken for the brightness to become 95% compared to the initial luminance of 100%. In Table 4, the driving voltage, current efficiency and lifetime of Examples 1 to 4 and Comparative Examples A1, A2, B1, B2, B3 and C are expressed as relative values (%) compared to the driving voltage, current efficiency and lifetime of Comparative Example A1. Meanwhile, the lifetime-luminance graph of each of the organic light-emitting devices manufactured in Example 1, Example 3, and Comparative Example A1 are shown in FIG. 3, and the lifetime-luminance graph of each of the organic light-emitting devices manufactured in Example 2, Example 4 and Comparative Example A1 is shown in FIG. 4.

TABLE 4

| | Host | Luminance ($cd/m^2$) | Driving voltage (Relative value, %) | Current efficiency (Relative value, %) | Lifetime ($LT_{95}$) (Relative value, %) |
|---|---|---|---|---|---|
| Example 1 | 11 | 1000 | 79 | 154 | 1226 |
| Example 2 | 27 | 1000 | 79 | 151 | 1222 |
| Example 3 | 238 | 1000 | 81 | 155 | 1070 |
| Example 4 | 715 | 1000 | 80 | 145 | 1186 |
| Comparative Example A1 | A1 | 1000 | 100 | 100 | 100 |
| Comparative Example A2 | A2 | 1000 | 95 | 110 | 202 |
| Comparative Example B1 | B1 | 1000 | 107 | 108 | 144 |
| Comparative Example B2 | B2 | 1000 | 99 | 121 | 250 |
| Comparative Example B3 | B3 | 1000 | 92 | 110 | 139 |
| Comparative Example C | C | 1000 | 85 | 150 | 580 |

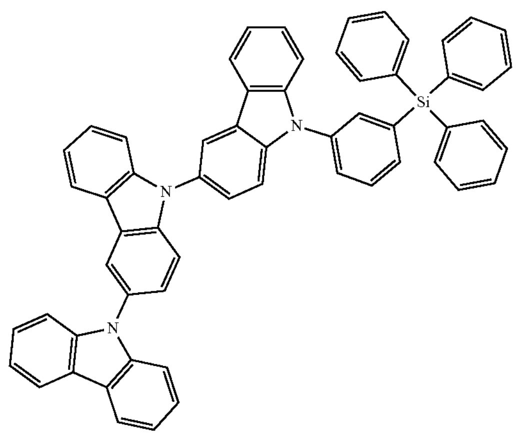

11

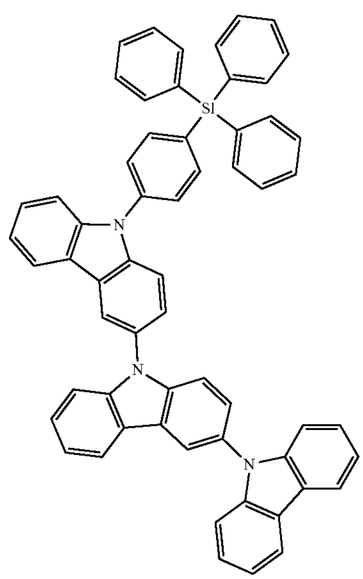

27

TABLE 4-continued
| Host | Luminance ($cd/m^2$) | Driving voltage (Relative value, %) | Current efficiency (Relative value, %) | Lifetime ($LT_{95}$) (Relative value, %) |
|---|---|---|---|---|
| 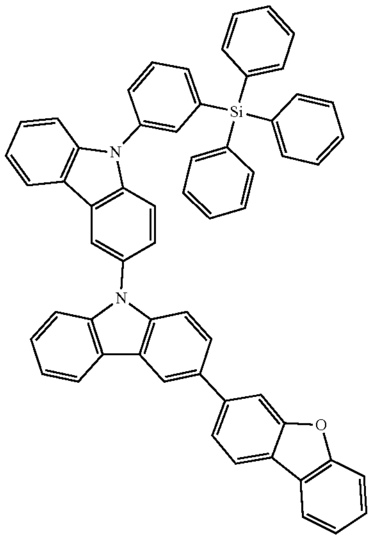 238 | | | | |
| 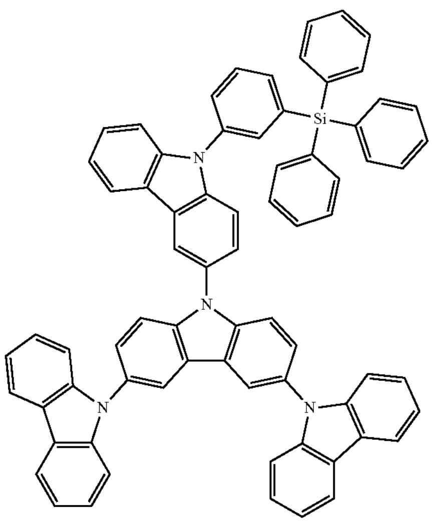 715 | | | | |
| 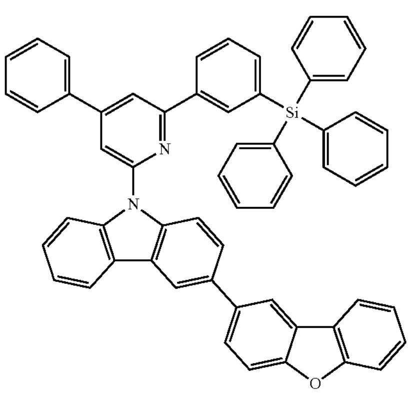 A1 | | | | |

TABLE 4-continued
| Host | Luminance ($cd/m^2$) | Driving voltage (Relative value, %) | Current efficiency (Relative value, %) | Lifetime ($LT_{95}$) (Relative value, %) |
|---|---|---|---|---|
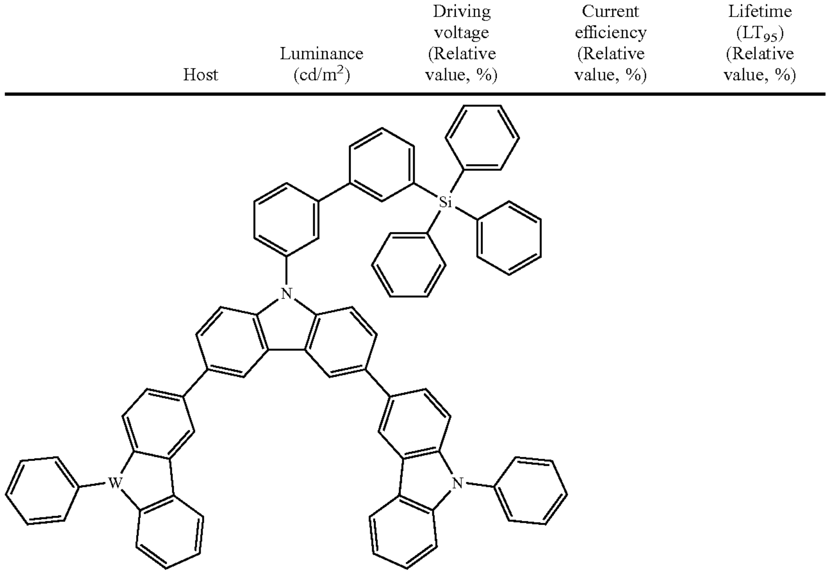
A2
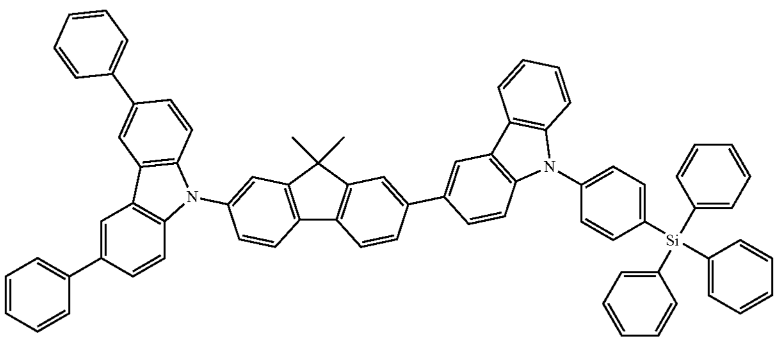
B1
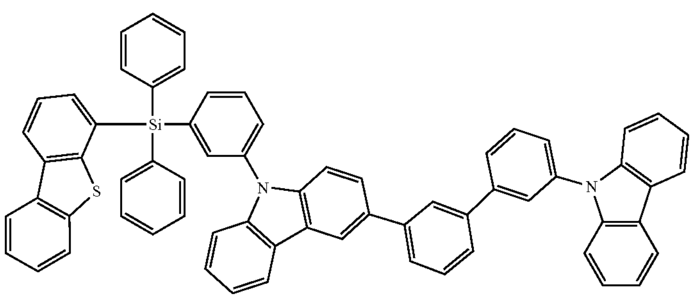
B2
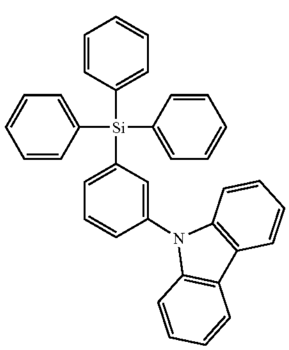
B3

TABLE 4-continued

| Host | Luminance ($cd/m^2$) | Driving voltage (Relative value, %) | Current efficiency (Relative value, %) | Lifetime ($LT_{95}$) (Relative value, %) |
|---|---|---|---|---|

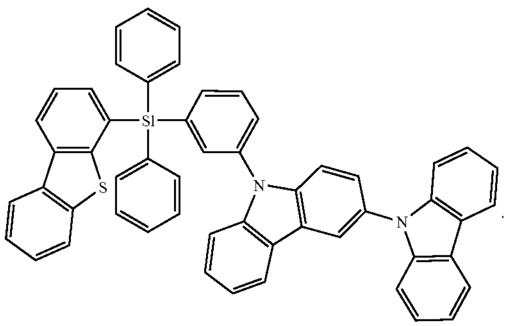

C

From Table 4, it can be seen that the organic light-emitting devices of Examples 1 to 4 have improved driving voltage, improved current efficiency, and improved lifetime compared to the organic light-emitting devices of Comparative Examples A1, A2, B1, B2, B3, and C.

By using the heterocyclic compound represented by Formula 1, an organic light-emitting device having high luminescence efficiency and long lifetime characteristics, and an electronic apparatus including the same can be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A heterocyclic compound represented by Formula 1 comprising:

Formula 1

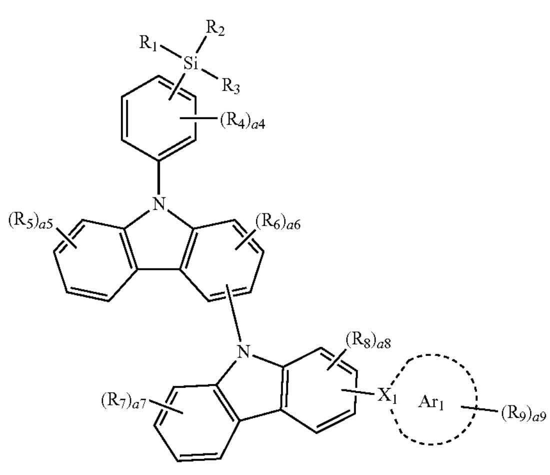

wherein, in Formula 1, $X_1$ is N or C, $Ar_1$ is i) a π electron-rich $C_6$-$C_{60}$ polycyclic group, or ii) a $C_6$-$C_{60}$ polycyclic group to which a furan group, a thiophene group, a pyrrole group, a cyclopentadiene group, a silole group, or any combination thereof is condensed, $R_1$ to $R_9$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$, a4, a5, and a7 are each independently an integer from 0 to 4, a6 and a8 are each independently an integer from 0 to 3, a9 is an integer from 0 to 20, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Ge(Q_{13})(Q_{14})(Q_{15})$, $—B(Q_{16})(Q_{17})$, $—P({=}O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Ge(Q_{23})(Q_{24})(Q_{25})$, $—B(Q_{26})(Q_{27})$, $—P({=}O)(Q_{28})(Q_{29})$, $—P(Q_{28})(Q_{29})$, or any combination thereof;

$—N(Q_{31})(Q_{32})$, $—Ge(Q_{33})(Q_{34})(Q_{35})$, $—B(Q_{36})(Q_{37})$, $—P({=}O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The heterocyclic compound of claim 1, wherein $Ar_1$ is:

a) a $C_{10}$-$C_{60}$ polycyclic group in which two or more first groups are condensed with each other, b) a $C_9$-$C_{60}$ polycyclic group in which one or more first groups and one or more second groups are condensed with each other, c) a $C_7$-$C_{60}$ polycyclic group in which one or more second groups and one or more third groups are condensed with each other, or d) a $C_{11}$-$C_{60}$ polycyclic group in which one or more first groups, one or more second groups, and one or more third groups are condensed with each other, wherein the first group is a benzene group, the second group is a furan group, a thiophene group, a pyrrole group, a cyclopentadiene group, or a silole group, and the third group is a pyridine group, a pyrimidine group, a pyridazine group, or a pyrazine group.

3. The heterocyclic compound of claim 1, wherein $Ar_1$ is a naphthalene group, an anthracene group, a phenanthrene group, a pyrene group, a furan group, a thiophene group, a pyrrole group, a cyclopentadiene group, a silole group, a benzofuran group, a benzothiophene group, an indole group, an indene group, a benzosilole group, a dibenzofuran group, a dibenzothiophene group, a carbazole group, a fluorene group, a dibenzosilole group, a naphthobenzofuran group, a naphthobenzothiophene group, a benzocarbazole group, a benzofluorene group, a naphthobenzosilole group, a dinaphthofuran group, a dinaphthothiophene group, a dibenzocarbazole group, a dibenzofluorene group, a dinaphthosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, an azadibenzosilole group, an azanaphthobenzofuran group, an azanaphthobenzothiophene group, an azabenzocarbazole group, an azabenzofluorene group, an azanaphthobenbenzosilole group, an azadinaphthofuran group, an azadinaphthothiophene group, an azadibenzocarbazole group, an azadibenzofluorene group, or an azadinaphthosilole group.

4. The heterocyclic compound of claim 1, wherein a group represented by

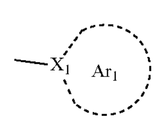

in Formula 1 is a group represented by Formula 2-1 or 2-2:

2-1

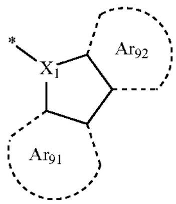

2-2

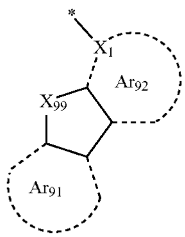

wherein, in Formulae 2-1 and 2-2, $X_1$ in Formula 2-1 is N, and $X_1$ in Formula 2-2 is the same as described in claim 1, $X_{99}$ is O, S, $N(R_{99a})$, $C(R_{99a})(R_{99b})$, or $Si(R_{99a})(R_{99b})$, $R_{99a}$ and $R_{99b}$ are each the same as described in connection with Re in claim 1, and $Ar_{91}$ and $Ar_{92}$ are each independently a benzene group, a naphthalene group, a benzofuran group, a benzothiophene group, an indole group, an indene group, a benzosilole group, a dibenzofuran group, a dibenzothiophene group, a carbazole group, a fluorene group, a dibenzosilole group, a pyridine group, a pyrimidine group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group, and indicates a binding site to an adjacent atom.

5. The heterocyclic compound of claim 1, wherein a group represented by

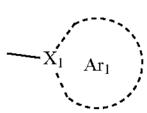

in Formula 1 is a group represented by one of Formulae 3-1 to 3-5:

3-1

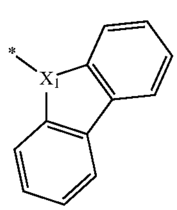

-continued 3-2

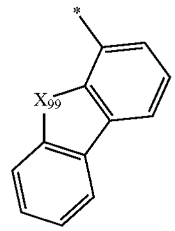

3-3

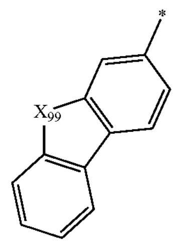

3-4

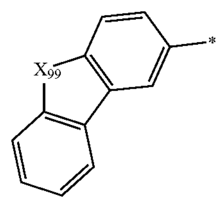

3-5

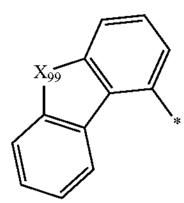

wherein, in Formulae 3-1 to 3-5, $X_1$ is N, $X_{99}$ is O, S, $N(R_{99a})$, $C(R_{99a})(R_{99b})$, or $Si(R_{99a})(R_{99b})$, $R_{99a}$ and $R_{99b}$ are each the same as described in connection with Re in claim 1, and

* indicates a binding site to an adjacent atom.

6. The heterocyclic compound of claim 1, wherein $R_1$ to $R_9$ are each independently:

hydrogen, deuterium, —F, or a cyano group; or a $C_1$-$C_{60}$ alkyl group, a $C_1$-$C_{60}$ alkoxy group, a π electron-rich $C_3$-$C_{60}$ cyclic group, or a pyridinyl group, each unsubstituted or substituted with deuterium, —F, a cyano group, a $C_1$-$C_{60}$ alkyl group, a $C_1$-$C_{60}$ alkoxy group, a π electron-rich $C_3$-$C_{60}$ cyclic group, a pyridinyl group, a biphenyl group, a terphenyl group, or any combination thereof.

7. The heterocyclic compound of claim 1, wherein $R_1$ to $R_3$ are each independently a phenyl group which is unsubstituted or substituted with deuterium, —F, a cyano group, a $C_1$-$C_{60}$ alkyl group, a $C_1$-$C_{60}$ alkoxy group, a phenyl group, a biphenyl group, a terphenyl group, or any combination thereof.

8. The heterocyclic compound of claim 1, wherein $R_4$ to $R_9$ are each independently hydrogen, deuterium, —F, or a cyano group; or a phenyl group which is unsubstituted or substituted with deuterium, —F, a cyano group, a $C_1$-$C_{60}$ alkyl group, a $C_1$-$C_{60}$ alkoxy group, a phenyl group, a biphenyl group, a terphenyl group, or any combination thereof.

9. The heterocyclic compound of claim 1, wherein a group represented by

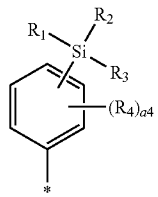

in Formula 1 is a group represented by one of Formulae 4-1 to 4-3:

4-1

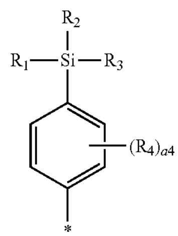

4-2

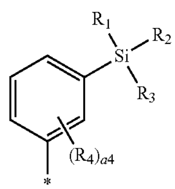

4-3

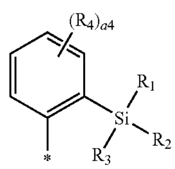

wherein, in Formulae 4-1 to 4-3, $R_1$ to $R_4$, and a4 are each the same as described in claim 1, and indicates a binding site to a neighboring N.

10. The heterocyclic compound of claim 1, wherein a group represented by

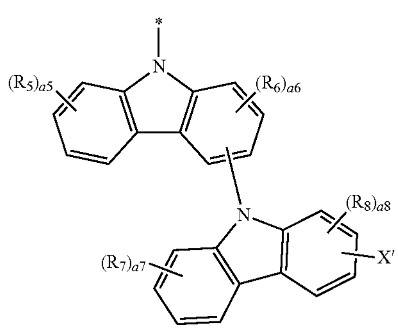

in Formula 1 is a group represented by one of Formulae 5-1 to 5-4:

5-1

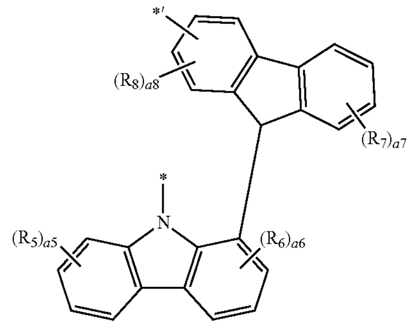

5-2

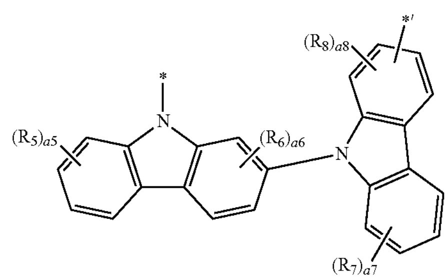

5-3

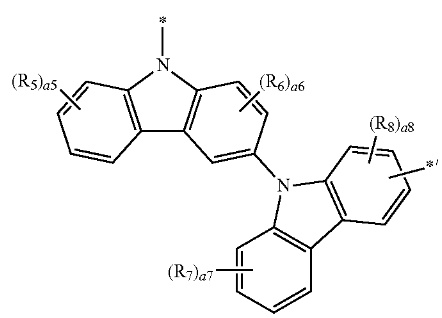

5-4

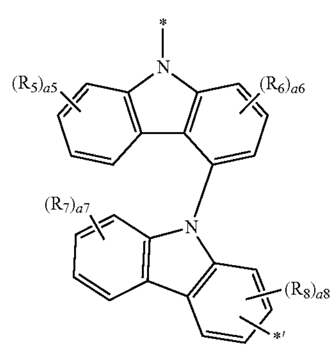

wherein, in Formulae 5-1 to 5-4, $R_5$ to $R_8$ and a5 to a8 are each the same as described in claim 1, indicates a binding site to a neighboring C, and is a binding site to $X_1$.

11. The heterocyclic compound of claim 1, wherein a group represented by

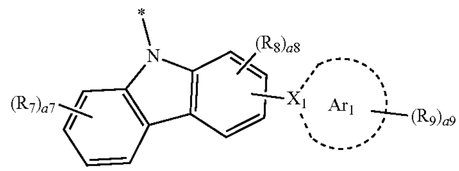

in Formula 1 is a group represented by one of Formulae 6-1 to 6-4:

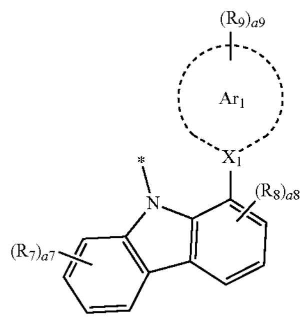

6-1

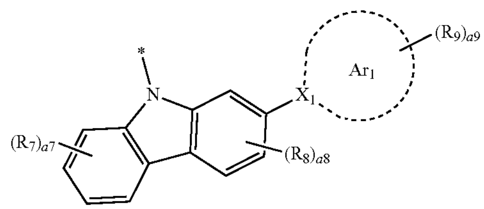

6-2

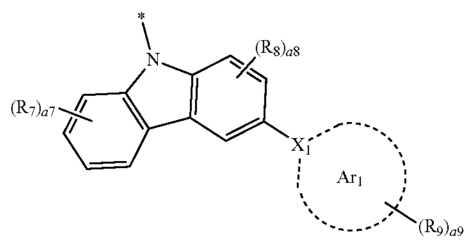

6-3

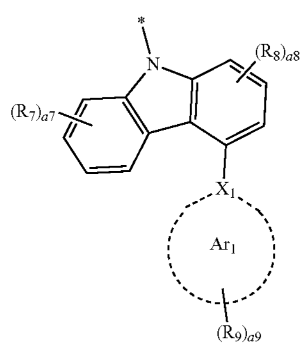

6-4 wherein, in Formulae 6-1 to 6-4, $X_1$, $Ar_1$, $R_7$ to $R_9$, and a7 to a9 are the same as described in claim 1, and indicates a binding site to a neighboring C.

12. An organic light-emitting device, comprising:

a first electrode, a second electrode, and an organic layer located between the first electrode and the second electrode and including an emission layer, wherein the organic layer comprises at least one heterocyclic compound according to claim 1.

13. The organic light-emitting device of claim 12, wherein the organic layer comprises a hole transport region located between the first electrode and the emission layer and an electron transport region located between the emission layer and the second electrode, the hole transport region comprises a hole injection layer, a hole transport layer, an electron-blocking layer, an auxiliary layer, or any combination thereof, and the electron transport region comprises a buffer layer, a hole-blocking layer, an electron transport layer, an electron injection layer, or any combination thereof.

14. The organic light-emitting device of claim 12, wherein the heterocyclic compound is included in the emission layer.

15. The organic light-emitting device of claim 14, wherein blue light is emitted from the emission layer.

16. The organic light-emitting device of claim 12, wherein the emission layer comprises a host and a dopant, and the at least one heterocyclic compound is included in the host.

17. The organic light-emitting device of claim 16, wherein the dopant comprises a platinum complex.

18. The organic light-emitting device of claim 16, wherein the dopant comprises a platinum complex, the platinum complex comprises platinum and n ligands bound to the platinum, n is an integer from 1 to 4, and at least one of the n ligands comprises a carbene moiety bound to the platinum.

19. The organic light-emitting device of claim 16, wherein the dopant comprises a platinum complex, and the platinum complex emits blue light.

20. An electronic apparatus comprising the organic light-emitting device of claim 12.

* * * * *